US010822510B2

(12) United States Patent
Pousthomis et al.

(10) Patent No.: US 10,822,510 B2
(45) Date of Patent: Nov. 3, 2020

(54) INK COMPRISING ENCAPSULATED NANOPARTICLES, METHOD FOR DEPOSITING THE INK, AND A PATTERN, PARTICLE AND OPTOELECTRONIC DEVICE COMPRISING THE INK

(71) Applicant: NEXDOT, Romainville (FR)

(72) Inventors: Marc Pousthomis, Deuil-la-Barre (FR); Michele D'Amico, Romainville (FR); Alexis Kuntzmann, Paris (FR); Yu-Pu Lin, Versailles (FR); Edgar Cao, Paris (FR); Robin Faideau, Houilles (FR)

(73) Assignee: NEXDOT, Romainville (FR)

( * ) Notice: Subject to any disclaimer, the term of this patent is extended or adjusted under 35 U.S.C. 154(b) by 27 days.

(21) Appl. No.: 15/995,491

(22) Filed: Jun. 1, 2018

(65) Prior Publication Data

US 2019/0002719 A1 Jan. 3, 2019

Related U.S. Application Data

(60) Provisional application No. 62/514,601, filed on Jun. 2, 2017, provisional application No. 62/514,297, filed (Continued)

(30) Foreign Application Priority Data

Sep. 22, 2017 (EP) .................................... 17306241
Sep. 22, 2017 (EP) .................................... 17306249
Dec. 11, 2017 (EP) .................................... 17206479

(51) Int. Cl.
*H01L 33/00* (2010.01)
*C09D 11/50* (2014.01)

(Continued)

(52) U.S. Cl.
CPC ............... *C09D 11/50* (2013.01); *B01J 13/14* (2013.01); *B01J 13/18* (2013.01); *B01J 13/22* (2013.01);

(Continued)

(58) Field of Classification Search
USPC ........................................................... 257/98
See application file for complete search history.

(56) References Cited

U.S. PATENT DOCUMENTS 9,425,365 B2 8/2016 Kurtin
2001/0032964 A1 10/2001 Oshima et al.

(Continued)

FOREIGN PATENT DOCUMENTS

WO 2016-166514 10/2016
WO 2017-020137 2/2017

OTHER PUBLICATIONS

Gui, Rijun et al., "Facile synthesis of quantum dots/mesoporous silica/quantum dots core/shell/shell hybrid microspheres for ratiometric fluorescence detection of 5-fluorouracil in human serum", Analyst, Jul. 22, 2013, 138, 5956-5964.

(Continued)

*Primary Examiner* — Caleb E Henry
(74) *Attorney, Agent, or Firm* — Nixon & Vanderhye

(57) ABSTRACT

Disclosed is an ink including at least one particle including a first material; and at least one liquid vehicle; wherein the particle includes at least one particle including a second material and at least one nanoparticle dispersed in the second material; wherein the first material and the second material have an extinction coefficient less or equal to $15\times10^{-5}$ at 460 nm. The invention also relates to inks, light emitting materials including at least one ink, patterns including at least one ink, particles deposited on a support, (Continued)

optoelectronic devices including at least one ink and method for depositing an ink on a support.

17 Claims, 21 Drawing Sheets

Related U.S. Application Data on Jun. 2, 2017, provisional application No. 62/609,932, filed on Dec. 22, 2017, provisional application No. 62/710,298, filed on Feb. 16, 2018, provisional application No. 62/642,370, filed on Mar. 13, 2018.

(51) Int. Cl.

| | |
|---|---|
| ***C09K 11/88*** | (2006.01) |
| ***B01J 13/14*** | (2006.01) |
| ***B01J 13/18*** | (2006.01) |
| ***C09K 11/70*** | (2006.01) |
| ***C01B 19/00*** | (2006.01) |
| ***C01G 9/02*** | (2006.01) |
| ***C01G 11/00*** | (2006.01) |
| ***B01J 13/22*** | (2006.01) |
| ***C01F 7/30*** | (2006.01) |
| ***C09K 11/02*** | (2006.01) |
| ***C09D 11/033*** | (2014.01) |
| ***C09D 11/037*** | (2014.01) |
| ***C09D 11/322*** | (2014.01) |
| ***C09D 11/36*** | (2014.01) |
| ***C09K 11/06*** | (2006.01) |
| ***C09K 11/56*** | (2006.01) |
| *C01B 33/12* | (2006.01) |
| *B82Y 20/00* | (2011.01) |
| *B82Y 40/00* | (2011.01) |
| *H01L 33/50* | (2010.01) |

(52) U.S. Cl.

CPC .............. *C01B 19/007* (2013.01); *C01F 7/30* (2013.01); *C01G 9/02* (2013.01); *C01G 11/006* (2013.01); *C09D 11/033* (2013.01); *C09D 11/037* (2013.01); *C09D 11/322* (2013.01); *C09D 11/36* (2013.01); *C09K 11/02* (2013.01); *C09K 11/025* (2013.01); *C09K 11/06* (2013.01); *C09K 11/565* (2013.01); *C09K 11/70* (2013.01); *C09K 11/703* (2013.01); *C09K 11/883* (2013.01); *B82Y 20/00* (2013.01); *B82Y 40/00* (2013.01); *C01B 33/12* (2013.01); *C01P 2004/04* (2013.01); *C01P 2004/24* (2013.01); *C01P 2004/32* (2013.01); *C01P 2004/80* (2013.01); *C09K 2211/10* (2013.01); *H01L 33/502* (2013.01); *H01L 2933/0041* (2013.01)

(56) References Cited

U.S. PATENT DOCUMENTS

| | | | | |
|---|---|---|---|---|
| 2004/0115239 | A1* | 6/2004 | Shastri | A61L 27/28 424/423 |
| 2007/0045777 | A1 | 3/2007 | Gillies | |
| 2008/0187651 | A1* | 8/2008 | Lee | C09D 11/52 427/77 |
| 2009/0020924 | A1* | 1/2009 | Lin | B81C 1/00031 264/605 |
| 2011/0068321 | A1 | 3/2011 | Pickett et al. | |
| 2011/0110864 | A1* | 5/2011 | Ibanez | C09K 11/025 424/9.6 |
| 2012/0058307 | A1* | 3/2012 | Yun | B05D 5/02 428/143 |
| 2013/0075692 | A1 | 3/2013 | Naasani et al. | |
| 2014/0227548 | A1* | 8/2014 | Myrick | C06B 45/30 428/570 |
| 2014/0264196 | A1 | 9/2014 | Werner et al. | |
| 2017/0084874 | A1* | 3/2017 | Baker | H01L 51/5275 |

OTHER PUBLICATIONS

International Search Report of International Application No. PCT/EP2018/064442, dated Dec. 10, 2018.

* cited by examiner

INK COMPRISING ENCAPSULATED NANOPARTICLES, METHOD FOR DEPOSITING THE INK, AND A PATTERN, PARTICLE AND OPTOELECTRONIC DEVICE COMPRISING THE INK

FIELD OF INVENTION

The present invention pertains to the field of inks. In particular, the invention relates to inks comprising particles.

BACKGROUND OF INVENTION

Panel displays and other thin film optoelectronic devices involve the creation of precise patterns on a support. Inkjet printing is a useful technology to achieve these patterns, especially over a large area.

Luminescent inorganic particles, especially semiconductor nanoparticles known as emissive material, are currently used in display devices as phosphors. Printing those nanoparticles on a support to create pixels has become an interest over the last years.

However, an important issue regarding inkjet printing is the abrasion of the printing elements such as printing systems, printheads and especially nozzles. The abrasion can be a mechanical and/or chemical abrasion, due to the hardness and roughness of the particles comprised in the ink, and to the chemically aggressive particles comprised in the ink respectively. This will cause the protective overcoat layer of the printhead to wear prematurely. This abrasion phenomenon induces also diminished performance, early deterioration and a shorten lifetime of the printing elements.

Therefore, there is a real need for solutions reducing the chances of abrasion of the printing elements.

To ensure a long lifetime of the printing elements, mechanical and/or chemical reactions between the printing elements surface and the particles comprised in the ink have to be prevented. This can be achieved by encapsulating said particles in a protective material that will prevent such reactions. The encapsulation of particles in a material can help tailoring the hardness, shape and roughness of said particles and provide a barrier between said particles and the printing elements surface. This protective material has then a dual role as it can protect the printing elements from reaction with the particles and protect said particles from the environment, ensuring this way a long lifetime of the printing elements and a long-term stability of the particles in the environment. However, this encapsulation should not be at the expense of the particles properties.

It is known to coat nanoparticles with a protective shell, i.e., to encapsulate nanoparticles in another material, to prevent deteriorating species or harmful compounds, such as water, oxygen or other harmful compounds, from reaching said nanoparticles surface. Silica is known to be an insulating protective material for nanoparticles.

For example, U.S. Pat. No. 9,425,365 discloses the encapsulation of quantum dots, including a nanocrystalline core and a nanocrystalline shell, in mesoporous silica using a reverse micellar method. The obtained particles are mesoporous silica nanoparticles, each comprising only one quantum dot. However, said particles are mesoporous which means that they comprise a porous network of silica that allows access to the quantum dots surface for deteriorating species, like water and oxygen, or other harmful compounds. The protection of said surface is thus ineffective and does not enable a long-term stability in time and temperature.

Gui et al. discloses the encapsulation of multiple PbSe quantum dots in silica particles using a base-catalyzed sol-gel method (Analyst, 2013, 138, 5956). However, said PbSe quantum dots are aggregated in the silica particles, resulting in a decrease of the photoluminescence quantum yield. The silica particles are porous, allowing access to the quantum dots surface for deteriorating species, like water, oxygen or other harmful compounds.

Preparing an ink comprising semiconductor nanoparticles (i.e., quantum dots) can also be fastidious and time consuming as a functionalization step is needed to render the semiconductor nanoparticles compatible with the liquid vehicle of the ink. This additional step always results in a degradation of the photoluminescence properties of said nanoparticles, especially photoluminescence quantum yield. Encapsulating said nanoparticles in a protective material readily compatible with the liquid vehicle of the ink allows for a faster preparation as the functionalization step is not needed anymore. Furthermore, the photoluminescence properties of said nanoparticles are preserved.

Furthermore, encapsulating particles can be tailored to be air processable allowing an easy manipulation, transport and use of said particles in a device such as an optoelectronic device.

It is therefore an object of the present invention to provide an ink comprising particles encapsulating nanoparticles. These particles have one or more of the following advantages: preventing the abrasion of the printing elements by tailoring the hardness, shape and roughness of said particles; enhanced stability over temperature, environment variations and deteriorating species like water and oxygen, or other harmful compounds attacks; coupling the properties of different nanoparticles encapsulated in the same particle; preventing a decrease of the properties of encapsulated nanoparticles; enhanced photoluminescence quantum yield; enhanced resistance to photobleaching and enhanced resistance to photon flux in the case of luminescent particles; air processable particles.

Said particles can also easily comply with ROHS requirements depending on the protective materials selected. It is a great advantage to have ROHS compliant particles while preserving the properties of encapsulated nanoparticles that may not be ROHS compliant themselves.

SUMMARY

In a first aspect, the present invention relates to an ink comprising:

at least one particle comprising a first material; and at least one liquid vehicle;

wherein the particle comprises at least one particle comprising a second material and at least one nanoparticle dispersed in said second material;

wherein the first material and the second material have an extinction coefficient less or equal to $15\times10^{-5}$ at 460 nm; or at least one particle comprising a plurality of nanoparticles encapsulated in a material; and at least one liquid vehicle;

wherein said particle has a surface roughness less or equal to 5% of the largest dimension of said particle; or at least one phosphor nanoparticle; and at least one liquid vehicle;

wherein the phosphor nanoparticle has a size ranging from 0.1 μm to 50 μm; or at least one particle comprising a first material; and at least one liquid vehicle;

wherein the particle comprises at least one particle comprising a second material and at least one nanoparticle dispersed in said second material;
wherein said particle has a surface roughness less or equal to 5% of the largest dimension of said particle.

In one embodiment, the first material limits or prevents the diffusion of outer molecular species or fluids (liquid or gas) into said first material.

According to one embodiment, the specific property of the particle 2 is preserved after encapsulation in the particle 1.

According to one embodiment, the photoluminescence of the particle 2 is preserved after encapsulation in the particle 1.

According to one embodiment, the first material has a density ranging from 1 to 10, preferably the first material has a density ranging from 3 to 10 $g/cm^3$.

In one embodiment, the first material has a density ranging from 1 to 10.

In one embodiment, the first material has a density superior or equal to the density of the second material.

In one embodiment, the first material has a thermal conductivity at standard conditions of at least 0.1 W/(m·K).

In one embodiment, the at least one nanoparticle is a luminescent nanoparticle.

In one embodiment, the at least one nanoparticle is a semiconductor nanocrystal.

In one embodiment, the semiconductor nanocrystal comprises a core comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

In one embodiment, the semiconductor nanocrystal comprises at least one shell comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

In one embodiment, the semiconductor nanocrystal is a semiconductor nanoplatelet.

In one embodiment, the at least one liquid vehicle comprises a liquid including but not limited to: 1-methoxy-2-propanol, 2-pyrrolidinone, C4 to C8 1,2-alkanediol, aliphatic or alicycle ketone, methyl ethyl ketone, C1-C4 alkanol such as for example methanol, ethanol, methanol or isopropanol, water, or a mixture thereof.

In one embodiment, the at least one phosphor nanoparticle comprises a material including but not limited to: blue phosphors; red phosphors; orange phosphors; green phosphors; and yellow phosphors.

In another aspect, the present invention relates to a particle deposited on a support by inkjet printing; wherein the particle comprises:

- a first material, and at least one particle comprising a second material and at least one nanoparticle dispersed in said second material; and wherein the first material and the second material have an extinction coefficient less or equal to $15\times10^{-5}$ at 460 nm; or

- a first material, and at least one particle comprising a second material and at least one nanoparticle dispersed in said second material; and wherein said particle has a surface roughness less or equal to 5% of the largest dimension of said particle.

In another aspect, the present invention relates to a particle deposited on a support by inkjet printing;
wherein said particle comprises a plurality of nanoparticles encapsulated in a material; and
wherein said particle has a surface roughness less or equal to 5% of the largest dimension of said particle.

In another aspect, the present invention relates to a pattern comprising at least one ink of the invention deposited by inkjet printing on a support.

In one embodiment, the support is a LED chip or micro-sized LED.

In another aspect, the present invention relates to an optoelectronic device comprising at least one ink of the invention.

In another aspect, the present invention relates to a method for depositing an ink of the invention on a support. comprising:

- printing the ink on a support using inkjet printing; and
- evaporating the solvent and/or the liquid vehicle.

Definitions

In the present invention, the following terms have the following meanings:

- "Acidic function" refers to COOH group.
- "Activated acidic function" refers to an acidic function wherein the OH is replaced by a better leaving group.
- "Activated alcoholic function" refers to an alcoholic function modified to be a better leaving group.
- "Adjacent particle" refers to neighbouring particles in a space or a volume, without any other particle between said adjacent particles.
- "Alkenyl" refers to any linear or branched hydrocarbon chain having at least one double bond, of 2 to 12 carbon atoms, and preferably 2 to 6 carbon atoms. The alkenyl group may be substituted. Examples of alkenyl groups are ethenyl, 2-propenyl, 2-butenyl, 3-butenyl, 2-pentenyl and its isomers, 2-hexenyl and its isomers, 2,4-pentadienyl and the like. The alkenyl group may be substituted by a saturated or unsaturated aryl group.

The terms "Alkenylene" means an alkenyl group as defined above having two single bonds as points of attachment to other groups.

"Alkoxy" refers to any O-alkyl group, preferably an O-alkyl group wherein the alkyl group has 1 to 6 carbon atoms.

"Alkyl" refers to any saturated linear or branched hydrocarbon chain, with 1 to 12 carbon atoms, preferably 1 to 6 carbon atoms, and more preferably methyl, ethyl, propyl, isopropyl, n-butyl, sec-butyl, isobutyl and tert-butyl. The alkyl group may be substituted by a saturated or unsaturated aryl group.

When the suffix "ene" ("alkylene") is used in conjunction with an alkyl group, this is intended to mean the alkyl group as defined herein having two single bonds as points of attachment to other groups. The term "alkylene" includes methylene, ethylene, methylmethylene, propylene, ethylethylene, and 1,2-dimethylethylene.

"Alkynyl", refers to any linear or branched hydrocarbon chain having at least one triple bond, of 2 to 12 carbon atoms, and preferably 2 to 6 carbon atoms.

"Amine" refers to any group derived from ammoniac $NH_3$ by substitution of one or more hydrogen atoms with an organic radical.

"Aqueous solvent" is defined as a unique-phase solvent wherein water is the main chemical species in terms of molar ratio and/or in terms of mass and/or in terms of volume in respect to the other chemical species contained in said aqueous solvent. The aqueous solvent includes but is not limited to: water, water mixed with an organic solvent miscible with water such as for example methanol, ethanol, acetone, tetrahydrofuran, n-methylformamide, n,n-dimethylformamide, dimethylsulfoxide or a mixture thereof.

"Aryl" refers to a mono- or polycyclic system of 5 to 20, and preferably 6 to 12, carbon atoms having one or more aromatic rings (when there are two rings, it is called a biaryl) among which it is possible to cite the phenyl group, the biphenyl group, the 1-naphthyl group, the 2-naphthyl group, the tetrahydronaphthyl group, the indanyl group and the binaphthyl group. The term aryl also means any aromatic ring including at least one heteroatom chosen from an oxygen, nitrogen or sulfur atom. The aryl group can be substituted by 1 to 3 substituents chosen independently of one another, among a hydroxyl group, a linear or branched alkyl group comprising 1, 2, 3, 4, 5 or 6 carbon atoms, in particular methyl, ethyl, propyl, butyl, an alkoxy group or a halogen atom, in particular bromine, chlorine and iodine, a nitro group, a cyano group, an azido group, an adhehyde group, a boronato group, a phenyl, CF3, methylenedioxy, ethylenedioxy, SO2NRR', NRR', COOR (where R and R' are each independently selected from the group consisting of H and alkyl), an second aryl group which may be substituted as above. Non-limiting examples of aryl comprise phenyl, biphenylyl, biphenylenyl, 5- or 6-tetralinyl, naphthalen-1- or -2-yl, 4-, 5-, 6 or 7-indenyl, 1- 2-, 3-, 4- or 5-acenaphtylenyl, 3-, 4- or 5-acenaphtenyl, 1- or 2-pentalenyl, 4- or 5-indanyl, 5-, 6-, 7- or 8-tetrahydronaphthyl, 1,2,3,4-tetrahydronaphthyl, 1,4-dihydronaphthyl, 1-, 2-, 3-, 4- or 5-pyrenyl.

"Arylalkoxy" refers to an alkoxy group substituted by an aryl group.

"Arylalkyl" refers to an alkyl group substituted by an aryl group, such as for example the phenyl-methyl group.

The term "Arylene" as used herein is intended to include divalent carbocyclic aromatic ring systems such as phenylene, biphenylylene, naphthylene, indenylene, pentalenylene, azulenylene and the like.

"Aryloxy" refers to any O-aryl group.

"Azido" refers to $N_3$ group.

"Colloidal" refers to a substance in which particles are dispersed, suspended and do not settle or would take a very long time to settle appreciably, but are not soluble in said substance.

"Colloidal particles" refers to particles that may be dispersed, suspended and which would not settle or would take a very long time to settle appreciably in another substance, typically in an aqueous or organic solvent, and which are not soluble in said substance. "Colloidal particles" does not refer to particles grown on substrate.

"Core" refers to the innermost space within a particle.

"Curvature" refers to the reciprocal of the radius.

"Cycle" refers to a saturated, partially unsaturated or unsaturated cyclic group.

"Display apparatus" refers to an apparatus or a device that displays an image signal.

Display devices or display apparatus include all devices that display an image, a succession of pictures or a video such as, non-limitatively, a LCD display device, a television, a projector, a computer monitor, a personal digital assistant, a mobile phone, a laptop computer, a tablet PC, an MP3 player, a CD player, a DVD player, a Blu-Ray player, a head mounted display, glasses, a helmet, a headgear, a headwear, a smart watch, a watch phone or a smart device.

"Encapsulate" refers to a material that coats, surrounds, embeds, contains, comprises, wraps, packs, or encloses a plurality of particles.

The terms "Film", "Layer" or "Sheet" are interchangeable in the present invention.

"Free of oxygen" refers to a formulation, a solution, a film, or a composition that is free of molecular oxygen, $O_2$, i.e., wherein molecular oxygen may be present in said formulation, solution, film, or composition in an amount of less than about 10 ppm, 5 ppm, 4 ppm, 3 ppm, 2 ppm, 1 ppm, 500 ppb, 300 ppb or in an amount of less than about 100 ppb in weight.

"Free of water" refers to a formulation, a solution, a film, or a composition that is free of molecular water, $H_2O$, i.e., wherein molecular water may be present in said formulation, solution, film, or composition in an amount of less than about 100 ppm, 50 ppm, 10 ppm, 5 ppm, 4 ppm, 3 ppm, 2 ppm, 1 ppm, 500 ppb, 300 ppb or in an amount of less than about 100 ppb in weight.

"Gas" refers to a substance in a gaseous state in standard conditions of pressure and temperature.

"Halogen" means fluoro, chloro, bromo, or iodo. Preferred halo groups are fluoro and chloro.

"Heterocycle" refers to a saturated, partially unsaturated or unsaturated cyclic group comprising at least on heteroatom.

"Impermeable" refers to a material that limits or prevents the diffusion of outer molecular species or fluids (liquid or gas) into said material.

"Loading charge" refers to the mass ratio between the mass of an ensemble of objects comprised in a space and the mass of said space.

"Monodisperse" refers to particles or droplets, wherein the size difference is inferior than 20%, 15%, 10%, preferably 5%.

"Narrow size distribution" refers to a size distribution of a statistical set of particles less than 1%, 2%, 3%, 4%, 5%, 6%, 7%, 8%, 9%, 10%, 15%, 20%, 25%, 30%, 35%, or 40% of the average size.

"Nanoplatelet" refers to a 2D shaped nanoparticle, wherein the smallest dimension of said nanoplatelet is smaller than the largest dimension of said nanoplatelet by a factor (aspect ratio) of at least 1.5, at least 2, at least 2.5, at least 3, at least 3.5, at least 4, at least 4.5, at least 5, at least 5.5, at least 6, at least 6.5, at least 7, at least 7.5, at least 8, at least 8.5, at least 9, at least 9.5 or at least 10.

"Optically transparent" refers to a material that absorbs less than 10%, 5%, 2.5%, 1%, 0.99%, 0.98%, 0.97%, 0.96%, 0.95%, 0.94%, 0.93%, 0.92%, 0.91%, 0.9%, 0.89%, 0.88%, 0.87%, 0.86%, 0.85%, 0.84%, 0.83%, 0.82%, 0.81%, 0.8%, 0.79%, 0.78%, 0.77%, 0.76%, 0.75%, 0.74%, 0.73%, 0.72%, 0.71%, 0.7%, 0.69%, 0.68%, 0.67%, 0.66%, 0.65%, 0.64%, 0.63%, 0.62%, 0.61%, 0.6%, 0.59%, 0.58%, 0.57%, 0.56%, 0.55%, 0.54%, 0.53%, 0.52%, 0.51%, 0.5%, 0.49%, 0.48%, 0.47%, 0.46%, 0.45%, 0.44%, 0.43%, 0.42%, 0.41%, 0.4%, 0.39%, 0.38%, 0.37%, 0.36%, 0.35%, 0.34%, 0.33%, 0.32%, 0.31%, 0.3%, 0.29%, 0.28%, 0.27%, 0.26%, 0.25%, 0.24%, 0.23%, 0.22%, 0.21%, 0.2%, 0.19%, 0.18%, 0.17%, 0.16%, 0.15%, 0.14%, 0.13%, 0.12%, 0.11%, 0.1%, 0.09%, 0.08%, 0.07%, 0.06%, 0.05%, 0.04%, 0.03%, 0.02%, 0.01%, 0.009%, 0.008%, 0.007%, 0.006%, 0.005%, 0.004%, 0.003%, 0.002%, 0.001%, 0.0009%, 0.0008%, 0.0007%, 0.0006%, 0.0005%, 0.0004%, 0.0003%, 0.0002%, 0.0001%, or 0% of light at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

"Outer molecular species or fluids (liquid or gas)" refers to molecular species or fluids (liquid or gas) coming from outside a material or a particle.

"Packing fraction" refers to the volume ratio between the volume filled by an ensemble of objects into a space and the volume of said space. The terms packing fraction, packing density and packing factor are interchangeable in the present invention.

"Partially" means incomplete. In the case of a ligand exchange, partially means that 5%, 10%, 15%, 20%, 25%, 30%, 35%, 40%, 45%, 50%, 55%, 60%, 65%, 70%, 75%, 80%, 85%, 90%, 95% of the ligands at the surface of a particle have been successfully exchanged.

"Permeable" refers to a material that allows the diffusion of outer molecular species or fluids (liquid or gas) into said material.

"Pixel pitch" refers to the distance from the center of a pixel to the center of the next pixel.

"Polydisperse" refers to particles or droplets of varied sizes, wherein the size difference is superior or equal to 20%.

"Population of particles" refers to a statistical set of particles having the same maximum emission wavelength.

"Resulting light" refers to the light supplied by a material after excitation by an incident light and emission of a secondary light. For example, resulting light refers to the light supplied by the luminescent particles, the light emitting material or the color conversion layer and is a combination of a part of the incident light and the secondary light.

"ROHS compliant" refers to a material compliant with Directive 2011/65/EU of the European Parliament and of the Council of 8 Jun. 2011 on the restriction of the use of certain hazardous substances in electrical and electronic equipment.

"Roughness" refers to a surface state of a particle. Surface irregularities can be present at the surface of particles and are defined as peaks or cavities depending on their relative position respect to the average particle surface. All said irregularities constitute the particle roughness. Said roughness is defined as the height difference between the highest peak and the deepest cavity on the surface. The surface of a particle is smooth if they are no irregularities on said surface, i.e., the roughness is equal to 0%, 0.0001%, 0.0002%, 0.0003%, 0.0004%, 0.0005%, 0.0006%, 0.0007%, 0.0008%, 0.0009%, 0.001%, 0.002%, 0.003%, 0.004%, 0.005%, 0.006%, 0.007%, 0.008%, 0.009%, 0.01%, 0.02%, 0.03%, 0.04%, 0.05%, 0.06%, 0.07%, 0.08%, 0.09%, 0.1%, 0.11%, 0.12%, 0.13%, 0.14%, 0.15%, 0.16%, 0.17%, 0.18%, 0.19%, 0.2%, 0.21%, 0.22%, 0.23%, 0.24%, 0.25%, 0.26%, 0.27%, 0.28%, 0.29%, 0.3%, 0.31%, 0.32%, 0.33%, 0.34%, 0.35%, 0.36%, 0.37%, 0.38%, 0.39%, 0.4%, 0.41%, 0.42%, 0.43%, 0.44%, 0.45%, 0.46%, 0.47%, 0.48%, 0.49%, 0.5%, 1%, 1.5%, 2%, 2.5% 3%, 3.5%, 4%, 4.5%, or 5% of the largest dimension of said particle.

"Secondary light" refers to the light emitted by a material in response to an excitation. Said excitation is generally provided by the light source, i.e., the excitation is the incident light. For example, secondary light refers to the light emitted by the luminescent particles, the light emitting material or the color conversion layer in response to an excitation of the particles comprised in said luminescent particles.

"Shell" refers to at least one monolayer of material coating partially or totally a core.

"Standard conditions" refers to the standard conditions of temperature and pressure, i.e., 273.15 K and $10^5$ Pa respectively.

"Statistical set" refers to a collection of at least 2, 3, 4, 5, 6, 7, 8, 9, 10, 11, 12, 13, 14, 15, 16, 17, 18, 19, 20, 30, 40, 50, 60, 70, 80, 90, 100, 150, 200, 250, 300, 350, 400, 450, 500, 550, 600, 650, 700, 750, 800, 850, 900, 950, or 1000 objects obtained by the strict same process. Such statistical set of objects allows determining average characteristics of said objects, for example their average size, their average size distribution or the average distance between them.

"Surfactant-free" refers to a particle that does not comprise any surfactant and was not synthesized by a method comprising the use of surfactants.

"Uniformly dispersed" refers to particles that are not aggregated, do not touch, are not in contact, and are separated by an inorganic material. Each particle is spaced from their adjacent particles by an average minimal distance.

"UV curing" refers to a process in which ultraviolet light (UV) and/or visible light is used to initiate a photochemical reaction that generates a crosslinked network of polymers. Various systems may be used for UV curing, including, without limitation, mercury vapor lamps, UV LEDs and fluorescent lamps.

DETAILED DESCRIPTION

The following detailed description will be better understood when read in conjunction with the drawings. For the purpose of illustrating, the ink is shown in the preferred embodiments. It should be understood, however that the application is not limited to the precise arrangements, structures, features, embodiments, and aspect shown. The drawings are not drawn to scale and are not intended to limit the scope of the claims to the embodiments depicted. Accordingly it should be understood that where features mentioned in the appended claims are followed by reference signs, such signs are included solely for the purpose of enhancing the intelligibility of the claims and are in no way limiting on the scope of the claims.

In a first aspect, the present invention relates to an ink comprising:

at least one particle comprising a first material; and at least one liquid vehicle;

wherein the particle comprises at least one particle comprising a second material and at least one nanoparticle dispersed in said second material;

wherein the first material and the second material have an extinction coefficient less or equal to $15\times10^{-5}$ at 460 nm; or at least one particle comprising a plurality of nanoparticles encapsulated in a material; and at least one liquid vehicle;

wherein said particle has a surface roughness less or equal to 5% of the largest dimension of said particle; or at least one phosphor nanoparticle; and at least one liquid vehicle;

wherein the phosphor nanoparticle has a size ranging from 0.1 μm to 50 μm; or at least one particle comprising a first material; and at least one liquid vehicle;

wherein the particle comprises at least one particle comprising a second material and at least one nanoparticle dispersed in said second material;

wherein said particle has a surface roughness less or equal to 5% of the largest dimension of said particle.

This invention relates to an ink comprising at least one particle 1 (illustrated in FIG. 1) comprising a first material 11 and at least one liquid vehicle; wherein the particle 1 comprises at least one particle 2 comprising a second material 21 and at least one nanoparticle 3 dispersed in said second material 21; and wherein the first material 11 and the second material 21 have an extinction coefficient less or equal to $15\times10^{-5}$ at 460 nm.

The encapsulation of the at least one particle 2 in the first material 11 allows for an increased protection of the at least one nanoparticle 3 regarding the diffusion of outer molecular species or fluids (liquid or gas), especially deteriorating species like $O_2$ and $H_2O$ to the surface of said nanoparticle 3. The first material 11 acts as a supplementary barrier against outer molecular species or fluids that could impair the properties of the at least one nanoparticle 3.

The "double encapsulation" of nanoparticles 3 have several advantages: i) it allows a passivation of nanoparticles 3 surface, thus a better protection of said nanoparticles 3 from temperature, environment variations and deteriorating species like water and oxygen therefore preventing the degradation of said nanoparticles 3; ii) in the case of luminescent nanoparticles 3 it helps preventing photoluminescence quantum yield decrease and photoluminescence decrease due to interaction with the environment; iii) it allows the scattering of the light emitted by a light source and the light resulting from the excitation of said nanoparticles 3.

Particles 1 of the invention are also particularly interesting as they can easily comply with ROHS requirements depending on the first and second materials (11, 21) selected. It is then possible to have ROHS compliant particles while preserving the properties of nanoparticles 3. that may not be ROHS compliant themselves.

In one embodiment, the extinction coefficient is measured by an absorbance measuring technique such as absorbance spectroscopy or any other method known in the art.

According to one embodiment, the particle 1 is air processable. This embodiment is particularly advantageous for the manipulation or the transport of said particle 1 and for the use of an ink comprising said particle 1 in a device such as an optoelectronic device.

According to one embodiment, the particle 1 is compatible with standard lithography processes. This embodiment is particularly advantageous for the use of an ink comprising said particle 1 in a device such as an optoelectronic device.

According to one embodiment, the particle 1 is a colloidal particle.

According to one embodiment, the particle 1 does not comprise a spherical porous bead, preferably the particle 1 does not comprise a central spherical porous bead.

According to one embodiment, the particle 1 does not comprise a spherical porous bead, wherein nanoparticles 3 are linked to the surface of said spherical porous bead.

According to one embodiment, the particle 1 does not comprise a bead and nanoparticles 3 having opposite electronic charges.

According to one embodiment, the particle 1 is dispersible in aqueous solvents, organic solvents and/or mixture thereof.

According to one embodiment, the particle 1 is dispersible in the liquid vehicle.

According to one embodiment, the particle 1 does not comprise organic molecules or polymer chains.

According to one embodiment, the particle 1 is coated by an organic layer comprising organic molecules or polymer chains.

According to one embodiment, the particle 1 is coated by an organic layer comprising polymerizable groups. In this embodiment, polymerizable groups are capable of undergoing a polymerization reaction. According to one embodiment, the particle 1 incorporates polymerizable groups (e.g., in the first (11) and/or second (21) materials). In this embodiment, polymerizable groups are capable of undergoing a polymerization reaction.

According to one embodiment, examples of polymerizable groups include but are not limited to:

vinyl monomers, acrylate monomers, methacrylate monomers, ethylacrylate monomers, acrylamide monomers, methacrylamide monomers, ethyl acrylamide monomers, ethylene glycol monomers, epoxide monomers, glycidyl monomers, olefin monomers, norbornyl monomers, isocyanide monomers, and any of the above mention in di/tri functional group format, or a mixture thereof.

According to one embodiment, the polymerization reaction can be achieved by thermal curing.

According to one embodiment, the polymerization reaction can be achieved by UV curing. An example of such process is described, e.g., in WO2017063968, WO2017063983 and WO2017162579. Briefly, the particle 1 can be coated and/or can incorporate a photoinitiator, a thiol compound and polymeric particles comprising a polymer, an oligomer or a monomer (preferably having ethylenically unsaturated polymerizable groups).

According to one embodiment, the particle 1 is luminescent.

According to one embodiment, the particle 1 is fluorescent.

According to one embodiment, the particle 1 is phosphorescent.

According to one embodiment, the particle 1 is electroluminescent.

According to one embodiment, the particle 1 is chemiluminescent.

According to one embodiment, the particle 1 is triboluminescent.

According to one embodiment, the features of the light emission of particle 1 are sensible to external pressure variations. In this embodiment, "sensible" means that the features of the light emission can be modified by external pressure variations.

According to one embodiment, the wavelength emission peak of particle 1 is sensible to external pressure variations. In this embodiment, "sensible" means that the wavelength emission peak can be modified by external pressure variations, i.e., external pressure variations can induce a wavelength shift.

According to one embodiment, the FWHM of particle 1 is sensible to external pressure variations. In this embodiment, "sensible" means that the FWHM can be modified by external pressure variations, i.e., FWHM can be reduced or increased.

According to one embodiment, the PLQY of particle 1 is sensible to external pressure variations. In this embodiment, "sensible" means that the PLQY can be modified by external pressure variations, i.e., PLQY can be reduced or increased.

According to one embodiment, the features of the light emission of particle 1 are sensible to external temperature variations.

According to one embodiment, the wavelength emission peak of particle 1 is sensible to external temperature variations. In this embodiment, "sensible" means that the wavelength emission peak can be modified by external temperature variations, i.e., external temperature variations can induce a wavelength shift.

According to one embodiment, the FWHM of particle 1 is sensible to external temperature variations. In this embodiment, "sensible" means that the FWHM can be modified by external temperature variations, i.e., FWHM can be reduced or increased.

According to one embodiment, the PLQY of particle 1 is sensible to external temperature variations. In this embodiment, "sensible" means that the PLQY can be modified by external temperature variations, i.e., PLQY can be reduced or increased.

According to one embodiment, the features of the light emission of particle 1 are sensible to external variations of pH.

According to one embodiment, the wavelength emission peak of particle 1 is sensible to external variations of pH. In this embodiment, "sensible" means that the wavelength emission peak can be modified by external variations of pH, i.e., external variations of pH can induce a wavelength shift.

According to one embodiment, the FWHM of particle 1 is sensible to e external variations of pH. In this embodiment, "sensible" means that the FWHM can be modified by external variations of pH, i.e., FWHM can be reduced or increased.

According to one embodiment, the PLQY of particle 1 is sensible to external variations of pH. In this embodiment, "sensible" means that the PLQY can be modified by external variations of pH, i.e., PLQY can be reduced or increased.

According to one embodiment, the particle 1 comprise at least one nanoparticle wherein the wavelength emission peak is sensible to external temperature variations; and at least one nanoparticle wherein the wavelength emission peak is not or less sensible to external temperature variations. In this embodiment, "sensible" means that the wavelength emission peak can be modified by external temperature variations, i.e., wavelength emission peak can be reduced or increased. This embodiment is particularly advantageous for temperature sensor applications.

According to one embodiment, the particle 1 exhibits an emission spectrum with at least one emission peak, wherein said emission peak has a maximum emission wavelength ranging from 400 nm to 50 μm.

According to one embodiment, the particle 1 exhibits an emission spectrum with at least one emission peak, wherein said emission peak has a maximum emission wavelength ranging from 400 nm to 500 nm. In this embodiment, the particle 1 emits blue light.

According to one embodiment, the particle 1 exhibits an emission spectrum with at least one emission peak, wherein said emission peak has a maximum emission wavelength ranging from 500 nm to 560 nm, more preferably ranging from 515 nm to 545 nm. In this embodiment, the particle 1 emits green light.

According to one embodiment, the particle 1 exhibits an emission spectrum with at least one emission peak, wherein said emission peak has a maximum emission wavelength ranging from 560 nm to 590 nm. In this embodiment, the particle 1 emits yellow light.

According to one embodiment, the particle 1 exhibits an emission spectrum with at least one emission peak, wherein said emission peak has a maximum emission wavelength ranging from 590 nm to 750 nm, more preferably ranging from 610 nm to 650 nm. In this embodiment, the particle 1 emits red light.

According to one embodiment, the particle 1 exhibits an emission spectrum with at least one emission peak, wherein said emission peak has a maximum emission wavelength ranging from 750 nm to 50 μm. In this embodiment, the particle 1 emits near infra-red, mid-infra-red, or infra-red light.

According to one embodiment, the particle 1 exhibits emission spectra with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the particle 1 exhibits emission spectra with at least one emission peak having a full width half maximum strictly lower than 40 nm, 30 nm, 25 nm, 20 nm, 15 nm, or 10 nm.

According to one embodiment, the particle 1 exhibits emission spectra with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the particle 1 exhibits emission spectra with at least one emission peak having a full width at quarter maximum strictly lower than 40 nm, 30 nm, 25 nm, 20 nm, 15 nm, or 10 nm.

According to one embodiment, the particle 1 has a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99% or 100%.

According to one embodiment, the particle 1 absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the particle 1 has an average fluorescence lifetime of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, or 1 µsecond.

In one embodiment, the particle 1 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$.

In one preferred embodiment, the particle 1 exhibits photoluminescence quantum yield (PQLY) decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$.

In one embodiment, the particle 1 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$.

In one preferred embodiment, the particle 1 exhibits FCE decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$.

According to one embodiment, the particle 1 has a size above 50 nm.

According to one embodiment, the particle 1 has a size of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, a statistical set of particles 1 has an average size of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the particle 1 has a largest dimension of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the particle 1 has a smallest dimension of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the smallest dimension of the particle 1 is smaller than the largest dimension of said particle 1 by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100; at least 150; at least 200; at least 250; at least 300; at least 350; at least 400; at least 450; at least 500; at least 550; at least 600; at least 650; at least 700; at least 750; at least 800; at least 850; at least 900; at least 950; or at least 1000.

According to one embodiment, the particle 1 has a smallest curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$ 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the particle 1 has a largest curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, in a statistical set of particles 1, said particles 1 are polydisperse.

According to one embodiment, in a statistical set of particles 1, said particles 1 are monodisperse.

According to one embodiment, in a statistical set of particles 1, said particles 1 have a narrow size distribution.

According to one embodiment, in a statistical set of particles 1, said particles 1 are not aggregated.

According to one embodiment, in an ink comprising a plurality of particles 1, said particles 1 are polydisperse.

According to one embodiment, in an ink comprising a plurality of particles 1, said particles 1 are monodisperse.

According to one embodiment, in an ink comprising a plurality of particles 1, said particles 1 have a narrow size distribution.

According to one embodiment, in an ink comprising a plurality of particles 1, said particles 1 are not aggregated in the liquid vehicle.

According to one embodiment, in an ink comprising a plurality of particles 1, said particles 1 are not in contact in the liquid vehicle.

According to one embodiment, in an ink comprising a plurality of particles 1, said particles 1 are individually dispersed in the liquid vehicle.

According to one embodiment, in an ink comprising a plurality of particles 1, said particles 1 are aggregated in the liquid vehicle.

According to one embodiment, in an ink comprising a plurality of particles 1, said particles 1 are in contact in the liquid vehicle.

According to one embodiment, the surface roughness of the particle 1 is less or equal to 0%, 0.0001%, 0.0002%, 0.0003%, 0.0004%, 0.0005%, 0.0006%, 0.0007%, 0.0008%, 0.0009%, 0.001%, 0.002%, 0.003%, 0.004%, 0.005%, 0.006%, 0.007%, 0.008%, 0.009%, 0.01%, 0.02%, 0.03%, 0.04%, 0.05%, 0.06%, 0.07%, 0.08%, 0.09%, 0.1%, 0.11%, 0.12%, 0.13%, 0.14%, 0.15%, 0.16%, 0.17%, 0.18%, 0.19%, 0.2%, 0.21%, 0.22%, 0.23%, 0.24%, 0.25%, 0.26%, 0.27%, 0.28%, 0.29%, 0.3%, 0.31%, 0.32%, 0.33%, 0.34%, 0.35%, 0.36%, 0.37%, 0.38%, 0.39%, 0.4%, 0.41%, 0.42%, 0.43%, 0.44%, 0.45%, 0.46%, 0.47%, 0.48%, 0.49%, 0.5%, 1%, 1.5%, 2%, 2.5% 3%, 3.5%, 4%, 4.5%, or 5% of the largest dimension of said particle 1, meaning that the surface of said particle 1 is completely smooth.

According to one embodiment, the surface roughness of the particle 1 is less or equal to 0.5% of the largest dimension of said particle 1, meaning that the surface of said particle 1 is completely smooth.

According to one embodiment, the particle 1 has a spherical shape, an ovoid shape, a discoidal shape, a cylindrical shape, a faceted shape, a hexagonal shape, a triangular shape, a cubic shape, or a platelet shape.

According to one embodiment, the particle 1 has a raspberry shape, a prism shape, a polyhedron shape, a snowflake shape, a flower shape, a thorn shape, a hemisphere shape, a cone shape, a urchin shape, a filamentous shape, a biconcave discoid shape, a worm shape, a tree shape, a dendrite shape, a necklace shape, a chain shape, or a bush shape.

According to one embodiment, the particle 1 has a spherical shape, or the particle 1 is a bead.

According to one embodiment, the particle 1 is hollow, i.e., the particle 1 is a hollow bead.

According to one embodiment, the particle 1 does not have a core/shell structure.

According to one embodiment, the particle 1 has a core/shell structure as described hereafter.

According to one embodiment, the particle 1 is not a fiber.

According to one embodiment, the particle 1 is not a matrix with undefined shape.

According to one embodiment, the particle 1 is not macroscopical piece of glass. In this embodiment, a piece of glass refers to glass obtained from a bigger glass entity for example by cutting it, or to glass obtained by using a mold. In one embodiment, a piece of glass has at least one dimension exceeding 1 mm.

According to one embodiment, the particle 1 is not obtained by reducing the size of the first material 11. For example, particle 1 is not obtained by milling a piece of first material 11, nor by cutting it, nor by firing it with projectiles like particles, atoms or electrons, or by any other method.

According to one embodiment, the particle 1 is not obtained by milling bigger particles or by spraying a powder.

According to one embodiment, the particle 1 is not a piece of nanometer pore glass doped with nanoparticles 3.

According to one embodiment, the particle 1 is not a glass monolith.

According to one embodiment, the spherical particle 1 has a diameter of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, a statistical set of spherical particles 1 has an average diameter of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the average diameter of a statistical set of spherical particles 1 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 20%, 30%, 40%, 50%, 60%, 70%, 80%, 85%, 90%, 95%, 100%, 105%, 110%, 115%, 120%, 125%, 130%, 135%, 140%, 145%, 150%, 155%, 160%, 165%, 170%, 175%, 180%, 185%, 190%, 195%, or 200%.

According to one embodiment, the spherical particle 1 has a unique curvature of at least 200 $\mu m^{-1}$, 100 $\mu m^{-1}$, 66.6 $\mu m^{-1}$, 50 $\mu m^{-1}$, 33.3 $\mu m^{-1}$, 28.6 $\mu m^{-1}$, 25 $\mu m^{-1}$, 20 $\mu m^{-1}$, 18.2 $\mu m^{-1}$, 16.7 $\mu m^{-1}$, 15.4 $\mu m^{-1}$, 14.3 $\mu m^{-1}$, 13.3 $\mu m^{-1}$, 12.5 $\mu m^{-1}$, 11.8 $\mu m^{-1}$, 11.1 $\mu m^{-1}$, 10.5 $\mu m^{-1}$, 10 $\mu m^{-1}$, 9.5 $\mu m^{-1}$, 9.1 $\mu m^{-1}$, 8.7 $\mu m^{-1}$, 8.3 $\mu m^{-1}$, 8 $\mu m^{-1}$, 7.7 $\mu m^{-1}$, 7.4 $\mu m^{-1}$, 7.1 $\mu m^{-1}$, 6.9 $\mu m^{-1}$, 6.7 $\mu m^{-1}$, 5.7 $\mu m^{-1}$, 5 $\mu m^{-1}$, 4.4 $\mu m^{-1}$, 4 $\mu m^{-1}$, 3.6 $\mu m^{-1}$, 3.3 $\mu m^{-1}$, 3.1 $\mu m^{-1}$, 2.9 $\mu m^{-1}$, 2.7 $\mu m^{-1}$, 2.5 $\mu m^{-1}$, 2.4 $\mu m^{-1}$, 2.2 $\mu m^{-1}$, 2.1 $\mu m^{-1}$, 2 $\mu m^{-1}$, 1.3333 $\mu m^{-1}$, 0.8 $\mu m^{-1}$, 0.6666 $\mu m^{-1}$, 0.5714 $\mu m^{-1}$, 0.5 $\mu m^{-1}$, 0.4444 $\mu m^{-1}$, 0.4 $\mu m^{-1}$, 0.3636 $\mu m^{-1}$, 0.3333 $\mu m^{-1}$, 0.3080 $\mu m^{-1}$, 0.2857 $\mu m^{-1}$, 0.2667 $\mu m^{-1}$, 0.25 $\mu m^{-1}$, 0.2353 $\mu m^{-1}$, 0.2222 $\mu m^{-1}$, 0.2105 $\mu m^{-1}$, 0.2 $\mu m^{-1}$, 0.1905 $\mu m^{-1}$, 0.1818 $\mu m^{-1}$, 0.1739 $\mu m^{-1}$, 0.1667 $\mu m^{-1}$, 0.16 $\mu m^{-1}$, 0.1538 $\mu m^{-1}$, 0.1481 $\mu m^{-1}$, 0.1429 $\mu m^{-1}$, 0.1379 $\mu m^{-1}$, 0.1333 $\mu m^{-1}$, 0.1290 $\mu m^{-1}$, 0.125 $\mu m^{-1}$, 0.1212 $\mu m^{-1}$, 0.1176 $\mu m^{-1}$, 0.1176 $\mu m^{-1}$, 0.1143 $\mu m^{-1}$, 0.1111 $\mu m^{-1}$, 0.1881 $\mu m^{-1}$, 0.1053 $\mu m^{-1}$, 0.1026 $\mu m^{-1}$, 0.1 $\mu m^{-1}$, 0.0976 $\mu m^{-1}$, 0.9524 $\mu m^{-1}$, 0.0930 $\mu m^{-1}$, 0.0909 $\mu m^{-1}$, 0.0889 $\mu m^{-1}$, 0.870 $\mu m^{-1}$, 0.0851 $\mu m^{-1}$, 0.0833 $\mu m^{-1}$, 0.0816 $\mu m^{-1}$, 0.08 $\mu m^{-1}$, 0.0784 $\mu m^{-1}$, 0.0769 $\mu m^{-1}$, 0.0755 $\mu m^{-1}$, 0.0741 $\mu m^{-1}$, 0.0727 $\mu m^{-1}$, 0.0714 $\mu m^{-1}$, 0.0702 $\mu m^{-1}$, 0.0690 $\mu m^{-1}$, 0.0678 $\mu m^{-1}$, 0.0667 $\mu m^{-1}$, 0.0656 $\mu m^{-1}$, 0.0645 $\mu m^{-1}$, 0.0635 $\mu m^{-1}$, 0.0625 $\mu m^{-1}$, 0.0615 $\mu m^{-1}$, 0.0606 $\mu m^{-1}$, 0.0597 $\mu m^{-1}$, 0.0588 $\mu m^{-1}$, 0.0580 $\mu m^{-1}$, 0.0571 $\mu m^{-1}$, 0.0563 $\mu m^{-1}$, 0.0556 $\mu m^{-1}$, 0.0548 $\mu m^{-1}$, 0.0541 $\mu m^{-1}$, 0.0533 $\mu m^{-1}$, 0.0526 $\mu m^{-1}$, 0.0519 $\mu m^{-1}$, 0.0513 $\mu m^{-1}$, 0.0506 $\mu m^{-1}$, 0.05 $\mu m^{-1}$, 0.0494 $\mu m^{-1}$, 0.0488 $\mu m^{-1}$, 0.0482 $\mu m^{-1}$, 0.0476 $\mu m^{-1}$, 0.0471 $\mu m^{-1}$, 0.0465 $\mu m^{-1}$, 0.0460 $\mu m^{-1}$, 0.0455 $\mu m^{-1}$, 0.0450 $\mu m^{-1}$, 0.0444 $\mu m^{-1}$, 0.0440 $\mu m^{-1}$, 0.0435 $\mu m^{-1}$, 0.0430 $\mu m^{-1}$, 0.0426 $\mu m^{-1}$, 0.0421 $\mu m^{-1}$, 0.0417 $\mu m^{-1}$, 0.0412 $\mu m^{-1}$, 0.0408 $\mu m^{-1}$, 0.0404 $\mu m^{-1}$, 0.04 $\mu m^{-1}$, 0.0396 $\mu m^{-1}$, 0.0392 $\mu m^{-1}$, 0.0388 $\mu m^{-1}$, 0.0385 $\mu m^{-1}$; 0.0381 $\mu m^{-1}$, 0.0377 $\mu m^{-1}$, 0.0374 $\mu m^{-1}$, 0.037 $\mu m^{-1}$, 0.0367 $\mu m^{-1}$, 0.0364 $\mu m^{-1}$, 0.0360 $\mu m^{-1}$, 0.0357 $\mu m^{-1}$, 0.0354 $\mu m^{-1}$, 0.0351 $\mu m^{-1}$, 0.0348 $\mu m^{-1}$, 0.0345 $\mu m^{-1}$, 0.0342 $\mu m^{-1}$, 0.0339 $\mu m^{-1}$, 0.0336 $\mu m^{-1}$, 0.0333 $\mu m^{-1}$, 0.0331 $\mu m^{-1}$, 0.0328 $\mu m^{-1}$, 0.0325 $\mu m^{-1}$, 0.0323 $\mu m^{-1}$, 0.032 $\mu m^{-1}$, 0.0317 $\mu m^{-1}$, 0.0315 $\mu m^{-1}$, 0.0312 $\mu m^{-1}$, 0.031 $\mu m^{-1}$, 0.0308 $\mu m^{-1}$, 0.0305 $\mu m^{-1}$, 0.0303 $\mu m^{-1}$, 0.0301 $\mu m^{-1}$, 0.03 $\mu m^{-1}$, 0.0299 $\mu m^{-1}$, 0.0296 $\mu m^{-1}$, 0.0294 $\mu m^{-1}$, 0.0292 $\mu m^{-1}$, 0.029 $\mu m^{-1}$, 0.0288 μm, 0.0286 $\mu m^{-1}$, 0.0284 $\mu m^{-1}$, 0.0282 $\mu m^{-1}$, 0.028 $\mu m^{-1}$, 0.0278 $\mu m^{-1}$, 0.0276 $\mu m^{-1}$, 0.0274 $\mu m^{-1}$, 0.0272 $\mu m^{-1}$; 0.0270 $\mu m^{-1}$, 0.0268 $\mu m^{-1}$, 0.02667 $\mu m^{-1}$, 0.0265 $\mu m^{-1}$, 0.0263 $\mu m^{-1}$, 0.0261 $\mu m^{-1}$, 0.026 $\mu m^{-1}$, 0.0258 $\mu m^{-1}$, 0.0256 $\mu m^{-1}$, 0.0255 $\mu m^{-1}$, 0.0253 $\mu m^{-1}$, 0.0252 $\mu m^{-1}$, 0.025 $\mu m^{-1}$, 0.0248 $\mu m^{-1}$, 0.0247 $\mu m^{-1}$, 0.0245 $\mu m^{-1}$, 0.0244 $\mu m^{-1}$, 0.0242 $\mu m^{-1}$, 0.0241 $\mu m^{-1}$, 0.024 $\mu m^{-1}$, 0.0238 $\mu m^{-1}$, 0.0237 $\mu m^{-1}$, 0.0235 $\mu m^{-1}$, 0.0234 $\mu m^{-1}$, 0.0233 $\mu m^{-1}$, 0.231 $\mu m^{-1}$, 0.023 $\mu m^{-1}$, 0.0229 $\mu m^{-1}$, 0.0227 $\mu m^{-1}$, 0.0226 $\mu m^{-1}$, 0.0225 $\mu m^{-1}$, 0.0223 $\mu m^{-1}$, 0.0222 $\mu m^{-1}$, 0.0221 $\mu m^{-1}$, 0.022 $\mu m^{-1}$, 0.0219 $\mu m^{-1}$, 0.0217 $\mu m^{-1}$, 0.0216 $\mu m^{-1}$, 0.0215 $\mu m^{-1}$, 0.0214 $\mu m^{-1}$, 0.0213 $\mu m^{-1}$, 0.0212 $\mu m^{-1}$, 0.0211 $\mu m^{-1}$, 0.021 $\mu m^{-1}$, 0.0209 $\mu m^{-1}$, 0.0208 $\mu m^{-1}$, 0.0207 $\mu m^{-1}$, 0.0206 $\mu m^{-1}$, 0.0205 $\mu m^{-1}$, 0.0204 $\mu m^{-1}$, 0.0203 $\mu m^{-1}$, 0.0202 $\mu m^{-1}$, 0.0201 $\mu m^{-1}$, 0.02 $\mu m^{-1}$, or 0.002 $\mu m^{-1}$.

According to one embodiment, a statistical set of the spherical particles 1 has an average unique curvature of at least 200 $\mu m^{-1}$, 100 $\mu m^{-1}$, 66.6 $\mu m^{-1}$, 50 $\mu m^{-1}$, 33.3 $\mu m^{-1}$, 28.6 $\mu m^{-1}$, 25 $\mu m^{-1}$, 20 $\mu m^{-1}$, 18.2 $\mu m^{-1}$, 16.7 $\mu m^{-1}$, 15.4 $\mu m^{-1}$, 14.3 $\mu m^{-1}$, 13.3 $\mu m^{-1}$, 12.5 $\mu m^{-1}$, 11.8 $\mu m^{-1}$, 11.1 $\mu m^{-1}$, 10.5 $\mu m^{-1}$, 10 $\mu m^{-1}$, 9.5 $\mu m^{-1}$, 9.1 $\mu m^{-1}$, 8.7 $\mu m^{-1}$, 8.3 $\mu m^{-1}$, 8 $\mu m^{-1}$, 7.7 $\mu m^{-1}$, 7.4 $\mu m^{-1}$, 7.1 $\mu m^{-1}$, 6.9 $\mu m^{-1}$, 6.7 $\mu m^{-1}$, 5.7 $\mu m^{-1}$, 5 $\mu m^{-1}$, 4.4 $\mu m^{-1}$, 4 $\mu m^{-1}$, 3.6 $\mu m^{-1}$, 3.3 $\mu m^{-1}$, 3.1 $\mu m^{-1}$, 2.9 $\mu m^{-1}$, 2.7 $\mu m^{-1}$, 2.5 $\mu m^{-1}$, 2.4 $\mu m^{-1}$, 2.2 $\mu m^{-1}$, 2.1 $\mu m^{-1}$, 2 $\mu m^{-1}$, 1.3333 $\mu m^{-1}$, 0.8 $\mu m^{-1}$, 0.6666 $\mu m^{-1}$, 0.5714 $\mu m^{-1}$, 0.5 $\mu m^{-1}$, 0.4444 $\mu m^{-1}$, 0.4 $\mu m^{-1}$, 0.3636 $\mu m^{-1}$, 0.3333 $\mu m^{-1}$, 0.3080 $\mu m^{-1}$, 0.2857 $\mu m^{-1}$, 0.2667 $\mu m^{-1}$, 0.25 $\mu m^{-1}$, 0.2353 $\mu m^{-1}$, 0.2222 $\mu m^{-1}$, 0.2105 $\mu m^{-1}$, 0.2 $\mu m^{-1}$, 0.1905 $\mu m^{-1}$, 0.1818 $\mu m^{-1}$, 0.1739 $\mu m^{-1}$, 0.1667 $\mu m^{-1}$, 0.16 $\mu m^{-1}$, 0.1538 $\mu m^{-1}$, 0.1481 $\mu m^{-1}$, 0.1429 $\mu m^{-1}$, 0.1379 $\mu m^{-1}$, 0.1333 $\mu m^{-1}$, 0.1290 $\mu m^{-1}$, 0.125 $\mu m^{-1}$, 0.1212 $\mu m^{-1}$, 0.1176 $\mu m^{-1}$, 0.1176 $\mu m^{-1}$, 0.1143 $\mu m^{-1}$, 0.1111 $\mu m^{-1}$, 0.1881 $\mu m^{-1}$, 0.1053 $\mu m^{-1}$, 0.1026 $\mu m^{-1}$, 0.1 $\mu m^{-1}$, 0.0976 $\mu m^{-1}$, 0.9524 $\mu m^{-1}$, 0.0930 $\mu m^{-1}$, 0.0909 $\mu m^{-1}$, 0.0889 $\mu m^{-1}$, 0.870 $\mu m^{-1}$, 0.0851 $\mu m^{-1}$, 0.0833 $\mu m^{-1}$, 0.0816 $\mu m^{-1}$, 0.08 $\mu m^{-1}$, 0.0784 $\mu m^{-1}$, 0.0769 $\mu m^{-1}$, 0.0755 $\mu m^{-1}$, 0.0741 $\mu m^{-1}$, 0.0727 $\mu m^{-1}$, 0.0714 $\mu m^{-1}$, 0.0702 $\mu m^{-1}$, 0.0690 $\mu m^{-1}$, 0.0678 $\mu m^{-1}$, 0.0667 $\mu m^{-1}$, 0.0656 $\mu m^{-1}$, 0.0645 $\mu m^{-1}$, 0.0635 $\mu m^{-1}$, 0.0625 $\mu m^{-1}$, 0.0615 $\mu m^{-1}$, 0.0606 $\mu m^{-1}$, 0.0597 $\mu m^{-1}$, 0.0588 $\mu m^{-1}$, 0.0580 $\mu m^{-1}$, 0.0571 $\mu m^{-1}$, 0.0563 $\mu m^{-1}$, 0.0556 $\mu m^{-1}$, 0.0548 $\mu m^{-1}$, 0.0541 $\mu m^{-1}$, 0.0533 $\mu m^{-1}$, 0.0526 $\mu m^{-1}$, 0.0519 $\mu m^{-1}$, 0.0513 $\mu m^{-1}$, 0.0506 $\mu m^{-1}$, 0.05 $\mu m^{-1}$, 0.0494 $\mu m^{-1}$, 0.0488 $\mu m^{-1}$, 0.0482 $\mu m^{-1}$, 0.0476 $\mu m^{-1}$, 0.0471 $\mu m^{-1}$, 0.0465 $\mu m^{-1}$, 0.0460 $\mu m^{-1}$, 0.0455 $\mu m^{-1}$, 0.0450 $\mu m^{-1}$, 0.0444 $\mu m^{-1}$, 0.0440 $\mu m^{-1}$, 0.0435 $\mu m^{-1}$, 0.0430 $\mu m^{-1}$, 0.0426 $\mu m^{-1}$, 0.0421 $\mu m^{-1}$, 0.0417 $\mu m^{-1}$, 0.0412 $\mu m^{-1}$, 0.0408 $\mu m^{-1}$, 0.0404 $\mu m^{-1}$, 0.04 $\mu m^{-1}$, 0.0396 $\mu m^{-1}$, 0.0392 $\mu m^{-1}$, 0.0388 $\mu m^{-1}$, 0.0385 $\mu m^{-1}$; 0.0381 $\mu m^{-1}$, 0.0377 $\mu m^{-1}$, 0.0374 $\mu m^{-1}$, 0.037 $\mu m^{-1}$, 0.0367 $\mu m^{-1}$, 0.0364 $\mu m^{-1}$, 0.0360 $\mu m^{-1}$, 0.0357 $\mu m^{-1}$, 0.0354 $\mu m^{-1}$, 0.0351 $\mu m^{-1}$, 0.0348 $\mu m^{-1}$, 0.0345 $\mu m^{-1}$, 0.0342 $\mu m^{-1}$, 0.0339 $\mu m^{-1}$, 0.0336 $\mu m^{-1}$, 0.0333 $\mu m^{-1}$, 0.0331 $\mu m^{-1}$, 0.0328 $\mu m^{-1}$, 0.0325 $\mu m^{-1}$, 0.0323 $\mu m^{-1}$, 0.032 $\mu m^{-1}$, 0.0317 $\mu m^{-1}$, 0.0315 $\mu m^{-1}$, 0.0312 $\mu m^{-1}$, 0.031 $\mu m^{-1}$, 0.0308 $\mu m^{-1}$, 0.0305 $\mu m^{-1}$, 0.0303 $\mu m^{-1}$, 0.0301 $\mu m^{-1}$, 0.03 $\mu m^{-1}$, 0.0299

μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the curvature of the spherical particle 1 has no deviation, meaning that said particle 1 has a perfect spherical shape. A perfect spherical shape prevents fluctuations of the intensity of the scattered light.

According to one embodiment, the unique curvature of the spherical particle 1 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, or 10% along the surface of said particle 1.

According to one embodiment, the particles 1 have an average size of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 tam, 10.5 μm, 11 μm, 11.5 μm, 12 μm, 12.5 μm, 13 μm, 13.5 μm, 14 μm, 14.5 μm, 15 μm, 15.5 tam, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

Particle 1 with an average size less than 1 μm have several advantages compared to bigger particles comprising the same number of particles 2: i) increasing the light scattering compared to bigger particles; ii) obtaining more stable colloidal suspensions compared to bigger particles, when they are dispersed in a solvent; iii) having a size compatible with pixels of at least 100 nm.

Particle 1 with an average size larger than 1 μm have several advantages compared to smaller particles comprising the same number of particles 2: i) reducing light scattering compared to smaller particles; ii) having whispering-gallery wave modes; iii) having a size compatible with pixels larger than or equal to 1 am; iv) increasing the average distance between nanoparticles 3 comprised in the at least one particle 2 comprised in the particle 1, resulting in a better heat draining; v) increasing the average distance between nanoparticles 3 comprised in the at least one particle 2 comprised in the particle 1 and the surface of said particles 1, thus better protecting the nanoparticles 3 against oxidation, or delaying oxidation resulting from a chemical reaction with chemical species coming from the outer space of said particles 1; vi) increasing the mass ratio between the particle 1 and nanoparticle 3 comprised in said at least one particle 2 comprised in the particle 1 compared to smaller particles 1, thus reducing the mass concentration of chemical elements subject to ROHS standards, making it easier to comply with ROHS requirements.

According to one embodiment, the particle 1 is ROHS compliant.

According to one embodiment, the particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the particle 1 comprises heavier chemical elements than the main chemical element present in the first and/or second materials (11, 21). In this embodiment, said heavy chemical elements in the particle 1 will lower the mass concentration of chemical elements subject to ROHS standards, allowing said particle 1 to be ROHS compliant.

According to one embodiment, examples of heavy chemical elements include but are not limited to B, C, N, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Tc, Ru, Rh, Pd, Ag, Cd, In, Sn, Sb, Te, I, Cs, Ba, La, Hf, Ta, W, Re, Os, Ir, Pt, Au, Hg, Tl, Pb, Bi, Po, At, Ce, Pr, Nd, Pm, Sm, Eu, Gd, Tb, Dy, Ho, Er, Tm, Yb, Lu or a mixture of thereof.

According to one embodiment, the particle 1 exhibits at least one other property so that the particle 1 is also: magnetic; ferromagnetic; paramagnetic; superparamagnetic; diamagnetic; plasmonic; piezo-electric; pyro-electric; ferroelectric; drug delivery featured; a light scatterer; an electrical insulator; an electrical conductor; a thermal insulator; a thermal conductor; and/or a local high temperature heating system.

According to one embodiment, the particle 1 exhibits at least one other property comprising one or more of the following: capacity of increasing local electromagnetic field, magnetization, magnetic coercivity, catalytic yield, catalytic properties, photovoltaic properties, photovoltaic yield, electrical polarization, thermal conductivity, electrical conductivity, permeability to molecular oxygen, permeability to molecular water, or any other properties.

According to one embodiment, the particle 1 is an electrical insulator. In this embodiment, the quenching of fluorescent properties for fluorescent nanoparticles 3 encapsulated in the second material 21 is prevented when it is due to electron transport. In this embodiment, the particle 1 may be used as an electrical insulator material exhibiting the same properties as the nanoparticles 3 encapsulated in the second material 21.

According to one embodiment, the particle 1 is an electrical conductor. This embodiment is particularly advantageous for an application of the particle 1 in photovoltaics or LEDs.

According to one embodiment, the particle 1 has an electrical conductivity at standard conditions ranging from $1\times10^{-20}$ to $10^7$ S/m, preferably from $1\times10^{-15}$ to 5 S/m, more preferably from $1\times10^{-7}$ to 1 S/m.

According to one embodiment, the particle 1 has an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the particle 1 may be measured for example with an impedance spectrometer.

According to one embodiment, the particle 1 is a thermal insulator.

According to one embodiment, the particle 1 is a thermal conductor. In this embodiment, the particle 1 is capable of draining away the heat originating from the nanoparticles 3 encapsulated in the second material 21, or from the environment.

According to one embodiment, the particle 1 has a thermal conductivity at standard conditions ranging from 0.1 to 450 W/(m·K), preferably from 1 to 200 W/(m·K), more preferably from 10 to 150 W/(m·K).

According to one embodiment, the particle 1 has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3

W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the thermal conductivity of the particle 1 may be measured for example by steady-state methods or transient methods.

According to one embodiment, the particle 1 is hydrophobic.

According to one embodiment, the particle 1 is hydrophilic.

According to one embodiment, the particle 1 is surfactant-free. In this embodiment, the surface of the particle 1 will be easy to functionalize as said surface will not be blocked by any surfactant molecule.

According to one embodiment, the particle 1 is not surfactant-free.

According to one embodiment, the particle 1 is amorphous.

According to one embodiment, the particle 1 is crystalline.

According to one embodiment, the particle 1 is totally crystalline.

According to one embodiment, the particle 1 is partially crystalline.

According to one embodiment, the particle 1 is monocrystalline.

According to one embodiment, the particle 1 is polycrystalline. In this embodiment, the particle 1 comprises at least one grain boundary.

According to one embodiment, the particle 1 is porous.

According to one embodiment, the particle 1 is considered porous when the quantity adsorbed by the particle 1 determined by adsorption-desorption of nitrogen in the Brunauer-Emmett-Teller (BET) theory is more than 20 $cm^3/g$, 15 $cm^3/g$, 10 $cm^3/g$, 5 $cm^3/g$ at a nitrogen pressure of 650 mmHg, preferably 700 mmHg.

According to one embodiment, the organization of the porosity of the particle 1 can be hexagonal, vermicular or cubic.

According to one embodiment, the organized porosity of the particle 1 has a pore size of at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, or 50 nm.

According to one embodiment, the particle 1 is not porous.

According to one embodiment, the particle 1 does not comprise pores or cavities.

According to one embodiment, the particle 1 is considered non-porous when the quantity adsorbed by the said particle 1 determined by adsorption-desorption of nitrogen in the Brunauer-Emmett-Teller (BET) theory is less than 20 $cm^3/g$, 15 $cm^3/g$, 10 $cm^3/g$, 5 $cm^3/g$ at a nitrogen pressure of 650 mmHg, preferably 700 mmHg.

According to one embodiment, the particle 1 is permeable.

According to one embodiment, the permeable particle 1 has an intrinsic permeability to fluids higher or equal to $10^{-11}$ $cm^2$, $10^{-10}$ $cm^2$, $10^{-9}$ $cm^2$, $10^{-8}$ $cm^2$, $10^{-7}$ $cm^2$, $10^{-6}$ $cm^2$, $10^{-5}$ $cm^2$, $10^{-4}$ $cm^2$, or $10^{-3}$ $cm^2$.

According to one embodiment, the particle 1 is impermeable to outer molecular species, gas or liquid. In this embodiment, outer molecular species, gas or liquid refers to molecular species, gas or liquid external to said particle 1.

According to one embodiment, the impermeable particle 1 has an intrinsic permeability to fluids less or equal to $10^{-11}$ $cm^2$, $10^{-12}$ $cm^2$, $10^{-13}$ $cm^2$, $10^{-14}$ $cm^2$, or $10^{-15}$ $cm^2$.

According to one embodiment, the particle 1 has an oxygen transmission rate ranging from $10^{-7}$ to 10 $cm^3 \cdot m^{-2} \cdot day^{-1}$, preferably from $10^{-7}$ to 1 $cm^3 \cdot m^{-2} \cdot day^{-1}$, more preferably from $10^{-7}$ to $10^{-1}$ $cm^3 \cdot m^{-2} \cdot day$, even more preferably from $10^{-7}$ to $10^{-4}$ $cm^3 \cdot m^{-2} \cdot day^{-1}$ at room temperature.

According to one embodiment, the particle 1 has a water vapor transmission rate ranging from $10^{-7}$ to 10 $g \cdot m^{-2} \cdot day^{-1}$, preferably from $10^{-7}$ to 1 $g \cdot m^{-2} \cdot day^{-1}$, more preferably from $10^{-7}$ to $10^{-1}$ $g \cdot m^{-2} \cdot day^{-1}$, even more preferably from $10^{-7}$ to $10^{-4}$ $g \cdot m^{-2} \cdot day^{-1}$ at room temperature. A water vapor transmission rate of $10^{-6}$ $g \cdot m^{-2} \cdot day^{-1}$ is particularly adequate for a use on LED.

According to one embodiment, the particle 1 is optically transparent, i.e., the particle 1 is transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

According to one embodiment, the particle 1 is a homostructure.

According to one embodiment, the particle 1 is not a core/shell structure wherein the core does not comprise particles 2 and the shell comprises particles 2.

According to one embodiment as illustrated in FIG. 6A-D, the particle 1 is a heterostructure, comprising a core 12 and at least one shell 13.

According to one embodiment, the shell 13 of the core/shell particle 1 comprises an inorganic material. In this embodiment, said inorganic material is the same or different than the first material 11 comprised in the core 12 of the core/shell particle 1.

According to one embodiment, the shell 13 of the core/shell particle 1 consists of an inorganic material. In this embodiment, said inorganic material is the same or different than the first material 11 comprised in the core 12 of the core/shell particle 1.

According to one embodiment illustrated in FIG. 6A, the core 12 of the core/shell particle 1 comprises at least one particle 2 as described herein and the shell 13 of the core/shell particle 1 does not comprise particles 2.

According to one embodiment illustrated in FIG. 6C, the core 12 of the core/shell particle 1 comprises at least one particle 2 as described herein and the shell 13 of the core/shell particle 1 comprises at least one particle 2.

According to one embodiment illustrated in FIG. 6D, the core 12 of the core/shell particle 1 comprises at least one particle 2 as described herein and the shell 13 of the core/shell particle 1 comprises at least one nanoparticle 3. In this embodiment, said at least one nanoparticle 3 comprised in the shell 13 may be different or identical to the at least one nanoparticle 3 dispersed in the second material 21 of the at least one particle 2 comprised in the core 12.

According to one embodiment, the at least one particle 2 comprised in the core 12 of the core/shell particle 1 is identical to the at least one particle 2 comprised in the shell 13 of the core/shell particle 1.

According to one embodiment, the at least one particle 2 comprised in the core 12 of the core/shell particle 1 is different to the at least one particle 2 comprised in the shell 13 of the core/shell particle 1. In this embodiment, the resulting core/shell particle 1 will exhibit different properties.

According to one embodiment, the core 12 of the core/shell particle 1 comprises at least one luminescent particle 2 and the shell 13 of the core/shell particle 1 comprises at least one particle 2 selected in the group of magnetic particle, plasmonic particle, dielectric particle, piezoelectric particle, pyro-electric particle, ferro-electric particle, light scattering particle, electrically insulating particle, thermally insulating particle, or catalytic particle.

According to one embodiment, the shell 13 of the core/shell particle 1 comprises at least one luminescent particle 2 and the core 12 of the core/shell particle 1 comprises at least one particle 2 selected in the group of magnetic particle, plasmonic particle, dielectric particle, piezoelectric particle, pyro-electric particle, ferro-electric particle, light scattering particle, electrically insulating particle, thermally insulating particle, or catalytic particle.

In a preferred embodiment, the core 12 of the core/shell particle 1 and the shell 13 of the core/shell particle 1 comprise at least two different luminescent particles 2, wherein said luminescent particles 2 emit at different emission wavelengths. This means that the core 12 comprises at least one luminescent particle and the shell 13 comprises at least one luminescent particle, said luminescent particles having different emission wavelengths.

In a preferred embodiment, the core 12 of the core/shell particle 1 and the shell 13 of the core/shell particle 1 comprise at least two different luminescent particles 2, wherein at least one luminescent particle 2 emits at a wavelength in the range from 500 to 560 nm, and at least one luminescent particle 2 emits at a wavelength in the range from 600 to 2500 nm. In this embodiment, the core 12 of the core/shell particle 1 and the shell 13 of the core/shell particle 1 comprise at least one luminescent particle 2 emitting in the green region of the visible spectrum and at least one luminescent particle 2 emitting in the red region of the visible spectrum, thus the particle 1 paired with a blue LED will be a white light emitter.

In a preferred embodiment, the core 12 of the core/shell particle 1 and the shell 13 of the core/shell particle 1 comprise at least two different luminescent particles 2, wherein at least one luminescent particle 2 emits at a wavelength in the range from 400 to 490 nm, and at least one luminescent particle 2 emits at a wavelength in the range from 600 to 2500 nm. In this embodiment, the core 12 of the core/shell particle 1 and the shell 13 of the core/shell particle 1 comprise at least one luminescent particle 2 emitting in the blue region of the visible spectrum and at least one luminescent particle 2 emitting in the red region of the visible spectrum, thus the particle 1 will be a white light emitter.

In a preferred embodiment, the core 12 of the core/shell particle 1 and the shell 13 of the core/shell particle 1 comprise comprises at least two different luminescent particles 2, wherein at least one luminescent particle 2 emits at a wavelength in the range from 400 to 490 nm, and at least one luminescent particle 2 emits at a wavelength in the range from 500 to 560 nm. In this embodiment, the core 12 of the core/shell particle 1 and the shell 13 of the core/shell particle 1 comprise at least one luminescent particle 2 emitting in the blue region of the visible spectrum and at least one luminescent particle 2 emitting in the green region of the visible spectrum.

According to one embodiment, the shell 13 of the particle 1 has a thickness of at least 0.1 nm, 0.2 nm, 0.3 nm, 0.4 nm, 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the shell 13 of the particle 1 has a thickness homogeneous all along the core 12, i.e., the shell 13 of the particle 1 has a same thickness all along the core 12.

According to one embodiment, the shell 13 of the particle 1 has a thickness heterogeneous along the core 12, i.e., said thickness varies along the core 12.

According to one embodiment, the particle 1 is not a core/shell particle wherein the core is an aggregate of metallic particles and the shell comprises the first material 11.

According to one embodiment, the particle 1 is a core/shell particle wherein the core is filled with solvent and the shell comprises particles 2 dispersed in a first material 11, i.e., said particle 1 is a hollow bead with a solvent filled core.

According to one embodiment, the particle 1 comprises one particle 2 dispersed in the first material 11.

According to one embodiment, the particle 1 is not a core/shell particle wherein the core is an aggregate of particles and the shell comprises the first material 11.

According to one embodiment, the particle 1 is not a core/shell particle wherein the core is an aggregate of metallic particles and the shell comprises the first material 11.

According to one embodiment, the particle 1 does not comprise only one particle 2 dispersed in the first material 11. In this embodiment, the particle 1 is not a core/shell particle wherein the at least one particle 2 is the core with a shell of the first material 11.

According to one embodiment, the particle 1 does not comprise only one core/shell particle 2 dispersed in the first material 11, i.e., the particle 1 is not a core/shell/shell particle, wherein the at least one core/shell particle 2 is the core with a first shell, and the second shell is made of the first material 11.

According to one embodiment, the particle 1 comprises at least two particles 2 dispersed in the first material 11.

According to one embodiment, the particle 1 comprises a plurality of particles 2 dispersed in the first material 11.

According to one embodiment, the particle 1 comprises at least 1, at least 2, at least 3, at least 4, at least 5, at least 6, at least 7, at least 8, at least 9, at least 10, at least 11, at least 12, at least 13, at least 14, at least 15, at least 16, at least 17, at least 18, at least 19, at least 20, at least 21, at least 22, at least 23, at least 24, at least 25, at least 26, at least 27, at least 28, at least 29, at least 30, at least 31, at least 32, at least 33, at least 34, at least 35, at least 36, at least 37, at least 38, at least 39, at least 40, at least 41, at least 42, at least 43, at least 44, at least 45, at least 46, at least 47, at least 48, at least 49, at least 50, at least 51, at least 52, at least 53, at least 54, at least 55, at least 56, at least 57, at least 58, at least 59, at least 60, at least 61, at least 62, at least 63, at least 64, at least 65, at least 66, at least 67, at least 68, at least 69, at least 70, at least 71, at least 72, at least 73, at least 74, at least 75, at least 76, at least 77, at least 78, at least 79, at least 80, at least 81, at least 82, at least 83, at least 84, at least 85, at least 86, at least 87, at least 88, at least 89, at least 90, at least 91, at least 92, at least 93, at least 94, at least 95, at least 96, at least 97, at least 98, at least 99, at least 100, at least 200, at least 300, at least 400, at least 500, at least 600, at least 700, at least 800, at least 900, at least 1000, at least 1500, at least 2000, at least 2500, at least 3000, at least 3500, at least 4000, at least 4500, at least 5000, at least 5500, at least 6000, at least 6500, at least 7000, at least 7500, at least 8000, at least 8500, at least 9000, at least 9500, at least 10000, at least 15000, at least 20000, at least 25000, at least 30000, at least 35000, at least 40000, at least 45000, at least 50000, at least 55000, at least 60000, at least 65000, at least 70000, at least 75000, at least 80000, at least 85000, at least 90000, at least 95000, or at least 100000 particles 2 dispersed in the first material 11.

According to one embodiment, the particle 1 comprises a combination of at least two different particles 2. In this embodiment, the resulting particle 1 will exhibit different properties.

In a preferred embodiment illustrated in FIG. 5, the particle 1 comprises at least two different particles 2, wherein at least one particle 2 emits at a wavelength in the range from 500 to 560 nm, and at least one particle 2 emits at a wavelength in the range from 600 to 2500 nm. In this embodiment, the particle 1 comprises at least one particle 2 emitting in the green region of the visible spectrum and at least one particle 2 emitting in the red region of the visible spectrum, thus the particle 1 paired with a blue LED will be a white light emitter.

In a preferred embodiment, the particle 1 comprises at least two different particles 2, wherein at least one particle 2 emits at a wavelength in the range from 400 to 490 nm, and at least one particle 2 emits at a wavelength in the range from 600 to 2500 nm. In this embodiment, the particle 1 comprises at least one particle 2 emitting in the blue region of the visible spectrum and at least one particle 2 emitting in the red region of the visible spectrum, thus the particle 1 will be a white light emitter.

In a preferred embodiment, the particle 1 comprises at least two different particles 2, wherein at least one particle 2 emits at a wavelength in the range from 400 to 490 nm, and at least one particle 2 emits at a wavelength in the range from 500 to 560 nm. In this embodiment, the particle 1 comprises at least one particle 2 emitting in the blue region of the visible spectrum and at least one particle 2 emitting in the green region of the visible spectrum.

In a preferred embodiment, the particle 1 comprises three different particles 2, wherein said particles 2 emit different emission wavelengths or color.

In a preferred embodiment, the particle 1 comprises at least three different particles 2, wherein at least one particle 2 emits at a wavelength in the range from 400 to 490 nm, at least one particle 2 emits at a wavelength in the range from 500 to 560 nm and at least one particle 2 emits at a wavelength in the range from 600 to 2500 nm. In this embodiment, the particle 1 comprises at least one particle 2 emitting in the blue region of the visible spectrum, at least one particle 2 emitting in the green region of the visible spectrum and at least one particle 2 emitting in the red region of the visible spectrum.

In a preferred embodiment, the particle 1 does not comprise any particle 2 on its surface. In this embodiment, the at least particle 2 is completely surrounded by the first material 11.

According to one embodiment, at least 100%, 95%, 90%, 85%, 80%, 75%, 70%, 65%, 60%, 55%, 50%, 45%, 40%, 35%, 30%, 25%, 20%, 15%, 10%, 5%, or 1% of particles 2 are comprised in the first material 11. In this embodiment, each of said particles 2 is completely surrounded by the first material 11.

According to one embodiment, the particle 1 comprises at least 100%, 95%, 90%, 85%, 80%, 75%, 70%, 65%, 60%, 55%, 50%, 45%, 40%, 35%, 30%, 25%, 20%, 15%, 10%, 5%, 1% or 0% of particles 2 on its surface.

According to one embodiment illustrated in FIG. 7A-B, the particle 1 comprises at least one particle 2 located on the surface of said particle 1.

According to one embodiment illustrated in FIG. 8A-B, the particle 1 comprises at least one particle 2 dispersed in the first material 11, i.e., totally surrounded by said first material 11; and at least one particle 2 located on the surface of said particle 1.

According to one embodiment, the particle 1 comprises at least one particle 2 dispersed in the first material 11, wherein said at least one particle 2 emits at a wavelength in the range from 500 to 560 nm; and at least one particle 2 located on the surface of said particle 1, wherein said at least one particle 2 emits at a wavelength in the range from 600 to 2500 nm.

According to one embodiment, the particle 1 comprises at least one particle 2 dispersed in the first material 11, wherein said at least one particle 2 emits at a wavelength in the range from 600 to 2500 nm; and at least one particle 2 located on the surface of said particle 1, wherein said at least one particle 2 emits at a wavelength in the range from 500 to 560 nm.

According to one embodiment, the at least one particle 2 is only located on the surface of said particle 1. This embodiment is advantageous as the at least one particle 2 will be better excited by the incident light than if said particle 2 was dispersed in the first material 11.

According to one embodiment, the at least one particle 2 located on the surface of said particle 1 may be chemically or physically adsorbed on said surface.

According to one embodiment illustrated in FIG. 7A and FIG. 8A, the at least one particle 2 located on the surface of said particle 1 may be adsorbed on said surface.

According to one embodiment illustrated in FIG. 7A and FIG. 8A, the at least one particle 2 located on the surface of said particle 1 may be adsorbed with a cement on said surface.

According to one embodiment, examples of cement include but are not limited to: polymers, silicone, oxides, or a mixture thereof.

According to one embodiment illustrated in FIG. 7B and FIG. 8B, the at least one particle 2 located on the surface of said particle 1 may have at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of its volume trapped in the first material 11.

According to one embodiment, the plurality of particles 2 is uniformly spaced on the surface of the particle 1.

According to one embodiment, each particle 2 of the plurality of particles 2 is spaced from its adjacent particle 2 by an average minimal distance.

According to one embodiment, the average minimal distance between two particles 2 is controlled.

According to one embodiment, the average minimal distance between two particles 2 on the surface of the particle 1 is at least 1 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two particles 2 on the surface of the particle 1 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two particles 2 on the surface of the particle 1 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 15%, 20%, 25%, 30%, 35%, 40%, 45%, or 50%.

According to one embodiment illustrated in FIG. 9, the particle 1 further comprises at least one nanoparticle 3 dispersed in the first material 11. In this embodiment, said at least one nanoparticle 3 is not dispersed in the second material 12; said at least one nanoparticle 3 may be identical or different from the at least one nanoparticle 3 encapsulated in the second particle 2.

According to one embodiment, the particle 1 comprises at least one nanoparticle 3 dispersed in the first material 11, wherein said at least one nanoparticle 3 emits at a wavelength in the range from 500 to 560 nm; and at least one nanoparticle 3 in the particle 2, wherein said at least one nanoparticle 3 emits at a wavelength in the range from 600 to 2500 nm.

According to one embodiment, the particle 1 comprises at least one nanoparticle 3 dispersed in the first material 11, wherein said at least one nanoparticle 3 emits at a wavelength in the range from 600 to 2500 nm; and at least one nanoparticle 3 in the particle 2, wherein said at least one nanoparticle 3 emits at a wavelength in the range from 500 to 560 nm.

According to one embodiment, the particle 1 exhibits a shelf life of at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

Photoluminescence refers to fluorescence and/or phosphorescence.

According to one embodiment, the particle 1 exhibits a degradation of its photoluminescence of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 1 exhibits a degradation of its photoluminescence of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the particle 1 exhibits a degradation of its photoluminescence of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

In one embodiment, the particle 1 exhibits photoluminescence quantum yield (PLQY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 $mW \cdot cm^{-2}$ and 100 $kW \cdot cm^{-2}$, more preferably between 10 $mW \cdot cm^{-2}$ and 100 $W \cdot cm^{-2}$, and even more preferably between 10 $mW \cdot cm^{-2}$ and 30 $W \cdot cm^{-2}$.

According to one embodiment, the photon flux or average peak pulse power of the illumination is at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the light illumination described herein provides continuous lighting.

According to one embodiment, the light illumination described herein provides pulsed light. This embodiment is particularly advantageous as it allows the evacuation of heat and/or electrical charges from nanoparticles 3. This embodiment is also particularly advantageous as using pulsed light allow a longer lifespan of the nanoparticles 3, thus of the particles 1, indeed under continuous light, nanoparticles 3 degrade faster than under pulsed light.

According to one embodiment, the light illumination described herein provides pulsed light. In this embodiment, if a continuous light illuminates a material with regular periods during which said material is voluntary removed from the illumination, said light may be considered as pulsed light. This embodiment is particularly advantageous as it allows the evacuation of heat and/or electrical charges from nanoparticles 3.

According to one embodiment, said pulsed light has a time off (or time without illumination) of at least 1 μsecond, 2 μseconds, 3 μseconds, 4 μseconds, 5 μseconds, 6 μseconds, 7 μseconds, 8 μseconds, 9 μseconds, 10 μseconds, 11 μseconds, 12 μseconds, 13 μseconds, 14 μseconds, 15 μseconds, 16 μseconds, 17 μseconds, 18 μseconds, 19 μseconds, 20 μseconds, 21 μseconds, 22 μseconds, 23 μseconds, 24 μseconds, 25 μseconds, 26 μseconds, 27 μseconds, 28 μseconds, 29 μseconds, 30 μseconds, 31 μseconds, 32 μseconds, 33 μseconds, 34 μseconds, 35 μseconds, 36 μseconds, 37 μseconds, 38 μseconds, 39 μseconds, 40 μseconds, 41 μseconds, 42 μseconds, 43 μseconds, 44 μseconds, 45 μseconds, 46 μseconds, 47 μseconds, 48 μseconds, 49 μseconds, 50 μseconds, 100 μseconds, 150 μseconds, 200 μseconds, 250 μseconds, 300 μseconds, 350 μseconds, 400 μseconds, 450 μseconds, 500 μseconds, 550 μseconds, 600 μseconds, 650 μseconds, 700 μseconds, 750 μseconds, 800 μseconds, 850 μseconds, 900 μseconds, 950 μseconds, 1 msecond, 2 mseconds, 3 mseconds, 4 mseconds, 5 mseconds, 6 mseconds, 7 mseconds, 8 mseconds, 9 mseconds, 10 mseconds, 11 mseconds, 12 mseconds, 13 mseconds, 14 mseconds, 15 mseconds, 16 mseconds, 17 mseconds, 18 mseconds, 19 mseconds, 20 mseconds, 21 mseconds, 22 mseconds, 23 mseconds, 24 mseconds, 25 mseconds, 26 mseconds, 27 mseconds, 28 mseconds, 29 mseconds, 30 mseconds, 31 mseconds, 32 mseconds, 33 mseconds, 34 mseconds, 35 mseconds, 36 mseconds, 37 mseconds, 38 mseconds, 39 mseconds, 40 mseconds, 41 mseconds, 42 mseconds, 43 mseconds, 44 mseconds, 45 mseconds, 46 mseconds, 47 mseconds, 48 mseconds, 49 mseconds, or 50 mseconds.

According to one embodiment, said pulsed light has a time on (or illumination time) of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, 1 μsecond, 2 μseconds, 3 μseconds, 4 μseconds, 5 μseconds, 6 μseconds, 7 μseconds, 8 μseconds, 9 μseconds, 10 μseconds, 11 μseconds, 12 μseconds, 13 μseconds, 14 μseconds, 15 μseconds, 16 μseconds, 17 μseconds, 18 μseconds, 19 μseconds, 20 μseconds, 21 μseconds, 22 μseconds, 23 μseconds, 24 μseconds, 25 μseconds, 26 μseconds, 27 μseconds, 28 μseconds, 29 μseconds, 30 μseconds, 31 μseconds, 32 μseconds, 33 μseconds, 34 μseconds, 35 μseconds, 36 μseconds, 37 μseconds, 38 μseconds, 39 μseconds, 40 μseconds, 41 μseconds, 42 μseconds, 43 μseconds, 44 μseconds, 45 μseconds, 46 μseconds, 47 μseconds, 48 μseconds, 49 μseconds, or 50 μseconds.

According to one embodiment, said pulsed light has a frequency of at least 10 Hz, 11 Hz, 12 Hz, 13 Hz, 14 Hz, 15 Hz, 16 Hz, 17 Hz, 18 Hz, 19 Hz, 20 Hz, 21 Hz, 22 Hz, 23 Hz, 24 Hz, 25 Hz, 26 Hz, 27 Hz, 28 Hz, 29 Hz, 30 Hz, 31 Hz, 32 Hz, 33 Hz, 34 Hz, 35 Hz, 36 Hz, 37 Hz, 38 Hz, 39 Hz, 40 Hz, 41 Hz, 42 Hz, 43 Hz, 44 Hz, 45 Hz, 46 Hz, 47 Hz, 48 Hz, 49 Hz, 50 Hz, 100 Hz, 150 Hz, 200 Hz, 250 Hz, 300 Hz, 350 Hz, 400 Hz, 450 Hz, 500 Hz, 550 Hz, 600 Hz, 650 Hz, 700 Hz, 750 Hz, 800 Hz, 850 Hz, 900 Hz, 950 Hz, 1 kHz, 2 kHz, 3 kHz, 4 kHz, 5 kHz, 6 kHz, 7 kHz, 8 kHz, 9 kHz, 10 kHz, 11 kHz, 12 kHz, 13 kHz, 14 kHz, 15 kHz, 16 kHz, 17 kHz, 18 kHz, 19 kHz, 20 kHz, 21 kHz, 22 kHz, 23 kHz, 24 kHz, 25 kHz, 26 kHz, 27 kHz, 28 kHz, 29 kHz, 30 kHz, 31 kHz, 32 kHz, 33 kHz, 34 kHz, 35 kHz, 36 kHz, 37 kHz, 38 kHz, 39 kHz, 40 kHz, 41 kHz, 42 kHz, 43 kHz, 44 kHz, 45 kHz, 46 kHz, 47 kHz, 48 kHz, 49 kHz, 50 kHz, 100 kHz, 150 kHz, 200 kHz, 250 kHz, 300 kHz, 350 kHz, 400 kHz, 450 kHz, 500 kHz, 550 kHz, 600 kHz, 650 kHz, 700 kHz, 750 kHz, 800 kHz, 850 kHz, 900 kHz, 950 kHz, 1 MHz, 2 MHz, 3 MHz, 4 MHz, 5 MHz, 6 MHz, 7 MHz, 8 MHz, 9 MHz, 10 MHz, 11 MHz, 12 MHz, 13 MHz, 14 MHz, 15 MHz, 16 MHz, 17 MHz, 18 MHz, 19 MHz, 20 MHz, 21 MHz, 22 MHz, 23 MHz, 24 MHz, 25 MHz, 26 MHz, 27 MHz, 28 MHz, 29 MHz, 30 MHz, 31 MHz, 32 MHz, 33 MHz, 34 MHz, 35 MHz, 36 MHz, 37 MHz, 38 MHz, 39 MHz, 40 MHz, 41 MHz, 42 MHz, 43 MHz, 44 MHz, 45 MHz, 46 MHz, 47 MHz, 48 MHz, 49 MHz, 50 MHz, or 100 MHz.

According to one embodiment, the spot area of the light which illuminates the particle 1, the particle 2, the ink, the nanoparticles 3 and/or the light emitting material 7 is at least 10 $\mu m^2$, 20 $\mu m^2$, 30 $\mu m^2$, 40 $\mu m^2$, 50 $\mu m^2$, 60 $\mu m^2$, 70 $\mu m^2$, 80 $\mu m^2$, 90 $\mu m^2$, 100 $\mu m^2$, 200 $\mu m^2$, 300 $\mu m^2$, 400 $\mu m^2$, 500 $\mu m^2$, 600 $\mu m^2$, 700 $\mu m^2$, 800 $\mu m^2$, 900 $\mu m^2$, $10^3$ $\mu m^2$, $10^4$ $\mu m^2$, $10^5$ $\mu m^2$, 1 $mm^2$, 10 $mm^2$, 20 $mm^2$, 30 $mm^2$, 40 $mm^2$, 50 $mm^2$, 60 $mm^2$, 70 $mm^2$, 80 $mm^2$, 90 $mm^2$, 100 $mm^2$, 200 $mm^2$, 300 $mm^2$, 400 $mm^2$, 500 $mm^2$, 600 $mm^2$, 700 $mm^2$, 800 $mm^2$, 900 $mm^2$, $10^3$ $mm^2$, $10^4$ $mm^2$, $10^5$ $mm^2$, 1 $m^2$, 10 $m^2$, 20 $m^2$, 30 $m^2$, 40 $m^2$, 50 $m^2$, 60 $m^2$, 70 $m^2$, 80 $m^2$, 90 $m^2$, or 100 $m^2$.

According to one embodiment, the emission saturation of the particle 1, the particle 2, the ink, the nanoparticles 3 and/or the light emitting material 7 is reached under a pulsed light with a peak pulse power of at least 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, 100 $kW \cdot cm^{-2}$, 200 $kW \cdot cm^{-2}$, 300 $kW \cdot cm^{-2}$, 400 $kW \cdot cm^{-2}$, 500 $kW \cdot cm^{-2}$, 600 $kW \cdot cm^{-2}$, 700 $kW \cdot cm^{-2}$, 800 $kW \cdot cm^{-2}$, 900 $kW \cdot cm^{-2}$, or 1 $MW \cdot cm^{-2}$.

According to one embodiment, the emission saturation of the particle 1, the particle 2, the ink, the nanoparticles 3 and/or the light emitting material 7 is reached under a continuous illumination with a peak pulse power of at least 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, or 1 $kW \cdot cm^{-2}$.

Emission saturation of particles under illumination with a given photon flux occurs when said particles cannot emit more photons. In other words, a higher photon flux doesn't lead to a higher number of photons emitted by said particles.

According to one embodiment, the FCE (Frequency Conversion Efficiency) of illuminated particle 1, the particle 2, the ink, nanoparticles 3 and/or light emitting material 7 is of at least 1%, 2%, 3%, 4%, 5%, 6%, 7%, 8%, 9%, 10%, 15%, 16%, 17%, 18%, 18%, 19%, 20%, 21%, 22%, 23%, 24%, 25%, 30%, 35%, 40%, 45%, 50%, 55%, 60%, 65%, 70%, 75%, 80%, 85%, 90%, 95%, or 100%. In this embodiment, the FCE was measured at 480 nm.

In one embodiment, the particle 1 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the particle 1 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the particle 1 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 1 exhibits a degradation of its FCE of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the particle 1 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment illustrated in FIG. 10A-B, the particle 1 further comprises at least one dense particle 9 dispersed in the first material 11. In this embodiment, said at least one dense particle 9 comprises a dense material with a density superior to the density of the first material 11.

According to one embodiment, the dense material has a bandgap superior or equal to 3 eV.

According to one embodiment, examples of dense material include but are not limited to: oxides such as for example tin oxide, silicon oxide, germanium oxide, aluminium oxide, gallium oxide, hafnium oxide, titanium oxide, tantalum oxide, ytterbium oxide, zirconium oxide, yttrium oxide, thorium oxide, zinc oxide, lanthanide oxides, actinide oxides, alkaline earth metal oxides, mixed oxides, mixed oxides thereof; metal sulfides; carbides; nitrides; or a mixture thereof.

According to one embodiment, the at least one dense particle 9 has a maximal packing fraction of 70%, 60%, 50%, 40%, 30%, 20%, 10% or 1%.

According to one embodiment, the at least one dense particle 9 has a density of at least 3, 4, 5, 6, 7, 8, 9 or 10.

According to one embodiment, the particle 1 is semiconductor nanoplatelet coated with grease and encapsulated in $Al_2O_3$.

According to one embodiment, the particle 1 is semiconductor nanoplatelet encapsulated in a PMMA particle further encapsulated in $Al_2O_3$: semiconductor nanoplatelet@PMMA@$Al_2O_3$.

According to one embodiment, the first material 11 and the second material 21 have a bandgap superior or equal to 3 eV.

Having a bandgap superior or equal to 3 eV, the first material 11 and the second material 21 are optically transparent to UV and blue light.

According to one embodiment, the first material 11 and the second material 21 have a bandgap of at least 3.0 eV, 3.1 eV, 3.2 eV, 3.3 eV, 3.4 eV, 3.5 eV, 3.6 eV, 3.7 eV, 3.8 eV, 3.9 eV, 4.0 eV, 4.1 eV, 4.2 eV, 4.3 eV, 4.4 eV, 4.5 eV, 4.6 eV, 4.7 eV, 4.8 eV, 4.9 eV, 5.0 eV, 5.1 eV, 5.2 eV, 5.3 eV, 5.4 eV or 5.5 eV.

According to one embodiment, the first material 11 and/or the second material 21 are inorganic materials.

According to one embodiment, the first material 11 and/or the second material 21 do not comprise organic molecules.

According to one embodiment, the first material 11 and/or the second material 21 do not comprise polymers.

According to one embodiment, the first material 11 and/or the second material 21 comprises inorganic polymers.

According to one embodiment, the first material 11 and/or the second material 21 are selected from the group consisting of oxide materials, semiconductor materials, wide-bandgap semiconductor materials or a mixture thereof.

According to one embodiment, examples of semiconductor materials include but are not limited to: III-V semiconductors, II-VI semiconductors, or a mixture thereof.

According to one embodiment, examples of wide-bandgap semiconductor materials include but are not limited to: silicon carbide SiC, aluminium nitride AlN, gallium nitride GaN, boron nitride BN, or a mixture thereof.

According to one embodiment, examples of oxide materials include but are not limited to: $SiO_2$, $Al_2O_3$, $TiO_2$, $ZrO_2$, FeO, ZnO, MgO, $SnO_2$, $Nb_2Os$, $CeO_2$, BeO, $IrO_2$, CaO, $Sc_2O_3$, $Na_2O$, BaO, $K_2O$, $TeO_2$, MnO, $B_2O_3$, $GeO_2$, $As_2O_3$, $Ta_2O_5$, $Li_2O$, SrO, $Y_2O_3$, $HfO_2$, $MoO_2$, $Tc_2O_7$, $ReO_2$, $Co_3O_4$, OsO, $RhO_2$, $Rh_2O_3$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof.

According to one embodiment, the first material 11 and/or the second material 21 are selected from the group consisting of silicon oxide, aluminium oxide, titanium oxide, iron oxide, calcium oxide, magnesium oxide, zinc oxide, tin oxide, beryllium oxide, zirconium oxide, niobium oxide, cerium oxide, iridium oxide, scandium oxide, sodium oxide, barium oxide, potassium oxide, tellurium oxide, manganese oxide, boron oxide, germanium oxide, osmium oxide, rhenium oxide, arsenic oxide, tantalum oxide, lithium oxide, strontium oxide, yttrium oxide, hafnium oxide, molybdenum oxide, technetium oxide, rhodium oxide, cobalt oxide, gallium oxide, indium oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, silicon carbide SiC, aluminium nitride AlN, gallium nitride GaN, boron nitride BN, mixed oxides, mixed oxides thereof, or a mixture thereof.

According to one embodiment, examples of oxide materials include but are not limited to: $SiO_2$, $Al_2O_3$, $TiO_2$, $ZrO_2$, FeO, ZnO, MgO, $SnO_2$, PbO, $Ag_2O$, $Nb_2Os$, $CeO_2$, BeO, $IrO_2$, CaO, $Sc_2O_3$, $Na_2O$, BaO, $K_2O$, $TeO_2$, MnO, $B_2O_3$, $GeO_2$, $As_2O_3$, $Ta_2O_5$, $Li_2O$, SrO, $P_2O_5$, $P_2O_3$, $P_4O_7$, $P_4O_8$, $P_4O_9$, $P_2O_6$, PO, $Fe_2O_3$, $Fe_3O_4$, $WO_2$, $Cr_2O_3$, $RuO_2$, PtO, PdO, CuO, $Cu_2O$, $Y_2O_3$, $HfO_2$, $V_2O_5$, $MoO_2$, $Tc_2O_7$, $ReO_2$, $Co_3O_4$, OsO, $RhO_2$, $Rh_2O_3$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof.

According to one embodiment, the first material 11 and/or the second material 21 are selected from the group consisting of silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

According to one embodiment, the first material 11 and/or the second material 21 comprise or consist of a $ZrO_2/SiO_2$ mixture: $Si_xZr_{1-x}O_2$, wherein $0 \leq x \geq 1$. In this embodiment, the first material 11 and/or the second material 21 are able to resist to any pH in a range from 0 to 14.

This allows for a better protection of the at least one nanoparticle 3.

According to one embodiment, the first material 11 and/or the second material 21 comprise or consist $Si_{0.8}Zr_{0.2}O_2$.

According to one embodiment, the first material 11 and/or the second material 21 comprise or consist of a $HfO_2/SiO_2$ mixture: $Si_xHf_{1-x}O_2$, wherein $0 \leq x \geq 1$.

According to one embodiment, the first material 11 and/or the second material 21 comprise or consist $Si_{0.8}Hf_{0.2}O_2$.

According to one embodiment, the first material 11 and/or the second material 21 comprise garnets.

According to one embodiment, examples of garnets include but are not limited to: $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, or a mixture thereof.

According to one embodiment, the ceramic is crystalline or non-crystalline ceramics. According to one embodiment, the ceramic is selected from oxide ceramics and/or non-oxides ceramics, According to one embodiment, the ceramic is selected from pottery, bricks, tiles, cements and/glasses.

According to one embodiment, the stone is selected from agate, aquamarine, amazonite, amber, amethyst, ametrine, angelite, apatite, aragonite, silver, astrophylite, aventurine, azurite, beryk, silicified wood, bronzite, chalcedony, calcite, celestine, chakras, charoite, chiastolite, chrysocolla, chrysoprase, citrine, coral, cornalite, rock crystal, native copper, cyanite, danburite, diamond, dioptase, dolomite, dumorerite, emerald, fluorite, foliage, galene, garnet, heliotrope; hematite, hemimorphite, howlite, hypersthene, iolite, jades, jet, jasper, kunzite, labradorite, lazuli lazuli, larimar, lava, lepidolite, magnetist, magnetite, alachite, marcasite, meteorite, mokaite, moldavite, morganite, mother-of-pearl, obsidian, eye hawk, iron eye, bull's eye, tiger eye, onyx tree, black onyx, opal, gold, peridot, moonstone, star stone, sun stone, pietersite, prehnite, pyrite, blue quartz, smoky quartz, quartz, quatz hematoide, milky quartz, rose quartz, rutile quartz, rhodochrosite, rhodonite, rhyolite, ruby, sapphire, rock salt, selenite, seraphinite, serpentine, shattukite, shiva lingam, shungite, flint, smithsonite, sodalite, stealite, straumatolite, sugilite, tanzanite, topaz, tourmaline watermelon, black tourmaline, turquoise, ulexite, unakite, variscite, zoizite.

According to one embodiment, the first material 11 and/or the second material 21 comprise or consist of a thermal conductive material wherein said thermal conductive material includes but is not limited to: $Al_yO_x$, $Ag_yO_x$, $Cu_yO_x$, $Fe_yO_x$, $Si_yO_x$, $Pb_yO_x$, $Ca_yO_x$, $Mg_yO_x$, $Zn_yO_x$, $Sn_yO_x$, $Ti_yO_x$, $Be_yO_x$, mixed oxides, mixed oxides thereof or a mixture thereof; x and y are independently a decimal number from 0 to 10, at the condition that x and y are not simultaneously equal to 0, and $x \neq 0$.

According to one embodiment, the first material 11 and/or the second material 21 comprise or consist of a thermal conductive material wherein said thermal conductive material includes but is not limited to: $Al_2O_3$, $Ag_2O$, $Cu_2O$, CuO, $Fe_3O_4$, FeO, $SiO_2$, PbO, CaO, MgO, ZnO, $SnO_2$, $TiO_2$, BeO, mixed oxides, mixed oxides thereof or a mixture thereof.

According to one embodiment, the first material 11 and/or the second material 21 comprise or consist of a thermal conductive material wherein said thermal conductive material includes but is not limited to: aluminium oxide, silver oxide, copper oxide, iron oxide, silicon oxide, lead oxide, calcium oxide, magnesium oxide, zinc oxide, tin oxide, titanium oxide, beryllium oxide, mixed oxides, mixed oxides thereof or a mixture thereof.

According to one embodiment, the first material 11 and/or the second material 21 comprise a material including but not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof, garnets such as for example $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, or a mixture thereof.

According to one embodiment, the first material 11 and/or the second material 21 do not comprise organic molecules, organic groups or polymer chains.

According to one embodiment, the first material 11 and/or the second material 21 do not comprise polymers.

According to one embodiment, the first material 11 and/or the second material 21 are composed of a material selected in the group of metals, halides, chalcogenides, phosphides, sulfides, metalloids, metallic alloys, ceramics such as for example oxides, carbides, nitrides, glasses, enamels, ceramics, stones, precious stones, pigments, cements and/or inorganic polymers. Said first material 11 and/or the second material 21 are prepared using protocols known to the person skilled in the art.

According to one embodiment, the first material 11 and/or the second material 21 are composed of a material selected in the group of metals, halides, chalcogenides, phosphides, sulfides, metalloids, metallic alloys, ceramics such as for example oxides, carbides, nitrides, enamels, ceramics, stones, precious stones, pigments, and/or cements. Said first material 11 and/or the second material 21 are prepared using protocols known to the person skilled in the art.

According to one embodiment, the first material 11 and/or the second material 21 comprise or consists of a $ZrO_2/SiO_2$ mixture: $Si_xZr_{1-x}O_2$, wherein $0 \leq x \leq 1$. In this embodiment, the first the first material 11 and/or the second material 21 are able to resist to any pH in a range from 0 to 14. This allows for a better protection of the particles 2 and/or nanoparticles 3.

According to one embodiment, the first material 11 and/or the second material 21 comprise or consists of $Si_{0.8}Zr_{0.2}O_2$.

According to one embodiment, the first material 11 and/or the second material 21 are comprise or consist of mixture: $Si_xZr_{1-x}O_z$, wherein $0<x \leq 1$ and $0<z \leq 3$.

According to one embodiment, the first material 11 and/or the second material 21 are comprise or consist of a $HfO_2/SiO_2$ mixture: $Si_xHf_{1-x}O_2$, wherein $0<x \leq 1$ and $0<z \leq 3$.

According to one embodiment, the first material 11 and/or the second material 21 are comprise or consist of $Si_{0.8}Hf_{0.2}O_2$.

According to one embodiment, a chalcogenide is a chemical compound consisting of at least one chalcogen anion selected in the group of O, S, Se, Te, Po, and at least one or more electropositive element.

According to one embodiment, the metallic first material 11 and/or second material 21 are selected in the group of gold, silver, copper, vanadium, platinum, palladium, ruthenium, rhenium, yttrium, mercury, cadmium, osmium, chromium, tantalum, manganese, zinc, zirconium, niobium, molybdenum, rhodium, tungsten, iridium, nickel, iron, or cobalt.

According to one embodiment, examples of carbide first material 11 and/or second material 21 include but are not limited to: SiC, WC, BC, MoC, TiC, $Al_4C_3$, $LaC_2$, FeC, CoC, HfC, $SixC_y$, $W_xC_y$, $B_xC_y$, $Mo_xC_y$, $Ti_xC_y$, $Al_xC_y$, $La_xC_y$, $Fe_xC_y$, $Co_xC_y$, $Hf_xC_y$, or a mixture thereof; x and y are independently a decimal number from 0 to 5, at the condition that x and y are not simultaneously equal to 0, and x≠0.

According to one embodiment, examples of nitride first material 11 and/or second material 21 include but are not limited to: TiN, $Si_3N_4$, MoN, VN, TaN, $Zr_3N_4$, HfN, FeN, NbN, GaN, CrN, AlN, InN, $Ti_xN_y$, $Si_xN_y$, $Mo_xN_y$, $V_xN_y$, $Ta_xN_y$, $Zr_xN_y$, $Hf_xN_y$, $Fe_xN_y$, $Nb_xN_y$, $Ga_xN_y$, $Cr_xN_y$, $Al_xN_y$, $In_xN_y$, or a mixture thereof; x and y are independently a decimal number from 0 to 5, at the condition that when x and y are not simultaneously equal to 0, and x≠0.

According to one embodiment, examples of sulfide first material 11 and/or second material 21 include but are not limited to: $Si_yS_x$, $Al_yS_x$, $Ti_yS_x$, $Zr_yS_x$, $Zn_yS_x$, $Mg_yS_x$, $Sn_yS_x$, $Nb_yS_x$, $Ce_yS_x$, $Be_yS_x$, $Ir_yS_x$, $Ca_yS_x$, $Sc_yS_x$, $Ni_yS_x$, $Na_yS_x$, $Ba_yS_x$, $K_yS_x$, $Pb_yS_x$, $Ag_yS_x$, $V_yS_x$, $Te_yS_x$, $Mn_yS_x$, $B_yS_x$, $P_yS_x$, $Ge_yS_x$, $As_yS_x$, $Fe_yS_x$, $Ta_yS_x$, $Li_yS_x$, $Sr_yS_x$, $Y_yS_x$, $Hf_yS_x$, $W_yS_x$, $Mo_yS_x$, $Cr_yS_x$, $Tc_yS_x$, $Re_yS_x$, $Ru_yS_x$, $Co_yS_x$, $Os_yS_x$, $Rh_yS_x$, $Pt_yS_x$, $Pd_yS_x$, $Cu_yS_x$, $Au_yS_x$, $Cd_yS_x$, $Hg_yS_x$, $Tl_yS_x$, $Ga_yS_x$, $In_yS_x$, $Bi_yS_x$, $Sb_yS_x$, $Po_yS_x$, $Se_yS_x$, $Cs_yS_x$, mixed sulfides, mixed sulfides thereof or a mixture thereof; x and y are independently a decimal number from 0 to 10, at the condition that x and y are not simultaneously equal to 0, and x≠0.

According to one embodiment, examples of halide first material 11 and/or second material 21 include but are not limited to: $BaF_2$, $LaF_3$, $CeF_3$, $YF_3$, $CaF_2$, $MgF_2$, $PrF_3$, AgCl, $MnCl_2$, $NiCl_2$, $Hg_2Cl_2$, $CaCl_2$, $CsPbCl_3$, AgBr, $PbBr_3$, $CsPbBr_3$, AgI, CuI, PbI, $HgI_2$, $BiI_3$, $CH_3NH_3PbI_3$, $CH_3NH_3PbCl_3$, $CH_3NH_3PbBr_3$, $CsPbI_3$, $FAPbBr_3$ (with FA formamidinium), or a mixture thereof.

According to one embodiment, examples of chalcogenide first material 11 and/or second material 21 include but are not limited to: CdO, CdS, CdSe, CdTe, ZnO, ZnS, ZnSe, ZnTe, HgO, HgS, HgSe, HgTe, CuO, $Cu_2O$, CuS, $Cu_2S$, CuSe, CuTe, $Ag_2O$, $Ag_2S$, $Ag_2Se$, $Ag_2Te$, $Au_2S$, PdO, PdS, $Pd_4S$, PdSe, PdTe, PtO, PtS, $PtS_2$, PtSe, PtTe, $RhO_2$, $Rh_2O_3$, $RhS_2$, $Rh_2S_3$, $RhSe_2$, $Rh_2Se_3$, $RhTe_2$, $IrO_2$, $IrS_2$, $Ir_2S_3$, $IrSe_2$, $IrTe_2$, $RuO_2$, $RuS_2$, OsO, OsS, OsSe, OsTe, MnO, MnS, MnSe, MnTe, $ReO_2$, $ReS_2$, $Cr_2O_3$, $Cr_2S_3$, $MoO_2$, $MoS_2$, $MoSe_2$, $MoTe_2$, $WO_2$, $WS_2$, $WSe_2$, $V_2O_5$, $V_2S_3$, $Nb_2Os$, $NbS_2$, $NbSe_2$, $HfO_2$, $HfS_2$, $TiO_2$, $ZrO_2$, $ZrS_2$, $ZrSe_2$, $ZrTe_2$, $Sc_2O_3$, $Y_2O_3$, $Y_2S_3$, $SiO_2$, $GeO_2$, GeS, $GeS_2$, GeSe, $GeSe_2$, GeTe, $SnO_2$, SnS, $SnS_2$, SnSe, $SnSe_2$, SnTe, PbO, PbS, PbSe, PbTe, MgO, MgS, MgSe, MgTe, CaO, CaS, SrO, $Al_2O_3$, $Ga_2O_3$, $Ga_2S_3$, $Ga_2Se_3$, $In_2O_3$, $In_2S_3$, $In_2Se_3$, $In_2Te_3$, $La_2O_3$, $La_2S_3$, $CeO_2$, $CeS_2$, $Pr_6O_{11}$, $Nd_2O_3$, $NdS_2$, $La_2O_3$, $Tl_2O$, $Sm_2O_3$, $SmS_2$, $Eu_2O_3$, $EuS_2$, $Bi_2O_3$, $Sb_2O_3$, $PoO_2$, $SeO_2$, $Cs_2O$, $Tb_4O_7$, $TbS_2$, $Dy_2O_3$, $Ho_2O_3$, $Er_2O_3$, $ErS_2$, $Tm_2O_3$, $Yb_2O_3$, $Lu_2O_3$, $CuInS_2$, $CuInSe_2$, $AgInS_2$, $AgInSe_2$, $Fe_2O_3$, $Fe_3O_4$, FeS, $FeS_2$, $Co_3S_4$, CoSe, $Co_3O_4$, NiO, $NiSe_2$, NiSe, $Ni_3Se_4$, $Gd_2O_3$, BeO, $TeO_2$, $Na_2O$, BaO, $K_2O$, $Ta_2O_5$, $Li_2O$, $Tc_2O_7$, $As_2O_3$, $B_2O_3$, $P_2O_5$, $P_2O_3$, $P_4O_7$, $P_4O_8$, $P_4O_9$, $P_2O_6$, PO, or a mixture thereof.

According to one embodiment, examples of phosphide first material 11 and/or second material 21 include but are not limited to: InP, $Cd_3P_2$, $Zn_3P_2$, AlP, GaP, TlP, or a mixture thereof.

According to one embodiment, examples of metalloid first material 11 and/or second material 21 include but are not limited to: Si, B, Ge, As, Sb, Te, or a mixture thereof.

According to one embodiment, examples of metallic alloy first material 11 and/or second material 21 include but are not limited to: Au—Pd, Au—Ag, Au—Cu, Pt—Pd, Pt—Ni, Cu—Ag, Cu—Sn, Ru—Pt, Rh—Pt, Cu—Pt, Ni—Au, Pt—Sn, Pd—V, Ir—Pt, Au—Pt, Pd—Ag, Cu—Zn, Cr—Ni, Fe—Co, Co—Ni, Fe—Ni or a mixture thereof.

According to one embodiment, the first material 11 and the second material 21 are independently chosen from the lists of materials cited herein.

According to one embodiment, the first material 11 and/or the second material 21 comprise organic molecules in small amounts of 0 mole %, 1 mole %, 5 mole %, 10 mole %, 15 mole %, 20 mole %, 25 mole %, 30 mole %, 35 mole %, 40 mole %, 45 mole %, 50 mole %, 55 mole %, 60 mole %, 65 mole %, 70 mole %, 75 mole %, 80 mole % relative to the majority element of said first material 11 and/or second material 21.

According to one embodiment, the first material 11 and/or the second material 21 do not comprise $SiO_2$.

According to one embodiment, the first material 11 and/or the second material 21 do not comprise inorganic polymers.

According to one embodiment, the first material 11 and/or the second material 21 comprise at least 1% of $SiO_2$, 5% of $SiO_2$, 10% of $SiO_2$, 15% of $SiO_2$, 20% of $SiO_2$, 25% of $SiO_2$, 30% of $SiO_2$, 35% of $SiO_2$, 40% of $SiO_2$, 45% of $SiO_2$, 50% of $SiO_2$, 55% of $SiO_2$, 60% of $SiO_2$, 65% of $SiO_2$, 70% of $SiO_2$, 75% of $SiO_2$, 80% of $SiO_2$, 85% of $SiO_2$, 90% of $SiO_2$, 95% of $SiO_2$, or 100% $SiO_2$.

According to one embodiment, the first material 11 and/or the second material 21 comprise less than 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $SiO_2$.

According to one embodiment, the first material 11 and/or the second material 21 comprise at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $SiO_2$ precursors.

According to one embodiment, the first material 11 and/or the second material 21 comprise less than 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $SiO_2$ precursors.

According to one embodiment, the first material 11 and/or the second material 21 comprise at least one precursor of $SiO_2$.

According to one embodiment, examples of precursors of $SiO_2$ include but are not limited to: tetramethyl orthosilicate, tetraethyl orthosilicate, polydiethyoxysilane, n-alkyltrimethoxylsilanes such as for example n-butyltrimethoxysilane, n-octyltrimethoxylsilane, n-dodecyltrimethoxysilane, n-octadecyltrimethoxysilane, 3-mercaptopropyltrimethoxysilane, 11-mercaptoundecyltrimethoxysilane, 3-aminopropyltrimethoxysilane, 11-aminoundecyltrimethoxysilane, 3-(2-(2-aminoethylamino)ethylamino)propyltrimethoxysilane, 3-(trimethoxysilyl)propyl methacrylate, 3-(aminopropyl)trimethoxysilane, or a mixture thereof.

According to one embodiment, the first material 11 and/or the second material 21 do not consist of pure $SiO_2$, i.e., 100% $SiO_2$.

According to one embodiment, the first material 11 and/or the second material 21 do not consist of pure $Al_2O_3$, i.e., 100% $Al_2O_3$.

According to one embodiment, the first material 11 and/or the second material 21 comprise at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $Al_2O_3$.

According to one embodiment, the first material 11 and/or the second material 21 comprise less than 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $Al_2O_3$.

According to one embodiment, the first material 11 and/or the second material 21 comprise at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $Al_2O_3$ precursors.

According to one embodiment, the first material 11 and/or the second material 21 comprise less than 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $Al_2O_3$ precursors.

According to one embodiment, the first material 11 and/or the second material 21 do not comprise $TiO_2$.

According to one embodiment, the first material 11 and/or the second material 21 do not consist of pure $TiO_2$, i.e., 100% $TiO_2$.

According to one embodiment, the first material 11 and/or the second material 21 do not comprise zeolite.

According to one embodiment, the first material 11 and/or the second material 21 do not consist of pure zeolite, i.e., 100% zeolite.

According to one embodiment, the first material 11 and/or the second material 21 do not comprise glass.

According to one embodiment, the first material 11 and/or the second material 21 do not comprise vitrified glass.

According to one embodiment, the first material 11 and/or the second material 21 comprise an inorganic polymer.

According to one embodiment, the inorganic polymer is a polymer not containing carbon.

According to one embodiment, the inorganic polymer is selected from polysilanes, polysiloxanes (or silicones), polythiazyles, polyaluminosilicates, polygermanes, polystannanes, polyborazylenes, polyphosphazenes, polydichlorophosphazenes, polysulfides, polysulfur and/or nitrides. According to one embodiment, the inorganic polymer is a liquid crystal polymer.

According to one embodiment, the inorganic polymer is a natural or synthetic polymer.

According to one embodiment, the inorganic polymer is synthetized by inorganic reaction, radical polymerization, polycondensation, polyaddition, or ring opening polymerization (ROP).

According to one embodiment, the inorganic polymer is a homopolymer or a copolymer.

According to one embodiment, the inorganic polymer is linear, branched, and/or cross-linked.

According to one embodiment, the inorganic polymer is amorphous, semi-crystalline or crystalline.

According to one embodiment, the inorganic polymer has an average molecular weight ranging from 2 000 g/mol to $5.10^6$ g/mol, preferably from 5 000 g/mol to $4.10^6$ g/mol; from 6 000 to $4.10^6$; from 7 000 to $4.10^6$; from 8 000 to $4.10^6$; from 9 000 to $4.10^6$; from 10 000 to $4.10^6$; from 15 000 to $4.10^6$; from 20 000 to $4.10^6$; from 25 000 to $4.10^6$; from 30 000 to $4.10^6$; from 35 000 to $4.10^6$; from 40 000 to $4.10^6$; from 45 000 to $4.10^6$; from 50 000 to $4.10^6$; from 55 000 to $4.10^6$; from 60 000 to $4.10^6$; from 65 000 to $4.10^6$; from 70 000 to $4.10^6$; from 75 000 to $4.10^6$; from 80 000 to $4.10^6$; from 85 000 to $4.10^6$; from 90 000 to $4.10^6$; from 95 000 to $4.10^6$; from 100 000 to $4.10^6$; from 200 000 to $4.10^6$; from 300 000 to $4.10^6$; from 400 000 to $4.10^6$; from 500 000 to $4.10^6$; from 600 000 to $4.10^6$; from 700 000 to $4.10^6$; from 800 000 to $4.10^6$; from 900 000 to $4.10^6$; from $1.10^6$ to $4.10^6$; from $2.10^6$ to $4.10^6$; from $3.10^6$ g/mol to $4.10^6$ g/mol.

According to one embodiment, the first material 11 and/or the second material 21 are organic materials.

According to one embodiment, the organic material refers to any element and/or material containing carbon, preferably any element and/or material containing at least one carbon-hydrogen bond.

According to one embodiment, the organic material may be natural or synthetic.

According to one embodiment, the organic material is a small organic compound or an organic polymer.

According to one embodiment, the first material 11 and/or the second material 21 are polymers.

According to one embodiment, examples of polymers include but are not limited to: silicone, PMMA, Polyethylene glycol/polyethylene oxide, Polyethylene Terephthalate, Polyimide, Polyetherimide, Polyamide, Polyetherimine, Polyamic acid, polyethers, polyester, polyacrylates, polymethacrylate, polycarbonates, polycaprolactone, polyvinyl alcohol, polydimethylsiloxane, polyvinylpyrrolidone, polyvinyl pyridine, silicone, polyvinylimidazole, polyimidazole, Polystyrine, Poly(vinyl acetate), poly(acrylonitrile), poly(propylene), poly(acrylic acid), polyoxazoline (poly-2-oxazoline), polylauryl methacrylate, polyglycolide, polylactic acid, poly(nucleotides), polysaccharides, block copolymers or copolymers such as polylactic-co-glycolic acid (PGLA), or a mixture thereof.

According to one embodiment, the first material 11 and/or the second material 21 comprises a monomer or a polymer as described hereafter.

According to one embodiment, the first material 11 and/or the second material 21 can polymerize by heating it (i.e., by thermal curing) and/or by exposing it to UV light (i.e., by UV curing). Examples of UV curing processes which can be contemplated in the present invention are described, e.g., in WO2017063968, WO2017063983 and WO2017162579.

According to one embodiment, examples of polymers include but are not limited to: silicone based polymers, polydimethylsiloxanes (PDMS), polyethylene terephthalate, polyesters, polyacrylates, polymethacrylates, polycarbonate, poly(vinyl alcohol), polyvinylpyrrolidone, polyvinylpyridine, polysaccharides, poly(ethylene glycol), melamine resins, a phenol resin, an alkyl resin, an epoxy resin, a polyurethane resin, a maleic resin, a polyamide resin, an alkyl resin, a maleic resin, terpenes resins, an acrylic resin or acrylate based resin such as PMMA, copolymers forming the resins, co-polymers, block co-polymers, polymerizable monomers comprising an UV initiator or thermic initiator, or a mixture thereof.

According to one embodiment, examples of polymers include but are not limited to: thermosetting resin, photosensitive resin, photoresist resin, photocurable resin, or dry-curable resin. The thermosetting resin and the photocurable resin are cured using heat and light, respectively. For the use of the dry hard resin, the resin is cured by applying heat to a solvent in which the particle and/or the nanoparticle.

When a thermosetting resin or a photocurable resin is used, the composition of the resulting particle is equal to the composition of the raw material of the particle. However, when a dry-curable resin is used, the composition of the resulting particle may be different from the composition of the raw material of the particle. During the dry-curing by heat, the solvent is partially evaporated. Thus, the volume ratio of particle of the invention in the raw material of the particle may be lower than the volume ratio of said particle in the resulting particle. In this embodiment, particle of the invention refers to particle 2 and/or nanoparticle.

Upon curing of the resin, a volume contraction is caused. According to one embodiment, a least 2%, 3%, 4%, 5%, 6%, 7%, 8%, 9%, 10%, 15%, or 20%, of contraction are aroused from a thermosetting resin or a photocurable resin. According to one embodiment, a dry-curable resin is contracted by at least 0.1%, 0.2%, 0.3%, 0.4%, 0.5%, 0.6%, 0.7%, 0.8%, 0.9%, 1%, 1.5%, 2%, 2.5%, 3%, 3.5%, 4%, 4.5%, 5%, 5.5%, 6%, 6.5%, 7%, 7.5%, 8%, 8.5%, 9%, 9.5%, 10%, 15%, or 20%. The contraction of the resin may cause movement of the particles 2 and/or nanoparticles, which may be lower the degree of dispersion of said particles in the first material 11 and/or the second material 21. However, embodiments of the present invention can maintain high dispersibility by preventing the movement of said particles by introducing other particles in the first material 11 and/or the second material 21

In one embodiment, the first material 11 and/or the second material 21 may be a polymerizable formulation which can include monomers, oligomers, polymers, or mixture thereof.

In one embodiment, the polymerizable formulation may further comprise a crosslinking agent, a scattering agent, a photo initiator or a thermal initiator.

In one embodiment, the polymerizable formulation includes but is not limited to: monomers, oligomers or polymers made from an alkyl methacrylates or an alkyl acrylates such as acrylic acid, methacrylic acid, crotonic acid, acrylonitrile, acrylic esters substituted with methoxy, ethoxy, propoxy, butoxy, and similar derivatives for example, methyl acrylate, ethyle acrylate, propyl acrylate, butyl acrylate, isobutyl acrylate, lauryl acrylate, norbomyl acrylate, 2-ethyl hexyl acrylate, 2-hydroxyethyl acrylate, 4-hydroxybutyl acrylate, benzyl acrylate, phenyl acrylate, isobornyle acrylate, hydroxypropyl acrylate, fluorinated acrylic monomers, chlorinated acrylic monomers, methacrylic acid, methyl methacrylate, n-butyl methacrylate, isobutyl methacrylate, 2-ethyl hexyl methacrylate, 2-hydroxyethyl methacrylate, 4-hydroxybutyl methacrylate, benzyl methacrylate, phenyl methacrylate, lauryl methacrylate, norbornyl methacrylate, isobornyle methacrylate, hydroxypropyl methacrylate, fluorinated methacrylic monomers, chlorinated methacrylic monomers, alkyl crotonates, allyl crotonates, glycidyl methacrylate and related esters.

In another embodiment, the polymerizable formulation includes but is not limited to: monomers, oligomers or polymers made from an alkyl acrylamide or alkyl methacrylamide such as acrylamide, Alkylacrylamide, N-tert-Butylacrylamide, Diacetone acrylamide, N,N-Diethylacrylamide, N-(Isobutoxymethyl)acrylamide, N-(3-Methoxypropyl) acrylamide, N-Diphenylmethylacrylamide, N-Ethylacrylamide, N-Hydroxyethyl acrylamide, N-(Isobutoxymethyl)acrylamide, N-Isopropylacrylamide, N-(3-Methoxypropyl)acrylamide, N-Phenylacrylamide, N-[Tris (hydroxymethyl)methyl]acrylamide, N,N-Diethylmethacrylamide, N,NDimethylacrylamide, N-[3-(Dimethylamino)propyl]methacrylamide, N-(Hydroxymethyl)acrylamide, 2-Hydroxypropyl methacrylamide, N-Isopropylmethacrylamide, Methacrylamide, N-(Triphenylmethyl)methacrylamide, poly (3,4-ethylenedioxythiopene), poly(ethylene dioxythiophene)/poly(styrene sulfonic acid) (PEDOT/PSS), an aqueous solution of polyaniline/camphor sulfonic acid (PANI/CSA), PTPDES, Et-PIT-DEK, PPBA, and similar derivatives.

In one embodiment, the polymerizable formulation includes but is not limited to: acrylate monomers, such as a mono- or multidentate acrylates; various methacrylate monomers, such as a mono- or multidentate methacrylates; and copolymers and mixtures thereof.

In one embodiment, the mono(meth)acrylate monomers and di(meth)acrylate monomers include but are not limited to: linear aliphatic mono(meth)acrylates and di(meth)acrylates, or cyclic and/or aromatic groups. In various embodiments, the mono(meth)acrylate monomers and/or di(meth) acrylate monomers are polyethers, or alkoxylated aliphatic di(meth)acrylate monomers such as for example neopentyl glycol group-containing di(meth)acrylates, alkoxylated neopentyl glycol diacrylates, neopentyl glycol propoxylate di(meth)acrylate, neopentyl glycol ethoxylate di(meth)acrylate.

In one embodiment, the mono(meth)acrylate monomers and di(meth)acrylate monomers include but are not limited to: alkyl (meth)acrylates, such as methyl (meth)acrylate and ethyl (meth)acrylate; cyclic trimethylolpropane formal (meth)acrylate; alkoxylated tetrahydrofurfuryl (meth)acrylate; phenoxyalkyl (meth)acrylates, such as 2-phenoxyethyl (meth)acrylate and phenoxymethyl (meth)acrylate; 2(2-ethoxyethoxy)ethyl (meth)acrylate. Other suitable di(meth) acrylate monomers include 1,6-hexanediol diacrylate, 1, 12 dodecanediol di(meth)acrylate; 1,3-butylene glycol di(meth) acrylate; di(ethylene glycol) methyl ether methacrylate; polyethylene glycol di(meth)acrylate monomers, including ethylene glycol di(meth)acrylate monomers and polyethylene glycol di(meth)acrylate monomers; dicyclopentenyloxyethyl acrylate (DCPOEA), isobornyl acrylate (ISOBA), dicyclopentenyloxyethyl methacrylate (DCPOEMA), isobornyl methacrylate (ISOBMA), and N-octadecyl methacrylate (OctaM). Homologs of ISOBA and ISOBMA.

In one embodiment, the polymerizable formulation includes but is not limited to: monomers, oligomers or polymers made from alpha-olefins, dienes such as butadiene and chloroprene; styrene, alpha-methyl styrene, and the like; heteroatom substituted alpha-olefins, for example, vinyl acetate, vinyl alkyl ethers for example, ethyl vinyl ether, vinyltrimethylsilane, vinyl chloride, tetrafluoroethylene, chlorotrifiuoroethylene, cyclic and polycyclic olefin compounds for example, cyclopentene, cyclohexene, cycloheptene, cyclooctene, and cyclic derivatives up to C20; polycyclic derivates for example, norbornene, and similar derivatives up to C20; cyclic vinyl ethers for example, 2, 3-dihydrofuran, 3,4-dihydropyran, and similar derivatives; allylic alcohol derivatives for example, vinylethylene carbonate, disubstituted olefins such as maleic and fumaric compounds for example, maleic anhydride, diethylfumarate, and the like, and mixtures thereof.

In one embodiment, examples of crosslinking agent include but are not limited to: di-acrylate, tri-acrylate, tetra-acrylate, di-methacrylate, tri-methacrylate and tetra-methacrylate monomers derivatives and the like. Another example of crosslinking agent includes but is not limited to: monomers, oligomers or polymers made from di- or trifunctional monomers such as allyl methacrylate, diallyl maleate, 1,3-butanediol dimethacrylate, 1,4-butanediol dimethacrylate, 1,6-hexanediol dimethacrylate, pentaerythritol triacrylate, trimethylolpropane triacrylate, Ethylene glycol dimethacrylate, Triethylene glycol dimethacrylate, N,N-methylenebis(acrylamide), N,N'-Hexamethylenebis (methacrylamide), and divinyl benzene.

In one embodiment, the polymerizable formulation may further comprise scattering particles Examples of scattering particles include but are not limited to: $SiO_2$, $ZrO_2$, ZnO, MgO, $SnO_2$, $TiO_2$, Ag, Au, alumina, barium sulfate, PTFE, barium titanate and the like.

In one embodiment, the polymerizable formulation may further comprise a thermal conductor.

Examples of thermal conductor include but are not limited to: $SiO_2$, $ZrO_2$, ZnO, MgO, $SnO_2$, $TiO_2$, CaO, alumina, barium sulfate, PTFE, barium titanate and the like. In this embodiment, the thermal conductivity of the first and/or second material (11, 21) is increased.

In one embodiment, the polymerizable formulation may further comprise a photo initiator.

Examples of photo initiators include but are not limited to: α-hydroxyketone, phenylglyoxylate, benzyldimethylketal, α-aminoketone, monoacylphosphine oxides, bisacylphosphine oxides, phosphine oxide, benzophenone and derivatives, polyvinyl cinnamate, metallocene or iodonium salt derivatives, 1-hydroxycyclohexyl phenyl ketone, thioxanthones (such as isopropylthioxanthone), 2-hydroxy-2-methyl-1-phenylpropan-1-one, 2-benzyl-2-dimethylamino-(4-morpholinophenyl)butan-1-one, benzil dimethylketal, bis(2,6-dimethylbenzoyl)-2,4,4-trimethylpentylphosphine oxide, 2,4,6-trimethylbenzoyldiphenylphosphine oxide, 2-methyl-1-[4-(methylthio)phenyl]-2-morpholinopropan-1-one, 2,2-dimethoxy-1,2-diphenylethan-1-one or 5,7-diiodo-3-butoxy-6-fluorone and the like. Other examples of photo initiators include, without limitation, Irgacure™ 184, Irgacure™ 500, Irgacure™ 907, Irgacure™ 369, Irgacure™ 1700, Irgacure™ 651, Irgacure™ 819, Irgacure™ 1000, Irgacure™ 1300, Irgacure™ 1870, Darocur™ 1 173, Darocur™ 2959, Darocur™ 4265 and Darocur™ ITX (available from Ciba Specialty Chemicals), Lucerin™ TPO (available from BASF AG), Esacure™ KT046, Esacure™ KIP150, Esacure™ KT37 and Esacure™ EDB (available from Lamberti), H-Nu™ 470 and H-Nu™ 470X (available from Spectra Group Ltd) and the like.

Further examples of photo initiators include, but are not limited to, those described in WO2017211587. Those include, but are not limited to, photo initiators of Formula (I) and mixtures thereof:

Formula (I)

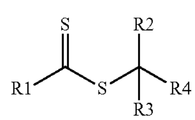

wherein:

R1 is selected from the group comprising or consisting of an optionally substituted alkyl group, an optionally substituted aryl or heteroaryl group, an optionally substituted alkenyl group, an optionally substituted alkynyl group, an optionally substituted alkaryl group, an optionally substituted aralkyl group, R5-O— and R6-S—;

R5 and R6 are independently selected from the group comprising or consisting of an optionally substituted alkyl group, an optionally substituted aryl or heteroaryl group, an optionally substituted alkenyl group, an optionally substituted alkynyl group, an optionally substituted alkaryl group and an optionally substituted aralkyl group;

R2 is selected from the group comprising or consisting of a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group;

R3 is selected from the group comprising or consisting of an electron withdrawing group comprising at least one oxygen carbon double bond, a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group; and R4 is selected from the group comprising or consisting of an electron withdrawing group comprising at least one oxygen carbon double bond, a nitrile group, an aryl group and a heteroaryl group;

with the proviso that at least one of R1 to R6 is functionalized with a photoinitiating moiety.

In one embodiment, the photo initiator according to Formula (I) is a compound wherein:

R1 is selected from the group comprising or consisting of an alkyl group, an aryl group, a heteroaryl group, an alkenyl group, an alkynyl group, an alkaryl group, an aralkyl group, R5-O—, R6-S— and a photoinitiating moiety selected from the group comprising or consisting of a thioxanthone group, a benzophenone group, an α-hydroxyketone group, an α-aminoketone group, an acylphosphine oxide group and a phenyl glyoxalic acid ester group;

R5 and R6 are independently selected from the group comprising or consisting of an alkyl group, an aryl or heteroaryl group, an alkenyl group, an alkynyl group, an alkaryl group, an aralkyl group and a photoinitiating moiety selected from the group consisting of a thioxanthone group, a benzophenone group, an α-hydroxyketone group, an α-aminoketone group, an acylphosphine oxide group and a phenyl glyoxalic acid ester group;

R2 is selected from the group comprising or consisting of hydrogen, an alkyl group, an aryl group, a heteroaryl group, an alkenyl group, an alkynyl group, an alkaryl group and an aralkyl group;

R3 is selected from the group comprising or consisting of —C(═O)—O—R7, —C(═O)—NR8-R9, C(═O)—R7, hydrogen, an alkyl group, an aryl group, heteroaryl group, an alkenyl group, an alkynyl group, an alkaryl group, an aralkyl group, a thioxanthone group, a benzophenone group, an α-aminoketone group, an acylphosphine oxide group and a phenyl glyoxalic acid ester group; and R4 is selected from the group comprising or consisting of —C(═O)—O—R10, —C(═O)—NR11-R12, C(═O)—R10, a nitrile group, an aryl group, a heteroaryl group, a thioxanthone group, a benzophenone group, an α-aminoketone group, an acylphosphine oxide group and a phenyl glyoxalic acid ester group;

R7 to R10 are independently selected from the group consisting of hydrogen, an alkyl group, an aryl or heteroaryl group, an alkenyl group, an alkynyl group, an alkaryl group, an aralkyl group and a photoinitiating moiety selected from the group consisting of a thioxanthone group, a benzophenone group, an α-hydroxyketone group, an α-aminoketone group, an acylphosphine oxide group and a phenyl glyoxalic acid ester group, or R8 and R9 and/or R11 and R12 may represent the necessary atoms to form a five or six membered ring;

with the proviso that at least one of R1, R3 and R4 is functionalized with a photoinitiating moiety.

In one embodiment, the photo initiator according to Formula (I) is a compound of Formula (II):

Formula (II)

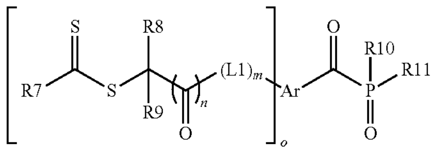

wherein:

R7 is selected from the group comprising or consisting of an optionally substituted alkyl group, an optionally substituted aryl or heteroaryl group, an optionally substituted alkenyl group, an optionally substituted alkynyl group, an optionally substituted alkaryl group, an optionally substituted aralkyl group, —O—R5 and —S—R6;

Ar represents an optionally substituted carbocyclic arylene group;

L1 represents a divalent linking group comprising not more than 10 carbon atoms;

R8 and R9 are independently selected from the group comprising or consisting of a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group;

R10 is selected from the group consisting of an optionally substituted alkyl group, an optionally substituted aryl group, an optionally substituted alkoxy group and an optionally substituted aryloxy group;

R11 is selected from the group comprising or consisting of an optionally substituted alkyl group, an optionally substituted aryl group, an optionally substituted alkoxy group, an optionally substituted aryloxy group and an acyl group;

n and m each independently represent 1 or 0;

o represents an integer from 1 to 5;

with the proviso that if n=0 and m=1 that L1 is coupled to CR8R9 via a carbon atom of an aromatic or heteroaromatic ring.

In one embodiment, the photo initiator according to Formula (I) is a compound of Formula (III):

Formula (III)

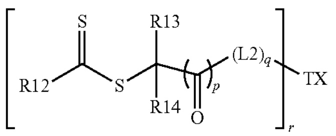

wherein:

R12 is selected from the group comprising or consisting of an optionally substituted alkyl group, an optionally substituted aryl or heteroaryl group, an optionally substituted alkenyl group, an optionally substituted alkynyl group, an optionally substituted alkaryl group, an optionally substituted aralkyl group, —O—R5 and —S—R6;

R5 and R6 are independently selected from the group comprising or consisting of an optionally substituted alkyl group, an optionally substituted aryl or heteroaryl group, an optionally substituted alkenyl group, an optionally substituted alkynyl group, an optionally substituted alkaryl group and an optionally substituted aralkyl group;

L2 represents a divalent linking group comprising or consisting of not more than 20 carbon atoms;

TX represents an optionally substituted thioxanthone group;

p and q each independently represent 1 or 0;

r represents an integer from 1 to 5;

R13 and R14 are independently selected from the group comprising or consisting of a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group;

with the proviso that if p=0 and q=1 that L2 is coupled to CR13R14 via a carbon atom of an aromatic or heteroaromatic ring.

In one embodiment, the photo initiator according to Formula (I) is a compound of Formula (IV):

Formula (IV)

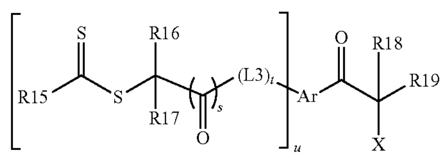

wherein:

R15 is selected from the group comprising or consisting of an optionally substituted alkyl group, an optionally substituted aryl or heteroaryl group, an optionally substituted alkenyl group, an optionally substituted alkynyl group, an optionally substituted alkaryl group, an optionally substituted aralkyl group, —O—R5 and —S—R6;

R5 and R6 are independently selected from the group comprising or consisting of an optionally substituted alkyl group, an optionally substituted aryl or heteroaryl group, an optionally substituted alkenyl group, an optionally substituted alkynyl group, an optionally substituted alkaryl group and an optionally substituted aralkyl group;

Ar represents an optionally substituted carbocyclic arylene group;

L3 represents a divalent linking group comprising or consisting not more than 20 carbon atoms;

R16 and R17 are independently selected from the group comprising or consisting of a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group;

R18 and R19 are independently selected from the group comprising or consisting of an optionally substituted alkyl group, an optionally substituted aryl group, an optionally substituted aralkyl group and an optionally substituted alkaryl group with the proviso that R18 and R19 may represent the necessary atoms to form a five to eight membered ring; X represents OH or NR20R21;

R20 and R21 are independently selected from the group comprising or consisting of an optionally substituted alkyl group, an optionally substituted aryl group, an optionally substituted aralkyl group and an optionally substituted alkaryl group, with the proviso that R20 and R21 may represent the necessary atoms to form a five to eight membered ring;

s and t each independently represent 1 or 0;

u represents an integer from 1 to 5;

with the proviso that if s=0 and t=1 that L3 is coupled to CR16R17 via a carbon atom of an aromatic or heteroaromatic ring.

In one embodiment, the photo initiator according to Formula (I) is a compound of Formula (V):

Formula (V)

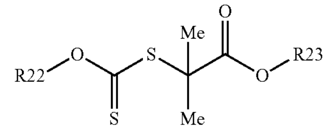

wherein:

R22 represents an alkyl group having no more than 6 carbon atoms; and

R23 represents a photoinitiating moiety selected from the group comprising or consisting of an acylphosphine oxide group, a thioxanthone group, a benzophenone group, an α-hydroxy ketone group and an α-amino ketone group.

In one embodiment, the photo initiator according to Formula (I) is a compound of Formula (VI) to (XXVIII):

Formula (VI)

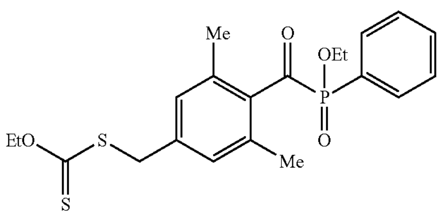

Formula (VII)

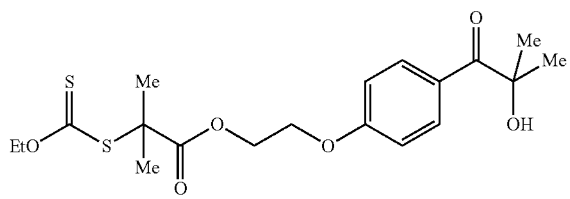

Formula (VIII)

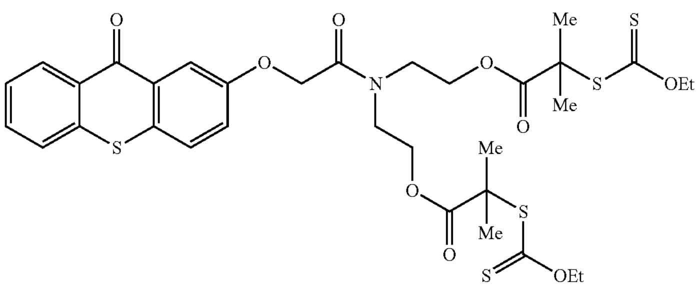

Formula (IX)

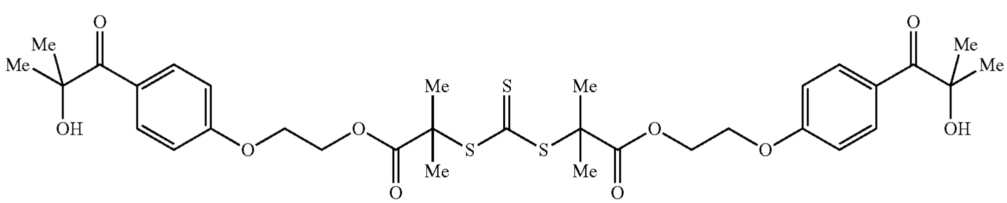

Formula (X)

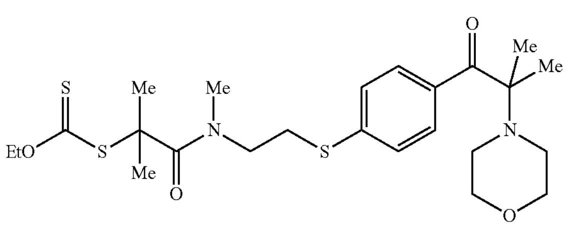

Formula (XI)

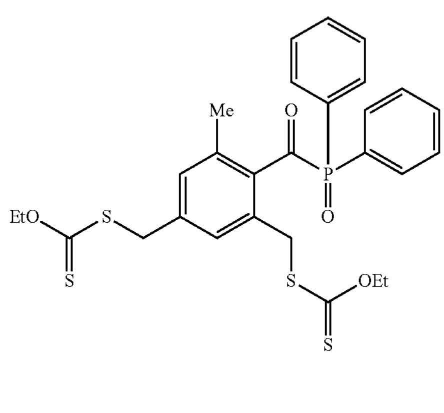

-continued
Formula (XII)
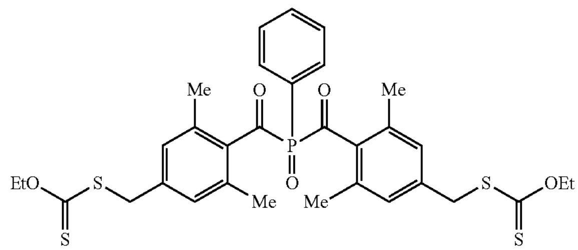
Formula (XIII)
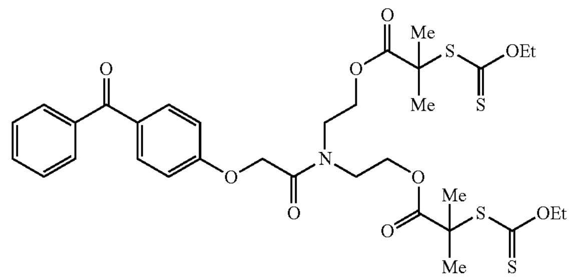
Formula (XIV)
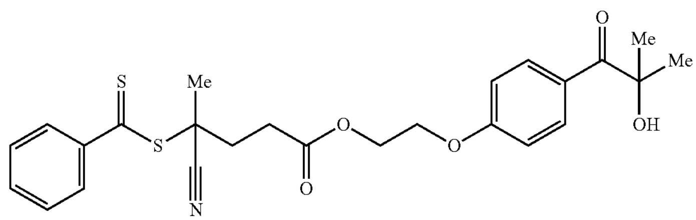
Formula (XV)
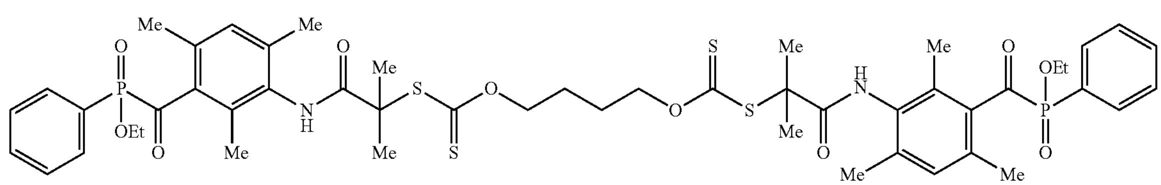
Formula (XVI)
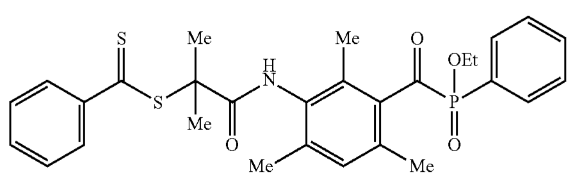
Formula (XVII)
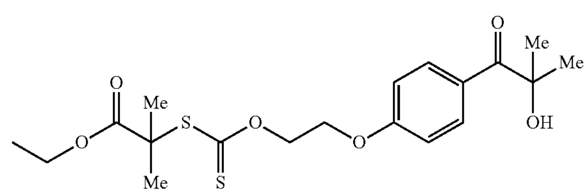
Formula (XVIII)
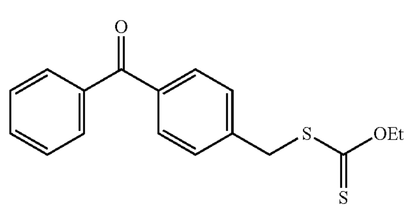
Formula (XIX)
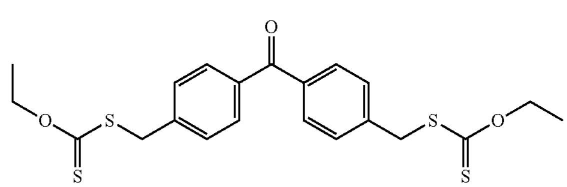
Formula (XX)
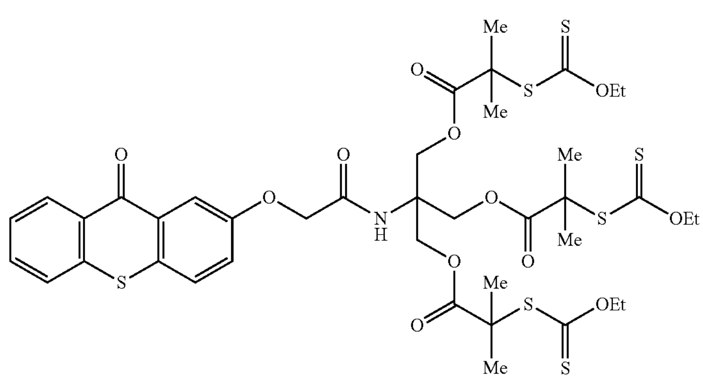

-continued
Formula (XXI)
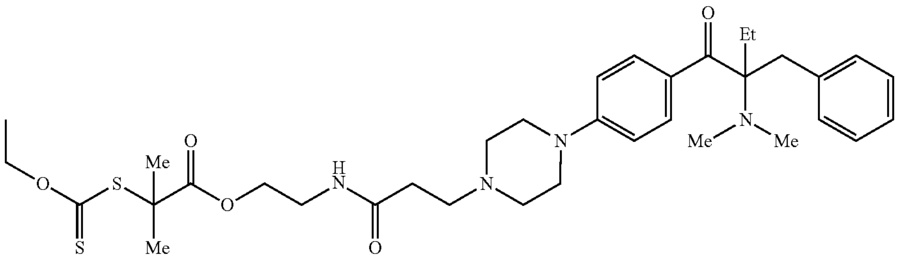
Formula (XXII)
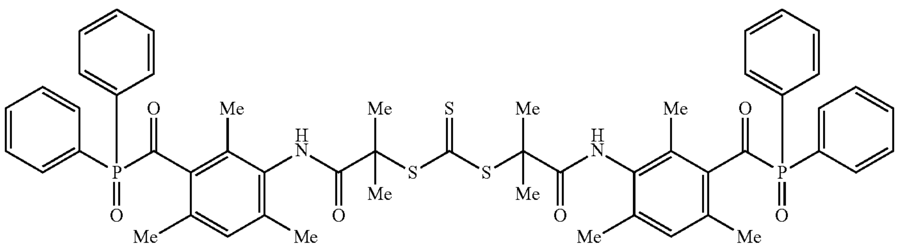
Formula (XXIII)
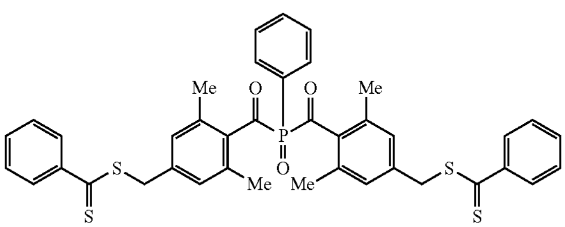
Formula (XXIV)
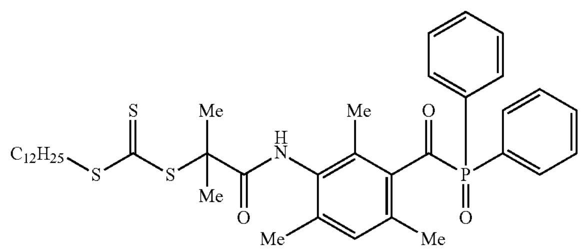
Formula (XXV)
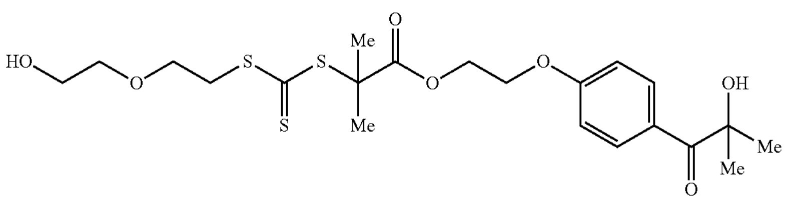
Formula (XXVI)
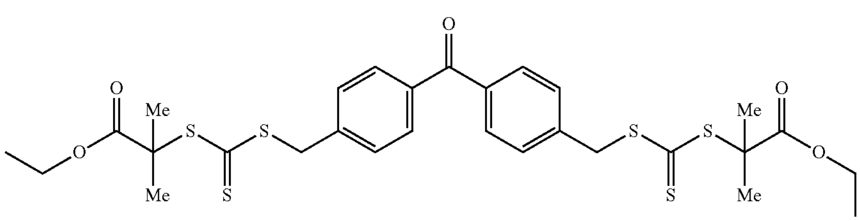
Formula (XXVII)
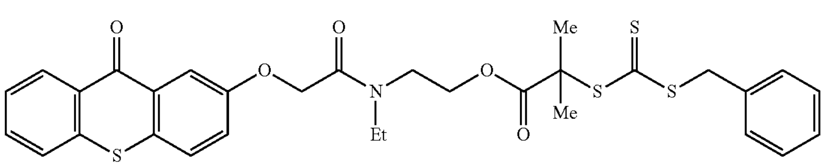

-continued

Formula (XXVIII)

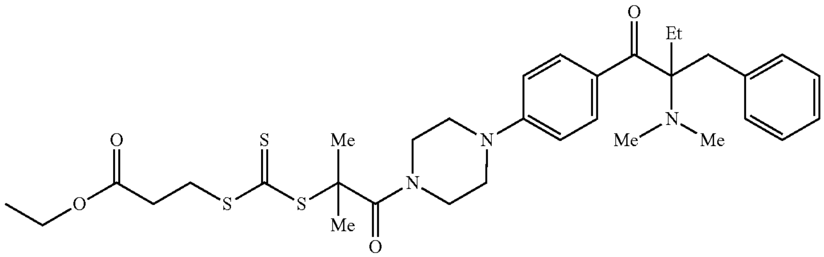

Further examples of photo initiators include, but are not limited to, polymerizable photo initiators, such as, e.g., those described in WO2017220425. Those include, but are not limited to, photo initiators of Formula (XXIX) and Formula (XXX), and mixtures thereof:

(Formula XXIX)

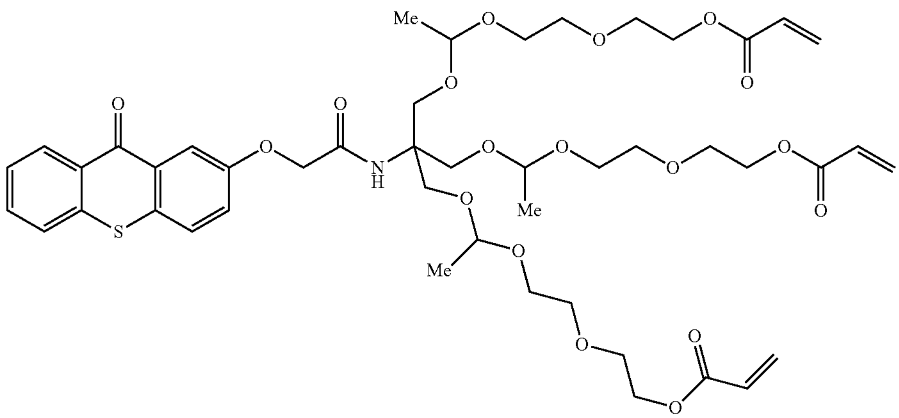

(Formula XXX)

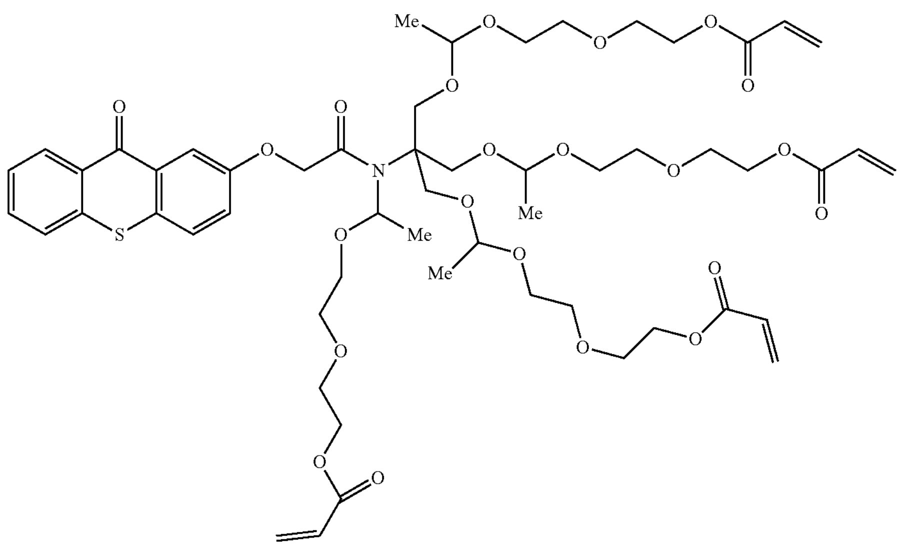

Preferably, a mixture of polymerizable photo initiators of Formula (XXIX) and Formula (XXX) may comprise or consist of an amount ranging from 0.1% w/w to 20.0% w/w, more preferably no more than 10.0% w/w of the photo initiator of Formula (XXX), based on the total weight of polymerizable photo initiators of Formula (XXIX) and Formula (XXX). Preferably, a mixture of polymerizable photo initiators of Formula (XXIX) and Formula (XXX) may comprise or consist of an amount of 75.0% w/w, more preferably an amount ranging from 80.0% w/w to 99.9% w/w of the photo initiator of Formula (XXIX), based on the total weight of polymerizable photo initiators of Formula (XXIX) and Formula (XXX).

In one embodiment, the polymerizable formulation may further comprise a thermal initiator. Examples of thermal initiator include but are limited to: peroxide compounds, azo compounds such as azobisisobutyronitrile (AIBN) and 4,4-

Azobis(4-cyanovaleric acid), potassium and ammonium persulfate, tert-Butyl peroxide, benzoyl peroxide and the like.

In one embodiment, the first material 11 and/or the second material 21 comprise a polymerized solid made from an alkyl methacrylates or an alkyl acrylates such as acrylic acid, methacrylic acid, crotonic acid, acrylonitrile, acrylic esters substituted with methoxy, ethoxy, propoxy, butoxy, and similar derivatives for example, methyl acrylate, ethyle acrylate, propyl acrylate, butyl acrylate, isobutyl acrylate, lauryl acrylate, norbornyl acrylate, 2-ethyl hexyl acrylate, 2-hydroxyethyl acrylate, 4-hydroxybutyl acrylate, benzyl acrylate, phenyl acrylate, isobornyle acrylate, hydroxypropyl acrylate, fluorinated acrylic monomers, chlorinated acrylic monomers, methacrylic acid, methyl methacrylate, nbutyl methacrylate, isobutyl methacrylate, 2-ethyl hexyl methacrylate, 2-hydroxyethyl methacrylate, 4-hydroxybutyl methacrylate, benzyl methacrylate, phenyl methacrylate, lauryl methacrylate, norbornyl methacrylate, isobornyle methacrylate, hydroxypropyl methacrylate, fluorinated methacrylic monomers, chlorinated methacrylic monomers, alkyl crotonates, allyl crotonates, glycidyl methacrylate and related esters.

In one embodiment, the first material 11 and/or the second material 21 comprise a polymerized solid made from an alkyl acrylamide or alkyl methacrylamide such as acrylamide, Alkylacrylamide, Ntert-Butylacrylamide, Diacetone acrylamide, N,N-Diethylacrylamide, N-Isobutoxymethyl) acrylamide, N-(3-Methoxypropyl)acrylamide, NDiphenylmethylacrylamide, N-Ethylacrylamide, N-Hydroxyethyl acrylamide, N-(Isobutoxymethyl)acrylamide, N-Isopropylacrylamide, N-(3-Methoxypropyl)acrylamide, N-Phenylacrylamide, N-[Tris(hydroxymethyl)methyl]acrylamide, N,N-Diethylmethacrylamide, N,NDimethylacrylamide, N-[3-(Dimethylamino)propyl]methacrylamide, N-(Hydroxymethyl)acrylamide, 2-Hydroxypropyl methacrylamide, NIsopropylmethacrylamide, Methacrylamide, N-(Triphenylmethyl)methacrylamide and similar derivatives.

In one embodiment, the first material 11 and/or the second material 21 comprise a polymerized solid made from alpha-olefins, dienes such as butadiene and chloroprene; styrene, alpha-methyl styrene, and the like; heteroatom substituted alpha-olefins, for example, vinyl acetate, vinyl alkyl ethers for example, ethyl vinyl ether, vinyltrimethylsilane, vinyl chloride, tetrafluoroethylene, chlorotrifiuoroethylene, cyclic and polycyclic olefin compounds for example, cyclopentene, cyclohexene, cycloheptene, cyclooctene, and cyclic derivatives up to C20; polycyclic derivates for example, norbornene, and similar derivatives up to C20; cyclic vinyl ethers for example, 2, 3-dihydrofuran, 3,4-dihydropyran, and similar derivatives; allylic alcohol derivatives for example, vinylethylene carbonate, disubstituted olefins such as maleic and fumaric compounds for example, maleic anhydride, diethylfumarate, and the like, and mixtures thereof.

In one embodiment, the first material 11 and/or the second material 21 comprise PMMA, Poly(lauryl methacrylate), glycolized poly(ethylene terephthalate), Poly(maleic anhydride-altoctadecene), or mixtures thereof.

In one embodiment, the first material 11 and/or the second material 21 may comprise a copolymer of vinyl chloride and a hydroxyfunctional monomer. Such copolymer is described, e.g., in WO2017102574. In such embodiment, examples of hydroxyfunctional monomers include, without limitation, 2-hydroxypropyl acrylate, 1-hydroxy-2-propyl acrylate, 3-methyl-3-buten-1-ol, 2-methyl-2-propenoic acid 2-hydroxypropyl ester, 2-hydroxy-3-chloropropyl methacrylate, N-methylolmethacrylamide, 2-hydroxyethyl methacrylate, poly(ethylene oxide) monomethacrylate, glycerine monomethacrylate, 1,2-propylene glycol methacrylate, 2,3-hydroxypropyl methacrylate, 2-hydroxyethyl acrylate, vinyl alcohol, N-methylolacrylamid, 2-propenoic acid 5-hydroxypentyl ester, 2-methyl-2-propenoic acid, 3-chloro-2-hydroxypropyl ester, 1-hydroxy-2-propenoic acid, 1-methylethyl ester, 2-hydroxyethyl allyl ether, 4-hydroxybutyl acrylate, 1,4-butanediol monovinyl ether, poly(e-caprolactone) hydroxyethyl methacrylate ester, poly(ethylene oxide) monomethacrylate, 2-methyl-2-propenoic acid, 2,5-dihydroxypentyl ester, 2-methyl-2-propenoic acid, 5,6-dihydroxyhexyl ester, 1,6-hexanediol monomethacrylate, 1,4-dideoxy-pentitol, 5-(2-methyl-2-propenoate), 2-propenoic acid, 2,4-dihydroxybutyl ester, 2-propenoic acid, 3,4-dihydroxybutyl ester, 2-methyl-2-propenoic acid, 2-hydroxy butyl ester, 3-hydroxypropyl methacrylate, 2-propenoic acid, 2,4-dihydroxybutyl ester and isopropenyl alcohol. Examples of copolymers of vinyl chloride and a hydroxy-functional monomer include, without limitation, chloroethylene-vinyl acetate-vinyl alcohol copolymer, vinyl alcohol-vinyl chloride copolymer, 2-hydroxypropyl acrylate-vinyl chloride polymer, propanediol monoacrylate-vinyl chloride copolymer, vinyl acetate-vinyl chloride-2-hydroxypropyl acrylate copolymer, hydroxyethyl acrylate-vinyl chloride copolymer and 2-hydroxyethyl methacrylate-vinyl chloride copolymer.

According to one embodiment, the organic polymer is selected from polyacrylates; polymethacrylates; polyacrylamides; polyamides; polyesters; polyethers; polyoelfins; polysaccharides; polyurethanes (or polycarbamates), polystyrenes; polyacrylonitrile-butadiene-styrene (ABS); polycarbonate; poly(styrene acrylonitrile); vinyl polymers such as polyvinyl chloride; polyvinyl alcohol, polyvinyl acetate, polyvinylpyrrolidone, polyvinyl pyridine, polyvinylimidazole; poly(p-phenylene oxide); polysulfone; polyethersulfone; polyethylenimine; polyphenylsulfone; poly(acrylonitrile styrene acrylate); polyepoxides, polythiophenes, polypyrroles; polyanilines; polyaryletherketones; polyfurans; polyimides; polyimidazoles; polyetherimides; polyketones; polynucleotides; polystyrene sulfonates; polyetherimines; polyamic acid; or any combinations and/or derivatives and/or copolymers thereof.

According to one embodiment, the organic polymer is a polyacrylate, preferably selected from poly(methyl acrylate), poly(ethyl acrylate), poly(propyl acrylate), poly(butyl acrylate), poly(pentyl acrylate), and poly(hexyl acrylate).

According to one embodiment, the organic polymer is a polymethacrylate, preferably selected from poly(methyl methacrylate), poly(ethyl methacrylate), poly(propyl methacrylate), poly(butyl methacrylate), poly(pentyl methacrylate), and poly(hexyl methacrylate). According to one embodiment, the organic polymer is poly(methyl methacrylate) (PMMA).

According to one embodiment, the organic polymer is a polyacrylamide, preferably selected from poly(acrylamide); poly(methyl acrylamide), poly(dimethyl acrylamide), poly (ethyl acrylamide), poly(diethyl acrylamide), poly(propyl acrylamide), poly(isopropyl acrylamide); poly(butyl acrylamide); and poly(tert-butyl acrylamide).

According to one embodiment, the organic polymer is a polyester, preferably selected from poly(glycolic acid) (PGA), poly(lactic acid) (PLA), poly(caprolactone) (PCL), polyhydroxyalcanoate (PHA), polyhydroxybutyrate (PHB), polyethylene adipate, polybutylene succinate, poly(ethylene terephthalate), poly(butylene terephthalate), poly(trimethylene terephthalate), polyarylate or any combination thereof.

According to one embodiment, the organic polymer is a polyether, preferably selected from aliphatic polyethers such as poly(glycol ether) or aromatic polyethers. According to one embodiment, the polyether is selected from poly(methylene oxide); poly(ethylene glycol)/poly(ethylene oxide), poly(propylene glycol) and poly(tetrahydrofuran).

According to one embodiment, the organic polymer is a polyolefin (or polyalkene), preferably selected from poly (ethylene), poly(propylene), poly(butadiene), poly(methylpentene), poly(butane) and poly(isobutylene).

According to one embodiment, the organic polymer is a polysaccharide selected from chitosan, dextran, hyaluronic acid, amylose, amylopectin, pullulan, heparin, chitin, cellulose, dextrin, starch, pectin, alginates, carrageenans, fucan, curdlan, xylan, polyguluronic acid, xanthan, arabinan, polymannuronic acid and their derivatives.

According to one embodiment, the organic polymer is a polyamide, preferably selected from polycaprolactame, polyauroamide, polyundecanamide, polytetramethylene adipamide, polyhexamethylene adipamide (also called nylon), polyhexamethylene nonanediamide, polyhexamethylene sebacamide, polyhexamethylene dodecanediamide; polydecamethylene sebacamide; polyhexamethylene isophthalamide; polymetaxylylene adipamide; polymetaphenylene isophthalamide; polyparaphenylene terephtalamide; polyphtalimides.

According to one embodiment, the organic polymer is a naturel or synthetic polymer.

According to one embodiment, the organic polymer is synthetized by organic reaction, radical polymerization, polycondensation, polyaddition, or ring opening polymerization (ROP).

According to one embodiment, the organic polymer is a homopolymer or a copolymer.

According to one embodiment, the organic polymer is linear, branched, and/or cross-linked.

According to one embodiment, the branched organic polymer is brush polymer (or also called comb polymer) or is a dendrimer.

According to one embodiment, the organic polymer is amorphous, semi-crystalline or crystalline. According to one embodiment, the organic polymer is a thermoplastic polymer or an elastomer.

According to one embodiment, the organic polymer is not a polyelectrolyte.

According to one embodiment, the organic polymer is not a hydrophilic polymer.

According to one embodiment, the organic polymer has an average molecular weight ranging from 2 000 g/mol to $5.10^6$ g/mol, preferably from 5 000 g/mol to $4.10^6$ g/mol; from 6 000 to $4.10^6$; from 7 000 to $4.10^6$; from 8 000 to $4.10^6$; from 9 000 to $4.10^6$; from 10 000 to $4.10^6$; from 15 000 to $4.10^6$; from 20 000 to $4.10^6$; from 25 000 to $4.10^6$; from 30 000 to $4.10^6$; from 35 000 to $4.10^6$; from 40 000 to $4.10^6$; from 45 000 to $4.10^6$; from 50 000 to $4.10^6$; from 55 000 to $4.10^6$; from 60 000 to $4.10^6$; from 65 000 to $4.10^6$; from 70 000 to $4.10^6$; from 75 000 to $4.10^6$; from 80 000 to $4.10^6$; from 85 000 to $4.10^6$; from 90 000 to $4.10^6$; from 95 000 to $4.10^6$; from 100 000 to $4.10^6$; from 200 000 to $4.10^6$; from 300 000 to $4.10^6$; from 400 000 to $4.10^6$; from 500 000 to $4.10^6$; from 600 000 to $4.10^6$; from 700 000 to $4.10^6$; from 800 000 to $4.10^6$; from 900 000 to $4.10^6$; from $1.10^6$ to $4.10^6$; from $2.10^6$ to $4.10^6$; from $3.10^6$ g/mol to $4.10^6$ g/mol.

According to one embodiment, the organic material is selected from polyacrylates; polymethacrylate; polyacrylamide; polyester; polyether; polyolefin (or polyalkene); polysaccharide; polyamide; or a mixture thereof; preferably the organic material is an organic polymer.

According to one embodiment, the first material 11 and/or the second material 21 are hybrid materials comprising at least one inorganic constituent and at least one organic constituent. In this embodiment the inorganic constituent is an inorganic material as described hereabove and the organic constituent is an organic material as described hereabove.

According to one embodiment, the polymer is optically transparent, i.e., the polymer is transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

According to one embodiment, the polymer is not optically transparent.

According to one embodiment, the polymer transmits at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the polymer transmits a part of the incident light and emits at least one secondary light. In this embodiment, the resulting light is a combination of the remaining transmitted incident light.

According to one embodiment, the polymer absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the polymer absorbs the incident light with wavelength lower than 460 nm.

According to one embodiment, the first material 11 and/or the second material 21 comprise additional heteroelements, wherein said additional heteroelements include but are not limited to: Cd, S, Se, Zn, In, Te, Hg, Sn, Cu, N, Ga, Sb, Tl, Mo, Pd, Ce, W, Co, Mn, Si, Ge, B, P, Al, As, Fe, Ti, Zr, Ni, Ca, Na, Ba, K, Mg, Pb, Ag, V, Be, Ir, Sc, Nb, Ta or a mixture thereof. In this embodiment, heteroelements can diffuse in the particle 1 and/or the particle 2 during heating step. They may form nanoclusters inside the particle 1 and/or the particle 2. These elements can limit the degradation of the photoluminescence of said particle 1 and/or the particle 2 during the heating step, and/or drain away the heat if it is a good thermal conductor, and/or evacuate electrical charges.

According to one embodiment, the first material 11 and/or the second material 21 comprise additional heteroelements in small amounts of 0 mole %, 1 mole %, 5 mole %, 10 mole %, 15 mole %, 20 mole %, 25 mole %, 30 mole %, 35 mole %, 40 mole %, 45 mole %, 50 mole % relative to the majority element of said first material 11.

According to one embodiment, the first material 11 and/or the second material 21 comprise $Al_2O_3$, $SiO_2$, MgO, ZnO, $ZrO_2$, $TiO_2$, $IrO_2$, $SnO_2$, BaO, $BaSO_4$, BeO, CaO, $CeO_2$, CuO, $Cu_2O$, $DyO_3$, $Fe_2O_3$, $Fe_3O_4$, $GeO_2$, $HfO_2$, $Lu_2O_3$, $Nb_2Os$, $Sc_2O_3$, $TaO_5$, $TeO_2$, or $Y_2O_3$ additional nanoparticles. These additional nanoparticles can drain away the heat if it is a good thermal conductor, and/or evacuate electrical charges, and/or scatter an incident light.

According to one embodiment, the first material 11 and/or the second material 21 comprise additional nanoparticles in small amounts at a level of at least 100 ppm, 200 ppm, 300 ppm, 400 ppm, 500 ppm, 600 ppm, 700 ppm, 800 ppm, 900 ppm, 1000 ppm, 1100 ppm, 1200 ppm, 951300 ppm, 1400 ppm, 1500 ppm, 1600 ppm, 1700 ppm, 1800 ppm, 1900 ppm, 2000 ppm, 1300 ppm, 1400 ppm, 1500 ppm, 1600 ppm, 1700 ppm, 1800 ppm, 1900 ppm, 2000 ppm, 2100 ppm, 2200 ppm, 2300 ppm, 2400 ppm, 2500 ppm, 2600 ppm, 2700 ppm, 2800 ppm, 2900 ppm, 3000 ppm, 3100 ppm, 3200 ppm, 3300 ppm, 3400 ppm, 3500 ppm, 3600 ppm, 3700 ppm, 3800 ppm, 3900 ppm, 4000 ppm, 4100 ppm, 4200 ppm, 4300 ppm, 4400 ppm, 4500 ppm, 4600 ppm, 4700 ppm, 4800 ppm, 4900 ppm, 5000 ppm, 5100 ppm, 5200 ppm, 5300 ppm, 5400 ppm, 5500 ppm, 5600 ppm, 5700 ppm, 5800 ppm, 5900 ppm, 6000 ppm, 6100 ppm, 6200 ppm, 6300 ppm, 6400 ppm, 6500 ppm, 6600 ppm, 6700 ppm, 6800 ppm, 6900 ppm, 7000 ppm, 7100 ppm, 7200 ppm, 7300 ppm, 7400 ppm, 7500 ppm, 7600 ppm, 7700 ppm, 7800 ppm, 7900 ppm, 8000 ppm, 8100 ppm, 8200 ppm, 8300 ppm, 8400 ppm, 8500 ppm, 8600 ppm, 8700 ppm, 8800 ppm, 8900 ppm, 9000 ppm, 9100 ppm, 9200 ppm, 9300 ppm, 9400 ppm, 9500 ppm, 9600 ppm, 9700 ppm, 9800 ppm, 9900 ppm, 10000 ppm, 10500 ppm, 11000 ppm, 11500 ppm, 12000 ppm, 12500 ppm, 13000 ppm, 13500 ppm, 14000 ppm, 14500 ppm, 15000 ppm, 15500 ppm, 16000 ppm, 16500 ppm, 17000 ppm, 17500 ppm, 18000 ppm, 18500 ppm, 19000 ppm, 19500 ppm, 20000 ppm, 30000 ppm, 40000 ppm, 50000 ppm, 60000 ppm, 70000 ppm, 80000 ppm, 90000 ppm, 100000 ppm, 110000 ppm, 120000 ppm, 130000 ppm, 140000 ppm, 150000 ppm, 160000 ppm, 170000 ppm, 180000 ppm, 190000 ppm, 200000 ppm, 210000 ppm, 220000 ppm, 230000 ppm, 240000 ppm, 250000 ppm, 260000 ppm, 270000 ppm, 280000 ppm, 290000 ppm, 300000 ppm, 310000 ppm, 320000 ppm, 330000 ppm, 340000 ppm, 350000 ppm, 360000 ppm, 370000 ppm, 380000 ppm, 390000 ppm, 400000 ppm, 410000 ppm, 420000 ppm, 430000 ppm, 440000 ppm, 450000 ppm, 460000 ppm, 470000 ppm, 480000 ppm, 490000 ppm, or 500 000 ppm in weight compared to the particle 1 and/or the particle 2.

According to one embodiment, the first material 11 and/or the second material 21 have a density ranging from 1 to 10, preferably the first material 11 has a density ranging from 3 to 10.

According to one embodiment, the first material 11 has a density superior or equal to the density of the second material 21.

According to one embodiment, the refractive index of first material 11 and second material 21 is tuned by the first material 11 and second material 21 chosen.

According to one embodiment, the first material 11 and/or the second material 21 have a refractive index ranging from 1 to 5, from 1.2 to 2.6, from 1.4 to 2.0.

According to one embodiment, the first material 11 and/or the second material 21 have a refractive index of at least 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, 4.0, 4.1, 4.2, 4.3, 4.4, 4.5, 4.6, 4.7, 4.8, 4.9, or 5.0.

According to one embodiment, the first material 11 has the same refractive index than the second material 21.

According to one embodiment, the first material 11 has a refractive index distinct from the refractive index of the second material 21. This embodiment allows for a wider scattering of light. This embodiment also allows to have a difference in light scattering as a function of the wavelength, in particular to increase the scattering of the excitation light with respect to the scattering of the emitted light, as the wavelength of the excitation light is lower than the wavelength of the emitted light.

According to one embodiment, the first material 11 has a refractive index superior or equal to the refractive index of the second material 21.

According to one embodiment, the first material 11 has a refractive index inferior to the refractive index of the second material 21.

According to one embodiment, the first material 11 has a difference of refractive index with the refractive index of the second material 21 of at least 0.02, 0.025, 0.03, 0.035, 0.04, 0.045, 0.05, 0.055, 0.06, 0.065, 0.07, 0.075, 0.08, 0.085, 0.09, 0.095, 0.1, 0.11, 0.115, 0.12, 0.125, 0.13, 0.135, 0.14, 0.145, 0.15, 0.155, 0.16, 0.165, 0.17, 0.175, 0.18, 0.185, 0.19, 0.195, 0.2, 0.25, 0.3, 0.35, 0.4, 0.45, 0.5, 0.55, 0.6, 0.65, 0.7, 0.75, 0.8, 0.85, 0.9, 0.95, 1, 1.1, 1.15, 1.2, 1.25, 1.3, 1.35, 1.4, 1.45, 1.5, 1.55, 1.6, 1.65, 1.7, 1.75, 1.8, 1.85, 1.9, 1.95, or 2.

According to one embodiment, the first material 11 has a difference of refractive index with the second material 21 ranging from 0.02 to 2, ranging from 0.02 to 1.5, ranging from 0.03 to 1.5, ranging from 0.04 to 1.5, ranging from 0.05 to 1.5, ranging from 0.02 to 1.2, ranging from 0.03 to 1.2, ranging from 0.04 to 1.2, ranging from 0.05 to 1.2, ranging from 0.05 to 1, ranging from 0.1 to 1, ranging from 0.2 to 1, ranging from 0.3 to 1, ranging from 0.5 to 1, ranging from 0.05 to 2, ranging from 0.1 to 2, ranging from 0.2 to 2, ranging from 0.3 to 2, or ranging from 0.5 to 2.

The difference of refractive index was measured at 450 nm.

According to one embodiment, the first material 11 has a difference of refractive index with the refractive index of the second material 21 of 0.02.

According to one embodiment, the first material 11 and/or the second material 21 act as a barrier against oxidation of the at least one nanoparticle 3.

According to one embodiment, the first material 11 and/or the second material 21 are thermally conductive.

According to one embodiment, the first material 11 and/or the second material 21 have a thermal conductivity at standard conditions ranging from 0.1 to 450 W/(m·K), preferably from 1 to 200 W/(m·K), more preferably from 10 to 150 W/(m·K).

According to one embodiment, the first material 11 and/or the second material 21 have a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7

W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the thermal conductivity of the first material 11 and/or the second material 21 may be measured by for example by steady-state methods or transient methods.

According to one embodiment, the first material 11 and/or the second material 21 are not thermally conductive.

According to one embodiment, the first material 11 and/or the second material 21 comprise a refractory material.

According to one embodiment, the first material 11 and/or the second material 21 are electrically insulator. In this embodiment, the quenching of fluorescent properties for fluorescent nanoparticles encapsulated in the second material 21 is prevented when it is due to electron transport. In this embodiment, the particle 1 may be used as an electrical insulator material exhibiting the same properties as the nanoparticles 3 encapsulated in the second material 21.

According to one embodiment, the first material 11 and/or the second material 21 are electrically conductive. This embodiment is particularly advantageous for an application of the particle 1 in photovoltaics or LEDs.

According to one embodiment, the first material 11 and/or the second material 21 have an electrical conductivity at standard conditions ranging from $1\times10^{-20}$ to $10^7$ S/m, preferably from $1\times10^{-15}$ to 5 S/m, more preferably from $1\times10^{-7}$ to 1 S/m.

According to one embodiment, the first material 11 and/or the second material 21 have an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the first material 11 and/or the second material 21 may be measured for example with an impedance spectrometer.

According to one embodiment, the first material 11 and/or the second material 21 are amorphous.

According to one embodiment, the first material 11 and/or the second material 21 are crystalline.

According to one embodiment, the first material 11 and/or the second material 21 are totally crystalline.

According to one embodiment, the first material 11 and/or the second material 21 are partially crystalline.

According to one embodiment, the first material 11 and/or the second material 21 are monocrystalline.

According to one embodiment, the first material 11 and/or the second material 21 are polycrystalline. In this embodiment, the first material 11 and/or the second material 21 comprise at least one grain boundary.

According to one embodiment, the first material 11 and/or the second material 21 are hydrophobic.

According to one embodiment, the first material 11 and/or the second material 21 are hydrophilic.

According to one embodiment, the first material 11 or the second material 21 is porous.

According to one embodiment, the first material 11 or the second material 21 is considered porous when the quantity adsorbed by the particle 1 or the particle 2 determined by adsorption-desorption of nitrogen in the Brunauer-Emmett-Teller (BET) theory is more than 20 $cm^3/g$, 15 $cm^3/g$, 10 $cm^3/g$, 5 $cm^3/g$ at a nitrogen pressure of 650 mmHg, preferably 700 mmHg.

According to one embodiment, the organization of the porosity of the first material 11 or the second material 21 can be hexagonal, vermicular or cubic.

According to one embodiment, the organized porosity of the first material 11 or the second material 21 have a pore size of at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, or 50 nm.

According to one embodiment, the first material 11 and/or the second material 21 are not porous.

According to one embodiment, the first material 11 and/or the second material 21 do not comprise pores or cavities.

According to one embodiment, the first material 11 and/or the second material 21 are considered non-porous when the quantity adsorbed by the particle 1 and/or the particle 2 determined by adsorption-desorption of nitrogen in the Brunauer-Emmett-Teller (BET) theory is less than 20 $cm^3/g$, 15 $cm^3/g$, 10 $cm^3/g$, 5 $cm^3/g$ at a nitrogen pressure of 650 mmHg, preferably 700 mmHg.

According to one embodiment, the first material 11 or the second material 21 is permeable. In this embodiment, permeation of outer molecular species, gas or liquid in the first material 11 or the second material 21 is possible.

According to one embodiment, the permeable first material 11 or the second material 21 has an intrinsic permeability to fluids higher or equal to $10^{-20}$ $cm^2$, $10^{-19}$ cm, $10^{-1}$ $cm^2$, $10^{-17}$ $cm^2$, $10^{-16}$ $cm^2$, $10^{-15}$ $cm^2$, $10^{-14}$ $cm^2$, $10^{-13}$ $cm^2$, $10^{-12}$ $cm^2$, $10^{-11}$ $cm^2$, $10^{-10}$ $cm^2$, $10^{-9}$ $cm^2$, $10^{-8}$ $cm^2$, $10^{-7}$ $cm^2$, $10^{-6}$ $cm^2$, $10^{-5}$ $cm^2$, $10^{-4}$ $cm^2$, or $10^{-3}$ $cm^2$.

According to one embodiment, the first material 11 and/or the second material 21 are impermeable to outer molecular species, gas or liquid. In this embodiment, the first material 11 and/or the second material 21 limit or prevent the degradation of the chemical and physical properties of the at least one nanoparticle 3 from molecular oxygen, water and/or high temperature.

According to one embodiment, the impermeable first material 11 and/or the second material 21 have an intrinsic permeability to fluids less or equal to $10^{-11}$ $cm^2$, $10^{-12}$ $cm^2$, $10^{-13}$ $cm^2$, $10^{-14}$ $cm^2$, $10^{-15}$ $cm^2$, $10^{-16}$ $cm^2$, $10^{-17}$ $cm^2$, $10^{-18}$ $cm^2$, $10^{-19}$ $cm^2$, or 10-20 $cm^2$.

According to one embodiment, the first material 11 and/or the second material 21 limit or prevent the diffusion of outer molecular species or fluids (liquid or gas) into said first material 11 and/or said second material 21.

According to one embodiment, the specific property of the nanoparticles 3 is preserved after encapsulation in the particle 1.

According to one embodiment, the photoluminescence of the nanoparticles 3 is preserved after encapsulation in the particle 1.

According to one embodiment, the first material 11 and/or the second material 21 have a density ranging from 1 to 10, preferably the first material 11 and/or the second material 21 have a density ranging from 3 to 10 $g/cm^3$.

According to one embodiment, the first material 11 and/or the second material 21 are optically transparent, i.e., the first material 11 and/or the second material 21 are transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm. In this embodiment, the first material 11 and/or the second material 21 do not absorb all incident light allowing the at least one nanoparticle 3 to absorb all the incident light; and/or the first material 11 and/or the second material 21 do not absorb the light emitted by the at least one nanoparticle 3 allowing to said light emitted to be transmitted through the first material 11 and/or the second material 21.

According to one embodiment, the first material 11 and/or the second material 21 are not optically transparent, i.e., the first material 11 and/or the second material 21 absorb light at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm. In this embodiment, the first material 11 and/or the second material 21 absorb part of the incident light allowing the at least one nanoparticle 3 to absorb only a part of the incident light; and/or the first material 11 and/or the second material 21 absorb part of the light emitted by the at least one nanoparticle 3 allowing said light emitted to be partially transmitted through the first material 11 and/or the second material 21.

According to one embodiment, the first material 11 and/or the second material 21 transmit at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the first material 11 and/or the second material 21 transmit a part of the incident light and emits at least one secondary light. In this embodiment, the resulting light is a combination of the remaining transmitted incident light.

According to one embodiment, the first material 11 and/or the second material 21 absorb the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the first material 11 and/or the second material 21 absorb the incident light with wavelength lower than 460 nm.

According to one embodiment, the first material 11 and/or the second material 21 have an extinction coefficient less or equal to $1\times10^{-5}$, $1.1\times10^{-5}$, $1.2\times10^{-5}$, $1.3\times10^{-5}$, $1.4\times10^{-5}$, $1.5\times10^{-5}$, $1.6\times10^{-5}$, $1.7\times10^{-5}$, $1.8\times10^{-5}$, $1.9\times10^{-5}$, $2\times10^{-5}$, $3\times10^{-5}$, $4\times10^{-5}$, $5\times10^{-5}$, $6\times10^{-5}$, $7\times10^{-5}$, $8\times10^{-5}$, $9\times10^{-5}$, $10\times10^{-5}$, $11\times10^{-5}$, $12\times10^{-5}$, $13\times10^{-5}$, $14\times10^{-5}$, $15\times10^{-5}$, $16\times10^{-5}$, $17\times10^{-5}$, $18\times10^{-5}$, $19\times10^{-5}$, $20\times10^{-5}$, $21\times10^{-5}$, $22\times10^{-5}$, $23\times10^{-5}$, $24\times10^{-5}$, or $25\times10^{-5}$ at 460 nm.

According to one embodiment, the first material 11 and/or the second material 21 have an attenuation coefficient less or equal to $1\times10^{-2}$ $cm^{-1}$, $1\times10^{-1}$ $cm^{-1}$, $0.5\times10^{-1}$ $cm^{-1}$, 0.1 $cm^{-1}$, 0.2 $cm^{-1}$, 0.3 $cm^{-1}$, 0.4 $cm^{-1}$, 0.5 $cm^{-1}$, 0.6 $cm^{-1}$, 0.7 $cm^{-1}$, 0.8 $cm^{-1}$, 0.9 $cm^{-1}$, 1 $cm^{-1}$, 1.1 $cm^{-1}$, 1.2 $cm^{-1}$, 1.3 $cm^{-1}$, 1.4 $cm^{-1}$, 1.5 $cm^{-1}$, 1.6 $cm^{-1}$, 1.7 $cm^{-1}$, 1.8 $cm^{-1}$, 1.9 $cm^{-1}$, 2.0 $cm^{-1}$, 2.5 $cm^{-1}$, 3.0 $cm^{-1}$, 3.5 $cm^{-1}$, 4.0 $cm^{-1}$, 4.5 $cm^{-1}$, 5.0 $cm^{-1}$, 5.5 $cm^{-1}$, 6.0 $cm^{-1}$, 6.5 $cm^{-1}$, 7.0 $cm^{-1}$, 7.5 $cm^{-1}$, 8.0 $cm^{-1}$, 8.5 $cm^{-1}$, 9.0 $cm^{-1}$, 9.5 $cm^{-1}$, 10 $cm^{-1}$, 15 $cm^{-1}$, 20 $cm^{-1}$, 25 $cm^{-1}$, or 30 $cm^{-1}$ at 460 nm.

According to one embodiment, the first material 11 and/or the second material 21 have an attenuation coefficient less or equal to $1\times10^{-2}$ $cm^{-1}$, $1\times10^{-1}$ $cm^{-1}$, $0.5\times10^{-1}$ $cm^{-1}$, 0.1 $cm^{-1}$, 0.2 $cm^{-1}$, 0.3 $cm^{-1}$, 0.4 $cm^{-1}$, 0.5 $cm^{-1}$, 0.6 $cm^{-1}$, 0.7 $cm^{-1}$, 0.8 $cm^{-1}$, 0.9 $cm^{-1}$, 1 $cm^{-1}$, 1.1 $cm^{-1}$, 1.2 $cm^{-1}$, 1.3 $cm^{-1}$, 1.4 $cm^{-1}$, 1.5 $cm^{-1}$, 1.6 $cm^{-1}$, 1.7 $cm^{-1}$, 1.8 $cm^{-1}$, 1.9 $cm^{-1}$, 2.0 $cm^{-1}$, 2.5 $cm^{-1}$, 3.0 $cm^{-1}$, 3.5 $cm^{-1}$, 4.0 $cm^{-1}$, 4.5 $cm^{-1}$, 5.0 $cm^{-1}$, 5.5 $cm^{-1}$, 6.0 $cm^{-1}$, 6.5 $cm^{-1}$, 7.0 $cm^{-1}$, 7.5 $cm^{-1}$, 8.0 $cm^{-1}$, 8.5 $cm^{-1}$, 9.0 $cm^{-1}$, 9.5 $cm^{-1}$, 10 $cm^{-1}$, 15 $cm^{-1}$, 20 $cm^{-1}$, 25 $cm^{-1}$, or 30 $cm^{-1}$ at 450 nm.

According to one embodiment, the first material 11 and/or the second material 21 have an optical absorption cross section less or equal to $1.10^{-35}$ $cm^2$, $1.10^{-34}$ $cm^2$, $1.10^{-33}$ $cm^2$, $1.10^{-32}$ $cm^2$, $1.10^{-31}$ $cm^2$, $1.10^{-30}$ $cm^2$, $1.10^{-29}$ $cm^2$, $1.10^{-28}$ $cm^2$, $1.10^{-27}$ $cm^2$, $1.10^{-26}$ $cm^2$, $1.10^{-25}$ $cm^2$, $1.10^{-24}$ $cm^2$, $1.10^{-23}$ $cm^2$, $1.10^{-22}$ $cm^2$, $1.10^{-21}$ $cm^2$, $1.10^{-20}$ $cm^2$, $1.10^{-19}$ $cm^2$, $1.10^{-18}$ $cm^2$, $1.10^{-17}$ $cm^2$, $1.10^{-16}$ $cm^2$, $1.10^{-15}$ $cm^2$, $1.10^{-14}$ $cm^2$, $1.10^{-13}$ $cm^2$, $1.10^{-12}$ $cm^2$, $1.10^{-11}$ $cm^2$, $1.10^{-10}$ cm$^2$, $1.10^{-9}$ cm$^2$, $1.10^{-8}$ cm$^2$, $1.10^{-7}$ cm$^2$, $1.10^{-6}$ cm$^2$, $1.10^{-5}$ cm$^2$, $1.10^{-4}$ cm$^2$, $1.10^{-3}$ cm$^2$, $1.10^{-2}$ cm$^2$ or $1.10^{-1}$ cm$^2$ at 460 nm.

According to one embodiment, the first material 11 and/or the second material 21 are stable under acidic conditions, i.e., at pH inferior or equal to 7. In this embodiment, the first material 11 and/or the second material 21 are sufficiently robust to withstand acidic conditions, meaning that the properties of the particle 1 are preserved under said conditions.

According to one embodiment, the first material 11 and/or the second material 21 are stable under basic conditions, i.e., at pH superior to 7. In this embodiment, the first material 11 and/or the second material 21 are sufficiently robust to withstand basic conditions, meaning that the properties of the particle 1 are preserved under said conditions.

According to one embodiment, the first material 11 and/or the second material 21 are physically and chemically stable under various conditions. In this embodiment, the first material 11 and/or the second material 21 are sufficiently robust to withstand the conditions to which the particle 1 will be subjected.

According to one embodiment, the first material 11 and/or the second material 21 are physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the first material 11 and/or the second material 21 are sufficiently robust to withstand the conditions to which the particle 1 will be subjected.

According to one embodiment, the first material 11 and/or the second material 21 are physically and chemically stable under 0%, 10%, 20%, 30%, 40%, 50%, 55%, 60%, 65%, 70%, 75%, 80%, 85%, 90%, 95%, or 99% of humidity for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the first material 11 and/or the second material 21 are sufficiently robust to withstand the conditions to which the particle 1 will be subjected.

According to one embodiment, the first material 11 and/or the second material 21 are physically and chemically stable under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the first material 11 and/or the second material 21 are sufficiently robust to withstand the conditions to which the particle 1 will be subjected.

According to one embodiment, the first material 11 and/or the second material 21 are physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. and under 0%, 10%, 20%, 30%, 40%, 50%, 55%, 60%, 65%, 70%, 75%, 80%, 85%, 90%, 95%, or 99% of humidity for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the first material 11 and/or the second material 21 are sufficiently robust to withstand the conditions to which the particle 1 will be subjected.

According to one embodiment, the first material 11 and/or the second material 21 are physically and chemically stable under 0%, 10%, 20%, 30%, 40%, 50%, 55%, 60%, 65%, 70%, 75%, 80%, 85%, 90%, 95%, or 99% of humidity and under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the first material 11 and/or the second material 21 are sufficiently robust to withstand the conditions to which the particle 1 will be subjected.

According to one embodiment, the first material 11 and/or the second material 21 are physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. and under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the first material 11 and/or the second material 21 are sufficiently robust to withstand the conditions to which the particle 1 will be subjected.

According to one embodiment, the first material 11 and the second material 21 have an extinction coefficient less or equal to $1\times10^{-5}$, $1.1\times10^{-5}$, $1.2\times10^{-5}$, $1.3\times10^{-5}$, $1.4\times10^{-5}$, $1.5\times10^{-5}$, $1.6\times10^{-5}$, $1.7\times10^{-5}$, $1.8\times10^{-5}$, $1.9\times10^{-5}$, $2\times10^{-5}$, $3\times10^{-5}$, $4\times10^{-5}$, $5\times10^{-5}$, $6\times10^{-5}$, $7\times10^{-5}$, $8\times10^{-5}$, $9\times10^{-5}$, $10\times10^{-5}$, $11\times10^{-5}$, $12\times10^{-5}$, $13\times10^{-5}$, $14\times10^{-5}$, $15\times10^{-5}$, $16\times10^{-5}$, $17\times10^{-5}$, $18\times10^{-5}$, $19\times10^{-5}$, $20\times10^{-5}$, $21\times10^{-5}$, $22\times10^{-5}$, $23\times10^{-5}$, $24\times10^{-5}$, or $25\times10^{-5}$ at 460 nm.

In one embodiment, the extinction coefficient is measured by an absorbance measuring technique such as absorbance spectroscopy or any other method known in the art.

In one embodiment, the extinction coefficient is measured by an absorbance measurement divided by the length of the path light passing through the sample.

According to one embodiment, the first material 11 and/or the second material 21 have an attenuation coefficient less or equal to $1\times10^{-2}$ cm$^{-1}$, $1\times10^{-1}$ cm$^{-1}$, $0.5\times10^{-1}$ cm$^{-1}$, 0.1 cm$^{-1}$, 0.2 cm$^{-1}$, 0.3 cm$^{-1}$, 0.4 cm$^{-1}$, 0.5 cm$^{-1}$, 0.6 cm$^{-1}$, 0.7 cm$^{-1}$, 0.8 cm$^{-1}$, 0.9 cm$^{-1}$, 1 cm$^{-1}$, 1.1 cm$^{-1}$, 1.2 cm$^{-1}$, 1.3 cm$^{-1}$, 1.4 cm$^{-1}$, 1.5 cm$^{-1}$, 1.6 cm$^{-1}$, 1.7 cm$^{-1}$, 1.8 cm$^{-1}$, 1.9 cm$^{-1}$, 2.0 cm$^{-1}$, 2.5 cm$^{-1}$, 3.0 cm$^{-1}$, 3.5 cm$^{-1}$, 4.0 cm$^{-1}$, 4.5 cm$^{-1}$, 5.0 cm$^{-1}$, 5.5 cm$^{-1}$, 6.0 cm$^{-1}$, 6.5 cm$^{-1}$, 7.0 cm$^{-1}$, 7.5

$cm^{-1}$, 8.0 $cm^{-1}$, 8.5 $cm^{-1}$, 9.0 $cm^{-1}$, 9.5 $cm^{-1}$, 10 $cm^{-1}$, 15 $cm^{-1}$, 20 $cm^{-1}$, 25 $cm^{-1}$, or 30 $cm^{-1}$ at 460 nm.

According to one embodiment, the first material 11 and/or the second material 21 have an attenuation coefficient less or equal to $1\times10^{-2}$ $cm^{-1}$, $1\times10^{-1}$ $cm^{-1}$, $0.5\times10^{-1}$ $cm^{-1}$, 0.1 $cm^{-1}$, 0.2 $cm^{-1}$, 0.3 $cm^{-1}$, 0.4 $cm^{-1}$, 0.5 $cm^{-1}$, 0.6 $cm^{-1}$, 0.7 $cm^{-1}$, 0.8 $cm^{-1}$, 0.9 $cm^{-1}$, 1 $cm^{-1}$, 1.1 $cm^{-1}$, 1.2 $cm^{-1}$, 1.3 $cm^{-1}$, 1.4 $cm^{-1}$, 1.5 $cm^{-1}$, 1.6 $cm^{-1}$, 1.7 $cm^{-1}$, 1.8 $cm^{-1}$, 1.9 $cm^{-1}$, 2.0 $cm^{-1}$, 2.5 $cm^{-1}$, 3.0 $cm^{-1}$, 3.5 $cm^{-1}$, 4.0 $cm^{-1}$, 4.5 $cm^{-1}$, 5.0 $cm^{-1}$, 5.5 $cm^{-1}$, 6.0 $cm^{-1}$, 6.5 $cm^{-1}$, 7.0 $cm^{-1}$, 7.5 $cm^{-1}$, 8.0 $cm^{-1}$, 8.5 $cm^{-1}$, 9.0 $cm^{-1}$, 9.5 $cm^{-1}$, 10 $cm^{-1}$, 15 $cm^{-1}$, 20 $cm^{-1}$, 25 $cm^{-1}$, or 30 $cm^{-1}$ at 450 nm.

According to one embodiment, the first material 11 and/or the second material 21 have an optical absorption cross section less or equal to $1.10^{-35}$ $cm^2$, $1.10^{-34}$ $cm^2$, $1.10^{-33}$ $cm^2$, $1.10^{-32}$ $cm^2$, $1.10^{-31}$ $cm^2$, $1.10^{-30}$ $cm^2$, $1.10^{-29}$ $cm^2$, $1.10^{-28}$ $cm^2$, $1.10^{-27}$ $cm^2$, $1.10^{-26}$ $cm^2$, $1.10^{-25}$ $cm^2$, $1.10^{-24}$ $cm^2$, $1.10^{-23}$ $cm^2$, $1.10^{-22}$ $cm^2$, $1.10^{-21}$ $cm^2$, $1.10^{-20}$ $cm^2$, $1.10^{-19}$ $cm^2$, $1.10^{-18}$ $cm^2$, $1.10^{-17}$ $cm^2$, $1.10^{-16}$ $cm^2$, $1.10^{-15}$ $cm^2$, $1.10^{-14}$ $cm^2$, $1.10^{-13}$ $cm^2$, $1.10^{-12}$ $cm^2$, $1.10^{-11}$ $cm^2$, $1.10^{-10}$ $cm^2$, $1.10^{-9}$ $cm^2$, $1.10^{-8}$ $cm^2$, $1.10^{-7}$ $cm^2$, $1.10^{-6}$ $cm^2$, $1.10^{-5}$ $cm^2$, $1.10^{-4}$ $cm^2$, $1.10^{-3}$ $cm^2$, $1.10^{-2}$ $cm^2$ or $1.10^{-1}$ $cm^2$ at 460 nm.

According to one embodiment, the second material 21 is the same as the first material 11 as described hereabove.

According to one embodiment, the second material 21 is different from the first material 11 as described hereabove.

According to one embodiment, the particle 2 is dispersed in the first material 11.

According to one embodiment, the particle 2 is totally surrounded by or encapsulated in the first material 11.

According to one embodiment, the particle 2 is partially surrounded by or encapsulated in the first material 11.

According to one embodiment, the particle 2 is fluorescent.

According to one embodiment, the particle 2 is phosphorescent.

According to one embodiment, the particle 2 is luminescent.

According to one embodiment, the particle 2 is electroluminescent.

According to one embodiment, the particle 2 is chemiluminescent.

According to one embodiment, the particle 2 is triboluminescent.

According to one embodiment, the features of the light emission of particle 2 are sensible to external pressure variations. In this embodiment, "sensible" means that the features of the light emission can be modified by external pressure variations.

According to one embodiment, the wavelength emission peak of particle 2 is sensible to external pressure variations. In this embodiment, "sensible" means that the wavelength emission peak can be modified by external pressure variations, i.e., external pressure variations can induce a wavelength shift.

According to one embodiment, the FWHM of particle 2 is sensible to external pressure variations. In this embodiment, "sensible" means that the FWHM can be modified by external pressure variations, i.e., FWHM can be reduced or increased.

According to one embodiment, the PLQY of particle 2 is sensible to external pressure variations.

In this embodiment, "sensible" means that the PLQY can be modified by external pressure variations, i.e., PLQY can be reduced or increased.

According to one embodiment, the features of the light emission of particle 2 are sensible to external temperature variations.

According to one embodiment, the wavelength emission peak of particle 2 is sensible to external temperature variations. In this embodiment, "sensible" means that the wavelength emission peak can be modified by external temperature variations, i.e., external temperature variations can induce a wavelength shift.

According to one embodiment, the FWHM of particle 2 is sensible to external temperature variations. In this embodiment, "sensible" means that the FWHM can be modified by external temperature variations, i.e., FWHM can be reduced or increased.

According to one embodiment, the PLQY of particle 2 is sensible to external temperature variations. In this embodiment, "sensible" means that the PLQY can be modified by external temperature variations, i.e., PLQY can be reduced or increased.

According to one embodiment, the features of the light emission of particle 2 are sensible to external variations of pH.

According to one embodiment, the wavelength emission peak of particle 2 is sensible to external variations of pH. In this embodiment, "sensible" means that the wavelength emission peak can be modified by external variations of pH, i.e., external variations of pH can induce a wavelength shift.

According to one embodiment, the FWHM of particle 2 is sensible to e external variations of pH. In this embodiment, "sensible" means that the FWHM can be modified by external variations of pH, i.e., FWHM can be reduced or increased.

According to one embodiment, the PLQY of particle 2 is sensible to external variations of pH. In this embodiment, "sensible" means that the PLQY can be modified by external variations of pH, i.e., PLQY can be reduced or increased.

According to one embodiment, the particle 2 comprise at least one nanoparticle wherein the wavelength emission peak is sensible to external temperature variations; and at least one nanoparticle wherein the wavelength emission peak is not or less sensible to external temperature variations. In this embodiment, "sensible" means that the wavelength emission peak can be modified by external temperature variations, i.e., wavelength emission peak can be reduced or increased. This embodiment is particularly advantageous for temperature sensor applications.

According to one embodiment, the particle 2 exhibits an emission spectrum with at least one emission peak, wherein said emission peak has a maximum emission wavelength ranging from 400 nm to 50 m.

According to one embodiment, the particle 2 exhibits an emission spectrum with at least one emission peak, wherein said emission peak has a maximum emission wavelength ranging from 400 nm to 500 nm. In this embodiment, the particle 2 emits blue light.

According to one embodiment, the particle 2 exhibits an emission spectrum with at least one emission peak, wherein said emission peak has a maximum emission wavelength ranging from 500 nm to 560 nm, more preferably ranging from 515 nm to 545 nm. In this embodiment, the particle 2 emits green light.

According to one embodiment, the particle 2 exhibits an emission spectrum with at least one emission peak, wherein said emission peak has a maximum emission wavelength ranging from 560 nm to 590 nm. In this embodiment, the particle 2 emits yellow light.

According to one embodiment, the particle 2 exhibits an emission spectrum with at least one emission peak, wherein said emission peak has a maximum emission wavelength ranging from 590 nm to 750 nm, more preferably ranging from 610 nm to 650 nm. In this embodiment, the particle 2 emits red light.

According to one embodiment, the particle 2 exhibits an emission spectrum with at least one emission peak, wherein said emission peak has a maximum emission wavelength ranging from 750 nm to 50 μm. In this embodiment, the particle 2 emits near infra-red, mid-infra-red, or infra-red light.

According to one embodiment, the particle 2 exhibits emission spectra with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the particle 2 exhibits emission spectra with at least one emission peak having a full width half maximum strictly lower than 40 nm, 30 nm, 25 nm, 20 nm, 15 nm, or 10 nm.

According to one embodiment, the particle 2 exhibits emission spectra with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the particle 2 exhibits emission spectra with at least one emission peak having a full width at quarter maximum strictly lower than 40 nm, 30 nm, 25 nm, 20 nm, 15 nm, or 10 nm.

According to one embodiment, the particle 2 has a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99% or 100%.

According to one embodiment, the particle 2 absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the particle 2 has an average fluorescence lifetime of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, or 1 μsecond.

In one embodiment, the particle 2 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one preferred embodiment, the particle 2 exhibits photoluminescence quantum yield (PQLY) decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the particle 2 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one preferred embodiment, the particle 2 exhibits FCE decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the particle 2 is magnetic.

According to one embodiment, the particle 2 is ferromagnetic.

According to one embodiment, the particle 2 is paramagnetic.

According to one embodiment, the particle 2 is superparamagnetic.

According to one embodiment, the particle 2 is diamagnetic.

According to one embodiment, the particle 2 is plasmonic.

According to one embodiment, the particle 2 has catalytic properties.

According to one embodiment, the particle 2 has photovoltaic properties.

According to one embodiment, the particle 2 is piezoelectric.

According to one embodiment, the particle 2 is pyroelectric.

According to one embodiment, the particle 2 is ferroelectric.

According to one embodiment, the particle 2 is drug delivery featured.

According to one embodiment, the particle 2 is a light scatterer.

According to one embodiment, the particle 2 absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the particle 2 is an electrical insulator. In this embodiment, the quenching of fluorescent properties for fluorescent nanoparticles 3 encapsulated in the material 21 is prevented when it is due to electron transport. In this embodiment, the particle 2 may be used as an electrical insulator material exhibiting the same properties as the nanoparticles 3 encapsulated in the material 21.

According to one embodiment, the particle 2 is an electrical conductor. This embodiment is particularly advantageous for an application of the particle 2 in photovoltaics or LEDs.

According to one embodiment, the particle 2 has an electrical conductivity at standard conditions ranging from $1 \times 10^{-20}$ to $10^7$ S/m, preferably from $1 \times 10^{-15}$ to 5 S/m, more preferably from $1 \times 10^{-7}$ to 1 S/m.

According to one embodiment, the particle 2 has an electrical conductivity at standard conditions of at least $1 \times 10^{-20}$ S/m, $0.5 \times 10^{-19}$ S/m, $1 \times 10^{-19}$ S/m, $0.5 \times 10^{-18}$ S/m, $1 \times 10^{-18}$ S/m, $0.5 \times 10^{-17}$ S/m, $1 \times 10^{-17}$ S/m, $0.5 \times 10^{-16}$ S/m, $1 \times 10^{-16}$ S/m, $0.5 \times 10^{-15}$ S/m, $1 \times 10^{-15}$ S/m, $0.5 \times 10^{-14}$ S/m, $1 \times 10^{-14}$ S/m, $0.5 \times 10^{-13}$ S/m, $1 \times 10^{-13}$ S/m, $0.5 \times 10^{-12}$ S/m, $1 \times 10^{-12}$ S/m, $0.5 \times 10^{-11}$ S/m, $1 \times 10^{-11}$ S/m, $0.5 \times 10^{-10}$ S/m, $1 \times 10^{-10}$ S/m, $0.5 \times 10^{-9}$ S/m, $1 \times 10^{-9}$ S/m, $0.5 \times 10^{-8}$ S/m, $1 \times 10^{-8}$ S/m, $0.5 \times 10^{-7}$ S/m, $1 \times 10^{-7}$ S/m, $0.5 \times 10^{-6}$ S/m, $1 \times 10^{-6}$ S/m, $0.5 \times 10^{-5}$ S/m, $1 \times 10^{-5}$ S/m, $0.5 \times 10^{-4}$ S/m, $1 \times 10^{-4}$ S/m, $0.5 \times 10^{-3}$ S/m, $1 \times 10^{-3}$ S/m, $0.5 \times 10^{-2}$ S/m, $1 \times 10^{-2}$ S/m, $0.5 \times 10^{-1}$ S/m, $1 \times 10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5 \times 10^2$ S/m, $10^3$ S/m, $5 \times 10^3$ S/m, $10^4$ S/m, $5 \times 10^4$ S/m, $10^5$ S/m, $5 \times 10^5$ S/m, $10^6$ S/m, $5 \times 10^6$ S/m, or $10^7$ S/m.

According to one embodiment, the electrical conductivity of the particle 2 may be measured for example with an impedance spectrometer.

According to one embodiment, the particle 2 is a thermal insulator.

According to one embodiment, the material 21 comprises a refractory material.

According to one embodiment, the particle 2 is a thermal conductor. In this embodiment, the particle 2 is capable of draining away the heat originating from the nanoparticles 3 encapsulated in the material 21, or from the environment.

According to one embodiment, the particle 2 has a thermal conductivity at standard conditions ranging from 0.1 to 450 W/(m·K), preferably from 1 to 200 W/(m·K), more preferably from 10 to 150 W/(m·K).

According to one embodiment, the particle 2 has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3

W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the thermal conductivity of the particle 2 may be measured for example by steady-state methods or transient methods.

According to one embodiment, the particle 2 is a local high temperature heating system.

According to one embodiment, the particle 2 is not a metallic particle.

According to one embodiment, the particle 2 is surfactant-free.

According to one embodiment, the particle 2 is not surfactant-free.

According to one embodiment, the particle 2 is amorphous.

According to one embodiment, the particle 2 is crystalline.

According to one embodiment, the particle 2 is totally crystalline.

According to one embodiment, the particle 2 is partially crystalline.

According to one embodiment, the particle 2 is monocrystalline.

According to one embodiment, the particle 2 is polycrystalline. In this embodiment, the particle 2 comprises at least one grain boundary.

According to one embodiment, the particle 2 is a colloidal particle.

According to one embodiment, the particle 2 does not comprise a spherical porous bead, preferably the particle 2 does not comprise a central spherical porous bead.

According to one embodiment, the particle 2 does not comprise a spherical porous bead, wherein nanoparticles 3 are linked to the surface of said spherical porous bead.

According to one embodiment, the particle 2 does not comprise a bead and nanoparticles 3 having opposite electronic charges.

According to one embodiment, the particle 2 is porous.

According to one embodiment, the particle 2 is considered porous when the quantity adsorbed by the particle 2 determined by adsorption-desorption of nitrogen in the Brunauer-Emmett-Teller (BET) theory is more than 20 $cm^3/g$, 15 $cm^3/g$, 10 $cm^3/g$, 5 $cm^3/g$ at a nitrogen pressure of 650 mmHg, preferably 700 mmHg.

According to one embodiment, the organization of the porosity of the particle 2 can be hexagonal, vermicular or cubic.

According to one embodiment, the organized porosity of the particle 2 has a pore size of at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, or 50 nm.

According to one embodiment, the particle 2 is not porous.

According to one embodiment, the particle 2 does not comprise pores or cavities.

According to one embodiment, the particle 2 is considered non-porous when the quantity adsorbed by the said particle 2 determined by adsorption-desorption of nitrogen in the Brunauer-Emmett-Teller (BET) theory is less than 20 $cm^3/g$, 15 $cm^3/g$, 10 $cm^3/g$, 5 $cm^3/g$ at a nitrogen pressure of 650 mmHg, preferably 700 mmHg.

According to one embodiment, the particle 2 is permeable.

According to one embodiment, the permeable particle 2 has an intrinsic permeability to fluids higher or equal to $10^{-11}$ $cm^2$, $10^{-10}$ $cm^2$, $10^{-9}$ $cm^2$, $10^{-8}$ $cm^2$, $10^{-7}$ $cm^2$, $10^{-6}$ $cm^2$, $10^{-5}$ $cm^2$, $10^{-4}$ $cm^2$, or $10^{-3}$ $cm^2$.

According to one embodiment, the particle 2 is impermeable to outer molecular species, gas or liquid. In this embodiment, outer molecular species, gas or liquid refers to molecular species, gas or liquid external to said particle 2.

According to one embodiment, the impermeable particle 2 has an intrinsic permeability to fluids less or equal to $10^{-11}$ $cm^2$, $10^{-12}$ $cm^2$, $10^{-13}$ $cm^2$, $10^{-14}$ $cm^2$, or $10^{-15}$ $cm^2$.

According to one embodiment, the particle 2 has an oxygen transmission rate ranging from $10^{-7}$ to 10 $cm^3 \cdot m^{-2} \cdot day^{-1}$, preferably from $10^{-7}$ to 1 $cm^3 \cdot m^{-2} \cdot day^{-1}$, more preferably from $10^{-7}$ to $10^{-1}$ $cm^3 \cdot m^{-2} \cdot day^{-1}$, even more preferably from $10^{-7}$ to $10^{-4}$ $cm^3 \cdot m^{-2} \cdot day^{-1}$ at room temperature.

According to one embodiment, the particle 2 has a water vapor transmission rate ranging from $10^{-7}$ to 10 $g \cdot m^{-2} \cdot day^{-1}$, preferably from $10^{-7}$ to 1 $g \cdot m^{-2} \cdot day^{-1}$, more preferably from $10^{-7}$ to $10^{-1}$ $g \cdot m^{-2} \cdot day^{-1}$, even more preferably from $10^{-7}$ to $10^{-4}$ $g \cdot m^{-2} \cdot day^{-1}$ at room temperature. A water vapor transmission rate of $10^{-6}$ $g \cdot m^{-2} \cdot day^{-1}$ is particularly adequate for a use on LED.

According to one embodiment, the particle 2 is dispersible in aqueous solvents, organic solvents and/or mixture thereof.

According to one embodiment, the particle 2 is dispersible in the liquid vehicle.

According to one embodiment, the particle 2 has a size above 20 nm.

According to one embodiment, the particle 2 has a size of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 tam, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, a statistical set of particles 2 has an average size of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the particle 2 has a largest dimension of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the particle 2 has a smallest dimension of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64

μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the smallest dimension of the particle 2 smaller than the largest dimension of said particle 2 by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100; at least 150; at least 200; at least 250; at least 300; at least 350; at least 400; at least 450; at least 500; at least 550; at least 600; at least 650; at least 700; at least 750; at least 800; at least 850; at least 900; at least 950; or at least 1000.

According to one embodiment, the particle 2 has a smallest curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 m$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm, 0.0225 μm$^{-1}$, 0.0223 μm$^{-1}$, 0.0222 μm, 0.0221 μm$^{-1}$, 0.022 μm$^{-1}$, 0.0219 μm, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the particle 2 has a largest curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 $\mu m^{-1}$, 0.0252 $\mu m^{-1}$, 0.025 $\mu m^{-1}$, 0.0248 $\mu m^{-1}$, 0.0247 $\mu m^{-1}$, 0.0245 $\mu m^{-1}$, 0.0244 $\mu m^{-1}$, 0.0242 $\mu m^{-1}$, 0.0241 $\mu m^{-1}$, 0.024 $\mu m^{-1}$, 0.0238 $\mu m^{-1}$, 0.0237 $\mu m^{-1}$, 0.0235 $\mu m^{-1}$, 0.0234 $\mu m^{-1}$, 0.0233 $\mu m^{-1}$, 0.231 μm, 0.023 μm, 0.0229 $\mu m^{-1}$, 0.0227 μm, 0.0226 $\mu m^{-1}$, 0.0225 $\mu m^{-1}$, 0.0223 $\mu m^{-1}$, 0.0222 $\mu m^{-1}$, 0.0221 $\mu m^{-1}$, 0.022 $\mu m^{-1}$, 0.0219 $\mu m^{-1}$, 0.0217 $\mu m^{-1}$, 0.0216 $\mu m^{-1}$, 0.0215 $\mu m^{-1}$, 0.0214 $\mu m^{-1}$, 0.0213 $\mu m^{-1}$, 0.0212 $\mu m^{-1}$, 0.0211 $\mu m^{-1}$, 0.021 $\mu m^{-1}$, 0.0209 $\mu m^{-1}$, 0.0208 $\mu m^{-1}$, 0.0207 $\mu m^{-1}$, 0.0206 $\mu m^{-1}$, 0.0205 $\mu m^{-1}$, 0.0204 $\mu m^{-1}$, 0.0203 $\mu m^{-1}$, 0.0202 $\mu m^{-1}$, 0.0201 $\mu m^{-1}$, 0.02 $\mu m^{-1}$, or 0.002 $\mu m^{-1}$.

According to one embodiment, the surface roughness of the particle 2 is less or equal to 0%, 0.0001%, 0.0002%, 0.0003%, 0.0004%, 0.0005%, 0.0006%, 0.0007%, 0.0008%, 0.0009%, 0.001%, 0.002%, 0.003%, 0.004%, 0.005%, 0.006%, 0.007%, 0.008%, 0.009%, 0.01%, 0.02%, 0.03%, 0.04%, 0.05%, 0.06%, 0.07%, 0.08%, 0.09%, 0.1%, 0.11%, 0.12%, 0.13%, 0.14%, 0.15%, 0.16%, 0.17%, 0.18%, 0.19%, 0.2%, 0.21%, 0.22%, 0.23%, 0.24%, 0.25%, 0.26%, 0.27%, 0.28%, 0.29%, 0.3%, 0.31%, 0.32%, 0.33%, 0.34%, 0.35%, 0.36%, 0.37%, 0.38%, 0.39%, 0.4%, 0.41%, 0.42%, 0.43%, 0.44%, 0.45%, 0.46%, 0.47%, 0.48%, 0.49%, 0.5%, 1%, 1.5%, 2%, 2.5% 3%, 3.5%, 4%, 4.5%, or 5% of the largest dimension of said particle 2, meaning that the surface of said particle 2 is completely smooth.

According to one embodiment, the surface roughness of the particle 2 is less or equal to 0.5% of the largest dimension of said particle 2, meaning that the surface of said particle 2 is completely smooth.

According to one embodiment, the particle 2 has a spherical shape, an ovoid shape, a discoidal shape, a cylindrical shape, a faceted shape, a hexagonal shape, a triangular shape, a cubic shape, or a platelet shape.

According to one embodiment, the particle 2 has a raspberry shape, a prism shape, a polyhedron shape, a snowflake shape, a flower shape, a thorn shape, a hemisphere shape, a cone shape, a urchin shape, a filamentous shape, a biconcave discoid shape, a worm shape, a tree shape, a dendrite shape, a necklace shape, a chain shape, or a bush shape.

According to one embodiment, the particle 2 has a spherical shape, or the particle 2 is a bead.

According to one embodiment, the particle 2 is hollow, i.e., the particle 2 is a hollow bead.

According to one embodiment, the particle 2 does not have a core/shell structure.

According to one embodiment, the particle 2 has a core/shell structure as described hereafter.

According to one embodiment, the particle 2 is not a fiber.

According to one embodiment, the particle 2 is not a matrix with undefined shape.

According to one embodiment, the particle 2 is not macroscopical piece of glass. In this embodiment, a piece of glass refers to glass obtained from a bigger glass entity for example by cutting it, or to glass obtained by using a mold. In one embodiment, a piece of glass has at least one dimension exceeding 1 mm.

According to one embodiment, the particle 2 is not obtained by reducing the size of the second material 21. For example, particle 2 is not obtained by milling a piece of second material 21, nor by cutting it, nor by firing it with projectiles like particles, atoms or electrons, or by any other method.

According to one embodiment, the particle 2 is not obtained by milling bigger particles or by spraying a powder.

According to one embodiment, the particle 2 is not a piece of nanometer pore glass doped with nanoparticles 3.

According to one embodiment, the particle 2 is not a glass monolith.

According to one embodiment, the spherical particle 2 has a diameter of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 tam, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, a statistical set of spherical particles 2 has an average diameter of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5

μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the average diameter of a statistical set of spherical particles 2 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 20%, 30%, 40%, 50%, 60%, 70%, 80%, 85%, 90%, 95%, 100%, 105%, 110%, 115%, 120%, 125%, 130%, 135%, 140%, 145%, 150%, 155%, 160%, 165%, 170%, 175%, 180%, 185%, 190%, 195%, or 200%.

According to one embodiment, the spherical particle 2 has a unique curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, a statistical set of the spherical particle 2 has an average unique curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the curvature of the spherical particle 2 has no deviation, meaning that said particle 2 has a perfect spherical shape. A perfect spherical shape prevents fluctuations of the intensity of the scattered light.

According to one embodiment, the unique curvature of the spherical particle 2 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, or 10% along the surface of said particle 2.

According to one embodiment, in a statistical set of particles 2, said particles 2 are polydisperse.

According to one embodiment, in a statistical set of particles 2, said particles 2 are monodisperse.

According to one embodiment, particles 2 in a same particle 1 are polydisperse.

According to one embodiment, particles 2 in a same particle 1 are monodisperse.

According to one embodiment, in a statistical set of particles 2, said particles 2 have a narrow size distribution.

According to one embodiment, the particle 2 represents at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99% by weight of the particle 1.

According to one embodiment, the loading charge of the particle 2 in the particle 1 is at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the loading charge of the particle 2 in the particle 1 is less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the particles 2 are not encapsulated in particle 1 via physical entrapment or electrostatic attraction.

According to one embodiment, the particles 2 and the first material 11 are not bonded or linked by electrostatic attraction or a functionalized silane based coupling agent.

According to one embodiment, the particle 2 comprised in the particle 1 have a packing fraction of at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the particles 2 comprised in the same particle 1 are not aggregated.

According to one embodiment, the particles 2 comprised in the same particle 1 do not touch, are not in contact.

According to one embodiment, the particles 2 comprised in the same particle 1 are separated by first material 11.

According to one embodiment, the particles 2 comprised in the same particle 1 are aggregated.

According to one embodiment, the particles 2 comprised in the same particle 1 touch, are in contact.

According to one embodiment, the particle 2 comprised in the same particle 1 can be individually evidenced.

According to one embodiment, the particle 2 comprised in the same particle 1 can be individually evidenced by transmission electron microscopy or fluorescence scanning microscopy, or any other characterization means known by the person skilled in the art.

According to one embodiment, the plurality of particles 2 is uniformly dispersed in the first material 11.

The uniform dispersion of the plurality of particles 2 in the first material 11 comprised in the particle 1 prevents the aggregation of said particles 2, thereby preventing the degradation of their properties. For example, in the case of inorganic fluorescent particles, a uniform dispersion will allow the optical properties of said particles to be preserved, and quenching can be avoided.

According to one embodiment, the particles 2 comprised in a particle 1 are uniformly dispersed within the first material 11 comprised in said particle 1.

According to one embodiment, the particles 2 comprised in a particle 1 are dispersed within the first material 11 comprised in said particle 1.

According to one embodiment, the particles 2 comprised in a particle 1 are uniformly and evenly dispersed within the first material 11 comprised in said particle 1.

According to one embodiment, the particles 2 comprised in a particle 1 are evenly dispersed within the first material 11 comprised in said particle 1.

According to one embodiment, the particles 2 comprised in a particle 1 are homogeneously dispersed within the first material 11 comprised in said particle 1.

According to one embodiment, the dispersion of particles 2 in the first material 11 does not have the shape of a ring, or a monolayer.

According to one embodiment, each particle 2 of the plurality of particles 2 is spaced from its adjacent particle 2 by an average minimal distance.

According to one embodiment, the average minimal distance between two particles 2 is controlled.

According to one embodiment, the average minimal distance is at least 1 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 300 µm, 400 µm, 500 µm, 600 µm, 700 µm, 800 µm, 900 µm, or 1 mm.

According to one embodiment, the average distance between two particles 2 in the same particle 1 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 300 µm, 400 µm, 500 µm, 600 µm, 700 µm, 800 µm, 900 µm, or 1 mm.

According to one embodiment, the average distance between two particles 2 in the same particle 1 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 15%, 20%, 25%, 30%, 35%, 40%, 45%, or 50%.

According to one embodiment, the particle 2 is hydrophobic.

According to one embodiment, the particle 2 is hydrophilic.

According to one embodiment, the particle 2 is ROHS compliant.

According to one embodiment, the particle 2 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the particle 2 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the particle 2 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the particle 2 comprises heavier chemical elements than the main chemical element present in the second material (21). In this embodiment, said heavy chemical elements in the particle 2 will lower the mass concentration of chemical elements subject to ROHS standards, allowing said particle 2 to be ROHS compliant.

According to one embodiment, examples of heavy chemical elements include but are not limited to B, C, N, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Tc, Ru, Rh, Pd, Ag, Cd, In, Sn, Sb, Te, I, Cs, Ba, La, Hf, Ta, W, Re, Os, Ir, Pt, Au, Hg, Tl, Pb, Bi, Po, At, Ce, Pr, Nd, Pm, Sm, Eu, Gd, Tb, Dy, Ho, Er, Tm, Yb, Lu or a mixture of thereof.

According to one embodiment, each nanoparticle 3 is totally surrounded by or encapsulated in the second material 21.

According to one embodiment, each nanoparticle 3 is partially surrounded by or encapsulated in the second material 21.

According to one embodiment, the particle 2 comprises at least 95%, 90%, 85%, 80%, 75%, 70%, 65%, 60%, 55%, 50%, 45%, 40%, 35%, 30%, 25%, 20%, 15%, 10%, 5%, 1% or 0% of nanoparticles 3 on its surface.

According to one embodiment, the particle 2 does not comprise nanoparticles 3 on its surface. In this embodiment, said nanoparticles 3 are completely surrounded by the second material 21.

According to one embodiment, at least 100%, 95%, 90%, 85%, 80%, 75%, 70%, 65%, 60%, 55%, 50%, 45%, 40%, 35%, 30%, 25%, 20%, 15%, 10%, 5%, or 1% of nanoparticles 3 are comprised in the second material 21. In this embodiment, each of said nanoparticles 3 is completely surrounded by the second material 21.

According to one embodiment, the particle 2 has an oxygen transmission rate ranging from $10^{-7}$ to 10 $cm^3 \cdot m^{-2} \cdot day^{-1}$, preferably from $10^{-7}$ to 1 $cm^3 \cdot m^{-2} \cdot day^{-1}$, more preferably from $10^{-7}$ to $10^{-1}$ $cm^3 \cdot m^{-2} \cdot day^{-1}$, even more preferably from $10^{-7}$ to $10^{-4}$ $cm^3 \cdot m^{-2} \cdot day^{-1}$ at room temperature.

According to one embodiment, the particle 2 has a water vapor transmission rate ranging from $10^{-7}$ to 10 $g \cdot m^2 \cdot day^{-1}$, preferably from $10^{-7}$ to 1 $g \cdot m^2 \cdot day^{-1}$, more preferably from $10^{-7}$ to $10^{-1}$ $g \cdot m^2 \cdot day^{-1}$, even more preferably from $10^{-7}$ to $10^{-4}$ $g \cdot m^{-2} \cdot day^{-1}$ at room temperature. A water vapor transmission rate of $10^{-6}$ $g \cdot m^{-2} \cdot day^{-1}$ is particularly adequate for a use on LED.

According to one embodiment, the particle 2 is a homostructure. In this embodiment, the particle 2 does not comprise a shell or a layer of a material surrounding (partially or totally) said particle 2.

According to one embodiment, the particle 2 is not a core/shell structure wherein the core does not comprise nanoparticles 3 and the shell comprises nanoparticles 3.

According to one embodiment, the particle 2 does not comprise an organic shell or an organic layer. In this embodiment, the particle 2 is not covered by any organic ligand or polymer shell.

According to one embodiment, the particle 2 does not comprise organic molecules or polymer chains.

According to one embodiment, the particle 2 is coated by an organic layer comprising organic molecules or polymer chains.

According to one embodiment, the particle 2 is coated by an organic layer comprising polymerizable groups. In this embodiment, polymerizable groups are capable of undergoing a polymerization reaction. Polymerizable groups are as described hereabove.

According to one embodiment, examples of polymerizable groups include but are not limited to: vinyl monomers, acrylate monomers, methacrylate monomers, ethylacrylate monomers, acrylamide monomers, methacrylamide monomers, ethyl acrylamide monomers, ethylene glycol monomers, epoxide monomers, glycidyl monomers, olefin monomers, norbornyl monomers, isocyanide monomers, and any of the above mention in di/tri functional group format, or a mixture thereof.

According to one embodiment illustrated in FIG. 6B, the particle 2 is a heterostructure, comprising a core 22 and at least one shell 23.

According to one embodiment, the at least one shell 23 is not an organic shell. In this embodiment, the particle 2 is not covered by any organic ligand or by a polymeric shell.

According to one embodiment, the at least one shell 23 does not comprise an organic layer.

According to one embodiment, the shell 23 of the core/shell particle 2 comprises an inorganic material. In this embodiment, said inorganic material is the same or different than the second material 21 comprised in the core 22 of the core/shell particle 2.

According to one embodiment, the shell 23 of the core/shell particle 2 consists of an inorganic material. In this embodiment, said inorganic material is the same or different than the second material 21 comprised in the core 22 of the core/shell particle 2.

According to one embodiment, the core 22 of the core/shell particle 2 comprises at least one nanoparticle 3 as described herein and the shell 23 of the core/shell particle 2 does not comprise nanoparticles 3.

According to one embodiment, the core 22 of the core/shell particle 2 comprises at least one nanoparticle 3 as described herein and the shell 23 of the core/shell particle 2 comprises at least one nanoparticle 3.

According to one embodiment, the at least one nanoparticle 3 comprised in the core 22 of the core/shell particle 2 is identical to the at least one nanoparticle 3 comprised in the shell 23 of the core/shell particle 2.

According to one embodiment illustrated in FIG. 25, the at least one nanoparticle 3 comprised in the core 22 of the core/shell particle 2 is different to the at least one nanoparticle 3 comprised in the shell 23 of the core/shell particle 2. In this embodiment, the resulting core/shell particle 2 will exhibit different properties.

According to one embodiment, the core 22 of the core/shell particle 2 comprises at least one luminescent nanoparticle and the shell 23 of the core/shell particle 2 comprises at least one nanoparticle 3 selected in the group of magnetic nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the shell 23 of the core/shell particle 2 comprises at least one luminescent nanoparticle and the core 22 of the core/shell particle 2 comprises at least one nanoparticle 3 selected in the group of magnetic nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

In a preferred embodiment, the core 22 of the core/shell particle 2 and the shell 23 of the core/shell particle 2 comprise at least two different luminescent nanoparticles, wherein said luminescent nanoparticles emit at different emission wavelengths. This means that the core 22 comprises at least one luminescent nanoparticle and the shell 23 comprises at least one luminescent nanoparticle, said luminescent nanoparticles having different emission wavelengths.

In a preferred embodiment, the core 22 of the core/shell particle 2 and the shell 23 of the core/shell particle 2 comprise at least two different luminescent nanoparticles, wherein at least one luminescent nanoparticle emits at a wavelength in the range from 500 to 560 nm, and at least one luminescent nanoparticle emits at a wavelength in the range from 600 to 2500 nm. In this embodiment, the core 22 of the core/shell particle 2 and the shell 23 of the core/shell particle 2 comprise at least one luminescent nanoparticle emitting in the green region of the visible spectrum and at least one luminescent nanoparticle emitting in the red region of the visible spectrum, thus the particle 2 paired with a blue LED will be a white light emitter.

In a preferred embodiment, the core 22 of the core/shell particle 2 and the shell 23 of the core/shell particle 2 comprise at least two different luminescent nanoparticles, wherein at least one luminescent nanoparticle emits at a wavelength in the range from 400 to 490 nm, and at least one luminescent nanoparticle emits at a wavelength in the range from 600 to 2500 nm. In this embodiment, the core 22 of the core/shell particle 2 and the shell 23 of the core/shell particle 2 comprise at least one luminescent nanoparticle emitting in the blue region of the visible spectrum and at least one luminescent nanoparticle emitting in the red region of the visible spectrum, thus the particle 2 will be a white light emitter.

In a preferred embodiment, the core 22 of the core/shell particle 2 and the shell 23 of the core/shell particle 2 comprise comprises at least two different luminescent nanoparticles, wherein at least one luminescent nanoparticle emits at a wavelength in the range from 400 to 490 nm, and at least one luminescent nanoparticle emits at a wavelength in the range from 500 to 560 nm. In this embodiment, the core 22 of the core/shell particle 2 and the shell 23 of the core/shell particle 2 comprise at least one luminescent nanoparticle emitting in the blue region of the visible spectrum and at least one luminescent nanoparticle emitting in the green region of the visible spectrum.

According to one embodiment, the core 22 of the core/shell particle 2 comprises at least one magnetic nanoparticle and the shell 23 of the core/shell particle 2 comprises at least one nanoparticle 3 selected in the group of luminescent nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the core 22 of the core/shell particle 2 comprises at least one plasmonic nanoparticle and the shell 23 of the core/shell particle 2 comprises at least one nanoparticle 3 selected in the group of luminescent nanoparticle, magnetic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the core 22 of the core/shell particle 2 comprises at least one dielectric nanoparticle and the shell 23 of the core/shell particle 2 comprises at least one nanoparticle 3 selected in the group of luminescent nanoparticle, magnetic nanoparticle, plasmonic nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the core 22 of the core/shell particle 2 comprises at least one piezoelectric nanoparticle and the shell 23 of the core/shell particle 2 comprises at least one nanoparticle 3 selected in the group of luminescent nanoparticle, magnetic nanoparticle, dielectric nanoparticle, plasmonic nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the core 22 of the core/shell particle 2 comprises at least one pyro-electric nanoparticle and the shell 23 of the core/shell particle 2 comprises at least one nanoparticle 3 selected in the group of luminescent nanoparticle, magnetic nanoparticle, dielectric nanoparticle, plasmonic nanoparticle, piezoelectric nanoparticle, ferro-electric nanoparticle, light scattering nanoparticle, electrically insulating nanoparticle, thermally insulating nanoparticle, or catalytic nanoparticle.

According to one embodiment, the core 22 of the core/shell particle 2 comprises at least one ferro-electric nanoparticle and the shell 23 of the core/shell particle 2 comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, light scattering nanoparticle, electrically insulating nanoparticle, thermally insulating nanoparticle, or catalytic nanoparticle.

According to one embodiment, the core 22 of the core/shell particle 2 comprises at least one light scattering nanoparticle and the shell 23 of the core/shell particle 2 comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, electrically insulating nanoparticle, thermally insulating nanoparticle, or catalytic nanoparticle.

According to one embodiment, the core 22 of the core/shell particle 2 comprises at least one electrically insulating nanoparticle and the shell 23 of the core/shell particle 2 comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, thermally insulating nanoparticle, or catalytic nanoparticle.

According to one embodiment, the core 22 of the core/shell particle 2 comprises at least one thermally insulating nanoparticle and the shell 23 of the core/shell particle 2 comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or catalytic nanoparticle.

According to one embodiment, the core 22 of the core/shell particle 2 comprises at least one catalytic nanoparticle and the shell 23 of the core/shell particle 2 comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or thermally insulating nanoparticle.

According to one embodiment, the shell 23 of the particle 2 has a thickness of at least 0.1 nm, 0.2 nm, 0.3 nm, 0.4 nm, 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the shell 23 of the particle 2 has a thickness homogeneous all along the core 22, i.e., the shell 23 of the particle 2 has a same thickness all along the core 22.

According to one embodiment, the shell 23 of the particle 2 has a thickness heterogeneous along the core 22, i.e., said thickness varies along the core 22.

According to one embodiment, the particle 2 is not a core/shell particle wherein the core is an aggregate of metallic particles and the shell comprises the second material 21.

According to one embodiment, the particle 2 is a core/shell particle wherein the core is filled with solvent and the shell comprises nanoparticles 3 dispersed in a second material 21, i.e., said particle 2 is a hollow bead with a solvent filled core.

According to one embodiment, the particle 2 is optically transparent, i.e., the particle 2 is transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

According to one embodiment, the particle 2 exhibits a shelf life of at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the particle 2 exhibits a degradation of its specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the specific property of the particle 2 comprises one or more of the following: fluorescence, phosphorescence, chemiluminescence, capacity of increasing local electromagnetic field, absorbance, magnetization, magnetic coercivity, catalytic yield, catalytic properties, photovoltaic properties, photovoltaic yield, electrical polarization, thermal conductivity, electrical conductivity, permeability to molecular oxygen, permeability to molecular water, or any other properties.

According to one embodiment, the particle 2 exhibits a degradation of its specific property of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 2 exhibits a degradation of its specific property of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its specific property of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 2 exhibits a degradation of its specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the particle 2 exhibits a degradation of its specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 2 exhibits a degradation of its specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

Photoluminescence refers to fluorescence and/or phosphorescence.

According to one embodiment, the particle 2 exhibits a degradation of its photoluminescence of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 2 exhibits a degradation of its photoluminescence of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its photoluminescence of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 2 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the particle 2 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 2 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

In one embodiment, the particle 2 exhibits photoluminescence quantum yield (PLQY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 $mW \cdot cm^{-2}$ and 100 $kW \cdot cm^{-2}$, more preferably between 10 $mW \cdot cm^{-2}$ and 100 $W \cdot cm^{-2}$, and even more preferably between 10 $mW \cdot cm^{-2}$ and 30 $W \cdot cm^{-2}$.

According to one embodiment, the photon flux or average peak pulse power of the illumination is at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the particle 2 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the particle 2 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the photoluminescence of the particle 2 is preserved after encapsulation in the particle 1.

According to one embodiment, the at least one nanoparticle 3 is a luminescent nanoparticle.

According to one embodiment, the luminescent nanoparticle is a fluorescent nanoparticle.

According to one embodiment, the luminescent nanoparticle is a phosphorescent nanoparticle.

According to one embodiment, the luminescent nanoparticle is a chemiluminescent particle.

According to one embodiment, the luminescent nanoparticle is a triboluminescent nanoparticle.

According to one embodiment, the luminescent nanoparticle exhibits an emission spectrum with at least one emission peak, wherein said emission peak has a maximum emission wavelength ranging from 400 nm to 50 μm.

According to one embodiment, the luminescent nanoparticle exhibits an emission spectrum with at least one emission peak, wherein said emission peak has a maximum emission wavelength ranging from 400 nm to 500 nm. In this embodiment, the luminescent nanoparticle emits blue light.

According to one embodiment, the luminescent nanoparticle exhibits an emission spectrum with at least one emission peak, wherein said emission peak has a maximum emission wavelength ranging from 500 nm to 560 nm, more preferably ranging from 515 nm to 545 nm. In this embodiment, the luminescent nanoparticle emits green light.

According to one embodiment, the luminescent nanoparticle exhibits an emission spectrum with at least one emission peak, wherein said emission peak has a maximum emission wavelength ranging from 560 nm to 590 nm. In this embodiment, the luminescent nanoparticle emits yellow light.

According to one embodiment, the luminescent nanoparticle exhibits an emission spectrum with at least one emission peak, wherein said emission peak has a maximum emission wavelength ranging from 590 nm to 750 nm, more preferably ranging from 610 nm to 650 nm. In this embodiment, the luminescent nanoparticle emits red light.

According to one embodiment, the luminescent nanoparticle exhibits an emission spectrum with at least one emission peak, wherein said emission peak has a maximum emission wavelength ranging from 750 nm to 50 am. In this embodiment, the luminescent nanoparticle emits near infrared, mid-infra-red, or infra-red light.

According to one embodiment, the luminescent nanoparticle exhibits an emission spectrum with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the luminescent nanoparticle exhibits emission spectra with at least one emission peak having a full width half maximum strictly lower than 40 nm, 30 nm, 25 nm, 20 nm, 15 nm, or 10 nm.

According to one embodiment, the luminescent nanoparticle exhibits an emission spectrum with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the luminescent nanoparticle exhibits emission spectra with at least one emission peak having a full width at quarter maximum strictly lower than 40 nm, 30 nm, 25 nm, 20 nm, 15 nm, or 10 nm.

According to one embodiment, the luminescent nanoparticle has a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99% or 100%.

According to one embodiment, the luminescent nanoparticles have an average fluorescence lifetime of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, or 1 μsecond.

In one embodiment, the nanoparticle 3 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one preferred embodiment, the nanoparticle 3 exhibits photoluminescence quantum yield (PQLY) decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the nanoparticle 3 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW \cdot cm^{-2}$, 50 $mW \cdot cm^{-2}$100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one preferred embodiment, the nanoparticle 3 exhibits FCE decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the at least one nanoparticle 3 absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the luminescent nanoparticle has an average fluorescence lifetime of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, or 1 μsecond.

According to one embodiment, the luminescent nanoparticle is a semiconductor nanoparticle.

According to one embodiment, the luminescent nanoparticle is a semiconductor nanocrystal.

According to one embodiment, the at least one nanoparticle 3 is a plasmonic nanoparticle.

According to one embodiment, the at least one nanoparticle 3 is a magnetic nanoparticle.

According to one embodiment, at least one nanoparticle 3 is a ferromagnetic nanoparticle.

According to one embodiment, the at least one nanoparticle 3 is a paramagnetic nanoparticle.

According to one embodiment, the at least one nanoparticle 3 is a superparamagnetic nanoparticle.

According to one embodiment, the at least one nanoparticle 3 is a diamagnetic nanoparticle.

According to one embodiment, the at least one nanoparticle 3 is a catalytic nanoparticle.

According to one embodiment, the nanoparticles 3 have photovoltaic properties.

According to one embodiment, the at least one nanoparticle 3 is a pyro-electric nanoparticle.

According to one embodiment, the at least one nanoparticle 3 is a ferro-electric nanoparticle.

According to one embodiment, the at least one nanoparticle 3 is a light scattering nanoparticle.

According to one embodiment, the at least one nanoparticle 3 is electrically insulating.

According to one embodiment, the at least one nanoparticle 3 is electrically conductive.

According to one embodiment, the at least one nanoparticle 3 has an electrical conductivity at standard conditions ranging from $1\times10^{-20}$ to $10^{7}$ S/m, preferably from $1\times10^{-15}$ to 5 S/m, more preferably from $1\times10^{-7}$ to 1 S/m.

According to one embodiment, the at least one nanoparticle 3 has an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-18}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^{2}$ S/m, $5\times10^{2}$ S/m, $10^{3}$ S/m, $5\times10^{3}$ S/m, $10^{4}$ S/m, $5\times10^{4}$ S/m, $10^{5}$ S/m, $5\times10^{5}$ S/m, $10^{6}$ S/m, $5\times10^{6}$ S/m, or $10^{7}$ S/m.

According to one embodiment, the electrical conductivity of the at least one nanoparticle 3 may be measured for example with an impedance spectrometer.

According to one embodiment, the at least one nanoparticle 3 is thermally conductive.

According to one embodiment, the at least one nanoparticle 3 has a thermal conductivity at standard conditions ranging from 0.1 to 450 W/(m·K), preferably from 1 to 200 W/(m·K), more preferably from 10 to 150 W/(m·K).

According to one embodiment, the at least one nanoparticle 3 has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the thermal conductivity of the at least one nanoparticle 3 may be measured by steady-state methods or transient methods.

According to one embodiment, the at least one nanoparticle 3 is thermally insulating.

According to one embodiment, the at least one nanoparticle 3 is a local high temperature heating system.

According to one embodiment, the at least one nanoparticle 3 is a dielectric nanoparticle.

According to one embodiment, the at least one nanoparticle 3 is a piezoelectric nanoparticle.

According to one embodiment, the ligands attached to the surface of a nanoparticle 3 is in contact with the second material 21. In this embodiment, said nanoparticle 3 is linked to the second material 21 and the electrical charges from said nanoparticle 3 can be evacuated. This prevents reactions at the surface of the nanoparticles 3 that can be due to electrical charges.

According to one embodiment, the ligands at the surface of the nanoparticles 3 are C3 to C20 alkanethiol ligands such as for example propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, or a mixture thereof. In this embodiment, C3 to C20 alkanethiol ligands help control the hydrophobicity of the nanoparticles surface.

According to one embodiment, the at least one nanoparticle 3 is hydrophobic.

According to one embodiment, the at least one nanoparticle 3 is hydrophilic.

According to one embodiment, the at least one nanoparticle 3 has an average size of at least 0.5 nm, 1 nm, 2 nm, 3 nm, 4 nm, 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the largest dimension of the at least one nanoparticle 3 is at least 5 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the smallest dimension of the at least one nanoparticle 3 is at least 0.5 nm, 1 nm, 1.5 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the smallest dimension of the at least one nanoparticle 3 is smaller than the largest dimension of said nanoparticle 3 by a factor (aspect ratio) of at least 1.5; at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100; at least 150; at least 200; at least 250; at least 300; at least 350; at least 400; at least 450; at least 500; at least 550; at least 600; at least 650; at least 700; at least 750; at least 800; at least 850; at least 900; at least 950; or at least 1000.

According to one embodiment, in a statistical ensemble of nanoparticles 3, said nanoparticles 3 are polydisperse.

According to one embodiment, in a statistical ensemble of nanoparticles 3, said nanoparticles 3 are monodisperse.

According to one embodiment, in a statistical ensemble of nanoparticles 3, said nanoparticles 3 have a narrow size distribution.

According to one embodiment, the size distribution for the smallest dimension of a statistical set of nanoparticles 3 is inferior than 1%, 2%, 3%, 4%, 5%, 6%, 7%, 8%, 9%, 10%, 15%, 20%, 25%, 30%, 35%, or 40% of said smallest dimension.

According to one embodiment, the size distribution for the largest dimension of a statistical set of nanoparticles 3 is inferior than 1%, 2%, 3%, 4%, 5%, 6%, 7%, 8%, 9%, 10%, 15%, 20%, 25%, 30%, 35%, or 40% of said largest dimension.

According to one embodiment, the at least one nanoparticle 3 is hollow.

According to one embodiment, the at least one nanoparticle 3 is not hollow.

According to one embodiment, the at least one nanoparticle 3 is isotropic.

According to one embodiment, examples of shape of isotropic nanoparticle 3 include but are not limited to: sphere 31 (as illustrated in FIG. 2 and FIG. 19), faceted sphere, prism, polyhedron, or cubic shape.

According to one embodiment, the at least one nanoparticle 3 is not spherical.

According to one embodiment, the at least one nanoparticle 3 is anisotropic.

According to one embodiment, examples of shape of anisotropic nanoparticle 3 include but are not limited to: rod, wire, needle, bar, belt, cone, or polyhedron shape.

According to one embodiment, examples of branched shape of anisotropic nanoparticle 3 include but are not limited to: monopod, bipod, tripod, tetrapod, star, or octopod shape.

According to one embodiment, examples of complex shape of anisotropic nanoparticle 3 include but are not limited to: snowflake, flower, thorn, hemisphere, cone, urchin, filamentous particle, biconcave discoid, worm, tree, dendrite, necklace, or chain.

According to one embodiment, as illustrated in FIG. 3 and FIG. 20, the at least one nanoparticle 3 has a 2D shape 32.

According to one embodiment, examples of shape of 2D nanoparticle 32 include but are not limited to: sheet, platelet, plate, ribbon, wall, plate triangle, square, pentagon, hexagon, disk or ring.

According to one embodiment, a nanoplatelet is different from a disk or a nanodisk.

According to one embodiment, nanosheets and nanoplatelets are not disks or nanodisks. In this embodiment, the section along the other dimensions than the thickness (width, length) of said nanosheets or nanoplatelets is square or rectangular, while it is circular or ovoidal for disks or nanodisks.

According to one embodiment, nanosheets and nanoplatelets are not disks or nanodisks. In this embodiment, none of the dimensions of said nanosheets and nanoplatelets can be defined as a diameter nor the size of a semi-major axis and a semi-minor axis contrarily to disks or nanodisks.

According to one embodiment, nanosheets and nanoplatelets are not disks or nanodisks. In this embodiment, the curvature at all points along the other dimensions than the thickness (length, width) of said nanosheets or nanoplatelets is below 10 $\mu m^{-1}$, while the curvature for disks or nanodisks is superior on at least one point.

According to one embodiment, nanosheets and nanoplatelets are not disks or nanodisks. In this embodiment, the curvature at at least one point along the other dimensions than the thickness (length, width) of said nanosheets or nanoplatelets is below 10 $\mu m^{-1}$, while the curvature for disks or nanodisks is superior than 10 $\mu m^{-1}$ at all points.

According to one embodiment, a nanoplatelet is different from a quantum dot, or a spherical nanocrystal. A quantum dot is spherical, thus is has a 3D shape and allow confinement of excitons in all three spatial dimensions, whereas the nanoplatelet has a 2D shape and allow confinement of excitons in one dimension and allow free propagation in the other two dimensions. This results in distinct electronic and optical properties, for example the typical photoluminescence decay time of semiconductor platelets is 1 order of magnitude faster than for spherical quantum dots, and the semiconductor platelets also show an exceptionally narrow optical feature with full width at half maximum (FWHM) much lower than for spherical quantum dots.

According to one embodiment, a nanoplatelet is different from a nanorod or nanowire. A nanorod (or nanowire) has a 1D shape and allow confinement of excitons two spatial dimensions, whereas the nanoplatelet has a 2D shape and allow confinement of excitons in one dimension and allow free propagation in the other two dimensions. This results in distinct electronic and optical properties.

According to one embodiment, to obtain a ROHS compliant particle 1 and/or particle 2, said particle 1 and/or particle 2 rather comprises semiconductor nanoplatelets than semiconductor quantum dots. Indeed, a same emission peak position is obtained for semiconductor quantum dots with a diameter d, and semiconductor nanoplatelets with a thickness d/2; thus for the same emission peak position, a semiconductor nanoplatelet comprises less cadmium in weight than a semiconductor quantum dot. Furthermore, if a CdS core is comprised in a core/shell quantum dot or a core/shell (or core/crown) nanoplatelet, then there are more possibilities of shell layers without cadmium in the case of core/shell (or core/crown) nanoplatelet; thus a core/shell (or core/crown) nanoplatelet with a CdS core may comprise less cadmium in weight than a core/shell quantum dot with a CdS core. The lattice difference between CdS and nonCadmium shells is too important for the quantum dot to sustain. Finally, semiconductor nanoplatelets have better absorption properties than semiconductor quantum dots, thus resulting in less cadmium in weight needed in semiconductor nanoplatelets.

According to one embodiment, as illustrated in FIG. 12A, the at least one nanoparticle 3 is a core nanoparticle 33 without a shell.

According to one embodiment, the at least one nanoparticle 3 is atomically flat. In this embodiment, the atomically flat nanoparticle 3 may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, the at least one nanoparticle 3 comprises at least one atomically flat core. In this embodiment, the atomically flat core may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence, or any other characterization means known by the person skilled in the art.

According to one embodiment, the at least one nanoparticle 3 is a core 33/shell 34 nanoparticle, wherein the core 33 is partially or totally covered with at least one shell 34 comprising at least one layer of material.

According to one embodiment, as illustrated in FIG. 12B-C and FIG. 12F-G, the at least one nanoparticle 3 is a core 33/shell 34 nanoparticle, wherein the core 33 is covered with at least one shell (34, 35).

According to one embodiment, the at least one shell (34, 35) has a thickness of at least 0.1 nm, 0.2 nm, 0.3 nm, 0.4 nm, 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, or 500 nm.

According to one embodiment, the at least one nanoparticle 3 is a core 33/shell 34 nanoparticle, wherein the core 33 and the shell 34 are composed of the same material.

According to one embodiment, the at least one nanoparticle 3 is a core 33/shell 34 nanoparticle, wherein the core 33 and the shell 34 are composed of at least two different materials.

According to one embodiment, the at least one nanoparticle 3 is a core 33/shell 34 nanoparticle, wherein the core 33 is a luminescent core covered with at least one shell 34 selected in the group of magnetic material, plasmonic material, dielectric material, piezoelectric material, pyro-electric material, ferro-electric material, light scattering material, electrically insulating material, thermally insulating material or catalytic material.

According to one embodiment, the at least one nanoparticle 3 is a core 33/shell 34 nanoparticle, wherein the core 33 is a magnetic core covered with at least one shell 34 selected in the group of luminescent material, plasmonic material, dielectric material, piezoelectric material, pyro-electric material, ferro-electric material, light scattering material, electrically insulating material, thermally insulating material or catalytic material.

According to one embodiment, the at least one nanoparticle 3 is a core 33/shell 34 nanoparticle, wherein the core 33 is a plasmonic core covered with at least one shell 34 selected in the group of magnetic material, luminescent material, dielectric material, piezoelectric material, pyro-electric material, ferro-electric material, light scattering material, electrically insulating material, thermally insulating material or catalytic material.

According to one embodiment, the at least one nanoparticle 3 is a core 33/shell 34 nanoparticle, wherein the core 33 is a dielectric core covered with at least one shell 34 selected in the group of magnetic material, plasmonic material, luminescent material, piezoelectric material, pyro-electric material, ferro-electric material, light scattering material, electrically insulating material, thermally insulating material or catalytic material.

According to one embodiment, the at least one nanoparticle 3 is a core 33/shell 34 nanoparticle, wherein the core 33 is a piezoelectric core covered with at least one shell 34 selected in the group of magnetic material, plasmonic material, dielectric material, luminescent material, pyro-electric material, ferro-electric material, light scattering material, electrically insulating material, thermally insulating material or catalytic material.

According to one embodiment, the at least one nanoparticle 3 is a core 33/shell 34 nanoparticle, wherein the core 33 is a pyro-electric core covered with at least one shell 34 selected in the group of magnetic material, plasmonic material, dielectric material, luminescent material, piezoelectric material, ferro-electric material, light scattering material, electrically insulating material, thermally insulating material or catalytic material.

According to one embodiment, the at least one nanoparticle 3 is a core 33/shell 34 nanoparticle, wherein the core 33 is a ferro-electric core covered with at least one shell 34 selected in the group of magnetic material, plasmonic material, dielectric material, luminescent material, piezoelectric material, pyro-electric material, light scattering material, electrically insulating material, thermally insulating material or catalytic material.

According to one embodiment, the at least one nanoparticle 3 is a core 33/shell 34 nanoparticle, wherein the core 33 is a light scattering core covered with at least one shell 34 selected in the group of magnetic material, plasmonic material, dielectric material, luminescent material, piezoelectric material, pyro-electric material, ferro-electric material, electrically insulating material, thermally insulating material or catalytic material.

According to one embodiment, the at least one nanoparticle 3 is a core 33/shell 34 nanoparticle, wherein the core 33 is an electrically insulating core covered with at least one shell 34 selected in the group of magnetic material, plasmonic material, dielectric material, luminescent material, piezoelectric material, pyro-electric material, ferro-electric material, light scattering material, thermally insulating material or catalytic material.

According to one embodiment, the at least one nanoparticle 3 is a core 33/shell 34 nanoparticle, wherein the core 33 is a thermally insulating core covered with at least one shell 34 selected in the group of magnetic material, plasmonic material, dielectric material, luminescent material, piezo-electric material, pyro-electric material, ferro-electric material, light scattering material, electrically insulating material or catalytic material.

According to one embodiment, the at least one nanoparticle 3 is a core 33/shell 34 nanoparticle, wherein the core 33 is a catalytic core covered with at least one shell 34 selected in the group of magnetic material, plasmonic material, dielectric material, luminescent material, piezoelectric material, pyro-electric material, ferro-electric material, light scattering material, electrically insulating material or thermally insulating material.

According to one embodiment, the at least one nanoparticle 3 is a core 33/shell 36 nanoparticle, wherein the core 33 is covered with an insulator shell 36. In this embodiment, the insulator shell 36 prevents the aggregation of the cores 33.

According to one embodiment, the insulator shell 36 has a thickness of at least 0.1 nm, 0.2 nm, 0.3 nm, 0.4 nm, 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm or 500 nm.

According to one embodiment, as illustrated in FIG. 12D and FIG. 12H, the at least one nanoparticle 3 is a core 33/shell (34, 35, 36) nanoparticle, wherein the core 33 is covered with at least one shell (34, 35) and an insulator shell 36.

According to one embodiment, the shells (34, 35, 36) covering the core 33 of the at least one nanoparticle 3 may be composed of the same material.

According to one embodiment, the shells (34, 35, 36) covering the core 33 of the at least one nanoparticle 3 may be composed of at least two different materials.

According to one embodiment, the shells (34, 35, 36) covering the core 33 of the at least one nanoparticle 3 may have the same thickness.

According to one embodiment, the shells (34, 35, 36) covering the core 33 of the at least one nanoparticle 3 may have different thickness.

According to one embodiment, each shell (34, 35, 36) covering the core 33 of the nanoparticle 3 has a thickness homogeneous all along the core 33, i.e., each shell (34, 35, 36) has a same thickness all along the core 33.

According to one embodiment, each shell (34, 35, 36) covering the core 33 of the nanoparticle 3 has a thickness heterogeneous along the core 33, i.e., said thickness varies along the core 33.

According to one embodiment, the at least one nanoparticle 3 is a core 33/insulator shell 36 nanoparticle, wherein examples of insulator shell 36 include but are not limited to: non-porous $SiO_2$, mesoporous $SiO_2$, non-porous MgO, mesoporous MgO, non-porous ZnO, mesoporous ZnO, non-porous $Al_2O_3$, mesoporous $Al_2O_3$, non-porous $ZrO_2$, mesoporous $ZrO_2$, non-porous $TiO_2$, mesoporous $TiO_2$, non-porous $SnO_2$, mesoporous $SnO_2$, or a mixture thereof. Said insulator shell 36 acts as a supplementary barrier against oxidation and can drain away the heat if it is a good thermal conductor.

According to one embodiment, as illustrated in FIG. 12E, the at least one nanoparticle 3 is a core 33/crown 37 nanoparticle with a 2D structure, wherein the core 33 is covered with at least one crown 37.

According to one embodiment, the at least one nanoparticle 3 is a core 33/crown 37 nanoparticle, wherein the core 33 is covered with a crown 37 comprising at least one layer of material.

According to one embodiment, the at least one nanoparticle 3 is a core 33/crown 37 nanoparticle, wherein the core 33 and the crown 37 are composed of the same material.

According to one embodiment, the at least one nanoparticle 3 is a core 33/crown 37 nanoparticle, wherein the core 33 and the crown 37 are composed of at least two different materials.

According to one embodiment, the at least one nanoparticle 3 is a core 33/crown 37 nanoparticle, wherein the core 33 is a luminescent core covered with at least one crown 37 selected in the group of magnetic material, plasmonic material, dielectric material, piezoelectric material, pyro-electric material, ferro-electric material, light scattering material, electrically insulating material, thermally insulating material, or catalytic material.

According to one embodiment, the at least one nanoparticle 3 is a core 33/crown 37 nanoparticle, wherein the core 33 is a magnetic core covered with at least one crown 37 selected in the group of luminescent material, plasmonic material, dielectric material, piezoelectric material, pyro-electric material, ferro-electric material, light scattering material, electrically insulating material, thermally insulating material, or catalytic material.

According to one embodiment, the at least one nanoparticle 3 is a core 33/crown 37 nanoparticle, wherein the core 33 is a plasmonic core covered with at least one crown 37 selected in the group of magnetic material, luminescent material, dielectric material, piezoelectric material, pyro-electric material, ferro-electric material, light scattering material, electrically insulating material, thermally insulating material, or catalytic material.

According to one embodiment, the at least one nanoparticle 3 is a core 33/crown 37 nanoparticle, wherein the core 33 is a dielectric core covered with at least one crown 37 selected in the group of magnetic material, plasmonic material, luminescent material, piezoelectric material, pyro-electric material, ferro-electric material, light scattering material, electrically insulating material, thermally insulating material, or catalytic material.

According to one embodiment, the at least one nanoparticle 3 is a core 33/crown 37 nanoparticle, wherein the core 33 is a piezoelectric core covered with at least one crown 37 selected in the group of magnetic material, plasmonic material, dielectric material, luminescent material, pyro-electric material, ferro-electric material, light scattering material, electrically insulating material, thermally insulating material, or catalytic material.

According to one embodiment, the at least one nanoparticle 3 is a core 33/crown 37 nanoparticle, wherein the core 33 is a pyro-electric core covered with at least one crown 37 selected in the group of magnetic material, plasmonic material, dielectric material, luminescent material, piezoelectric material, ferro-electric material, light scattering material, electrically insulating material, thermally insulating material, or catalytic material.

According to one embodiment, the at least one nanoparticle 3 is a core 33/crown 37 nanoparticle, wherein the core 33 is a ferro-electric core covered with at least one crown 37 selected in the group of magnetic material, plasmonic material, dielectric material, luminescent material, piezoelectric material, pyro-electric material, light scattering material, electrically insulating material, thermally insulating material, or catalytic material.

According to one embodiment, the at least one nanoparticle 3 is a core 33/crown 37 nanoparticle, wherein the core 33 is a light scattering core covered with at least one crown 37 selected in the group of magnetic material, plasmonic material, dielectric material, luminescent material, piezoelectric material, pyro-electric material, ferro-electric material, electrically insulating material, thermally insulating material, or catalytic material.

According to one embodiment, the at least one nanoparticle 3 is a core 33/crown 37 nanoparticle, wherein the core 33 is an electrically insulating core covered with at least one crown 37 selected in the group of magnetic material, plasmonic material, dielectric material, luminescent material, piezoelectric material, pyro-electric material, ferro-electric material, light scattering material, thermally insulating material, or catalytic material.

According to one embodiment, the at least one nanoparticle 3 is a core 33/crown 37 nanoparticle, wherein the core 33 is a thermally insulating core covered with at least one crown 37 selected in the group of magnetic material, plasmonic material, dielectric material, luminescent material, piezoelectric material, pyro-electric material, ferro-electric material, light scattering material, electrically insulating material, or catalytic material.

According to one embodiment, the at least one nanoparticle 3 is a core 33/crown 37 nanoparticle, wherein the core 33 is a catalytic core covered with at least one crown 37 selected in the group of magnetic material, plasmonic material, dielectric material, luminescent material, piezoelectric material, pyro-electric material, ferro-electric material, light scattering material, electrically insulating material, or thermally insulating material.

According to one embodiment, the at least one nanoparticle 3 is a core 33/crown 37 nanoparticle, wherein the core 33 is covered with an insulator crown. In this embodiment, the insulator crown prevents the aggregation of the cores 33.

According to one embodiment, the particle 2 comprises at least two nanoparticles 3 dispersed in the second material 21.

According to one embodiment, the particle 2 comprises a plurality of nanoparticles 3 dispersed in the second material 21.

According to one embodiment, the particle 2 comprises at least 1, at least 2, at least 3, at least 4, at least 5, at least 6, at least 7, at least 8, at least 9, at least 10, at least 11, at least 12, at least 13, at least 14, at least 15, at least 16, at least 17, at least 18, at least 19, at least 20, at least 21, at least 22, at least 23, at least 24, at least 25, at least 26, at least 27, at least 28, at least 29, at least 30, at least 31, at least 32, at least 33, at least 34, at least 35, at least 36, at least 37, at least 38, at least 39, at least 40, at least 41, at least 42, at least 43, at least 44, at least 45, at least 46, at least 47, at least 48, at least 49, at least 50, at least 51, at least 52, at least 53, at least 54, at least 55, at least 56, at least 57, at least 58, at least 59, at least 60, at least 61, at least 62, at least 63, at least 64, at least 65, at least 66, at least 67, at least 68, at least 69, at least 70, at least 71, at least 72, at least 73, at least 74, at least 75, at least 76, at least 77, at least 78, at least 79, at least 80, at least 81, at least 82, at least 83, at least 84, at least 85, at least 86, at least 87, at least 88, at least 89, at least 90, at least 91, at least 92, at least 93, at least 94, at least 95, at least 96, at least 97, at least 98, at least 99, at least 100, at least 200, at least 300, at least 400, at least 500, at least 600, at least 700, at least 800, at least 900, at least 1000, at least 1500, at least 2000, at least 2500, at least 3000, at least 3500, at least 4000, at least 4500, at least 5000, at least 5500, at least 6000, at least 6500, at least 7000, at least 7500, at least 8000, at least 8500, at least 9000, at least 9500, at least 10000, at least 15000, at least 20000, at least 25000, at least 30000, at least 35000, at least 40000, at least 45000, at least 50000, at least 55000, at least 60000, at least 65000, at least 70000, at least 75000, at least 80000, at least 85000, at least 90000, at least 95000, or at least 100000 nanoparticles 3 dispersed in the second material 21.

According to one embodiment, the particle 2 comprises a combination of at least two different nanoparticles 3. In this embodiment, the resulting particle 2 will exhibit different properties.

In a preferred embodiment, the particle 2 comprises at least two different nanoparticles 3, wherein at least one nanoparticle 3 emits at a wavelength in the range from 500 to 560 nm, and at least one nanoparticle 3 emits at a wavelength in the range from 600 to 2500 nm. In this embodiment, the particle 2 comprises at least one nanoparticle 3 emitting in the green region of the visible spectrum and at least one nanoparticle 3 emitting in the red region of the visible spectrum, thus the particle 2 paired with a blue LED will be a white light emitter.

In a preferred embodiment, the particle 2 comprises at least two different nanoparticles 3, wherein at least one nanoparticle 3 emits at a wavelength in the range from 400 to 490 nm, and at least one nanoparticle 3 emits at a wavelength in the range from 600 to 2500 nm. In this embodiment, the particle 2 comprises at least one nanoparticle 3 emitting in the blue region of the visible spectrum and at least one nanoparticle 3 emitting in the red region of the visible spectrum, thus the particle 2 will be a white light emitter.

In a preferred embodiment, the particle 2 comprises at least two different nanoparticles 3, wherein at least one nanoparticle 3 emits at a wavelength in the range from 400 to 490 nm, and at least one nanoparticle 3 emits at a wavelength in the range from 500 to 560 nm. In this embodiment, the particle 2 comprises at least one nanoparticle 3 emitting in the blue region of the visible spectrum and at least one nanoparticle 3 emitting in the green region of the visible spectrum.

In a preferred embodiment, the particle 2 comprises three different nanoparticles 3, wherein said nanoparticles 3 emit different emission wavelengths or color.

In a preferred embodiment, the particle 2 comprises at least three different nanoparticles 3, wherein at least one nanoparticle 3 emits at a wavelength in the range from 400 to 490 nm, at least one nanoparticle 3 emits at a wavelength in the range from 500 to 560 nm and at least one nanoparticle 3 emits at a wavelength in the range from 600 to 2500 nm. In this embodiment, the particle 2 comprises at least one nanoparticle 3 emitting in the blue region of the visible spectrum, at least one nanoparticle 3 emitting in the green region of the visible spectrum and at least one nanoparticle 3 emitting in the red region of the visible spectrum.

In a preferred embodiment, the particle 2 does not comprise any nanoparticle 3 on its surface. In this embodiment, the at least one nanoparticle 3 is completely surrounded by the second material 21.

According to one embodiment, at least 100%, 95%, 90%, 85%, 80%, 75%, 70%, 65%, 60%, 55%, 50%, 45%, 40%, 35%, 30%, 25%, 20%, 15%, 10%, 5%, or 1% of nanoparticles 3 are comprised in the second material 21. In this embodiment, each of said nanoparticles 3 is completely surrounded by the second material 21.

According to one embodiment, the particle 2 comprises at least 100%, 95%, 90%, 85%, 80%, 75%, 70%, 65%, 60%, 55%, 50%, 45%, 40%, 35%, 30%, 25%, 20%, 15%, 10%, 5%, 1% or 0% of nanoparticles 3 on its surface.

According to one embodiment, the particle 2 comprises at least one nanoparticle 3 located on the surface of said particle 2.

According to one embodiment, the particle 2 comprises at least one nanoparticle 3 dispersed in the second material 21, i.e., totally surrounded by said second material 21; and at least one nanoparticle 3 located on the surface of said particle 2.

According to one embodiment, the particle 2 comprises at least one nanoparticle 3 dispersed in the second material 21, wherein said at least one nanoparticle 3 emits at a wavelength in the range from 500 to 560 nm; and at least one nanoparticle 3 located on the surface of said particle 2, wherein said at least one nanoparticle 3 emits at a wavelength in the range from 600 to 2500 nm.

According to one embodiment, the particle 2 comprises at least one nanoparticle 3 dispersed in the second material 21, wherein said at least one nanoparticle 3 emits at a wavelength in the range from 600 to 2500 nm; and at least one nanoparticle 3 located on the surface of said particle 2, wherein said at least one nanoparticle 3 emits at a wavelength in the range from 500 to 560 nm.

According to one embodiment, the at least one nanoparticle 3 is only located on the surface of said particle 2. This embodiment is advantageous as the at least one nanoparticle 3 will be better excited by the incident light than if said nanoparticle 3 was dispersed in the second material 21.

According to one embodiment, the at least one nanoparticle 3 located on the surface of said particle 2 may be chemically or physically adsorbed on said surface.

According to one embodiment, the at least one nanoparticle 3 located on the surface of said particle 2 may be adsorbed on said surface.

According to one embodiment, the at least one nanoparticle 3 located on the surface of said particle 2 may be adsorbed with a cement on said surface.

According to one embodiment, examples of cement include but are not limited to: polymers, silicone, oxides, or a mixture thereof.

According to one embodiment, the at least one nanoparticle 3 located on the surface of said particle 2 may have at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of its volume trapped in the second material 21.

According to one embodiment, the plurality of nanoparticles 3 is uniformly spaced on the surface of the particle 2.

According to one embodiment, each nanoparticle 3 of the plurality of nanoparticles 3 is spaced from its adjacent nanoparticle 3 by an average minimal distance.

According to one embodiment, the average minimal distance between two nanoparticles 3 is controlled.

According to one embodiment, the average minimal distance between two nanoparticles 3 on the surface of the particle 2 is at least 1 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two nanoparticles 3 on the surface of the particle 2 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5

μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two nanoparticles 3 on the surface of the particle 2 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 15%, 20%, 25%, 30%, 35%, 40%, 45%, or 50%.

According to one embodiment, a plurality of nanoparticles 3 is uniformly dispersed in the second material 21.

The uniform dispersion of the plurality of nanoparticles 3 in the second material 21 comprised in the particle 2 prevents the aggregation of said nanoparticles 3, thereby preventing the degradation of their properties. For example, in the case of inorganic fluorescent particles, a uniform dispersion will allow the optical properties of said particles to be preserved, and quenching can be avoided.

According to one embodiment, the nanoparticles 3 comprised in a particle 2 are uniformly dispersed within the second material 21 comprised in said particle 2.

According to one embodiment, the nanoparticles 3 comprised in a particle 2 are dispersed within the second material 21 comprised in said particle 2.

According to one embodiment, the nanoparticles 3 comprised in a particle 2 are uniformly and evenly dispersed within the second material 21 comprised in said particle 2.

According to one embodiment, the nanoparticles 3 comprised in a particle 2 are evenly dispersed within the second material 21 comprised in said particle 2.

According to one embodiment, the nanoparticles 3 comprised in a particle 2 are homogeneously dispersed within the second material 21 comprised in said particle 2.

According to one embodiment, the dispersion of nanoparticles 3 in the second material 21 does not have the shape of a ring, or a monolayer.

According to one embodiment, each nanoparticle 3 of the plurality of nanoparticles 3 is spaced from its adjacent nanoparticle 3 by an average minimal distance.

According to one embodiment, the average minimal distance between two nanoparticles 3 is controlled.

According to one embodiment, the average minimal distance is at least 1 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two nanoparticles 3 in the same particle 2 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 tam, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5

μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two nanoparticles 3 in the same particle 2 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 15%, 20%, 25%, 30%, 35%, 40%, 45%, or 50%.

According to one embodiment, the at least one nanoparticle 3 is encapsulated into the second material 21 during the formation of said second material 21. For example, said nanoparticle 3 are not inserted in nor put in contact with the second material 21 which have been previously obtained.

In a preferred embodiment, the particle 2 comprises at least one luminescent nanoparticle and at least one plasmonic nanoparticle.

According to one embodiment, the number of nanoparticles 3 comprised in the particle 2 depends mainly on the molar ratio or the mass ratio between the chemical species allowing to produce the second material 21 and the at least one nanoparticle 3.

According to one embodiment, the at least one nanoparticle 3 represents at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99% by weight of the particle 1.

According to one embodiment, the loading charge of the at least one nanoparticle 3 in the particle 2 is at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the loading charge of the at least one nanoparticle 3 in the particle 2 is less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the nanoparticles 3 are not encapsulated in particle 2 via physical entrapment or electrostatic attraction.

According to one embodiment, the nanoparticles 3 and the second material 21 are not bonded or linked by electrostatic attraction or a functionalized silane based coupling agent.

According to one embodiment, the at least one nanoparticle 3 comprised in the particle 2 have a packing fraction of at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the nanoparticles 3 comprised in the particle 2 are not aggregated.

According to one embodiment, the nanoparticles 3 comprised in the particle 2 do not touch, are not in contact.

According to one embodiment, the nanoparticles 3 comprised in the particle 2 are separated by second material 21.

According to one embodiment, the at least one nanoparticle 3 comprised in the particle 2 can be individually evidenced.

According to one embodiment, the at least one nanoparticle 3 comprised in the particle 2 can be individually evidenced by transmission electron microscopy or fluorescence scanning microscopy, or any other characterization means known by the person skilled in the art.

According to one embodiment, as illustrated in FIG. 4 and FIG. 21, the particle 2 comprises a combination of at least two different nanoparticles (31, 32). In this embodiment, the particle 2, thus the resulting particle 1 will exhibit different properties.

According to one embodiment, the particle 2 comprises at least one luminescent nanoparticle and at least one nanoparticle 3 selected in the group of magnetic nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

In a preferred embodiment, the particle 2 comprises at least two different luminescent nanoparticles, wherein said luminescent nanoparticles emit different emission wavelengths.

In a preferred embodiment, the particle 2 comprises at least two different luminescent nanoparticles, wherein at least one luminescent nanoparticle emits at a wavelength in the range from 500 to 560 nm, and at least one luminescent nanoparticle emits at a wavelength in the range from 600 to 2500 nm. In this embodiment, the particle 2 comprises at least one luminescent nanoparticle emitting in the green region of the visible spectrum and at least one luminescent nanoparticle emitting in the red region of the visible spectrum, thus the particle 1 paired with a blue LED will be a white light emitter.

In a preferred embodiment, the particle 2 comprises at least two different luminescent nanoparticles, wherein at least one luminescent nanoparticle emits at a wavelength in the range from 400 to 490 nm, and at least one luminescent nanoparticle emits at a wavelength in the range from 600 to 2500 nm. In this embodiment, the particle 2 comprises at least one luminescent nanoparticle emitting in the blue region of the visible spectrum and at least one luminescent nanoparticle emitting in the red region of the visible spectrum, thus the particle 1 will be a white light emitter.

In a preferred embodiment, the particle 2 comprises at least two different luminescent nanoparticles, wherein at least one luminescent nanoparticle emits at a wavelength in the range from 400 to 490 nm, and at least one luminescent nanoparticle emits at a wavelength in the range from 500 to 560 nm. In this embodiment, the particle 2 comprises at least one luminescent nanoparticle emitting in the blue region of the visible spectrum and at least one luminescent nanoparticle emitting in the green region of the visible spectrum.

In a preferred embodiment, the particle 2 comprises three different luminescent nanoparticles, wherein said luminescent nanoparticles emit at different emission wavelengths or color.

In a preferred embodiment, the particle 2 comprises at least three different luminescent nanoparticles, wherein at least one luminescent nanoparticle emits at a wavelength in the range from 400 to 490 nm, at least one luminescent nanoparticle emits at a wavelength in the range from 500 to 560 nm and at least one luminescent nanoparticle emits at a wavelength in the range from 600 to 2500 nm. In this embodiment, the particle 2 comprises at least one luminescent nanoparticle emitting in the blue region of the visible spectrum, at least one luminescent nanoparticle emitting in the green region of the visible spectrum and at least one luminescent nanoparticle emitting in the red region of the visible spectrum.

According to one embodiment, the particle 2 comprises at least one magnetic nanoparticle and at least one nanoparticle 3 selected in the group of luminescent nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the particle 2 comprises at least one plasmonic nanoparticle and at least one nanoparticle 3 selected in the group of luminescent nanoparticle, magnetic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the particle 2 comprises at least one dielectric nanoparticle and at least one nanoparticle 3 selected in the group of luminescent nanoparticle, magnetic nanoparticle, plasmonic nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the particle 2 comprises at least one piezoelectric nanoparticle and at least one nanoparticle 3 selected in the group of luminescent nanoparticle, magnetic nanoparticle, dielectric nanoparticle, plasmonic nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the particle 2 comprises at least one pyro-electric nanoparticle and at least one nanoparticle 3 selected in the group of luminescent nanoparticle, magnetic nanoparticle, dielectric nanoparticle, plasmonic nanoparticle, piezoelectric nanoparticle, ferro-electric nanoparticle, light scattering nanoparticle, electrically insulating nanoparticle, thermally insulating nanoparticle, or catalytic nanoparticle.

According to one embodiment, the particle 2 comprises at least one ferro-electric nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, light scattering nanoparticle, electrically insulating nanoparticle, thermally insulating nanoparticle, or catalytic nanoparticle.

According to one embodiment, the particle 2 comprises at least one light scattering nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, electrically insulating nanoparticle, thermally insulating nanoparticle, or catalytic nanoparticle.

According to one embodiment, the particle 2 comprises at least one electrically insulating nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, thermally insulating nanoparticle, or catalytic nanoparticle.

According to one embodiment, the particle 2 comprises at least one thermally insulating nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or catalytic nanoparticle.

According to one embodiment, the particle 2 comprises at least one catalytic nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or thermally insulating nanoparticle.

According to one embodiment, the particle 2 comprises at least one nanoparticle 3 without a shell and at least one nanoparticle 3 selected in the group of core 33/shell 34 nanoparticles 3 and core 33/insulator shell 36 nanoparticles 3.

According to one embodiment, the particle 2 comprises at least one core 33/shell 34 nanoparticle 3 and at least one nanoparticle 3 selected in the group of nanoparticles 3 without a shell and core 33/insulator shell 36 nanoparticles 3.

According to one embodiment, the particle 2 comprises at least one core 33/insulator shell 36 nanoparticle 3 and at least one nanoparticle 3 selected in the group of nanoparticles 3 without a shell and core 33/shell 34 nanoparticles 3.

According to one embodiment, the at least one nanoparticle 3 is ROHS compliant.

According to one embodiment, the at least one nanoparticle 3 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the at least one nanoparticle 3 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the at least one nanoparticle 3 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the at least one nanoparticle 3 in the second material 21 exhibits a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the at least one nanoparticle 3 in the second material 21 exhibits a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the at least one nanoparticle 3 in the second material 21 exhibits a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the specific property of the at least one nanoparticle 3 comprises one or more of the following: fluorescence, phosphorescence, chemiluminescence, capacity of increasing local electromagnetic field, absorbance, magnetization, magnetic coercivity, catalytic yield, catalytic properties, photovoltaic properties, photovoltaic yield, electrical polarization, thermal conductivity, electrical conductivity, permeability to molecular oxygen, permeability to molecular water, or any other properties.

According to one embodiment, the at least one nanoparticle 3 in the second material 21 exhibits a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the at least one nanoparticle 3 in the second material 21 exhibits a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the at least one nanoparticle 3 in the second material 21 exhibits a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the at least one nanoparticle 3 in the second material 21 exhibits a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the at least one nanoparticle 3 in the second material 21 exhibits a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the at least one nanoparticle 3 in the second material 21 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits a degradation of its FCE of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the at least one nanoparticle 3 in the second material 21 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 is a colloidal nanoparticle.

According to one embodiment, the at least one nanoparticle 3 is dispersible in aqueous solvents, organic solvents and/or mixture thereof. According to one embodiment, the nanoparticles 3 are colloidal nanoparticles.

According to one embodiment, the nanoparticle 3 is an electrically charged nanoparticle.

According to one embodiment, the nanoparticle 3 is not electrically charged nanoparticle.

According to one embodiment, the nanoparticle 3 is not positively charged nanoparticle.

According to one embodiment, the nanoparticle 3 is not negatively charged nanoparticle.

According to one embodiment, the at least one nanoparticle 3 is an organic nanoparticle.

According to one embodiment, the organic nanoparticle is composed of a material selected in the group of carbon nanotube, graphene and its chemical derivatives, graphyne, fullerenes, nanodiamonds, boron nitride nanotubes, boron nitride nanosheets, phosphorene and $Si_2BN$.

According to one embodiment, the organic nanoparticle comprises an organic material.

In one embodiment, the organic material is selected from polyacrylates; polymethacrylate; polyacrylamide; polyester; polyether; polyolefin (or polyalkene); polysaccharide; polyamide; or a mixture thereof; preferably the organic material is an organic polymer.

According to one embodiment, the organic material refers to any element and/or material containing carbon, preferably any element and/or material containing at least one carbon-hydrogen bond.

According to one embodiment, the organic material may be natural or synthetic.

According to one embodiment, the organic material is a small organic compound or an organic polymer.

According to one embodiment, the organic polymer is selected from polyacrylates; polymethacrylates; polyacrylamides; polyamides; polyesters; polyethers; polyoelfins; polysaccharides; polyurethanes (or polycarbamates), polystyrenes; polyacrylonitrile-butadiene-styrene (ABS); polycarbonate; poly(styrene acrylonitrile); vinyl polymers such as polyvinyl chloride; polyvinyl alcohol, polyvinyl acetate, polyvinylpyrrolidone, polyvinyl pyridine, polyvinylimidazole; poly(p-phenylene oxide); polysulfone; polyethersulfone; polyethylenimine; polyphenylsulfone; poly(acrylonitrile styrene acrylate); polyepoxides, polythiophenes, polypyrroles; polyanilines; polyaryletherketones; polyfurans; polyimides; polyimidazoles; polyetherimides; polyketones; polynucleotides; polystyrene sulfonates; polyetherimines; polyamic acid; or any combinations and/or derivatives and/or copolymers thereof.

According to one embodiment, the organic polymer is a polyacrylate, preferably selected from poly(methyl acrylate), poly(ethyl acrylate), poly(propyl acrylate), poly(butyl acrylate), poly(pentyl acrylate), and poly(hexyl acrylate).

According to one embodiment, the organic polymer is a polymethacrylate, preferably selected from poly(methyl methacrylate), poly(ethyl methacrylate), poly(propyl methacrylate), poly(butyl methacrylate), poly(pentyl methacrylate), and poly(hexyl methacrylate). According to one embodiment, the organic polymer is poly(methyl methacrylate) (PMMA).

According to one embodiment, the organic polymer is a polyacrylamide, preferably selected from poly(acrylamide); poly(methyl acrylamide), poly(dimethyl acrylamide), poly (ethyl acrylamide), poly(diethyl acrylamide), poly(propyl acrylamide), poly(isopropyl acrylamide); poly(butyl acrylamide); and poly(tert-butyl acrylamide).

According to one embodiment, the organic polymer is a polyester, preferably selected from poly(glycolic acid) (PGA), poly(lactic acid) (PLA), poly(caprolactone) (PCL), polyhydroxyalcanoate (PHA), polyhydroxybutyrate (PHB), polyethylene adipate, polybutylene succinate, poly(ethylene terephthalate), poly(butylene terephthalate), poly(trimethylene terephthalate), polyarylate or any combination thereof.

According to one embodiment, the organic polymer is a polyether, preferably selected from aliphatic polyethers such as poly(glycol ether) or aromatic polyethers. According to one embodiment, the polyether is selected from poly(methylene oxide); poly(ethylene glycol)/poly(ethylene oxide), poly(propylene glycol) and poly(tetrahydrofuran).

According to one embodiment, the organic polymer is a polyolefin (or polyalkene), preferably selected from poly (ethylene), poly(propylene), poly(butadiene), poly(methylpentene), poly(butane) and poly(isobutylene).

According to one embodiment, the organic polymer is a polysaccharide selected from chitosan, dextran, hyaluronic acid, amylose, amylopectin, pullulan, heparin, chitin, cellulose, dextrin, starch, pectin, alginates, carrageenans, fucan, curdlan, xylan, polyguluronic acid, xanthan, arabinan, polymannuronic acid and their derivatives.

According to one embodiment, the organic polymer is a polyamide, preferably selected from polycaprolactame, polyauroamide, polyundecanamide, polytetramethylene adipamide, polyhexamethylene adipamide (also called nylon), polyhexamethylene nonanediamide, polyhexamethylene sebacamide, polyhexamethylene dodecanediamide; polydecamethylene sebacamide; polyhexamethylene isophthalamide; polymetaxylylene adipamide; polymetaphenylene isophthalamide; polyparaphenylene terephtalamide; polyphtalimides.

According to one embodiment, the organic polymer is a naturel or synthetic polymer.

According to one embodiment, the organic polymer is synthetized by organic reaction, radical polymerization, polycondensation, polyaddition, or ring opening polymerization (ROP).

According to one embodiment, the organic polymer is a homopolymer or a copolymer.

According to one embodiment, the organic polymer is linear, branched, and/or cross-linked.

According to one embodiment, the branched organic polymer is brush polymer (or also called comb polymer) or is a dendrimer.

According to one embodiment, the organic polymer is amorphous, semi-crystalline or crystalline. According to one embodiment, the organic polymer is a thermoplastic polymer or an elastomer.

According to one embodiment, the organic polymer is not a polyelectrolyte.

According to one embodiment, the organic polymer is not a hydrophilic polymer.

According to one embodiment, the organic polymer has an average molecular weight ranging from 2 000 g/mol to $5.10^6$ g/mol, preferably from 5 000 g/mol to $4.10^6$ g/mol; from 6 000 to $4.10^6$; from 7 000 to $4.10^6$; from 8 000 to $4.10^6$; from 9 000 to $4.10^6$; from 10 000 to $4.10^6$; from 15 000 to $4.10^6$; from 20 000 to $4.10^6$; from 25 000 to $4.10^6$; from 30 000 to $4.10^6$; from 35 000 to $4.10^6$; from 40 000 to $4.10^6$; from 45 000 to $4.10^6$; from 50 000 to $4.10^6$; from 55 000 to $4.10^6$; from 60 000 to $4.10^6$; from 65 000 to $4.10^6$; from 70 000 to $4.10^6$; from 75 000 to $4.10^6$; from 80 000 to $4.10^6$; from 85 000 to $4.10^6$; from 90 000 to $4.10^6$; from 95 000 to $4.10^6$; from 100 000 to $4.10^6$; from 200 000 to $4.10^6$; from 300 000 to $4.10^6$; from 400 000 to $4.10^6$; from 500 000 to $4.10^6$; from 600 000 to $4.10^6$; from 700 000 to $4.10^6$; from 800 000 to $4.10^6$; from 900 000 to $4.10^6$; from $1.10^6$ to $4.10^6$; from $2.10^6$ to $4.10^6$; from $3.10^6$ g/mol to $4.10^6$ g/mol.

According to one embodiment, the at least one nanoparticle 3 is an inorganic nanoparticle.

According to one embodiment, the nanoparticle 3 comprises an inorganic material. Said inorganic material is the same or different from the second material 21.

According to one embodiment, the particle 1 comprises at least one inorganic nanoparticle and at least one organic nanoparticle.

According to one embodiment, the at least one nanoparticle 3 is not a ZnO nanoparticle.

According to one embodiment, the at least one nanoparticle 3 is not a metal nanoparticle.

According to one embodiment, the particle 1 does not comprise only metal nanoparticles.

According to one embodiment, the particle 1 does not comprise only magnetic nanoparticles.

According to one embodiment, the inorganic nanoparticle is a colloidal nanoparticle.

According to one embodiment, the inorganic nanoparticle is amorphous.

According to one embodiment, the inorganic nanoparticle is crystalline.

According to one embodiment, the inorganic nanoparticle is totally crystalline.

According to one embodiment, the inorganic nanoparticle is partially crystalline.

According to one embodiment, the inorganic nanoparticle is monocrystalline.

According to one embodiment, the inorganic nanoparticle is polycrystalline. In this embodiment, each inorganic nanoparticle comprises at least one grain boundary.

According to one embodiment, the inorganic nanoparticle is a nanocrystal.

According to one embodiment, the inorganic nanoparticle is composed of a material selected in the group of metals, halides, chalcogenides, phosphides, sulfides, metalloids, metallic alloys, ceramics such as for example oxides, carbides, nitrides, glasses, enamels, ceramics, stones, precious stones, pigments, cements and/or inorganic polymers. Said inorganic nanoparticles are prepared using protocols known to the person skilled in the art.

According to one embodiment, the inorganic nanoparticle is composed of a material selected in the group of metals, halides, chalcogenides, phosphides, sulfides, metalloids, metallic alloys, ceramics such as for example oxides, carbides, or nitrides. Said inorganic nanoparticles are prepared using protocols known to the person skilled in the art.

According to one embodiment, the inorganic nanoparticle is selected in the group of metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof. Said nanoparticles are prepared using protocols known to the person skilled in the art.

According to one embodiment, the inorganic nanoparticle is selected from metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof, preferably is a semiconductor nanocrystal.

According to one embodiment, a chalcogenide is a chemical compound consisting of at least one chalcogen anion selected in the group of O, S, Se, Te, Po, and at least one or more electropositive element.

According to one embodiment, the metallic nanoparticles are selected in the group of gold nanoparticles, silver nanoparticles, copper nanoparticles, vanadium nanoparticles, platinum nanoparticles, palladium nanoparticles, ruthenium nanoparticles, rhenium nanoparticles, yttrium nanoparticles, mercury nanoparticles, cadmium nanoparticles, osmium nanoparticles, chromium nanoparticles, tantalum nanoparticles, manganese nanoparticles, zinc nanoparticles, zirconium nanoparticles, niobium nanoparticles, molybdenum nanoparticles, rhodium nanoparticles, tungsten nanoparticles, iridium nanoparticles, nickel nanoparticles, iron nanoparticles, or cobalt nanoparticles.

According to one embodiment, examples of carbide nanoparticles include but are not limited to: SiC, WC, BC, MoC, TiC, $Al_4C_3$, $LaC_2$, FeC, CoC, HfC, $Si_xC_y$, $W_xC_y$, $B_xC_y$, $Mo_xC_y$, $Ti_xC_y$, $Al_xC_y$, $La_xC_y$, $Fe_xC_y$, $Co_xC_y$, $Hf_xC_y$, or a mixture thereof; x and y are independently a decimal number from 0 to 5, at the condition that x and y are not simultaneously equal to 0, and $x \neq 0$.

According to one embodiment, examples of oxide nanoparticles include but are not limited to: $SiO_2$, $Al_2O_3$, $TiO_2$, $ZrO_2$, ZnO, MgO, $SnO_2$, $Nb_2Os$, $CeO_2$, BeO, $IrO_2$, CaO, $Sc_2O_3$, NiO, $Na_2O$, BaO, $K_2O$, PbO, $Ag_2O$, $V_2O_5$, $TeO_2$, MnO, $B_2O_3$, $P_2O_5$, $P_2O_3$, $P_4O_7$, $P_4O_8$, $P_4O_9$, $P_2O_6$, PO, $GeO_2$, $As_2O_3$, $Fe_2O_3$, $Fe_3O_4$, $Ta_2O_5$, $Li_2O$, SrO, $Y_2O_3$, $HfO_2$, $WO_2$, $MoO_2$, $Cr_2O_3$, $Tc_2O_7$, $ReO_2$, $RuO_2$, $Co_3O_4$, OsO, $RhO_2$, $Rh_2O_3$, PtO, PdO, CuO, $Cu_2O$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof.

According to one embodiment, examples of oxide nanoparticles include but are not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

According to one embodiment, examples of nitride nanoparticles include but are not limited to: TiN, $Si_3N_4$, MoN, VN, TaN, $Zr_3N_4$, HfN, FeN, NbN, GaN, CrN, AlN, InN, $Ti_xN_y$, $Si_xN_y$, $Mo_xN_y$, $V_xN_y$, $Ta_xN_y$, $Zr_xN_y$, $Hf_xN_y$, $Fe_xN_y$, $Nb_xN_y$, $Ga_xN_y$, $Cr_xN_y$, $Al_xN_y$, $In_xN_y$, or a mixture thereof; x and y are independently a decimal number from 0 to 5, at the condition that x and y are not simultaneously equal to 0, and $x \neq 0$.

According to one embodiment, examples of sulfide nanoparticles include but are not limited to: $Si_yS_x$, $Al_yS_x$, $Ti_yS_x$, $Zr_yS_x$, $Zn_yS_x$, $Mg_yS_x$, $Sn_yS_x$, $Nb_yS_x$, $Ce_yS_x$, $Be_yS_x$, $Ir_yS_x$, $Ca_yS_x$, $Sc_yS_x$, $Ni_yS_x$, $Na_yS_x$, $Ba_yS_x$, $K_yS_x$, $Pb_yS_x$, $Ag_yS_x$, $V_yS_x$, $Te_yS_x$, $Mn_yS_x$, $B_yS_x$, $P_yS_x$, $Ge_yS_x$, $As_yS_x$, $Fe_yS_x$, $Ta_yS_x$, $Li_yS_x$, $Sr_yS_x$, $Y_yS_x$, $Hf_yS_x$, $W_yS_x$, $Mo_yS_x$, $Cr_yS_x$, $Tc_yS_x$, $Re_yS_x$, $Ru_yS_x$, $Co_yS_x$, $Os_yS_x$, $Rh_yS_x$, $Pt_yS_x$, $Pd_yS_x$, $Cu_yS_x$, $Au_yS_x$, $Cd_yS_x$, $Hg_yS_x$, $Tl_yS_x$, $Ga_yS_x$, $In_yS_x$, $Bi_yS_x$, $Sb_yS_x$, $Po_yS_x$, $Se_yS_x$, $Cs_yS_x$, mixed sulfides, mixed sulfides thereof or a mixture thereof; x and y are independently a decimal number from 0 to 10, at the condition that x and y are not simultaneously equal to 0, and $x \neq 0$.

According to one embodiment, examples of halide nanoparticles include but are not limited to: $BaF_2$, $LaF_3$, $CeF_3$, $YF_3$, $CaF_2$, $MgF_2$, $PrF_3$, AgCl, $MnCl_2$, $NiCl_2$, $Hg_2Cl_2$, $CaCl_2$, $CsPbCl_3$, AgBr, $PbBr_3$, $CsPbBr_3$, AgI, CuI, PbI, $Hg_2$, $BiI_3$, $CH_3NH_3PbI_3$, $CH_3NH_3PbCl_3$, $CH_3NH_3PbBr_3$, $CsPbI_3$, $FAPbBr_3$ (with FA formamidinium), or a mixture thereof.

According to one embodiment, examples of chalcogenide nanoparticles include but are not limited to: CdO, CdS, CdSe, CdTe, ZnO, ZnS, ZnSe, ZnTe, HgO, HgS, HgSe, HgTe, CuO, $Cu_2O$, CuS, $Cu_2S$, CuSe, CuTe, $Ag_2O$, $Ag_2S$, $Ag_2Se$, $Ag_2Te$, $Au_2S$, PdO, PdS, $Pd_4S$, PdSe, PdTe, PtO, PtS, $PtS_2$, PtSe, PtTe, $RhO_2$, $Rh_2O_3$, $RhS_2$, $Rh_2S_3$, $RhSe_2$, $Rh_2Se_3$, $RhTe_2$, $IrO_2$, $IrS_2$, $Ir_2S_3$, $IrSe_2$, $IrTe_2$, $RuO_2$, $RuS_2$, OsO, OsS, OsSe, OsTe, MnO, MnS, MnSe, MnTe, $ReO_2$, $ReS_2$, $Cr_2O_3$, $Cr_2S_3$, $MoO_2$, $MoS_2$, $MoSe_2$, $MoTe_2$, $WO_2$, $WS_2$, $WSe_2$, $V_2O_5$, $V_2S_3$, $Nb_2Os$, $NbS_2$, $NbSe_2$, $HfO_2$, $HfS_2$, $TiO_2$, $ZrO_2$, $ZrS_2$, $ZrSe_2$, $ZrTe_2$, $Sc_2O_3$, $Y_2O_3$, $Y_2S_3$, $SiO_2$, $GeO_2$, GeS, $GeS_2$, GeSe, $GeSe_2$, GeTe, $SnO_2$, SnS, $SnS_2$, SnSe, $SnSe_2$, SnTe, PbO, PbS, PbSe, PbTe, MgO, MgS, MgSe, MgTe, CaO, CaS, SrO, $Al_2O_3$, $Ga_2O_3$, $Ga_2S_3$, $Ga_2Se_3$, $In_2O_3$, $In_2S_3$, $In_2Se_3$, $In_2Te_3$, $La_2O_3$, $La_2S_3$, $CeO_2$, $CeS_2$, $Pr_6O_{11}$, $Nd_2O_3$, $NdS_2$, $La_2O_3$, $Tl_2O$, $Sm_2O_3$, $SmS_2$, $Eu_2O_3$, $EuS_2$, $Bi_2O_3$, $Sb_2O_3$, $PoO_2$, $SeO_2$, $Cs_2O$, $Tb_4O_7$, $TbS_2$, $Dy_2O_3$, $Ho_2O_3$, $Er_2O_3$, $ErS_2$, $Tm_2O_3$, $Yb_2O_3$, $Lu_2O_3$, $CuInS_2$, $CuInSe_2$, $AgInS_2$, $AgInSe_2$, $Fe_2O_3$, $Fe_3O_4$, FeS, $FeS_2$, $Co_3S_4$, CoSe, $Co_3O_4$, NiO, $NiSe_2$, NiSe, $Ni_3Se_4$, $Gd_2O_3$, BeO, $TeO_2$, $Na_2O$, BaO, $K_2O$, $Ta_2O_5$, $Li_2O$, $Tc_2O_7$, $As_2O_3$, $B_2O_3$, $P_2O_5$, $P_2O_3$, $P_4O_7$, $P_4O_8$, $P_4O_9$, $P_2O_6$, PO, or a mixture thereof.

According to one embodiment, examples of phosphide nanoparticles include but are not limited to: InP, $Cd_3P_2$, $Zn_3P_2$, AlP, GaP, TlP, or a mixture thereof.

According to one embodiment, examples of metalloid nanoparticles include but are not limited to: Si, B, Ge, As, Sb, Te, or a mixture thereof.

According to one embodiment, examples of metallic alloy nanoparticles include but are not limited to: Au—Pd, Au—Ag, Au—Cu, Pt—Pd, Pt—Ni, Cu—Ag, Cu—Sn, Ru—Pt, Rh—Pt, Cu—Pt, Ni—Au, Pt—Sn, Pd—V, Ir—Pt, Au—Pt, Pd—Ag, Cu—Zn, Cr—Ni, Fe—Co, Co—Ni, Fe—Ni or a mixture thereof.

According to one embodiment, the nanoparticle 3 is a nanoparticle comprising hygroscopic materials such as for example phosphor materials or scintillator materials.

According to one embodiment, the at least one nanoparticle 3 is a perovskite nanoparticle.

According to one embodiment, perovskites comprise a material $A_mB_nX_{3p}$, wherein A is selected from the group consisting of Ba, B, K, Pb, Cs, Ca, Ce, Na, La, Sr, Th, FA (formamidinium $CN_2H_5^+$), or a mixture thereof; B is selected from the group consisting of Fe, Nb, Ti, Pb, Sn, Ge, Bi, Zr, or a mixture thereof; X is selected from the group consisting of O, CI, Br, I, cyanide, thiocyanate, or a mixture thereof; m, n and p are independently a decimal number from 0 to 5; m, n and p are not simultaneously equal to 0; m and n are not simultaneously equal to 0.

According to one embodiment, m, n and p are not equal to 0.

According to one embodiment, examples of perovskites include but or not limited to: $Cs_3Bi_2I_9$, $Cs_3Bi_2Cl_9$, $Cs_3Bi_2Br_9$, $BFeO_3$, $KNbO_3$, $BaTiO_3$, $CH_3NH_3PbI_3$, $CH_3NH_3PbCl_3$, $CH_3NH_3PbBr_3$, $FAPbBr_3$ (with FA formamidinium), $FAPbCl_3$, $FAPbI_3$, $CsPbCl_3$, $CsPbBr_3$, $CsPbI_3$, $CsSnI_3$, $CsSnCl_3$, $CsSnBr_3$, $CsGeCl_3$, $CsGeBr_3$, $CsGeI_3$, $FAPbCl_xBr_yI_z$ (with x, y and z independent decimal number from 0 to 5 and not simultaneously equal to 0).

According to one embodiment, the at least one nanoparticle 3 is a phosphor nanoparticle.

According to one embodiment, the at least one nanoparticle 3 is a metal nanoparticle (gold, silver, aluminum, magnesium, or copper, alloys).

According to one embodiment, the at least one nanoparticle 3 is an inorganic semiconductor or insulator which can be coated with organic compounds.

According to one embodiment, the inorganic semiconductor or insulator can be, for instance, group IV semiconductors (for instance, Carbon, Silicon, Germanium), group III-V compound semiconductors (for instance, Gallium Nitride, Indium Phosphide, Gallium Arsenide), II-VI compound semiconductors (for instance, Cadmium Selenide, Zinc Selenide, Cadmium Sulfide, Mercury Telluride), inorganic oxides (for instance, Indium Tin Oxide, Aluminum Oxide, Titanium Oxide, Silicon Oxide), and other chalcogenides.

According to one embodiment, the inorganic nanoparticle is a phosphor nanoparticle.

According to one embodiment, examples of phosphor nanoparticles include but are not limited to:

- rare earth doped garnets or garnets such as for example $Y_3Al_5O_{12}$, $Y_3Ga_5O_{12}$, $Y_3Fe_2(FeO_4)_3$, $Y_3Fe_5O_{12}$, $Y_4Al_2O_9$, $YAlO_3$, $RE_{3-n}Al_5O_{12}:Ce_n$ (RE=Y, Gd, Tb, Lu), $Gd_3Al_5O_{12}$, $Gd_3Ga_5O_{12}$, $Lu_3Al_5O_{12}$, $Fe_3Al_2(SiO_4)_3$, $(Lu_{(1-x-y)}A_xCe_y)_3B_zAl_5O_{12}C_{2z}$ with A=at least one of Sc, La, Gd, Tb or mixture thereof, B at least one of Mg, Sr, Ca, Ba or mixture thereof, C at least one of F, C, Br, I or mixture thereof, $0 \leq x \leq 0.5$, $0.001 \leq y \leq 0.2$, and $0.001 \leq z \leq 0.5$, $(Lu_{0.90}Gd_{0.07}Ce_{0.03})_3Sr_{0.34}Al_5O_{12}F_{0.68}$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, TAG, GAL, LuAG, YAG;
- doped nitrides such as europium doped $CaAlSiN_3$, $Sr(LiAl_3N_4)$:Eu, $SrMg_3SiN_4$:Eu, $La_3Si_6N_{11}$:Ce, (Ca, Sr)$AlSiN_3$:Eu, $(Ca_{0.2}Sr_{0.8})AlSiN_3$, $(Ca, Sr, Ba)_2Si_8N_8$:Eu;
- sulfide-based phosphors such as for example CaS:Eu, SrS:Eu;
- $A_2(MF_6)$: $Mn^{4+}$ wherein A comprises Na, K, Rb, Cs, or $NH_4$ and M comprises Si, Ti, Zr, or Mn, such as for example $Mn^{4+}$ doped potassium fluorosilicate (PFS), $K_2(SiF_6):Mn^{4+}$ or $K_2(TiF_6):Mn^{4+}$, $Na_2SnF_6:Mn^{4+}$, $Cs_2SnF_6:Mn^{4+}$, $Na_2SiF_6:Mn^{4+}$, $Na_2GeF_6:Mn^{4+}$;

- oxinitrides such as for example europium doped (Li, Mg, Ca, Y)-α-SiAlON, $SrAl_2Si_3ON_6$:Eu, $Eu_xSi_{6-z}Al_zO_yN_{8-y}$ (y=z−2x), $Eu_{0.018}Si_{5.77}Al_{0.23}O_{0.194}N_{7.806}$, $SrSi_2O_2N_2$:Eu, $Pr^{3+}$ activated β-SiAlON:Eu;
- silicates such as for example $A_2Si(OD)_4$:Eu with A=Sr, Ba, Ca, Mg, Zn or mixture thereof and D=F, Cl, S, N, Br or mixture thereof, $(SrBaCa)_2SiO_4$:Eu, $Ba_2MgSi_2O_7$:Eu, $Ba_2SiO_4$:Eu, $Sr_3SiO_5$, $(Ca,Ce)_3(Sc,Mg)_2Si_3O_{12}$;
- carbonitrides such as for example $Y_2Si_4N_6C$, $CsLnSi(CN_2)_4$:Eu with Ln=Y, La or Gd;
- oxycarbonitrides such as for example $Sr_2Si_5N_{8-[(4x/3)+z]}C_xO_{3z/2}$ where 0≤x≤5.0, 0.06≤x≤0.1 and x≠3z/2;
- europium aluminates such as for example $EuAl_6O_{10}$, $EuAl_2O_4$;
- barium oxides such as for example $Ba_{0.93}Eu_{0.07}Al_2O_4$;
- halogenated garnets such as for example $(Lu_{1-a-b-c}Y_aTb_bA_c)_3(Al_{1-d}B_d)_5(O_{1-e}C_e)_{12}$:Ce, Eu, where A is selected from the group consisting of Mg, Sr, Ca, Ba or mixture thereof; B is selected from the group consisting of Ga, In or mixture thereof; C is selected from the group consisting of F, Cl, Br or mixture thereof; and 0≤a≤1; 0≤b≤1; 0<c≤0.5; 0≤d≤1; and 0<e≤0.2;
- $((Sr_{1-z}M_z)_{1-(x+w)}A_wCe_x)_3(Al_{1-y}Si_y)O_{4+y+3(x-w)}F_{1-y-3(x-w)}$ wherein 0<x≤0.10, 0≤y≤0.5, 0≤z≤0.5, 0≤w≤x, A comprises Li, Na, K, Rb or mixture thereof; and M comprises Ca, Ba, Mg, Zn, Sn or mixture thereof, $(Sr_{0.98}Na_{0.01}Ce_{0.01})_3(Al_{0.9}Si_{0.1})O_{4.1}F_{0.9}$, $(Sr_{0.595}Ca_{0.4}Ce_{0.005})_3(Al_{0.6}Si_{0.4})O_{4.415}F_{0.585}$;
- $BaMgAl_{10}O_{17}$:Eu, $Sr_5(PO_4)_3Cl$:Eu, AlN:Eu, $LaSi_3N_5$:Ce, $SrSi_9Al_{19}ON_{31}$:Eu, $SrSi_{6-x}Al_xO_{1+x}N_{8-x}$:Eu;
- rare earth doped nanoparticles;
- doped nanoparticles;
- any phosphors known by the skilled artisan;
- or a mixture thereof.

According to one embodiment, examples of phosphor nanoparticles include but are not limited to:

- blue phosphors such as for example $BaMgAl_{10}O_{17}:Eu^{2+}$ or $Co^{2+}$, $Sr_5(PO_4)_3Cl:Eu^{2+}$, $AlN:Eu^{2+}$, $LaSi_3N_5:Ce^{3+}$, $SrSi_9Al_{19}ON_{31}:Eu^{2+}$, $SrSi_{6-x}Al_xO_{1+x}N_{8-x}:Eu^{2+}$;
- red phosphors such as for example $Mn^{4+}$ doped potassium fluorosilicate (PFS), carbidonitrides, nitrides, sulfides (CaS), $CaAlSiN_3:Eu^{3+}$, $(Ca,Sr)AlSiN_3:Eu^{3+}$, $(Ca, Sr, Ba)_2Si_5N_8:Eu^{3+}$, $SrLiAl_3N_4:Eu^{3+}$, $SrMg_3SiN_4:Eu^{3+}$, red emitting silicates;
- orange phosphors such as for example orange emitting silicates, Li, Mg, Ca, or Y doped α-SiAlON;
- green phosphors such as for example oxynitrides, carbidonitrides, green emitting silicates, LuAG, green GAL, green YAG, green GaYAG, β-SiAlON:$Eu^{2+}$, $SrSi_2O_2N_2:Eu^{2+}$; and
- yellow phosphors such as for example yellow emitting silicates, TAG, yellow YAG, $La_3Si_6N_{11}:Ce^{3+}$ (LSN), yellow GAL.

According to one embodiment, examples of phosphor nanoparticles include but are not limited to: blue phosphors; red phosphors; orange phosphors; green phosphors; and yellow phosphors.

According to one embodiment, the phosphor nanoparticle has an average size of at least 0.5 nm, 1 nm, 2 nm, 3 nm, 4 nm, 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the phosphor nanoparticle has an average size ranging from 0.1 μm to 50 μm.

According to one embodiment, the particle 2 comprises one phosphor nanoparticle.

According to one embodiment, the nanoparticles 3 is a scintillator nanoparticle.

According to one embodiment, examples of scintillator nanoparticles include but are not limited to: NaI(Tl) (thallium-doped sodium iodide), CsI(Tl), CsI(Na), CsI(pure), CsF, KI(Tl), LiI(Eu), $BaF_2$, $CaF_2$(Eu), ZnS(Ag), $CaWO_4$, $CdWO_4$, YAG(Ce) ($Y_3Al_5O_{12}$(Ce)), GSO, LSO, $LaCl_3$(Ce) (lanthanum chloride doped with cerium), $LaBr_3$(Ce) (cerium-doped lanthanum bromide), LYSO ($Lu_{1.8}Y_{0.2}SiO_5$(Ce)), or a mixture thereof.

According to one embodiment, the nanoparticle 3 is a metal nanoparticle (gold, silver, aluminum, magnesium, or copper, alloys).

According to one embodiment, the nanoparticle 3 is an inorganic semiconductor or insulator which can be coated with organic compounds.

According to one embodiment, the inorganic semiconductor or insulator can be, for instance, group IV semiconductors (for instance, Carbon, Silicon, Germanium), group III-V compound semiconductors (for instance, Gallium Nitride, Indium Phosphide, Gallium Arsenide), II-VI compound semiconductors (for instance, Cadmium Selenide, Zinc Selenide, Cadmium Sulfide, Mercury Telluride), inorganic oxides (for instance, Indium Tin Oxide, Aluminum Oxide, Titanium Oxide, Silicon Oxide), and other chalcogenides.

According to one embodiment, the inorganic nanoparticle is a semiconductor nanocrystal.

According to one embodiment, the semiconductor nanocrystal comprises a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; x, y, z and w are independently a decimal number from 0 to 5; x, y, z and w are not simultaneously equal to 0; x and y are not simultaneously equal to 0; z and w may not be simultaneously equal to 0.

According to one embodiment, the semiconductor nanocrystal comprises a core comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; x, y, z and w are independently a decimal number from 0 to 5; x, y, z and w are not simultaneously equal to 0; x and y are not simultaneously equal to 0; z and w may not be simultaneously equal to 0.

According to one embodiment, the semiconductor nanocrystal comprises a material of formula $M_xN_yE_zA_w$, wherein M and/or N is selected from the group consisting of Ib, IIa, IIb, IIIa, IIIb, IVa, IVb, Va, Vb, VIb, VIIb, VIII, or mixtures thereof; E and/or A is selected from the group consisting of Va, VIa, VIIa, or mixtures thereof; x, y, z and w are independently a decimal number from 0 to 5; x, y, z and w are not simultaneously equal to 0; x and y are not simultaneously equal to 0; z and w may not be simultaneously equal to 0.

According to one embodiment, the semiconductor nanocrystal comprises a material of formula $M_xE_y$, wherein M is selected from group consisting of Cd, Zn, Hg, Ge, Sn, Pb, Cu, Ag, Fe, In, Al, Ti, Mg, Ga, Tl, Mo, Pd, W, Cs, Pb, or a mixture thereof; x and y are independently a decimal number from 0 to 5, x and y are not simultaneously equal to 0.

According to one embodiment, the semiconductor nanocrystal comprises a material of formula $M_xE_y$, wherein E is selected from group consisting of S, Se, Te, O, P, C, N, As, Sb, F, Cl, Br, I, or a mixture thereof; x and y are independently a decimal number from 0 to 5, x and y are not simultaneously equal to 0.

According to one embodiment, the semiconductor nanocrystal is selected from the group consisting of a IIb-VIa, IVa-VIa, Ib-IIIa-VIa, IIb-IVa-Va, Ib-VIa, VIII-VIa, IIb-Va, IIIa-VIa, IVb-VIa, IIa-VIa, IIIa-Va, IIIa-VIa, VIb-VIa, and Va-VIa semiconductor.

According to one embodiment, the semiconductor nanocrystal comprises a material $M_xN_yE_zA_w$ selected from the group consisting of CdS, CdSe, CdTe, ZnS, ZnSe, ZnTe, HgS, HgSe, HgTe, HgO, GeS, GeSe, GeTe, SnS, SnSe, SnTe, PbS, PbSe, PbTe, $GeS_2$, $GeSe_2$, $SnS_2$, $SnSe_2$, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, InP, $Cd_3P_2$, $Zn_3P_2$, CdO, ZnO, FeO, $Fe_2O_3$, $Fe_3O_4$, $Al_2O_3$, $TiO_2$, MgO, MgS, MgSe, MgTe, AlN, AlP, AlAs, AlSb, GaN, GaP, GaAs, GaSb, InN, InP, InAs, InSb, TlN, TlP, TlAs, TlSb, $MoS_2$, PdS, $Pd_4S$, $WS_2$, $CsPbCl_3$, $PbBr_3$, $CsPbBr_3$, $CH_3NH_3PbI_3$, $CH_3NH_3PbCl_3$, $CH_3NH_3PbBr_3$, $CsPbI_3$, $FAPbBr_3$ (with FA formamidinium), or a mixture thereof.

According to one embodiment, the inorganic nanoparticle is a semiconductor nanoplatelet, nanosheet, nanoribbon, nanowire, nanodisk, nanocube, nanoring, magic size cluster, or sphere such as for example quantum dot.

According to one embodiment, the inorganic nanoparticle is a semiconductor nanoplatelet, nanosheet, nanoribbon, nanowire, nanodisk, nanocube, magic size cluster, or nanoring.

According to one embodiment, the inorganic nanoparticle comprises an initial nanocrystal.

According to one embodiment, the inorganic nanoparticle comprises an initial colloidal nanocrystal.

According to one embodiment, the inorganic nanoparticle comprises an initial nanoplatelet.

According to one embodiment, the inorganic nanoparticle comprises an initial colloidal nanoplatelet.

According to one embodiment, the inorganic nanoparticle is a core nanoparticle, wherein the core is not partially or totally covered with at least one shell comprising at least one layer of inorganic material.

According to one embodiment, the inorganic nanoparticle is a core nanocrystal, wherein the core is not partially or totally covered with a shell comprising at least one layer of inorganic material.

According to one embodiment, the inorganic nanoparticle is a core/shell nanoparticle, wherein the core is partially or totally covered with at least one shell comprising at least one layer of inorganic material.

According to one embodiment, the inorganic nanoparticle is a core 33/shell 34 nanocrystal, wherein the core 33 is partially or totally covered with at least one shell 34 comprising at least one layer of inorganic material.

According to one embodiment, the core/shell semiconductor nanocrystal comprises at least one shell 34 comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5;

x, y, z and w are not simultaneously equal to 0; x and y are not simultaneously equal to 0; z and w may not be simultaneously equal to 0.

According to one embodiment, the core/shell semiconductor nanocrystal comprises two shells (34, 35) comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

According to one embodiment, the shell 34 comprises a different material than the material of core 33.

According to one embodiment, the shell 34 comprises the same material than the material of core 33.

According to one embodiment, the shells (34, 35) comprise different materials.

According to one embodiment, the shells (34, 35) comprise the same material.

According to one embodiment, the core/shell semiconductor nanocrystal comprises at least one shell comprising a material of formula $M_xN_yE_zA_w$, wherein M, N, E and A are as described hereabove.

According to one embodiment, examples of core/shell semiconductor nanocrystals include but are not limited to: CdSe/CdS, CdSe/$Cd_xZn_{1-x}S$, CdSe/CdS/ZnS, CdSe/ZnS/CdS, CdSe/ZnS, CdSe/$Cd_xZn_{1-x}S$/ZnS, CdSe/ZnS/$Cd_xZn_{1-x}S$, CdSe/CdS/$Cd_xZn_{1-x}S$, CdSe/ZnSe/ZnS, CdSe/ZnSe/$Cd_xZn_{1-x}S$, $CdSe_xS_{1-x}$/CdS, $CdSe_xSi_{1-x}$/CdZnS, $CdSe_xS_{1-x}$/CdS/ZnS, $CdSe_xS_{1-x}$/ZnS/CdS, $CdSe_xS_{1-x}$/ZnS, $CdSe_xS_{1-x}$/$Cd_xZn_{1-x}S$/ZnS, $CdSe_xS_{1-x}$/ZnS/$Cd_xZn_{1-x}S$, $CdSe_xS_{1-x}$/CdS/$Cd_xZn_{1-x}S$, $CdSe_xS_{1-x}$/ZnSe/ZnS, $CdSe_xS_{1-x}$/ZnSe/$Cd_xZn_{1-x}S$, InP/CdS, InP/CdS/ZnSe/ZnS, InP/$Cd_xZn_{1-x}S$, InP/CdS/ZnS, InP/ZnS/CdS, InP/ZnS, InP/$Cd_xZn_{1-x}S$/ZnS, InP/ZnS/$Cd_xZn_{1-x}S$, InP/CdS/$Cd_xZn_{1-x}S$, InP/ZnSe, InP/ZnSe/ZnS, InP/ZnSe/$Cd_xZn_{1-x}S$, InP/$ZnSe_xS_{1-x}$, InP/GaP/ZnS, $In_xZn_{1-x}P$/ZnS, $In_xZn_{1-x}P$/ZnS, InP/GaP/ZnSe, InP/ZnS/ZnSe, InP/GaP/ZnSe/ZnS, InP/ZnS/ZnSe/ZnS, wherein x is a decimal number from 0 to 1.

According to one embodiment, the core/shell semiconductor nanocrystal is ZnS rich, i.e., the last monolayer of the shell is a ZnS monolayer.

According to one embodiment, the core/shell semiconductor nanocrystal is CdS rich, i.e., the last monolayer of the shell is a CdS monolayer.

According to one embodiment, the core/shell semiconductor nanocrystal is $Cd_xZn_{1-x}S$ rich, i.e., the last monolayer of the shell is a $Cd_xZn_{1-x}S$ monolayer, wherein x is a decimal number from 0 to 1.

According to one embodiment, the last atomic layer of the semiconductor nanocrystal is a cation-rich monolayer of cadmium, zinc or indium.

According to one embodiment, the last atomic layer of the semiconductor nanocrystal is an anion-rich monolayer of sulfur, selenium or phosphorus.

According to one embodiment, the inorganic nanoparticle is a core/crown semiconductor nanocrystal.

According to one embodiment, the core/crown semiconductor nanocrystal comprises at least one crown 37 comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

According to one embodiment, the core/crown semiconductor nanocrystal comprises at least one crown comprising a material of formula $M_xN_yE_zA_w$, wherein M, N, E and A are as described hereabove.

According to one embodiment, the crown 37 comprises a different material than the material of core 33.

According to one embodiment, the crown 37 comprises the same material than the material of core 33.

According to one embodiment, the semiconductor nanocrystal is atomically flat. In this embodiment, the atomically flat semiconductor nanocrystal may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, the semiconductor nanocrystal comprises an atomically flat core.

In this embodiment, the atomically flat core may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, the semiconductor nanocrystal is a semiconductor nanoplatelet.

According to one embodiment, the nanoparticles 3 comprise at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the inorganic nanoparticles comprise at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the semiconductor nanocrystals comprise at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the particle 1 comprises at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the particle 2 comprises at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the semiconductor nanoplatelet is atomically flat. In this embodiment, the atomically flat nanoplatelet may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, the semiconductor nanocrystal comprises an initial nanoplatelet.

According to one embodiment, the semiconductor nanocrystal comprises an initial colloidal nanoplatelet.

According to one embodiment, the semiconductor nanoplatelet is quasi-2D.

According to one embodiment, the semiconductor nanoplatelet comprises an atomically flat core.

In this embodiment, the atomically flat core may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence, or any other characterization means known by the person skilled in the art.

According to one embodiment, the semiconductor nanoplatelet is 2D-shaped.

According to one embodiment, the semiconductor nanoplatelet has a thickness tuned at the atomic level.

According to one embodiment, the semiconductor nanoplatelet comprises an initial nanocrystal.

According to one embodiment, the semiconductor nanoplatelet comprises an initial colloidal nanocrystal.

According to one embodiment, the semiconductor nanoplatelet comprises an initial nanoplatelet.

According to one embodiment, the semiconductor nanoplatelet comprises an initial colloidal nanoplatelet.

According to one embodiment, the core 33 of the semiconductor nanoplatelet is an initial nanoplatelet.

According to one embodiment, the initial nanoplatelet comprises a material of formula $M_xN_yE_zA_w$, wherein M, N, E and A are as described hereabove.

According to one embodiment, the thickness of the initial nanoplatelet comprises an alternate of atomic layers of M and E.

According to one embodiment, the thickness of the initial nanoplatelet comprises an alternate of atomic layers of M, N, A and E.

According to one embodiment, a semiconductor nanoplatelet comprises an initial nanoplatelet partially or completely covered with at least one layer of additional material.

According to one embodiment, the at least one layer of additional material comprises a material of formula $M_xN_yE_zA_w$, wherein M, N, E and A are as described hereabove.

According to one embodiment, a semiconductor nanoplatelet comprises an initial nanoplatelet partially or completely covered on a least one facet by at least one layer of additional material.

In one embodiment wherein several layers cover all or part of the initial nanoplatelet, these layers can be composed of the same material or composed of different materials.

In one embodiment wherein several layers cover all or part of the initial nanoplatelet, these layers can be composed such as to form a gradient of materials.

In one embodiment, the initial nanoplatelet is an inorganic colloidal nanoplatelet.

In one embodiment, the initial nanoplatelet comprised in the semiconductor nanoplatelet has preserved its 2D structure.

In one embodiment, the material covering the initial nanoplatelet is inorganic.

In one embodiment, at least one part of the semiconductor nanoplatelet has a thickness greater than the thickness of the initial nanoplatelet.

In one embodiment, the semiconductor nanoplatelet comprises the initial nanoplatelet totally covered with at least one layer of material.

In one embodiment, the semiconductor nanoplatelet comprises the initial nanoplatelet totally covered with a first layer of material, said first layer being partially or completely covered with at least a second layer of material.

In one embodiment, the initial nanoplatelet has a thickness of at least 0.3 nm, 0.4 nm, 0.5 nm, 0.6 nm, 0.7 nm, 0.8 nm, 0.9 nm, 1.0 nm, 1.1 nm, 1.2 nm, 1.3 nm, 1.4 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, or 500 nm.

According to one embodiment, the thickness of the initial nanoplatelet is smaller than at least one of the lateral dimensions (length or width) of the initial nanoplatelet by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100; at least 150; at least 200; at least 250; at least 300; at least 350; at least 400; at least 450; at least 500; at least 550; at least 600; at least 650; at least 700; at least 750; at least 800; at least 850; at least 900; at least 950; or at least 1000.

In one embodiment, the initial nanoplatelet has lateral dimensions of at least 2 nm, 3 nm, 4 nm, 5 nm, 6 nm, 7 nm, 8 nm, 9 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 m, 14 μm, 14.5 μm, 15 μm, 15.5 μm, 16 μm, 16.5 μm, 17 μm, 17.5 μm, 18 μm, 18.5 μm, 19 m, 19.5 μm, 20 μm, 20.5 μm, 21 μm, 21.5 μm, 22 μm, 22.5 μm, 23 μm, 23.5 μm, 24 μm, 24.5 m, 25 μm, 25.5

µm, 26 µm, 26.5 µm, 27 µm, 27.5 µm, 28 µm, 28.5 µm, 29 µm, 29.5 µm, 30 m, 30.5 µm, 31 µm, 31.5 µm, 32 µm, 32.5 µm, 33 µm, 33.5 µm, 34 µm, 34.5 µm, 35 µm, 35.5 m, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 250 µm, 300 µm, 350 µm, 400 µm, 450 µm, 500 µm, 550 µm, 600 µm, 650 µm, 700 µm, 750 µm, 800 µm, 850 µm, 900 µm, 950 µm, or 1 mm.

According to one embodiment, the semiconductor nanoplatelet has a thickness of at least 0.3 nm, 0.4 nm, 0.5 nm, 0.6 nm, 0.7 nm, 0.8 nm, 0.9 nm, 1.0 nm, 1.1 nm, 1.2 nm, 1.3 nm, 1.4 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, or 500 nm.

According to one embodiment, the semiconductor nanoplatelet has lateral dimensions of at least 2 nm, 3 nm, 4 nm, 5 nm, 6 nm, 7 nm, 8 nm, 9 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 250 µm, 300 µm, 350 µm, 400 µm, 450 µm, 500 µm, 550 µm, 600 µm, 650 µm, 700 µm, 750 µm, 800 µm, 850 µm, 900 µm, 950 µm, or 1 mm.

According to one embodiment, the thickness of the semiconductor nanoplatelet is smaller than at least one of the lateral dimensions (length or width) of the semiconductor nanoplatelet by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100; at least 150; at least 200; at least 250; at least 300; at least 350; at least 400; at least 450; at least 500; at least 550; at least 600; at least 650; at least 700; at least 750; at least 800; at least 850; at least 900; at least 950; or at least 1000.

According to one embodiment, the semiconductor nanoplatelet is obtained by a process of growth in the thickness of at least one face of at least one initial nanoplatelet by deposition of a film or a layer of material on the surface of the at least one initial nanoplatelet; or a process lateral growth of at least one face of at least one initial nanoplatelet by deposition of a film or a layer of material on the surface of the at least one initial nanoplatelet; or any methods known by the person skilled in the art.

In one embodiment, the semiconductor nanoplatelet can comprise the initial nanoplatelet and 1, 2, 3, 4, 5 or more layers covering all or part of the initial nanoplatelet, said layers begin of same composition as the initial nanoplatelet or being of different composition than the initial nanoplatelet or being of different composition one another.

In one embodiment, the semiconductor nanoplatelet can comprise the initial nanoplatelet and at least 1, 2, 3, 4, 5 or more layers in which the first deposited layer covers all or part of the initial nanoplatelet and the at least second deposited layer covers all or part of the previously deposited layer, said layers being of same composition as the initial nanoplatelet or being of different composition than the initial nanoplatelet and possibly of different compositions one another.

According to one embodiment, the semiconductor nanoplatelet has a thickness quantified by a $M_xN_yE_zA_w$ monolayer, wherein M, N, E and A are as described hereabove.

According to one embodiment, the core 33 of the semiconductor nanoplatelet has a thickness of at least 1 $M_xN_yE_zA_w$ monolayer, at least 2 $M_xN_yE_zA_w$ monolayers, at least 3 $M_xN_yE_zA_w$ monolayers, at least 4 $M_xN_yE_zA_w$ monolayers, at least 5 $M_xN_yE_zA_w$ monolayers, wherein M, N, E and A are as described hereabove.

According to one embodiment, the shell 34 of the semiconductor nanoplatelet has a thickness quantified by a $M_xN_yE_zA_w$ monolayer, wherein M, N, E and A are as described hereabove, wherein M, N, E and A are as described hereabove.

According to one embodiment, the photoluminescence of the at least one nanoparticle 3 is preserved after encapsulation in the particle 2 and after encapsulation of said particle 2 in the particle 1.

According to one embodiment, the size ratio between the particle 1 and the particle 2 ranges from 10 to 2 000, preferably from 10 to 1 500, more preferably from 10 to 1 000, even more preferably from 10 to 500.

According to one embodiment, the size ratio between the particle 1 and the at least one nanoparticle 3 ranges from 12 to 100 000, preferably from 50 to 50 000, more preferably from 100 to 10 000, even more preferably from 200 to 1 000.

According to one embodiment, the size ratio between the particle 2 and the at least one nanoparticle 3 ranges from 1.25 to 1 000, preferably from 2 to 500, more preferably from 5 to 250, even more preferably from 5 to 100.

According to one embodiment illustrated in FIG. 11, the particle 1 is encapsulated in a bigger particle or a bead 8, wherein said bead 8 comprises a third material 81 and the particle 1 is dispersed in said third material 81.

According to one embodiment, the bead 8 is air processable. This embodiment is particularly advantageous for the manipulation or the transport of said bead 8 and for the use of said bead 8 in a device such as an optoelectronic device.

According to one embodiment, the bead 8 is compatible with standard lithography processes.

This embodiment is particularly advantageous for the use of said bead 8 in a device such as an optoelectronic device.

According to one embodiment, the bead 8 is a colloidal particle.

According to one embodiment, the bead 8 is fluorescent.

According to one embodiment, the bead 8 is fluorescent.

According to one embodiment, the bead 8 is phosphorescent.

According to one embodiment, the bead 8 is electroluminescent.

According to one embodiment, the bead 8 is chemiluminescent.

According to one embodiment, the bead 8 is triboluminescent.

According to one embodiment, the features of the light emission of bead 8 are sensible to external pressure variations. In this embodiment, "sensible" means that the features of the light emission can be modified by external pressure variations.

According to one embodiment, the wavelength emission peak of bead 8 is sensible to external pressure variations. In this embodiment, "sensible" means that the wavelength emission peak can be modified by external pressure variations, i.e., external pressure variations can induce a wavelength shift.

According to one embodiment, the FWHM of bead 8 is sensible to external pressure variations.

In this embodiment, "sensible" means that the FWHM can be modified by external pressure variations, i.e., FWHM can be reduced or increased.

According to one embodiment, the PLQY of bead 8 is sensible to external pressure variations. In this embodiment, "sensible" means that the PLQY can be modified by external pressure variations, i.e., PLQY can be reduced or increased.

According to one embodiment, the features of the light emission of bead 8 are sensible to external temperature variations.

According to one embodiment, the wavelength emission peak of bead 8 is sensible to external temperature variations. In this embodiment, "sensible" means that the wavelength emission peak can be modified by external temperature variations, i.e., external temperature variations can induce a wavelength shift.

According to one embodiment, the FWHM of bead 8 is sensible to external temperature variations. In this embodiment, "sensible" means that the FWHM can be modified by external temperature variations, i.e., FWHM can be reduced or increased.

According to one embodiment, the PLQY of bead 8 is sensible to external temperature variations. In this embodiment, "sensible" means that the PLQY can be modified by external temperature variations, i.e., PLQY can be reduced or increased.

According to one embodiment, the features of the light emission of bead 8 are sensible to external variations of pH.

According to one embodiment, the wavelength emission peak of bead 8 is sensible to external variations of pH. In this embodiment, "sensible" means that the wavelength emission peak can be modified by external variations of pH, i.e., external variations of pH can induce a wavelength shift.

According to one embodiment, the FWHM of bead 8 is sensible to e external variations of pH. In this embodiment, "sensible" means that the FWHM can be modified by external variations of pH, i.e., FWHM can be reduced or increased.

According to one embodiment, the PLQY of bead 8 is sensible to external variations of pH. In this embodiment, "sensible" means that the PLQY can be modified by external variations of pH, i.e., PLQY can be reduced or increased.

According to one embodiment, the bead 8 exhibits an emission spectrum with at least one emission peak, wherein said emission peak has a maximum emission wavelength ranging from 400 nm to 50 am.

According to one embodiment, the bead 8 exhibits an emission spectrum with at least one emission peak, wherein said emission peak has a maximum emission wavelength ranging from 400 nm to 500 nm. In this embodiment, the bead 8 emits blue light.

According to one embodiment, the bead 8 exhibits an emission spectrum with at least one emission peak, wherein said emission peak has a maximum emission wavelength ranging from 500 nm to 560 nm, more preferably ranging from 515 nm to 545 nm. In this embodiment, the bead 8 emits green light.

According to one embodiment, the bead 8 exhibits an emission spectrum with at least one emission peak, wherein said emission peak has a maximum emission wavelength ranging from 560 nm to 590 nm. In this embodiment, the bead 8 emits yellow light.

According to one embodiment, the bead 8 exhibits an emission spectrum with at least one emission peak, wherein said emission peak has a maximum emission wavelength ranging from 590 nm to 750 nm, more preferably ranging from 610 nm to 650 nm. In this embodiment, the bead 8 emits red light.

According to one embodiment, the bead 8 exhibits an emission spectrum with at least one emission peak, wherein said emission peak has a maximum emission wavelength ranging from 750 nm to 50 μm. In this embodiment, the bead 8 emits near infra-red, mid-infra-red, or infra-red light.

According to one embodiment, the bead 8 exhibits emission spectra with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the bead 8 exhibits emission spectra with at least one emission peak having a full width half maximum strictly lower than 40 nm, 30 nm, 25 nm, 20 nm, 15 nm, or 10 nm.

According to one embodiment, the bead 8 exhibits emission spectra with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the bead 8 exhibits emission spectra with at least one emission peak having a full width at quarter maximum strictly lower than 40 nm, 30 nm, 25 nm, 20 nm, 15 nm, or 10 nm.

According to one embodiment, the bead 8 has a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99% or 100%.

According to one embodiment, the bead 8 absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the bead 8 has an average fluorescence lifetime of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, or 1 μsecond.

In one embodiment, the bead 8 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$. In one preferred embodiment, the bead 8 exhibits photoluminescence quantum yield (PQLY) decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the bead 8 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one preferred embodiment, the bead 8 exhibits FCE decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the bead 8 has a size above 50 nm.

According to one embodiment, the bead 8 has a size of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, a statistical set of bead 8 has an average size of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the bead 8 has a largest dimension of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the bead 8 has a smallest dimension of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70

μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the smallest dimension of the bead 8 is smaller than the largest dimension of said bead 8 by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100; at least 150; at least 200; at least 250; at least 300; at least 350; at least 400; at least 450; at least 500; at least 550; at least 600; at least 650; at least 700; at least 750; at least 800; at least 850; at least 900; at least 950; or at least 1000.

According to one embodiment, the bead 8 has a smallest curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the bead 8 has a largest curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, in a statistical set of beads 8, said beads 8 are polydisperse.

According to one embodiment, in a statistical set of beads 8, said beads 8 are monodisperse.

According to one embodiment, in a statistical set of beads 8, said beads 8 have a narrow size distribution.

According to one embodiment, in a statistical set of beads 8, said beads 8 are not aggregated.

According to one embodiment, the surface roughness of the bead 8 is less or equal to 0%, 0.0001%, 0.0002%, 0.0003%, 0.0004%, 0.0005%, 0.0006%, 0.0007%, 0.0008%, 0.0009%, 0.001%, 0.002%, 0.003%, 0.004%, 0.005%, 0.006%, 0.007%, 0.008%, 0.009%, 0.01%, 0.02%, 0.03%, 0.04%, 0.05%, 0.06%, 0.07%, 0.08%, 0.09%, 0.1%, 0.11%, 0.12%, 0.13%, 0.14%, 0.15%, 0.16%, 0.17%, 0.18%, 0.19%, 0.2%, 0.21%, 0.22%, 0.23%, 0.24%, 0.25%, 0.26%, 0.27%, 0.28%, 0.29%, 0.3%, 0.31%, 0.32%, 0.33%, 0.34%, 0.35%, 0.36%, 0.37%, 0.38%, 0.39%, 0.4%, 0.41%, 0.42%, 0.43%, 0.44%, 0.45%, 0.46%, 0.47%, 0.48%, 0.49%, 0.5%, 1%, 1.5%, 2%, 2.5% 3%, 3.5%, 4%, 4.5%, or 5% of the largest dimension of said bead 8, meaning that the surface of said bead 8 is completely smooth.

According to one embodiment, the surface roughness of the bead 8 is less or equal to 0.5% of the largest dimension of said bead 8, meaning that the surface of said bead 8 is completely smooth.

According to one embodiment, the bead 8 has a spherical shape, an ovoid shape, a discoidal shape, a cylindrical shape, a faceted shape, a hexagonal shape, a triangular shape, a cubic shape, or a platelet shape.

According to one embodiment, the bead 8 has a raspberry shape, a prism shape, a polyhedron shape, a snowflake shape, a flower shape, a thorn shape, a hemisphere shape, a cone shape, a urchin shape, a filamentous shape, a biconcave discoid shape, a worm shape, a tree shape, a dendrite shape, a necklace shape, a chain shape, or a bush shape.

According to one embodiment, the bead 8 has a spherical shape.

According to one embodiment, the spherical bead 8 has a diameter of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 jam, 700 μm, 750 μm, 800 μm, 850 μm, 900 μm, 950 μm, or 1 mm.

According to one embodiment, a statistical set of spherical bead 8 has an average diameter of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the average diameter of a statistical set of spherical bead 8 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 20%, 30%, 40%, 50%, 60%, 70%, 80%, 85%, 90%, 95%, 100%, 105%, 110%, 115%, 120%, 125%, 130%, 135%, 140%, 145%, 150%, 155%, 160%, 165%, 170%, 175%, 180%, 185%, 190%, 195%, or 200%.

According to one embodiment, the spherical bead 8 has a unique curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 m$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$, 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, a statistical set of the spherical beads 8 has an average unique curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$, 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the curvature of the spherical bead 8 has no deviation, meaning that said bead 8 has a perfect spherical shape. A perfect spherical shape prevents fluctuations of the intensity of the scattered light.

According to one embodiment, the unique curvature of the spherical bead 8 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, or 10% along the surface of said bead 8.

Bead 8 with an average size less than 1 μm have several advantages compared to bigger particles comprising the same number of particles 1: i) increasing the light scattering compared to bigger particles; ii) obtaining more stable colloidal suspensions compared to bigger particles, when they are dispersed in a solvent; iii) having a size compatible with pixels of at least 100 nm.

Bead 8 with an average size larger than 1 μm have several advantages compared to smaller particles comprising the same number of particles 1: i) reducing light scattering compared to smaller particles; ii) having whispering-gallery wave modes; iii) having a size compatible with pixels larger than or equal to 1 μm; iv) increasing the average distance between nanoparticles 3 comprised in the particle 1, resulting in a better heat draining; v) increasing the average distance between nanoparticles 3 comprised in the particle 1 and the surface of said particle 1, thus better protecting the nanoparticles 3 against oxidation, or delaying oxidation resulting from a chemical reaction with chemical species coming from the outer space of said particle 1; vi) increasing the mass ratio between the particle 1 and nanoparticle 3 comprised in the particle 1 compared to smaller particles 1, thus reducing the mass concentration of chemical elements subject to ROHS standards, making it easier to comply with ROHS requirements.

According to one embodiment, the bead 8 is ROHS compliant.

According to one embodiment, the bead 8 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the bead 8 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the bead 8 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the bead 8 comprises heavier chemical elements than the main chemical element present in the third material 81. In this embodiment, said heavy chemical elements in the bead 8 will lower the mass concentration of chemical elements subject to ROHS standards, allowing said bead 8 to be ROHS compliant.

According to one embodiment, examples of heavy chemical elements include but are not limited to B, C, N, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Tc, Ru, Rh, Pd, Ag, Cd, In, Sn, Sb, Te, I, Cs, Ba, La, Hf, Ta, W, Re, Os, Ir, Pt, Au, Hg, Tl, Pb, Bi, Po, At, Ce, Pr, Nd, Pm, Sm, Eu, Gd, Tb, Dy, Ho, Er, Tm, Yb, Lu or a mixture of thereof.

According to one embodiment, the bead 8 exhibits at least one other property so that the bead 8 is also: magnetic; ferromagnetic; paramagnetic; superparamagnetic; diamagnetic; plasmonic; piezo-electric; pyro-electric; ferro-electric; drug delivery featured; a light scatterer; an electrical insulator; an electrical conductor; a thermal insulator; a thermal conductor; and/or a local high temperature heating system.

According to one embodiment, the bead 8 exhibits at least one other property comprising one or more of the following: capacity of increasing local electromagnetic field, magnetization, magnetic coercivity, catalytic yield, catalytic properties, photovoltaic properties, photovoltaic yield, electrical polarization, thermal conductivity, electrical conductivity, permeability to molecular oxygen, permeability to molecular water, or any other properties.

According to one embodiment, the bead 8 is an electrical insulator. In this embodiment, the quenching of fluorescent properties for fluorescent nanoparticles 3 encapsulated in the second material 21 is prevented when it is due to electron transport. In this embodiment, the bead 8 may be used as an electrical insulator material exhibiting the same properties as the nanoparticles 3 encapsulated in the second material 21.

According to one embodiment, the bead 8 is an electrical conductor. This embodiment is particularly advantageous for an application of the particle 1 in photovoltaics or LEDs.

According to one embodiment, the bead 8 has an electrical conductivity at standard conditions ranging from $1\times10^{-20}$ to $10^7$ S/m, preferably from $1\times10^{-15}$ to 5 S/m, more preferably from $1\times10^{-7}$ to 1 S/m.

According to one embodiment, the bead 8 has an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the bead 8 may be measured for example with an impedance spectrometer.

According to one embodiment, the bead 8 is a thermal insulator.

According to one embodiment, the bead 8 is a thermal conductor. In this embodiment, the bead 8 is capable of draining away the heat originating from the particle 1, or from the environment.

According to one embodiment, the bead 8 has a thermal conductivity at standard conditions ranging from 0.1 to 450 W/(m·K), preferably from 1 to 200 W/(m·K), more preferably from 10 to 150 W/(m·K).

According to one embodiment, the bead 8 has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the thermal conductivity of the bead 8 may be measured for example by steady-state methods or transient methods.

According to one embodiment, the bead 8 is hydrophobic.

According to one embodiment, the bead 8 is hydrophilic.

According to one embodiment, the bead 8 is surfactant-free. In this embodiment, the surface of the bead 8 will be easy to functionalize as said surface will not be blocked by any surfactant molecule.

According to one embodiment, the bead 8 is not surfactant-free.

According to one embodiment, the bead 8 is amorphous.

According to one embodiment, the bead 8 is crystalline.

According to one embodiment, the bead 8 is totally crystalline.

According to one embodiment, the bead 8 is partially crystalline.

According to one embodiment, the bead 8 is monocrystalline.

According to one embodiment, the bead 8 is polycrystalline. In this embodiment, the bead 8 comprises at least one grain boundary.

According to one embodiment, the bead 8 is porous.

According to one embodiment, the bead 8 is considered porous when the quantity adsorbed by the bead 8 determined by adsorption-desorption of nitrogen in the Brunauer-Emmett-Teller (BET) theory is more than 20 $cm^3/g$, 15 $cm^3/g$, 10 $cm^3/g$, 5 $cm^3/g$ at a nitrogen pressure of 650 mmHg, preferably 700 mmHg.

According to one embodiment, the organization of the porosity of the bead 8 can be hexagonal, vermicular or cubic.

According to one embodiment, the organized porosity of the bead 8 has a pore size of at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, or 50 nm.

According to one embodiment, the bead 8 is not porous.

According to one embodiment, the bead 8 does not comprise pores or cavities.

According to one embodiment, the bead 8 is considered non-porous when the quantity adsorbed by said bead 8 determined by adsorption-desorption of nitrogen in the Brunauer-Emmett-Teller (BET) theory is less than 20 $cm^3/g$, 15 $cm^3/g$, 10 $cm^3/g$, 5 $cm^3/g$ at a nitrogen pressure of 650 mmHg, preferably 700 mmHg.

According to one embodiment, the bead 8 is permeable.

According to one embodiment, the permeable bead 8 has an intrinsic permeability to fluids higher or equal to $10^{-11}$ $cm^2$, $10^{-10}$ $cm^2$, $10^{-9}$ $cm^2$, $10^{-8}$ $cm^2$, $10^{-7}$ $cm^2$, $10^{-6}$ $cm^2$, $10^{-5}$ $cm^2$, 101 $cm^2$, or $10^{-3}$ $cm^2$.

According to one embodiment, the bead 8 is impermeable to outer molecular species, gas or liquid. In this embodiment, outer molecular species, gas or liquid refers to molecular species, gas or liquid external to said bead 8.

According to one embodiment, the impermeable bead 8 has an intrinsic permeability to fluids less or equal to $10^{-11}$ $cm^2$, $10^{-12}$ $cm^2$, $10^{-13}$ $cm^2$, $10^{-14}$ $cm^2$, or $10^{-15}$ $cm^2$.

According to one embodiment, the bead 8 has an oxygen transmission rate ranging from $10^{-7}$ to 10 $cm^3 \cdot m^{-2} \cdot day^{-1}$, preferably from $10^{-7}$ to 1 $cm^3 \cdot m^{-2} \cdot day^{-1}$, more preferably from $10^{-7}$ to $10^{-1}$ $cm^3 \cdot m^{-2} \cdot day^{-1}$, even more preferably from $10^{-7}$ to $10^{-4}$ $cm^3 \cdot m^{-2} \cdot day^{-1}$ at room temperature.

According to one embodiment, the bead 8 has a water vapor transmission rate ranging from $10^{-7}$ to 10 $g \cdot m^2 \cdot day^{-1}$, preferably from $10^{-7}$ to 1 $g \cdot m^2 \cdot day^{-1}$, more preferably from $10^{-7}$ to $10^{-1}$ $g \cdot m^{-2} \cdot day^{-1}$, even more preferably from $10^{-7}$ to $10^{-4}$ $g \cdot m^{-2} \cdot day^{-1}$ at room temperature. A water vapor transmission rate of $10^{-6}$ $g \cdot m^{-2} \cdot day^{-1}$ is particularly adequate for a use on LED.

According to one embodiment, the bead 8 is optically transparent, i.e., the bead 8 is transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

According to one embodiment, the bead 8 comprises at least one particle 1 dispersed in the third material 81.

According to one embodiment, the bead 8 does not comprise only one particle 1 dispersed in the third material 81. In this embodiment, the bead 8 is not a core/shell particle wherein the particle 1 is the core with a shell of the third material 81.

According to one embodiment, the bead 8 comprises at least two particles 1 dispersed in the third material 81.

According to one embodiment, the bead 8 comprises a plurality of particles 1 dispersed in the third material 81.

According to one embodiment, the bead 8 comprises at least 1, at least 2, at least 3, at least 4, at least 5, at least 6, at least 7, at least 8, at least 9, at least 10, at least 11, at least 12, at least 13, at least 14, at least 15, at least 16, at least 17, at least 18, at least 19, at least 20, at least 21, at least 22, at least 23, at least 24, at least 25, at least 26, at least 27, at least 28, at least 29, at least 30, at least 31, at least 32, at least 33, at least 34, at least 35, at least 36, at least 37, at least 38, at least 39, at least 40, at least 41, at least 42, at least 43, at least 44, at least 45, at least 46, at least 47, at least 48, at least 49, at least 50, at least 51, at least 52, at least 53, at least 54, at least 55, at least 56, at least 57, at least 58, at least 59, at least 60, at least 61, at least 62, at least 63, at least 64, at least 65, at least 66, at least 67, at least 68, at least 69, at least 70, at least 71, at least 72, at least 73, at least 74, at least 75, at least 76, at least 77, at least 78, at least 79, at least 80, at least 81, at least 82, at least 83, at least 84, at least 85, at least 86, at least 87, at least 88, at least 89, at least 90, at least 91, at least 92, at least 93, at least 94, at least 95, at least 96, at least 97, at least 98, at least 99, at least 100, at least 200, at least 300, at least 400, at least 500, at least 600, at least 700, at least 800, at least 900, at least 1000, at least 1500, at least 2000, at least 2500, at least 3000, at least 3500, at least 4000, at least 4500, at least 5000, at least 5500, at least 6000, at least 6500, at least 7000, at least 7500, at least 8000, at least 8500, at least 9000, at least 9500, at least 10000, at least 15000, at least 20000, at least 25000, at least 30000, at least 35000, at least 40000, at least 45000, at least 50000, at least 55000, at least 60000, at least 65000, at least 70000, at least 75000, at least 80000, at least 85000, at least 90000, at least 95000, or at least 100000 particles 1 dispersed in the third material 81.

According to one embodiment, the particle 1 is totally surrounded by or encapsulated in the third material 81.

According to one embodiment, the particle 1 is partially surrounded by or encapsulated in the third material 81.

According to one embodiment, the particle 1 represents at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99% by weight of the bead 8.

According to one embodiment, the loading charge of the particle 1 in the bead 8 is at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the loading charge of the particle 1 in the bead 8 is less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the particle 1 comprised in the bead 8 have a packing fraction of at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the particles 1 comprised in the same bead 8 are not aggregated.

According to one embodiment, the particles 1 comprised in the same bead 8 do not touch, are not in contact.

According to one embodiment, the particles 1 comprised in the same bead 8 are separated by third material 81.

According to one embodiment, the particles 1 comprised in the same bead 8 are aggregated.

According to one embodiment, the particles 1 comprised in the same bead 8 touch, are in contact.

According to one embodiment, the particle 1 comprised in the same bead 8 can be individually evidenced.

According to one embodiment, the particle 1 comprised in the same bead 8 can be individually evidenced by transmission electron microscopy or fluorescence scanning microscopy, or any other characterization means known by the person skilled in the art.

According to one embodiment, the plurality of particles 1 is uniformly dispersed in the third material 81.

The uniform dispersion of the plurality of particles 1 in the third material 81 comprised in the bead 8 prevents the aggregation of said particles 1, thereby preventing the degradation of their properties. For example, in the case of inorganic fluorescent particles, a uniform dispersion will allow the optical properties of said particles to be preserved, and quenching can be avoided.

According to one embodiment, the particles 1 comprised in a bead 8 are uniformly dispersed within the third material 81 comprised in said bead 8.

According to one embodiment, the particles 1 comprised in a bead 8 are dispersed within the third material 81 comprised in said bead 8.

According to one embodiment, the particles 1 comprised in a bead 8 are uniformly and evenly dispersed within the third material 81 comprised in said bead 8.

According to one embodiment, the particles 1 comprised in a bead 8 are evenly dispersed within the third material 81 comprised in said bead 8.

According to one embodiment, the particles 1 comprised in a bead 8 are homogeneously dispersed within the third material 81 comprised in said bead 8.

According to one embodiment, the dispersion of particles 1 in the third material 81 does not have the shape of a ring, or a monolayer.

According to one embodiment, each particle 1 of the plurality of particles 1 is spaced from its adjacent particle 1 by an average minimal distance.

According to one embodiment, the average minimal distance between two particles 1 is controlled.

According to one embodiment, the average minimal distance is at least 1 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two particles 1 in the same bead 8 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two particles 1 in the same bead 8 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 15%, 20%, 25%, 30%, 35%, 40%, 45%, or 50%.

According to one embodiment, the bead 8 comprises a combination of at least two different particles 1. In this embodiment, the resulting bead 8 will exhibit different properties.

In a preferred embodiment, the bead 8 comprises at least two different particles 1, wherein at least one particle 1 emits at a wavelength in the range from 500 to 560 nm, and at least one particle 1 emits at a wavelength in the range from 600 to 2500 nm. In this embodiment, the bead 8 comprises at least one particle 1 emitting in the green region of the visible spectrum and at least one particle 1 emitting in the red region of the visible spectrum, thus the bead 8 paired with a blue LED will be a white light emitter.

In a preferred embodiment, the bead 8 comprises at least two different particles 1, wherein at least one particle 1 emits at a wavelength in the range from 400 to 490 nm, and at least one particle 1 emits at a wavelength in the range from 600 to 2500 nm. In this embodiment, the bead 8 comprises at least one particle 1 emitting in the blue region of the visible spectrum and at least one particle 1 emitting in the red region of the visible spectrum, thus the bead 8 will be a white light emitter.

In a preferred embodiment, the bead 8 comprises at least two luminescent different particles 1, wherein at least one particle 1 emits at a wavelength in the range from 400 to 490 nm, and at least one particle 1 emits at a wavelength in the range from 500 to 560 nm. In this embodiment, the bead 8 comprises at least one particle 1 emitting in the blue region of the visible spectrum and at least one particle 1 emitting in the green region of the visible spectrum.

In a preferred embodiment, the bead 8 comprises three different particles 1, wherein said particles 1 emit different emission wavelengths or color.

In a preferred embodiment, the bead 8 comprises at least three different particles 1, wherein at least one particle 1 emits at a wavelength in the range from 400 to 490 nm, at least one particle 1 emits at a wavelength in the range from 500 to 560 nm and at least one particle 1 emits at a wavelength in the range from 600 to 2500 nm. In this embodiment, the bead 8 comprises at least one particle 1 emitting in the blue region of the visible spectrum, at least one particle 1 emitting in the green region of the visible spectrum and at least one particle 1 emitting in the red region of the visible spectrum.

In a preferred embodiment, the bead 8 does not comprise any particle 1 on its surface. In this embodiment, the at least particle 1 is completely surrounded by the third material 81.

According to one embodiment, at least 100%, 95%, 90%, 85%, 80%, 75%, 70%, 65%, 60%, 55%, 50%, 45%, 40%, 35%, 30%, 25%, 20%, 15%, 10%, 5%, or 1% of particles 1 are comprised in the third material 81. In this embodiment, each of said particles 1 is completely surrounded by the third material 81.

According to one embodiment, the bead 8 comprises at least 100%, 95%, 90%, 85%, 80%, 75%, 70%, 65%, 60%, 55%, 50%, 45%, 40%, 35%, 30%, 25%, 20%, 15%, 10%, 5%, 1% or 0% of particles 1 on its surface.

According to one embodiment, the bead 8 comprises at least one particle 1 dispersed in the third material 81, i.e., totally surrounded by said third material 81; and at least one particle 1 located on the surface of said bead 8.

According to one embodiment, the particle 1 is only located on the surface of said bead 8. This embodiment is advantageous as the particle 1 will be better excited by the incident light than if said particle 1 was dispersed in the third material 81.

According to one embodiment, the particle 1 located on the surface of said bead 8 may be chemically or physically adsorbed on said surface.

According to one embodiment, the particle 1 located on the surface of said bead 8 may be adsorbed on said surface.

According to one embodiment, the particle 1 located on the surface of said bead 8 may be adsorbed with a cement on said surface.

According to one embodiment, examples of cement include but are not limited to: polymers, silicon, oxides, or a mixture thereof.

According to one embodiment, the particle 1 located on the surface of said bead 8 may have at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of its volume trapped in the third material 81.

According to one embodiment, the plurality of particles 1 is uniformly is uniformly spaced on the surface of the bead 8.

According to one embodiment, each particle 1 of the plurality of particles 1 is spaced from its adjacent particle 1 by an average minimal distance.

According to one embodiment, the average minimal distance between two particles 1 is controlled.

According to one embodiment, the average minimal distance between two particles 1 on the surface of the bead 8 is at least 1 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38

μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two particles 1 on the surface of the bead 8 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two particles 1 on the surface of the bead 8 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 15%, 20%, 25%, 30%, 35%, 40%, 45%, or 50%.

According to one embodiment, the bead 8 exhibits a shelf life of at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

Photoluminescence refers to fluorescence and/or phosphorescence.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

In one embodiment, the bead 8 exhibits photoluminescence quantum yield (PLQY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 $mW \cdot cm^{-2}$ and 100 $kW \cdot cm^{-2}$, more preferably between 10 $mW \cdot cm^{-2}$ and 100 $W \cdot cm^{-2}$, and even more preferably between 10 $mW \cdot cm^{-2}$ and 30 $W \cdot cm^{-2}$.

According to one embodiment, the photon flux or average peak pulse power of the illumination is at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the bead 8 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300

W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the bead 8 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the third material 81 has a bandgap of at least 3.0 eV, 3.1 eV, 3.2 eV, 3.3 eV, 3.4 eV, 3.5 eV, 3.6 eV, 3.7 eV, 3.8 eV, 3.9 eV, 4.0 eV, 4.1 eV, 4.2 eV, 4.3 eV, 4.4 eV, 4.5 eV, 4.6 eV, 4.7 eV, 4.8 eV, 4.9 eV, 5.0 eV, 5.1 eV, 5.2 eV, 5.3 eV, 5.4 eV or 5.5 eV.

According to one embodiment, the third material 81 is selected from the group consisting of oxide materials, semiconductor materials, wide-bandgap semiconductor materials or a mixture thereof.

According to one embodiment, examples of semiconductor materials include but are not limited to: III-V semiconductors, II-VI semiconductors, or a mixture thereof.

According to one embodiment, examples of wide-bandgap semiconductor materials include but are not limited to: silicon carbide SiC, aluminium nitride AlN, gallium nitride GaN, boron nitride BN, or a mixture thereof.

According to one embodiment, examples of oxide materials include but are not limited to: $SiO_2$, $Al_2O_3$, $TiO_2$, $ZrO_2$, FeO, ZnO, MgO, $SnO_2$, $Nb_2Os$, $CeO_2$, BeO, $IrO_2$, CaO, $Sc_2O_3$, $Na_2O$, BaO, $K_2O$, $TeO_2$, MnO, $B_2O_3$, $GeO_2$, $As_2O_3$, $Ta_2O_5$, $Li_2O$, SrO, $Y_2O_3$, $HfO_2$, $MoO_2$, $Tc_2O_7$, $ReO_2$, $Co_3O_4$, OsO, $RhO_2$, $Rh_2O_3$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof.

According to one embodiment, the third material 81 is selected from the group consisting of silicon oxide, aluminium oxide, titanium oxide, iron oxide, calcium oxide, magnesium oxide, zinc oxide, tin oxide, beryllium oxide, zirconium oxide, niobium oxide, cerium oxide, iridium oxide, scandium oxide, sodium oxide, barium oxide, potassium oxide, tellurium oxide, manganese oxide, boron oxide, germanium oxide, osmium oxide, rhenium oxide, arsenic oxide, tantalum oxide, lithium oxide, strontium oxide, yttrium oxide, hafnium oxide, molybdenum oxide, technetium oxide, rhodium oxide, cobalt oxide, gallium oxide, indium oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, silicon carbide SiC, aluminium nitride AlN, gallium nitride GaN, boron nitride BN, mixed oxides, mixed oxides thereof, or a mixture thereof.

According to one embodiment, the third material 81 comprises garnets.

According to one embodiment, examples of garnets include but are not limited to: $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, or a mixture thereof.

According to one embodiment, the third material 81 comprises or consists of a thermal conductive material wherein said thermal conductive material includes but is not limited to: $Al_yO_x$, $Ag_yO_x$, $Cu_yO_x$, $Fe_yO_x$, $Si_yO_x$, $Pb_yO_x$, $Ca_yO_x$, $Mg_yO_x$, $Zn_yO_x$, $Sn_yO_x$, $Ti_yO_x$, $Be_yO_x$, mixed oxides, mixed oxides thereof or a mixture thereof; x and y are independently a decimal number from 0 to 10, at the condition that x and y are not simultaneously equal to 0, and $x \neq 0$.

According to one embodiment, the third material 81 comprises or consists of a thermal conductive material wherein said thermal conductive material includes but is not limited to: $Al_2O_3$, $Ag_2O$, $Cu_2O$, CuO, $Fe_3O_4$, FeO, $SiO_2$, PbO, CaO, MgO, ZnO, $SnO_2$, $TiO_2$, BeO, mixed oxides, mixed oxides thereof or a mixture thereof.

According to one embodiment, the third material 81 comprises or consists of a thermal conductive material wherein said thermal conductive material includes but is not limited to: aluminium oxide, silver oxide, copper oxide, iron oxide, silicon oxide, lead oxide, calcium oxide, magnesium oxide, zinc oxide, tin oxide, titanium oxide, beryllium oxide, mixed oxides, mixed oxides thereof or a mixture thereof.

According to one embodiment, the third material 81 comprises a material including but not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof, garnets such as for example $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, or a mixture thereof.

According to one embodiment, the third material 81 comprises organic molecules in small amounts of 0 mole %, 1 mole %, 5 mole %, 10 mole %, 15 mole %, 20 mole %, 25 mole %, 30 mole %, 35 mole %, 40 mole %, 45 mole %, 50 mole %, 55 mole %, 60 mole %, 65 mole %, 70 mole %, 75 mole %, 80 mole % relative to the majority element of said third material 81.

According to one embodiment, the third material 81 does not comprise inorganic polymers.

According to one embodiment, the third material 81 does not comprise $SiO_2$.

According to one embodiment, the third material 81 does not consist of pure $SiO_2$, i.e., 100% $SiO_2$.

According to one embodiment, the third material 81 does not comprise glass.

According to one embodiment, the third material 81 does not comprise vitrified glass.

According to one embodiment, the third material 81 comprises additional heteroelements, wherein said additional heteroelements include but are not limited to: Cd, S, Se, Zn, In, Te, Hg, Sn, Cu, N, Ga, Sb, Tl, Mo, Pd, Ce, W, Co, Mn, Si, Ge, B, P, Al, As, Fe, Ti, Zr, Ni, Ca, Na, Ba, K, Mg, Pb, Ag, V, Be, Ir, Sc, Nb, Ta or a mixture thereof. In this embodiment, heteroelements can diffuse in the bead 8 and/or the particle 1 and/or the particle 2 during heating step. They may form nanoclusters inside the bead 8 and/or the particle 1 and/or the particle 2. These elements can limit the degradation of the photoluminescence of said bead 8 and/or the particle 1 and/or the particle 2 during the heating step, and/or drain away the heat if it is a good thermal conductor, and/or evacuate electrical charges.

According to one embodiment, the first material 11 and/or the second material 21 comprise additional heteroelements in small amounts of 0 mole %, 1 mole %, 5 mole %, 10 mole %, 15 mole %, 20 mole %, 25 mole %, 30 mole %, 35 mole %, 40 mole %, 45 mole %, 50 mole % relative to the majority element of said first material 11.

According to one embodiment, the third material 81 comprises $Al_2O_3$, $SiO_2$, MgO, ZnO, $ZrO_2$, $TiO_2$, $IrO_2$, $SnO_2$, BaO, $BaSO_4$, BeO, CaO, $CeO_2$, CuO, $Cu_2O$, $DyO_3$, $Fe_2O_3$, $Fe_3O_4$, $GeO_2$, $HfO_2$, $Lu_2O_3$, $Nb_2Os$, $Sc_2O_3$, $TaO_5$, $TeO_2$, or $Y_2O_3$ additional nanoparticles. These additional nanoparticles can drain away the heat if it is a good thermal conductor, and/or evacuate electrical charges, and/or scatter an incident light.

According to one embodiment, the third material 81 comprises additional nanoparticles in small amounts at a level of at least 100 ppm, 200 ppm, 300 ppm, 400 ppm, 500 ppm, 600 ppm, 700 ppm, 800 ppm, 900 ppm, 1000 ppm, 1100 ppm, 1200 ppm, 1300 ppm, 1400 ppm, 1500 ppm, 1600 ppm, 1700 ppm, 1800 ppm, 1900 ppm, 2000 ppm, 2100 ppm, 2200 ppm, 2300 ppm, 2400 ppm, 2500 ppm, 2600 ppm, 2700 ppm, 2800 ppm, 2900 ppm, 3000 ppm, 3100 ppm, 3200 ppm, 3300 ppm, 3400 ppm, 3500 ppm, 3600 ppm, 3700 ppm, 3800 ppm, 3900 ppm, 4000 ppm, 4100 ppm, 4200 ppm, 4300 ppm, 4400 ppm, 4500 ppm, 4600 ppm, 4700 ppm, 4800 ppm, 4900 ppm, 5000 ppm, 5100 ppm, 5200 ppm, 5300 ppm, 5400 ppm, 5500 ppm, 5600 ppm, 5700 ppm, 5800 ppm, 5900 ppm, 6000 ppm, 6100 ppm, 6200 ppm, 6300 ppm, 6400 ppm, 6500 ppm, 6600 ppm, 6700 ppm, 6800 ppm, 6900 ppm, 7000 ppm, 7100 ppm, 7200 ppm, 7300 ppm, 7400 ppm, 7500 ppm, 7600 ppm, 7700 ppm, 7800 ppm, 7900 ppm, 8000 ppm, 8100 ppm, 8200 ppm, 8300 ppm, 8400 ppm, 8500 ppm, 8600 ppm, 8700 ppm, 8800 ppm, 8900 ppm, 9000 ppm, 9100 ppm, 9200 ppm, 9300 ppm, 9400 ppm, 9500 ppm, 9600 ppm, 9700 ppm, 9800 ppm, 9900 ppm, 10000 ppm, 10500 ppm, 11000 ppm, 11500 ppm, 12000 ppm, 12500 ppm, 13000 ppm, 13500 ppm, 14000 ppm, 14500 ppm, 15000 ppm, 15500 ppm, 16000 ppm, 16500 ppm, 17000 ppm, 17500 ppm, 18000 ppm, 18500 ppm, 19000 ppm, 19500 ppm, 20000 ppm, 30000 ppm, 40000 ppm, 50000 ppm, 60000 ppm, 70000 ppm, 80000 ppm, 90000 ppm, 100000 ppm, 110000 ppm, 120000 ppm, 130000 ppm, 140000 ppm, 150000 ppm, 160000 ppm, 170000 ppm, 180000 ppm, 190000 ppm, 200000 ppm, 210000 ppm, 220000 ppm, 230000 ppm, 240000 ppm, 250000 ppm, 260000 ppm, 270000 ppm, 280000 ppm, 290000 ppm, 300000 ppm, 310000 ppm, 320000 ppm, 330000 ppm, 340000 ppm, 350000 ppm, 360000 ppm, 370000 ppm, 380000 ppm, 390000 ppm, 400000 ppm, 410000 ppm, 420000 ppm, 430000 ppm, 440000 ppm, 450000 ppm, 460000 ppm, 470000 ppm, 480000 ppm, 490000 ppm, or 500 000 ppm in weight compared to the bead 8 and/or the particle 1 and/or the particle 2.

According to one embodiment, the third material 81 has a density ranging from 1 to 10, preferably the third material 81 has a density ranging from 3 to 10.

According to one embodiment, the third material 81 has a density superior or equal to the density of the first material 11.

According to one embodiment, the third material 81 has a density superior or equal to the density of the second material 21.

According to one embodiment, the third material 81 has a refractive index ranging from 1 to 5, from 1.2 to 2.6, from 1.4 to 2.0.

According to one embodiment, the third material 81 has a refractive index of at least 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0.

According to one embodiment, the third material 81 has the same refractive index than the second material 21.

According to one embodiment, the third material 81 has the same refractive index than the first material 11.

According to one embodiment, the third material 81 has a refractive index distinct from the refractive index of the first material 11. This embodiment allows for a wider scattering of light.

This embodiment also allows to have a difference in light scattering as a function of the wavelength, in particular to increase the scattering of the excitation light with respect to the scattering of the emitted light, as the wavelength of the excitation light is lower than the wavelength of the emitted light.

According to one embodiment, the third material 81 has a refractive index distinct from the refractive index of the second material 21. This embodiment allows for a wider scattering of light. This embodiment also allows to have a difference in light scattering as a function of the wavelength, in particular to increase the scattering of the excitation light with respect to the scattering of the emitted light, as the wavelength of the excitation light is lower than the wavelength of the emitted light.

According to one embodiment, the third material 81 has a refractive index superior or equal to the refractive index of the first material 11.

According to one embodiment, the third material 81 has a refractive index superior or equal to the refractive index of the second material 21.

According to one embodiment, the first material 11 has a refractive index inferior to the refractive index of the second material 21.

According to one embodiment, the third material 81 has a refractive index inferior to the refractive index of the first material 11.

According to one embodiment, the third material 81 has a refractive index inferior to the refractive index of the second material 21.

According to one embodiment, the third material 81 has a difference of refractive index with the refractive index of the first material 11 and/or the second material 21 of at least 0.02, 0.025, 0.03, 0.035, 0.04, 0.045, 0.05, 0.055, 0.06, 0.065, 0.07, 0.075, 0.08, 0.085, 0.09, 0.095, 0.1, 0.11, 0.115, 0.12, 0.125, 0.13, 0.135, 0.14, 0.145, 0.15, 0.155, 0.16, 0.165, 0.17, 0.175, 0.18, 0.185, 0.19, 0.195, 0.2, 0.25, 0.3, 0.35, 0.4, 0.45, 0.5, 0.55, 0.6, 0.65, 0.7, 0.75, 0.8, 0.85, 0.9, 0.95, 1, 1.1, 1.15, 1.2, 1.25, 1.3, 1.35, 1.4, 1.45, 1.5, 1.55, 1.6, 1.65, 1.7, 1.75, 1.8, 1.85, 1.9, 1.95, or 2.

According to one embodiment, the third material 81 has a difference of refractive index with the first material 11 and/or the second material 21 ranging from 0.02 to 2, ranging from 0.02 to 1.5, ranging from 0.03 to 1.5, ranging from 0.04 to 1.5, ranging from 0.05 to 1.5, ranging from 0.02 to 1.2, ranging from 0.03 to 1.2, ranging from 0.04 to 1.2, ranging from 0.05 to 1.2, ranging from 0.05 to 1, ranging from 0.1 to 1, ranging from 0.2 to 1, ranging from 0.3 to 1, ranging from 0.5 to 1, ranging from 0.05 to 2, ranging from 0.1 to 2, ranging from 0.2 to 2, ranging from 0.3 to 2, or ranging from 0.5 to 2.

The difference of refractive index was measured at 450 nm.

According to one embodiment, the third material 81 has a difference of refractive index with the refractive index of the first material 11 and/or the second material 21 of 0.02.

According to one embodiment, the third material 81 acts as a barrier against oxidation of the at least one nanoparticle 3.

According to one embodiment, the third material 81 is thermally conductive.

According to one embodiment, the third material 81 has a thermal conductivity at standard conditions ranging from 0.1 to 450 W/(m·K), preferably from 1 to 200 W/(m·K), more preferably from 10 to 150 W/(m·K).

According to one embodiment, the third material 81 has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the thermal conductivity of the third material 81 may be measured by for example by steady-state methods or transient methods.

According to one embodiment, the third material 81 is not thermally conductive.

According to one embodiment, the third material 81 comprises a refractory material.

According to one embodiment, the third material 81 is electrically insulator. In this embodiment, the quenching of fluorescent properties for fluorescent nanoparticles encapsulated in the second material 21 is prevented when it is due to electron transport. In this embodiment, the bead 8 may be used as an electrical insulator material exhibiting the same properties as the nanoparticles 3 encapsulated in the second material 21.

According to one embodiment, the third material 81 are electrically conductive. This embodiment is particularly advantageous for an application of the bead 8 in photovoltaics or LEDs.

According to one embodiment, the third material 81 has an electrical conductivity at standard conditions ranging from $1\times10^{-20}$ to $10^{7}$ S/m, preferably from $1\times10^{-15}$ to 5 S/m, more preferably from $1\times10^{-7}$ to 1 S/m.

According to one embodiment, the third material 81 has an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the third material 81 may be measured for example with an impedance spectrometer.

According to one embodiment, the third material 81 is amorphous.

According to one embodiment, the third material 81 is crystalline.

According to one embodiment, the third material 81 is totally crystalline.

According to one embodiment, the third material 81 is partially crystalline.

According to one embodiment, the third material 81 is monocrystalline.

According to one embodiment, the third material 81 is polycrystalline. In this embodiment, the third material 81 comprises at least one grain boundary.

According to one embodiment, the third material 81 is hydrophobic.

According to one embodiment, the third material 81 is hydrophilic.

According to one embodiment, the third material 81 is porous.

According to one embodiment, the third material 81 is considered porous when the quantity adsorbed by the bead 8 determined by adsorption-desorption of nitrogen in the Brunauer-Emmett-Teller (BET) theory is more than 20 $cm^3$/g, 15 $cm^3$/g, 10 $cm^3$/g, 5 $cm^3$/g at a nitrogen pressure of 650 mmHg, preferably 700 mmHg.

According to one embodiment, the organization of the porosity of the third material 81 can be hexagonal, vermicular or cubic.

According to one embodiment, the organized porosity of the third material 81 has a pore size of at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, or 50 nm.

According to one embodiment, the third material 81 is not porous.

According to one embodiment, the third material 81 does not comprise pores or cavities.

According to one embodiment, the third material 81 is considered non-porous when the quantity adsorbed by the bead 8 determined by adsorption-desorption of nitrogen in the Brunauer-Emmett-Teller (BET) theory is less than 20 $cm^3$/g, 15 $cm^3$/g, 10 $cm^3$/g, 5 $cm^3$/g at a nitrogen pressure of 650 mmHg, preferably 700 mmHg.

According to one embodiment, the third material 81 is permeable. In this embodiment, permeation of outer molecular species, gas or liquid in the f third material 81 is possible.

According to one embodiment, the permeable third material 81 has an intrinsic permeability to fluids higher or equal to $10^{-20}$ $cm^2$, $10^{-19}$ $cm^2$, $10^{-18}$ $cm^2$, $10^{-17}$ $cm^2$, $10^{-16}$ $cm^2$, $10^{-15}$ $cm^2$, $10^{-14}$ $cm^2$, $10^{-13}$ $cm^2$, $10^{-12}$ $cm^2$, $10^{-11}$ $cm^2$, $\mathbf{10^{-10}}$ $cm^2$, $10^{-9}$ $cm^2$, $10^{-8}$ $cm^2$, $10^{-7}$ $cm^2$, $10^{-6}$ $cm^2$, $10^{-5}$ $cm^2$, 10-$cm^2$, or $10^{-3}$ $cm^2$.

According to one embodiment, the third material 81 is impermeable to outer molecular species, gas or liquid. In this embodiment, the third material 81 limits or prevents the degradation of the chemical and physical properties of the at least one nanoparticle 3 from molecular oxygen, water and/or high temperature.

According to one embodiment, the impermeable third material 81 has an intrinsic permeability to fluids less or equal to $10^{-11}$ $cm^2$, $10^{-12}$ $cm^2$, $10^{-13}$ $cm^2$, $10^{-14}$ $cm^2$, $10^{-15}$ $cm^2$, $10^{-16}$ $cm^2$, $10^{-17}$ $cm^2$, $10^{-18}$ $cm^2$, $10^{-19}$ $cm^2$, or $10^{-20}$ $cm^2$.

According to one embodiment, the third material 81 limits or prevents the diffusion of outer molecular species or fluids (liquid or gas) into said third material 81.

According to one embodiment, the third material 81 is optically transparent, i.e., the third material 81 is transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm. In this embodiment, the third material 81 does not absorb all incident light allowing the at least one nanoparticle 3 to absorb all the incident light; and/or the third material 81 does not absorb the light emitted by the at least one nanoparticle 3 allowing to said light emitted to be transmitted through the third material 81.

According to one embodiment, the third material 81 is not optically transparent, i.e., the third material 81 absorbs light at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm. In this embodiment, the third material 81 absorbs part of the incident light allowing the at least one nanoparticle 3 to absorb only a part of the incident light; and/or the third material 81 absorbs part of the light emitted by the at least one nanoparticle 3 allowing said light emitted to be partially transmitted through the third material 81.

According to one embodiment, the third material 81 is stable under acidic conditions, i.e., at pH inferior or equal to 7. In this embodiment, the third material 81 is sufficiently robust to withstand acidic conditions, meaning that the properties of the bead 8 are preserved under said conditions.

According to one embodiment, the third material 81 is stable under basic conditions, i.e., at pH superior to 7. In this embodiment, the third material 81 is sufficiently robust to withstand basic conditions, meaning that the properties of the bead 8 are preserved under said conditions.

According to one embodiment, the third material 81 is physically and chemically stable under various conditions. In this embodiment, the third material 81 is sufficiently robust to withstand the conditions to which the bead 8 will be subjected.

According to one embodiment, the third material 81 is physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the third material 81 is sufficiently robust to withstand the conditions to which the bead 8 will be subjected.

According to one embodiment, the third material 81 is physically and chemically stable under 0%, 10%, 20%, 30%, 40%, 50%, 55%, 60%, 65%, 70%, 75%, 80%, 85%, 90%, 95%, or 99% of humidity for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the third material 81 is sufficiently robust to withstand the conditions to which the bead 8 will be subjected.

According to one embodiment, the third material 81 is physically and chemically stable under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the third material 81 is sufficiently robust to withstand the conditions to which the bead 8 will be subjected.

According to one embodiment, the third material 81 is physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. and under 0%, 10%, 20%, 30%, 40%, 50%, 55%, 60%, 65%, 70%, 75%, 80%, 85%, 90%, 95%, or 99% of humidity for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the third material 81 is sufficiently robust to withstand the conditions to which the bead 8 will be subjected.

According to one embodiment, the third material 81 is physically and chemically stable under 0%, 10%, 20%, 30%, 40%, 50%, 55%, 60%, 65%, 70%, 75%, 80%, 85%, 90%, 95%, or 99% of humidity and under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the third material 81 is sufficiently robust to withstand the conditions to which the bead 8 will be subjected.

According to one embodiment, the third material 81 is physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. and under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the third material 81 is sufficiently robust to withstand the conditions to which the bead 8 will be subjected.

According to one embodiment, the third material 81 is the same as the second material 21 as described hereabove.

According to one embodiment, the third material 81 is different from the first material 11 as described hereabove.

According to one embodiment, the third material 81 is different from the second material 21 as described hereabove.

According to one embodiment, the particle 1 and/or the particle 2 are functionalized.

A functionalized particle 1 and/or the particle 2 can then be dispersed in a host material or a liquid vehicle of an ink for further use.

Some applications, for example biological applications, require particles to be functionalized with a biocompatible agent for example.

According to one embodiment, the particle 1 and/or the particle 2 are functionalized with a specific-binding component, wherein said specific-binding component includes but is not limited to: antigens, steroids, vitamins, drugs, haptens, metabolites, toxins, environmental pollutants, amino acids, peptides, proteins, antibodies, polysaccharides, nucleotides, nucleosides, oligonucleotides, psoralens, hormones, nucleic acids, nucleic acid polymers, carbohydrates, lipids, phospholipids, lipoproteins, lipopolysaccharides, liposomes, lipophilic polymers, synthetic polymers, polymeric microparticles, biological cells, virus and combinations thereof.

Preferred peptides include, but are not limited to: neuropeptides, cytokines, toxins, protease substrates, and protein kinase substrates. Preferred protein conjugates include enzymes, antibodies, lectins, glycoproteins, histones, albumins, lipoproteins, avidin, streptavidin, protein A, protein G, phycobiliproteins and other fluorescent proteins, hormones, toxins and growth factors. Preferred nucleic acid polymers are single- or multi-stranded, natural or synthetic DNA or RNA oligonucleotides, or DNA/RNA hybrids, or incorporating an unusual linker such as morpholine derivatized phosphides, or peptide nucleic acids such as N-(2-aminoethyl)glycine units, where the nucleic acid contains fewer than 50 nucleotides, more typically fewer than 25 nucleotides. The functionalization of the particle 1 and/or the particle 2 can be made using techniques known in the art.

According to one embodiment, the liquid vehicle surrounds, encapsulates and/or covers partially or totally at least one particle. In this embodiment, particle refers to particle 1, particle 2 and/or nanophosphor nanoparticle.

"Liquid vehicle" or "ink vehicle," as used herein, refers to the vehicle in which the particles of the invention are placed to form the ink. In this embodiment, particle refers to particle 1, particle 2 and/or nanophosphor nanoparticle. In this embodiment, particles can be functionalized or not.

According to one embodiment, the ink further comprises a plurality of particles. In this embodiment, particle refers to particle 1, particle 2 and/or nanophosphor nanoparticle.

According to one embodiment, the ink comprises at least two liquid vehicles. In this embodiment, the liquid vehicles may be different or identical.

According to one embodiment, the ink comprises a plurality of liquid vehicles.

According to one embodiment, the plurality of particles is uniformly dispersed in the liquid vehicle. In this embodiment, particle refers to particle 1, particle 2 and/or nanophosphor nanoparticle.

According to one embodiment, the loading charge of particles in the liquid vehicle is at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%. In this embodiment, particle refers to particle 1, particle 2 and/or nanophosphor nanoparticle.

According to one embodiment, the loading charge of particles in the liquid vehicle is less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%. In this embodiment, particle refers to particle 1, particle 2 and/or nanophosphor nanoparticle.

According to one embodiment, the particles dispersed in the liquid vehicle have a packing fraction of at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%. In this embodiment, particle refers to particle 1, particle 2 and/or nanophosphor nanoparticle.

According to one embodiment, the particles dispersed in the liquid vehicle have a packing fraction of less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%. In this embodiment, particle refers to particle 1, particle 2 and/or nanophosphor nanoparticle.

According to one embodiment, the particles in the liquid vehicle are adjoining, are in contact.

In this embodiment, particle refers to particle 1, particle 2 and/or nanophosphor nanoparticle.

According to one embodiment, in the same liquid vehicle, the particles are not aggregated. In this embodiment, particle refers to particle 1, particle 2 and/or nanophosphor nanoparticle.

According to one embodiment, the particles in the liquid vehicle do not touch, are not in contact.

In this embodiment, particle refers to particle 1, particle 2 and/or nanophosphor nanoparticle.

According to one embodiment, the particles are separated by the liquid vehicle. In this embodiment, particle refers to particle 1, particle 2 and/or nanophosphor nanoparticle.

According to one embodiment, the particles in the liquid vehicle can be individually evidenced for example by conventional microscopy, transmission electron microscopy, scanning transmission electron microscopy, scanning electron microscopy, or fluorescence scanning microscopy.

According to one embodiment, in the liquid vehicle, each particle of the plurality of particles is spaced from its adjacent particle by an average minimal distance. In this embodiment, particle refers to particle 1, particle 2 and/or nanophosphor nanoparticle.

According to one embodiment, the average minimal distance between two particles in the liquid vehicle is controlled. In this embodiment, particle refers to particle 1, particle 2 and/or nanophosphor nanoparticle.

According to one embodiment, the average minimal distance between two particles in the liquid vehicle or in a statistical set of particles is at least 1 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm. In this embodiment, particle refers to particle 1, particle 2 and/or nanophosphor nanoparticle.

According to one embodiment, the average distance between two particles in the liquid vehicle or in a statistical set of particles is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm. In this embodiment, particle refers to particle 1, particle 2 and/or nanophosphor nanoparticle.

According to one embodiment, the average distance between two particles in the liquid vehicle or in a statistical set of particles may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, or 10%. In this embodiment, particle refers to particle 1, particle 2 and/or nanophosphor nanoparticle.

According to one embodiment, the ink does not comprise optically transparent void regions.

According to one embodiment, the ink does not comprise void regions surrounding the at least one particle. In this embodiment, particle refers to particle 1, particle 2 and/or nanophosphor nanoparticle.

According to one embodiment, the ink further comprises at least one particle comprising an inorganic material; and a plurality of nanoparticles, wherein said inorganic material is different from the material comprised in the particle of the invention. In this embodiment, said at least one particle comprising an inorganic material is empty, i.e., does not comprise any nanoparticle. In this embodiment, particle of the invention refers to particle 1, particle 2 and/or nanophosphor nanoparticle.

According to one embodiment, the ink further comprises at least one particle comprising an inorganic material; and a plurality of nanoparticles, wherein said inorganic material is the same as the material comprised in the particle of the invention. In this embodiment, said at least one particle comprising an inorganic material is empty, i.e., does not comprise any nanoparticle. In this embodiment, particle of the invention refers to particle 1, particle 2 and/or nanophosphor nanoparticle.

According to one embodiment, the ink further comprises at least one particle comprising an inorganic material, wherein said inorganic material is the same as the material comprised in the particle of the invention. In this embodiment, said at least one particle comprising an inorganic material is empty, i.e., does not comprise any nanoparticle. In this embodiment, particle of the invention refers to particle 1, particle 2 and/or nanophosphor nanoparticle.

According to one embodiment, the ink further comprises at least one particle comprising an inorganic material, wherein said inorganic material is different from the material comprised in the particle of the invention. In this embodiment, said at least one particle comprising an inorganic material is empty, i.e., does not comprise any nanoparticle. In this embodiment, particle of the invention refers to particle 1, particle 2 and/or nanophosphor nanoparticle.

According to one embodiment, the ink further comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, or 95% in weight of particle comprising an inorganic material.

According to one embodiment, the particle comprising an inorganic material has a different size than the particle of the invention. In this embodiment, particle of the invention refers to particle 1, particle 2 and/or nanophosphor nanoparticle.

According to one embodiment, the particle comprising an inorganic material has the same size as the particle of the invention. In this embodiment, particle of the invention refers to particle 1, particle 2 and/or nanophosphor nanoparticle.

According to one embodiment, the ink further comprises a plurality of nanoparticles. In this embodiment, said nanoparticles are different from the nanoparticles 3 comprised in the particle of the invention. In this embodiment, particle of the invention refers to particle 1, particle 2 and/or nanophosphor nanoparticle.

According to one embodiment, the ink further comprises a plurality of nanoparticles. In this embodiment, said nanoparticles are the same as the nanoparticles 3 comprised in the particle of the invention. In this embodiment, particle of the invention refers to particle 1, particle 2 and/or nanophosphor nanoparticle.

According to one embodiment, the ink further comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, or 95% in weight of nanoparticles, wherein said nanoparticles are not comprised in the particle of the invention. In this embodiment, particle of the invention refers to particle 1, particle 2 and/or nanophosphor nanoparticle.

According to one embodiment, the ink is free of oxygen.

According to one embodiment, the ink is free of water.

According to one embodiment, the ink further comprises scattering particles dispersed in the liquid vehicle. Examples of scattering particles include but are not limited to: $SiO_2$, $ZrO_2$, ZnO, MgO, $SnO_2$, $TiO_2$, Ag, Au, alumina, barium sulfate, PTFE, barium titanate and the like.

In one embodiment, the ink further comprises thermal conductor particles dispersed in the liquid vehicle. Examples of thermal conductor particles include but are not limited to: $SiO_2$, $ZrO_2$, ZnO, MgO, $SnO_2$, $TiO_2$, CaO, alumina, barium sulfate, PTFE, barium titanate and the like. In this embodiment, the thermal conductivity of the liquid vehicle is increased.

According to one embodiment, the ink exhibits an emission spectrum with at least one emission peak, wherein said emission peak has a maximum emission wavelength ranging from 400 nm to 50 m.

According to one embodiment, the ink exhibits an emission spectrum with at least one emission peak, wherein said emission peak has a maximum emission wavelength ranging from 400 nm to 500 nm. In this embodiment, the ink emits blue light.

According to one embodiment, the ink exhibits an emission spectrum with at least one emission peak, wherein said emission peak has a maximum emission wavelength ranging from 500 nm to 560 nm, more preferably ranging from 515 nm to 545 nm. In this embodiment, the ink emits green light.

According to one embodiment, the ink exhibits an emission spectrum with at least one emission peak, wherein said emission peak has a maximum emission wavelength ranging from 560 nm to 590 nm. In this embodiment, the ink emits yellow light.

According to one embodiment, the ink exhibits an emission spectrum with at least one emission peak, wherein said emission peak has a maximum emission wavelength ranging from 590 nm to 750 nm, more preferably ranging from 610 nm to 650 nm. In this embodiment, the ink emits red light.

According to one embodiment, the ink exhibits an emission spectrum with at least one emission peak, wherein said emission peak has a maximum emission wavelength ranging from 750 nm to 50 μm. In this embodiment, the ink emits near infra-red, mid-infra-red, or infra-red light.

According to one embodiment, the ink exhibits emission spectra with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the ink exhibits emission spectra with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the ink has a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99% or 100%.

In one embodiment, the ink exhibits photoluminescence quantum yield (PLQY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 $mW \cdot cm^{-2}$ and 100 $kW \cdot cm^{-2}$ and more preferably between 10 $mW \cdot cm^{-2}$ and 100 $W \cdot cm^{-2}$, and even more preferably between 10 $mW \cdot cm^{-2}$ and 30 $W \cdot cm^{-2}$.

According to one embodiment, the photon flux or average peak pulse power of the illumination is at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the ink exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the ink exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160

W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$. According to one embodiment, the liquid vehicle is free of oxygen.

According to one embodiment, the liquid vehicle is free of water.

According to one embodiment, the liquid vehicle limits or prevents the degradation of the chemical and physical properties of the particle of the invention from molecular oxygen, water and/or high temperature. In this embodiment, particle of the invention refers to particle 1, particle 2 and/or nanophosphor nanoparticle.

According to one embodiment, the liquid vehicle is optically transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

According to one embodiment, the liquid vehicle has a refractive index ranging from 1.0 to 3.0, from 1.2 to 2.6, from 1.4 to 2.0.

According to one embodiment, the liquid vehicle has a refractive index of at least 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0.

According to one embodiment, the liquid vehicle has a refractive index distinct from the refractive index of the material comprised in the particle of the invention or from the refractive index of the particle of the invention. This embodiment allows for a wider scattering of light.

This embodiment also allows to have a difference in light scattering as a function of the wavelength, in particular to increase the scattering of the excitation light with respect to the scattering of the emitted light, as the wavelength of the excitation light is lower than the wavelength of the emitted light. In this embodiment, particle of the invention refers to particle 1, particle 2 and/or nanophosphor nanoparticle.

According to one embodiment, the liquid vehicle has a difference of refractive index with the refractive index of the material comprised in the particle of the invention or with the refractive index of the particle of the invention of at least 0.02, 0.025, 0.03, 0.035, 0.04, 0.045, 0.05, 0.055, 0.06, 0.065, 0.07, 0.075, 0.08, 0.085, 0.09, 0.095, 0.1, 0.11, 0.115, 0.12, 0.125, 0.13, 0.135, 0.14, 0.145, 0.15, 0.155, 0.16, 0.165, 0.17, 0.175, 0.18, 0.185, 0.19, 0.195, 0.2, 0.25, 0.3, 0.35, 0.4, 0.45, 0.5, 0.55, 0.6, 0.65, 0.7, 0.75, 0.8, 0.85, 0.9, 0.95, 1, 1.1, 1.15, 1.2, 1.25, 1.3, 1.35, 1.4, 1.45, 1.5, 1.55, 1.6, 1.65, 1.7, 1.75, 1.8, 1.85, 1.9, 1.95, or 2. In this embodiment, particle of the invention refers to particle 1, particle 2 and/or nanophosphor nanoparticle.

According to one embodiment, the liquid vehicle has a refractive index superior or equal to the refractive index of the material comprised in the particle of the invention. In this embodiment, particle of the invention refers to particle 1, particle 2 and/or nanophosphor nanoparticle.

According to one embodiment, the liquid vehicle has a refractive index inferior to the refractive index of the material comprised in the particle of the invention. In this embodiment, particle of the invention refers to particle 1, particle 2 and/or nanophosphor nanoparticle.

According to one embodiment, the particle of the invention in the liquid vehicle is configured to scatter light.

According to one embodiment, the liquid vehicle has a haze factor ranging from 1% to 100%.

According to one embodiment, the liquid vehicle has a haze factor of at least 1%, 2%, 3%, 4%, 5%, 10%, 15%, 20%, 25%, 30%, 35%, 40%, 45%, 50%, 55%, 60%, 65%, 70%, 75%, 80%, 85%, 90%, 95%, or 100%.

The haze factor is calculated by the ratio between the intensity of light scattered by the material beyond the viewing angle and the total intensity transmitted by the material when illuminated with a light source.

According to one embodiment, the viewing angle used to measure the haze factor ranges from 0° to 200.

According to one embodiment, the viewing angle used to measure the haze factor is at least 0°, 1°, 2°, 3°, 4°, 5°, 6°, 7°, 8°, 9°, 10°, 11°, 12°, 13°, 14°, 15°, 16°, 17°, 18°, 19°, or 20°.

According to one embodiment, the particle of the invention in the liquid vehicle is configured to serve as a waveguide. In this embodiment, the refractive index of the particle of the invention is higher than the refractive index of the liquid vehicle. In this embodiment, particle of the invention refers to particle 1, particle 2 and/or nanophosphor nanoparticle.

According to one embodiment, the particle of the invention has a spherical shape. The spherical shape may permit to the light to circulate in said particle without leaving said particle such as to operate as a waveguide. The spherical shape may permit to the light to have whispering-gallery wave modes. Furthermore, a perfect spherical shape prevents fluctuations of the intensity of the scattered light. In this embodiment, particle of the invention refers to particle 1, particle 2 and/or nanophosphor nanoparticle.

According to one embodiment, the particle of the invention in the liquid vehicle is configured to generate multiple reflections of light inside said particle. In this embodiment, particle of the invention refers to particle 1, particle 2 and/or nanophosphor nanoparticle.

According to one embodiment, the liquid vehicle has a refractive index equal to the refractive index of the material comprised in the particle of the invention. In this embodiment, scattering of light is prevented.

According to one embodiment, the at least one liquid vehicle comprises a liquid including but not limited to: 1-methoxy-2-propanol, 2-pyrrolidinone, C4 to C8 1,2-alkanediol, aliphatic or alicycle ketone, methyl ethyl ketone, C1-C4 alkanol such as for example methanol, ethanol, methanol propanol, or isopropanol, ketones, esters, ether of ethylene glycol or propylene glycol, acetals, acrylic resin, polyvinyl acetate, polyvinyl alcohol, polyamide resin, polyurethane resin, epoxy resin, alkyd ester, nitrated cellulose, ethyl cellulose, sodium carboxymethyl cellulose, alkyds, maleics, cellulose derivatives, formaldehyde, rubber resin, phenolics, propyl acetate, glycol ether, aliphatic hydrocarbon, acetate, ester. acrylic, cellulose ester, nitrocellulose, modified resin, alkoxylated alcohol, 2-pyrrolidone, a homolog of 2-pyrrolidone, glycol, water, or a mixture thereof.

In an embodiment, the liquid vehicle includes water and effective amounts of one or more of: derivatized 2-pyrrolidinone(s), glycerol polyoxyethyl ether(s), diol(s), or combinations thereof. In one non-limiting example, the liquid vehicle includes water and a derivatized 2-pyrrolidinone (e.g., 1-(2-hydroxyethyl)-2-pyrrolidinone). In another non-limiting example, the liquid vehicle includes derivatized 2-pyrrolidinone(s), glycerol polyoxyethyl ether(s), diol(s), and non-ionic and/or anionic surfactants.

In one embodiment, the liquid vehicle may also include water soluble polymers, buffers, biocides, sequestering agents, viscosity modifiers, surface-active agents, chelating agents, pH adjusting agents, resins, and/or combinations thereof.

According to one embodiment, the at least one liquid vehicle comprises a liquid at a level of at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, or 95% in weight compared to the total weight of the liquid vehicle.

According to one embodiment, the liquid vehicle is a thermal insulator.

According to one embodiment, the liquid vehicle is a thermal conductor.

According to one embodiment, the liquid vehicle has a thermal conductivity at standard conditions ranging from 0.1 to 450 W/(m·K), preferably from 1 to 200 W/(m·K), more preferably from 10 to 150 W/(m·K).

According to one embodiment, the liquid vehicle has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the liquid vehicle is electrically insulator.

According to one embodiment, the liquid vehicle is electrically conductive.

According to one embodiment, the liquid vehicle has an electrical conductivity at standard conditions ranging from $1\times10^{-20}$ to $10^7$ S/m, preferably from $1\times10^{-15}$ to 5 S/m, more preferably from $1\times10^{-7}$ to 1 S/m.

According to one embodiment, the liquid vehicle has an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the liquid vehicle may be measured for example with an impedance spectrometer.

According to one embodiment, the liquid vehicle can be cured into a shape of a film, thereby generating a film.

According to one embodiment, the liquid vehicle comprises a film-forming material. In this embodiment, the film-forming material is a polymer or an inorganic material as described hereabove.

According to one embodiment, the liquid vehicle comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of a film-forming material.

According to one embodiment, the film-forming material is stable in the liquid vehicle.

According to one embodiment, the film-forming material is dispersed or dissolved in the liquid vehicle.

According to one embodiment, the film-forming material is present in an amount of from about 0.1% by weight to about 10.0% by weight based on the total weight of the ink.

According to one embodiment, the ink comprises one or more materials useful in forming at least one of a hole transport layer, a hole injection layer, an electron transport layer, an electron injection layer, and an emissive layer, of a light-emitting device.

According to one embodiment, the ink comprises a material that is cured or otherwise processed to form a layer on a support.

According to one embodiment, the liquid vehicle has a maximum boiling point that is substantially lower than the evaporation or sublimation temperature of the film-forming material.

According to one embodiment, the liquid vehicle has a maximum boiling point that is at least 70° C., 65° C., 60° C., 55° C., 50° C., 45° C., 40° C., 35° C., 30° C., 25° C., 20° C., 15° C., or 10° C. lower than the evaporation or sublimation temperature of the film-forming material.

According to one embodiment, the liquid vehicle and/or the organic solvent has a maximum boiling point that is at least 50° C., 60° C., 65° C., 70° C., 75° C., 80° C., 85° C., 90° C., 95° C., 100° C., 10° C., 120° C., 130° C., 135° C., 140° C., 145° C., 150° C., 155° C., 160° C., 165° C., 170° C., 175° C., 180° C., 185° C., 190° C., 195° C., 200° C., 210° C., 220° C., 230° C., 235° C., 240° C., 245° C., 250° C., 255° C., 260° C., 265° C., 270° C., 275° C., or 280° C. lower than the evaporation or sublimation temperature of the film-forming material.

According to one embodiment, the liquid vehicle has high purity and the maximum boiling point and purity are such that when heated to a temperature below or equal to the maximum boiling point of the liquid vehicle, the liquid vehicle substantially completely and rapidly evaporates while the film-forming material remains stable.

According to one embodiment, the liquid vehicle is highly pure such that it contains 2000 ppm or less in impurities, by weight, based on the total weight of the liquid vehicle.

According to one embodiment, the liquid vehicle is inert with respect to inkjet and/or thermal printing printhead materials.

According to one embodiment, the liquid vehicle is polymeric.

According to one embodiment, the film-forming material is polymeric.

According to one embodiment, the liquid vehicle comprises a monomer or a polymer as described hereafter.

According to one embodiment, the liquid vehicle and/or the film-forming material can polymerize by heating it (i.e., by thermal curing) and/or by exposing it to UV light (i.e., by UV curing). Examples of UV curing processes which can be contemplated in the present invention are described, e.g., in WO2017063968, WO2017063983 and WO2017162579.

According to one embodiment, the polymeric liquid vehicle and/or the film-forming material includes but is not limited to: silicone based polymers, polydimethylsiloxanes (PDMS), polyethylene terephthalate, polyesters, polyacrylates, polymethacrylates, polycarbonate, poly(vinyl alcohol), polyvinylpyrrolidone, polyvinylpyridine, polysaccharides, poly(ethylene glycol), melamine resins, a phenol resin, an alkyl resin, an epoxy resin, a polyurethane resin, a maleic resin, a polyamide resin, an alkyl resin, a maleic resin, terpenes resins, an acrylic resin or acrylate based resin such as PMMA, copolymers forming the resins, co-polymers, block co-polymers, polymerizable monomers comprising an UV initiator or thermic initiator, or a mixture thereof.

According to one embodiment, the polymeric liquid vehicle and/or the film-forming material includes but is not limited to: thermosetting resin, photosensitive resin, photoresist resin, photocurable resin, or dry-curable resin. The thermosetting resin and the photocurable resin are cured using heat and light, respectively. For the use of the dry hard resin, the resin is cured by applying heat to a solvent in which the particle of the invention is dispersed. In this embodiment, particle of the invention refers to particle 1, particle 2 and/or nanophosphor nanoparticle.

When a thermosetting resin or a photocurable resin is used, the composition of the resulting ink is equal to the composition of the raw material of the ink. However, when a dry-curable resin is used, the composition of the resulting ink may be different from the composition of the raw material of the ink. During the dry-curing by heat, the solvent is partially evaporated. Thus, the volume ratio of particle of the invention in the raw material of the ink may be lower than the volume ratio of said particle in the resulting ink. In this embodiment, particle of the invention refers to particle 1, particle 2 and/or nanophosphor nanoparticle.

Upon curing of the resin, a volume contraction is caused. According to one embodiment, a least 2%, 3%, 4%, 5%, 6%, 7%, 8%, 9%, 10%, 15%, or 20%, of contraction are aroused from a thermosetting resin or a photocurable resin. According to one embodiment, a dry-curable resin is contracted by at least 0.1%, 0.2%, 0.3%, 0.4%, 0.5%, 0.6%, 0.7%, 0.8%, 0.9%, 1%, 1.5%, 2%, 2.5%, 3%, 3.5%, 4%, 4.5%, 5%, 5.5%, 6%, 6.5%, 7%, 7.5%, 8%, 8.5%, 9%, 9.5%, 10%, 15%, or 20%. The contraction of the resin may cause movement of the particles of the invention, which may be lower the degree of dispersion of the particles of the invention in the ink.

However, embodiments of the present invention can maintain high dispersibility by preventing the movement of said particles by introducing other particles in said ink. In this embodiment, particle of the invention refers to particle 1, particle 2 and/or nanophosphor nanoparticle.

In one embodiment, the liquid vehicle and/or the film-forming material may be a polymerizable formulation which can include monomers, oligomers, polymers, or mixture thereof.

In one embodiment, the polymerizable formulation may further comprise a crosslinking agent, a scattering agent, a photo initiator or a thermal initiator.

In one embodiment, the polymerizable formulation includes but is not limited to: monomers, oligomers or polymers made from an alkyl methacrylates or an alkyl acrylates such as acrylic acid, methacrylic acid, crotonic acid, acrylonitrile, acrylic esters substituted with methoxy, ethoxy, propoxy, butoxy, and similar derivatives for example, methyl acrylate, ethyle acrylate, propyl acrylate, butyl acrylate, isobutyl acrylate, lauryl acrylate, norbornyl acrylate, 2-ethyl hexyl acrylate, 2-hydroxyethyl acrylate, 4-hydroxybutyl acrylate, benzyl acrylate, phenyl acrylate, isobornyle acrylate, hydroxypropyl acrylate, fluorinated acrylic monomers, chlorinated acrylic monomers, methacrylic acid, methyl methacrylate, n-butyl methacrylate, isobutyl methacrylate, 2-ethyl hexyl methacrylate, 2-hydroxyethyl methacrylate, 4-hydroxybutyl methacrylate, benzyl methacrylate, phenyl methacrylate, lauryl methacrylate, norbornyl methacrylate, isobornyle methacrylate, hydroxypropyl methacrylate, fluorinated methacrylic monomers, chlorinated methacrylic monomers, alkyl crotonates, allyl crotonates, glycidyl methacrylate and related esters.

In another embodiment, the polymerizable formulation includes but is not limited to: monomers, oligomers or polymers made from an alkyl acrylamide or alkyl methacrylamide such as acrylamide, Alkylacrylamide, N-tert-Butylacrylamide, Diacetone acrylamide, N,N-Diethylacrylamide, N-(Isobutoxymethyl)acrylamide, N-(3-Methoxypropyl) acrylamide, N-Diphenylmethylacrylamide, N-Ethylacrylamide, N-Hydroxyethyl acrylamide, N-(Isobutoxymethyl)acrylamide, N-Isopropylacrylamide, N-(3-Methoxypropyl)acrylamide, N-Phenylacrylamide, N-[Tris (hydroxymethyl)methyl]acrylamide, N,N-Diethylmethacrylamide, N,NDimethylacrylamide, N-[3-(Dimethylamino)propyl]methacrylamide, N-(Hydroxymethyl)acrylamide, 2-Hydroxypropyl methacrylamide, N-Isopropylmethacrylamide, Methacrylamide, N-(Triphenylmethyl)methacrylamide, poly (3,4-ethylenedioxythiopene), poly(ethylene dioxythiophene)/poly(styrene sulfonic acid) (PEDOT/PSS), an aqueous solution of polyaniline/camphor sulfonic acid (PANI/CSA), PTPDES, Et-PIT-DEK, PPBA, and similar derivatives.

In one embodiment, the polymerizable formulation includes but is not limited to: monomers, oligomers or polymers made from alpha-olefins, dienes such as butadiene and chloroprene; styrene, alpha-methyl styrene, and the like; heteroatom substituted alpha-olefins, for example, vinyl acetate, vinyl alkyl ethers for example, ethyl vinyl ether, vinyltrimethylsilane, vinyl chloride, tetrafluoroethylene, chlorotrifiuoroethylene, cyclic and polycyclic olefin compounds for example, cyclopentene, cyclohexene, cycloheptene, cyclooctene, and cyclic derivatives up to C20; polycyclic derivates for example, norbornene, and similar derivatives up to C20; cyclic vinyl ethers for example, 2, 3-dihydrofuran, 3,4-dihydropyran, and similar derivatives; allylic alcohol derivatives for example, vinylethylene carbonate, disubstituted olefins such as maleic and fumaric compounds for example, maleic anhydride, diethylfumarate, and the like, and mixtures thereof.

In one embodiment, examples of crosslinking agent include but are not limited to: di-acrylate, tri-acrylate, tetra-acrylate, di-methacrylate, tri-methacrylate and tetra-methacrylate monomers derivatives and the like. Another example of crosslinking agent includes but is not limited to: monomers, oligomers or polymers made from di- or trifunctional monomers such as allyl methacrylate, diallyl maleate, 1,3-butanediol dimethacrylate, 1,4-butanediol dimethacrylate, 1,6-hexanediol dimethacrylate, pentaerythritol triacrylate, trimethylolpropane triacrylate, Ethylene glycol dimethacrylate, Triethylene glycol dimethacrylate, N,N-methylenebis(acrylamide), N,N'-Hexamethylenebis (methacrylamide), and divinyl benzene.

In one embodiment, the polymerizable formulation may further comprise scattering particles Examples of scattering particles include but are not limited to: $SiO_2$, $ZrO_2$, ZnO, MgO, $SnO_2$, $TiO_2$, Ag, Au, alumina, barium sulfate, PTFE, barium titanate and the like.

In one embodiment, the polymerizable formulation may further comprise a thermal conductor.

Examples of thermal conductor include but are not limited to: $SiO_2$, $ZrO_2$, ZnO, MgO, $SnO_2$, $TiO_2$, CaO, alumina, barium sulfate, PTFE, barium titanate and the like. In this embodiment, the thermal conductivity of the liquid vehicle is increased.

In one embodiment, the polymerizable formulation may further comprise a photo initiator.

Examples of photo initiators include but are not limited to: α-hydroxyketone, phenylglyoxylate, benzyldimethylketal, α-aminoketone, monoacylphosphine oxides, bisacylphosphine oxides, phosphine oxide, benzophenone and derivatives, polyvinyl cinnamate, metallocene or iodonium salt derivatives, 1-hydroxycyclohexyl phenyl ketone, thioxanthones (such as isopropylthioxanthone), 2-hydroxy-2-methyl-1-phenylpropan-1-one, 2-benzyl-2-dimethylamino-(4-morpholinophenyl)butan-1-one, benzil dimethylketal, bis (2,6-dimethylbenzoyl)-2,4,4-trimethylpentylphosphine oxide, 2,4,6-trimethylbenzoyldiphenylphosphine oxide, 2-methyl-1-[4-(methylthio)phenyl]-2-morpholinopropan-1-one, 2,2-dimethoxy-1,2-diphenylethan-1-one or 5,7-diiodo-3-butoxy-6-fluorone and the like. Other examples of photo initiators include, without limitation, Irgacure™ 184, Irgacure™ 500, Irgacure™ 907, Irgacure™ 369, Irgacure™ 1700, Irgacure™ 651, Irgacure™ 819, Irgacure™ 1000, Irgacure™ 1300, Irgacure™ 1870, Darocur™ 1 173, Darocur™ 2959, Darocur™ 4265 and Darocur™ ITX (available from Ciba Specialty Chemicals), Lucerin™ TPO (available from BASF AG), Esacure™ KT046, Esacure™ KIP150, Esacure™ KT37 and Esacure™ EDB (available from Lamberti), H-Nu™ 470 and H-Nu™ 470X (available from Spectra Group Ltd) and the like.

Further examples of photo initiators include, but are not limited to, those described in WO2017211587. Those include, but are not limited to, photo initiators of Formula (I) and mixtures thereof:

Formula (I)

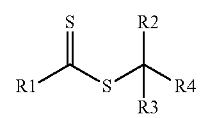

wherein:

R1 is selected from the group comprising or consisting of an optionally substituted alkyl group, an optionally substituted aryl or heteroaryl group, an optionally substituted alkenyl group, an optionally substituted alkynyl group, an optionally substituted alkaryl group, an optionally substituted aralkyl group, R5-O— and R6-S—;

R5 and R6 are independently selected from the group comprising or consisting of an optionally substituted alkyl group, an optionally substituted aryl or heteroaryl group, an optionally substituted alkenyl group, an optionally substituted alkynyl group, an optionally substituted alkaryl group and an optionally substituted aralkyl group;

R2 is selected from the group comprising or consisting of a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group;

R3 is selected from the group comprising or consisting of an electron withdrawing group comprising at least one oxygen carbon double bond, a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group; and R4 is selected from the group comprising or consisting of an electron withdrawing group comprising at least one oxygen carbon double bond, a nitrile group, an aryl group and a heteroaryl group;

with the proviso that at least one of R1 to R6 is functionalized with a photoinitiating moiety.

In one embodiment, the photo initiator according to Formula (I) is a compound wherein:

R1 is selected from the group comprising or consisting of an alkyl group, an aryl group, a heteroaryl group, an alkenyl group, an alkynyl group, an alkaryl group, an aralkyl group, R5-O—, R6-S— and a photoinitiating moiety selected from the group comprising or consisting of a thioxanthone group, a benzophenone group, an α-hydroxyketone group, an α-aminoketone group, an acylphosphine oxide group and a phenyl glyoxalic acid ester group;

R5 and R6 are independently selected from the group comprising or consisting of an alkyl group, an aryl or heteroaryl group, an alkenyl group, an alkynyl group, an alkaryl group, an aralkyl group and a photoinitiating moiety selected from the group consisting of a thioxanthone group, a benzophenone group, an α-hydroxyketone group, an α-aminoketone group, an acylphosphine oxide group and a phenyl glyoxalic acid ester group;

R2 is selected from the group comprising or consisting of hydrogen, an alkyl group, an aryl group, a heteroaryl group, an alkenyl group, an alkynyl group, an alkaryl group and an aralkyl group;

R3 is selected from the group comprising or consisting of —C(═O)—O—R7, —C(═O)—NR8-R9, C(═O)—R7, hydrogen, an alkyl group, an aryl group, heteroaryl group, an alkenyl group, an alkynyl group, an alkaryl group, an aralkyl group, a thioxanthone group, a benzophenone group, an α-aminoketone group, an acylphosphine oxide group and a phenyl glyoxalic acid ester group; and R4 is selected from the group comprising or consisting of —C(═O)—O—R10, —C(═O)—NR11-R12, C(═O)—R10, a nitrile group, an aryl group, a heteroaryl group, a thioxanthone group, a benzophenone group, an α-aminoketone group, an acylphosphine oxide group and a phenyl glyoxalic acid ester group;

R7 to R10 are independently selected from the group consisting of hydrogen, an alkyl group, an aryl or heteroaryl group, an alkenyl group, an alkynyl group, an alkaryl group, an aralkyl group and a photoinitiating moiety selected from the group consisting of a thioxanthone group, a benzophenone group, an α-hydroxyketone group, an α-aminoketone group, an acylphosphine oxide group and a phenyl glyoxalic acid ester group, or R8 and R9 and/or R11 and R12 may represent the necessary atoms to form a five or six membered ring;

with the proviso that at least one of R1, R3 and R4 is functionalized with a photoinitiating moiety.

In one embodiment, the photo initiator according to Formula (I) is a compound of Formula (II):

Formula (II)

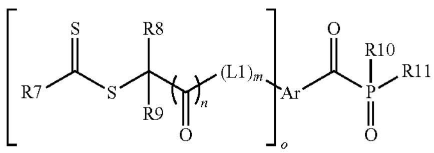

wherein:

R7 is selected from the group comprising or consisting of an optionally substituted alkyl group, an optionally substituted aryl or heteroaryl group, an optionally substituted alkenyl group, an optionally substituted alkynyl group, an optionally substituted alkaryl group, an optionally substituted aralkyl group, —O—R5 and —S—R6;

Ar represents an optionally substituted carbocyclic arylene group;

L1 represents a divalent linking group comprising not more than 10 carbon atoms;

R8 and R9 are independently selected from the group comprising or consisting of a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group;

R10 is selected from the group consisting of an optionally substituted alkyl group, an optionally substituted aryl group, an optionally substituted alkoxy group and an optionally substituted aryloxy group;

R11 is selected from the group comprising or consisting of an optionally substituted alkyl group, an optionally substituted aryl group, an optionally substituted alkoxy group, an optionally substituted aryloxy group and an acyl group;

n and m each independently represent 1 or 0;

o represents an integer from 1 to 5;

with the proviso that if n=0 and m=1 that L1 is coupled to CR8R9 via a carbon atom of an aromatic or heteroaromatic ring.

In one embodiment, the photo initiator according to Formula (I) is a compound of Formula (III):

Formula (III)

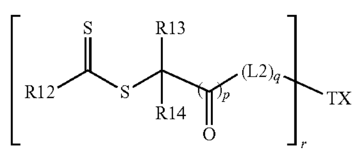

wherein:

R12 is selected from the group comprising or consisting of an optionally substituted alkyl group, an optionally substituted aryl or heteroaryl group, an optionally substituted alkenyl group, an optionally substituted alkynyl group, an optionally substituted alkaryl group, an optionally substituted aralkyl group, —O—R5 and —S—R6;

R5 and R6 are independently selected from the group comprising or consisting of an optionally substituted alkyl group, an optionally substituted aryl or heteroaryl group, an optionally substituted alkenyl group, an optionally substituted alkynyl group, an optionally substituted alkaryl group and an optionally substituted aralkyl group;

L2 represents a divalent linking group comprising or consisting of not more than 20 carbon atoms;

TX represents an optionally substituted thioxanthone group;

p and q each independently represent 1 or 0;

r represents an integer from 1 to 5;

R13 and R14 are independently selected from the group comprising or consisting of a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group;

with the proviso that if p=0 and q=1 that L2 is coupled to CR13R14 via a carbon atom of an aromatic or heteroaromatic ring.

In one embodiment, the photo initiator according to Formula (I) is a compound of Formula (IV):

Formula (IV)

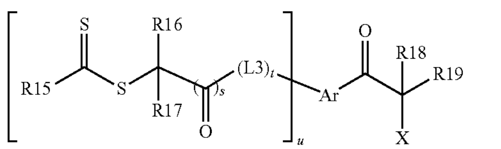

wherein:

R15 is selected from the group comprising or consisting of an optionally substituted alkyl group, an optionally substituted aryl or heteroaryl group, an optionally substituted alkenyl group, an optionally substituted alkynyl group, an optionally substituted alkaryl group, an optionally substituted aralkyl group, —O—R5 and —S—R6;

R5 and R6 are independently selected from the group comprising or consisting of an optionally substituted alkyl group, an optionally substituted aryl or heteroaryl group, an optionally substituted alkenyl group, an optionally substituted alkynyl group, an optionally substituted alkaryl group and an optionally substituted aralkyl group;

Ar represents an optionally substituted carbocyclic arylene group;

L3 represents a divalent linking group comprising or consisting not more than 20 carbon atoms;

R16 and R17 are independently selected from the group comprising or consisting of a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group;

R18 and R19 are independently selected from the group comprising or consisting of an optionally substituted alkyl group, an optionally substituted aryl group, an optionally substituted aralkyl group and an optionally substituted alkaryl group with the proviso that R18 and R19 may represent the necessary atoms to form a five to eight membered ring; X represents OH or NR20R21;

R20 and R21 are independently selected from the group comprising or consisting of an optionally substituted alkyl group, an optionally substituted aryl group, an optionally substituted aralkyl group and an optionally substituted alkaryl group, with the proviso that R20 and R21 may represent the necessary atoms to form a five to eight membered ring;

s and t each independently represent 1 or 0;

u represents an integer from 1 to 5;

with the proviso that if s=0 and t=1 that L3 is coupled to CR16R17 via a carbon atom of an aromatic or heteroaromatic ring.

In one embodiment, the photo initiator according to Formula (I) is a compound of Formula (V):

Formula (V)

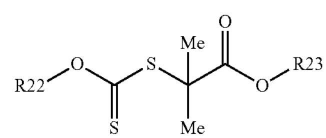

wherein:

R22 represents an alkyl group having no more than 6 carbon atoms; and

R23 represents a photoinitiating moiety selected from the group comprising or consisting of an acylphosphine oxide group, a thioxanthone group, a benzophenone group, an α-hydroxy ketone group and an α-amino ketone group.

In one embodiment, the photo initiator according to Formula (I) is a compound of Formula (VI) to (XXVIII):

Formula (VI)

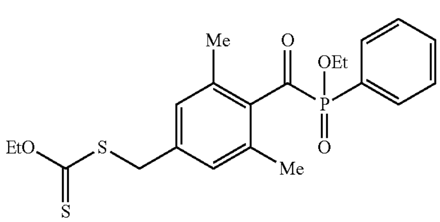

Formula (VII)

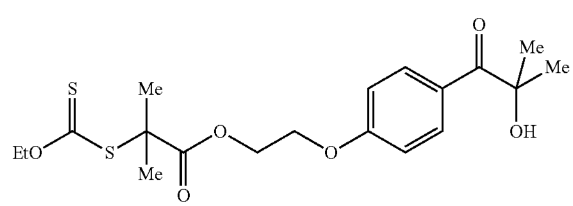

Formula (VIII)

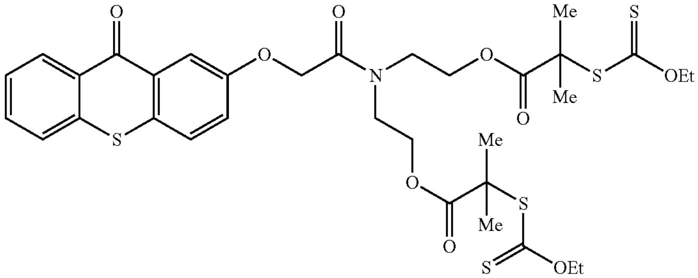

-continued
Formula (IX)
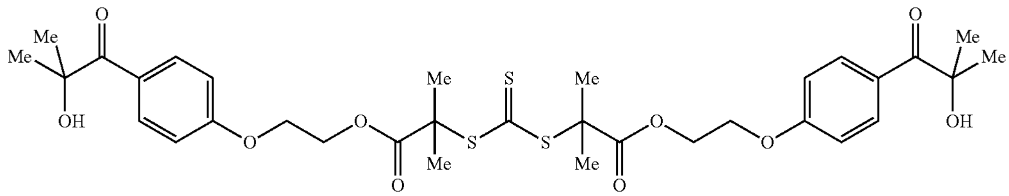
Formula (X)
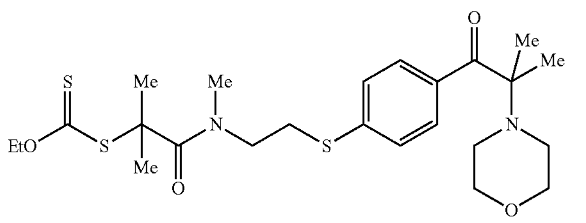
Formula (XI)
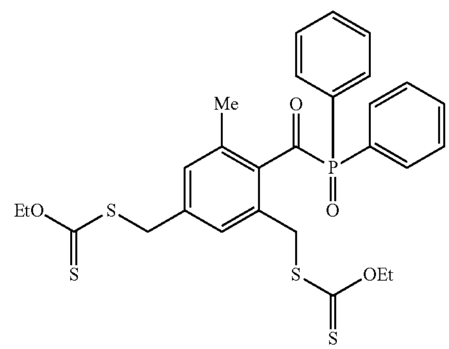
Formula (XII)
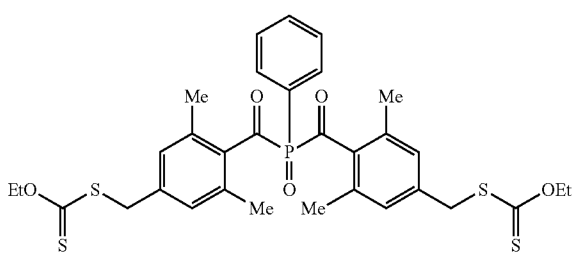
Formula (XIII)
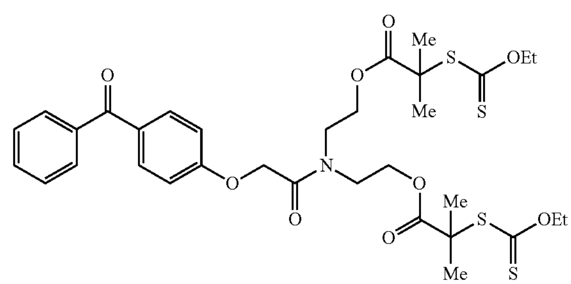
Formula (XIV)
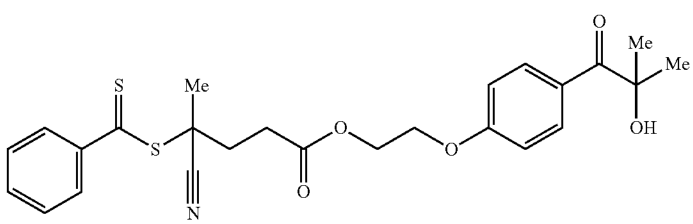
Formula (XV)
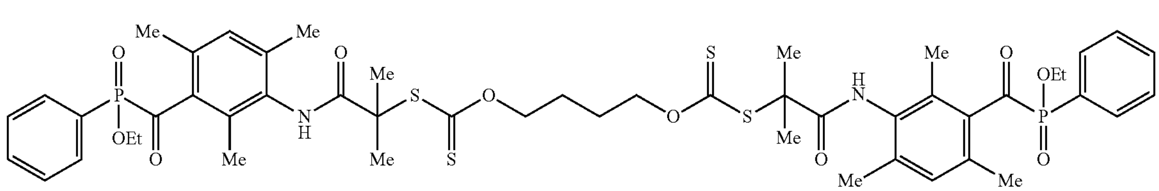
Formula (XVI)
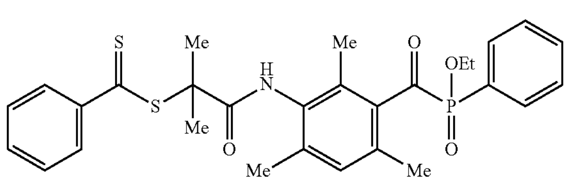
Formula (XVII)
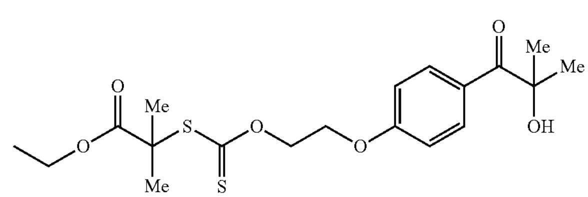

-continued
Formula (XVIII)
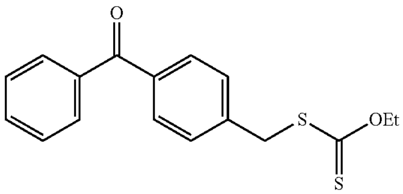
Formula (XIX)
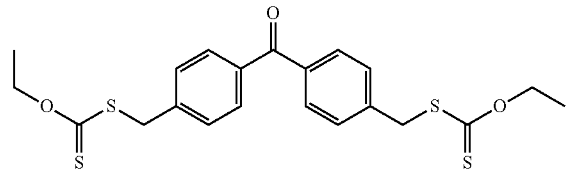
Formula (XX)
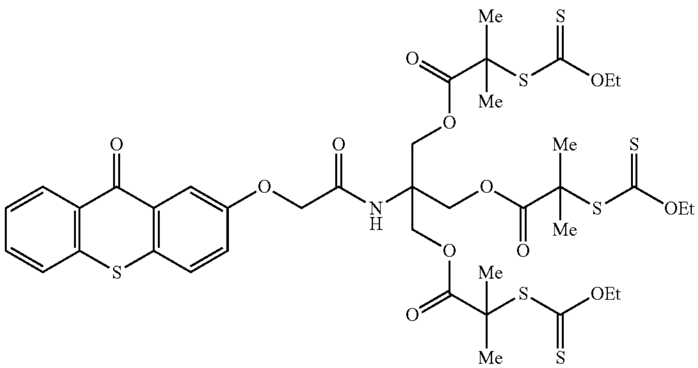
Formula (XXI)
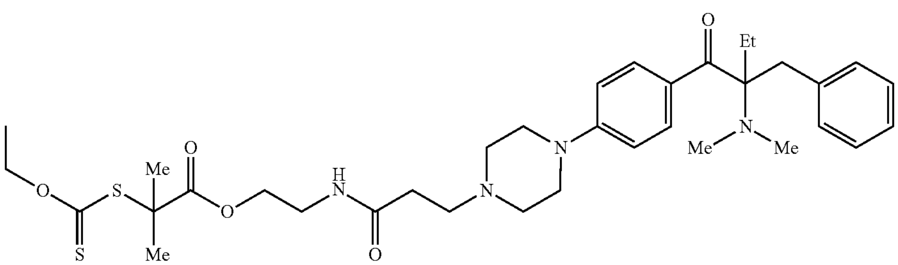
Formula (XXII)
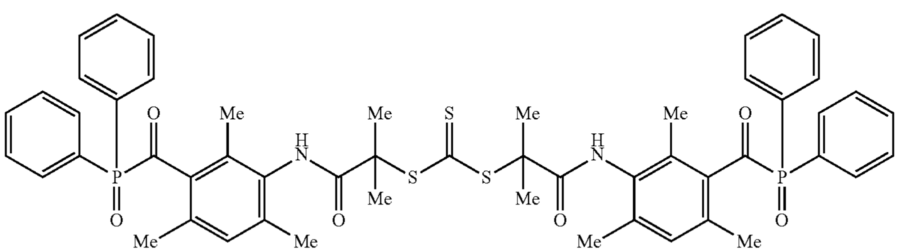
Formula (XXIII)
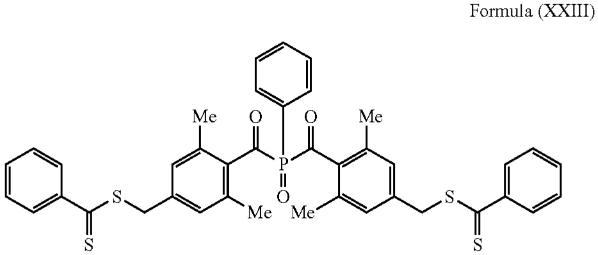
Formula (XXIV)
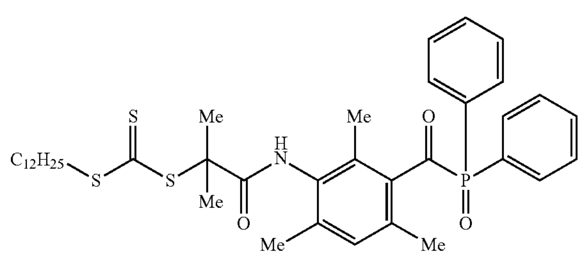
Formula (XXV)
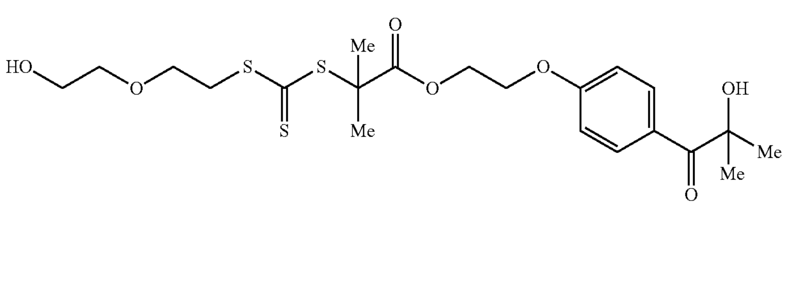

-continued
Formula (XXVI)
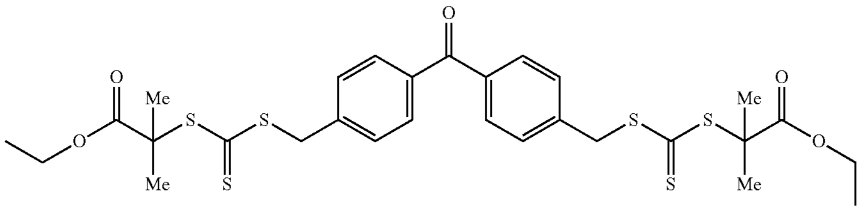
Formula (XXVII)
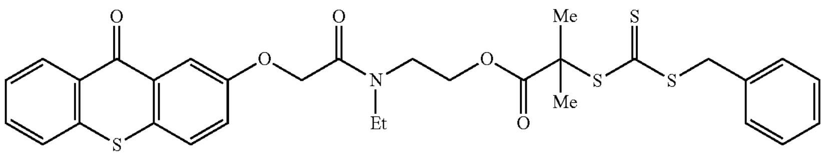
Formula (XXVIII)
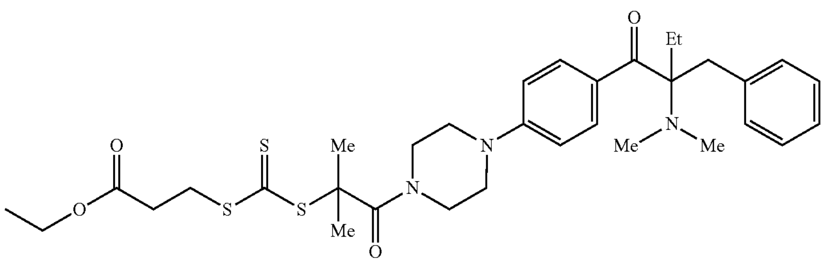
Further examples of photo initiators include, but are not limited to, polymerizable photo initiators, such as, e.g., those described in WO2017220425. Those include, but are not limited to, photo initiators of Formula (XXIX) and Formula (XXX), and mixtures thereof:
(Formula XXIX)
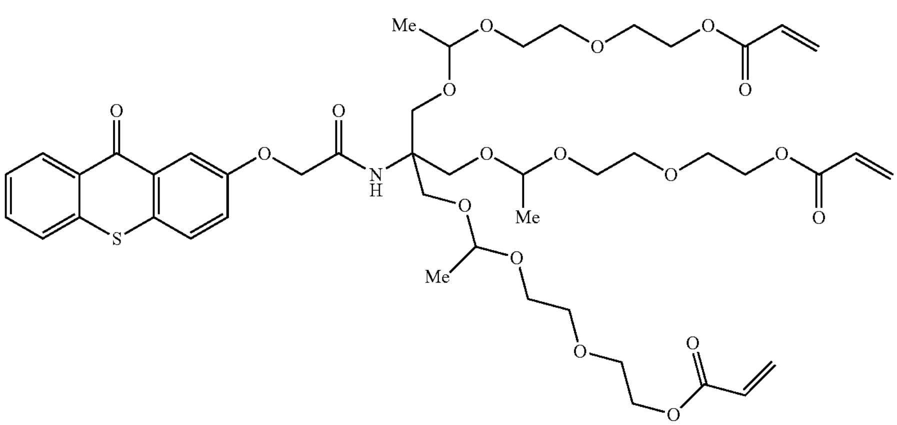

-continued (Formula XXX)

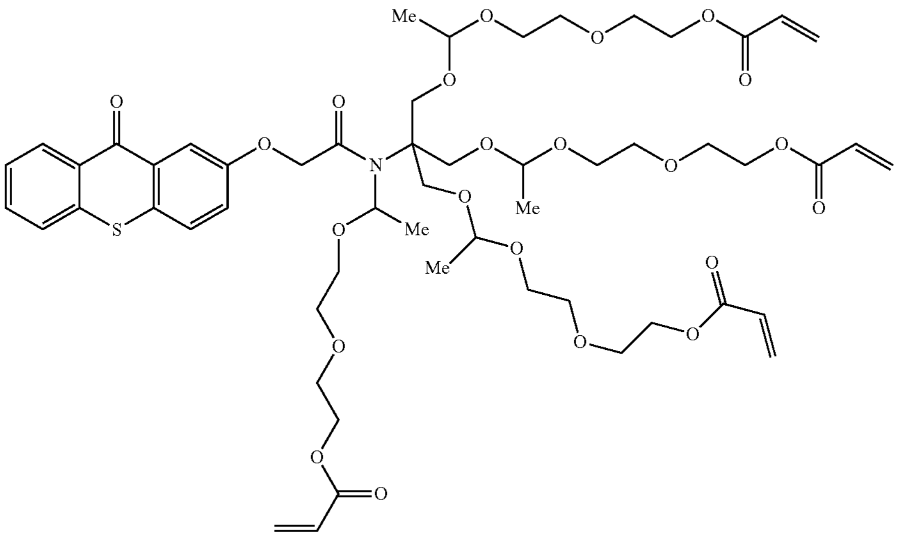

Preferably, a mixture of polymerizable photo initiators of Formula (XXIX) and Formula (XXX) may comprise or consist of an amount ranging from 0.1% w/w to 20.0% w/w, more preferably no more than 10.0% w/w of the photo initiator of Formula (XXX), based on the total weight of polymerizable photo initiators of Formula (XXIX) and Formula (XXX). Preferably, a mixture of polymerizable photo initiators of Formula (XXIX) and Formula (XXX) may comprise or consist of an amount of 75.0% w/w, more preferably an amount ranging from 80.0% w/w to 99.9% w/w of the photo initiator of Formula (XXIX), based on the total weight of polymerizable photo initiators of Formula (XXIX) and Formula (XXX).

In one embodiment, the polymerizable formulation may further comprise a thermal initiator. Examples of thermal initiator include but are limited to: peroxide compounds, azo compounds such as azobisisobutyronitrile (AIBN) and 4,4-Azobis(4-cyanovaleric acid), potassium and ammonium persulfate, tert-Butyl peroxide, benzoyl peroxide and the like.

In one embodiment, the polymeric liquid vehicle and/or the film-forming material may be a polymerized solid made from an alkyl methacrylates or an alkyl acrylates such as acrylic acid, methacrylic acid, crotonic acid, acrylonitrile, acrylic esters substituted with methoxy, ethoxy, propoxy, butoxy, and similar derivatives for example, methyl acrylate, ethyle acrylate, propyl acrylate, butyl acrylate, isobutyl acrylate, lauryl acrylate, norbornyl acrylate, 2-ethyl hexyl acrylate, 2-hydroxyethyl acrylate, 4-hydroxybutyl acrylate, benzyl acrylate, phenyl acrylate, isobornyle acrylate, hydroxypropyl acrylate, fluorinated acrylic monomers, chlorinated acrylic monomers, methacrylic acid, methyl methacrylate, nbutyl methacrylate, isobutyl methacrylate, 2-ethyl hexyl methacrylate, 2-hydroxyethyl methacrylate, 4-hydroxybutyl methacrylate, benzyl methacrylate, phenyl methacrylate, lauryl methacrylate, norbornyl methacrylate, isobornyle methacrylate, hydroxypropyl methacrylate, fluorinated methacrylic monomers, chlorinated methacrylic monomers, alkyl crotonates, allyl crotonates, glycidyl methacrylate and related esters.

In one embodiment, the polymeric liquid vehicle and/or the film-forming material may be a polymerized solid made from an alkyl acrylamide or alkyl methacrylamide such as acrylamide, Alkylacrylamide, Ntert-Butylacrylamide, Diacetone acrylamide, N,N-Diethylacrylamide, N-Isobutoxymethyl)acrylamide, N-(3-Methoxypropyl)acrylamide, NDiphenylmethylacrylamide, N-Ethylacrylamide, N-Hydroxyethyl acrylamide, N-(Isobutoxymethyl)acrylamide, N-Isopropylacrylamide, N-(3-Methoxypropyl)acrylamide, N-Phenylacrylamide, N-[Tris(hydroxymethyl)methyl] acrylamide, N,N-Diethylmethacrylamide, N,NDimethylacrylamide, N-[3-(Dimethylamino)propyl] methacrylamide, N-(Hydroxymethyl)acrylamide, 2-Hydroxypropyl methacrylamide, NIsopropylmethacrylamide, Methacrylamide, N-(Triphenylmethyl)methacrylamide and similar derivatives.

In one embodiment, the polymeric liquid vehicle and/or the film-forming material may be a polymerized solid made from alpha-olefins, dienes such as butadiene and chloroprene; styrene, alpha-methyl styrene, and the like; heteroatom substituted alpha-olefins, for example, vinyl acetate, vinyl alkyl ethers for example, ethyl vinyl ether, vinyltrimethylsilane, vinyl chloride, tetrafluoroethylene, chlorotrifiuoroethylene, cyclic and polycyclic olefin compounds for example, cyclopentene, cyclohexene, cycloheptene, cyclooctene, and cyclic derivatives up to C20; polycyclic derivates for example, norbornene, and similar derivatives up to C20; cyclic vinyl ethers for example, 2, 3-dihydrofuran, 3,4-dihydropyran, and similar derivatives; allylic alcohol derivatives for example, vinylethylene carbonate, disubstituted olefins such as maleic and fumaric compounds for example, maleic anhydride, diethylfumarate, and the like, and mixtures thereof.

In one embodiment, the polymeric liquid vehicle and/or the film-forming material may be PMMA, Poly(lauryl methacrylate), glycolized poly(ethylene terephthalate), Poly(maleic anhydride-altoctadecene), or mixtures thereof.

In one embodiment, the polymeric liquid vehicle and/or the film-forming material may comprise a copolymer of vinyl chloride and a hydroxyfunctional monomer. Such copolymer is described, e.g., in WO2017102574. In such embodiment, examples of hydroxyfunctional monomers include, without limitation, 2-hydroxypropyl acrylate, 1-hydroxy-2-propyl acrylate, 3-methyl-3-buten-1-ol, 2-methyl-2-propenoic acid 2-hydroxypropyl ester, 2-hydroxy-3-chloropropyl methacrylate, N-methylolmethacrylamide, 2-hydroxyethyl methacrylate, poly(ethylene oxide) monomethacrylate, glycerine monomethacrylate, 1,2-propylene glycol methacrylate, 2,3-hydroxypropyl methacrylate, 2-hydroxyethyl acrylate, vinyl alcohol, N-methylolacrylamid, 2-propenoic acid 5-hydroxypentyl ester, 2-methyl-2-propenoic acid, 3-chloro-2-hydroxypropyl ester, 1-hydroxy-2-propenoic acid, 1-methylethyl ester, 2-hydroxyethyl allyl ether, 4-hydroxybutyl acrylate, 1,4-butanediol monovinyl ether, poly(e-caprolactone) hydroxyethyl methacrylate ester, poly(ethylene oxide) monomethacrylate, 2-methyl-2-propenoic acid, 2,5-dihydroxypentyl ester, 2-methyl-2-propenoic acid, 5,6-dihydroxyhexyl ester, 1,6-hexanediol monomethacrylate, 1,4-dideoxy-pentitol, 5-(2-methyl-2-propenoate), 2-propenoic acid, 2,4-dihydroxybutyl ester, 2-propenoic acid, 3,4-dihydroxybutyl ester, 2-methyl-2-propenoic acid, 2-hydroxy butyl ester, 3-hydroxypropyl methacrylate, 2-propenoic acid, 2,4-dihydroxybutyl ester and isopropenyl alcohol. Examples of copolymers of vinyl chloride and a hydroxyfunctional monomer include, without limitation, chloroethylene-vinyl acetate-vinyl alcohol copolymer, vinyl alcohol-vinyl chloride copolymer, 2-hydroxypropyl acrylate-vinyl chloride polymer, propanediol monoacrylate-vinyl chloride copolymer, vinyl acetate-vinyl chloride-2-hydroxypropyl acrylate copolymer, hydroxyethyl acrylate-vinyl chloride copolymer and 2-hydroxyethyl methacrylate-vinyl chloride copolymer.

In another embodiment, the ink may further comprise at least one solvent.

According to this embodiment, the solvent is one that allows the solubilization of the particles of the invention and polymeric liquid vehicle and/or the film-forming material such as for example, pentane, hexane, heptane, tetradecane, 1,2-hexanediol, 1,5-pentanediol, cyclohexane, petroleum ether, toluene, benzene, xylene, chlorobenzene, carbon tetrachloride, chloroform, dichloromethane, 1,2-dichloroethane, THF (tetrahydrofuran), acetonitrile, acetone, ethanol, methanol, ethyl acetate, ethylene glycol, diglyme (diethylene glycol dimethyl ether), diethyl ether, DME (1,2-dimethoxy-ethane, glyme), DMF (dimethylformamide), NMF (N-methylformamide), FA (Formamide), DMSO (dimethyl sulfoxide), 1,4-Dioxane, triethyl amine, alkoxy alcohol, alkyl alcohol, alkyl benzene, alkyl benzoate, alkyl naphthalene, amyl octanoate, anisole, aryl alcohol, benzyl alcohol, butyl benzene, butyrophenon, cis-decalin, dipropylene glycol methyl ether, dodecyl benzene, propylene glycol methyl ether acetate (PGMEA), mesitylene, methoxy propanol, methylbenzoate, methyl naphthalene, methyl pyrrolidinone, phenoxy ethanol, 1,3-propanediol, pyrrolidinone, trans-decalin, valerophenone, or mixture thereof. In this embodiment, particle of the invention refers to particle 1, particle 2 and/or nanophosphor nanoparticle.

According to one embodiment, the ink comprises at least two solvents as described hereabove. In this embodiment, the solvents are miscible together.

According to one embodiment, the ink comprises a blend of solvents as described hereabove. In this embodiment, the solvents are miscible together.

According to one embodiment, the ink comprises a plurality of solvents as described hereabove.

In this embodiment, the solvents are miscible together.

According to one embodiment, the solvent comprised in the ink is miscible with water.

In another embodiment, the ink comprises a blend of solvents such as for example: a blend of benzyl alcohol and butyl benzene, a blend of benzyl alcohol and anisole, a blend of benzyl alcohol and mesitylene, a blend of butyl benzene and anisole, a blend of butyl benzene and mesitylene, a blend of anisole and mesitylene, a blend of dodecyl benzene and cis-decalin, a blend of dodecyl benzene and benzyl alcohol, a blend of dodecyl benzene and butyl benzene, a blend of dodecyl benzene and anisole, a blend of dodecyl benzene and mesitylene, a blend of cis-decalin and benzyl alcohol, a blend of cis-decalin and butyl benzene, a blend of cis-decalin and anisole, a blend of cis-decalin and mesitylene, a blend of trans-decalin and benzyl alcohol, a blend of trans-decalin and butyl benzene, a blend of trans-decalin and anisole, a blend of trans-decalin and mesitylene, a blend of methyl pyrrolidinone and anisole, a blend of methylbenzoate and anisole, a blend of methyl pyrrolidinone and methyl naphthalene, a blend of methyl pyrrolidinone and methoxy propanol, a blend of methyl pyrrolidinone and phenoxy ethanol, a blend of methyl pyrrolidinone and amyl octanoate, a blend of methyl pyrrolidinone and trans-decalin, a blend of methyl pyrrolidinone and mesitylene, a blend of methyl pyrrolidinone and butyl benzene, a blend of methyl pyrrolidinone and dodecyl benzene, a blend of methyl pyrrolidinone and benzyl alcohol, a blend of anisole and methyl naphthalene, a blend of anisole and methoxy propanol, a blend of anisole and phenoxy ethanol, a blend of anisole and amyl octanoate, a blend of methylbenzoate and methyl naphthalene, a blend of methylbenzoate and methoxy propanol, a blend of methylbenzoate and phenoxy ethanol, a blend of methylbenzoate and amyl octanoate, a blend of methylbenzoate and cis-decalin, a blend of methylbenzoate and trans-decalin, a blend of methylbenzoate and mesitylene, a blend of methylbenzoate and butyl benzene, a blend of methylbenzoate and dodecyl benzene, a blend of methylbenzoate and benzyl alcohol, a blend of methyl naphthalene and methoxy propanol, a blend of methyl naphthalene and phenoxy ethanol, a blend of methyl naphthalene and amyl octanoate, a blend of methyl naphthalene and cis-decalin, a blend of methyl naphthalene and trans-decalin, a blend of methyl naphthalene and mesitylene, a blend of methyl naphthalene and butyl benzene, a blend of methyl naphthalene and dodecyl benzene, a blend of methyl naphthalene and benzyl alcohol, a blend of methoxy propanol and phenoxy ethanol, a blend of methoxy propanol and amyl octanoate, a blend of methoxy propanol and cis-decalin, a blend of methoxy propanol and trans-decalin, a blend of methoxy propanol and mesitylene, a blend of methoxy propanol and butyl benzene, a blend of methoxy propanol and dodecyl benzene, a blend of methoxy propanol and benzyl alcohol, a blend of phenoxy ethanol and amyl octanoate, a blend of phenoxy propanol and mesitylene, a blend of phenoxy propanol and butyl benzene, a blend of phenoxy propanol and dodecyl benzene, a blend of phenoxy propanol and benzyl alcohol, a blend of amyl octanoate and cis-decalin, a blend of amyl octanoate and trans-decalin, a blend of amyl octanoate and mesitylene, a blend of amyl octanoate and butyl benzene, a blend of amyl octanoate and dodecyl benzene, a blend of amyl octanoate and benzyl alcohol, or a combination thereof.

According to one embodiment, the ink comprises a blend of valerophenon and dipropyleneglycol methyl ether, a blend of valerophenon and butyrophenon, a blend of dipropyleneglycol methyl ether and butyrophenon, a blend of dipropyleneglycol methyl ether and 1,3-propanediol, a blend of butyrophenon and 1,3-propanediol, a blend of dipropyleneglycol methyl ether, 1,3-propanediol, and water, or a combination thereof.

According to one embodiment, the ink comprises a blend of three, four, five, or more solvents can be used for the vehicle. For example, the vehicle can comprise a blend of three, four, five, or more solvents selected from pyrrolidinone, methyl pyrrolidinone, anisole, alkyl benzoate, methylbenzoate, alkyl naphthalene, methyl naphthalene, alkoxy alcohol, methoxy propanol, phenoxy ethanol, amyl octanoate, cis-decalin, trans-decalin, mesitylene, alkyl benzene, butyl benzene, dodecyl benzene, alkyl alcohol, aryl alcohol, benzyl alcohol, butyrophenon, dipropylene glycol methyl ether, valerophenon, and 1,3-propanediol. According to one embodiment, the ink comprises three or more solvents selected from cis-decalin, trans-decalin, benzyl alcohol, butyl benzene, anisole, mesitylene, and dodecyl benzene.

In some embodiments, each of the solvents in each of the blends listed above is present in an amount of at least 5% by weight based on the total weight of the liquid vehicle, for example, at least 10% by weight, at least 15% by weight, at least 20% by weight, at least 25% by weight, at least 30% by weight, at least 35% by weight, or at least 40% by weight. In some embodiments, each of the solvents in each of the blends listed can comprise 50% by weight of the liquid vehicle based on the total weight of the liquid vehicle.

In another embodiment, the ink comprises the particles of the invention and a polymeric liquid vehicle, and does not comprise a solvent. In this embodiment, said particles and liquid vehicle can be mixed by extrusion. In this embodiment, particle of the invention refers to particle 1, particle 2 and/or nanophosphor nanoparticle.

In another embodiment, the ink comprises infrared emitting particles of the invention, i.e., having a maximum emission wavelength ranging from 750 nm to 50 am. In this embodiment, the particles emit near infra-red, mid-infra-red, or infra-red light.

In another embodiment, the ink comprises red emitting particles of the invention, i.e., having a maximum emission wavelength ranging from 590 nm to 750 nm, more preferably ranging from 610 nm to 650 nm.

In another embodiment, the ink comprises yellow emitting particles of the invention, i.e., having a maximum emission wavelength ranging from 560 nm to 590 nm.

In another embodiment, the ink comprises green emitting particles of the invention, i.e., having a maximum emission wavelength ranging from 500 nm to 560 nm, more preferably ranging from 515 nm to 545 nm.

In another embodiment, the ink comprises blue emitting particles of the invention, i.e., having a maximum emission wavelength ranging from 400 nm to 500 nm.

According to another embodiment, the liquid vehicle and/or the film-forming material is inorganic.

According to one embodiment, the liquid vehicle and/or the film-forming material does not comprise glass.

According to one embodiment, the liquid vehicle and/or the film-forming material does not comprise vitrified glass.

According to one embodiment, examples of inorganic liquid vehicle and/or the film-forming material include but are not limited to: materials obtainable by sol-gel process, metal oxides such as for example $SiO_2$, $Al_2O_3$, $TiO_2$, $ZrO_2$, ZnO, MgO, $SnO_2$, $IrO_2$, or a mixture thereof. Said liquid vehicle and/or the film-forming material acts as a supplementary barrier against oxidation and can drain away the heat if it is a good thermal conductor.

According to one embodiment, the liquid vehicle and/or the film-forming material is composed of a material selected in the group of metals, halides, chalcogenides, phosphides, sulfides, metalloids, metallic alloys, ceramics such as for example oxides, carbides, nitrides, glasses, enamels, ceramics, stones, precious stones, pigments, cements and/or inorganic polymers. Said liquid vehicle and/or the film-forming material is prepared using protocols known to the person skilled in the art.

According to one embodiment, a chalcogenide is a chemical compound consisting of at least one chalcogen anion selected in the group of O, S, Se, Te, Po, and at least one or more electropositive element.

According to one embodiment, the metallic liquid vehicle and/or the film-forming material is selected in the group of gold, silver, copper, vanadium, platinum, palladium, ruthenium, rhenium, yttrium, mercury, cadmium, osmium, chromium, tantalum, manganese, zinc, zirconium, niobium, molybdenum, rhodium, tungsten, iridium, nickel, iron, or cobalt.

According to one embodiment, examples of carbide liquid vehicle and/or the film-forming material include but are not limited to: SiC, WC, BC, MoC, TiC, $Al_4C_3$, $LaC_2$, FeC, CoC, HfC, $Si_xC_y$, $W_xC_y$, $B_xC_y$, $Mo_xC_y$, $Ti_xC_y$, $Al_xC_y$, $La_xC_y$, $Fe_xC_y$, $Co_xC_y$, $Hf_xC_y$, or a mixture thereof; x and y are independently a decimal number from 0 to 5, at the condition that x and y are not simultaneously equal to 0, and $x \neq 0$.

According to one embodiment, examples of oxide liquid vehicle and/or the film-forming material include but are not limited to: $SiO_2$, $Al_2O_3$, $TiO_2$, $ZrO_2$, ZnO, MgO, $SnO_2$, $Nb_2Os$, $CeO_2$, BeO, $IrO_2$, CaO, $Sc_2O_3$, NiO, $Na_2O$, BaO, $K_2O$, PbO, $Ag_2O$, $V_2O_5$, $TeO_2$, MnO, $B_2O_3$, $P_2O_5$, $P_2O_3$, $P_4O_7$, $P_4O_8$, $P_4O_9$, $P_2O_6$, PO, $GeO_2$, $As_2O_3$, $Fe_2O_3$, $Fe_3O_4$, $Ta_2O_5$, $Li_2O$, SrO, $Y_2O_3$, $HfO_2$, $WO_2$, $MoO_2$, $Cr_2O_3$, $Tc_2O_7$, $ReO_2$, $RuO_2$, $Co_3O_4$, OsO, $RhO_2$, $Rh_2O_3$, PtO, PdO, CuO, $Cu_2O$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof.

According to one embodiment, examples of oxide liquid vehicle and/or the film-forming material include but are not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

According to one embodiment, examples of nitride liquid vehicle and/or the film-forming material include but are not limited to: TiN, $Si_3N_4$, MoN, VN, TaN, $Zr_3N_4$, HfN, FeN, NbN, GaN, CrN, AlN, InN, $Ti_xN_y$, $Si_xN_y$, $Mo_xN_y$, $V_xN_y$, $Ta_xN_y$, $Zr_xN_y$, $Hf_xN_y$, $Fe_xN_y$, $Nb_xN_y$, $Ga_xN_y$, $Cr_xN_y$, $Al_xN_y$, $In_xN_y$, or a mixture thereof; x and y are independently a decimal number from 0 to 5, at the condition that x and y are not simultaneously equal to 0, and $x \neq 0$.

According to one embodiment, examples of sulfide liquid vehicle and/or the film-forming material include but are not limited to: $Si_yS_x$, $Al_yS_x$, $Ti_yS_x$, $Zr_yS_x$, $Zn_yS_x$, $Mg_yS_x$, $Sn_yS_x$, $Nb_yS_x$, $Ce_yS_x$, $Be_yS_x$, $Ir_yS_x$, $Ca_yS_x$, $Sc_yS_x$, $Ni_yS_x$, $Na_yS_x$, $Ba_yS_x$, $K_yS_x$, $Pb_yS_x$, $Ag_yS_x$, $V_yS_x$, $Te_yS_x$, $Mn_yS_x$, $B_yS_x$, $P_yS_x$, $Ge_yS_x$, $As_yS_x$, $Fe_yS_x$, $Ta_yS_x$, $Li_yS_x$, $Sr_yS_x$, $Y_yS_x$, $Hf_yS_x$, $W_yS_x$, $Mo_yS_x$, $Cr_yS_x$, $Tc_yS_x$, $Re_yS_x$, $Ru_yS_x$, $Co_yS_x$, $Os_yS_x$, $Rh_yS_x$, $Pt_yS_x$, $Pd_yS_x$, $Cu_yS_x$, $Au_yS_x$, $Cd_yS_x$, $Hg_yS_x$, $Tl_yS_x$, $Ga_yS_x$, $In_yS_x$, $Bi_yS_x$, $Sb_yS_x$, $Po_yS_x$, $Se_yS_x$, $Cs_yS_x$, mixed sulfides, mixed sulfides thereof or a mixture thereof; x and y are independently a decimal number from 0 to 10, at the condition that x and y are not simultaneously equal to 0, and $x \neq 0$.

According to one embodiment, examples of halide liquid vehicle and/or the film-forming material include but are not limited to: $BaF_2$, $LaF_3$, $CeF_3$, $YF_3$, $CaF_2$, $MgF_2$, $PrF_3$, AgCl, $MnCl_2$, $NiCl_2$, $Hg_2Cl_2$, $CaCl_2$, $CsPbCl_3$, AgBr, $PbBr_3$, $CsPbBr_3$, AgI, CuI, PbI, $HgI_2$, $BiI_3$, $CH_3NH_3PbI_3$, $CH_3NH_3PbCl_3$, $CH_3NH_3PbBr_3$, $CsPbI_3$, $FAPbBr_3$ (with FA formamidinium), or a mixture thereof.

According to one embodiment, examples of chalcogenide liquid vehicle and/or the film-forming material include but are not limited to: CdO, CdS, CdSe, CdTe, ZnO, ZnS, ZnSe, ZnTe, HgO, HgS, HgSe, HgTe, CuO, $Cu_2O$, CuS, $Cu_2S$, CuSe, CuTe, $Ag_2O$, $Ag_2S$, $Ag_2Se$, $Ag_2Te$, $Au_2S$, PdO, PdS, $Pd_4S$, PdSe, PdTe, PtO, PtS, $PtS_2$, PtSe, PtTe, $RhO_2$, $Rh_2O_3$, $RhS_2$, $Rh_2S_3$, $RhSe_2$, $Rh_2Se_3$, $RhTe_2$, $IrO_2$, $IrS_2$, $Ir_2S_3$, $IrSe_2$, $IrTe_2$, $RuO_2$, $RuS_2$, OsO, OsS, OsSe, OsTe, MnO, MnS, MnSe, MnTe, $ReO_2$, $ReS_2$, $Cr_2O_3$, $Cr_2S_3$, $MoO_2$, $MoS_2$, $MoSe_2$, $MoTe_2$, $WO_2$, $WS_2$, $WSe_2$, $V_2O_5$, $V_2S_3$, $Nb_2Os$, $NbS_2$, $NbSe_2$, $HfO_2$, $HfS_2$, $TiO_2$, $ZrO_2$, $ZrS_2$, $ZrSe_2$, $ZrTe_2$, $Sc_2O_3$, $Y_2O_3$, $Y_2S_3$, $SiO_2$, $GeO_2$, GeS, $GeS_2$, GeSe, $GeSe_2$, GeTe, $SnO_2$, SnS, $SnS_2$, SnSe, $SnSe_2$, SnTe, PbO, PbS, PbSe, PbTe, MgO, MgS, MgSe, MgTe, CaO, CaS, SrO, $Al_2O_3$, $Ga_2O_3$, $Ga_2S_3$, $Ga_2Se_3$, $In_2O_3$, $In_2S_3$, $In_2Se_3$, $In_2Te_3$, $La_2O_3$, $La_2S_3$, $CeO_2$, $CeS_2$, $Pr_6O_{11}$, $Nd_2O_3$, $NdS_2$, $La_2O_3$, $Tl_2O$, $Sm_2O_3$, $SmS_2$, $Eu_2O_3$, $EuS_2$, $Bi_2O_3$, $Sb_2O_3$, $PoO_2$, $SeO_2$, $Cs_2O$, $Tb_4O_7$, $TbS_2$, $Dy_2O_3$, $Ho_2O_3$, $Er_2O_3$, $ErS_2$, $Tm_2O_3$, $Yb_2O_3$, $Lu_2O_3$, $CuInS_2$, $CuInSe_2$, $AgInS_2$, $AgInSe_2$, $Fe_2O_3$, $Fe_3O_4$, FeS, $FeS_2$, $Co_3S_4$, CoSe, $Co_3O_4$, NiO, $NiSe_2$, NiSe, $Ni_3Se_4$, $Gd_2O_3$, BeO, $TeO_2$, $Na_2O$, BaO, $K_2O$, $Ta_2O_5$, $Li_2O$, $Tc_2O_7$, $As_2O_3$, $B_2O_3$, $P_2O_5$, $P_2O_3$, $P_4O_7$, $P_4O_8$, $P_4O_9$, $P_2O_6$, PO, or a mixture thereof.

According to one embodiment, examples of phosphide liquid vehicle and/or the film-forming material include but are not limited to: InP, $Cd_3P_2$, $Zn_3P_2$, AlP, GaP, TlP, or a mixture thereof.

According to one embodiment, examples of metalloid liquid vehicle and/or the film-forming material include but are not limited to: Si, B, Ge, As, Sb, Te, or a mixture thereof.

According to one embodiment, examples of metallic alloy liquid vehicle and/or the film-forming material include but are not limited to: Au—Pd, Au—Ag, Au—Cu, Pt—Pd, Pt—Ni, Cu—Ag, Cu—Sn, Ru—Pt, Rh—Pt, Cu—Pt, Ni—Au, Pt—Sn, Pd—V, Ir—Pt, Au—Pt, Pd—Ag, Cu—Zn, Cr—Ni, Fe—Co, Co—Ni, Fe—Ni or a mixture thereof.

According to one embodiment, the ink comprises garnets.

According to one embodiment, examples of garnets include but are not limited to: $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, or a mixture thereof.

According to one embodiment, the ink comprises or consists of a thermal conductive material wherein said thermal conductive material includes but is not limited to: $Al_yO_x$, $Ag_yO_x$, $Cu_yO_x$, $Fe_yO_x$, $Si_yO_x$, $Pb_yO_x$, $Ca_yO_x$, $Mg_yO_x$, $Zn_yO_x$, $Sn_yO_x$, $Ti_yO_x$, $Be_yO_x$, CdS, ZnS, ZnSe, CdZnS, CdZnSe, Au, Na, Fe, Cu, Al, Ag, Mg, mixed oxides, mixed oxides thereof or a mixture thereof; x and y are independently a decimal number from 0 to 10, at the condition that x and y are not simultaneously equal to 0, and $x \neq 0$.

According to one embodiment, the ink comprises or consists of a thermal conductive material wherein said thermal conductive material includes but is not limited to: $Al_2O_3$, $Ag_2O$, $Cu_2O$, CuO, $Fe_3O_4$, FeO, $SiO_2$, PbO, CaO, MgO, ZnO, $SnO_2$, $TiO_2$, BeO, CdS, ZnS, ZnSe, CdZnS, CdZnSe, Au, Na, Fe, Cu, Al, Ag, Mg, mixed oxides, mixed oxides thereof or a mixture thereof.

According to one embodiment, the ink and/or liquid vehicle and/or the film-forming material comprise or consists of a thermal conductive material wherein said thermal conductive material includes but is not limited to: aluminium oxide, silver oxide, copper oxide, iron oxide, silicon oxide, lead oxide, calcium oxide, magnesium oxide, zinc oxide, tin oxide, titanium oxide, beryllium oxide, zinc sulfide, cadmium sulfide, zinc selenium, cadmium zinc selenium, cadmium zinc sulfide, gold, sodium, iron, copper, aluminium, silver, magnesium, mixed oxides, mixed oxides thereof or a mixture thereof.

According to one embodiment, the liquid vehicle and/or the film-forming material comprises organic molecules in small amounts of 0 mole %, 1 mole %, 5 mole %, 10 mole %, 15 mole %, 20 mole %, 25 mole %, 30 mole %, 35 mole %, 40 mole %, 45 mole %, 50 mole %, 55 mole %, 60 mole %, 65 mole %, 70 mole %, 75 mole %, 80 mole % relative to the majority element of said liquid vehicle and/or the film-forming material.

According to one embodiment, the liquid vehicle and/or the film-forming material comprises a polymeric material as described hereabove, an inorganic material vehicle as described hereabove, or a mixture thereof.

According to one embodiment, the ink comprises at least one liquid vehicle.

According to one embodiment, the ink comprises at least two liquid vehicles. In this embodiment, the liquid vehicles can be identical or different from each other.

According to one embodiment, the ink comprises a plurality of liquid vehicles. In this embodiment, the liquid vehicles can be identical or different from each other.

In one embodiment, the ink comprises at least one population of particles of the invention. In one embodiment, a population of particles is defined by the maximum emission wavelength. In this embodiment, particle of the invention refers to particle 1, particle 2 and/or nanophosphor nanoparticle.

In one embodiment, the ink comprises two populations of particles of the invention emitting different colors or wavelengths. In this embodiment, particle of the invention refers to particle 1, particle 2 and/or nanophosphor nanoparticle.

In one embodiment, the concentration of the at least two populations of said particles comprised in the ink and emitting different colors or wavelengths, is controlled to predetermine the light intensity of each secondary light emitted by each of the least two populations of said particles, after excitation by an incident light.

In one embodiment, the ink comprises particles of the invention which emit green light and red light upon downconversion of a blue light source. In this embodiment, the ink is configured to transmit a predetermined intensity of the blue light from the light source and to emit a predetermined intensity of secondary green and red lights, allowing to emit a resulting tri-chromatic white light. In this embodiment, particle of the invention refers to particle 1, particle 2 and/or nanophosphor nanoparticle.

According to one embodiment, the ink comprises at least one particle of the invention comprising at least one nanoparticle 3 that emits green light upon downconversion of a blue light source. In this embodiment, particle of the invention refers to particle 1, particle 2 and/or nanophosphor nanoparticle.

According to one embodiment, the ink comprises at least one particle of the invention comprising at least one nanoparticles 3 that emits orange light upon downconversion of a blue light source. In this embodiment, particle of the invention refers to particle 1, particle 2 and/or nanophosphor nanoparticle.

According to one embodiment, the ink comprises at least one particle of the invention comprising at least one nanoparticles 3 that emits yellow light upon downconversion of a blue light source. In this embodiment, particle of the invention refers to particle 1, particle 2 and/or nanophosphor nanoparticle.

According to one embodiment, the ink comprises at least one particle of the invention comprising at least one nanoparticles 3 that emits purple light upon downconversion of a blue light source. In this embodiment, particle of the invention refers to particle 1, particle 2 and/or nanophosphor nanoparticle.

In one embodiment, the ink comprises two populations of particles of the invention, a first population with a maximum emission wavelength between 500 nm and 560 nm, more preferably between 515 nm and 545 nm and a second population with a maximum emission wavelength between 600 nm and 2500 nm, more preferably between 610 nm and 650 nm. In this embodiment, particle of the invention refers to particle 1, particle 2 and/or nanophosphor nanoparticle.

In one embodiment, the ink comprises three populations of particles of the invention, a first population of said particles with a maximum emission wavelength between 440 and 499 nm, more preferably between 450 and 495 nm, a second population of said particles with a maximum emission wavelength between 500 nm and 560 nm, more preferably between 515 nm and 545 nm and a third population of said particles with a maximum emission wavelength between 600 nm and 2500 nm, more preferably between 610 nm and 650 nm. In this embodiment, particle of the invention refers to particle 1, particle 2 and/or nanophosphor nanoparticle.

In one embodiment, the ink is splitted in several areas, each of them comprises a different population of particles of the invention emitting different colors or wavelengths.

In one embodiment, the ink is processed by extrusion.

According to one embodiment, the ink absorbs at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the ink absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the ink transmits at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the ink scatters at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the ink backscatters at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the ink transmits a part of the incident light and emits at least one secondary light. In this embodiment, the resulting light is a combination of the remaining transmitted incident light.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 300 nm, 350 nm, 400 nm, 450 nm, 455 nm, 460 nm, 470 nm, 480 nm, 490 nm, 500 nm, 510 nm, 520 nm, 530 nm, 540 nm, 550 nm, 560 nm, 570 nm, 580 nm, 590 nm, or 600 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 300 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 350 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 400 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 450 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 455 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 460 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 470 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 480 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 490 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 500 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 510 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 520 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 530 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 540 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 550 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 560 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 570 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 580 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 590 nm.

According to one embodiment, the ink has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 600 nm.

According to one embodiment, the increase in absorption efficiency of incident light by the ink is at least of 1%, 2%, 3%, 4%, 5%, 6%, 7%, 8%, 9%, 10%, 20%, 30%, 40%, 50%, 55%, 60%, 65%, 70%, 75%, 80%, 85%, 90%, 95%, or 100% compared to bare nanoparticles 3.

Bare nanoparticles 3 refers here to nanoparticles 3 that are not encapsulated in a second material 21.

According to one embodiment, the increase in emission efficiency of secondary light by the ink is less than 1%, 2%, 3%, 4%, 5%, 6%, 7%, 8%, 9%, 10%, 20%, 30%, 40%, 50%, 55%, 60%, 65%, 70%, 75%, 80%, 85%, 90%, 95%, or 100% compared to bare nanoparticles 3.

According to one embodiment, the ink exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the ink exhibits a degradation of its photoluminescence of less than 90%, 80%, 70%, 60%, 50%, 40%, 30%, 25%, 20%, 15%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the ink exhibits a degradation of its photoluminescence of less than 90%, 80%, 70%, 60%, 50%, 40%, 30%, 25%, 20%, 15%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the ink exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the ink exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the ink exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the ink exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the ink exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the ink exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the ink exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the ink exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the ink exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the ink exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the ink exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the ink exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the ink exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the ink exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the ink exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the ink exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the ink exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the ink exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the ink exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the ink exhibits a degradation of its FCE of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the ink exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the ink exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the ink exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the ink exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the ink exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the ink exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the ink exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the ink exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

In another embodiment, the ink may further comprise at least one population of converters having phosphor properties. Examples of converter having phosphor properties include, but are not limited to: garnets (LuAG, GAL, YAG, GaYAG), silicates, oxynitrides/oxycarbidonitrides, nintrides/carbidonitrides, $Mn^{4+}$ red phosphors (PFS/KFS), quantum dots.

According to one embodiment, particles of the invention are incorporated in the liquid vehicle at a level ranging from 100 ppm to 500 000 ppm in weight. In this embodiment, particle of the invention refers to particle 1, particle 2 and/or nanophosphor nanoparticle.

According to one embodiment, particles of the invention are incorporated in the liquid vehicle at a level of at least 100 ppm, 200 ppm, 300 ppm, 400 ppm, 500 ppm, 600 ppm, 700 ppm, 800 ppm, 900 ppm, 1000 ppm, 1100 ppm, 1200 ppm, 1300 ppm, 1400 ppm, 1500 ppm, 1600 ppm, 1700 ppm, 1800 ppm, 1900 ppm, 2000 ppm, 2100 ppm, 2200 ppm, 2300 ppm, 2400 ppm, 2500 ppm, 2600 ppm, 2700 ppm, 2800 ppm, 2900 ppm, 3000 ppm, 3100 ppm, 3200 ppm, 3300 ppm, 3400 ppm, 3500 ppm, 3600 ppm, 3700 ppm, 3800 ppm, 3900 ppm, 4000 ppm, 4100 ppm, 4200 ppm, 4300 ppm, 4400 ppm, 4500 ppm, 4600 ppm, 4700 ppm, 4800 ppm, 4900 ppm, 5000 ppm, 5100 ppm, 5200 ppm, 5300 ppm, 5400 ppm, 5500 ppm, 5600 ppm, 5700 ppm, 5800 ppm, 5900 ppm, 6000 ppm, 6100 ppm, 6200 ppm, 6300 ppm, 6400 ppm, 6500 ppm, 6600 ppm, 6700 ppm, 6800 ppm, 6900 ppm, 7000 ppm, 7100 ppm, 7200 ppm, 7300 ppm, 7400 ppm, 7500 ppm, 7600 ppm, 7700 ppm, 7800 ppm, 7900 ppm, 8000 ppm, 8100 ppm, 8200 ppm, 8300 ppm, 8400 ppm, 8500 ppm, 8600 ppm, 8700 ppm, 8800 ppm, 8900 ppm, 9000 ppm, 9100 ppm, 9200 ppm, 9300 ppm, 9400 ppm, 9500 ppm, 9600 ppm, 9700 ppm, 9800 ppm, 9900 ppm, 10000 ppm, 10500 ppm, 11000 ppm, 11500 ppm, 12000 ppm, 12500 ppm, 13000 ppm, 13500 ppm, 14000 ppm, 14500 ppm, 15000 ppm, 15500 ppm, 16000 ppm, 16500 ppm, 17000 ppm, 17500 ppm, 18000 ppm, 18500 ppm, 19000 ppm, 19500 ppm, 20000 ppm, 30000 ppm, 40000 ppm, 50000 ppm, 60000 ppm, 70000 ppm, 80000 ppm, 90000 ppm, 100000 ppm, 110000 ppm, 120000 ppm, 130000 ppm, 140000 ppm, 150000 ppm, 160000 ppm, 170000 ppm, 180000 ppm, 190000 ppm, 200000 ppm, 210000 ppm, 220000 ppm, 230000 ppm, 240000 ppm, 250000 ppm, 260000 ppm, 270000 ppm, 280000 ppm, 290000 ppm, 300000 ppm, 310000 ppm, 320000 ppm, 330000 ppm, 340000 ppm, 350000 ppm, 360000 ppm, 370000 ppm, 380000 ppm, 390000 ppm, 400000 ppm, 410000 ppm, 420000 ppm, 430000 ppm, 440000 ppm, 450000 ppm, 460000 ppm, 470000 ppm, 480000 ppm, 490000 ppm, or 500 000 ppm in weight. In this embodiment, particle of the invention refers to particle 1, particle 2 and/or nanophosphor nanoparticle.

According to one embodiment, the ink comprises less than 95%, 90%, 80%, 70%, 60%, 50%, 40%, 30%, 20%, preferably 10% in weight of particles of the invention. In this embodiment, particle of the invention refers to particle 1, particle 2 and/or nanophosphor nanoparticle.

According to one embodiment, the loading charge of particles of the invention in the ink is at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%. In this embodiment, particle of the invention refers to particle 1, particle 2 and/or nanophosphor nanoparticle.

According to one embodiment, the loading charge of particles of the invention in the ink is less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%. In this embodiment, particle of the invention refers to particle 1, particle 2 and/or nanophosphor nanoparticle.

According to one embodiment, the particles of the invention dispersed in the ink have a packing fraction of at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%. In this embodiment, particle of the invention refers to particle 1, particle 2 and/or nanophosphor nanoparticle.

According to one embodiment, the particles of the invention dispersed in the ink have a packing fraction of less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%. In this embodiment, particle of the invention refers to particle 1, particle 2 and/or nanophosphor nanoparticle.

According to one embodiment, the ink is ROHS compliant.

According to one embodiment, the ink comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the ink comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the ink comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the ink comprise heavier chemical elements or materials based on heavier chemical elements than the main chemical element present in the liquid vehicle and/or the material of the particle of the invention. In this embodiment, said heavy chemical elements in the ink will lower the mass concentration of chemical elements subject to ROHS standards, allowing said ink to be ROHS compliant. In this embodiment, particle of the invention refers to particle 1, particle 2 and/or nano-phosphor nanoparticle.

According to one embodiment, examples of heavy elements include but are not limited to B, C, N, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Tc, Ru, Rh, Pd, Ag, Cd, In, Sn, Sb, Te, I, Cs, Ba, La, Hf, Ta, W, Re, Os, Ir, Pt, Au, Hg, Tl, Pb, Bi, Po, At, Ce, Pr, Nd, Pm, Sm, Eu, Gd, Tb, Dy, Ho, Er, Tm, Yb, Lu or a mixture of thereof.

According to one embodiment, the ink further comprises a variety of components such as those typically used in inkjet liquid vehicles, such as, but not limited to solvents, cosolvents, surface tension adjusting agents, spreading modifier, charge-transporting agents, surfactants, biocides, buffers, viscosity modifiers, sequestering agents, crosslinking photoinitiator, crosslinking agent, colorants, pigments, stabilizing agents, humectants, scatterers, fillers, extenders, water, and mixtures thereof.

According to one embodiment, examples of the surfactant include but are not limited to: carboxylic acids such as for example oleic acid, acetic acid, octanoic acid; thiols such as octanethiol, hexanethiol, butanethiol; 4-mercaptobenzoic acid; Triton X100, amines such as for example oleylamine, 1,6-hexanediamine, octylamine; phosphonic acids; antibodies; or a mixture thereof.

According to one embodiment, the spreading modifier comprises an alkoxylated aliphatic diacrylate monomer, an alkoxylated aliphatic dimethacrylate monomer, or a mixture thereof.

According to one embodiment, the spreading modifier has a viscosity in the range from about 10 to about 25 centipoise at 25° C. and a surface tension in the range from about 25 to about 45 dynes/cm at 25° C.

According to one embodiment, the ink comprises from 10 wt. % to 80 wt. % of a spreading modifier.

According to one embodiment, the ink comprises 4-10 wt. % of pentaerythritol tetraacrylate, pentaerythritol tetramethacrylate, or a combination thereof.

According to one embodiment, the ink comprises polyethylene glycol.

According to one embodiment, the ink comprises dimethacrylate monomer, monoacrylate monomer, polyethylene glycol diacrylate monomer, diacrylate monomer, or a mixture thereof.

According to one embodiment, the monomer has a number average molecular weight in the range from about 100 g/mole to about 1000 g/mole; from about 150 g/mole to about 800 g/mole; from about 200 g/mole to about 600 g/mole; from about 200 g/mole to about 500 g/mole; from about 250 g/mole to about 450 g/mole.

According to one embodiment, the ink comprises a multifunctional methacrylate crosslinking agent, multifunctional acrylate crosslinking agent, or a mixture thereof.

According to one embodiment, the ink comprises 0.5 wt % to 20 wt % of a multifunctional methacrylate crosslinking agent, multifunctional acrylate crosslinking agent.

According to one embodiment, the ink comprises a crosslinking photoinitiator.

According to one embodiment, the ink comprises 0.05 wt % to 20 wt % of crosslinking photoinitiator.

According to one embodiment, the ink comprises a multifunctional crosslinking agent.

According to one embodiment, the ink comprises 0.05 wt % to 20 wt % of multifunctional crosslinking agent.

According to one embodiment, the ink comprises at least one pigment.

According to one embodiment, the pigment has an average size ranging from 10 nm to 1 am.

According to one embodiment, the ink comprises at least 0.1%, 0.2%, 0.3%, 0.4%, 0.5%, 0.6%, 0.7%, 0.8%, 0.9%, 1%, 2%, 3%, 4%, 5%, 6%, 7%, 8%, 9%, 10%, 15%, 20%, 25%, 30%, 35%, 40%, 45%, or 50% of a pigment.

According to one embodiment, the pigment substantially insoluble in the liquid vehicle.

According to one embodiment, the pigment substantially soluble in the liquid vehicle.

According to one embodiment, the ink further comprises particles of various shapes and materials added to the ink composition for the purpose of providing refractive index adjustment and/or substantially reducing the water vapor permeation through said ink. In this embodiment, the ink further comprises particles such as for example metal oxide nanoparticles, such as zirconium oxide, aluminum oxide, titanium oxide, and hafnium oxide; graphene nanostructures, such as graphene nanoribbons and graphene platelets; or a mixture thereof. In this embodiment, said particles have a size between 5 nm to 50 nm. In this embodiment, the loading of said particles in the ink is ranging from 0.1% wt to 2.0% wt.

According to one embodiment, the ink has a viscosity and a surface tension at inkjet jetting temperatures that enable reliable delivery from an inkjet printhead while leaving little or no residue on the printhead.

Methods for measuring viscosities and surface tensions are well known and include the use of commercially available rheometers (e.g., a DV-I Prime Brookfield rheometer) and tensiometers (e.g., a SITA bubble pressure tensiometer).

According to one embodiment, the ink has a density of at least 0.90, 0.95, 1.00, 1.05, 1.10, 1.15, 1.20, 1.25, 1.30, 1.35, 1.40, 1.45, 1.50, 1.55, 1.60, 1.65, 1.70, 1.75, 1.80, 1.85, 1.90 1.95, or 2.00.

According to one embodiment, the density of the ink is tuned to obtain a homogeneous layer and a desired thickness when the ink is deposited on a support.

According to one embodiment, the ink exhibits a viscosity of at least 0.5 mPa·s, 1.0 mPa·s, 2.0 mPa·s, 3.0 mPa·s, 4.0 mPa·s, 5.0 mPa·s, 6.0 mPa·s, 7.0 mPa·s, 8.0 mPa·s, 9.0 mPa·s, 10.0 mPa·s, 11.0 mPa·s, 12.0 mPa·s, 13.0 mPa·s, 14.0 mPa·s, 15.0 mPa·s, 16.0 mPa·s, 17.0 mPa·s, 18.0 mPa·s, 19.0 mPa·s, 20.0 mPa·s, 21.0 mPa·s, 22.0 mPa·s, 23.0 mPa·s, 24.0 mPa·s, 25.0 mPa·s, 26.0 mPa·s, 27.0 mPa·s, 28.0 mPa·s, 29.0 mPa·s, or 30.0 mPa·s, at 25° C.

According to one embodiment, the ink exhibits a viscosity of at least 0.5 mPa·s, 1.0 mPa·s, 2.0 mPa·s, 3.0 mPa·s, 4.0 mPa·s, 5.0 mPa·s, 6.0 mPa·s, 7.0 mPa·s, 8.0 mPa·s, 9.0 mPa·s, 10.0 mPa·s, 11.0 mPa·s, 12.0 mPa·s, 13.0 mPa·s, 14.0 mPa·s, 15.0 mPa·s, 16.0 mPa·s, 17.0 mPa·s, 18.0 mPa·s, 19.0 mPa·s, 20.0 mPa·s, 21.0 mPa·s, 22.0 mPa·s, 23.0 mPa·s, 24.0 mPa·s, 25.0 mPa·s, 26.0 mPa·s, 27.0 mPa·s, 28.0 mPa·s, 29.0 mPa·s, or 30.0 mPa·s.

According to one embodiment, the ink exhibits a viscosity of at least 0.5 centipoise, 1.0 centipoise, 2.0 centipoise, 3.0 centipoise, 4.0 centipoise, 5.0 centipoise, 6.0 centipoise, 7.0 centipoise, 8.0 centipoise, 9.0 centipoise, 10.0 centipoise, 11.0 centipoise, 12.0 centipoise, 13.0 centipoise, 14.0 centipoise, 15.0 centipoise, 16.0 centipoise, 17.0 centipoise, 18.0 centipoise, 19.0 centipoise, 20.0 centipoise, 21.0 centipoise, 22.0 centipoise, 23.0 centipoise, 24.0 centipoise, 25.0 centipoise, 26.0 centipoise, 27.0 centipoise, 28.0 centipoise, 29.0 centipoise, or 30.0 centipoise, at 25° C.

According to one embodiment, the ink exhibits a viscosity of at least 0.5 centipoise, 1.0 centipoise, 2.0 centipoise, 3.0 centipoise, 4.0 centipoise, 5.0 centipoise, 6.0 centipoise, 7.0 centipoise, 8.0 centipoise, 9.0 centipoise, 10.0 centipoise, 11.0 centipoise, 12.0 centipoise, 13.0 centipoise, 14.0 centipoise, 15.0 centipoise, 16.0 centipoise, 17.0 centipoise, 18.0 centipoise, 19.0 centipoise, 20.0 centipoise, 21.0 centipoise, 22.0 centipoise, 23.0 centipoise, 24.0 centipoise, 25.0 centipoise, 26.0 centipoise, 27.0 centipoise, 28.0 centipoise, 29.0 centipoise, or 30.0 centipoise.

According to one embodiment, the ink exhibits a Reynolds number of at least 1, 2, 3, 4, 5, 6, 7, 8, 9, 10, 11, 12, 13, 14, 15, 16, 17, 18, 19, 20, 30, 40, 50, 60, 70, 80, 90, 100, 110, 120, 130, 140, 150, 160, 170, 180, 190, 200, 300, 400, 500, 600, 700, 800, 900, or 1000.

According to one embodiment, the ink flow exhibits a Reynolds number of at least 1, 2, 3, 4, 5, 6, 7, 8, 9, 10, 11, 12, 13, 14, 15, 16, 17, 18, 19, 20, 30, 40, 50, 60, 70, 80, 90, 100, 110, 120, 130, 140, 150, 160, 170, 180, 190, 200, 300, 400, 500, 600, 700, 800, 900, or 1000.

According to one embodiment, the ink exhibits an Ohnesorge number of at least 0.01, 0.02, 0.03, 0.04, 0.05, 0.06, 0.07, 0.08, 0.09, 0.1, 0.15, 0.2, 0.25, 0.3, 0.35, 0.4, 0.45, 0.5, 0.55, 0.6, 0.65, 0.7, 0.75, 0.8, 0.85, 0.9, 0.95, 1, 2, 3, 4, 5, 6, 7, 8, 9, 10.

According to one embodiment, the ink drops exhibit an Ohnesorge number of at least 0.01, 0.02, 0.03, 0.04, 0.05, 0.06, 0.07, 0.08, 0.09, 0.1, 0.15, 0.2, 0.25, 0.3, 0.35, 0.4, 0.45, 0.5, 0.55, 0.6, 0.65, 0.7, 0.75, 0.8, 0.85, 0.9, 0.95, 1, 2, 3, 4, 5, 6, 7, 8, 9, 10.

According to one embodiment, the viscosity of the ink is tuned to obtain a homogeneous layer and a desired thickness when the ink is deposited on a support.

According to one embodiment, the ink deposited on a support forms a continuous layer, i.e., without cracks or interruptions.

According to one embodiment, the ink deposited on a support forms a layer with a varying thickness along its length.

According to one embodiment, the ink deposited on a support forms a layer with a homogeneous or uniform thickness along its length.

In one embodiment, the support as described herein can be heated or cooled down by an external system.

According to one embodiment, the ink has a viscosity and a surface tension at inkjet jetting temperatures, for example, at 25° C., that enable delivery from an inkjet printhead.

According to one embodiment, the liquid vehicle can exhibit properties that provide a substantially uniformly thick film of the ink.

According to one embodiment, the ink exhibits a surface tension of at least 20.0 dynes/cm, 25 dynes/cm, 30 dynes/cm, 35 dynes/cm, 40.0 dynes/cm, 45 dynes/cm, 50.0 dynes/cm, 55 dynes/cm, or 60.0 dynes/cm, at 25° C.

According to one embodiment, the liquid vehicle is miscible with water.

According to one embodiment, the liquid vehicle comprises water.

According to one embodiment, the liquid vehicle comprises at least one surfactant.

According to one embodiment, the ink comprises at least 1 wt %, 2 wt %, 3 wt %, 4 wt %, 5 wt %, 6 wt %, 7 wt %, 8 wt %, 9 wt %, 10 wt %, 15 wt %, 20 wt %, 25 wt %, 30 wt %, 35 wt %, 40 wt %, 45 wt %, 50 wt %, 55 wt %, 60 wt %, 65 wt %, 70 wt %, 75 wt %, 80 wt %, 85 wt %, 90 wt %, 95 wt %, or 99 wt % of solvent as described hereabove.

According to one embodiment, the ink comprises at least 1 wt %, 2 wt %, 3 wt %, 4 wt %, 5 wt %, 6 wt %, 7 wt %, 8 wt %, 9 wt %, 10 wt %, 15 wt %, 20 wt %, 25 wt %, 30 wt %, 35 wt %, 40 wt %, 45 wt %, 50 wt %, 55 wt %, 60 wt %, 65 wt %, 70 wt %, 75 wt %, 80 wt %, 85 wt %, 90 wt %, 95 wt %, or 99 wt % of liquid vehicle as described hereabove.

According to one embodiment, the ink comprises at least 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, 0.2 wt %, 0.3 wt %, 0.4 wt %, 0.5 wt %, 0.6 wt %, 0.7 wt %, 0.8 wt %, 0.9 wt %, 1 wt %, 2 wt %, 3 wt %, 4 wt %, 5 wt %, 6 wt %, 7 wt %, 8 wt %, 9 wt %, 10 wt %, 15 wt %, 20 wt %, 25 wt %, 30 wt %, 35 wt %, 40 wt %, 45 wt %, 50 wt %, 55 wt %, 60 wt %, 65 wt %, 70 wt %, 75 wt %, 80 wt %, 85 wt %, 90 wt %, 95 wt %, or 99 wt % of particle of the invention. In this embodiment, particle of the invention refers to particle 1, particle 2 and/or nanophosphor nanoparticle.

According to one embodiment, in the ink, the weight ratio between the liquid vehicle and the particle of the invention is at least 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, or 50%. In this embodiment, particle of the invention refers to particle 1, particle 2 and/or nanophosphor nanoparticle as described hereabove.

According to one embodiment, the ink comprises particles of the invention, polyethylene glycol dimethacrylate monomer, monoacrylate monomer, a multifunctional methacrylate crosslinking agent and a crosslinking photoinitiator. In this embodiment, particle of the invention refers to particle 1, particle 2 and/or nanophosphor nanoparticle as described hereabove.

According to one embodiment, the ink comprises particles of the invention, water and 1,2-hexanediol. In this embodiment, particle of the invention refers to particle 1, particle 2 and/or nanophosphor nanoparticle as described hereabove.

According to one embodiment, the ink comprises particles of the invention, polyethylene glycol diacrylate monomer, multifunctional acrylate crosslinking agent, spreading modifier comprising an alkoxylated aliphatic diacrylate monomer. In this embodiment, particle of the invention refers to particle 1, particle 2 and/or nanophosphor nanoparticle as described hereabove.

According to one embodiment, the ink comprises a liquid vehicle consisting essentially of up to 16 wt % of 1,2- hexanediol or 1,5-pentanediol; a balance of water; and from about 0.01 wt. % to about 10 wt. % of particles of the invention. In this embodiment, particle of the invention refers to particle 1, particle 2 and/or nanophosphor nanoparticle as described hereabove.

According to one embodiment, the ink comprises particles of the invention, a mixed solvent of chlorobenzene and cyclohexane, Triton X-100 as an additive. In this embodiment, particle of the invention refers to particle 1, particle 2 and/or nanophosphor nanoparticle as described hereabove.

According to one embodiment, the ink comprises particles of the invention, Ebecyl, $TiO_2$. In this embodiment, particle of the invention refers to particle 1, particle 2 and/or nanophosphor nanoparticle as described hereabove.

According to one embodiment, the ink comprises particles of the invention; 40 wt % to 60 wt % polyethylene glycol dimethacrylate monomer, polyethylene glycol diacrylate monomer, or a combination thereof, wherein the polyethylene glycol dimethacrylate monomer and the polyethylene glycol diacrylate monomer have number average molecular weights in the range from about 230 g/mole to about 430 g mole; 25 wt % to 50 wt % monoacrylate monomer, monomethacrylate monomer, or a combination thereof, having a viscosity in the range from about 10 cps to about 27 cps at 22° C.; 4 wt % to 10 wt % multifunctional acrylate crosslinking agent, a multifunctional methacrylate crosslinking agent, or a combination thereof; and 0.1 wt % to 10 wt % crosslinking photoinitiator.

According to one embodiment, the ink comprises particles of the invention; 40 wt % to 60 wt % polyethylene glycol dimethacrylate monomer, polyethylene glycol diacrylate monomer, or a combination thereof, wherein the polyethylene glycol dimethacrylate monomer and the polyethylene glycol diacrylate monomer have number average molecular weights in the range from about 230 g/mole to about 430 g mole; 25 wt % to 50 wt % monoacrylate monomer, monomethacrylate monomer, or a combination thereof, having a viscosity in the range from about 10 cps to about 27 cps at 22° C.; 4 wt % to 10 wt % multifunctional acrylate crosslinking agent, a multifunctional methacrylate crosslinking agent, or a combination thereof; and 0.1 wt % to 10 wt % crosslinking photoinitiator, the ink composition having a surface tension of between about 32 dynes/cm and about 45 dynes/cm at 22° C.

According to one embodiment, the ink comprises particles of the invention; from 30 wt % to 50 wt % of a polyethylene glycol dimethacrylate monomer, a polyethylene glycol diacrylate monomer, or a combination thereof, wherein the polyethylene glycol dimethacrylate monomer and the polyethylene glycol diacrylate monomer have number average molecular weights in the range from 230 g/mole to 430 g/mole; from 4 wt % to 10 wt % of a multifunctional acrylate crosslinking agent, a multifunctional methacrylate crosslinking agent, or a combination thereof; and from 40 wt % to 60 wt % of a spreading modifier comprising an alkoxylated aliphatic diacrylate monomer, an alkoxylated aliphatic dimethacrylate monomer, or a combination thereof, and having a viscosity in the range from 14 cps to 18 cps at 22° C. and a surface tension in the range from 35 dynes/cm to 39 dynes/cm at 22° C.

According to one embodiment, from 30 wt % to 50 wt % of the ink comprises a monomer selected from the group consisting of a polyethylene glycol dimethacrylate monomer, a polyethylene glycol diacrylate monomer, and a combination thereof, wherein the polyethylene glycol dimethacrylate monomer and the polyethylene glycol diacrylate monomer have number average molecular weights in the range from 230 g/mole to 430 g/mole; from 4 wt % to 10 wt % of the ink comprises a crosslinking agent selected from the group consisting of a multifunctional acrylate crosslinking agent, a multifunctional methacrylate crosslinking agent, and a combination thereof; and from 40 wt % to 60 wt % of the ink comprises a spreading modifier selected from the group consisting of an alkoxylated aliphatic diacrylate monomer, an alkoxylated aliphatic dimethacrylate monomer, and a combination thereof.

According to one embodiment, from 30 wt % to 50 wt % of the ink comprises a monomer selected from the group consisting of a polyethylene glycol dimethacrylate monomer, a polyethylene glycol diacrylate monomer, and a combination thereof, wherein the polyethylene glycol dimethacrylate monomer and the polyethylene glycol diacrylate monomer have number average molecular weights in the range from 230 g/mole to 430 g/mole; from 4 wt % to 10 wt % of the ink comprises a crosslinking agent selected from the group consisting of a multifunctional acrylate crosslinking agent, a multifunctional methacrylate crosslinking agent, and a combination thereof; and from 40 wt % to 60 wt % of the ink comprises a spreading modifier selected from the group consisting of an alkoxylated aliphatic diacrylate monomer, an alkoxylated aliphatic dimethacrylate monomer, and a combination thereof, the ink having a viscosity in the range from 14 cps to 18 cps at 22° C. and a surface tension in the range from 35 dynes/cm to 39 dynes/cm at 22° C.

According to one embodiment, the ink comprises particles of the invention; 75-95 wt % of a polyethylene glycol dimethacrylate monomer, a polyethylene glycol diacrylate monomer, or a combination thereof, wherein the polyethylene glycol dimethacrylate monomer and the polyethylene glycol diacrylate monomer have number average molecular weights in the range from about 230 g/mole to about 430 g/mole; 4-10 wt % of pentaerythritol tetraacrylate, pentaerythritol tetramethacrylate, or a combination thereof; and 1-15 wt % of a spreading modifier having a viscosity in the range from about 14 to about 18 cps at 22° C. and a surface tension in the range from about 35 to about 39 dynes/cm at 22° C.

According to one embodiment, the ink comprises materials configured to limit or prevent the coffee-ring effect.

According to one embodiment, the ink is formulated to leave little or no residue in the pores of a thermal printing printhead that comprises pores. In this embodiment at least 50000 cycles of printing can be performed without clogging the pores of said printhead. Microscopic examination, for example, at 20× magnification, can be used to visually inspect for residue and/or residue build-up on the printhead.

According to one embodiment, the ink is formulated to leave no mark of abrasion on a printhead.

According to one embodiment, the ink may be used in a light source.

According to one embodiment, the ink may be used as a color filter.

According to one embodiment, the ink may be used in a color filter.

According to one embodiment, the ink may be used in addition to a color filter.

According to one embodiment, the ink is deposited on a support by drop-casting, spin coating, dip coating, inkjet printing, spray, plating, electroplating, or any other means known by the person skilled in the art.

According to one embodiment, the ink is deposited on a support by inkjet printing: thermal, piezoelectric or other inkjet printing methods.

According to one embodiment, the deposited ink has a thickness between 30 nm and 10 cm, more preferably between 100 nm and 1 cm, even more preferably between 100 nm and 1 mm.

According to one embodiment, the deposited ink has a thickness of at least 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.1 μm, 4.2 μm, 4.3 μm, 4.4 μm, 4.5 μm, 4.6 μm, 4.7 μm, 4.8 μm, 4.9 μm, 5 μm, 5.1 μm, 5.2 μm, 5.3 μm, 5.4 μm, 5.5 μm, 5.5 μm, 5.6 μm, 5.7 μm, 5.8 μm, 5.9 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.1 mm, 1.2 mm, 1.3 mm, 1.4 mm, 1.5 mm, 1.6 mm, 1.7 mm, 1.8 mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, 3.1 mm, 3.2 mm, 3.3 mm, 3.4 mm, 3.5 mm, 3.6 mm, 3.7 mm, 3.8 mm, 3.9 mm, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7.4 mm, 7.5 mm, 7.6 mm, 7.7 mm, 7.8 mm, 7.9 mm, 8 mm, 8.1 mm, 8.2 mm, 8.3 mm, 8.4 mm, 8.5 mm, 8.6 mm, 8.7 mm, 8.8 mm, 8.9 mm, 9 mm, 9.1 mm, 9.2 mm, 9.3 mm, 9.4 mm, 9.5 mm, 9.6 mm, 9.7 mm, 9.8 mm, 9.9 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, the support is a solar panel, or a panel.

In one embodiment, the ink on a support is encapsulated into a multilayered system. In one embodiment, the multilayer system comprises at least two, at least three layers.

In one embodiment, the multilayered system may further comprise at least one auxiliary layer.

According to one embodiment, the auxiliary layer is optically transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm. In this embodiment, the auxiliary layer does not absorb any light allowing the ink and the particles comprised in the ink to absorb all the incident light.

According to one embodiment, the auxiliary layer limits or prevents the degradation of the chemical and physical properties of the particles comprised in the ink from molecular oxygen, water, ozone and/or high temperature.

According to one embodiment, the auxiliary layer is thermally conductive.

According to one embodiment, the auxiliary layer has a thermal conductivity at standard conditions ranging from 0.1 to 450 W/(m·K), preferably from 1 to 200 W/(m·K), more preferably from 10 to 150 W/(m·K).

According to one embodiment, the auxiliary layer has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1

W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the auxiliary layer is a polymeric auxiliary layer.

According to one embodiment, the one or more components of the auxiliary layer can include a polymerizable component, a crosslinking agent, a scattering agent, a rheology modifier, a filler, a photoinitiator, or a thermal initiator as described here after or above.

According to one embodiment, the auxiliary layer comprises scattering particles. Examples of scattering particles include but are not limited to: $SiO_2$, $ZrO_2$, ZnO, MgO, $SnO_2$, $TiO_2$, Ag, Au, alumina, barium sulfate, PTFE, barium titanate and the like.

In one embodiment, the auxiliary layer further comprises thermal conductor particles. Examples of thermal conductor particles include but are not limited to: $SiO_2$, $ZrO_2$, ZnO, MgO, $SnO_2$, $TiO_2$, CaO, alumina, barium sulfate, PTFE, barium titanate and the like. In this embodiment, the thermal conductivity of the auxiliary layer is increased.

According to one embodiment, the auxiliary layer comprises a polymeric material.

According to one embodiment, the auxiliary layer comprises an inorganic material.

According to one embodiment, the auxiliary layer can polymerize by heating it (i.e., by thermal curing) and/or by exposing it to UV light (i.e., by UV curing). Examples of UV curing processes which can be contemplated in the present invention are described, e.g., in WO2017063968, WO2017063983 and WO2017162579.

According to one embodiment, the polymeric auxiliary layer includes but is not limited to: silicone based polymers, polydimethylsiloxanes (PDMS), polyethylene terephthalate, polyesters, polyacrylates, polymethacrylates, polycarbonate, poly(vinyl alcohol), polyvinylpyrrolidone, polyvinylpyridine, polysaccharides, poly(ethylene glycol), melamine resins, a phenol resin, an alkyl resin, an epoxy resin, a polyurethane resin, a maleic resin, a polyamide resin, an alkyl resin, a maleic resin, terpenes resins, an acrylic resin or acrylate based resin such as PMMA, copolymers forming the resins, co-polymers, block co-polymers, polymerizable monomers comprising an UV initiator or thermic initiator, or a mixture thereof.

According to one embodiment, the polymeric auxiliary layer includes but is not limited to: thermosetting resin, photosensitive resin, photoresist resin, photocurable resin, or dry-curable resin. The thermosetting resin and the photocurable resin are cured using heat and light, respectively.

In one embodiment, the auxiliary layer may be a polymerizable formulation which can include monomers, oligomers, polymers, or mixture thereof.

In one embodiment, the polymerizable formulation may further comprise a crosslinking agent, a scattering agent, a photo initiator or a thermal initiator.

In one embodiment, the polymerizable formulation includes but is not limited to: monomers, oligomers or polymers made from an alkyl methacrylates or an alkyl acrylates such as acrylic acid, methacrylic acid, crotonic acid, acrylonitrile, acrylic esters substituted with methoxy, ethoxy, propoxy, butoxy, and similar derivatives for example, methyl acrylate, ethyle acrylate, propyl acrylate, butyl acrylate, isobutyl acrylate, lauryl acrylate, norbornyl acrylate, 2-ethyl hexyl acrylate, 2-hydroxyethyl acrylate, 4-hydroxybutyl acrylate, benzyl acrylate, phenyl acrylate, isobornyle acrylate, hydroxypropyl acrylate, fluorinated acrylic monomers, chlorinated acrylic monomers, methacrylic acid, methyl methacrylate, n-butyl methacrylate, isobutyl methacrylate, 2-ethyl hexyl methacrylate, 2-hydroxyethyl methacrylate, 4-hydroxybutyl methacrylate, benzyl methacrylate, phenyl methacrylate, lauryl methacrylate, norbornyl methacrylate, isobornyle methacrylate, hydroxypropyl methacrylate, fluorinated methacrylic monomers, chlorinated methacrylic monomers, alkyl crotonates, allyl crotonates, glycidyl methacrylate and related esters.

In another embodiment, the polymerizable formulation includes but is not limited to: monomers, oligomers or polymers made from an alkyl acrylamide or alkyl methacrylamide such as acrylamide, Alkylacrylamide, N-tert-Butylacrylamide, Diacetone acrylamide, N,N-Diethylacrylamide, N-(Isobutoxymethyl)acrylamide, N-(3-Methoxypropyl) acrylamide, N-Diphenylmethylacrylamide, N-Ethylacrylamide, N-Hydroxyethyl acrylamide, N-(Isobutoxymethyl)acrylamide, N-Isopropylacrylamide, N-(3-Methoxypropyl)acrylamide, N-Phenylacrylamide, N-[Tris (hydroxymethyl)methyl]acrylamide, N,N-Diethylmethacrylamide, N,NDimethylacrylamide, N-[3-(Dimethylamino)propyl]methacrylamide, N-(Hydroxymethyl)acrylamide, 2-Hydroxypropyl methacrylamide, N-Isopropylmethacrylamide, Methacrylamide, N-(Triphenylmethyl)methacrylamide and similar derivatives.

In one embodiment, the polymerizable formulation includes but is not limited to: monomers, oligomers or polymers made from alpha-olefins, dienes such as butadiene and chloroprene; styrene, alpha-methyl styrene, and the like; heteroatom substituted alpha-olefins, for example, vinyl acetate, vinyl alkyl ethers for example, ethyl vinyl ether, vinyltrimethylsilane, vinyl chloride, tetrafluoroethylene, chlorotrifiuoroethylene, cyclic and polycyclic olefin compounds for example, cyclopentene, cyclohexene, cycloheptene, cyclooctene, and cyclic derivatives up to C20; polycyclic derivates for example, norbornene, and similar derivatives up to C20; cyclic vinyl ethers for example, 2, 3-dihydrofuran, 3,4-dihydropyran, and similar derivatives; allylic alcohol derivatives for example, vinylethylene carbonate, disubstituted olefins such as maleic and fumaric compounds for example, maleic anhydride, diethylfumarate, and the like, and mixtures thereof.

In one embodiment, examples of crosslinking agent include but are not limited to: di-acrylate, tri-acrylate, tetra-acrylate, di-methacrylate, tri-methacrylate and tetra-methacrylate monomers derivatives and the like. Another example of crosslinking agent includes but is not limited to: monomers, oligomers or polymers made from di- or trifunctional monomers such as allyl methacrylate, diallyl maleate, 1,3-butanediol dimethacrylate, 1,4-butanediol dimethacrylate, 1,6-hexanediol dimethacrylate, pentaerythritol triacrylate, trimethylolpropane triacrylate, Ethylene glycol dimethacrylate, Triethylene glycol dimethacrylate, N,N-methylenebis(acrylamide), N,N'-Hexamethylenebis (methacrylamide), and divinyl benzene.

In one embodiment, the polymerizable formulation may further comprise scattering particles Examples of scattering particles include but are not limited to: $SiO_2$, $ZrO_2$, ZnO, MgO, $SnO_2$, $TiO_2$, Ag, Au, alumina, barium sulfate, PTFE, barium titanate and the like.

In one embodiment, the polymerizable formulation may further comprise a thermal conductor. Examples of thermal conductor include but are not limited to: $SiO_2$, $ZrO_2$, ZnO, MgO, $SnO_2$, $TiO_2$, CaO, alumina, barium sulfate, PTFE, barium titanate and the like. In this embodiment, the thermal conductivity of the auxiliary layer is increased.

In one embodiment, the polymerizable formulation may further comprise a photo initiator.

Examples of photo initiators include but are not limited to: α-hydroxyketone, phenylglyoxylate, benzyldimethyl-ketal, α-aminoketone, monoacylphosphine oxides, bisacylphosphine oxides, phosphine oxide, benzophenone and derivatives, polyvinyl cinnamate, metallocene or iodonium salt derivatives, 1-hydroxycyclohexyl phenyl ketone, thioxanthones (such as isopropylthioxanthone), 2-hydroxy-2-methyl-1-phenylpropan-1-one, 2-benzyl-2-dimethylamino-(4-morpholinophenyl)butan-1-one, benzil dimethylketal, bis (2,6-dimethylbenzoyl)-2,4,4-trimethylpentylphosphine oxide, 2,4,6-trimethylbenzoyldiphenylphosphine oxide, 2-methyl-1-[4-(methylthio)phenyl]-2-morpholinopropan-1-one, 2,2-dimethoxy-1,2-diphenylethan-1-one or 5,7-diiodo-3-butoxy-6-fluorone and the like. Other examples of photo initiators include, without limitation, Irgacure™ 184, Irgacure™ 500, Irgacure™ 907, Irgacure™ 369, Irgacure™ 1700, Irgacure™ 651, Irgacure™ 819, Irgacure™ 1000, Irgacure™ 1300, Irgacure™ 1870, Darocur™ 1 173, Darocur™ 2959, Darocur™ 4265 and Darocur™ ITX (available from Ciba Specialty Chemicals), Lucerin™ TPO (available from BASF AG), Esacure™ KT046, Esacure™ KIP150, Esacure™ KT37 and Esacure™ EDB (available from Lamberti), H-Nu™ 470 and H-Nu™ 470X (available from Spectra Group Ltd) and the like.

Further examples of photo initiators include, but are not limited to, those described in WO2017211587. Those include, but are not limited to, photo initiators of Formula (I) and mixtures thereof:

Formula (I)

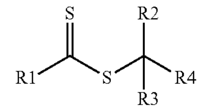

wherein:

R1 is selected from the group comprising or consisting of an optionally substituted alkyl group, an optionally substituted aryl or heteroaryl group, an optionally substituted alkenyl group, an optionally substituted alkynyl group, an optionally substituted alkaryl group, an optionally substituted aralkyl group, R5-O— and R6-S—;

R5 and R6 are independently selected from the group comprising or consisting of an optionally substituted alkyl group, an optionally substituted aryl or heteroaryl group, an optionally substituted alkenyl group, an optionally substituted alkynyl group, an optionally substituted alkaryl group and an optionally substituted aralkyl group;

R2 is selected from the group comprising or consisting of a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group;

R3 is selected from the group comprising or consisting of an electron withdrawing group comprising at least one oxygen carbon double bond, a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group; and R4 is selected from the group comprising or consisting of an electron withdrawing group comprising at least one oxygen carbon double bond, a nitrile group, an aryl group and a heteroaryl group;

with the proviso that at least one of R1 to R6 is functionalized with a photoinitiating moiety.

In one embodiment, the photo initiator according to Formula (I) is a compound wherein:

R1 is selected from the group comprising or consisting of an alkyl group, an aryl group, a heteroaryl group, an alkenyl group, an alkynyl group, an alkaryl group, an aralkyl group, R5-O—, R6-S— and a photoinitiating moiety selected from the group comprising or consisting of a thioxanthone group, a benzophenone group, an α-hydroxyketone group, an α-aminoketone group, an acylphosphine oxide group and a phenyl glyoxalic acid ester group;

R5 and R6 are independently selected from the group comprising or consisting of an alkyl group, an aryl or heteroaryl group, an alkenyl group, an alkynyl group, an alkaryl group, an aralkyl group and a photoinitiating moiety selected from the group consisting of a thioxanthone group, a benzophenone group, an α-hydroxyketone group, an α-aminoketone group, an acylphosphine oxide group and a phenyl glyoxalic acid ester group;

R2 is selected from the group comprising or consisting of hydrogen, an alkyl group, an aryl group, a heteroaryl group, an alkenyl group, an alkynyl group, an alkaryl group and an aralkyl group;

R3 is selected from the group comprising or consisting of —C(═O)—O—R7, —C(═O)—NR8-R9, C(═O)—R7, hydrogen, an alkyl group, an aryl group, heteroaryl group, an alkenyl group, an alkynyl group, an alkaryl group, an aralkyl group, a thioxanthone group, a benzophenone group, an α-aminoketone group, an acylphosphine oxide group and a phenyl glyoxalic acid ester group; and R4 is selected from the group comprising or consisting of —C(═O)—O—R10, —C(═O)—NR11-R12, C(═O)—R10, a nitrile group, an aryl group, a heteroaryl group, a thioxanthone group, a benzophenone group, an α-aminoketone group, an acylphosphine oxide group and a phenyl glyoxalic acid ester group;

R7 to R10 are independently selected from the group consisting of hydrogen, an alkyl group, an aryl or heteroaryl group, an alkenyl group, an alkynyl group, an alkaryl group, an aralkyl group and a photoinitiating moiety selected from the group consisting of a thioxanthone group, a benzophenone group, an α-hydroxyketone group, an α-aminoketone group, an acylphosphine oxide group and a phenyl glyoxalic acid ester group, or R8 and R9 and/or R11 and R12 may represent the necessary atoms to form a five or six membered ring;

with the proviso that at least one of R1, R3 and R4 is functionalized with a photoinitiating moiety.

In one embodiment, the photo initiator according to Formula (I) is a compound of Formula (II):

Formula (II)

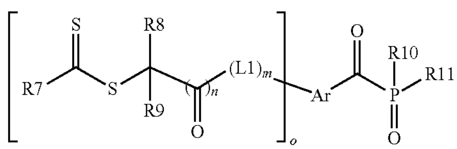

wherein:

R7 is selected from the group comprising or consisting of an optionally substituted alkyl group, an optionally substituted aryl or heteroaryl group, an optionally substituted alkenyl group, an optionally substituted alkynyl group, an optionally substituted alkaryl group, an optionally substituted aralkyl group, —O—R5 and —S—R6;

Ar represents an optionally substituted carbocyclic arylene group;

L1 represents a divalent linking group comprising not more than 10 carbon atoms;

R8 and R9 are independently selected from the group comprising or consisting of a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group;

R10 is selected from the group consisting of an optionally substituted alkyl group, an optionally substituted aryl group, an optionally substituted alkoxy group and an optionally substituted aryloxy group;

R11 is selected from the group comprising or consisting of an optionally substituted alkyl group, an optionally substituted aryl group, an optionally substituted alkoxy group, an optionally substituted aryloxy group and an acyl group;

n and m each independently represent 1 or 0;

o represents an integer from 1 to 5;

with the proviso that if n=0 and m=1 that L1 is coupled to CR8R9 via a carbon atom of an aromatic or heteroaromatic ring.

In one embodiment, the photo initiator according to Formula (I) is a compound of Formula (III):

Formula (III)

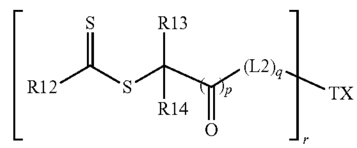

wherein:

R12 is selected from the group comprising or consisting of an optionally substituted alkyl group, an optionally substituted aryl or heteroaryl group, an optionally substituted alkenyl group, an optionally substituted alkynyl group, an optionally substituted alkaryl group, an optionally substituted aralkyl group, —O—R5 and —S—R6;

R5 and R6 are independently selected from the group comprising or consisting of an optionally substituted alkyl group, an optionally substituted aryl or heteroaryl group, an optionally substituted alkenyl group, an optionally substituted alkynyl group, an optionally substituted alkaryl group and an optionally substituted aralkyl group;

L2 represents a divalent linking group comprising or consisting of not more than 20 carbon atoms;

TX represents an optionally substituted thioxanthone group;

p and q each independently represent 1 or 0;

r represents an integer from 1 to 5;

R13 and R14 are independently selected from the group comprising or consisting of a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group;

with the proviso that if p=0 and q=1 that L2 is coupled to CR13R14 via a carbon atom of an aromatic or heteroaromatic ring.

In one embodiment, the photo initiator according to Formula (I) is a compound of Formula (IV):

Formula (IV)

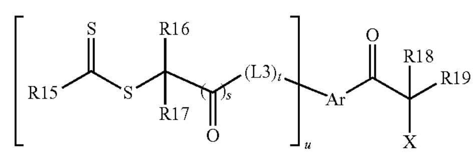

wherein:

R15 is selected from the group comprising or consisting of an optionally substituted alkyl group, an optionally substituted aryl or heteroaryl group, an optionally substituted alkenyl group, an optionally substituted alkynyl group, an optionally substituted alkaryl group, an optionally substituted aralkyl group, —O—R5 and —S—R6;

R5 and R6 are independently selected from the group comprising or consisting of an optionally substituted alkyl group, an optionally substituted aryl or heteroaryl group, an optionally substituted alkenyl group, an optionally substituted alkynyl group, an optionally substituted alkaryl group and an optionally substituted aralkyl group;

Ar represents an optionally substituted carbocyclic arylene group;

L3 represents a divalent linking group comprising or consisting not more than 20 carbon atoms;

R16 and R17 are independently selected from the group comprising or consisting of a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group;

R18 and R19 are independently selected from the group comprising or consisting of an optionally substituted alkyl group, an optionally substituted aryl group, an optionally substituted aralkyl group and an optionally substituted alkaryl group with the proviso that R18 and R19 may represent the necessary atoms to form a five to eight membered ring; X represents OH or NR20R21;

R20 and R21 are independently selected from the group comprising or consisting of an optionally substituted alkyl group, an optionally substituted aryl group, an optionally substituted aralkyl group and an optionally substituted alkaryl group, with the proviso that R20 and R21 may represent the necessary atoms to form a five to eight membered ring;

s and t each independently represent 1 or 0;

u represents an integer from 1 to 5;

with the proviso that if s=0 and t=1 that L3 is coupled to CR16R17 via a carbon atom of an aromatic or heteroaromatic ring.

In one embodiment, the photo initiator according to Formula (I) is a compound of Formula (V):

Formula (V)

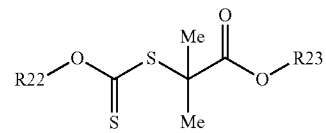

wherein:

R22 represents an alkyl group having no more than 6 carbon atoms; and

R23 represents a photoinitiating moiety selected from the group comprising or consisting of an acylphosphine oxide group, a thioxanthone group, a benzophenone group, an α-hydroxy ketone group and an α-amino ketone group.

In one embodiment, the photo initiator according to Formula (I) is a compound of Formula (VI) to (XXVIII):

Formula (VI)

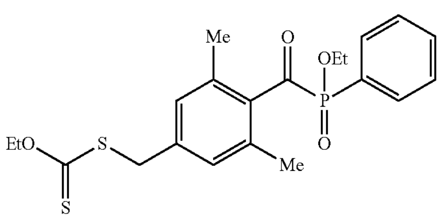

Formula (VII)

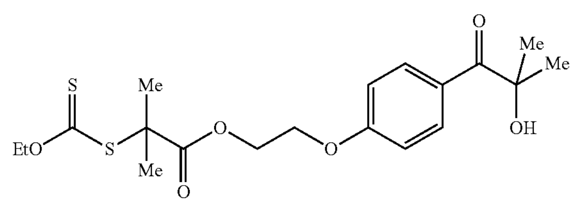

Formula (VIII)

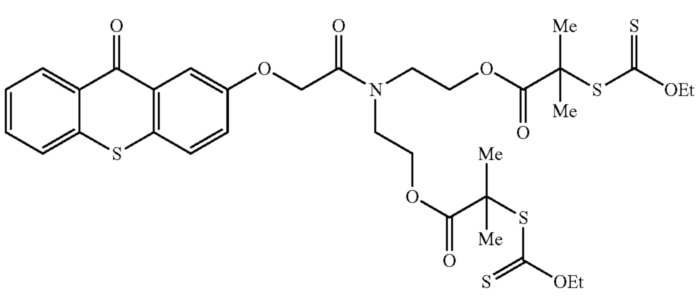

Formula (IX)

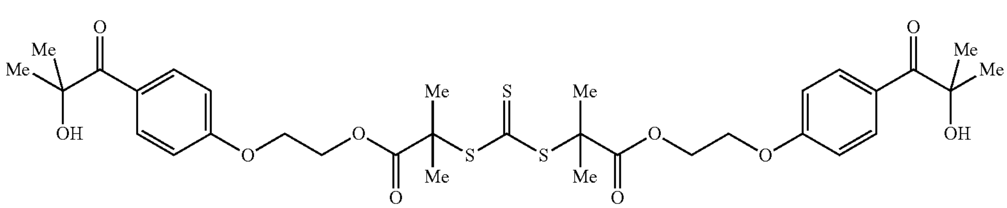

-continued
Formula (X)
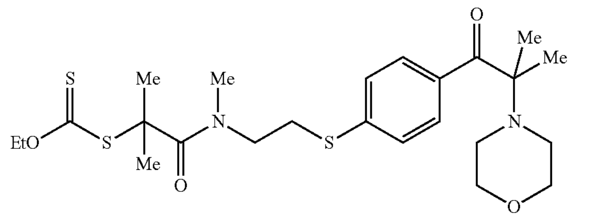
Formula (XI)
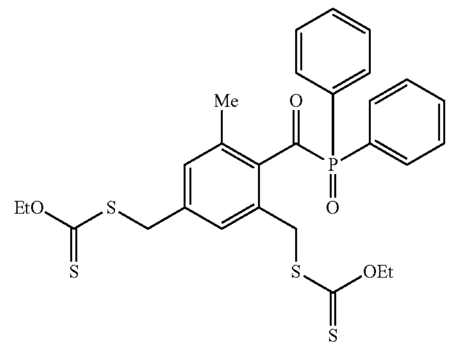
Formula (XII)
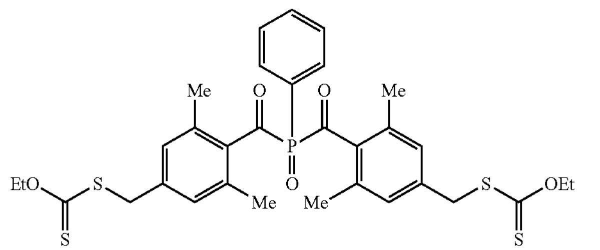
Formula (XIII)
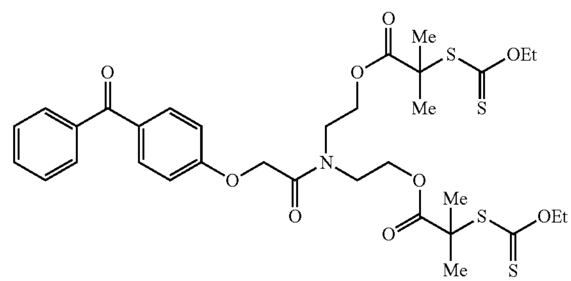
Formula (XIV)
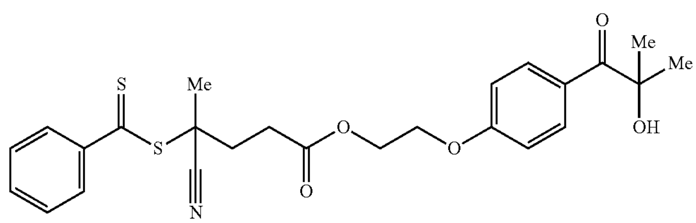
Formula (XV)
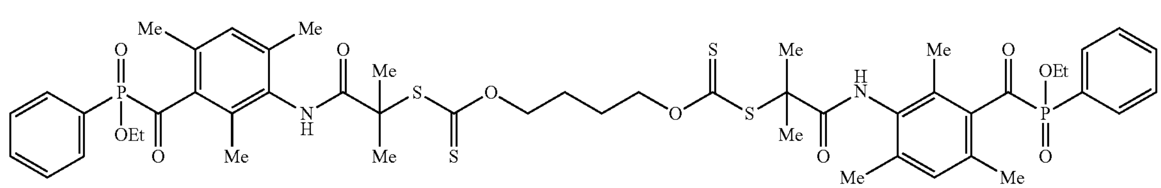
Formula (XVI)
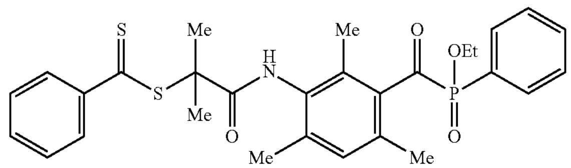
Formula (XVII)
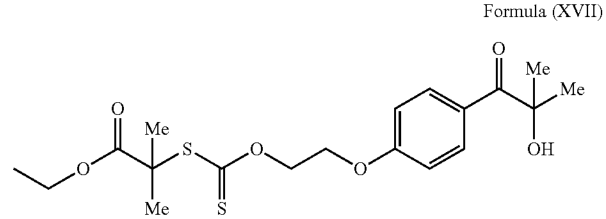
Formula (XVIII)
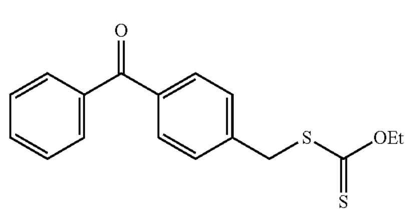
Formula (XIX)
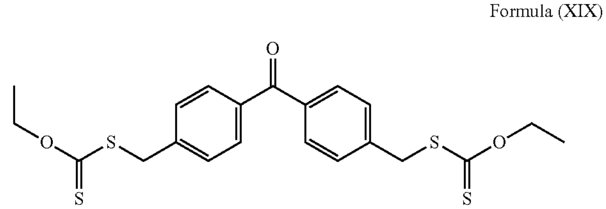

-continued
Formula (XX)
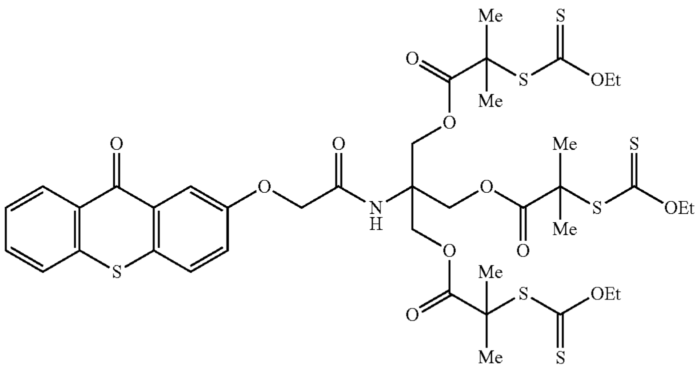
Formula (XXI)
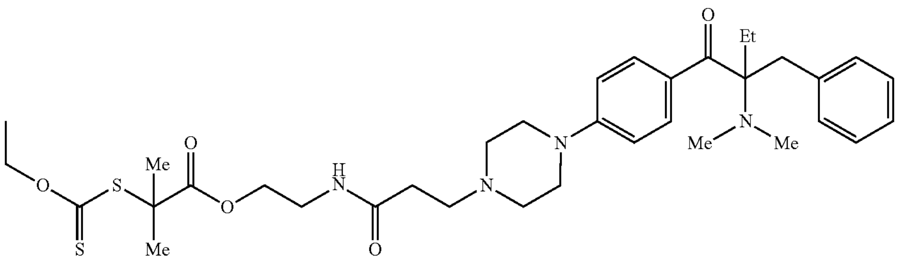
Formula (XXII)
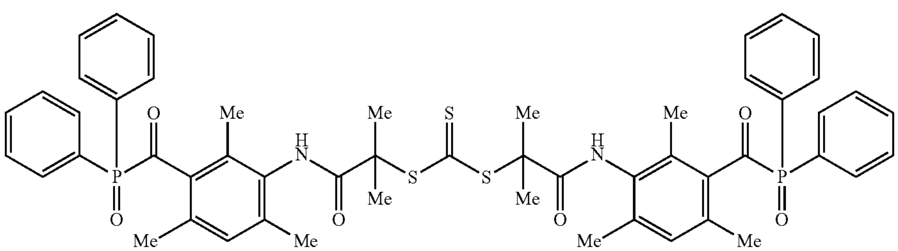
Formula (XXIII)
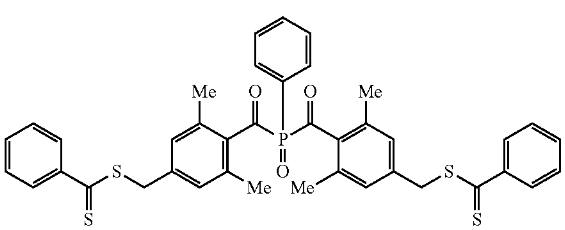
Formula (XXIV)
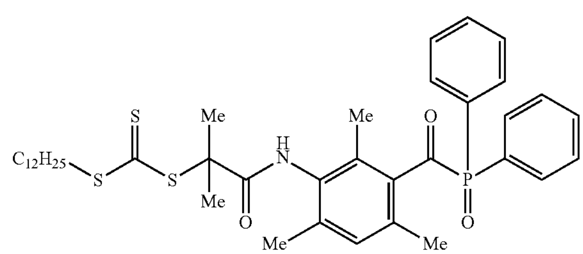
Formula (XXV)
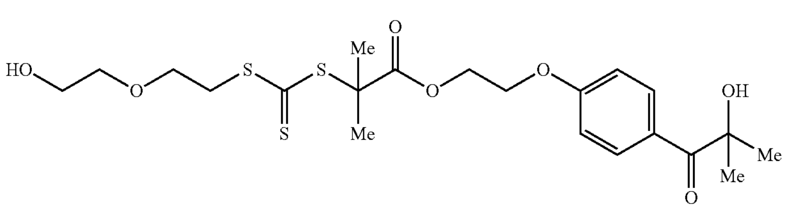
Formula (XXVI)
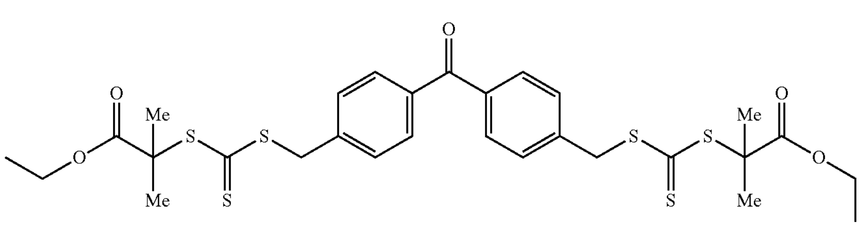

-continued

Formula (XXVII)

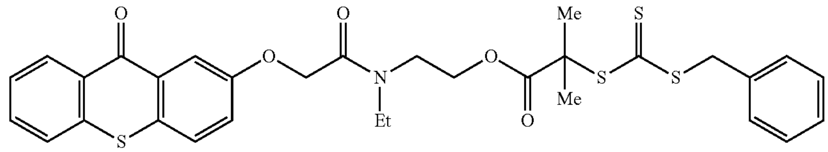

Formula (XXVIII)

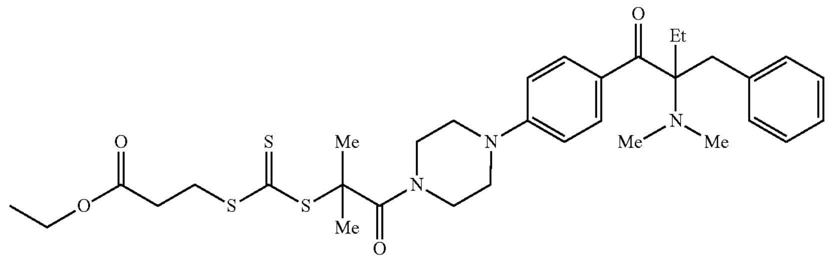

Further examples of photo initiators include, but are not limited to, polymerizable photo initiators, such as, e.g., those described in WO2017220425. Those include, but are not limited to, photo initiators of Formula (XXIX) and Formula (XXX), and mixtures thereof:

Preferably, a mixture of polymerizable photo initiators of Formula (XXIX) and Formula (XXX) may comprise or consist of an amount ranging from 0.1% w/w to 20.0% w/w, more preferably no more than 10.0% w/w of the photo initiator of Formula (XXX), based on the total weight of (Formula XXIX)

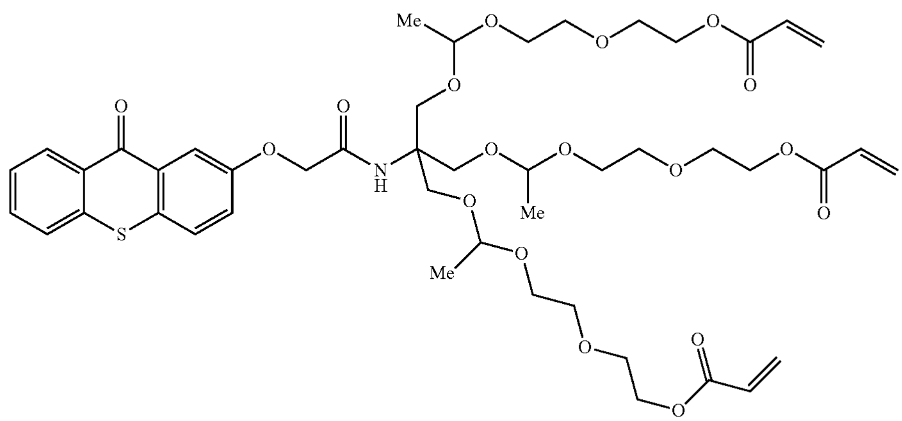

(Formula XXX)

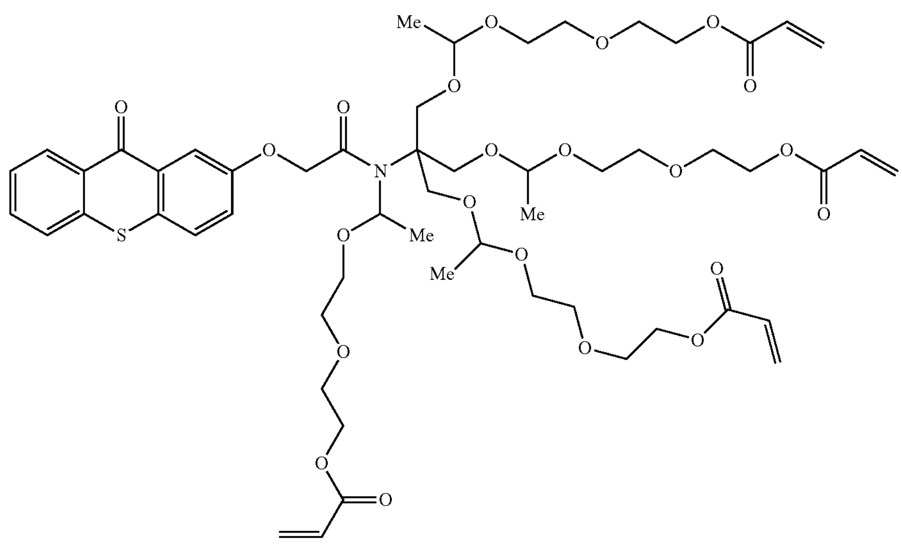

polymerizable photo initiators of Formula (XXIX) and Formula (XXX). Preferably, a mixture of polymerizable photo initiators of Formula (XXIX) and Formula (XXX) may comprise or consist of an amount of 75.0% w/w, more preferably an amount ranging from 80.0% w/w to 99.9% w/w of the photo initiator of Formula (XXIX), based on the total weight of polymerizable photo initiators of Formula (XXIX) and Formula (XXX).

In one embodiment, the polymerizable formulation may further comprise a thermal initiator. Examples of thermal initiator include but are limited to: peroxide compounds, azo compounds such as azobisisobutyronitrile (AIBN) and 4,4-Azobis(4-cyanovaleric acid), potassium and ammonium persulfate, tert-Butyl peroxide, benzoyl peroxide and the like.

In one embodiment, the polymeric auxiliary layer may be a polymerized solid made from an alkyl methacrylates or an alkyl acrylates such as acrylic acid, methacrylic acid, crotonic acid, acrylonitrile, acrylic esters substituted with methoxy, ethoxy, propoxy, butoxy, and similar derivatives for example, methyl acrylate, ethyle acrylate, propyl acrylate, butyl acrylate, isobutyl acrylate, lauryl acrylate, norbornyl acrylate, 2-ethyl hexyl acrylate, 2-hydroxyethyl acrylate, 4-hydroxybutyl acrylate, benzyl acrylate, phenyl acrylate, isobornyle acrylate, hydroxypropyl acrylate, fluorinated acrylic monomers, chlorinated acrylic monomers, methacrylic acid, methyl methacrylate, nbutyl methacrylate, isobutyl methacrylate, 2-ethyl hexyl methacrylate, 2-hydroxyethyl methacrylate, 4-hydroxybutyl methacrylate, benzyl methacrylate, phenyl methacrylate, lauryl methacrylate, norbornyl methacrylate, isobornyle methacrylate, hydroxypropyl methacrylate, fluorinated methacrylic monomers, chlorinated methacrylic monomers, alkyl crotonates, allyl crotonates, glycidyl methacrylate and related esters.

In one embodiment, the polymeric auxiliary layer may be a polymerized solid made from an alkyl acrylamide or alkyl methacrylamide such as acrylamide, Alkylacrylamide, Ntert-Butylacrylamide, Diacetone acrylamide, N,N-Diethylacrylamide, N-Isobutoxymethyl)acrylamide, N-(3-Methoxypropyl)acrylamide, NDiphenylmethylacrylamide, N-Ethylacrylamide, N-Hydroxyethyl acrylamide, N-(Isobutoxymethyl)acrylamide, N-Isopropylacrylamide, N-(3-Methoxypropyl)acrylamide, N-Phenylacrylamide, N-[Tris(hydroxymethyl)methyl]acrylamide, N,N-Diethylmethacrylamide, N,NDimethylacrylamide, N-[3-(Dimethylamino)propyl]methacrylamide, N-(Hydroxymethyl)acrylamide, 2-Hydroxypropyl methacrylamide, NIsopropylmethacrylamide, Methacrylamide, N-(Triphenylmethyl)methacrylamide and similar derivatives.

In one embodiment, the polymeric auxiliary layer may be a polymerized solid made from alpha-olefins, dienes such as butadiene and chloroprene; styrene, alpha-methyl styrene, and the like; heteroatom substituted alpha-olefins, for example, vinyl acetate, vinyl alkyl ethers for example, ethyl vinyl ether, vinyltrimethylsilane, vinyl chloride, tetrafluoroethylene, chlorotrifuoroethylene, cyclic and polycyclic olefin compounds for example, cyclopentene, cyclohexene, cycloheptene, cyclooctene, and cyclic derivatives up to C20; polycyclic derivates for example, norbornene, and similar derivatives up to C20; cyclic vinyl ethers for example, 2, 3-dihydrofuran, 3,4-dihydropyran, and similar derivatives; allylic alcohol derivatives for example, vinylethylene carbonate, disubstituted olefins such as maleic and fumaric compounds for example, maleic anhydride, diethylfumarate, and the like, and mixtures thereof.

In one embodiment, the polymeric auxiliary layer may be PMMA, Poly(lauryl methacrylate), glycolized poly(ethylene terephthalate), Poly(maleic anhydride-altoctadecene), or mixtures thereof.

In one embodiment, the polymeric auxiliary layer may comprise a copolymer of vinyl chloride and a hydroxyfunctional monomer. Such copolymer is described, e.g., in WO2017102574. In such embodiment, examples of hydroxyfunctional monomers include, without limitation, 2-hydroxypropyl acrylate, 1-hydroxy-2-propyl acrylate, 3-methyl-3-buten-1-ol, 2-methyl-2-propenoic acid 2-hydroxypropyl ester, 2-hydroxy-3-chloropropyl methacrylate, N-methylolmethacrylamide, 2-hydroxyethyl methacrylate, poly(ethylene oxide) monomethacrylate, glycerine monomethacrylate, 1,2-propylene glycol methacrylate, 2,3-hydroxypropyl methacrylate, 2-hydroxyethyl acrylate, vinyl alcohol, N-methylolacrylamid, 2-propenoic acid 5-hydroxypentyl ester, 2-methyl-2-propenoic acid, 3-chloro-2-hydroxypropyl ester, 1-hydroxy-2-propenoic acid, 1-methylethyl ester, 2-hydroxyethyl allyl ether, 4-hydroxybutyl acrylate, 1,4-butanediol monovinyl ether, poly(e-caprolactone) hydroxyethyl methacrylate ester, poly(ethylene oxide) monomethacrylate, 2-methyl-2-propenoic acid, 2,5-dihydroxypentyl ester, 2-methyl-2-propenoic acid, 5,6-dihydroxyhexyl ester, 1,6-hexanediol monomethacrylate, 1,4-dideoxy-pentitol, 5-(2-methyl-2-propenoate), 2-propenoic acid, 2,4-dihydroxybutyl ester, 2-propenoic acid, 3,4-dihydroxybutyl ester, 2-methyl-2-propenoic acid, 2-hydroxy butyl ester, 3-hydroxypropyl methacrylate, 2-propenoic acid, 2,4-dihydroxybutyl ester and isopropenyl alcohol. Examples of copolymers of vinyl chloride and a hydroxyfunctional monomer include, without limitation, chloroethylene-vinyl acetate-vinyl alcohol copolymer, vinyl alcohol-vinyl chloride copolymer, 2-hydroxypropyl acrylate-vinyl chloride polymer, propanediol monoacrylate-vinyl chloride copolymer, vinyl acetate-vinyl chloride-2-hydroxypropyl acrylate copolymer, hydroxyethyl acrylate-vinyl chloride copolymer and 2-hydroxyethyl methacrylate-vinyl chloride copolymer.

In another embodiment, the auxiliary layer may further comprise at least one solvent such as for example, pentane, hexane, heptane, cyclohexane, petroleum ether, toluene, benzene, xylene, chlorobenzene, carbon tetrachloride, chloroform, dichloromethane, 1,2-dichloroethane, THF (tetrahydrofuran), acetonitrile, acetone, ethanol, methanol, ethyl acetate, ethylene glycol, diglyme (diethylene glycol dimethyl ether), diethyl ether, DME (1,2-dimethoxy-ethane, glyme), DMF (dimethylformamide), NMF (N-methylformamide), FA (Formamide), DMSO (dimethyl sulfoxide), 1,4-Dioxane, triethyl amine, or mixture thereof.

According to one embodiment, the auxiliary layer does not comprise glass.

According to one embodiment, the auxiliary layer does not comprise vitrified glass.

According to one embodiment, examples of inorganic auxiliary layer include but are not limited to: materials obtainable by sol-gel process, metal oxides such as for example $SiO_2$, $Al_2O_3$, $TiO_2$, $ZrO_2$, ZnO, MgO, $SnO_2$, $IrO_2$, or a mixture thereof. Said auxiliary layer acts as a supplementary barrier against oxidation and can drain away the heat if it is a good thermal conductor.

According to one embodiment, the auxiliary layer is composed of a material selected in the group of metals, halides, chalcogenides, phosphides, sulfides, metalloids, metallic alloys, ceramics such as for example oxides, carbides, nitrides, glasses, enamels, ceramics, stones, precious stones, pigments, cements and/or inorganic polymers. Said auxiliary layer is prepared using protocols known to the person skilled in the art.

According to one embodiment, a chalcogenide is a chemical compound consisting of at least one chalcogen anion selected in the group of O, S, Se, Te, Po, and at least one or more electropositive element.

According to one embodiment, the metallic auxiliary layer is selected in the group of gold, silver, copper, vanadium, platinum, palladium, ruthenium, rhenium, yttrium, mercury, cadmium, osmium, chromium, tantalum, manganese, zinc, zirconium, niobium, molybdenum, rhodium, tungsten, iridium, nickel, iron, or cobalt.

According to one embodiment, examples of carbide auxiliary layer include but are not limited to: SiC, WC, BC, MoC, TiC, $Al_4C_3$, $LaC_2$, FeC, CoC, HfC, $Si_xC_y$, $W_xC_y$, $B_xC_y$, $Mo_xC_y$, $Ti_xC_y$, $Al_xC_y$, $La_xC_y$, $Fe_xC_y$, $Co_xC_y$, $Hf_xC_y$, or a mixture thereof; x and y are independently a decimal number from 0 to 5, at the condition that x and y are not simultaneously equal to 0, and x≠0.

According to one embodiment, examples of oxide auxiliary layer include but are not limited to: $SiO_2$, $Al_2O_3$, $TiO_2$, $ZrO_2$, ZnO, MgO, $SnO_2$, $Nb_2Os$, $CeO_2$, BeO, $IrO_2$, CaO, $Sc_2O_3$, NiO, $Na_2O$, BaO, $K_2O$, PbO, $Ag_2O$, $V_2O_5$, $TeO_2$, MnO, $B_2O_3$, $P_2O_5$, $P_2O_3$, $P_4O_7$, $P_4O_8$, $P_4O_9$, $P_2O_6$, PO, $GeO_2$, $As_2O_3$, $Fe_2O_3$, $Fe_3O_4$, $Ta_2O_5$, $Li_2O$, SrO, $Y_2O_3$, $HfO_2$, $WO_2$, $MoO_2$, $Cr_2O_3$, $Tc_2O_7$, $ReO_2$, $RuO_2$, $Co_3O_4$, OsO, $RhO_2$, $Rh_2O_3$, PtO, PdO, CuO, $Cu_2O$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof.

According to one embodiment, examples of oxide auxiliary layer include but are not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

According to one embodiment, examples of nitride auxiliary layer include but are not limited to: TiN, $Si_3N_4$, MoN, VN, TaN, $Zr_3N_4$, HfN, FeN, NbN, GaN, CrN, AlN, InN, $Ti_xN_y$, $Si_xN_y$, $Mo_xN_y$, $V_xN_y$, $Ta_xN_y$, $Zr_xN_y$, $Hf_xN_y$, $Fe_xN_y$, $Nb_xN_y$, $Ga_xN_y$, $Cr_xN_y$, $Al_xN_y$, $In_xN_y$, or a mixture thereof; x and y are independently a decimal number from 0 to 5, at the condition that x and y are not simultaneously equal to 0, and x≠0.

According to one embodiment, examples of sulfide auxiliary layer include but are not limited to: $Si_yS_x$, $Al_yS_x$, $Ti_yS_x$, $Zr_yS_x$, $Zn_yS_x$, $Mg_yS_x$, $Sn_yS_x$, $Nb_yS_x$, $Ce_yS_x$, $Be_yS_x$, $Ir_yS_x$, $Ca_yS_x$, $Sc_yS_x$, $Ni_yS_x$, $Na_yS_x$, $Ba_yS_x$, $K_yS_x$, $Pb_yS_x$, $Ag_yS_x$, $V_yS_x$, $Te_yS_x$, $Mn_yS_x$, $B_yS_x$, $P_yS_x$, $Ge_yS_x$, $As_yS_x$, $Fe_yS_x$, $Ta_yS_x$, $Li_yS_x$, $Sr_yS_x$, $Y_yS_x$, $Hf_yS_x$, $W_yS_x$, $Mo_yS_x$, $Cr_yS_x$, $Tc_yS_x$, $Re_yS_x$, $Ru_yS_x$, $Co_yS_x$, $Os_yS_x$, $Rh_yS_x$, $Pt_yS_x$, $Pd_yS_x$, $Cu_yS_x$, $Au_yS_x$, $Cd_yS_x$, $Hg_yS_x$, $Tl_yS_x$, $Ga_yS_x$, $In_yS_x$, $Bi_yS_x$, $Sb_yS_x$, $Po_yS_x$, $Se_yS_x$, $Cs_yS_x$, mixed sulfides, mixed sulfides thereof or a mixture thereof; x and y are independently a decimal number from 0 to 10, at the condition that x and y are not simultaneously equal to 0, and x≠0.

According to one embodiment, examples of halide auxiliary layer include but are not limited to: $BaF_2$, $LaF_3$, $CeF_3$, $YF_3$, $CaF_2$, $MgF_2$, $PrF_3$, AgCl, $MnCl_2$, $NiCl_2$, $Hg_2Cl_2$, $CaCl_2$, $CsPbCl_3$, AgBr, $PbBr_3$, $CsPbBr_3$, AgI, CuI, PbI, $Hg_2$, $BiI_3$, $CH_3NH_3PbI_3$, $CH_3NH_3PbCl_3$, $CH_3NH_3PbBr_3$, $CsPbI_3$, $FAPbBr_3$ (with FA formamidinium), or a mixture thereof.

According to one embodiment, examples of chalcogenide auxiliary layer include but are not limited to: CdO, CdS, CdSe, CdTe, ZnO, ZnS, ZnSe, ZnTe, HgO, HgS, HgSe, HgTe, CuO, $Cu_2O$, CuS, $Cu_2S$, CuSe, CuTe, $Ag_2O$, $Ag_2S$, $Ag_2Se$, $Ag_2Te$, $Au_2S$, PdO, PdS, $Pd_4S$, PdSe, PdTe, PtO, PtS, $PtS_2$, PtSe, PtTe, $RhO_2$, $Rh_2O_3$, $RhS_2$, $Rh_2S_3$, $RhSe_2$, $Rh_2Se_3$, $RhTe_2$, $IrO_2$, $IrS_2$, $Ir_2S_3$, $IrSe_2$, $IrTe_2$, $RuO_2$, $RuS_2$, OsO, OsS, OsSe, OsTe, MnO, MnS, MnSe, MnTe, $ReO_2$, $ReS_2$, $Cr_2O_3$, $Cr_2S_3$, $MoO_2$, $MoS_2$, $MoSe_2$, $MoTe_2$, $WO_2$, $WS_2$, $WSe_2$, $V_2O_5$, $V_2S_3$, $Nb_2Os$, $NbS_2$, $NbSe_2$, $HfO_2$, $HfS_2$, $TiO_2$, $ZrO_2$, $ZrS_2$, $ZrSe_2$, $ZrTe_2$, $Sc_2O_3$, $Y_2O_3$, $Y_2S_3$, $SiO_2$, $GeO_2$, GeS, $GeS_2$, GeSe, $GeSe_2$, GeTe, $SnO_2$, SnS, $SnS_2$, SnSe, $SnSe_2$, SnTe, PbO, PbS, PbSe, PbTe, MgO, MgS, MgSe, MgTe, CaO, CaS, SrO, $Al_2O_3$, $Ga_2O_3$, $Ga_2S_3$, $Ga_2Se_3$, $In_2O_3$, $In_2S_3$, $In_2Se_3$, $In_2Te_3$, $La_2O_3$, $La_2S_3$, $CeO_2$, $CeS_2$, $Pr_6O_{11}$, $Nd_2O_3$, $NdS_2$, $La_2O_3$, $Tl_2O$, $Sm_2O_3$, $SmS_2$, $Eu_2O_3$, $EuS_2$, $Bi_2O_3$, $Sb_2O_3$, $PoO_2$, $SeO_2$, $Cs_2O$, $Tb_4O_7$, $TbS_2$, $Dy_2O_3$, $Ho_2O_3$, $Er_2O_3$, $ErS_2$, $Tm_2O_3$, $Yb_2O_3$, $Lu_2O_3$, $CuInS_2$, $CuInSe_2$, $AgInS_2$, $AgInSe_2$, $Fe_2O_3$, $Fe_3O_4$, FeS, $FeS_2$, $Co_3S_4$, CoSe, $Co_3O_4$, NiO, $NiSe_2$, NiSe, $Ni_3Se_4$, $Gd_2O_3$, BeO, $TeO_2$, $Na_2O$, BaO, $K_2O$, $Ta_2O_5$, $Li_2O$, $Tc_2O_7$, $As_2O_3$, $B_2O_3$, $P_2O_5$, $P_2O_3$, $P_4O_7$, $P_4O_8$, $P_4O_9$, $P_2O_6$, PO, or a mixture thereof.

According to one embodiment, examples of phosphide auxiliary layer include but are not limited to: InP, $Cd_3P_2$, $Zn_3P_2$, AlP, GaP, TlP, or a mixture thereof.

According to one embodiment, examples of metalloid auxiliary layer include but are not limited to: Si, B, Ge, As, Sb, Te, or a mixture thereof.

According to one embodiment, examples of metallic alloy auxiliary layer include but are not limited to: Au—Pd, Au—Ag, Au—Cu, Pt—Pd, Pt—Ni, Cu—Ag, Cu—Sn, Ru—Pt, Rh—Pt, Cu—Pt, Ni—Au, Pt—Sn, Pd—V, Ir—Pt, Au—Pt, Pd—Ag, Cu—Zn, Cr—Ni, Fe—Co, Co—Ni, Fe—Ni or a mixture thereof.

According to one embodiment, the auxiliary layer comprises garnets.

According to one embodiment, examples of garnets include but are not limited to: $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, or a mixture thereof.

According to one embodiment, the auxiliary layer comprises or consists of a thermal conductive material wherein said thermal conductive material includes but is not limited to: $Al_yO_x$, $Ag_yO_x$, $Cu_yO_x$, $Fe_yO_x$, $Si_yO_x$, $Pb_yO_x$, $Ca_yO_x$, $Mg_yO_x$, $Zn_yO_x$, $Sn_yO_x$, $Ti_yO_x$, $Be_yO_x$, CdS, ZnS, ZnSe, CdZnS, CdZnSe, Au, Na, Fe, Cu, Al, Ag, Mg, mixed oxides, mixed oxides thereof or a mixture thereof; x and y are independently a decimal number from 0 to 10, at the condition that x and y are not simultaneously equal to 0, and x≠0.

According to one embodiment, the auxiliary layer comprises or consists of a thermal conductive material wherein said thermal conductive material includes but is not limited to: $Al_2O_3$, $Ag_2O$, $Cu_2O$, CuO, $Fe_3O_4$, FeO, $SiO_2$, PbO, CaO, MgO, ZnO, $SnO_2$, $TiO_2$, BeO, CdS, ZnS, ZnSe, CdZnS, CdZnSe, Au, Na, Fe, Cu, Al, Ag, Mg, mixed oxides, mixed oxides thereof or a mixture thereof.

According to one embodiment, the auxiliary layer comprises or consists of a thermal conductive material wherein said thermal conductive material includes but is not limited to: aluminium oxide, silver oxide, copper oxide, iron oxide, silicon oxide, lead oxide, calcium oxide, magnesium oxide, zinc oxide, tin oxide, titanium oxide, beryllium oxide, zinc sulfide, cadmium sulfide, zinc selenium, cadmium zinc selenium, cadmium zinc sulfide, gold, sodium, iron, copper, aluminium, silver, magnesium, mixed oxides, mixed oxides thereof or a mixture thereof.

According to one embodiment, the auxiliary layer comprises organic molecules in small amounts of 0 mole %, 1 mole %, 5 mole %, 10 mole %, 15 mole %, 20 mole %, 25 mole %, 30 mole %, 35 mole %, 40 mole %, 45 mole %, 50 mole %, 55 mole %, 60 mole %, 65 mole %, 70 mole %, 75 mole %, 80 mole % relative to the majority element of said auxiliary layer.

According to one embodiment, the auxiliary layer comprises a polymeric material as described hereabove, an inorganic material as described hereabove, or a mixture thereof.

In one embodiment, the auxiliary layer has a thickness between 30 nm and 1 cm, between 100 nm and 1 mm, preferably between 100 nm and 500 m.

According to one embodiment, the auxiliary layer has a thickness of at least 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.1 μm, 4.2 μm, 4.3 μm, 4.4 μm, 4.5 μm, 4.6 μm, 4.7 μm, 4.8 μm, 4.9 μm, 5 μm, 5.1 μm, 5.2 μm, 5.3 μm, 5.4 μm, 5.5 μm, 5.5 μm, 5.6 μm, 5.7 μm, 5.8 μm, 5.9 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 cm.

According to one embodiment, the multilayered system is covered by at least one protective layer.

According to one embodiment, the multilayered system is surrounded by at least one protective layer.

In one embodiment, the multilayered system is covered by at least one auxiliary layer, both being then surrounded by at least one protective layer.

In one embodiment, the multilayered system is covered at least one auxiliary layer and/or at least one protective layer.

In one embodiment, the protective layer is a planarization layer.

In one embodiment, the protective layer is an oxygen, ozone and/or water impermeable layer.

In one embodiment, the protective layer is an oxygen, ozone and/or water non-permeable layer.

According to one embodiment, the protective layer is thermally conductive.

According to one embodiment, the protective layer has a thermal conductivity at standard conditions ranging from 0.1 to 450 W/(m·K), preferably from 1 to 200 W/(m·K), more preferably from 10 to 150 W/(m·K).

According to one embodiment, the protective layer has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9

W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

In one embodiment, the protective layer can be made of glass, PET (Polyethylene terephthalate), PDMS (Polydimethylsiloxane), PES (Polyethersulfone), PEN (Polyethylene naphthalate), PC (Polycarbonate), PI (Polyimide), PNB (Polynorbornene), PAR (Polyarylate), PEEK (Polyetheretherketone), PCO (Polycyclic olefins), PVDC (Polyvinylidene chloride), Nylon, ITO (Indium tin oxide), FTO (Fluorine doped tin oxide), cellulose, $Al_2O_3$, $AlO_xN_y$, $SiO_xC_y$, $SiO_2$, $SiO_x$, $SiN_x$, $SiC_x$, $ZrO_2$, $TiO_2$, MgO, ZnO, $SnO_2$, ceramic, organic modified ceramic, or mixture thereof.

In one embodiment, the protective layer can be deposited by PECVD (Plasma Enhanced Chemical Vapor Deposition), ALD (Atomic Layer Deposition), CVD (Chemical Vapor Deposition), iCVD (Initiator Chemical Vapor Deposition), Cat-CVD (Catalytic Chemical Vapor Deposition).

According to one embodiment, the protective layer may comprise scattering particles. Examples of scattering particles include but are not limited to: $SiO_2$, $ZrO_2$, ZnO, MgO, $SnO_2$, $TiO_2$, Ag, Au, alumina, barium sulfate, PTFE, barium titanate and the like.

In one embodiment, the protective layer further comprises thermal conductor particles. Examples of thermal conductor particles include but are not limited to: $SiO_2$, $ZrO_2$, ZnO, MgO, $SnO_2$, $TiO_2$, CaO, alumina, barium sulfate, PTFE, barium titanate and the like. In this embodiment, the thermal conductivity of the protective layer is increased.

In one embodiment, the support can be a substrate, a LED, a LED array, a vessel, a tube or a container. Preferably the support is optically transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

LED used herein includes LED, LED chip 5 and micro-sized LED 6.

In one embodiment, the support can be a fabric, a piece of clothes, wood, plastic, ceramic, glass, steel, metal, or any active surfaces.

In one embodiment, active surfaces are interactive surfaces.

In one embodiment, active surfaces are surfaces destined to be included in an optoelectronic device, or a display device.

In one embodiment, the support is reflective.

In one embodiment, the support comprises a material allowing to reflect the light such as for example a metal like aluminium, silver, a glass, a polymer or a plastic.

In one embodiment, the support is thermally conductive.

According to one embodiment, the support has a thermal conductivity at standard conditions ranging from 0.5 to 450 W/(m·K), preferably from 1 to 200 W/(m·K), more preferably from 10 to 150 W/(m·K).

According to one embodiment, the support has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6

W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the substrate comprises GaN, GaSb, GaAs, GaAsP, GaP, InP, SiGe, InGaN, GaAlN, GaAlPN, AlN, AlGaAs, AlGaP, AlGaInP, AlGaN, AlGaInN, ZnSe, Si, SiC, diamond, boron nitride.

According to one embodiment, the substrate comprises Au, Ag, Pt, Ru, Ni, Co, Cr, Cu, Sn, Rh Pd, Mn, Ti or a mixture thereof.

According to one embodiment, the substrate comprises silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

A second object of the invention relates to an ink comprising at least one particle 2 (as illustrated in FIG. 18) comprising a plurality of nanoparticles 3 encapsulated in a material 21; and at least one liquid vehicle; wherein said particle 2 has a surface roughness less or equal to 5% of the largest dimension of said particle 2.

According to one embodiment, the particle 2 is as described hereabove.

According to one embodiment, in an ink comprising a plurality of particles 2, said particles 2 are polydisperse.

According to one embodiment, in an ink comprising a plurality of particles 2, said particles 2 are monodisperse.

According to one embodiment, in an ink comprising a plurality of particles 2, said particles 2 have a narrow size distribution.

According to one embodiment, in an ink comprising a plurality of particles 2, said particles 2 are not aggregated in the liquid vehicle.

According to one embodiment, in an ink comprising a plurality of particles 2, said particles 2 are not in contact in the liquid vehicle.

According to one embodiment, in an ink comprising a plurality of particles 2, said particles 2 are individually dispersed in the liquid vehicle.

According to one embodiment, in an ink comprising a plurality of particles 2, said particles 2 are aggregated in the liquid vehicle.

According to one embodiment, in an ink comprising a plurality of particles 2, said particles 2 are in contact in the liquid vehicle.

According to one embodiment, the nanoparticles 3 are as described hereabove.

According to one embodiment, the material 21 is the second material 21 as described hereabove.

According to one embodiment, the liquid vehicle is as described hereabove.

According to one embodiment, the ink is as described hereabove.

According to one embodiment, the ink is deposited on a support by drop-casting, spin coating, dip coating, inkjet printing, spray, plating, electroplating, or any other means known by the person skilled in the art.

According to one embodiment, the ink is deposited on a support by inkjet printing: thermal, piezoelectric or other inkjet printing methods.

In one embodiment, the ink on a support is encapsulated into a multilayered system. In one embodiment, the multilayer system comprises at least two, at least three layers.

In one embodiment, the support is as described hereabove.

In one embodiment, the multilayered system is as described hereabove.

A third object of the invention relates to an ink comprising at least one phosphor nanoparticle; and at least one liquid vehicle; wherein the phosphor nanoparticle has a size ranging from 0.1 am to 50 am.

According to one embodiment, the at least one phosphor nanoparticle is as described hereabove.

According to one embodiment, in an ink comprising a plurality of phosphor nanoparticles, said phosphor nanoparticles are polydisperse.

According to one embodiment, in an ink comprising a plurality of phosphor nanoparticles, said phosphor nanoparticles are monodisperse.

According to one embodiment, in an ink comprising a plurality of phosphor nanoparticles, said phosphor nanoparticles have a narrow size distribution.

According to one embodiment, in an ink comprising a plurality of phosphor nanoparticles, said phosphor nanoparticles are not aggregated in the liquid vehicle.

According to one embodiment, in an ink comprising a plurality of phosphor nanoparticles, said phosphor nanoparticles are not in contact in the liquid vehicle.

According to one embodiment, in an ink comprising a plurality of phosphor nanoparticles, said phosphor nanoparticles are individually dispersed in the liquid vehicle.

According to one embodiment, in an ink comprising a plurality of phosphor nanoparticles, said phosphor nanoparticles are aggregated in the liquid vehicle.

According to one embodiment, in an ink comprising a plurality of phosphor nanoparticles, said phosphor nanoparticles are in contact in the liquid vehicle.

According to one embodiment, the liquid vehicle is as described hereabove.

According to one embodiment, the ink is as described hereabove.

According to one embodiment, the ink is deposited on a support by drop-casting, spin coating, dip coating, inkjet printing, spray, plating, electroplating, or any other means known by the person skilled in the art.

According to one embodiment, the ink is deposited on a support by inkjet printing: thermal, piezoelectric or other inkjet printing methods.

In one embodiment, the ink on a support is encapsulated into a multilayered system. In one embodiment, the multilayer system comprises at least two, at least three layers.

In one embodiment, the support is as described hereabove.

In one embodiment, the multilayered system is as described hereabove.

A fourth object of the invention relates to an ink comprising at least one particle 1 (illustrated in FIG. 1) comprising a first material 11 and at least one liquid vehicle; wherein the particle 1 comprises at least one particle 2 comprising a second material 21 and at least one nanoparticle 3 dispersed in said second material 21; and wherein said particle 1 has a surface roughness less or equal to 5% of the largest dimension of said particle 1.

According to one embodiment, the particle 1 is as described hereabove.

According to one embodiment, the particle 2 is as described hereabove.

According to one embodiment, the nanoparticles 3 are as described hereabove.

According to one embodiment, the first material 11 and the second material 21 are as described hereabove.

According to one embodiment, the liquid vehicle is as described hereabove.

According to one embodiment, the ink is as described hereabove.

According to one embodiment, the ink is deposited on a support by drop-casting, spin coating, dip coating, inkjet printing, spray, plating, electroplating, or any other means known by the person skilled in the art.

According to one embodiment, the ink is deposited on a support by inkjet printing: thermal, piezoelectric or other inkjet printing methods.

In one embodiment, the ink on a support is encapsulated into a multilayered system. In one embodiment, the multilayer system comprises at least two, at least three layers.

In one embodiment, the support is as described hereabove.

In one embodiment, the multilayered system is as described hereabove.

In a preferred embodiment, examples of the ink include but are not limited to:

- an ink comprising particles of the invention in PMMA, MMA or PS;
- an ink comprising: 40 wt. % to 60 wt. % polyethylene glycol dimethacrylate monomer, or polyethylene glycol diacrylate monomer (number average molecular weights in the range from about 230 g/mole to about 430 g mole); 25 wt. % to 50 wt. % monoacrylate monomer, or monomethacrylate monomer (viscosity in the range from about 10 cps to about 27 cps at 22° C.); 4 wt. % to 10 wt. % multifunctional acrylate crosslinking agent, or a multifunctional methacrylate crosslinking agent; and 0.1 wt. % to 10 wt. % crosslinking photoinitiator; and 0.01 wt. % to 50 wt. % particles of the invention;
- an ink comprising: from 30 wt. % to 50 wt. % of a polyethylene glycol dimethacrylate monomer, or a polyethylene glycol diacrylate monomer (number average molecular weights in the range from 230 g/mole to 430 g/mole); from 4 wt. % to 10 wt. % of a multifunctional acrylate crosslinking agent, or a multifunctional methacrylate crosslinking agent; from 40 wt. % to 60 wt. % of a spreading modifier comprising an alkoxylated aliphatic diacrylate monomer, or an alkoxylated aliphatic dimethacrylate monomer (viscosity in the range from 14 cps to 18 cps at 22° C. and surface tension in the range from 35 dynes/cm to 39 dynes/cm at 22° C.); and 0.01 wt. % to 50 wt. % particles of the invention;
- an ink comprising: from 30 wt. % to 50 wt. % of a monomer selected from the group consisting of a polyethylene glycol dimethacrylate monomer, a polyethylene glycol diacrylate monomer (number average molecular weights in the range from 230 g/mole to 430 g/mole); from 4 wt. % to 10 wt. % of a crosslinking agent selected from the group consisting of a multifunctional acrylate crosslinking agent, a multifunctional methacrylate crosslinking agent; from 40 wt. % to 60 wt. % of a spreading modifier selected from the group consisting of an alkoxylated aliphatic diacrylate monomer, an alkoxylated aliphatic dimethacrylate monomer; and 0.01 wt. % to 50 wt. % particles of the invention;
- an ink comprising: 75-95 wt. % of a polyethylene glycol dimethacrylate monomer, or a polyethylene glycol diacrylate monomer (number average molecular weights in the range from about 230 g/mole to about 430 g/mole); 4-10 wt. % of pentaerythritol tetraacrylate, or pentaerythritol tetramethacrylate; 1-15 wt. % of a spreading modifier (viscosity in the range from about 14 to about 18 cps at 22° C. and surface tension in the range from about 35 to about 39 dynes/cm at 22° C.); and 0.01 wt. % to 50 wt. % particles of the invention;
- an ink comprising: particles 1, di(meth)acrylate monomers; wherein said particles 1 comprise particles 2 comprising quantum dots or semiconductor nanoplatelets;
- an ink comprising: particles 2, di(meth)acrylate monomers; wherein said particles 2 comprise quantum dots or semiconductor nanoplatelets;
- an ink comprising: particles 1, a combination of di(meth) acrylate and mono(meth)acrylate monomers; wherein said particles 1 comprise particles 2 comprising quantum dots or semiconductor nanoplatelets;
- an ink comprising: particles 2, a combination of di(meth) acrylate and mono(meth)acrylate monomers; wherein said particles 2 comprise quantum dots or semiconductor nanoplatelets;
- 70 wt. % to 96 wt. % di(meth)acrylate monomers or a combination of di(meth)acrylate monomers and mono (meth)acrylate monomers; 4 wt. % to 10 wt. % multifunctional (meth)acrylate crosslinking agent; and 0.1 wt. % to 5 wt. % particles of the invention;
- particles of the invention in combination with plasmonic scattering particles such as Ag or Au particles dispersed in a liquid vehicle;
- particles of the invention in combination with scattering particles dispersed in a liquid vehicle.

According to a preferred embodiment, examples of particle of the invention include but are not limited to: semiconductor nanoparticles encapsulated in an inorganic material, semiconductor nanocrystals encapsulated in an inorganic material, semiconductor nanoplatelets encapsulated in an inorganic material, perovskite nanoparticles encapsulated in an inorganic material, phosphor nanoparticles encapsulated in an inorganic material, semiconductor nanoplatelets coated with grease and then in an inorganic material such as for example $Al_2O_3$, or a mixture thereof. In this embodiment, grease can refer to lipids as, for example, long apolar carbon chain molecules; phosphlipid molecules that possess a charged end group; polymers such as block copolymers or copolymers, wherein one portion of polymer has a domain of long apolar carbon chains, either part of the backbone or part of the polymeric sidechain; or long hydrocarbon chains that have a terminal functional group that includes carboxylates, sulfates, phosphonates or thiols.

According to a preferred embodiment, examples of particle of the invention include but are not limited to: $CdSe/CdZnS@SiO_2$, $CdSe/CdZnS@Si_xCd_yZn_zO_w$, $CdSe/CdZnS@Al_2O_3$, $InP/ZnS@Al_2O_3$, $CH_5N_2$—$PbBr_3@Al_2O_3$, CdSe/CdZnS—$Au@SiO_2$, $Fe_3O_4@Al_2O_3$—$CdSe/CdZnS@SiO_2$, $CdS/ZnS@Al_2O_3$, $CdSeS/CdZnS@Al_2O_3$, $CdSe/CdS/ZnS@Al_2O_3$, $InP/ZnSe/ZnS@Al_2O_3$, $CuInS_2/ZnS@Al_2O_3$, $CuInSe_2/ZnS@Al_2O_3$, $CdSe/CdS/ZnS@SiO_2$, $CdSeS/ZnS@Al_2O_3$, $CdSeS/CdZnS@SiO_2$, $InP/ZnS@SiO_2$, $CdSeS/CdZnS@SiO_2$, $InP/ZnSe/ZnS@SiO_2$, $Fe_3O_4@Al_2O_3$, CdSe/CdZnS@ZnO, CdSe/CdZnS @ZnO, CdSe/CdZnS $@Al_2O_3@MgO$, CdSe/CdZnS—$Fe_3O_4@SiO_2$, phosphor nanoparticles $@Al_2O_3$, phosphor nanoparticles@ZnO, phosphor nanoparticles$@SiO_2$, phosphor nanoparticles$@HfO_2$, $CdSe/CdZnS@HfO_2$, $CdSeS/CdZnS@HfO_2$, $InP/ZnS@HfO_2$, $CdSeS/CdZnS@HfO_2$, $InP/ZnSe/ZnS@HfO_2$, CdSe/CdZnS—$Fe_3O_4@HfO_2$, $CdSe/CdS/ZnS@SiO_2$, or a mixture thereof; wherein phosphor nanoparticles include but are not limited to: Yttrium aluminium garnet particles (YAG, $Y_3Al_5O_{12}$), (Ca,Y)-α-SiAlON:Eu particles, ($(Y,Gd)_3(Al,Ga)_5O_{12}$:Ce) particles, $CaAlSiN_3$:Eu particles, sulfide-based phosphor particles, PFS:$Mn^{4+}$ particles (potassium fluorosilicate).

According to a preferred embodiment, examples of particle of the invention include but are not limited to: semiconductor nanoparticles encapsulated in an inorganic material dispersed in $Al_2O_3$, $HfO_2$, $Si_{0.8}Hf_{0.2}O_2$, ZnS, ZnO, MgO, or $SiO_2$; semiconductor nanocrystals encapsulated in an inorganic material dispersed in $Al_2O_3$, $HfO_2$, $Si_{0.8}Hf_{0.2}O_2$, ZnS, ZnO, MgO, or $SiO_2$; semiconductor nanoplatelets encapsulated in an inorganic material dispersed in $Al_2O_3$, $HfO_2$, $Si_{0.8}Hf_{0.2}O_2$, ZnS, ZnO, MgO, or $SiO_2$; perovskite nanoparticles encapsulated in an inorganic material dispersed in $Al_2O_3$, $HfO_2$, $Si_{0.8}Hf_{0.2}O_2$, ZnS, ZnO, MgO, or $SiO_2$; phosphor nanoparticles encapsulated in an inorganic material dispersed in $Al_2O_3$, $HfO_2$, $Si_{0.8}Hf_{0.2}O_2$, ZnS, ZnO, MgO, or $SiO_2$; semiconductor nanoplatelets coated with grease dispersed in $Al_2O_3$, $HfO_2$, $Si_{0.8}Hf_{0.2}O_2$, ZnS, ZnO, MgO, or $SiO_2$; or a mixture thereof. In this embodiment, grease can refer to lipids as, for example, long apolar carbon chain molecules; phosphlipid molecules that possess a charged end group; polymers such as block copolymers or copolymers, wherein one portion of polymer has a domain of long apolar carbon chains, either part of the backbone or part of the polymeric sidechain; or long hydrocarbon chains that have a terminal functional group that includes carboxylates, sulfates, phosphonates or thiols.

According to a preferred embodiment, examples of particle of the invention include but are not limited to: $CdSe/CdZnS@SiO_2@Al_2O_3$, $CdSe/CdZnS@Si_xCd_yZn_zO_w@AA_2O_3$, CdSe/CdZnS—$Au@SiO_2@Al_2O_3$, $CdSeS/CdZnS@SiO_2@Al_2O_3$, $InP/ZnSe/ZnS@SiO_2@Al_2O_3$, $CdSeS/CdZnS@SiO_2@Al_2O_3$, phosphor nanoparticles$@SiO_2@Al_2O_3$, $Fe_3O_4@SiO_2@Al_2O_3$, InP/ZnS $@SiO_2@Al_2O_3$, CdSe/CdZnS—$Au@SiO_2@Al_2O_3$, $CdSe/CdS/ZnS@SiO_2@Al_2O_3$; $CdSe/CdZnS@SiO_2@ZnO$, $CdSe/CdZnS@Si_xCd_yZn_zO_w@ZnO$, CdSe/CdZnS—$Au@SiO_2@ZnO$, $CdSeS/CdZnS@SiO_2@ZnO$, $InP/ZnSe/ZnS@SiO_2@ZnO$, $CdSeS/CdZnS@SiO_2@ZnO$, phosphor nanoparticles$@SiO_2@ZnO$, $Fe_3O_4@SiO_2@ZnO$, $InP/ZnS@SiO_2@ZnO$, CdSe/CdZnS—$Au@SiO_2@ZnO$, CdSe/CdS/ZnS $@SiO_2@ZnO$; $CdSe/CdZnS@SiO_2@HfO_2$, $CdSe/CdZnS@Si_xCd_yZn_zO_w@HfO_2$, CdSe/CdZnS—$Au@SiO_2@HfO_2$, $CdSeS/CdZnS@SiO_2@HfO_2$, $InP/ZnSe/ZnS@SiO_2@HfO_2$, $CdSeS/CdZnS@SiO_2@HfO_2$, phosphor nanoparticles$@SiO_2@HfO_2$, $Fe_3O_4@SiO_2@HfO_2$, $InP/ZnS@SiO_2@HfO_2$, CdSe/CdZnS—$Au@SiO_2@HfO_2$, $CdSe/CdS/ZnS@SiO_2@HfO_2$; $CdSe/CdZnS@SiO_2@MgO$, $CdSe/CdZnS@Si_xCd_yZn_zO_w@MgO$, CdSe/CdZnS—$Au@SiO_2@MgO$, $CdSeS/CdZnS@SiO_2@MgO$, $InP/ZnSe/ZnS@SiO_2@MgO$, $CdSeS/CdZnS@SiO_2@MgO$, phosphor nanoparticles$@SiO_2@MgO$, $Fe_3O_4@SiO_2@MgO$, $InP/ZnS@SiO_2@MgO$, CdSe/CdZnS—$Au@SiO_2@MgO$, $CdSe/CdS/ZnS@SiO_2@MgO$; $CdSe/CdZnS@Al_2O_3@SiO_2$, $InP/ZnS@Al_2O_3@SiO_2$, $CH_5N_2$—$PbBr_3@Al_2O_3@SiO_2$, $CdS/ZnS@Al_2O_3@SiO_2$, CdSeS/CdZnS $@Al_2O_3@SiO_2$, CdSeS/ZnS $@Al_2O_3@SiO_2$, $Fe_3O_4@Al_2O_3@SiO_2$, CdSe/CdZnS-phosphor nanoparticles$@Al_2O_3@SiO_2$; $CdSe/CdZnS@Al_2O_3@ZnO$, $InP/ZnS@Al_2O_3@ZnO$, $CH_5N_2$—$PbBr_3@Al_2O_3@ZnO$, $CdS/ZnS@Al_2O_3@ZnO$, $CdSeS/CdZnS@Al_2O_3@ZnO$, CdSeS/ZnS $@Al_2O_3@ZnO$, $Fe_3O_4@Al_2O_3@ZnO$, CdSe/CdZnS-phosphor nanoparticles$@Al_2O_3@ZnO$; $CdSe/CdZnS@Al_2O_3@HfO_2$, $InP/ZnS@Al_2O_3@HfO_2$, $CH_5N_2$—$PbBr_3@Al_2O_3@HfO_2$, $CdS/ZnS@Al_2O_3@HfO_2$, $CdSeS/CdZnS@Al_2O_3@HfO_2$, $CdSeS/ZnS@Al_2O_3@HfO_2$, $Fe_3O_4@Al_2O_3@HfO_2$, CdSe/CdZnS-phosphor nanoparticles$@Al_2O_3@HfO_2$; $CdSe/CdZnS@Al_2O_3@MgO$, $InP/ZnS@Al_2O_3@MgO$, $CH_5N_2$—$PbBr_3@Al_2O_3@MgO$, $CdS/ZnS@Al_2O_3@MgO$, $CdSeS/CdZnS@Al_2O_3@MgO$, $CdSeS/ZnS@Al_2O_3@MgO$, $Fe_3O_4@Al_2O_3@MgO$, CdSe/CdZnS-phosphor nanoparticles$@Al_2O_3@MgO$; CdSe/CdZnS $@ZnO@Al_2O_3$, CdSe/CdZnS $@ZnO@Al_2O_3$, phosphor nanoparticles$@ZnO@Al_2O_3$; CdSe/CdZnS $@ZnO@HfO_2$, $CdSe/CdZnS@ZnO@HfO_2$, phosphor nanoparticles $@ZnO@HfO_2$; CdSe/CdZnS $@ZnO@SiO_2$, CdSe/CdZnS $@ZnO@SiO_2$, phosphor nanoparticles$@ZnO@SiO_2$; CdSe/CdZnS@ZnO@MgO, CdSe/CdZnS @ZnO@MgO, phosphor nanoparticles@ZnO@MgO; phosphor nanoparticles$@HfO_2@Al_{203}$, $CdSe/CdZnS@HfO_2@Al_2O_3$, $CdSeS/CdZnS@HfO_2@Al_2O_3$, InP/ZnS $@HfO_2@Al_2O_3$, $CdSeS/CdZnS@HfO_2@Al_2O_3$, $InP/ZnSe/ZnS@HfO_2@Al_2O_3$, CdSe/CdZnS—$Fe_3O_4@HfO_2@Al_2O_3$; phosphor nanoparticles$@HfO_2@SiO_2$, $CdSe/CdZnS@HfO_2@SiO_2$, CdSeS/CdZnS $@HfO_2@SiO_2$, $InP/ZnS@HfO_2@SiO_2$, $CdSeS/CdZnS@HfO_2@SiO_2$, $InP/ZnSe/ZnS@HfO_2@SiO_2$, CdSe/CdZnS—$Fe_3O_4@HfO_2@SiO_2$; phosphor nanoparticles$@HfO_2@ZnO$, CdSe/CdZnS $@HfO_2@ZnO$, $CdSeS/CdZnS@HfO_2@ZnO$, InP/ZnS $@HfO_2@ZnO$, CdSeS/CdZnS $@HfO_2@ZnO$, $InP/ZnSe/ZnS@HfO_2@ZnO$, CdSe/CdZnS—$Fe_3O_4@HfO_2@ZnO$; phosphor nanoparticles$@HfO_2@MgO$, CdSe/CdZnS $@HfO_2@MgO$, $CdSeS/CdZnS@HfO_2@MgO$, InP/

$ZnS@HfO_2@MgO$, $CdSeS/CdZnS@HfO_2@MgO$, $InP/ZnSe/ZnS@HfO_2@MgO$, $CdSe/CdZnS—Fe_3O_4@HfO_2@MgO$; $InP/GaP/ZnSe/ZnS@Al_2O_3@HfO_2$; $InP/ZnS/ZnSe/ZnS@Al_2O_3@HfO_2$; $CdSe/CdZnS@HfO_2@Si_{0.8}Hf_{0.2}O_2$; $CdSe/CdZnS@Al_2O_3@HfO_2$; $CdSe/CdZnS@Al_2O_3$ and $SnO_2$ particles encapsulated in $Al_2O_3$; phosphor particles $@Al_2O_3@HfO_2$ $CdSe/CdZnS@HfO_2@Al_2O_3$; $CdSe/CdZnS@HfO_2$ and $SnO_2$ particles encapsulated in $Al_2O_3$; phosphor particles$@HfO_2@Al_2O_3$; $CdSe/CdZnS@HfO_2@SiO_2$ comprising $SnO_2$ nanoparticles; semiconductor nanoplatelets$@Al_2O_3@SiO_2$; semiconductor nanoplatelets$@HfO_2@SiO_2$; semiconductor nanoplatelets$@Al_2O_3@SiO_2$; $CdSe/CdZnS@HfO_2@SiO_2$; or a mixture thereof; wherein phosphor nanoparticles include but are not limited to: Yttrium aluminium garnet particles (YAG, $Y_3Al_5O_{12}$), (Ca,Y)-α-SiAlON:Eu particles, ($(Y,Gd)_3(Al,Ga)_5O_{12}$:Ce) particles, $CaAlSiN_3$:Eu particles, sulfide-based phosphor particles, PFS:$Mn^{4+}$ particles (potassium fluorosilicate).

According to one embodiment, the particle 1 does not comprise a spacer layer between the nanoparticles 3 and the material (11, 21).

According to one embodiment, the particle 1 does not comprise one core/shell nanoparticle wherein the core is luminescent and emits red light, and the shell is a spacer layer between the nanoparticles 3 and the material (11, 21).

According to one embodiment, the particle 1 does not comprise a core/shell nanoparticle and a plurality of nanoparticles 3, wherein the core is luminescent and emits red light, and the shell is a spacer layer between the nanoparticles 3 and the material (11, 21).

According to one embodiment, the particle 1 does not comprise at least one luminescent core, a spacer layer, an encapsulation layer and a plurality of quantum dots, wherein the luminescent core emits red light, and the spacer layer is situated between said luminescent core and the material (11, 21).

According to one embodiment, the particle 1 does not comprise a luminescent core surrounded by a spacer layer and emitting red light.

According to one embodiment, the particle 1 does not comprise nanoparticles covering or surrounding a luminescent core.

According to one embodiment, the particle 1 does not comprise nanoparticles covering or surrounding a luminescent core emitting red light.

According to one embodiment, the particle 1 does not comprise a luminescent core made by a specific material selected from the group consisting of silicate phosphor, aluminate phosphor, phosphate phosphor, sulfide phosphor, nitride phosphor, nitrogen oxide phosphor, and combination of aforesaid two or more materials; wherein said luminescent core is covered by a spacer layer.

Another object of the invention relates to a light emitting material 7 (as illustrated in FIG. 13A) comprising at least one ink comprising at least one particle 1 comprising a first material 11 and at least one liquid vehicle; wherein the particle 1 comprises at least one particle 2 comprising a second material 21 and at least one nanoparticle 3 dispersed in said second material 21; and wherein the first material 11 and the second material 21 have an extinction coefficient less or equal to $15\times10^{-5}$ at 460 nm.

According to one embodiment, the particle 1 is as described hereabove.

According to one embodiment, the particle 2 is as described hereabove.

According to one embodiment, the nanoparticles 3 are as described hereabove.

According to one embodiment, the first material 11 and/or the second material 21 are as described hereabove.

According to one embodiment, the liquid vehicle is as described hereabove.

According to one embodiment, the ink is as described hereabove.

According to one embodiment, the light emitting material further comprises at least one host material 71.

The light emitting material 7 allows the protection of the particle 1 from molecular oxygen, ozone, water and/or high temperature by the at least one host material 71. Therefore, deposition of a supplementary protective layer on top of said light emitting material 7 is not compulsory, which can save time, money and loss of luminescence.

According to one embodiment, the ink and the host material 71 are miscible.

According to one embodiment, the host material 71 surrounds, encapsulates and/or covers partially or totally at least one ink.

According to one embodiment, the light emitting material 7 further comprises a plurality of inks, thus a plurality of particles 1.

According to one embodiment, the light emitting material 7 comprises at least two host materials 71. In this embodiment, the host materials may be different or identical.

According to one embodiment, the light emitting material 7 comprises a plurality of host materials 71.

According to one embodiment, the light emitting material 7 does not comprise optically transparent void regions.

According to one embodiment, as illustrated in FIG. 13B, the light emitting material 7 further comprises at least one particle comprising an inorganic material 14; and a plurality of nanoparticles, wherein said inorganic material 14 is different from the first material 11 and/or second material 21. In this embodiment, said at least one particle comprising an inorganic material 14 is empty, i.e., does not comprise any nanoparticle.

According to one embodiment, the light emitting material 7 further comprises at least one particle comprising an inorganic material 14; and a plurality of nanoparticles, wherein said inorganic material 14 is the same as the first material 11 and/or second material 21. In this embodiment, said at least one particle comprising an inorganic material 14 is empty, i.e., does not comprise any nanoparticle.

According to one embodiment, the light emitting material 7 further comprises at least one particle comprising an inorganic material 14, wherein said inorganic material 14 is the same as the first material 11 and/or second material 21. In this embodiment, said at least one particle comprising an inorganic material 14 is empty, i.e., does not comprise any nanoparticle.

According to one embodiment, the light emitting material 7 further comprises at least one particle comprising an inorganic material 14, wherein said inorganic material 14 is different from the first material 11 and/or second material 21. In this embodiment, said at least one particle comprising an inorganic material 14 is empty, i.e., does not comprise any nanoparticle.

According to one embodiment, the light emitting material 7 further comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, or 95% in weight of particle comprising an inorganic material 14.

According to one embodiment, the particle comprising an inorganic material 14 has a different size than the at least one particle 1 and/or the particle 2.

According to one embodiment, the particle comprising an inorganic material 14 has the same size as the at least one particle 1 and/or the particle 2.

According to one embodiment, the light emitting material 7 further comprises a plurality of nanoparticles. In this embodiment, said nanoparticles are different from the nanoparticles 3 comprised in the particle 2.

According to one embodiment, the light emitting material 7 further comprises a plurality of nanoparticles. In this embodiment, said nanoparticles are the same as the nanoparticles 3 comprised in the particle 2.

According to one embodiment, the light emitting material 7 further comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, or 95% in weight of nanoparticles, wherein said nanoparticles are not comprised in the particle 2.

According to one embodiment, the light emitting material 7 is free of oxygen.

According to one embodiment, the light emitting material 7 is free of water.

In another embodiment, the light emitting material 7 may further comprise at least one solvent.

In another embodiment, the light emitting material 7 does not comprise a solvent.

According to one embodiment, the light emitting material 7 further comprises scattering particles dispersed in the host material 71. Examples of scattering particles include but are not limited to: $SiO_2$, $ZrO_2$, ZnO, MgO, $SnO_2$, $TiO_2$, Ag, Au, alumina, barium sulfate, PTFE, barium titanate and the like. Said scattering particles can help increasing light scattering in the interior of the light emitting material 7, so that there are more interactions between the photons and the scattering particles and, therefore, more light absorption by the particles.

In one embodiment, the light emitting material 7 further comprises thermal conductor particles dispersed in the host material 71. Examples of thermal conductor particles include but are not limited to: $SiO_2$, $ZrO_2$, ZnO, MgO, $SnO_2$, $TiO_2$, CaO, alumina, barium sulfate, PTFE, barium titanate and the like. In this embodiment, the thermal conductivity of the host material 71 is increased.

According to one embodiment, the light emitting material 7 exhibits an emission spectrum with at least one emission peak, wherein said emission peak has a maximum emission wavelength ranging from 400 nm to 50 am.

According to one embodiment, the light emitting material 7 exhibits an emission spectrum with at least one emission peak, wherein said emission peak has a maximum emission wavelength ranging from 400 nm to 500 nm. In this embodiment, the light emitting material 7 emits blue light.

According to one embodiment, the light emitting material 7 exhibits an emission spectrum with at least one emission peak, wherein said emission peak has a maximum emission wavelength ranging from 500 nm to 560 nm, more preferably ranging from 515 nm to 545 nm. In this embodiment, the light emitting material 7 emits green light.

According to one embodiment, the light emitting material 7 exhibits an emission spectrum with at least one emission peak, wherein said emission peak has a maximum emission wavelength ranging from 560 nm to 590 nm. In this embodiment, the light emitting material 7 emits yellow light.

According to one embodiment, the light emitting material 7 exhibits an emission spectrum with at least one emission peak, wherein said emission peak has a maximum emission wavelength ranging from 590 nm to 750 nm, more preferably ranging from 610 nm to 650 nm. In this embodiment, the light emitting material 7 emits red light.

According to one embodiment, the light emitting material 7 exhibits an emission spectrum with at least one emission peak, wherein said emission peak has a maximum emission wavelength ranging from 750 nm to 50 μm. In this embodiment, the light emitting material 7 emits near infra-red, mid-infra-red, or infra-red light.

According to one embodiment, the light emitting material 7 exhibits emission spectra with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the light emitting material 7 exhibits emission spectra with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the light emitting material 7 has a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99% or 100%.

In one embodiment, the light emitting material 7 exhibits photoluminescence quantum yield (PLQY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 $mW \cdot cm^{-2}$ and 100 $kW \cdot cm^{-2}$ and more preferably between 10 $mW \cdot cm^{-2}$ and 100 $W \cdot cm^{-2}$, and even more preferably between 10 $mW \cdot cm^{-2}$ and 30 $W \cdot cm^{-2}$.

According to one embodiment, the photon flux or average peak pulse power of the illumination is at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the light emitting material 7 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the light emitting material 7 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the host material 71 is free of oxygen.

According to one embodiment, the host material 71 is free of water.

According to one embodiment, the host material 71 limits or prevents the degradation of the chemical and physical properties of the at least one ink or particle 1 from molecular oxygen, ozone, water and/or high temperature.

According to one embodiment, the host material 71 is optically transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

According to one embodiment, the host material 71 has a refractive index ranging from 1.0 to 3.0, from 1.2 to 2.6, from 1.4 to 2.0.

According to one embodiment, the host material 71 has a refractive index of at least 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0.

According to one embodiment, the host material 71 has a refractive index distinct from the refractive index of the first material 11 comprised in the at least one particle 1 or from the refractive index of the particle 1. This embodiment allows for a wider scattering of light. This embodiment also allows to have a difference in light scattering as a function of the wavelength, in particular to increase the scattering of the excitation light with respect to the scattering of the emitted light, as the wavelength of the excitation light is lower than the wavelength of the emitted light.

According to one embodiment, the host material 71 has a difference of refractive index with the refractive index of the first material 11 comprised in the at least one particle 1 or with the refractive index of the particle 1 of at least 0.02, 0.025, 0.03, 0.035, 0.04, 0.045, 0.05, 0.055, 0.06, 0.065, 0.07, 0.075, 0.08, 0.085, 0.09, 0.095, 0.1, 0.11, 0.115, 0.12, 0.125, 0.13, 0.135, 0.14, 0.145, 0.15, 0.155, 0.16, 0.165, 0.17, 0.175, 0.18, 0.185, 0.19, 0.195, 0.2, 0.25, 0.3, 0.35, 0.4, 0.45, 0.5, 0.55, 0.6, 0.65, 0.7, 0.75, 0.8, 0.85, 0.9, 0.95, 1, 1.1, 1.15, 1.2, 1.25, 1.3, 1.35, 1.4, 1.45, 1.5, 1.55, 1.6, 1.65, 1.7, 1.75, 1.8, 1.85, 1.9, 1.95, or 2.

According to one embodiment, the host material 71 has a difference of refractive index with the first material 11 comprised in the at least one particle 1 ranging from 0.02 to 2, ranging from 0.02 to 1.5, ranging from 0.03 to 1.5, ranging from 0.04 to 1.5, ranging from 0.05 to 1.5, ranging from 0.02 to 1.2, ranging from 0.03 to 1.2, ranging from 0.04 to 1.2, ranging from 0.05 to 1.2, ranging from 0.05 to 1, ranging from 0.1 to 1, ranging from 0.2 to 1, ranging from 0.3 to 1, ranging from 0.5 to 1, ranging from 0.05 to 2, ranging from 0.1 to 2, ranging from 0.2 to 2, ranging from 0.3 to 2, or ranging from 0.5 to 2.

The difference of refractive index was measured at 450 nm.

According to one embodiment, the host material 71 has a refractive index distinct from the refractive index of the ink. This embodiment allows for a wider scattering of light. This embodiment also allows to have a difference in light scattering as a function of the wavelength, in particular to increase the scattering of the excitation light with respect to the scattering of the emitted light, as the wavelength of the excitation light is lower than the wavelength of the emitted light.

According to one embodiment, the host material 71 has a difference of refractive index with the refractive index of the ink of at least 0.02, 0.025, 0.03, 0.035, 0.04, 0.045, 0.05, 0.055, 0.06, 0.065, 0.07, 0.075, 0.08, 0.085, 0.09, 0.095, 0.1, 0.11, 0.115, 0.12, 0.125, 0.13, 0.135, 0.14, 0.145, 0.15, 0.155, 0.16, 0.165, 0.17, 0.175, 0.18, 0.185, 0.19, 0.195, 0.2, 0.25, 0.3, 0.35, 0.4, 0.45, 0.5, 0.55, 0.6, 0.65, 0.7, 0.75, 0.8, 0.85, 0.9, 0.95, 1, 1.1, 1.15, 1.2, 1.25, 1.3, 1.35, 1.4, 1.45, 1.5, 1.55, 1.6, 1.65, 1.7, 1.75, 1.8, 1.85, 1.9, 1.95, or 2.

According to one embodiment, the light emitting material 7 has a haze factor ranging from 1% to 100%.

According to one embodiment, the light emitting material 7 has a haze factor of at least 1%, 2%, 3%, 4%, 5%, 10%, 15%, 20%, 25%, 30%, 35%, 40%, 45%, 50%, 55%, 60%, 65%, 70%, 75%, 80%, 85%, 90%, 95%, or 100%.

The haze factor is calculated by the ratio between the intensity of light scattered by the material beyond the viewing angle and the total intensity transmitted by the material when illuminated with a light source.

According to one embodiment, the viewing angle used to measure the haze factor ranges from 0° to 20°.

According to one embodiment, the viewing angle used to measure the haze factor is at least 0°, 1°, 2°, 3°, 4°, 5°, 6°, 7°, 8°, 9°, 10°, 11°, 12°, 13°, 14°, 15°, 16°, 17°, 18°, 19°, or 20°. According to one embodiment, the host material 71 has a refractive index equal to the refractive index of the first material 11 comprised in the at least one particle 1. In this embodiment, scattering of light is prevented.

According to one embodiment, the host material 71 has a refractive index equal to the refractive index of the ink. In this embodiment, scattering of light is prevented.

According to one embodiment, the host material 71 is a thermal insulator.

According to one embodiment, the host material 71 is a thermal conductor.

According to one embodiment, the host material 71 has a thermal conductivity at standard conditions ranging from 0.1 to 450 W/(m·K), preferably from 1 to 200 W/(m·K), more preferably from 10 to 150 W/(m·K).

According to one embodiment, the host material 71 has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the host material 71 is electrically insulator.

According to one embodiment, the host material 71 is electrically conductive.

According to one embodiment, the host material 71 has an electrical conductivity at standard conditions ranging from $1\times10^{-20}$ to $10^{7}$ S/m, preferably from $1\times10^{-15}$ to 5 S/m, more preferably from $1\times10^{-7}$ to 1 S/m.

According to one embodiment, the host material 71 has an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^{2}$ S/m, $5\times10^{2}$ S/m, $10^{3}$ S/m, $5\times10^{3}$ S/m, $10^{4}$ S/m, $5\times10^{4}$ S/m, $10^{5}$ S/m, $5\times10^{5}$ S/m, $10^{6}$ S/m, $5\times10^{6}$ S/m, or $10^{7}$ S/m.

According to one embodiment, the electrical conductivity of the host material 71 may be measured for example with an impedance spectrometer.

According to one embodiment, the host material 71 can be cured into a shape of a film, thereby generating a film.

According to one embodiment, the host material 71 is polymeric.

According to one embodiment, the host material 71 can polymerize by heating it (i.e., by thermal curing) and/or by exposing it to UV light (i.e., by UV curing). Examples of UV curing processes which can be contemplated in the present invention are described, e.g., in WO2017063968, WO2017063983 and WO2017162579.

According to one embodiment, the polymeric host material 71 includes but is not limited to: silicone based polymers, polydimethylsiloxanes (PDMS), polyethylene terephthalate, polyesters, polyacrylates, polymethacrylates, polycarbonate, poly(vinyl alcohol), polyvinylpyrrolidone, polyvinylpyridine, polysaccharides, poly(ethylene glycol), melamine resins, a phenol resin, an alkyl resin, an epoxy resin, a polyurethane resin, a maleic resin, a polyamide resin, an alkyl resin, a maleic resin, terpenes resins, an acrylic resin or acrylate based resin such as PMMA, copolymers forming the resins, co-polymers, block co-polymers, polymerizable monomers comprising an UV initiator or thermic initiator, or a mixture thereof.

According to one embodiment, the polymeric host material 71 includes but is not limited to: thermosetting resin, photosensitive resin, photoresist resin, photocurable resin, or dry-curable resin. The thermosetting resin and the photocurable resin are cured using heat and light, respectively.

When a thermosetting resin or a photocurable resin is used, the composition of the resulting light emitting material 7 is equal to the composition of the raw material of the light emitting material 7. However, when a dry-curable resin is used, the composition of the resulting light emitting material 7 may be different from the composition of the raw material of the light emitting material 7. During the dry-curing by heat, the solvent is partially evaporated. Thus, the volume ratio of ink or particle 1 in the raw material of the light emitting material 7 may be lower than the volume ratio of ink or particle 1 in the resulting light emitting material 7.

Upon curing of the resin, a volume contraction is caused.

According to one embodiment, a least 2%, 3%, 4%, 5%, 6%, 7%, 8%, 9%, 10%, 15%, or 20%, of contraction are aroused from a thermosetting resin or a photocurable resin. According to one embodiment, a dry-curable resin is contracted by at least 0.1%, 0.2%, 0.3%, 0.4%, 0.5%, 0.6%, 0.7%, 0.8%, 0.9%, 1%, 1.5%, 2%, 2.5%, 3%, 3.5%, 4%, 4.5%, 5%, 5.5%, 6%, 6.5%, 7%, 7.5%, 8%, 8.5%, 9%, 9.5%, 10%, 15%, or 20%. The contraction of the resin may cause movement of the ink or particles 1, which may be lower the degree of dispersion of the ink or particles 1 in the light emitting material 7. However, embodiments of the present invention can maintain high dispersibility by preventing the movement of the ink or particles 1 by introducing other particles in said light emitting material 7.

In one embodiment, the host material 71 may be a polymerizable formulation which can include monomers, oligomers, polymers, or mixture thereof.

In one embodiment, the polymerizable formulation may further comprise a crosslinking agent, a scattering agent, a photo initiator or a thermal initiator.

In one embodiment, the polymerizable formulation includes but is not limited to: monomers, oligomers or polymers made from an alkyl methacrylates or an alkyl acrylates such as acrylic acid, methacrylic acid, crotonic acid, acrylonitrile, acrylic esters substituted with methoxy, ethoxy, propoxy, butoxy, and similar derivatives for example, methyl acrylate, ethyle acrylate, propyl acrylate, butyl acrylate, isobutyl acrylate, lauryl acrylate, norbornyl acrylate, 2-ethyl hexyl acrylate, 2-hydroxyethyl acrylate, 4-hydroxybutyl acrylate, benzyl acrylate, phenyl acrylate, isobornyle acrylate, hydroxypropyl acrylate, fluorinated acrylic monomers, chlorinated acrylic monomers, methacrylic acid, methyl methacrylate, n-butyl methacrylate, isobutyl methacrylate, 2-ethyl hexyl methacrylate, 2-hydroxyethyl methacrylate, 4-hydroxybutyl methacrylate, benzyl methacrylate, phenyl methacrylate, lauryl methacrylate, norbornyl methacrylate, isobornyle methacrylate, hydroxypropyl methacrylate, fluorinated methacrylic monomers, chlorinated methacrylic monomers, alkyl crotonates, allyl crotonates, glycidyl methacrylate and related esters.

In another embodiment, the polymerizable formulation includes but is not limited to: monomers, oligomers or polymers made from an alkyl acrylamide or alkyl methacrylamide such as acrylamide, Alkylacrylamide, N-tert-Butylacrylamide, Diacetone acrylamide, N,N-Diethylacrylamide, N-(Isobutoxymethyl)acrylamide, N-(3-Methoxypropyl) acrylamide, N-Diphenylmethylacrylamide, N-Ethylacrylamide, N-Hydroxyethyl acrylamide, N-(Isobutoxymethyl)acrylamide, N-Isopropylacrylamide, N-(3-Methoxypropyl)acrylamide, N-Phenylacrylamide, N-[Tris (hydroxymethyl)methyl]acrylamide, N,N-Diethylmethacrylamide, N,NDimethylacrylamide, N-[3-(Dimethylamino)propyl]methacrylamide, N-(Hydroxymethyl)acrylamide, 2-Hydroxypropyl methacrylamide, N-Isopropylmethacrylamide, Methacrylamide, N-(Triphenylmethyl)methacrylamide and similar derivatives.

In one embodiment, the polymerizable formulation includes but is not limited to: monomers, oligomers or polymers made from alpha-olefins, dienes such as butadiene and chloroprene; styrene, alpha-methyl styrene, and the like; heteroatom substituted alpha-olefins, for example, vinyl acetate, vinyl alkyl ethers for example, ethyl vinyl ether, vinyltrimethylsilane, vinyl chloride, tetrafluoroethylene, chlorotrifiuoroethylene, cyclic and polycyclic olefin compounds for example, cyclopentene, cyclohexene, cycloheptene, cyclooctene, and cyclic derivatives up to C20; polycyclic derivates for example, norbornene, and similar derivatives up to C20; cyclic vinyl ethers for example, 2, 3-dihydrofuran, 3,4-dihydropyran, and similar derivatives; allylic alcohol derivatives for example, vinylethylene carbonate, disubstituted olefins such as maleic and fumaric compounds for example, maleic anhydride, diethylfumarate, and the like, and mixtures thereof.

In one embodiment, examples of crosslinking agent include but are not limited to: di-acrylate, tri-acrylate, tetra-acrylate, di-methacrylate, tri-methacrylate and tetra-methacrylate monomers derivatives and the like. Another example of crosslinking agent includes but is not limited to: monomers, oligomers or polymers made from di- or trifunctional monomers such as allyl methacrylate, diallyl maleate, 1,3-butanediol dimethacrylate, 1,4-butanediol dimethacrylate, 1,6-hexanediol dimethacrylate, pentaerythritol triacrylate, trimethylolpropane triacrylate, Ethylene glycol dimethacrylate, Triethylene glycol dimethacrylate, N,N-methylenebis(acrylamide), N,N'-Hexamethylenebis (methacrylamide), and divinyl benzene.

In one embodiment, the polymerizable formulation may further comprise scattering particles Examples of scattering particles include but are not limited to: $SiO_2$, $ZrO_2$, ZnO, MgO, $SnO_2$, $TiO_2$, Ag, Au, alumina, barium sulfate, PTFE, barium titanate and the like.

In one embodiment, the polymerizable formulation may further comprise a thermal conductor.

Examples of thermal conductor include but are not limited to: $SiO_2$, $ZrO_2$, ZnO, MgO, $SnO_2$, $TiO_2$, CaO, alumina, barium sulfate, PTFE, barium titanate and the like. In this embodiment, the thermal conductivity of the host material 71 is increased.

In one embodiment, the polymerizable formulation may further comprise a photo initiator.

Examples of photo initiators include but are not limited to: α-hydroxyketone, phenylglyoxylate, benzyldimethylketal, α-aminoketone, monoacylphosphine oxides, bisacylphosphine oxides, phosphine oxide, benzophenone and derivatives, polyvinyl cinnamate, metallocene or iodonium salt derivatives, 1-hydroxycyclohexyl phenyl ketone, thioxanthones (such as isopropylthioxanthone), 2-hydroxy-2-methyl-1-phenylpropan-1-one, 2-benzyl-2-dimethylamino-(4-morpholinophenyl)butan-1-one, benzil dimethylketal, bis (2,6-dimethylbenzoyl)-2,4,4-trimethylpentylphosphine oxide, 2,4,6-trimethylbenzoyldiphenylphosphine oxide, 2-methyl-1-[4-(methylthio)phenyl]-2-morpholinopropan-1-one, 2,2-dimethoxy-1,2-diphenylethan-1-one or 5,7-diiodo-3-butoxy-6-fluorone and the like. Other examples of photo initiators include, without limitation, Irgacure™ 184, Irgacure™ 500, Irgacure™ 907, Irgacure™ 369, Irgacure™ 1700, Irgacure™ 651, Irgacure™ 819, Irgacure™ 1000, Irgacure™ 1300, Irgacure™ 1870, Darocur™ 1 173, Darocur™ 2959, Darocur™ 4265 and Darocur™ ITX (available from Ciba Specialty Chemicals), Lucerin™ TPO (available from BASF AG), Esacure™ KT046, Esacure™ KIP150, Esacure™ KT37 and Esacure™ EDB (available from Lamberti), H-Nu™ 470 and H-Nu™ 470X (available from Spectra Group Ltd) and the like.

Further examples of photo initiators include, but are not limited to, those described in WO2017211587. Those include, but are not limited to, photo initiators of Formula (I) and mixtures thereof:

Formula (I)

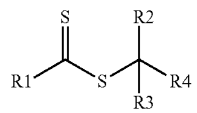

wherein:

R1 is selected from the group comprising or consisting of an optionally substituted alkyl group, an optionally substituted aryl or heteroaryl group, an optionally substituted alkenyl group, an optionally substituted alkynyl group, an optionally substituted alkaryl group, an optionally substituted aralkyl group, R5-O— and R6-S—;

R5 and R6 are independently selected from the group comprising or consisting of an optionally substituted alkyl group, an optionally substituted aryl or heteroaryl group, an optionally substituted alkenyl group, an optionally substituted alkynyl group, an optionally substituted alkaryl group and an optionally substituted aralkyl group;

R2 is selected from the group comprising or consisting of a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group;

R3 is selected from the group comprising or consisting of an electron withdrawing group comprising at least one oxygen carbon double bond, a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group; and R4 is selected from the group comprising or consisting of an electron withdrawing group comprising at least one oxygen carbon double bond, a nitrile group, an aryl group and a heteroaryl group;

with the proviso that at least one of R1 to R6 is functionalized with a photoinitiating moiety.

In one embodiment, the photo initiator according to Formula (I) is a compound wherein:

R1 is selected from the group comprising or consisting of an alkyl group, an aryl group, a heteroaryl group, an alkenyl group, an alkynyl group, an alkaryl group, an aralkyl group, R5-O—, R6-S— and a photoinitiating moiety selected from the group comprising or consisting of a thioxanthone group, a benzophenone group, an α-hydroxyketone group, an α-aminoketone group, an acylphosphine oxide group and a phenyl glyoxalic acid ester group;

R5 and R6 are independently selected from the group comprising or consisting of an alkyl group, an aryl or heteroaryl group, an alkenyl group, an alkynyl group, an alkaryl group, an aralkyl group and a photoinitiating moiety selected from the group consisting of a thioxanthone group, a benzophenone group, an α-hydroxyketone group, an α-aminoketone group, an acylphosphine oxide group and a phenyl glyoxalic acid ester group;

R2 is selected from the group comprising or consisting of hydrogen, an alkyl group, an aryl group, a heteroaryl group, an alkenyl group, an alkynyl group, an alkaryl group and an aralkyl group;

R3 is selected from the group comprising or consisting of —C(═O)—O—R7, —C(═O)—NR8-R9, C(═O)—R7, hydrogen, an alkyl group, an aryl group, heteroaryl group, an alkenyl group, an alkynyl group, an alkaryl group, an aralkyl group, a thioxanthone group, a benzophenone group, an α-aminoketone group, an acylphosphine oxide group and a phenyl glyoxalic acid ester group; and R4 is selected from the group comprising or consisting of —C(═O)—O—R10, —C(═O)—NR11-R12, C(═O)—R10, a nitrile group, an aryl group, a heteroaryl group, a thioxanthone group, a benzophenone group, an α-aminoketone group, an acylphosphine oxide group and a phenyl glyoxalic acid ester group;

R7 to R10 are independently selected from the group consisting of hydrogen, an alkyl group, an aryl or heteroaryl group, an alkenyl group, an alkynyl group, an alkaryl group, an aralkyl group and a photoinitiating moiety selected from the group consisting of a thioxanthone group, a benzophenone group, an α-hydroxyketone group, an α-aminoketone group, an acylphosphine oxide group and a phenyl glyoxalic acid ester group, or R8 and R9 and/or R11 and R12 may represent the necessary atoms to form a five or six membered ring;

with the proviso that at least one of R1, R3 and R4 is functionalized with a photoinitiating moiety.

In one embodiment, the photo initiator according to Formula (I) is a compound of Formula (II):

Formula (II)

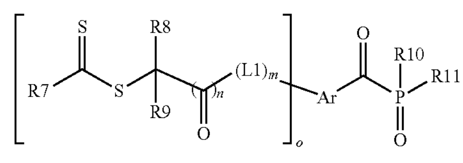

wherein:

R7 is selected from the group comprising or consisting of an optionally substituted alkyl group, an optionally substituted aryl or heteroaryl group, an optionally substituted alkenyl group, an optionally substituted alkynyl group, an optionally substituted alkaryl group, an optionally substituted aralkyl group, —O—R5 and —S—R6;

Ar represents an optionally substituted carbocyclic arylene group;

L1 represents a divalent linking group comprising not more than 10 carbon atoms;

R8 and R9 are independently selected from the group comprising or consisting of a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group;

R10 is selected from the group consisting of an optionally substituted alkyl group, an optionally substituted aryl group, an optionally substituted alkoxy group and an optionally substituted aryloxy group;

R11 is selected from the group comprising or consisting of an optionally substituted alkyl group, an optionally substituted aryl group, an optionally substituted alkoxy group, an optionally substituted aryloxy group and an acyl group;

n and m each independently represent 1 or 0;

o represents an integer from 1 to 5;

with the proviso that if n=0 and m=1 that L1 is coupled to CR8R9 via a carbon atom of an aromatic or heteroaromatic ring.

In one embodiment, the photo initiator according to Formula (I) is a compound of Formula (III):

Formula (III)

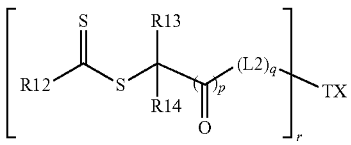

wherein:

R12 is selected from the group comprising or consisting of an optionally substituted alkyl group, an optionally substituted aryl or heteroaryl group, an optionally substituted alkenyl group, an optionally substituted alkynyl group, an optionally substituted alkaryl group, an optionally substituted aralkyl group, —O—R5 and —S—R6;

R5 and R6 are independently selected from the group comprising or consisting of an optionally substituted alkyl group, an optionally substituted aryl or heteroaryl group, an optionally substituted alkenyl group, an optionally substituted alkynyl group, an optionally substituted alkaryl group and an optionally substituted aralkyl group;

L2 represents a divalent linking group comprising or consisting of not more than 20 carbon atoms;

TX represents an optionally substituted thioxanthone group;

p and q each independently represent 1 or 0;

r represents an integer from 1 to 5;

R13 and R14 are independently selected from the group comprising or consisting of a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group;

with the proviso that if p=0 and q=1 that L2 is coupled to CR13R14 via a carbon atom of an aromatic or heteroaromatic ring.

In one embodiment, the photo initiator according to Formula (I) is a compound of Formula (IV):

Formula (IV)

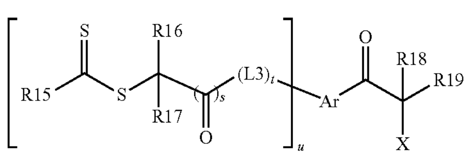

wherein:

R15 is selected from the group comprising or consisting of an optionally substituted alkyl group, an optionally substituted aryl or heteroaryl group, an optionally substituted alkenyl group, an optionally substituted alkynyl group, an optionally substituted alkaryl group, an optionally substituted aralkyl group, —O—R5 and —S—R6;

R5 and R6 are independently selected from the group comprising or consisting of an optionally substituted alkyl group, an optionally substituted aryl or heteroaryl group, an optionally substituted alkenyl group, an optionally substituted alkynyl group, an optionally substituted alkaryl group and an optionally substituted aralkyl group;

Ar represents an optionally substituted carbocyclic arylene group;

L3 represents a divalent linking group comprising or consisting not more than 20 carbon atoms;

R16 and R17 are independently selected from the group comprising or consisting of a hydrogen, an optionally substituted alkyl group, an optionally substituted aryl or heteroaryl group, an optionally substituted alkenyl group, an optionally substituted alkynyl group, an optionally substituted alkaryl group and an optionally substituted aralkyl group;

R18 and R19 are independently selected from the group comprising or consisting of an optionally substituted alkyl group, an optionally substituted aryl group, an optionally substituted aralkyl group and an optionally substituted alkaryl group with the proviso that R18 and R19 may represent the necessary atoms to form a five to eight membered ring; X represents OH or NR20R21;

R20 and R21 are independently selected from the group comprising or consisting of an optionally substituted alkyl group, an optionally substituted aryl group, an optionally substituted aralkyl group and an optionally substituted alkaryl group, with the proviso that R20 and R21 may represent the necessary atoms to form a five to eight membered ring;

s and t each independently represent 1 or 0;

u represents an integer from 1 to 5;

with the proviso that if s=0 and t=1 that L3 is coupled to CR16R17 via a carbon atom of an aromatic or heteroaromatic ring.

In one embodiment, the photo initiator according to Formula (I) is a compound of Formula (V):

Formula (V)

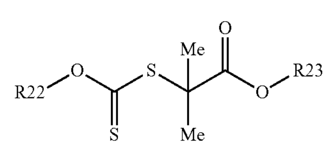

wherein:

R22 represents an alkyl group having no more than 6 carbon atoms; and

R23 represents a photoinitiating moiety selected from the group comprising or consisting of an acylphosphine oxide group, a thioxanthone group, a benzophenone group, an α-hydroxy ketone group and an α-amino ketone group.

In one embodiment, the photo initiator according to Formula (I) is a compound of Formula (VI) to (XXVIII):

Formula (VI)
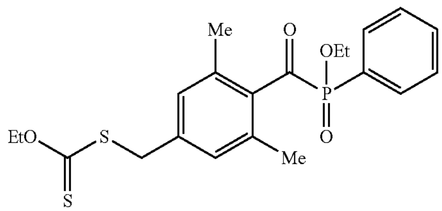
Formula (VII)
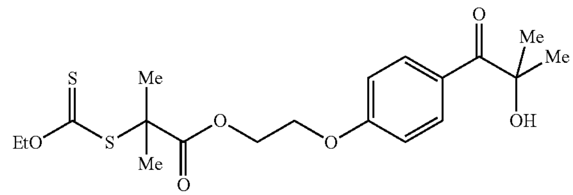
Formula (VIII)
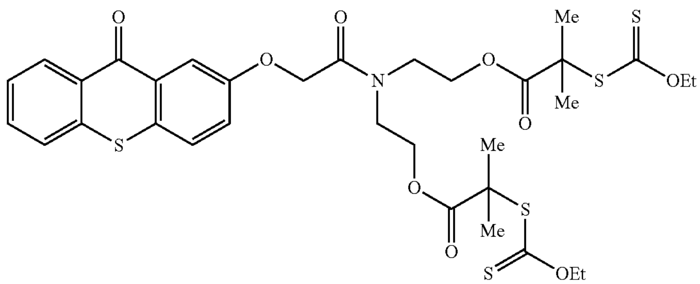
Formula (IX)
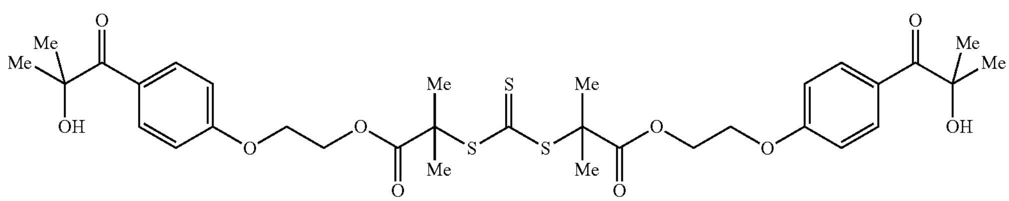
Formula (X)
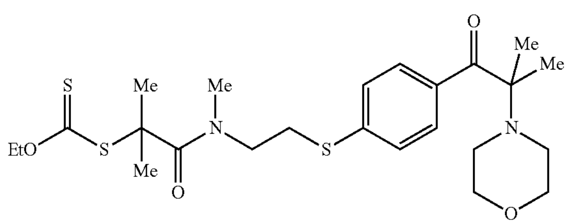
Formula (XI)
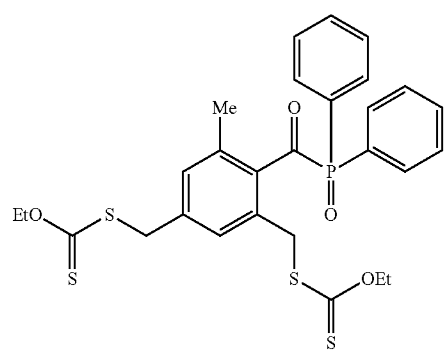
Formula (XII)
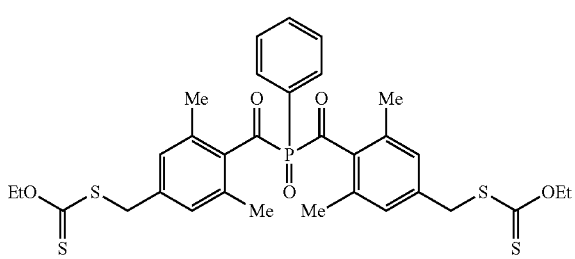
Formula (XIII)
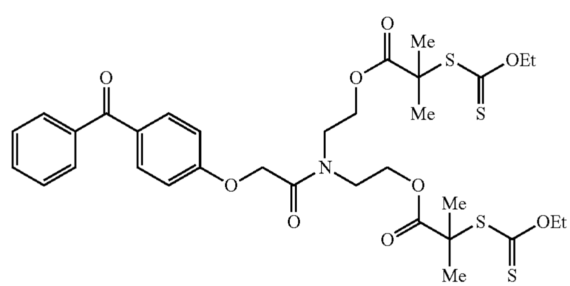
Formula (XIV)
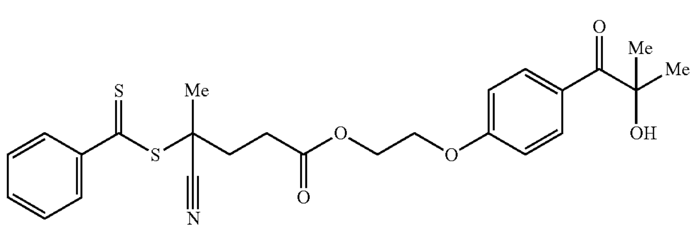

-continued
Formula (XV)
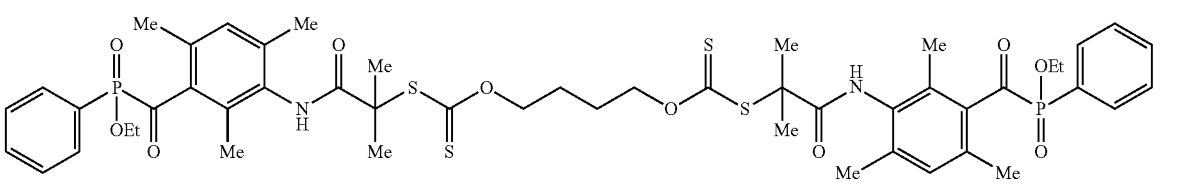
Formula (XVI)
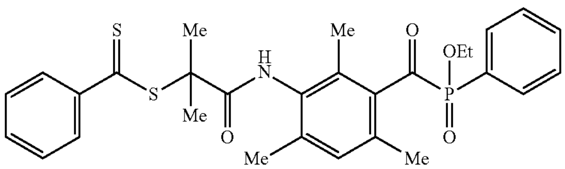
Formula (XVII)
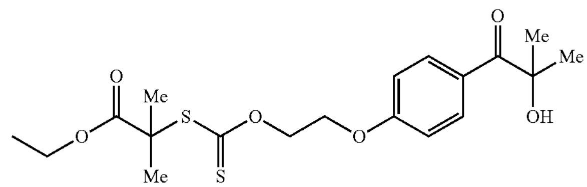
Formula (XVIII)
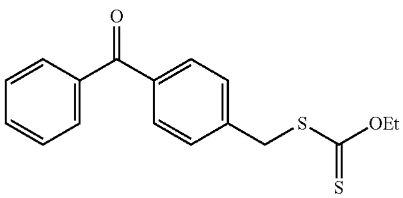
Formula (XIX)
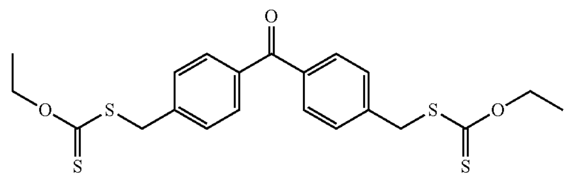
Formula (XX)
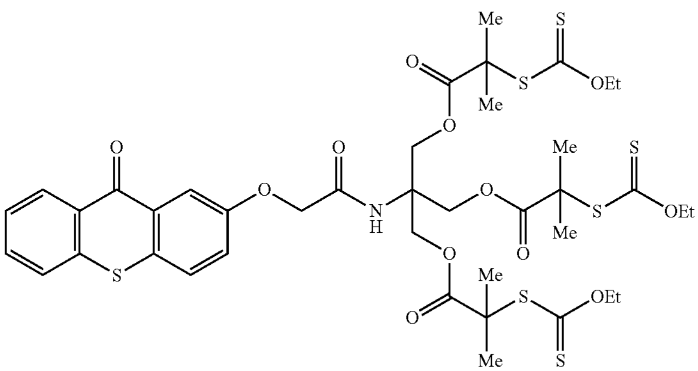
Formula (XXI)
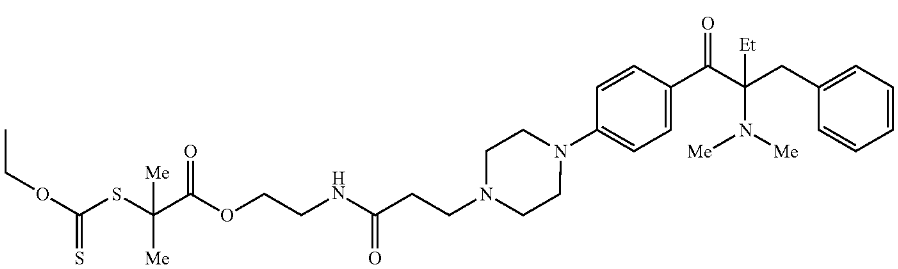
Formula (XXII)
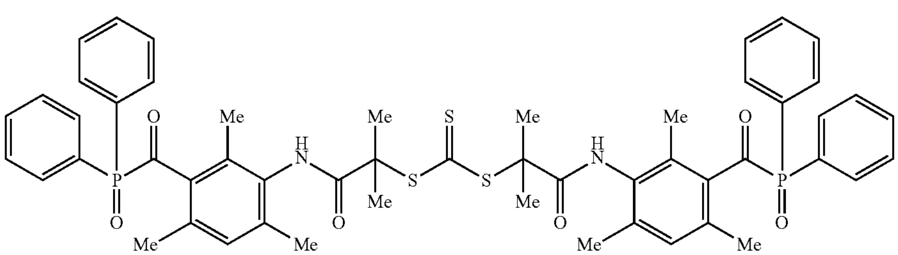

-continued
Formula (XXIII)
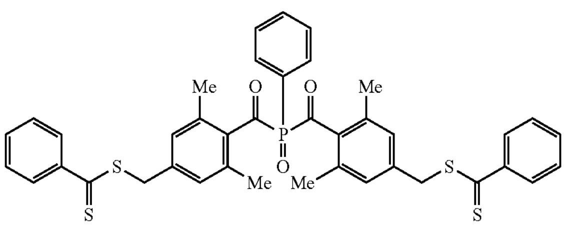
Formula (XXIV)
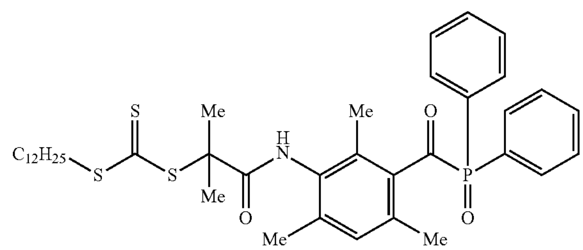
Formula (XXV)
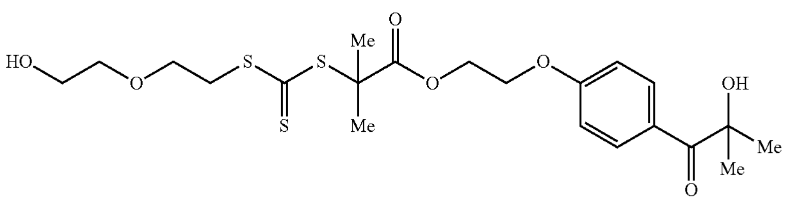
Formula (XXVI)
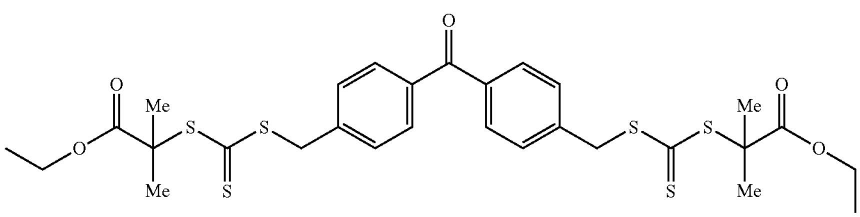
Formula (XXVII)
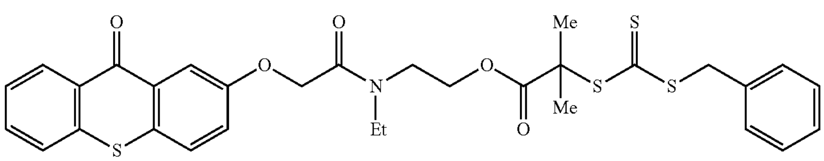
Formula (XXVIII)
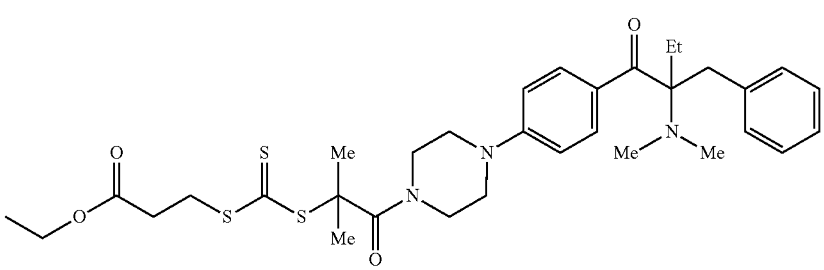
Further examples of photo initiators include, but are not limited to, polymerizable photo initiators, such as, e.g., those described in WO2017220425. Those include, but are not limited to, photo initiators of Formula (XXIX) and Formula (XXX), and mixtures thereof:

(Formula XXIX)

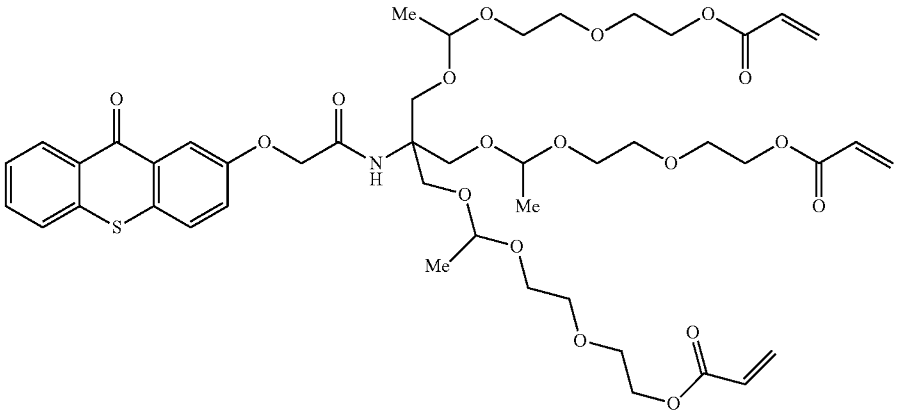

(Formula XXX)

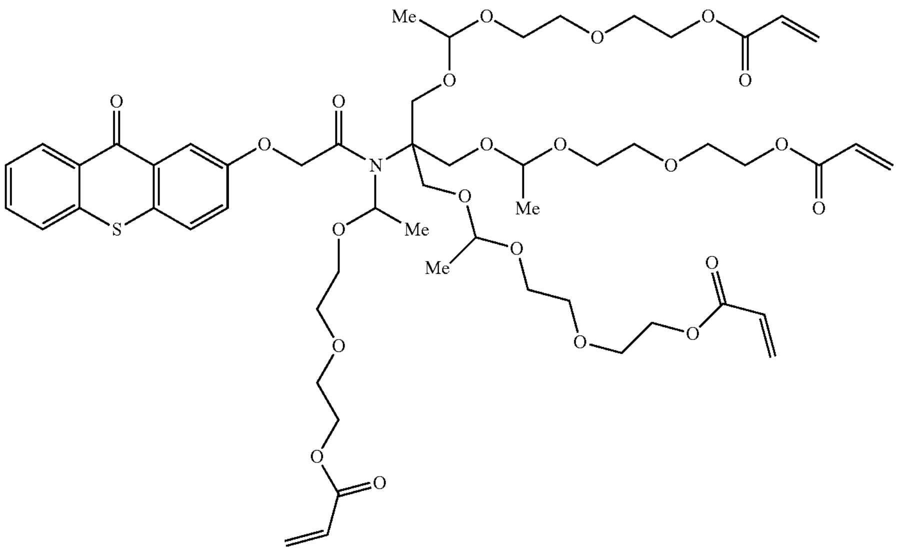

Preferably, a mixture of polymerizable photo initiators of Formula (XXIX) and Formula (XXX) may comprise or consist of an amount ranging from 0.1% w/w to 20.0% w/w, more preferably no more than 10.0% w/w of the photo initiator of Formula (XXX), based on the total weight of polymerizable photo initiators of Formula (XXIX) and Formula (XXX). Preferably, a mixture of polymerizable photo initiators of Formula (XXIX) and Formula (XXX) may comprise or consist of an amount of 75.0% w/w, more preferably an amount ranging from 80.0% w/w to 99.9% w/w of the photo initiator of Formula (XXIX), based on the total weight of polymerizable photo initiators of Formula (XXIX) and Formula (XXX).

In one embodiment, the polymerizable formulation may further comprise a thermal initiator. Examples of thermal initiator include but are limited to: peroxide compounds, azo compounds such as azobisisobutyronitrile (AIBN) and 4,4-Azobis(4-cyanovaleric acid), potassium and ammonium persulfate, tert-Butyl peroxide, benzoyl peroxide and the like.

In one embodiment, the polymeric host material 71 may be a polymerized solid made from an alkyl methacrylates or an alkyl acrylates such as acrylic acid, methacrylic acid, crotonic acid, acrylonitrile, acrylic esters substituted with methoxy, ethoxy, propoxy, butoxy, and similar derivatives for example, methyl acrylate, ethyle acrylate, propyl acrylate, butyl acrylate, isobutyl acrylate, lauryl acrylate, norbornyl acrylate, 2-ethyl hexyl acrylate, 2-hydroxyethyl acrylate, 4-hydroxybutyl acrylate, benzyl acrylate, phenyl acrylate, isobornyle acrylate, hydroxypropyl acrylate, fluorinated acrylic monomers, chlorinated acrylic monomers, methacrylic acid, methyl methacrylate, nbutyl methacrylate, isobutyl methacrylate, 2-ethyl hexyl methacrylate, 2-hydroxyethyl methacrylate, 4-hydroxybutyl methacrylate, benzyl methacrylate, phenyl methacrylate, lauryl methacrylate, norbornyl methacrylate, isobornyle methacrylate, hydroxypropyl methacrylate, fluorinated methacrylic monomers, chlorinated methacrylic monomers, alkyl crotonates, allyl crotonates, glycidyl methacrylate and related esters.

In one embodiment, the polymeric host material 71 may be a polymerized solid made from an alkyl acrylamide or alkyl methacrylamide such as acrylamide, Alkylacrylamide, Ntert-Butylacrylamide, Diacetone acrylamide, N,N-Diethylacrylamide, N-Isobutoxymethyl)acrylamide, N-(3-Methoxypropyl)acrylamide, NDiphenylmethylacrylamide, N-Ethylacrylamide, N-Hydroxyethyl acrylamide, N-(Isobutoxymethyl)acrylamide, N-Isopropylacrylamide, N-(3-Methoxypropyl)acrylamide, N-Phenylacrylamide, N-[Tris(hydroxymethyl)methyl]acrylamide, N,N-Diethylmethacrylamide, N,NDimethylacrylamide, N-[3-(Dimethylamino)propyl]methacrylamide, N-(Hydroxymethyl)acrylamide, 2-Hydroxypropyl methacrylamide, NIsopropylmethacrylamide, Methacrylamide, N-(Triphenylmethyl)methacrylamide and similar derivatives.

In one embodiment, the polymeric host material 71 may be a polymerized solid made from alpha-olefins, dienes such as butadiene and chloroprene; styrene, alpha-methyl styrene, and the like; heteroatom substituted alpha-olefins, for example, vinyl acetate, vinyl alkyl ethers for example, ethyl vinyl ether, vinyltrimethylsilane, vinyl chloride, tetrafluoroethylene, chlorotrifiuoroethylene, cyclic and polycyclic olefin compounds for example, cyclopentene, cyclohexene, cycloheptene, cyclooctene, and cyclic derivatives up to C20; polycyclic derivates for example, norbornene, and similar derivatives up to C20; cyclic vinyl ethers for example, 2, 3-dihydrofuran, 3,4-dihydropyran, and similar derivatives; allylic alcohol derivatives for example, vinylethylene carbonate, disubstituted olefins such as maleic and fumaric compounds for example, maleic anhydride, diethylfumarate, and the like, and mixtures thereof.

In one embodiment, the polymeric host material 71 may be PMMA, Poly(lauryl methacrylate), glycolized poly(ethylene terephthalate), Poly(maleic anhydride-altoctadecene), or mixtures thereof.

In one embodiment, the polymeric host material 71 may comprise a copolymer of vinyl chloride and a hydroxyfunctional monomer. Such copolymer is described, e.g., in WO2017102574. In such embodiment, examples of hydroxyfunctional monomers include, without limitation, 2-hydroxypropyl acrylate, 1-hydroxy-2-propyl acrylate, 3-methyl-3-buten-1-ol, 2-methyl-2-propenoic acid 2-hydroxypropyl ester, 2-hydroxy-3-chloropropyl methacrylate, N-methylolmethacrylamide, 2-hydroxyethyl methacrylate, poly(ethylene oxide) monomethacrylate, glycerine monomethacrylate, 1,2-propylene glycol methacrylate, 2,3-hydroxypropyl methacrylate, 2-hydroxyethyl acrylate, vinyl alcohol, N-methylolacrylamid, 2-propenoic acid 5-hydroxypentyl ester, 2-methyl-2-propenoic acid, 3-chloro-2-hydroxypropyl ester, 1-hydroxy-2-propenoic acid, 1-methylethyl ester, 2-hydroxyethyl allyl ether, 4-hydroxybutyl acrylate, 1,4-butanediol monovinyl ether, poly(e-caprolactone) hydroxyethyl methacrylate ester, poly(ethylene oxide) monomethacrylate, 2-methyl-2-propenoic acid, 2,5-dihydroxypentyl ester, 2-methyl-2-propenoic acid, 5,6-dihydroxyhexyl ester, 1,6-hexanediol monomethacrylate, 1,4-dideoxy-pentitol, 5-(2-methyl-2-propenoate), 2-propenoic acid, 2,4-dihydroxybutyl ester, 2-propenoic acid, 3,4-dihydroxybutyl ester, 2-methyl-2-propenoic acid, 2-hydroxy butyl ester, 3-hydroxypropyl methacrylate, 2-propenoic acid, 2,4-dihydroxybutyl ester and isopropenyl alcohol. Examples of copolymers of vinyl chloride and a hydroxyfunctional monomer include, without limitation, chloroethylene-vinyl acetate-vinyl alcohol copolymer, vinyl alcohol-vinyl chloride copolymer, 2-hydroxypropyl acrylate-vinyl chloride polymer, propanediol monoacrylate-vinyl chloride copolymer, vinyl acetate-vinyl chloride-2-hydroxypropyl acrylate copolymer, hydroxyethyl acrylate-vinyl chloride copolymer and 2-hydroxyethyl methacrylate-vinyl chloride copolymer.

In another embodiment, the light emitting material 7 may further comprise at least one solvent. According to this embodiment, the solvent is one that allows the solubilization of the particles 1 of the invention and polymeric host material 71 such as for example, pentane, hexane, heptane, cyclohexane, petroleum ether, toluene, benzene, xylene, chlorobenzene, carbon tetrachloride, chloroform, dichloromethane, 1,2-dichloroethane, THF (tetrahydrofuran), acetonitrile, acetone, ethanol, methanol, ethyl acetate, ethylene glycol, diglyme (diethylene glycol dimethyl ether), diethyl ether, DME (1,2-dimethoxy-ethane, glyme), DMF (dimethylformamide), NMF (N-methylformamide), FA (Formamide), DMSO (dimethyl sulfoxide), 1,4-Dioxane, triethyl amine, or mixture thereof.

In another embodiment, the light emitting material 7 comprises the particles 1 of the invention and a polymeric host material 71, and does not comprise a solvent. In this embodiment, the particles 1 and host material 71 can be mixed by extrusion.

According to another embodiment, the host material 71 is inorganic.

According to one embodiment, the host material 71 does not comprise glass.

According to one embodiment, the host material 71 does not comprise vitrified glass.

According to one embodiment, examples of inorganic host material 71 include but are not limited to: materials obtainable by sol-gel process, metal oxides such as for example $SiO_2$, $Al_2O_3$, $TiO_2$, $ZrO_2$, ZnO, MgO, $SnO_2$, $IrO_2$, or a mixture thereof. Said host material 71 acts as a supplementary barrier against oxidation and can drain away the heat if it is a good thermal conductor.

According to one embodiment, the host material 71 is composed of a material selected in the group of metals, halides, chalcogenides, phosphides, sulfides, metalloids, metallic alloys, ceramics such as for example oxides, carbides, nitrides, glasses, enamels, ceramics, stones, precious stones, pigments, cements and/or inorganic polymers. Said host material 71 is prepared using protocols known to the person skilled in the art.

According to one embodiment, a chalcogenide is a chemical compound consisting of at least one chalcogen anion selected in the group of O, S, Se, Te, Po, and at least one or more electropositive element.

According to one embodiment, the metallic host material 71 is selected in the group of gold, silver, copper, vanadium, platinum, palladium, ruthenium, rhenium, yttrium, mercury, cadmium, osmium, chromium, tantalum, manganese, zinc, zirconium, niobium, molybdenum, rhodium, tungsten, iridium, nickel, iron, or cobalt.

According to one embodiment, examples of carbide host material 71 include but are not limited to: SiC, WC, BC, MoC, TiC, $Al_4C_3$, $LaC_2$, FeC, CoC, HfC, $Si_xC_y$, $W_xC_y$, $B_xC_y$, $Mo_xC_y$, $Ti_xC_y$, $Al_xC_y$, $La_xC_y$, $Fe_xC_y$, $Co_xC_y$, $Hf_xC_y$, or a mixture thereof; x and y are independently a decimal number from 0 to 5, at the condition that x and y are not simultaneously equal to 0, and $x \neq 0$.

According to one embodiment, examples of oxide host material 71 include but are not limited to: $SiO_2$, $Al_2O_3$, $TiO_2$, $ZrO_2$, ZnO, MgO, $SnO_2$, $Nb_2Os$, $CeO_2$, BeO, $IrO_2$, CaO, $Sc_2O_3$, NiO, $Na_2O$, BaO, $K_2O$, PbO, $Ag_2O$, $V_2O_5$, $TeO_2$, MnO, $B_2O_3$, $P_2O_5$, $P_2O_3$, $P_4O_7$, $P_4O_8$, $P_4O_9$, $P_2O_6$, PO, $GeO_2$, $As_2O_3$, $Fe_2O_3$, $Fe_3O_4$, $Ta_2O_5$, $Li_2O$, SrO, $Y_2O_3$, $HfO_2$, $WO_2$, $MoO_2$, $Cr_2O_3$, $Tc_2O_7$, $ReO_2$, $RuO_2$, $Co_3O_4$, OsO, $RhO_2$, $Rh_2O_3$, PtO, PdO, CuO, $Cu_2O$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof.

According to one embodiment, examples of oxide host material 71 include but are not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

According to one embodiment, examples of nitride host material 71 include but are not limited to: TiN, $Si_3N_4$, MoN, VN, TaN, $Zr_3N_4$, HfN, FeN, NbN, GaN, CrN, AlN, InN, $Ti_xN_y$, $Si_xN_y$, $Mo_xN_y$, $V_xN_y$, $Ta_xN_y$, $Zr_xN_y$, $Hf_xN_y$, $Fe_xN_y$, $Nb_xN_y$, $Ga_xN_y$, $Cr_xN_y$, $Al_xN_y$, $In_xN_y$, or a mixture thereof; x and y are independently a decimal number from 0 to 5, at the condition that x and y are not simultaneously equal to 0, and $x \neq 0$.

According to one embodiment, examples of sulfide host material 71 include but are not limited to: $Si_yS_x$, $Al_yS_x$, $Ti_yS_x$, $Zr_yS_x$, $Zn_yS_x$, $Mg_yS_x$, $Sn_yS_x$, $Nb_yS_x$, $Ce_yS_x$, $Be_yS_x$, $Ir_yS_x$, $Ca_yS_x$, $Sc_yS_x$, $Ni_yS_x$, $Na_yS_x$, $Ba_yS_x$, $K_yS_x$, $Pb_yS_x$, $Ag_yS_x$, $V_yS_x$, $Te_yS_x$, $Mn_yS_x$, $B_yS_x$, $P_yS_x$, $Ge_yS_x$, $As_yS_x$, $Fe_yS_x$, $Ta_yS_x$, $Li_yS_x$, $Sr_yS_x$, $Y_yS_x$, $Hf_yS_x$, $W_yS_x$, $Mo_yS_x$, $Cr_yS_x$, $Tc_yS_x$, $Re_yS_x$, $Ru_yS_x$, $Co_yS_x$, $Os_yS_x$, $Rh_yS_x$, $Pt_yS_x$, $Pd_yS_x$, $Cu_yS_x$, $Au_yS_x$, $Cd_yS_x$, $Hg_yS_x$, $Tl_yS_x$, $Ga_yS_x$, $In_yS_x$, $Bi_yS_x$, $Sb_yS_x$, $Po_yS_x$, $Se_yS_x$, $Cs_yS_x$, mixed sulfides, mixed sulfides thereof or a mixture thereof; x and y are independently a decimal number from 0 to 10, at the condition that x and y are not simultaneously equal to 0, and $x \neq 0$.

According to one embodiment, examples of halide host material 71 include but are not limited to: $BaF_2$, $LaF_3$, $CeF_3$, $YF_3$, $CaF_2$, $MgF_2$, $PrF_3$, AgCl, $MnCl_2$, $NiCl_2$, $Hg_2Cl_2$, $CaCl_2$, $CsPbCl_3$, AgBr, $PbBr_3$, $CsPbBr_3$, AgI, CuI, PbI, $Hg_2$, $BiI_3$, $CH_3NH_3PbI_3$, $CH_3NH_3PbCl_3$, $CH_3NH_3PbBr_3$, $CsPbI_3$, $FAPbBr_3$ (with FA formamidinium), or a mixture thereof.

According to one embodiment, examples of chalcogenide host material 71 include but are not limited to: CdO, CdS, CdSe, CdTe, ZnO, ZnS, ZnSe, ZnTe, HgO, HgS, HgSe, HgTe, CuO, $Cu_2O$, CuS, $Cu_2S$, CuSe, CuTe, $Ag_2O$, $Ag_2S$, $Ag_2Se$, $Ag_2Te$, $Au_2S$, PdO, PdS, $Pd_4S$, PdSe, PdTe, PtO, PtS, $PtS_2$, PtSe, PtTe, $RhO_2$, $Rh_2O_3$, $RhS_2$, $Rh_2S_3$, $RhSe_2$, $Rh_2Se_3$, $RhTe_2$, $IrO_2$, $IrS_2$, $Ir_2S_3$, $IrSe_2$, $IrTe_2$, $RuO_2$, $RuS_2$, OsO, OsS, OsSe, OsTe, MnO, MnS, MnSe, MnTe, $ReO_2$, $ReS_2$, $Cr_2O_3$, $Cr_2S_3$, $MoO_2$, $MoS_2$, $MoSe_2$, $MoTe_2$, $WO_2$, $WS_2$, $WSe_2$, $V_2O_5$, $V_2S_3$, $Nb_2Os$, $NbS_2$, $NbSe_2$, $HfO_2$, $HfS_2$, $TiO_2$, $ZrO_2$, $ZrS_2$, $ZrSe_2$, $ZrTe_2$, $Sc_2O_3$, $Y_2O_3$, $Y_2S_3$, $SiO_2$, $GeO_2$, GeS, $GeS_2$, GeSe, $GeSe_2$, GeTe, $SnO_2$, SnS, $SnS_2$, SnSe, $SnSe_2$, SnTe, PbO, PbS, PbSe, PbTe, MgO, MgS, MgSe, MgTe, CaO, CaS, SrO, $Al_2O_3$, $Ga_2O_3$, $Ga_2S_3$, $Ga_2Se_3$, $In_2O_3$, $In_2S_3$, $In_2Se_3$, $In_2Te_3$, $La_2O_3$, $La_2S_3$, $CeO_2$, $CeS_2$, $Pr_6O_{11}$, $Nd_2O_3$, $NdS_2$, $La_2O_3$, $Tl_2O$, $Sm_2O_3$, $SmS_2$, $Eu_2O_3$, $EuS_2$, $Bi_2O_3$, $Sb_2O_3$, $PoO_2$, $SeO_2$, $Cs_2O$, $Tb_4O_7$, $TbS_2$, $Dy_2O_3$, $Ho_2O_3$, $Er_2O_3$, $ErS_2$, $Tm_2O_3$, $Yb_2O_3$, $Lu_2O_3$, $CuInS_2$, $CuInSe_2$, $AgInS_2$, $AgInSe_2$, $Fe_2O_3$, $Fe_3O_4$, FeS, $FeS_2$, $Co_3S_4$, CoSe, $Co_3O_4$, NiO, $NiSe_2$, NiSe, $Ni_3Se_4$, $Gd_2O_3$, BeO, $TeO_2$, $Na_2O$, BaO, $K_2O$, $Ta_2O_5$, $Li_2O$, $Tc_2O_7$, $As_2O_3$, $B_2O_3$, $P_2O_5$, $P_2O_3$, $P_4O_7$, $P_4O_8$, $P_4O_9$, $P_2O_6$, PO, or a mixture thereof.

According to one embodiment, examples of phosphide host material 71 include but are not limited to: InP, $Cd_3P_2$, $Zn_3P_2$, AlP, GaP, TlP, or a mixture thereof.

According to one embodiment, examples of metalloid host material 71 include but are not limited to: Si, B, Ge, As, Sb, Te, or a mixture thereof.

According to one embodiment, examples of metallic alloy host material 71 include but are not limited to: Au—Pd, Au—Ag, Au—Cu, Pt—Pd, Pt—Ni, Cu—Ag, Cu—Sn, Ru—Pt, Rh—Pt, Cu—Pt, Ni—Au, Pt—Sn, Pd—V, Ir—Pt, Au—Pt, Pd—Ag, Cu—Zn, Cr—Ni, Fe—Co, Co—Ni, Fe—Ni or a mixture thereof.

According to one embodiment, the host material 71 comprises garnets.

According to one embodiment, examples of garnets include but are not limited to: $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, or a mixture thereof.

According to one embodiment, the host material 71 comprises or consists of a thermal conductive material wherein said thermal conductive material includes but is not limited to: $Al_yO_x$, $Ag_yO_x$, $Cu_yO_x$, $Fe_yO_x$, $Si_yO_x$, $Pb_yO_x$, $Ca_yO_x$, $Mg_yO_x$, $Zn_yO_x$, $Sn_yO_x$, $Ti_yO_x$, $Be_yO_x$, CdS, ZnS, ZnSe, CdZnS, CdZnSe, Au, Na, Fe, Cu, Al, Ag, Mg, mixed oxides, mixed oxides thereof or a mixture thereof; x and y are independently a decimal number from 0 to 10, at the condition that x and y are not simultaneously equal to 0, and $x \neq 0$.

According to one embodiment, the host material 71 comprises or consists of a thermal conductive material wherein said thermal conductive material includes but is not limited to: $Al_2O_3$, $Ag_2O$, $Cu_2O$, CuO, $Fe_3O_4$, FeO, $SiO_2$, PbO, CaO, MgO, ZnO, $SnO_2$, $TiO_2$, BeO, CdS, ZnS, ZnSe, CdZnS, CdZnSe, Au, Na, Fe, Cu, Al, Ag, Mg, mixed oxides, mixed oxides thereof or a mixture thereof.

According to one embodiment, the host material 71 comprises or consists of a thermal conductive material wherein said thermal conductive material includes but is not limited to: aluminium oxide, silver oxide, copper oxide, iron oxide, silicon oxide, lead oxide, calcium oxide, magnesium oxide, zinc oxide, tin oxide, titanium oxide, beryllium oxide, zinc sulfide, cadmium sulfide, zinc selenium, cadmium zinc selenium, cadmium zinc sulfide, gold, sodium, iron, copper, aluminium, silver, magnesium, mixed oxides, mixed oxides thereof or a mixture thereof.

According to one embodiment, the host material 71 comprises organic molecules in small amounts of 0 mole %, 1 mole %, 5 mole %, 10 mole %, 15 mole %, 20 mole %, 25 mole %, 30 mole %, 35 mole %, 40 mole %, 45 mole %, 50 mole %, 55 mole %, 60 mole %, 65 mole %, 70 mole %, 75 mole %, 80 mole % relative to the majority element of said host material 71.

According to one embodiment, the host material 71 comprises a polymeric host material as described hereabove, an inorganic host material as described hereabove, or a mixture thereof.

In one embodiment, the light emitting material 7 of the invention comprises at least one ink comprising at least one population of particles 1. In one embodiment, a population of particles 1 is defined by the maximum emission wavelength.

In one embodiment, the light emitting material 7 comprises at least one ink comprising two populations of particles 1 emitting different colors or wavelengths, or two inks comprising one population of particles 1.

In one embodiment, the light emitting material 7 comprises at least one ink comprising particles 1 which emit green light and red light upon downconversion of a blue light source. In this embodiment, the light emitting material 7 is configured to transmit a predetermined intensity of the blue light from the light source and to emit a predetermined intensity of secondary green and red lights, allowing to emit a resulting tri-chromatic white light.

According to one embodiment, the light emitting material 7 comprises at least one ink comprising at least one particle 1 that emits green light upon downconversion of a blue light source.

According to one embodiment, the light emitting material 7 comprises at least one ink comprising at least one particle 1 that emits orange light upon downconversion of a blue light source.

According to one embodiment, the light emitting material 7 comprises at least one ink comprising at least one particle 1 that emits yellow light upon downconversion of a blue light source.

According to one embodiment, the light emitting material 7 comprises at least one ink comprising at least one particle 1 that emits purple light upon downconversion of a blue light source.

In one embodiment, the light emitting material 7 comprises at least one ink comprising two populations of particles 1, or two inks each comprising at least one population of particles 1: a first population with a maximum emission wavelength between 500 nm and 560 nm, more preferably between 515 nm and 545 nm and a second population with a maximum emission wavelength between 600 nm and 2500 nm, more preferably between 610 nm and 650 nm.

In one embodiment, the light emitting material 7 comprises at least one ink comprising three populations of particles 1, or three inks each comprising at least one population of particles 1: a first population of particles 1 with a maximum emission wavelength between 440 and 499 nm, more preferably between 450 and 495 nm, a second population of particles 1 with a maximum emission wavelength between 500 nm and 560 nm, more preferably between 515 nm and 545 nm and a third population of particles 1 with a maximum emission wavelength between 600 nm and 2500 nm, more preferably between 610 nm and 650 nm.

In one embodiment, the light emitting material 7 is splitted in several areas, each of them comprises a different ink emitting different colors or wavelengths.

In one embodiment, the light emitting material 7 has a shape of a film.

In one embodiment, the light emitting material 7 is a film.

In one embodiment, the light emitting material 7 is processed by extrusion.

In one embodiment, the light emitting material 7 is made of a stack of two films, each of them comprises a different ink emitting different colors or wavelengths.

In one embodiment, the light emitting material 7 is made of a stack of a plurality of films, each of them comprises a different ink emitting different colors or wavelengths.

According to one embodiment, the light emitting material 7 has a thickness between 30 nm and 10 cm, more preferably between 100 nm and 1 cm, even more preferably between 100 nm and 1 mm.

According to one embodiment, the light emitting material 7 has a thickness of at least 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.1 tam, 4.2 μm, 4.3 μm, 4.4 μm, 4.5 μm, 4.6 μm, 4.7 μm, 4.8 μm, 4.9 μm, 5 μm, 5.1 μm, 5.2 μm, 5.3 μm, 5.4 μm, 5.5 μm, 5.5 μm, 5.6 μm, 5.7 μm, 5.8 μm, 5.9 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 tam, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.1 mm, 1.2 mm, 1.3 mm, 1.4 mm, 1.5 mm, 1.6 mm, 1.7 mm, 1.8 mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, 3.1 mm, 3.2 mm, 3.3 mm, 3.4 mm, 3.5 mm, 3.6 mm, 3.7 mm, 3.8 mm, 3.9 mm, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7.4 mm, 7.5 mm, 7.6 mm, 7.7 mm, 7.8 mm, 7.9 mm, 8 mm, 8.1 mm, 8.2 mm, 8.3 mm, 8.4 mm, 8.5 mm, 8.6 mm, 8.7 mm, 8.8 mm, 8.9 mm, 9 mm, 9.1 mm, 9.2 mm, 9.3 mm, 9.4 mm, 9.5 mm, 9.6 mm, 9.7 mm, 9.8 mm, 9.9 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, the light emitting material 7 absorbs at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the light emitting material 7 absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the light emitting material 7 transmits at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the light emitting material 7 scatters at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the light emitting material 7 backscatters at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the light emitting material 7 transmits a part of the incident light and emits at least one secondary light. In this embodiment, the resulting light is a combination of the remaining transmitted incident light.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 300 nm, 350 nm, 400 nm, 450 nm, 455 nm, 460 nm, 470 nm, 480 nm, 490 nm, 500 nm, 510 nm, 520 nm, 530 nm, 540 nm, 550 nm, 560 nm, 570 nm, 580 nm, 590 nm, or 600 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 300 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 350 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 400 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 450 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 455 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 460 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 470 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 480 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 490 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 500 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 510 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 520 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 530 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 540 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 550 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 560 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 570 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 580 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 590 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 600 nm.

According to one embodiment, the increase in absorption efficiency of incident light by the light emitting material 7 is at least of 1%, 2%, 3%, 4%, 5%, 6%, 7%, 8%, 9%, 10%, 20%, 30%, 40%, 50%, 55%, 60%, 65%, 70%, 75%, 80%, 85%, 90%, 95%, or 100% compared to bare nanoparticles 3. Bare nanoparticles 3 refers here to nanoparticles 3 that are not encapsulated in a second material 21.

According to one embodiment, the increase in emission efficiency of secondary light by the light emitting material 7 is less than 1%, 2%, 3%, 4%, 5%, 6%, 7%, 8%, 9%, 10%, 20%, 30%, 40%, 50%, 55%, 60%, 65%, 70%, 75%, 80%, 85%, 90%, 95%, or 100% compared to bare nanoparticles 3.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

In another embodiment, the light emitting material 7 comprising at least one population of particles 1, may further comprise at least one population of converters having phosphor properties. Examples of converter having phosphor properties include, but are not limited to: garnets (LuAG, GAL, YAG, GaYAG), silicates, oxynitrides/oxycarbidonitrides, nintrides/carbidonitrides, $Mn^{4+}$ red phosphors (PFS/KFS), quantum dots.

According to one embodiment, ink of the invention is incorporated in the host material 71 at a level ranging from 100 ppm to 500 000 ppm in weight.

According to one embodiment, ink of the invention is incorporated in the host material 71 at a level of at least 100 ppm, 200 ppm, 300 ppm, 400 ppm, 500 ppm, 600 ppm, 700 ppm, 800 ppm, 900 ppm, 1000 ppm, 1100 ppm, 1200 ppm, 1300 ppm, 1400 ppm, 1500 ppm, 1600 ppm, 1700 ppm, 1800 ppm, 1900 ppm, 2000 ppm, 2100 ppm, 2200 ppm, 2300 ppm, 2400 ppm, 2500 ppm, 2600 ppm, 2700 ppm, 2800 ppm, 2900 ppm, 3000 ppm, 3100 ppm, 3200 ppm, 3300 ppm, 3400 ppm, 3500 ppm, 3600 ppm, 3700 ppm, 3800 ppm, 3900 ppm, 4000 ppm, 4100 ppm, 4200 ppm, 4300 ppm, 4400 ppm, 4500 ppm, 4600 ppm, 4700 ppm, 4800 ppm, 4900 ppm, 5000 ppm, 5100 ppm, 5200 ppm, 5300 ppm, 5400 ppm, 5500 ppm, 5600 ppm, 5700 ppm, 5800 ppm, 5900 ppm, 6000 ppm, 6100 ppm, 6200 ppm, 6300 ppm, 6400 ppm, 6500 ppm, 6600 ppm, 6700 ppm, 6800 ppm, 6900 ppm, 7000 ppm, 7100 ppm, 7200 ppm, 7300 ppm, 7400 ppm, 7500 ppm, 7600 ppm, 7700 ppm, 7800 ppm, 7900 ppm, 8000 ppm, 8100 ppm, 8200 ppm, 8300 ppm, 8400 ppm, 8500 ppm, 8600 ppm, 8700 ppm, 8800 ppm, 8900 ppm, 9000 ppm, 9100 ppm, 9200 ppm, 9300 ppm, 9400 ppm, 9500 ppm, 9600 ppm, 9700 ppm, 9800 ppm, 9900 ppm, 10000 ppm, 10500 ppm, 11000 ppm, 11500 ppm, 12000 ppm, 12500 ppm, 13000 ppm, 13500 ppm, 14000 ppm, 14500 ppm, 15000 ppm, 15500 ppm, 16000 ppm, 16500 ppm, 17000 ppm, 17500 ppm, 18000 ppm, 18500 ppm, 19000 ppm, 19500 ppm, 20000 ppm, 30000 ppm, 40000 ppm, 50000 ppm, 60000 ppm, 70000 ppm, 80000 ppm, 90000 ppm, 100000 ppm, 110000 ppm, 120000 ppm, 130000 ppm, 140000 ppm, 150000 ppm, 160000 ppm, 170000 ppm, 180000 ppm, 190000 ppm, 200000 ppm, 210000 ppm, 220000 ppm, 230000 ppm, 240000 ppm, 250000 ppm, 260000 ppm, 270000 ppm, 280000 ppm, 290000 ppm, 300000 ppm, 310000 ppm, 320000 ppm, 330000 ppm, 340000 ppm, 350000 ppm, 360000 ppm, 370000 ppm, 380000 ppm, 390000 ppm, 400000 ppm, 410000 ppm, 420000 ppm, 430000 ppm, 440000 ppm, 450000 ppm, 460000 ppm, 470000 ppm, 480000 ppm, 490000 ppm, or 500 000 ppm in weight.

According to one embodiment, the loading charge of ink in the light emitting material 7 is at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the loading charge of ink in the light emitting material 7 is less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the light emitting material 7 is ROHS compliant.

According to one embodiment, the light emitting material 7 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the light emitting material 7 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the light emitting material 7 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the light emitting material 7 comprise heavier chemical elements or materials based on heavier chemical elements than the main chemical element present in the host material 71 and/or the first material 11. In this embodiment, said heavy chemical elements in the light emitting material 7 will lower the mass concentration of chemical elements subject to ROHS standards, allowing said light emitting material 7 to be ROHS compliant.

According to one embodiment, examples of heavy elements include but are not limited to B, C, N, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Tc, Ru, Rh, Pd, Ag, Cd, In, Sn, Sb, Te, I, Cs, Ba, La, Hf, Ta, W, Re, Os, Ir, Pt, Au, Hg, Tl, Pb, Bi, Po, At, Ce, Pr, Nd, Pm, Sm, Eu, Gd, Tb, Dy, Ho, Er, Tm, Yb, Lu or a mixture of thereof.

According to one embodiment, the light emitting material 7 may be used as a light source.

According to one embodiment, the light emitting material 7 may be used in a light source.

According to one embodiment, the light emitting material 7 may be used as a color filter.

According to one embodiment, the light emitting material 7 may be used in a color filter.

According to one embodiment, the light emitting material 7 may be used in addition to a color filter.

According to one embodiment, the light emitting material 7 is deposited on a support by drop-casting, spin coating, dip coating, inkjet printing, spray, plating, electroplating, or any other means known by the person skilled in the art.

According to one embodiment, the light emitting material 7 is deposited on a support by inkjet printing: thermal, piezoelectric or other inkjet printing methods.

According to one embodiment, the support is as described hereabove.

In one embodiment, the light emitting material 7 on a support is encapsulated into a multilayered system. In one embodiment, the multilayer system comprises at least two, at least three layers.

According to one embodiment, the multilayered system is as described hereabove.

Another object of the invention relates to a light emitting material 7 (as illustrated in FIG. 22A-B) comprising at least one ink comprising at least one particle 2 comprising a plurality of nanoparticles 3 encapsulated in a material 21; and at least one liquid vehicle; wherein said particle 2 has a surface roughness less or equal to 5% of the largest dimension of said particle 2.

According to one embodiment, the light emitting material is as described hereabove.

According to one embodiment, the particle 2 is as described hereabove.

According to one embodiment, the nanoparticles 3 are as described hereabove.

According to one embodiment, the material 21 is the second material 21 as described hereabove.

According to one embodiment, the liquid vehicle is as described hereabove.

According to one embodiment, the ink is as described hereabove.

In one embodiment, the light emitting material comprises at least one ink comprising at least one population of particle 2. In one embodiment, a population of particles 2 is defined by the maximum emission wavelength.

In one embodiment, the light emitting material comprises at least one ink comprising two populations of particles 2 emitting different colors or wavelengths, or two inks comprising one population of particles 2.

In one embodiment, the light emitting material comprises at least one ink comprising particles 2 which emit green light and red light upon downconversion of a blue light source. In this embodiment, the light emitting material is configured to transmit a predetermined intensity of the blue light from the light source and to emit a predetermined intensity of secondary green and red lights, allowing to emit a resulting tri-chromatic white light.

According to one embodiment, the light emitting material comprises at least one ink comprising at least one particle 2 that emits green light upon downconversion of a blue light source.

According to one embodiment, the light emitting material comprises at least one ink comprising at least one particle 2 that emits orange light upon downconversion of a blue light source.

According to one embodiment, the light emitting material comprises at least one ink comprising at least one particle 2 that emits yellow light upon downconversion of a blue light source.

According to one embodiment, the light emitting material comprises at least one ink comprising at least one particle 2 that emits purple light upon downconversion of a blue light source.

In one embodiment, the light emitting material comprises at least one ink comprising two populations of particles 2, or two inks each comprising at least one population of particles 2: a first population with a maximum emission wavelength between 500 nm and 560 nm, more preferably between 515 nm and 545 nm and a second population with a maximum emission wavelength between 600 nm and 2500 nm, more preferably between 610 nm and 650 nm.

In one embodiment, the light emitting material comprises at least one ink comprising three populations of particles 2, or three inks each comprising at least one population of particles 2: a first population of particles 2 with a maximum emission wavelength between 440 and 499 nm, more preferably between 450 and 495 nm, a second population of particles 2 with a maximum emission wavelength between 500 nm and 560 nm, more preferably between 515 nm and 545 nm and a third population of particles 2 with a maximum emission wavelength between 600 nm and 2500 nm, more preferably between 610 nm and 650 nm.

Another object of the invention relates to a light emitting material comprising at least one ink comprising at least one phosphor nanoparticle; and at least one liquid vehicle; wherein the phosphor nanoparticle has a size ranging from 0.1 μm to 50 μm.

According to one embodiment, the light emitting material is as described hereabove.

According to one embodiment, the at least one phosphor nanoparticle is as described hereabove.

In one embodiment, the light emitting material of the invention comprises at least one ink comprising at least one population of phosphor nanoparticles. In one embodiment, a population of phosphor nanoparticles is defined by the maximum emission wavelength.

In one embodiment, the light emitting material comprises at least one ink comprising two populations of phosphor nanoparticles emitting different colors or wavelengths, or two inks comprising one population of phosphor nanoparticles.

In one embodiment, the light emitting material comprises at least one ink comprising phosphor nanoparticles which emit green light and red light upon downconversion of a blue light source.

In this embodiment, the light emitting material is configured to transmit a predetermined intensity of the blue light from the light source and to emit a predetermined intensity of secondary green and red lights, allowing to emit a resulting tri-chromatic white light.

According to one embodiment, the light emitting material comprises at least one ink comprising at least one phosphor nanoparticle that emits green light upon downconversion of a blue light source.

According to one embodiment, the light emitting material comprises at least one ink comprising at least one phosphor nanoparticle that emits orange light upon downconversion of a blue light source.

According to one embodiment, the light emitting material comprises at least one ink comprising at least one phosphor nanoparticle that emits yellow light upon downconversion of a blue light source.

According to one embodiment, the light emitting material comprises at least one ink comprising at least one phosphor nanoparticle that emits purple light upon downconversion of a blue light source.

In one embodiment, the light emitting material comprises at least one ink comprising two populations of phosphor nanoparticles, or two inks each comprising at least one population of phosphor nanoparticles: a first population with a maximum emission wavelength between 500 nm and 560 nm, more preferably between 515 nm and 545 nm and a second population with a maximum emission wavelength between 600 nm and 2500 nm, more preferably between 610 nm and 650 nm.

In one embodiment, the light emitting material comprises at least one ink comprising three populations of phosphor nanoparticles, or three inks each comprising at least one population of phosphor nanoparticles: a first population of phosphor nanoparticles with a maximum emission wavelength between 440 and 499 nm, more preferably between 450 and 495 nm, a second population of phosphor nanoparticles with a maximum emission wavelength between 500 nm and 560 nm, more preferably between 515 nm and 545 nm and a third population of phosphor nanoparticles with a maximum emission wavelength between 600 nm and 2500 nm, more preferably between 610 nm and 650 nm.

According to one embodiment, the light emitting material 7 is deposited on a support by drop-casting, spin coating, dip coating, inkjet printing, spray, plating, electroplating, or any other means known by the person skilled in the art.

According to one embodiment, the light emitting material 7 is deposited on a support by inkjet printing: thermal, piezoelectric or other inkjet printing methods.

According to one embodiment, the support is as described hereabove.

Another object of the invention relates to a light emitting material 7 comprising at least one ink comprising at least one particle 1 comprising a first material 11 and at least one liquid vehicle; wherein the particle 1 comprises at least one particle 2 comprising a second material 21 and at least one nanoparticle 3 dispersed in said second material 21; and wherein said particle 1 has a surface roughness less or equal to 5% of the largest dimension of said particle 1.

According to one embodiment, the light emitting material is as described hereabove.

According to one embodiment, the particle 1 is as described hereabove.

According to one embodiment, the particle 2 is as described hereabove.

According to one embodiment, the nanoparticles 3 are as described hereabove.

According to one embodiment, the first material 11 and the second material 21 are as described hereabove.

According to one embodiment, the liquid vehicle is as described hereabove.

According to one embodiment, the ink is as described hereabove.

Another object of the invention relates to a pattern comprising at least one ink deposited by inkjet printing on a support.

Said ink comprising:

i. at least one particle 1 comprising a first material 11 and at least one liquid vehicle; wherein the particle 1 comprises at least one particle 2 comprising a second material 21 and at least one nanoparticle 3 dispersed in said second material 21; and wherein the first material 11 and the second material 21 have an extinction coefficient less or equal to $15\times10^{-5}$ at 460 nm; or ii. at least one particle 2 comprising a plurality of nanoparticles 3 encapsulated in a material 21; and at least one liquid vehicle; wherein said particle 2 has a surface roughness less or equal to 5% of the largest dimension of said particle 2; or iii. at least one phosphor nanoparticle; and at least one liquid vehicle; wherein the phosphor nanoparticle has a size ranging from 0.1 μm to 50 μm; or iv. at least one particle 1 comprising a first material 11 and at least one liquid vehicle; wherein the particle 1 comprises at least one particle 2 comprising a second material 21 and at least one nanoparticle 3 dispersed in said second material 21; and wherein said particle 1 has a surface roughness less or equal to 5% of the largest dimension of said particle 1.

According to one embodiment, the particle 1 is as described hereabove.

According to one embodiment, the particle 2 is as described hereabove.

According to one embodiment, the nanoparticles 3 are as described hereabove.

According to one embodiment, the first material 11 and/or the second material 21 are as described hereabove.

According to one embodiment, the liquid vehicle is as described hereabove.

According to one embodiment, the ink is as described hereabove.

According to one embodiment, the support is as described hereabove.

According to one embodiment, the at least one phosphor nanoparticle is as described hereabove.

According to one embodiment, the support is a LED chip or microsized LED.

According to one embodiment, the ink is deposited on a support by inkjet printing: thermal, piezoelectric or other inkjet printing methods.

According to one embodiment, the pattern is formed by deposition of an ink on a support by inkjet printing: thermal, piezoelectric or other inkjet printing methods.

According to one embodiment, the pattern is formed by deposition of an ink on a support by spin coating, inkjet printing (thermal, piezoelectric or other inkjet printing methods), slot die coating, nozzle printing, contact printing, gravure printing, and any solution printing technology.

According to one embodiment, the pattern is fluorescent.

According to one embodiment, the pattern is phosphorescent.

According to one embodiment, the pattern is luminescent.

According to one embodiment, the pattern is electroluminescent.

According to one embodiment, the pattern is chemiluminescent.

According to one embodiment, the pattern is triboluminescent.

According to one embodiment, the features of the light emission of pattern are sensible to external pressure variations. In this embodiment, "sensible" means that the features of the light emission can be modified by external pressure variations.

According to one embodiment, the wavelength emission peak of pattern is sensible to external pressure variations. In this embodiment, "sensible" means that the wavelength emission peak can be modified by external pressure variations, i.e., external pressure variations can induce a wavelength shift.

According to one embodiment, the FWHM of pattern is sensible to external pressure variations.

In this embodiment, "sensible" means that the FWHM can be modified by external pressure variations, i.e., FWHM can be reduced or increased.

According to one embodiment, the PLQY of pattern is sensible to external pressure variations. In this embodiment, "sensible" means that the PLQY can be modified by external pressure variations, i.e., PLQY can be reduced or increased.

According to one embodiment, the features of the light emission of pattern are sensible to external temperature variations.

According to one embodiment, the wavelength emission peak of pattern is sensible to external temperature variations. In this embodiment, "sensible" means that the wavelength emission peak can be modified by external temperature variations, i.e., external temperature variations can induce a wavelength shift.

According to one embodiment, the FWHM of pattern is sensible to external temperature variations. In this embodiment, "sensible" means that the FWHM can be modified by external temperature variations, i.e., FWHM can be reduced or increased.

According to one embodiment, the PLQY of pattern is sensible to external temperature variations. In this embodiment, "sensible" means that the PLQY can be modified by external temperature variations, i.e., PLQY can be reduced or increased.

According to one embodiment, the features of the light emission of pattern are sensible to external variations of pH.

According to one embodiment, the wavelength emission peak of pattern is sensible to external variations of pH. In this embodiment, "sensible" means that the wavelength emission peak can be modified by external variations of pH, i.e., external variations of pH can induce a wavelength shift.

According to one embodiment, the FWHM of pattern is sensible to e external variations of pH.

In this embodiment, "sensible" means that the FWHM can be modified by external variations of pH, i.e., FWHM can be reduced or increased.

According to one embodiment, the PLQY of pattern is sensible to external variations of pH. In this embodiment, "sensible" means that the PLQY can be modified by external variations of pH, i.e., PLQY can be reduced or increased.

According to one embodiment, the pattern is magnetic.

According to one embodiment, the pattern is ferromagnetic.

According to one embodiment, the pattern is paramagnetic.

According to one embodiment, the pattern is superparamagnetic.

According to one embodiment, the pattern is diamagnetic.

According to one embodiment, the pattern is plasmonic.

According to one embodiment, the pattern has photovoltaic properties.

According to one embodiment, the pattern is piezo-electric.

According to one embodiment, the pattern is pyro-electric.

According to one embodiment, the pattern is ferro-electric.

According to one embodiment, the pattern is drug delivery featured.

According to one embodiment, the pattern is a light scatterer.

According to one embodiment, the pattern is a local high temperature heating system.

According to one embodiment, the pattern is a thermal insulator.

According to one embodiment, the pattern is a thermal conductor.

According to one embodiment, the pattern is an electrical conductor.

According to one embodiment, the pattern is an electrical insulator.

According to one embodiment, the pattern absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the pattern exhibits an emission spectrum with at least one emission peak, wherein said emission peak has a maximum emission wavelength ranging from 400 nm to 50 m.

According to one embodiment, the pattern exhibits an emission spectrum with at least one emission peak, wherein said emission peak has a maximum emission wavelength ranging from 400 nm to 500 nm. In this embodiment, the pattern emits blue light.

According to one embodiment, the pattern exhibits an emission spectrum with at least one emission peak, wherein said emission peak has a maximum emission wavelength ranging from 500 nm to 560 nm, more preferably ranging from 515 nm to 545 nm. In this embodiment, the pattern emits green light.

According to one embodiment, the pattern exhibits an emission spectrum with at least one emission peak, wherein said emission peak has a maximum emission wavelength ranging from 560 nm to 590 nm. In this embodiment, the pattern emits yellow light.

According to one embodiment, the pattern exhibits an emission spectrum with at least one emission peak, wherein said emission peak has a maximum emission wavelength ranging from 590 nm to 750 nm, more preferably ranging from 610 nm to 650 nm. In this embodiment, the pattern emits red light.

According to one embodiment, the pattern exhibits an emission spectrum with at least one emission peak, wherein said emission peak has a maximum emission wavelength ranging from 750 nm to 50 μm. In this embodiment, the pattern emits near infra-red, mid-infra-red, or infra-red light.

According to one embodiment, the pattern exhibits emission spectra with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the pattern exhibits emission spectra with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the pattern has a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99% or 100%.

In one embodiment, the pattern exhibits photoluminescence quantum yield (PLQY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 $mW \cdot cm^{-2}$ and 100 $kW \cdot cm^{-2}$ and more preferably between 10 $mW \cdot cm^{-2}$ and 100 $W \cdot cm^{-2}$, and even more preferably between 10 $mW \cdot cm^{-2}$ and 30 $W \cdot cm^{-2}$.

According to one embodiment, the photon flux or average peak pulse power of the illumination is at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the pattern exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the pattern exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$.

In one embodiment, the pattern is a film.

In one embodiment, the pattern is a light emitting material as described hereabove.

In one embodiment, the pattern is a geometrical pattern.

In one embodiment, the pattern is made of a stack of two films, each of them comprises a different population of inks emitting different colors or wavelengths.

In one embodiment, the pattern is made of a stack of a plurality of films, each of them comprises a different population of inks emitting different colors or wavelengths.

According to one embodiment, the pattern has a thickness between 30 nm and 10 cm, more preferably between 100 nm and 1 cm, even more preferably between 100 nm and 1 mm.

According to one embodiment, the pattern has a thickness of at least 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.1 µm, 4.2 µm, 4.3 µm, 4.4 µm, 4.5 µm, 4.6 µm, 4.7 µm, 4.8 µm, 4.9 µm, 5 µm, 5.1 µm, 5.2 µm, 5.3 µm, 5.4 µm, 5.5 µm, 5.5 µm, 5.6 µm, 5.7 µm, 5.8 µm, 5.9 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 250 µm, 300 µm, 350 µm, 400 µm, 450 µm, 500 µm, 550 µm, 600 µm, 650 µm, 700 µm, 750 µm, 800 µm, 850 µm, 900 µm, 950 µm, 1 mm, 1.1 mm, 1.2 mm, 1.3 mm, 1.4 mm, 1.5 mm, 1.6 mm, 1.7 mm, 1.8 mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, 3.1 mm, 3.2 mm, 3.3 mm, 3.4 mm, 3.5 mm, 3.6 mm, 3.7 mm, 3.8 mm, 3.9 mm, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7.4 mm, 7.5 mm, 7.6 mm, 7.7 mm, 7.8 mm, 7.9 mm, 8 mm, 8.1 mm, 8.2 mm, 8.3 mm, 8.4 mm, 8.5 mm, 8.6 mm, 8.7 mm, 8.8 mm, 8.9 mm, 9 mm, 9.1 mm, 9.2 mm, 9.3 mm, 9.4 mm, 9.5 mm, 9.6 mm, 9.7 mm, 9.8 mm, 9.9 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, the pattern absorbs at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the pattern absorbs the incident light with wavelength lower than 50 µm, 40 µm, 30 µm, 20 µm, 10 µm, 1 µm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the pattern transmits at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the pattern scatters at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the pattern backscatters at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the pattern transmits a part of the incident light and emits at least one secondary light. In this embodiment, the resulting light is a combination of the remaining transmitted incident light.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 300 nm, 350 nm, 400 nm, 450 nm, 455 nm, 460 nm, 470 nm, 480 nm, 490 nm, 500 nm, 510 nm, 520 nm, 530 nm, 540 nm, 550 nm, 560 nm, 570 nm, 580 nm, 590 nm, or 600 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 300 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 350 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 400 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 450 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 455 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 460 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 470 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 480 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 490 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 500 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 510 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 520 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 530 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 540 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 550 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 560 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 570 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 580 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 590 nm.

According to one embodiment, the pattern has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 600 nm.

According to one embodiment, the pattern exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the pattern exhibits a degradation of its photoluminescence of less than 90%, 80%, 70%, 60%, 50%, 40%, 30%, 25%, 20%, 15%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the pattern exhibits a degradation of its photoluminescence of less than 90%, 80%, 70%, 60%, 50%, 40%, 30%, 25%, 20%, 15%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the pattern exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the pattern exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the pattern exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the pattern exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the pattern exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the pattern exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the pattern exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the pattern exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the pattern exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the pattern exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the pattern exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the pattern exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the pattern exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the pattern exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the pattern exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the pattern exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the pattern exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the pattern exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the pattern exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the pattern exhibits a degradation of its FCE of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the pattern exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the pattern exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the pattern exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the pattern exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the pattern exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the pattern exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the pattern exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the pattern exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the pattern is ROHS compliant.

According to one embodiment, the pattern comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the pattern comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the pattern comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

Another object of the invention relates to a particle 1 deposited on a support by inkjet printing; wherein the particle 1 comprises a first material 11, and at least one particle 2 comprising a second material 21 and at least one nanoparticle 3 dispersed in said second material 21; and wherein the first material 11 and the second material 21 have an extinction coefficient less or equal to $15\times10^{-5}$ at 460 nm.

In another aspect, the present invention relates to a particle deposited on a support by inkjet printing; wherein the particle comprises:

- a first material, and at least one particle comprising a second material and at least one nanoparticle dispersed in said second material; and wherein the first material and the second material have an extinction coefficient less or equal to $15\times10^{-5}$ at 460 nm; or

- a first material, and at least one particle comprising a second material and at least one nanoparticle dispersed in said second material; and wherein said particle has a surface roughness less or equal to 5% of the largest dimension of said particle.

According to one embodiment, the particle 1 is as described hereabove.

According to one embodiment, the first material 11 is as described hereabove.

According to one embodiment, the particle 2 is as described hereabove.

According to one embodiment, the second material 21 is as described hereabove.

According to one embodiment, the nanoparticle 3 is as described hereabove.

According to one embodiment, the support is as described hereabove.

In one embodiment, the support supports at least one population of particles of the invention. In this embodiment, particle of the invention refers to particle 1, particle 2 and/or nanophosphor nanoparticle.

In the present application, a population of particles is defined by the maximum emission wavelength.

In one embodiment, the support supports two populations of particles of the invention emitting different colors or wavelengths. In this embodiment, particle of the invention refers to particle 1, particle 2 and/or nanophosphor nanoparticle.

In one embodiment, the support supports particles of the invention which emit green light and red light upon down-conversion of a blue light source. Thus, the blue light from the light source(s) pass through the particles of the invention, where predetermined amounts of green and red light are mixed with the remaining blue light to create the tri-chromatic white light. In this embodiment, particle of the invention refers to particle 1, particle 2 and/or nanophosphor nanoparticle.

In one embodiment, the support supports two populations of particles of the invention, a first population with a maximum emission wavelength between 500 nm and 560 nm, more preferably between 515 nm and 545 nm and a second population with a maximum emission wavelength between 600 nm and 2500 nm, more preferably between 610 nm and 650 nm. In this embodiment, particle of the invention refers to particle 1, particle 2 and/or nanophosphor nanoparticle.

In one embodiment, the support supports two populations of particles of the invention, a first population with at least one emission peak having a full width half maximum lower than 90 nm, 80 nm, 70 nm, 60 nm, 50 nm, 40 nm, 30 nm, 25 nm, 20 nm, 15 nm, or 10 nm and a second population with at least one emission peak having a full width half maximum lower than 90 nm, 80 nm, 70 nm, 60 nm, 50 nm, 40 nm, 30 nm, 25 nm, 20 nm, 15 nm, or 10 nm. In this embodiment, particle of the invention refers to particle 1, particle 2 and/or nanophosphor nanoparticle.

In one embodiment, the support supports two populations of particles of the invention, a first population with at least one emission peak having a full width at quarter maximum lower than 90 nm, 80 nm, 70 nm, 60 nm, 50 nm, 40 nm, 30 nm, 25 nm, 20 nm, 15 nm, or 10 nm and a second population with at least one emission peak having a full width at quarter maximum lower than 90 nm, 80 nm, 70 nm, 60 nm, 50 nm, 40 nm, 30 nm, 25 nm, 20 nm, 15 nm, or 10 nm. In this embodiment, particle of the invention refers to particle 1, particle 2 and/or nanophosphor nanoparticle.

Another object of the invention relates to a particle 2 deposited on a support by inkjet printing; wherein said particle 2 comprises a plurality of nanoparticles 3 encapsulated in a material 21; and wherein said particle 2 has a surface roughness less or equal to 5% of the largest dimension of said particle 2.

According to one embodiment, the particle 2 is as described hereabove.

According to one embodiment, the second material 21 is as described hereabove.

According to one embodiment, the nanoparticles 3 are as described hereabove.

According to one embodiment, the support is as described hereabove.

In one embodiment, the particle 2 on a support is encapsulated into a multilayered system. In one embodiment, the multilayer system comprises at least two, at least three layers.

Another object of the invention relates to a particle 1 deposited on a support by inkjet printing; wherein the particle 1 comprises a first material 11 and at least one particle 2 comprising a second material 21 and at least one nanoparticle 3 dispersed in said second material 21; and wherein said particle 1 has a surface roughness less or equal to 5% of the largest dimension of said particle 1.

According to one embodiment, the particle 1 is as described hereabove.

According to one embodiment, the first material 11 is as described hereabove.

According to one embodiment, the particle 2 is as described hereabove.

According to one embodiment, the second material 21 is as described hereabove.

According to one embodiment, the nanoparticle 3 is as described hereabove.

According to one embodiment, the support is as described hereabove.

Another object of the invention relates to an optoelectronic device comprising at least one ink comprising at least one particle 1 comprising a first material 11 and at least one liquid vehicle; wherein the particle 1 comprises at least one particle 2 comprising a second material 21 and at least one nanoparticle 3 dispersed in said second material 21; and wherein the first material 11 and the second material 21 have an extinction coefficient less or equal to $15\times10^{-5}$ at 460 nm.

According to one embodiment, the particle 1 is as described hereabove.

According to one embodiment, the particle 2 is as described hereabove.

According to one embodiment, the nanoparticles 3 are as described hereabove.

According to one embodiment, the first material 11 and/or the second material 21 are as described hereabove.

According to one embodiment, the liquid vehicle is as described hereabove.

According to one embodiment, the ink is as described hereabove.

According to one embodiment, the optoelectronic device further comprises a light emitting material as described hereabove.

According to one embodiment, the optoelectronic device further comprises a pattern as described hereabove.

According to one embodiment, the optoelectronic device comprises: an optoelectronic device substrate; and a crosslinked polymer film on the optoelectronic device substrate, the crosslinked polymer film comprising the ink as described hereabove.

According to one embodiment, the optoelectronic device comprises at least one cut-on filter layer. In this embodiment, said layer is a global cut-on filter, a local cut-on filter, or a mixture thereof. This embodiment is particularly advantageous as said cut-on filter layer prevents the excitation of the particles of the invention comprised in the ink by ambient light. A local cut-on filter blocks only a particular part of the optical spectrum. A local cut-on filter which blocks only this particular part of the optical spectrum can, in conjunction with a global cut-on filter, eliminate (or significantly reduce) the excitation of the particles of the invention by ambient light According to one embodiment, the cut-on filter is a resin that can filter blue light.

According to one embodiment, the optoelectronic device is a display device, a LCD display device, a diode, a light emitting diode (LED), a laser, a photodetector, a transistor, a supercapacitor, a barcode, a LED, a microLED, an array of LED, an array of microLED, or an IR camera.

LED used herein includes LED, LED chip 5 and microsized LED 6.

According to one embodiment, the optoelectronic device comprises at least one LED and at least one ink.

According to one embodiment, a pixel comprises at least one LED.

According to one embodiment, a pixel comprises at least 1, 2, 3, 4, 5, 10, 20, 30, 40, 50, 60, 70, 80, 90, 100, 500, 1000, 5000, 10000, 50000, 100000, 150000, 200000, 250000, 300000, 350000, 400000, 450000, 500000, 550000, 600000, 650000, 750000, 800000, 850000, 900000, 950000, $10^6$, $10^7$, $10^8$, $10^9$, $10^{10}$, $10^{11}$, or $10^{12}$ LEDs.

According to one embodiment, the ink is deposited on top of a LED chip 5 or a microsized LED 6.

According to one embodiment, the ink is deposited on top of at least one LED of a LED array or a microsized LED 6 array.

According to one embodiment, the ink is deposited and patterned on top of at least one LED of a LED array or a microsized LED 6 array.

According to one embodiment, the ink is deposited and patterned on top of a LED, at least one LED of a LED array, a microsized LED 6 or at least one LED of a microsized LED 6 array using an inkjet printing technique, a lift-off technique, lithography, or a direct etching of the ink.

In one embodiment, as illustrated in FIG. 14A, the ink 15 covers the LED chip 5.

In one embodiment, as illustrated in FIG. 14B, the ink 15 covers and surrounds partially or totally the LED chip 5.

In one embodiment, as illustrated in FIG. 16A, the ink 15 covers a pixel of a microsized LED 6 array without overlapping between the pixels of said microsized LED 6 array.

In one embodiment, the ink covers partially a pixel of a microsized LED 6 array without overlapping between the pixels of said microsized LED 6 array.

In one embodiment, as illustrated in FIG. 16B, the ink 15 covers and surrounds partially or totally a pixel of a microsized LED 6 array without overlapping between the pixels of said microsized LED 6 array.

In one embodiment, the ink covers a microsized LED 6 array without overlapping between the pixels of said microsized LED 6 array.

In one embodiment, the ink covers partially a microsized LED 6 array without overlapping between the pixels of said microsized LED 6 array.

In one embodiment, the ink covers and surrounds partially or totally a microsized LED 6 array without overlapping between the pixels of said microsized LED 6 array.

In one embodiment, one ink comprising one population of particles 1 and/or particles 2 is deposited on a microsized LED 6 array. In one embodiment, a population of particles is defined by the maximum emission wavelength.

In one embodiment, at least one ink comprising at least one population of particles 1 and/or particles 2 is deposited on a pixel or a sub-pixel of a microsized LED 6 array.

In one embodiment, the at least one ink as described here is deposited on a pixel, a sub-pixel, a microsized LED, a LED, or an array of LEDs by drop-casting, spin coating, dip coating, inkjet printing, lithography, spray, plating, electroplating, or any other means known by the person skilled in the art.

In one embodiment, at least one ink comprising two populations of particles 1 and/or particles 2 emitting different colors or wavelengths are deposited on a microsized LED 6 array.

In one embodiment, two inks each comprising one population of particles 1 and/or particles 2 emitting different colors or wavelengths are deposited on a microsized LED 6 array.

In one embodiment, at least one ink comprising two populations of particles 1 and/or particles 2 which emit green light and red light upon downconversion of a blue light source are deposited on a microsized LED 6 array.

In one embodiment, two inks each comprising one population of particles 1 and/or particles 2 which emit green light and red light upon downconversion of a blue light source are deposited on a microsized LED 6 array.

In one embodiment, the two populations of particles 1 and/or particles 2 comprise a first population with a maximum emission wavelength between 500 nm and 560 nm, more preferably between 515 nm and 545 nm and a second population with a maximum emission wavelength between 600 nm and 2500 nm, more preferably between 610 nm and 650 nm.

In one embodiment, the LED chip 5 or the microsized LED 6 is a blue LED with a wavelength ranging from 400 nm to 470 nm such as for instance a gallium nitride based diode.

In one embodiment, the LED chip 5 or the microsized LED 6 is a blue LED with a wavelength ranging from 400 nm to 470 nm. In one embodiment, the LED chip 5 or the microsized LED 6 has an emission peak at about 405 nm. In one embodiment, the LED chip 5 or the microsized LED 6 has an emission peak at about 447 nm. In one embodiment, the LED chip 5 or the microsized LED 6 has an emission peak at about 455 nm.

In one embodiment, the LED chip 5 or the microsized LED 6 is a UV LED with a wavelength ranging from 200 nm to 400 nm. In one embodiment, the LED chip 5 or the microsized LED 6 has an emission peak at about 253 nm. In one embodiment, the LED chip 5 or the microsized LED 6 has an emission peak at about 365 nm. In one embodiment, the LED chip 5 or the microsized LED 6 has an emission peak at about 395 nm.

In one embodiment, the LED chip 5 or the microsized LED 6 is a green LED with a wavelength ranging from 500 nm to 560 nm. In one embodiment, the LED chip 5 or the microsized LED 6 has an emission peak at about 515 nm. In one embodiment, the LED chip 5 or the microsized LED 6 has an emission peak at about 525 nm. In one embodiment, the LED chip 5 or the microsized LED 6 has an emission peak at about 540 nm.

In one embodiment, the LED chip 5 or the microsized LED 6 is a red LED with a wavelength ranging from 750 to 850 nm. In one embodiment, the LED chip 5 or the microsized LED 6 has an emission peak at about 755 nm. In one embodiment, the LED chip 5 or the microsized LED 6 has an emission peak at about 800 nm. In one embodiment, the LED chip 5 or the microsized LED 6 has an emission peak at about 850 nm.

In one embodiment, the LED chip 5 or the microsized LED 6 has a photon flux or average peak pulse power between 1 $W \cdot cm^{-2}$ and 1 $kW \cdot cm^{-2}$ and more preferably between 1 $mW \cdot cm^{-2}$ and 100 $W \cdot cm^{-2}$, and even more preferably between 1 $mW \cdot cm^{-2}$ and 30 $W \cdot cm^{-2}$.

In one embodiment, the LED chip 5 or the microsized LED 6 has a photon flux or average peak pulse power of at least 1 $W \cdot cm^{-2}$, 10 $W \cdot cm^{-2}$, 100 $W \cdot cm^{-2}$, 500 $W \cdot cm^{-2}$, 1 $mW \cdot cm^{-2}$, 10 $mW \cdot cm^{-2}$, 100 $mW \cdot cm^{-2}$, 500 $mW \cdot cm^{-2}$, 1 $W \cdot cm^{-2}$, 10 $W \cdot cm^{-2}$, 100 $W \cdot cm^{-2}$, 500 $W \cdot cm^{-2}$, or 1 $kW \cdot cm^{-2}$.

In one embodiment, the LED chip 5 is a GaN, GaSb, GaAs, GaAsP, GaP, InP, SiGe, InGaN, GaAlN, GaAlPN, AlN, AlGaAs, AlGaP, AlGaInP, AlGaN, AlGaInN, ZnSe, Si, SiC, diamond, boron nitride diode.

In one embodiment, the microsized LED 6 is a GaN, GaSb, GaAs, GaAsP, GaP, InP, SiGe, InGaN, GaAlN, GaAlPN, AlN, AlGaAs, AlGaP, AlGaInP, AlGaN, AlGaInN, ZnSe, Si, SiC, diamond, boron nitride diode.

In one embodiment, a LED array comprises an array of GaN diodes, GaSb diodes, GaAs diodes, GaAsP diodes, GaP diodes, InP diodes, SiGe diodes, InGaN diodes, GaAlN diodes, GaAlPN diodes, AlN diodes, AlGaAs diodes, AlGaP diodes, AlGaInP diodes, AlGaN diodes, AlGaInN diodes, ZnSe diodes, Si diodes, SiC diodes, diamond diodes, boron nitride diodes or a mixture thereof.

According to one embodiment, a pixel comprises at least one microsized LED 6.

According to one embodiment, at least one pixel comprises a unique microsized LED 6.

According to one embodiment, at least one pixel comprises one microsized LED 6. In this embodiment, the microsized LED 6 and the one pixel are combined.

According to one embodiment, as illustrated in FIG. 15, the pixel pitch D is at least 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, 50 μm, 51 μm, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 μm, 69 μm, 70 μm, 71 μm, 72 μm, 73 μm, 74 μm, 75 μm, 76 μm, 77 μm, 78 μm, 79 μm, 80 μm, 81 μm, 82 μm, 83 μm, 84 μm, 85 μm, 86 μm, 87 μm, 88 μm, 89 μm, 90 μm, 91 μm, 92 μm, 93 μm, 94 μm, 95 μm, 96 μm, 97 μm, 98 μm, 99 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.1 mm, 1.2 mm, 1.3 mm, 1.4 mm, 1.5 mm, 1.6 mm, 1.7 mm, 1.8 mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, 3.1 mm, 3.2 mm, 3.3 mm, 3.4 mm, 3.5 mm, 3.6 mm, 3.7 mm, 3.8 mm, 3.9 mm, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7.4 mm, 7.5 mm, 7.6 mm, 7.7 mm, 7.8 mm, 7.9 mm, 8 mm, 8.1 mm, 8.2 mm, 8.3 mm, 8.4 mm, 8.5 mm, 8.6 mm, 8.7 mm, 8.8 mm, 8.9 mm, 9 mm, 9.1 mm, 9.2 mm, 9.3 mm, 9.4 mm, 9.5 mm, 9.6 mm, 9.7 mm, 9.8 mm, 9.9 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, the pixel pitch D is smaller than 10 μm.

According to one embodiment, the pixel size is at least 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, 50 μm, 51 μm, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 μm, 69 μm, 70 μm, 71 μm, 72 μm, 73 μm, 74 μm, 75 μm, 76 μm, 77 μm, 78 μm, 79 μm, 80 μm, 81 μm, 82 μm, 83 μm, 84 μm, 85 μm, 86 μm, 87 μm, 88 μm, 89 μm, 90 μm, 91 μm, 92 μm, 93 μm, 94 μm, 95 μm, 96 μm, 97 μm, 98 μm, 99 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.1 mm, 1.2 mm, 1.3 mm, 1.4 mm, 1.5 mm, 1.6 mm, 1.7 mm, 1.8 mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, 3.1 mm, 3.2 mm, 3.3 mm, 3.4 mm, 3.5 mm, 3.6 mm, 3.7 mm, 3.8 mm, 3.9 mm, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7.4 mm, 7.5 mm, 7.6 mm, 7.7 mm, 7.8 mm, 7.9 mm, 8 mm, 8.1 mm, 8.2 mm, 8.3 mm, 8.4 mm, 8.5 mm, 8.6 mm, 8.7 mm, 8.8 mm, 8.9 mm, 9 mm, 9.1 mm, 9.2 mm, 9.3 mm, 9.4 mm, 9.5 mm, 9.6 mm, 9.7 mm, 9.8 mm, 9.9 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, the optoelectronic device comprises LEDs, microLEDs, at least one array of LED or at least one array of microLED, on which at least one ink is deposited.

According to one embodiment, red emitting ink, and green emitting ink are deposited alternatively on LEDs, microLEDs, at least one array of LED or at least one array of microLED, preferably blue LEDs, microLEDs, at least one array of LED or at least one array of microLED thus creating an alternance of red-green emitting pixels. According to one embodiment, red emitting ink, green emitting ink, no ink are deposited alternatively on LEDs, microLEDs, at least one array of LED or at least one array of microLED, preferably blue LEDs, microLEDs, at least one array of LED or at least one array of microLED, thus creating an alternance of blue-red-green emitting pixels.

According to one embodiment, the at least one ink deposited on LEDs, microLEDs, at least one array of LED or at least one array of microLED is covered with an auxiliary layer as described herein, preferably a blue absorbing resin so that only red and green secondary light can be emitted.

According to one embodiment, the optoelectronic device comprises at least one ink deposited on at least one array of LED, at least one array of microLED, or a pixel.

According to one embodiment, after deposition, the at least one ink is coated with an auxiliary layer as described here above. In this embodiment, the auxiliary layer limits or prevents the degradation of the chemical and physical properties of the at least one ink from molecular oxygen, ozone, water and/or high temperature.

According to one embodiment, after deposition, the ink is coated with a protective layer as described here above. In this embodiment, the protective layer limits or prevents the degradation of the chemical and physical properties of the at least one ink from molecular oxygen, ozone, water and/or high temperature.

In one embodiment, the ink exhibits photoluminescence quantum yield (PLQY) decrease of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 $mW \cdot cm^{-2}$ and 100 $kW \cdot cm^{-2}$ and more preferably between 10 $mW \cdot cm^{-2}$ and 100 $W \cdot cm^{-2}$, and even more preferably between 10 $mW \cdot cm^{-2}$ and 30 $W \cdot cm^{-2}$.

According to one embodiment, the photon flux or average peak pulse power of the illumination is at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300

W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the ink exhibits photoluminescence quantum yield (PQLY) decrease of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$. In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% under a humidity of at least 0%, 10%, 20%, 30%, 40%, 50%, 55%, 60%, 65%, 70%, 75%, 80%, 85%, 90%, 95%, or 100%, under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% under a humidity of at least 0%, 10%, 20%, 30%, 40%, 50%, 55%, 60%, 65%, 70%, 75%, 80%, 85%, 90%, 95%, or 100%, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW·cm^{-2}$, 50 $mW·cm^{-2}$, 100 $mW·cm^{-2}$, 500 $mW·cm^{-2}$, 1 $W·cm^{-2}$, 5 $W·cm^{-2}$, 10 $W·cm^{-2}$, 20 $W·cm^{-2}$, 30 $W·cm^{-2}$, 40 $W·cm^{-2}$, 50 $W·cm^{-2}$, 60 $W·cm^{-2}$, 70 $W·cm^{-2}$, 80 $W·cm^{-2}$, 90 $W·cm^{-2}$, 100 $W·cm^{-2}$, 110 $W·cm^{-2}$, 120 $W·cm^{-2}$, 130 $W·cm^{-2}$, 140 $W·cm^{-2}$, 150 $W·cm^{-2}$, 160 $W·cm^{-2}$, 170 $W·cm^{-2}$, 180 $W·cm^{-2}$, 190 $W·cm^{-2}$, 200 $W·cm^{-2}$, 300 $W·cm^{-2}$, 400 $W·cm^{-2}$, 500 $W·cm^{-2}$, 600 $W·cm^{-2}$, 700 $W·cm^{-2}$, 800 $W·cm^{-2}$, 900 $W·cm^{-2}$, 1 $kW·cm^{-2}$, 50 $kW·cm^{-2}$, or 100 $kW·cm^{-2}$, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% under light illumination with a photon flux or average peak pulse power of at least 1 $mW·cm^{-2}$, 50 $mW·cm^{-2}$, 100 $mW·cm^{-2}$, 500 $mW·cm^{-2}$, 1 $W·cm^{-2}$, 5 $W·cm^{-2}$, 10 $W·cm^{-2}$, 20 $W·cm^{-2}$, 30 $W·cm^{-2}$, 40 $W·cm^{-2}$, 50 $W·cm^{-2}$, 60 $W·cm^{-2}$, 70 $W·cm^{-2}$, 80 $W·cm^{-2}$, 90 $W·cm^{-2}$, 100 $W·cm^{-2}$110 $W·cm^{-2}$, 120 $W·cm^{-2}$, 130 $W·cm^{-2}$, 140 $W·cm^{-2}$, 150 $W·cm^{-2}$, 160 $W·cm^{-2}$, 170 $W·cm^{-2}$180 $W·cm^{-2}$, 190 $W·cm^{-2}$, 200 $W·cm^{-2}$, 300 $W·cm^{-2}$, 400 $W·cm^{-2}$, 500 $W·cm^{-2}$, 600 $W·cm^{-2}$, 700 $W·cm^{-2}$, 800 $W·cm^{-2}$, 900 $W·cm^{-2}$, 1 $kW·cm^{-2}$, 50 $kW·cm^{-2}$, or 100 $kW·cm^{-2}$, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW·cm^{-2}$, 50 $mW·cm^{-2}$, 100 $mW·cm^{-2}$, 500 $mW·cm^{-2}$, 1 $W·cm^{-2}$, 5 $W·cm^{-2}$, 10 $W·cm^{-2}$, 20 $W·cm^{-2}$, 30 $W·cm^{-2}$, 40 $W·cm^{-2}$, 50 $W·cm^{-2}$, 60 $W·cm^{-2}$, 70 $W·cm^{-2}$, 80 $W·cm^{-2}$, 90 $W·cm^{-2}$, 100 $W·cm^{-2}$, 110 $W·cm^{-2}$, 120 $W·cm^{-2}$, 130 $W·cm^{-2}$, 140 $W·cm^{-2}$, 150 $W·cm^{-2}$, 160 $W·cm^{-2}$, 170 $W·cm^{-2}$, 180 $W·cm^{-2}$, 190 $W·cm^{-2}$, 200 $W·cm^{-2}$, 300 $W·cm^{-2}$, 400 $W·cm^{-2}$, 500 $W·cm^{-2}$, 600 $W·cm^{-2}$, 700 $W·cm^{-2}$, 800 $W·cm^{-2}$, 900 $W·cm^{-2}$, 1 $kW·cm^{-2}$, 50 $kW·cm^{-2}$, or 100 $kW·cm^{-2}$, and under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW·cm^{-2}$, 50 $mW·cm^{-2}$, 100 $mW·cm^{-2}$, 500 $mW·cm^{-2}$, 1 $W·cm^{-2}$, 5 $W·cm^{-2}$, 10 $W·cm^{-2}$, 20 $W·cm^{-2}$, 30 $W·cm^{-2}$, 40 $W·cm^{-2}$, 50 $W·cm^{-2}$, 60 $W·cm^{-2}$, 70 $W·cm^{-2}$, 80 $W·cm^{-2}$, 90 $W·cm^{-2}$, 100 $W·cm^{-2}$, 110 $W·cm^{-2}$, 120 $W·cm^{-2}$, 130 $W·cm^{-2}$, 140 $W·cm^{-2}$, 150 $W·cm^{-2}$, 160 $W·cm^{-2}$, 170 $W·cm^{-2}$, 180 $W·cm^{-2}$, 190 $W·cm^{-2}$, 200 $W·cm^{-2}$, 300 $W·cm^{-2}$, 400 $W·cm^{-2}$, 500 $W·cm^{-2}$, 600 $W·cm^{-2}$, 700 $W·cm^{-2}$, 800 $W·cm^{-2}$, 900 $W·cm^{-2}$, 1 $kW·cm^{-2}$, 50 kW·cm 2, or 100 $kW·cm^{-2}$.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm under a humidity of at least 0%, 10%, 20%, 30%, 40%, 50%, 55%, 60%, 65%, 70%, 75%, 80%, 85%, 90%, 95%, or 100%, under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm under a humidity of at least 0%, 10%, 20%, 30%, 40%, 50%, 55%, 60%, 65%, 70%, 75%, 80%, 85%, 90%, 95%, or 100%, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$, and under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits an increase of the full width half maximum of at least one emission peak of less than 60 nm, 55 nm, 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., under light illumination with a photon flux or average peak pulse power of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm under a humidity of at least 0%, 10%, 20%, 30%, 40%, 50%, 55%, 60%, 65%, 70%, 75%, 80%, 85%, 90%, 95%, or 100%, under light illumination with a photon flux or average peak pulse power of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$.

In one embodiment, the optoelectronic device exhibits an increase of the full width half maximum of at least one emission peak of less than 90%, 80%, 70%, 60%, 50%, 40%, 30%, 25%, 20%, 15%, 10%, 5%, or 0% under a humidity of at least 0%, 10%, 20%, 30%, 40%, 50%, 55%, 60%, 65%, 70%, 75%, 80%, 85%, 90%, 95%, or 100%, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm under light illumination with a photon flux or average peak pulse power of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 kW·cm$^{-2}$, or 100 kW·cm$^{-2}$, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. and under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$ and under a humidity of at least 0%, 10%, 20%, 30%, 40%, 50%, 55%, 60%, 65%, 70%, 75%, 80%, 85%, 90%, 95%, or 100%.

Another object of the invention relates to an optoelectronic device comprising at least one ink comprising at least one particle 2 comprising a plurality of nanoparticles 3 encapsulated in a material 21; and at least one liquid vehicle; wherein said particle 2 has a surface roughness less or equal to 5% of the largest dimension of said particle 2.

According to one embodiment, the optoelectronic device is as described hereabove.

According to one embodiment, the particle 2 is as described hereabove.

According to one embodiment, the nanoparticles 3 are as described hereabove.

According to one embodiment, the material 21 is the second material 21 as described hereabove.

According to one embodiment, the liquid vehicle is as described hereabove.

According to one embodiment, the ink is as described hereabove.

According to one embodiment, the optoelectronic device further comprises a light emitting material as described hereabove.

According to one embodiment, the optoelectronic device further comprises a pattern as described hereabove.

Another object of the invention relates to an optoelectronic device comprising at least one ink comprising at least one phosphor nanoparticle; and at least one liquid vehicle; wherein the phosphor nanoparticle has a size ranging from 0.1 μm to 50 μm.

According to one embodiment, the pattern is as described hereabove.

According to one embodiment, the at least one phosphor nanoparticle is as described hereabove.

According to one embodiment, the ink is as described hereabove.

According to one embodiment, the liquid vehicle is as described hereabove.

According to one embodiment, the optoelectronic device further comprises a light emitting material as described hereabove.

According to one embodiment, the optoelectronic device further comprises a pattern as described hereabove.

Another object of the invention relates to an optoelectronic device comprising at least one ink comprising at least one particle 1 comprising a first material 11 and at least one liquid vehicle; wherein the particle 1 comprises at least one particle 2 comprising a second material 21 and at least one nanoparticle 3 dispersed in said second material 21; and wherein said particle 1 has a surface roughness less or equal to 5% of the largest dimension of said particle 1.

According to one embodiment, the particle 1 is as described hereabove.

According to one embodiment, the particle 2 is as described hereabove.

According to one embodiment, the nanoparticles 3 are as described hereabove.

According to one embodiment, the first material 11 and/or the second material 21 are as described hereabove.

According to one embodiment, the liquid vehicle is as described hereabove.

According to one embodiment, the ink is as described hereabove.

According to one embodiment, the optoelectronic device further comprises a light emitting material as described hereabove.

According to one embodiment, the optoelectronic device further comprises a pattern as described hereabove.

Another object of the invention relates to a method for depositing an ink on a support.

Said ink comprising:

i. at least one particle 1 comprising a first material 11 and at least one liquid vehicle; wherein the particle 1 comprises at least one particle 2 comprising a second material 21 and at least one nanoparticle 3 dispersed in said second material 21; and wherein the first material 11 and the second material 21 have an extinction coefficient less or equal to $15\times10^{0.5}$ at 460 nm; or ii. at least one particle 2 comprising a plurality of nanoparticles 3 encapsulated in a material 21; and at least one liquid vehicle; wherein said particle 2 has a surface roughness less or equal to 5% of the largest dimension of said particle 2; or iii. at least one phosphor nanoparticle; and at least one liquid vehicle; wherein the phosphor nanoparticle has a size ranging from 0.1 am to 50 am; or iv. at least one particle 1 comprising a first material 11 and at least one liquid vehicle; wherein the particle 1 comprises at least one particle 2 comprising a second material 21 and at least one nanoparticle 3 dispersed in said second material 21; and wherein said particle 1 has a surface roughness less or equal to 5% of the largest dimension of said particle 1.

According to one embodiment, the method comprises:

printing the ink on a support using inkjet printing; and evaporating the solvent and/or the liquid vehicle.

According to one embodiment, the evaporating step can be performed by heating, by using an inert gas stream, simply by evaporation over a period of time under air, under controlled atmosphere or under vacuum, or by any means known by those skilled in the art.

According to one embodiment, the method comprises:

ejecting a predetermined amount of droplets of ink from a printing nozzle of a printhead, said droplets being ejected in the direction of a support;

removing the liquid vehicle from the ink; and optionally further heating of the substantially dry ink in the printhead, causing the ink to leave the printhead by a process of sublimation and/or melting and evaporation.

According to one embodiment, the removing step can be performed by the application of heat from a heater in thermal communication with the printhead containing or retaining the ink.

According to one embodiment, the droplets can be formed using gravity, pressure, mechanical pushing of the ink, electrically stimulated droplet ejection or electrohydrodynamic ejection, or any means for forming droplets known in the art.

According to one embodiment, the droplets can be formed by pushing, i.e., a high pressure build-up is created within ink so that the ink is pushed out of the printing nozzle.

According to one embodiment, the droplets can be formed by pulling with an electrically stimulated droplet ejection known also as electrohydrodynamic ejection, i.e., localised pressure build-up is created outside of the ink thanks to the application of an electrical field so that the ink is pulled from the nozzle. This embodiment is particularly advantageous as droplets formed this way are more than 100 times smaller than droplets formed using gravity or mechanical pushing, and enable sub-100 nm printing. The continued downward acceleration overturns air drag even for ultra-small droplet and the placement precision is more than 100 times higher.

Electrohydrodynamic ejection allows applicability with a very wide range of liquids with a single print head. Additionally, it is possible to adjust ejection flow rate (i.e., ejection frequency) by many orders of magnitude, with the same ink and the same print head.

According to one embodiment, the optional heating step is particularly performed with a printhead presenting pores as to prevent the clogging of said pores.

According to one embodiment, the method further comprises a curing step.

According to one embodiment, the method further comprises successive printing steps. In this embodiment, a plurality of inks can be printed on a same or on a plurality of supports.

According to one embodiment, the method comprises depositing a red emitting ink on a support using a first printing nozzle, depositing a green emitting ink on a support using a second printing nozzle and depositing a blue emitting ink on a support using a third printing nozzle. The support is as described hereabove.

According to one embodiment, a plurality of inks can be inkjet printed onto a plurality of supports simultaneously, or in rapid succession, with or without a controlled delay between successive printing steps. In this embodiment, a substrate tray that holds the substrates in place and that moves with respect to the inkjet printhead during the printing steps can be used.

According to one embodiment, the printhead is an inkjet printhead.

According to one embodiment, the printhead is an inkjet thermal or piezoelectric printhead.

According to one embodiment, during movement of the printhead over the support, the ink, without liquid vehicle, can be deposited on the support in a desired pattern, avoiding the dangers a liquid vehicle or solvent might pose to already-deposited layers on the support.

According to one embodiment, the printing nozzle has a size of at least 1 μm, 1.5 μm, 2.5 μm, 3 μm, 3.5 μm, 4 μm, 4.1 μm, 4.2 μm, 4.3 μm, 4.4 μm, 4.5 μm, 4.6 μm, 4.7 μm, 4.8 μm, 4.9 μm, 5 tam, 5.1 μm, 5.2 μm, 5.3 μm, 5.4 μm, 5.5 μm, 5.5 μm, 5.6 μm, 5.7 μm, 5.8 μm, 5.9 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.1 mm, 1.2 mm, 1.3 mm, 1.4 mm, 1.5 mm, 1.6 mm, 1.7 mm, 1.8 mm, 1.9 mm, or 2 mm.

According to one embodiment, the printing nozzle has a size superior or equal to the size of the particles comprised in the ink.

According to one embodiment, the method is a method for forming a hole injecting layer for a light emitting diode, the method comprising:

inkjet printing a droplet of the ink of the invention over an electrode layer on a pixel or in a pixel cell of a light emitting diode; and allowing the volatile components of the ink to evaporate, whereby the hole injecting layer is formed.

According to one embodiment, the inks of the present invention, the particles as described above, the light emitting materials as described above and/or the patterns as described above are used for optoelectronics. In this embodiment, the inks of the present invention, the particles as described above, the light emitting materials as described above and/or the patterns as described above are comprised in an optoelectronic device. Examples of optoelectronic devices include but are not limited to: a display device, a LCD display device, a diode, a light emitting diode (LED), a microLED, an array of LED or microLED, a laser, a transistor, or a supercapacitor or an IR camera or a barcode.

According to one embodiment, the inks of the present invention, the particles as described above, the light emitting materials as described above and/or the patterns as described above are used for the optical calibration of optical instruments such as spectrophotometers.

According to one embodiment, the optoelectronic device is a display device, a LCD display device, a diode, a light emitting diode (LED), a laser, a photodetector, a transistor, a supercapacitor, a barcode, a LED, a microLED, an array of LED, an array of microLED, or an IR camera.

According to one embodiment, the inks of the present invention, the particles as described above, the light emitting materials as described above and/or the patterns as described above are used in lighting applications. In this embodiment, examples of lighting applications include but are not limited to: lighting for farming and/or horticulture applications or installations such as for example greenhouses, or indoor plant growing; specialized lighting such as for example retail lighting such as for example lighting in clothing stores, grocery stores, retail stores, or malls; street lighting; commercial lighting; entertainment lighting such as for example concert lighting, studio TV lighting, movie lighting, stage lighting, club lighting, photography lighting, or architecture lighting; airfield lighting; healthcare lighting such as for example lighting in hospitals, clinics, or medical offices; hospitality lighting such as for example lighting in hotels and resorts, casinos, restaurants, bars and nightclubs, convention centers, spas and wellness centers; industrial lighting such as for example lighting in warehouses, manufacturing, distribution centers, transportation, parking facilities, or public utilities; medical and examination lighting; sport lighting such as for example lighting in sports Facilities, theme parks, museums, parks, art installations, theaters, or entertainment complexes; or eco-friendly lighting. the inks of the present invention, the particles as described above, the light emitting materials as described above and/or the patterns as described above can improve the appeal and/or the preservation of the items sold in stores when used in the lighting installations of said stores.

According to one embodiment, the inks of the present invention, the particles as described above, the light emitting materials as described above and/or the patterns as described above are used in Quantum Dot Enhanced Films (QDEF) to replace regular quantum dots. In particular, a particle 1 comprising quantum dots, semiconductor nanoplatelets, or a mixture of at least one quantum dot and at least one semiconductor nanoplatelet is used in QDEF.

According to one embodiment, the inks of the present invention, the particles as described above, the light emitting materials as described above and/or the patterns as described above are used on chip: on microLEDs, LEDs, an array of microLEDs, or an array of LEDs. In particular, a particle 1 comprising quantum dots emitting red light, semiconductor nanoplatelets emitting red light, or a mixture of at least one quantum dot and at least one semiconductor nanoplatelet emitting red light is used on chip.

According to one embodiment, the inks of the present invention, the particles as described above, the light emitting materials as described above and/or the patterns as described above are used in a color filter, or as a color filter.

According to one embodiment, the inks of the present invention, the particles as described above, the light emitting materials as described above and/or the patterns as described above are used in microLED, LED, or large LED videowalls.

According to one embodiment, the inks of the present invention, the particles as described above, the light emitting materials as described above and/or the patterns as described above are used inside individual subpixels within a pixel array being charged by electrical current to create refined patterns and colors.

According to one embodiment, the inks of the present invention, the particles as described above, the light emitting materials as described above and/or the patterns as described above are used for videoprojection, i.e., it is used in videoprojection devices.

According to one embodiment, the inks of the present invention, the particles as described above, the light emitting materials as described above and/or the patterns as described above are used in a display apparatus comprising at least one light source and a rotating wheel, wherein said at least one light source is configured to provide an illumination and/or an excitation for the inks of the present invention, the particles as described above, the light emitting materials as described above and/or the patterns as described above. The light of the light source meets the rotating wheel comprising the inks of the present invention, the particles as described above, the light emitting materials as described above and/or the patterns as described above. the rotating wheel comprises several zones including at least one zone comprising the inks of the present invention, the particles as described above, the light emitting materials as described above and/or the patterns as described above or including at least two zones each comprising the inks of the present invention, the particles as described above, the light emitting materials as described above and/or the patterns as described above able to emit secondary lights at different wavelengths. At least one zone may be free of the inks of the present invention, the particles as described above, the light emitting materials as described above and/or the patterns as described above, empty or optically transparent in order to permit the primary light to be transmitted through the rotating wheel without emission of any secondary light.

According to one embodiment, the inks of the present invention, the particles as described above, the light emitting materials as described above and/or the patterns as described above are used for luminescence detection.

According to one embodiment, the inks of the present invention, the particles as described above, the light emitting materials as described above and/or the patterns as described above are used for bioimaging, biotargeting, biosensing, medical imaging, diagnostic, therapy, or theranostics.

According to one embodiment, the inks of the present invention, the particles as described above, the light emitting materials as described above and/or the patterns as described above are used for catalysis.

According to one embodiment, the inks of the present invention, the particles as described above, the light emitting materials as described above and/or the patterns as described above are used in drug delivery.

According to one embodiment, the inks of the present invention, the particles as described above, the light emitting materials as described above and/or the patterns as described above are used in energy storage devices.

According to one embodiment, the inks of the present invention, the particles as described above, the light emitting materials as described above and/or the patterns as described above are used in energy production devices.

According to one embodiment, the inks of the present invention, the particles as described above, the light emitting materials as described above and/or the patterns as described above are used in energy conversion devices.

According to one embodiment, the inks of the present invention, the particles as described above, the light emitting materials as described above and/or the patterns as described above are used in energy transport devices.

According to one embodiment, the inks of the present invention, the particles as described above, the light emitting materials as described above and/or the patterns as described above are used in photovoltaic cells.

According to one embodiment, the inks of the present invention, the particles as described above, the light emitting materials as described above and/or the patterns as described above are used in lighting devices.

According to one embodiment, the inks of the present invention, the particles as described above, the light emitting materials as described above and/or the patterns as described above are used in sensor devices.

According to one embodiment, t the inks of the present invention, the particles as described above, the light emitting materials as described above and/or the patterns as described above are used in pressure sensor devices. In this embodiment, a pressure exerted on said inks of the present invention, the particles as described above, the light emitting materials as described above and/or the patterns as described above (and therefore on the fluorescent nanoparticles) induces a shift in the emission wavelength.

While various embodiments have been described and illustrated, the detailed description is not to be construed as being limited hereto. Various modifications can be made to the embodiments by those skilled in the art without departing from the true spirit and scope of the disclosure as defined by the claims.

EXAMPLES

The present invention is further illustrated by the following examples.

Example 1: Inorganic Nanoparticles Preparation

Nanoparticles used in the examples herein were prepared according to methods of the art (Lhuillier E. et al., Acc. Chem. Res., 2015, 48 (1), pp 22-30; Pedetti S. et al., J. Am. Chem. Soc., 2014, 136 (46), pp 16430-16438; Ithurria S. et al., J. Am. Chem. Soc., 2008, 130, 16504-16505; Nasilowski M. et al., Chem. Rev. 2016, 116, 10934-10982).

Nanoparticles used in the examples herein were selected in the group comprising CdSe/CdZnS, CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots.

Example 2: Particles Preparation from a Basic Aqueous Solution—CdSe/CdZnS@$SiO_2$ 100 μL of CdSe/CdZnS nanoplatelets suspended in a basic aqueous solution were mixed with a basic aqueous solution of TEOS at 0.13M previously hydrolyzed for 24 hours, then loaded on a spray-drying set-up. The liquid mixture was sprayed towards a tube furnace heated at a temperature ranging from the boiling point of the solvent to 1000° C. with a nitrogen flow. The particles were collected at the surface of a filter.

Figure 23A:
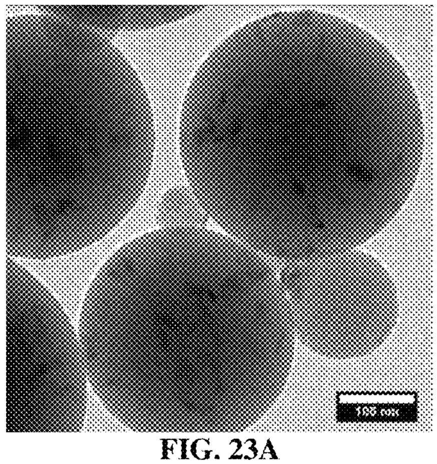
FIG. 23A is TEM images showing CdSe/CdZnS nanoplatelets (dark contrast) uniformly dispersed in $SiO_2$ (bright contrast—@$SiO_2$).
Figure 23B:
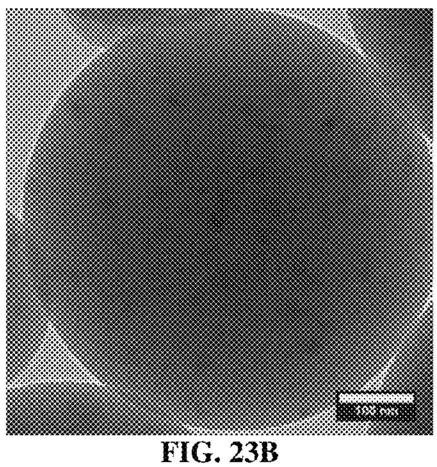
FIG. 23B is TEM images showing CdSe/CdZnS nanoplatelets (dark contrast) uniformly dispersed in $SiO_2$ (bright contrast—@$SiO_2$).
Figure 23C:
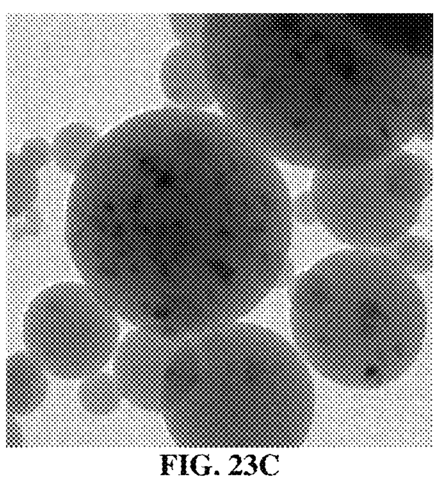
FIG. 23C is TEM images showing CdSe/CdZnS nanoplatelets (dark contrast) uniformly dispersed in $Al_2O_3$ (bright contrast—@$Al_2O_3$).

FIG. 23 A-B show TEM images of the resulting particles.

Figure 24A:
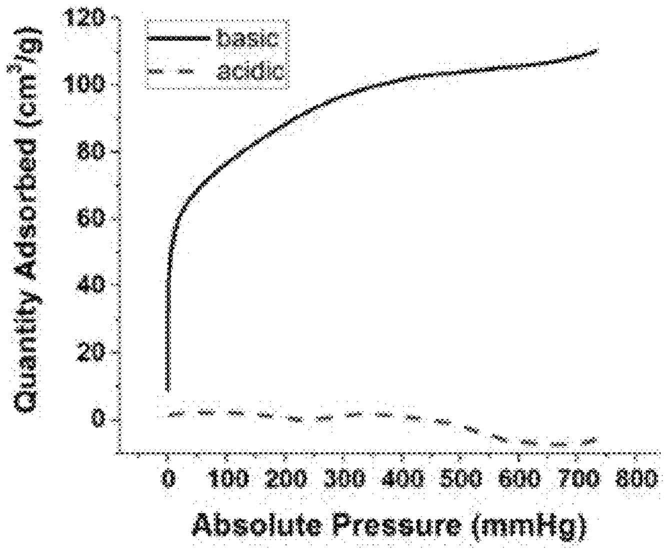
FIG. 24A shows the $N_2$ adsorption isotherm of particles 2 CdSe/CdZnS@$SiO_2$ prepared from a basic aqueous solution and from an acidic solution.
Figure 24B:
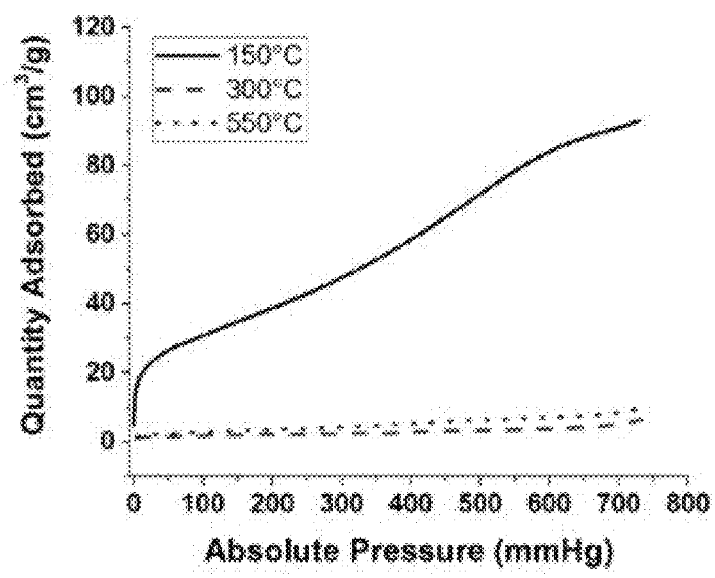
FIG. 24B shows the $N_2$ adsorption isotherm of particles 2 CdSe/CdZnS@$Al_2O_3$ obtained by heating droplets at 150° C., 300° C. and 550° C.
Figure 25:
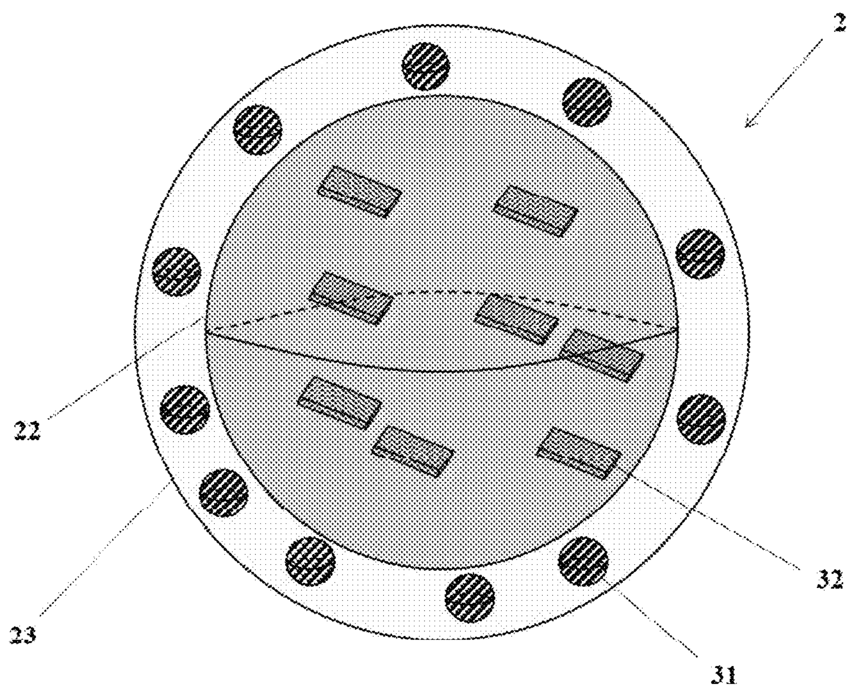
FIG. 25 illustrates a particle 2 comprising a core 22 comprising a plurality of nanoparticles 32 encapsulated in a material, and a shell 23 comprising a plurality of nanoparticles 31 encapsulated in a material.

FIG. 24 A shows the $N_2$ adsorption isotherm of the resulting particles. Said resulting particles are porous.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 3: Particles Preparation from an Acidic Aqueous Solution—CdSe/CdZnS@$SiO_2$ 100 μL of CdSe/CdZnS nanoplatelets suspended in an acidic aqueous solution were mixed with an acidic aqueous solution of TEOS at 0.13M previously hydrolyzed for 24 hours, then loaded on a spray-drying set-up. The liquid mixture was sprayed towards a tube furnace heated at a temperature ranging from the boiling point of the solvent to 1000° C. with a nitrogen flow. The particles were collected at the surface of a filter.

FIG. 24 A shows the $N_2$ adsorption isotherm of the resulting particles. Said resulting particles are not porous.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 4: Particles Preparation from a Basic Aqueous Solution with Hetero-Elements—CdSe/CdZnS@$Si_xCd_yZn_zO_w$ 100 μL of CdSe/CdZnS nanoplatelets suspended in an acidic aqueous solution were mixed with an acidic aqueous solution of TEOS at 0.13M previously hydrolyzed for 24 hours in presence of cadmium acetate at 0.01M and zinc oxide at 0.01M, then loaded on a spray-drying set-up. The liquid mixture was sprayed towards a tube furnace heated at a temperature ranging from the boiling point of the solvent to 1000° C. with a nitrogen flow. The particles were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 5: Particles Preparation from an Organic Solution and an Aqueous Solution—CdSe/CdZnS@$Al_2O_3$ 100 μL of CdSe/CdZnS nanoplatelets suspended in heptane were mixed with aluminium tri-sec butoxide and 5 mL of pentane, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The particles were collected at the surface of a filter.

FIG. 23 C shows TEM images of the resulting particles.

FIG. 24 B show $N_2$ adsorption isotherms for particles obtained after heating the droplets at 150° C., 300° C. and 550° C. Increasing the heating temperature results in a loss of the porosity. Thus particles obtained by heating at 150° C. are porous, whereas the particles obtained by heating at 300° C. and 550° C. are not porous.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ with ZnTe, $SiO_2$, $TiO_2$, $HfO_2$, ZnSe, ZnO, ZnS or MgO, or a mixture thereof. Reaction temperature of the above procedure is adapted according to the inorganic material chosen.

The same procedure was carried out by replacing $Al_2O_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 6: Particles Preparation from an Organic Solution and an Aqueous Solution—InP/ZnS@$Al_2O_3$ 4 mL of InP/ZnS nanoparticles suspended in heptane were mixed with aluminium tri-sec butoxide and 400 mL of heptane, then loaded in a spray-drying set-up. On another side, an acidic aqueous solution was prepared and loaded in the same spray-drying set-up, but at a different location than the first hexane solution. The two liquids were sprayed simultaneously with two different means for forming droplets towards a tube furnace heated at a temperature ranging from the boiling point of the solvent to 1000° C. with a nitrogen flow. The particles were collected at the surface of a filter.

The same procedure was carried out by replacing InP/ZnS nanoparticles with CdSe, CdS, CdTe, CdSe/CdS, CdSe/ZnS, CdSe/CdZnS, CdS/ZnS, CdS/CdZnS, CdTe/ZnS, CdTe/CdZnS, CdSe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ with $SiO_2$, $TiO_2$, $HfO_2$, ZnTe, ZnSe, ZnO, ZnS or MgO, or a mixture thereof. Reaction temperature of the above procedure is adapted according to the inorganic material chosen.

The same procedure was carried out by replacing $Al_2O_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 7: Particles Preparation from an Organic Solution and an Aqueous Solution—$CH_5N_2$—$PbBr_3$@$Al_2O_3$ 100 μL of $CH_5N_2$—$PbBr_3$ nanoparticles suspended in hexane were mixed with aluminium tri-sec butoxide and 5 mL of hexane, then loaded in a spray-drying set-up. On another side, an acidic aqueous solution was prepared and loaded in the same spray-drying set-up, but at a different location than the first hexane solution. The two liquids were sprayed simultaneously with two different means for forming droplets towards a tube furnace heated at a temperature ranging from the boiling point of the solvent to 1000° C. with a nitrogen flow. The particles were collected at the surface of a filter.

The same procedure was carried out by replacing $Al_2O_3$ with $SiO_2$, $TiO_2$, $HfO_2$, ZnTe, ZnSe, ZnO, ZnS or MgO, or a mixture thereof. Reaction temperature of the above procedure is adapted according to the inorganic material chosen.

The same procedure was carried out by replacing $Al_2O_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 8: Particles Preparation from an Organic Solution and an Aqueous Solution—CdSe/CdZnS—Au@$SiO_2$ On one side, 100 μL of gold nanoparticles and 100 μL of CdSe/CdZnS nanoplatelets suspended in an acidic aqueous solution were mixed with an acidic aqueous solution of TEOS at 0.13M previously hydrolyzed for 24 hours, then loaded in a spray-drying set-up. The suspension was sprayed towards a tube furnace heated at a temperature ranging from the boiling point of the solvent to 1000° C. with a nitrogen flow. The particles were collected at the surface of a GaN substrate. The GaN substrate with the deposited particles was then cut into pieces of 1 mm×1 mm and electrically connected to get a LED emitting a mixture of the blue light and the light emitted by the fluorescent nanoparticles.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $SiO_2$ with $Al_2O_3$, $TiO_2$, $HfO_2$, ZnTe, ZnSe, ZnO, ZnS or MgO, or a mixture thereof. Reaction temperature of the above procedure is adapted according to the inorganic material chosen.

The same procedure was carried out by replacing $SiO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 9: Particles Preparation from an Organic Solution and an Aqueous Solution—$Fe_3O_4$@$Al_2O_3$—CdSe/CdZnS@$SiO_2$ On one side, 100 μL of $Fe_3O_4$ nanoparticles suspended in an acidic aqueous solution were mixed with an acidic aqueous solution of TEOS at 0.13M previously hydrolyzed for 24 hours. On another side, 100 μL of CdSe/CdZnS nanoplatelets suspended in heptane were mixed with aluminium tri-sec butoxide and 5 mL of heptane, then loaded on the same spray-drying set-up, but at a different location than the first aqueous solution. The two liquids were sprayed simultaneously with two different means for forming droplets towards a tube furnace heated at a temperature ranging from the boiling point of the solvent to 1000° C. with a nitrogen flow. The particles were collected at the surface of a filter. The particles comprise a core of silica containing $Fe_3O_4$ nanoparticles and a shell of alumina containing CdSe/CdZnS nanoplatelets.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $SiO_2$ with $TiO_2$, $SiO_2$, $Al_2O_3$, $HfO_2$, ZnTe, ZnSe, ZnO, ZnS or MgO, or a mixture thereof. Reaction temperature of the above procedure is adapted according to the inorganic material chosen.

The same procedure was carried out by replacing $Al_2O_3$ and/or $SiO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 10: Particles Preparation from an Organic Solution and an Aqueous Solution—CdS/ZnS Nanoplatelets@$Al_2O_3$ 4 mL of CdS/ZnS nanoplatelets suspended in heptane were mixed with aluminium tri-sec butoxide and 400 mL of heptane, then loaded in a spray-drying set-up. On another side, an acidic aqueous solution was prepared and loaded in the same spray-drying set-up, but at a different location than the first hexane solution. The two liquids were sprayed simultaneously with two different means for forming droplets towards a tube furnace heated at a temperature ranging from the boiling point of the solvent to 1000° C. with a nitrogen flow. The particles were collected at the surface of a filter.

The same procedure was carried out by replacing CdS/ZnS nanoplatelets with CdSe, CdS, CdTe, CdSe/CdS, CdSe/ZnS, CdSe/CdZnS, CdS/CdZnS, CdTe/ZnS, CdSe/CdZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ with $SiO_2$, $TiO_2$, $HfO_2$, ZnTe, ZnSe, ZnO, ZnS or MgO, or a mixture thereof. Reaction temperature of the above procedure is adapted according to the inorganic material chosen.

The same procedure was carried out by replacing $Al_2O_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 11: Particles Preparation from an Organic Solution and an Aqueous Solution—InP/ZnS@$SiO_2$ 4 mL of InP/ZnS nanoparticles suspended in an acidic aqueous solution were mixed with an acidic aqueous solution of TEOS at 0.13M previously hydrolyzed for 24 hours, then loaded in a spray-drying set-up. The suspension was sprayed for forming droplets towards a tube furnace heated a temperature ranging from the boiling point of the solvent to 1000° C. with a nitrogen flow. The particles were collected at the surface of a filter.

The same procedure was carried out by replacing InP/ZnS nanoparticles with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, CdSe/CdZnS, InP/CdS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $SiO_2$ with $TiO_2$, $Al_2O_3$, $HfO_2$, ZnTe, ZnSe, ZnO, ZnS or MgO, or a mixture thereof. Reaction temperature of the above procedure is adapted according to the inorganic material chosen.

The same procedure was carried out by replacing $SiO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 12: Particles Preparation from an Organic Solution and an Aqueous Solution, Followed by a Treatment of Ammonia Vapors—CdSe/CdZnS@ZnO 100 μL of CdSe/CdZnS nanoplatelets suspended in heptane were mixed with zinc methoxyethoxide and 5 mL of pentane, then loaded on a spray-drying set-up as described in the invention. On another side, a basic aqueous solution was prepared and loaded on the same spray-drying set-up, but at a different location than the first heptane solution. On another side, an ammonium hydroxide solution was loaded on the same spray-drying system, between the tube furnace and the filter. The two first liquids were sprayed while the third one was heated at 35° C. by an external heating system to produce ammonia vapors, simultaneously towards a tube furnace heated at a temperature ranging from the boiling point of the solvent to 1000° C. with a nitrogen flow. The particles were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing ZnO with $TiO_2$, $SiO_2$, $HfO_2$, $Al_2O_3$, ZnTe, ZnSe, ZnS or MgO, or a mixture thereof. Reaction temperature of the above procedure is adapted according to the inorganic material chosen.

The same procedure was carried out by replacing ZnO with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 13: Particles Preparation from an Organic Solution and an Aqueous Solution, Followed by an Extra Shell Coating—CdSe/CdZnS@$Al_2O_3$@MgO 100 μL of CdSe/CdZnS nanoplatelets suspended in heptane were mixed with zinc methoxyethoxide and 5 mL of pentane, then loaded on a spray-drying set-up as described in the invention. On another side, a basic aqueous solution was prepared and loaded on the same spray-drying set-up, but at a different location than the first heptane solution. The two liquids were sprayed simultaneously towards a tube furnace heated at a temperature ranging from the boiling point of the solvent to 1000° C. with a nitrogen flow. The particles were directed towards a tube where an extra MgO shell was coated at the surface of the particles by an ALD process, said particles being suspended in the gas. The particles were finally collected on the inner wall of the tube where the ALD was performed.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 14: Particles Preparation from an Organic Solution and an Aqueous Solution—CdSe/CdZnS—$Fe_3O_4$@$SiO_2$ On one side, 100 μL of $Fe_3O_4$ nanoparticles and 100 μL of CdSe/CdZnS nanoplatelets suspended in an acidic aqueous solution were mixed with an acidic aqueous solution of TEOS at 0.13M previously hydrolyzed for 24 hours, then loaded in a spray-drying set-up as described in the invention. On another side, an acidic aqueous solution was prepared and loaded on the same spray-drying set-up, but at a different location than the first heptane solution. The two liquids were sprayed simultaneously towards a tube furnace heated at a temperature ranging from the boiling point of the solvent to 1000° C. with a nitrogen flow. The particles were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 15: Core/Shell Particles Preparation from an Organic Solution and an Aqueous Solution—Au@$Al_2O_3$ in the Core and CdSe/CdZnS@$SiO_2$ in the Shell On one side, 100 μL of CdSe/CdZnS nanoplatelets suspended in an acidic aqueous solution were mixed with an acidic aqueous solution of TEOS at 0.13M previously hydrolyzed for 24 hours, then loaded on a spray-drying set-up as described in the invention. On another side, 100 μL of Au nanoparticles suspended in heptane were mixed with aluminium tri-sec butoxide and 5 mL of heptane, then loaded on the same spray-drying set-up, but at a different location than the first aqueous solution. The two liquids were sprayed simultaneously towards a tube furnace heated at a temperature ranging from the boiling point of the solvent to 1000° C. with a nitrogen flow. The particles were collected at the surface of a filter. The particles comprise a core of alumina containing gold nanoparticles and a shell of silica containing CdSe/CdZnS nanoplatelets.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/

ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 16: Particles Preparation—Phosphor Nanoparticles@$SiO_2$

Phosphor nanoparticles were suspended in a basic aqueous solution were mixed with a basic aqueous solution of TEOS at 0.13M previously hydrolyzed for 24 hours, then loaded on a spray-drying set-up. The liquid mixture was sprayed towards a tube furnace heated at a temperature ranging from the boiling point of the solvent to 1000° C. with a nitrogen flow. The particles were collected at the surface of a filter.

Phosphor nanoparticles used for this example were: Yttrium aluminium garnet nanoparticles (YAG, $Y_3Al_5O_{12}$), (Ca,Y)-α-SiAlON:Eu nanoparticles, $((Y,Gd)_3(Al,Ga)_5O_{12}$:Ce) nanoparticles, $CaAlSiN_3$:Eu nanoparticles, sulfide-based phosphor nanoparticles, PFS:$Mn^{4+}$ nanoparticles (potassium fluorosilicate).

Example 17: Particles Preparation—Phosphor Nanoparticles@$Al_2O_3$

Phosphor nanoparticles were suspended in heptane were mixed with aluminium tri-sec butoxide and 400 mL of heptane, then loaded in a spray-drying set-up. On another side, an acidic aqueous solution was prepared and loaded in the same spray-drying set-up, but at a different location than the first hexane solution. The two liquids were sprayed simultaneously with two different means for forming droplets towards a tube furnace heated at a temperature ranging from the boiling point of the solvent to 1000° C. with a nitrogen flow. The particles were collected at the surface of a filter.

Phosphor nanoparticles used for this example were: Yttrium aluminium garnet nanoparticles (YAG, $Y_3Al_5O_{12}$), (Ca,Y)-α-SiAlON:Eu nanoparticles, $((Y,Gd)_3(Al,Ga)_5O_{12}$:Ce) nanoparticles, $CaAlSiN_3$:Eu nanoparticles, sulfide-based phosphor nanoparticles, PFS:$Mn^{4+}$ nanoparticles (potassium fluorosilicate).

Example 18: Particles Preparation—CdSe/CdZnS@$HfO_2$

100 μL of CdSe/CdZnS nanoplatelets suspended in heptane (10 mg/mL) were mixed with Hafnium n-butoxide and 5 mL of pentane, then loaded on a spray-drying set-up. On another side, a basic aqueous solution was prepared and loaded on the same spray-drying set-up, but at a different location than the first heptane solution. The two liquids were sprayed simultaneously towards a tube furnace heated at a temperature ranging from the boiling point of the solvent to 1000° C. with a nitrogen flow. Particles were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 19: Particles Preparation—Phosphor Nanoparticles@$HfO_2$

1 μm of phosphor nanoparticles (cf. list below) suspended in heptane (10 mg/mL) were mixed with hafnium n-butoxide and 5 mL of pentane, then loaded on a spray-drying set-up. On another side, an aqueous solution was prepared and loaded on the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles phosphors particles@$HfO_2$ were collected at the surface of a filter.

Phosphor nanoparticles used for this example were: Yttrium aluminium garnet nanoparticles (YAG, $Y_3Al_5O_{12}$), (Ca,Y)-α-SiAlON:Eu nanoparticles, ($(Y,Gd)_3(Al,Ga)_5O_{12}$:Ce) nanoparticles, $CaAlSiN_3$:Eu nanoparticles, sulfide-based phosphor nanoparticles, PFS:$Mn^{4+}$ nanoparticles (potassium fluorosilicate).

Example 20: Particles Preparation from an Organometallic Precursor

100 μL of CdSe/CdZnS nanoplatelets suspended in heptane were mixed with an organometallic precursor selected in the group below in pentane under controlled atmosphere, then loaded on a spray-drying set-up. On another side, an aqueous solution was prepared and loaded on the same spray-drying set-up, but at a different location than the first heptane solution. The two liquids were sprayed simultaneously towards a tube furnace heated from room temperature to 300° C. with a nitrogen flow. The particles were collected at the surface of a filter.

The procedure was carried out with an organometallic precursor selected in the group comprising: $Al[N(SiMe_3)_2]_3$, trimethyl aluminium, triisobutylaluminum, trioctylaluminum, triphenylaluminum, dimethyl aluminium, trimethyl zinc, dimethyl zinc, diethylzinc, $Zn[(N(TMS)_2]_2$, $Zn[(CF_3SO_2)_2N]_2$, $Zn(Ph)_2$, $Zn(C_6F_5)_2$, $Zn(TMHD)_2$ (β-diketonate), $Hf[C_5H_4(CH_3)]_2(CH_3)_2$, $HfCH_3(OCH_3)[C_5H_4(CH_3)]_2$, $[[(CH_3)_3Si]_2N]_2HfCl_2$, $(C_5H_5)_2Hf(CH_3)_2$, $[(CH_2CH_3)_2N]_4Hf$, $[(CH_3)_2N]_4Hf$, $[(CH_3)_2N]_4Hf$, $[(CH_3)(C_2H_5)N]_4Hf$, $[(CH_3)(C_2H_5)N]_4Hf$, 2,2',6,6'-tetramethyl-3,5-heptanedione zirconium ($Zr(THD)_4$), $C_{10}H_{12}Zr$, $Zr(CH_3C_5H_4)_2CH_3OCH_3$, $C_{22}H_{36}Zr$, $[(C_2H_5)_2N]_4Zr$, $[(CH_3)_2N]_4Zr$, $[(CH_3)_2N]_4Zr$, $Zr(NCH_3C_2H_5)_4$, $Zr(NCH_3C_2H_5)_4$, $C_{18}H_{32}O_6Zr$, $Zr(C_5H_{15}O_2)_4$, $Zr(OCC(CH_3)_3CHCOC(CH_3)_3)_4$, $Mg(C_5H_5)_2$, or $C_{20}H_{30}Mg$, or a mixture thereof. Reaction temperature of the above procedure is adapted according to the organometallic precursor chosen.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ with $TiO_2$, ZnO, MgO, $HfO_2$ or $ZrO_2$. The same procedure was carried out by replacing $Al_2O_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

The same procedure was carried out by replacing the aqueous solution with another liquid or vapor source of oxidation.

Example 21: Particles Preparation from an Organometallic Precursor—CdSe/CdZnS@ZnTe 100 μL of CdSe/CdZnS nanoplatelets suspended in heptane were mixed with two organometallic precursors selected in the group below in pentane under inert atmosphere then loaded on a spray-drying set-up. The suspension was sprayed towards a tube furnace heated from RT to 300° C. with a nitrogen flow. The particles were collected at the surface of a filter.

The procedure was carried out by with a first organometallic precursor selected in the group comprising: dimethyl telluride, diethyl telluride, diisopropyl telluride, di-t-butyl telluride, diallyl telluride, methyl allyl telluride, dimethyl selenide, or dimethyl sulfur, or a mixture thereof.

Reaction temperature of the above procedure is adapted according to the organometallic precursor chosen.

The procedure was carried out by with a second organometallic precursor selected in the group comprising: dimethyl zinc, trimethyl zinc, diethylzinc, $Zn[(N(TMS)_2]_2$, $Zn[(CF_3SO_2)_2N]_2$, $Zn(Ph)_2$, $Zn(C_6F_5)_2$, or $Zn(TMHD)_2$ (β-diketonate), or a mixture thereof. Reaction temperature of the above procedure is adapted according to the organometallic precursor chosen.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing ZnTe with ZnS or ZnSe, or a mixture thereof.

The same procedure was carried out by replacing ZnTe with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

Example 22: Particles Preparation from an Organometallic Precursor—CdSe/CdZnS @ZnS 100 μL of CdSe/CdZnS nanoplatelets suspended in heptane were mixed with an organometallic precursor selected in the group below in pentane under inert atmosphere, then loaded on a spray-drying set-up. On another side, a vapor source of $H_2S$ was inserted in the same spray-drying set-up. The suspension was sprayed towards a tube furnace heated from RT to 300° C. with a nitrogen flow. The particles were collected at the surface of a filter.

The procedure was carried out with an organometallic precursor selected in the group comprising: dimethyl zinc, trimethyl zinc, diethylzinc, $Zn[(N(TMS)_2]_2$, $Zn[(CF_3SO_2)_2N]_2$, $Zn(Ph)_2$, $Zn(C_6F_5)_2$, $Zn(TMHD)_2$ (β-diketonate), or a mixture thereof. Reaction temperature of the above procedure is adapted according to the organometallic precursor chosen.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing ZnS with ZnSe or ZnTe, or a mixture thereof.

The same procedure was carried out by replacing ZnS with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

The same procedure was carried out by replacing $H_2S$ with $H_2Se$, $H_2Te$ or other gas.

Example 23: InP/GaP/ZnSe/ZnS@$Al_2O_3$@$HfO_2$

1st Step

100 μL of InP/GaP/ZnSe/ZnS nanocrystals suspended in heptane (10 mg/mL) were mixed with aluminium tri-sec butoxide and 5 mL of pentane, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles InP/GaP/ZnSe/ZnS@$Al_2O_3$ were collected at the surface of a filter.

2nd Step 5 mg of InP/GaP/ZnSe/ZnS@$Al_2O_3$ particles were suspended in 5 mL of pentane and mixed with hafnium n-butoxide, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles InP/GaP/ZnSe/ZnS@$Al_2O_3$@$HfO_2$ were collected at the surface of a filter.

The same procedure was carried out by replacing InP/GaP/ZnSe/ZnS nanocrystals with CdSe/CdZnS, CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/

CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing InP/GaP/ZnSe/ZnS nanocrystals with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $HfO_2$ with $TiO_2$, ZnTe, $Al_2O_3$, $SiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 24: InP/ZnS/ZnSe/ZnS@$Al_2O_3$@$HfO_2$

1st Step

100 µL of InP/ZnS/ZnSe/ZnS nanocrystals suspended in heptane (10 mg/mL) were mixed with aluminium tri-sec butoxide and 5 mL of pentane, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles InP/ZnS/ZnSe/ZnS@$Al_2O_3$ were collected at the surface of a filter.

2nd Step 5 mg of InP/ZnS/ZnSe/ZnS @$Al_2O_3$ particles were suspended in 5 mL of pentane and mixed with hafnium n-butoxide, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles InP/ZnS/ZnSe/ZnS@$Al_2O_3$@$HfO_2$ were collected at the surface of a filter.

The same procedure was carried out by replacing InP/ZnS/ZnSe/ZnS nanocrystals with CdSe, CdS, CdTe, CdSe/CdS, CdSe/ZnS, CdSe/CdZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing InP/ZnS/ZnSe/ZnS nanocrystals with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $HfO_2$ with $TiO_2$, ZnTe, $Al_2O_3$, $SiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 25: CdSe/CdZnS@$HfO_2$@$Si_{0.8}Hf_{0.2}O_2$

1st Step

100 µL of CdSe/CdZnS nanoplatelets suspended in heptane (10 mg/mL) were mixed with hafnium n-butoxide and 5 mL of pentane, then loaded on a spray-drying set-up. On another side, an aqueous solution was prepared and loaded the same spray-drying set-up, but at a different location than the first pentane solution. The two liquids were sprayed simultaneously towards a tube furnace heated at a temperature ranging from the boiling point of the solvent to 1000° C. with a nitrogen flow. The resulting particles CdSe/CdZnS@$HfO_2$ were collected at the surface of a filter.

2nd Step 50 mg of CdSe/CdZnS@$HfO_2$ particles were suspended in 20 mL of ethanol and mixed with TEOS, hafnium oxychloride and water, then loaded on a spray-drying set-up. The liquid was sprayed towards a tube furnace heated at a temperature ranging from the boiling point of the solvent to 1000° C. with a nitrogen flow. The luminescent particles CdSe/CdZnS@$HfO_2$@$SiHfO_2$ were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $SiHfO_2$ and/or $HfO_2$ with ZnTe, $Al_2O_3$, $SiO_2$, $HfO_2$, ZnSe, $TiO_2$, ZnO, ZnS, $SiZrO_2$, $SiHfO_2$ or MgO, or a mixture thereof. Reaction temperature of the above procedure is adapted according to the inorganic material chosen.

The same procedure was carried out by replacing $SiHfO_2$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 26: $CdSe/CdZnS@HfO_2@Si_{0.8}Zr_{0.2}O_2$

1st Step

100 μL of CdSe/CdZnS nanoplatelets suspended in heptane (10 mg/mL) were mixed with hafnium n-butoxide and 5 mL of pentane, then loaded on a spray-drying set-up. On another side, an aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles $CdSe/CdZnS@HfO_2$ were collected at the surface of a filter.

2nd Step 50 mg of $CdSe/CdZnS@HfO_2$ particles were suspended in 20 mL of ethanol and mixed with TEOS, zirconium oxychloride and water, then loaded on a spray-drying set-up. The liquid was sprayed towards a tube furnace heated at a temperature ranging from the boiling point of the solvent to a temperature ranging from the boiling point of the solvent to 1000° C. with a nitrogen flow. The luminescent particles $CdSe/CdZnS @HfO_2@SiZrO_2$ were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $SiZrO_2$ and/or $HfO_2$ with ZnTe, $Al_2O_3$, $SiO_2$, $HfO_2$, ZnSe, $TiO_2$, ZnO, ZnS, $SiZrO_2$, $SiHfO_2$ or MgO, or a mixture thereof. Reaction temperature of the above procedure is adapted according to the inorganic material chosen.

The same procedure was carried out by replacing $SiZrO_2$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 27: $CdSe/CdZnS@Al_2O_3@HfO_2$

1st Step

100 μL of CdSe/CdZnS nanoplatelets suspended in heptane (10 mg/mL) were mixed with aluminium tri-sec butoxide and 5 mL of pentane, then loaded on a spray-drying set-up. On another side, an aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles $CdSe/CdZnS@Al_2O_3$ (particles 2) were collected at the surface of a filter.

2nd Step 5 mg of $CdSe/CdZnS@Al_2O_3$ particles were suspended in 5 mL of pentane and mixed with hafnium n-butoxide, then loaded on a spray-drying set-up. On another side, an aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles $CdSe/CdZnS@Al_2O_3@HfO_2$ were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $HfO_2$ with ZnTe, $TiO_2$, $Al_2O_3$, $SiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 28: CdSe/CdZnS@$Al_2O_3$ and $SnO_2$ Particles Encapsulated in $Al_2O_3$ 5 mg of a previously prepared CdSe/CdZnS@$Al_2O_3$ particles (size: 150 nm) were suspended in 5 mL of pentane along with larger particles ($SnO_2$, 2 μm) and mixed with aluminium tri-sec butoxide, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles, CdSe/CdZnS@$Al_2O_3$ and $SnO_2$ particles encapsulated in $Al_2O_3$, were collected at the surface of a filter.

Note: the amount of aluminium tri-sec butoxide is calculated so that the amount of $Al_2O_3$ formed would form a layer around the $SnO_2$ particle so that it is thicker than the solid diameter.

The same procedure was carried out by replacing CdSe/CdZnS nanoplatelets and/or $SnO_2$ particles with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets and/or $SnO_2$ particles with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ with ZnTe, $Al_2O_3$, $TiO_2$, $SiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 29: Phosphor Particles@$Al_2O_3$@$HfO_2$

1st Step

1 μm of phosphor particles (cf. list below) suspended in heptane (10 mg/mL) were mixed with aluminium tri-sec butoxide and 5 mL of pentane, then loaded on a spray-drying set-up. On another side, an aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles phosphors particles@$Al_2O_3$ were collected at the surface of a filter.

2nd Step 5 mg of phosphors particles@$Al_2O_3$ were suspended in 5 mL of pentane and mixed with hafnium n-butoxide, then loaded on a spray-drying set-up. On another side, an aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles phosphor particles@$Al_2O_3$@$HfO_2$ were collected at the surface of a filter.

Phosphor particles used for this example were: Yttrium aluminium garnet particles (YAG, $Y_3Al_5O_{12}$), (Ca,Y)-α-SiAlON:Eu particles, ($(Y,Gd)_3(Al,Ga)_5O_{12}$:Ce) particles, $CaAlSiN_3$:Eu particles, sulfide-based phosphor particles, PFS:$Mn^{4+}$ particles (potassium fluorosilicate).

The same procedure was carried out by replacing $Al_2O_3$ and/or $HfO_2$ with $TiO_2$, ZnTe, $Al_2O_3$, $SiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 30: CdSe/CdZnS@$HfO_2$@$Al_2O_3$

1st Step

100 μL of CdSe/CdZnS nanoplatelets suspended in heptane (10 mg/mL) were mixed with hafnium n-butoxide and 5 mL of pentane, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles $CdSe/CdZnS@HfO_2$ were collected at the surface of a filter.

2nd Step 5 mg of $CdSe/CdZnS@HfO_2$ particles were suspended in 5 mL of pentane and mixed with aluminium tri-sec butoxide, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles $CdSe/CdZnS@HfO_2@Al_2O_3$ were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2/ZnS$, $CuInSe_2/ZnS$, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $HfO_2$ with $TiO_2$, ZnTe, $Al_2O_3$, $SiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 31: $CdSe/CdZnS@HfO_2$ and $SnO_2$ Particles Encapsulated in $Al_2O_3$ 5 mg of a previously prepared $CdSe/CdZnS@HfO_2$ particles (size: 150 nm) were suspended in 5 mL of pentane along with larger particles ($SnO_2$, 2 am) and mixed with aluminium tri-sec butoxide, then loaded on a spray-drying set-up. On another side, an aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles, $CdSe/CdZnS@HfO_2$ and $SnO_2$ particles encapsulated in $Al_2O_3$, were collected at the surface of a filter.

Note: the amount of aluminium tri-sec butoxide is calculated so that the amount of $Al_2O_3$ formed would form a layer around the $SnO_2$ particle so that it is thicker than the solid diameter.

The same procedure was carried out by replacing CdSe/CdZnS nanoplatelets and/or $SnO_2$ particles with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2/ZnS$, $CuInSe_2/ZnS$, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets and/or $SnO_2$ particles with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $HfO_2$ with $TiO_2$, ZnTe, $Al_2O_3$, $SiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 32: Phosphor Particles$@HfO_2@Al_2O_3$

1st Step

1 μm of phosphor particles (cf. list below) suspended in heptane (10 mg/mL) were mixed with hafnium n-butoxide and 5 mL of pentane, then loaded on a spray-drying set-up. On another side, an aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles phosphors particles$@HfO_2$ were collected at the surface of a filter.

2nd Step 5 mg of phosphors particles$@HfO_2$ were suspended in 5 mL of pentane and mixed with aluminium tri-sec butoxide, then loaded on a spray-drying set-up. On another side, an aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles phosphor particles @$HfO_2$@$Al_2O_3$ were collected at the surface of a filter.

Phosphor particles used for this example were: Yttrium aluminium garnet particles (YAG, $Y_3Al_5O_{12}$), (Ca,Y)-α-SiAlON:Eu particles, ($(Y,Gd)_3(Al,Ga)_5O_{12}$:Ce) particles, $CaAlSiN_3$:Eu particles, sulfide-based phosphor particles, PFS:$Mn^{4+}$ particles (potassium fluorosilicate).

The same procedure was carried out by replacing $Al_2O_3$ and/or $HfO_2$ with $TiO_2$, ZnTe, $Al_2O_3$, $SiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 33: Preparation of CdSe/CdZnS@$HfO_2$@$SiO_2$ Comprising $SnO_2$ Nanoparticles by Microemulsion CdSe/CdZnS@$HfO_2$ and $SnO_2$ nanoparticles (30-40 nm diameter) were coated with $SiO_2$ using reverse micelles of polyoxyethylene cetylether (Nihon surfactant, C-15) using cyclohexane (purity 99.0%) as the organic phase. The concentration of the surfactant in the organic solvent was 0.5 mol/L. The microemulsion solution was prepared by injecting an aqueous solution (4.0 mL, denoted as aq.) containing 100 mg of CdSe/CdZnS@$HfO_2$ and $SnO_2$ nanoparticles (varying proportions) into the organic surfactant solution (100 mL) at 50° C. under magnetic stirring. An oxalic acid solution ($(COOH)_2$ aq., 1 mol/L, 3.0 mL) was used to charge positively the oxides surface. Tetraethylorthosilicate (TEOS, 0.86 mol/L in the microemulsion solution) as a $SiO_2$ source and diluted $NH_4OH$ solution (2.70 mol/l, 15.0 ml) were charged into the microemulsion containing CdSe/CdZnS @$HfO_2$ and $SnO_2$ nanoparticles, and subjected to hydrolysis at 50° C. for 60 min. The molar ratio of water to surfactant in the solution during TEOS hydrolysis was 23. The solid formed was centrifuged, thoroughly washed with propanol, dried at 80° C. overnight, and a thermal treatment at 130° C. for 24 h was performed in air.

The same procedure was carried out by replacing CdSe/CdZnS nanoplatelets and/or $SnO_2$ nanoparticles with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets and/or $SnO_2$ nanoparticles with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $SiO_2$ and/or $HfO_2$ with $TiO_2$, ZnTe, $Al_2O_3$, $SiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $SiO_2$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 34: Semiconductor Nanoplatelets@$Al_2O_3$@$SiO_2$

The dry solid 0.05 g, i.e., semiconductor nanoplatelets@$Al_2O_3$, is weighted under dry atmosphere (glovebox) and is dispersed in 1 mL of pure/dry THF, then 0.07 mL of 2.3 mol·$L^{-1}$ HCl solution is added. The solution is then heated in a closed vessel to 70° C. A solution (1 mL) containing TEOS (TetraEthyl OrthoSilicate) (0.5 mmol·$L^{-1}$) in clean THF is added dropwise over a period of 0.1 μmol·$min^{-1}$ under stirring. The mixture is then refluxed for about 1 h. The product is then filtered and washed consecutively with 20/80 water/THF (3×5 mL), EtOH (3×5 mL), and $Et_2O$ (3×5 mL), and dried at 80° C. under vacuum.

The same procedure was carried out by replacing semiconductor nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $SiO_2$ with $TiO_2$, ZnTe, $Al_2O_3$, $SiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $SiO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 35: Semiconductor Nanoplatelets@$HfO_2$@$SiO_2$

The dry solid 0.05 g, i.e., semiconductor nanoplatelets@$HfO_2$, is weighted under dry atmosphere (glovebox) and is dispersed in 1 mL of pure/dry THF, then 0.07 mL of 2.3 mol·$L^{-1}$ HCl solution is added. The solution is then heated in a closed vessel to 70° C. A solution (1 mL) containing TEOS (TetraEthyl OrthoSilicate) (0.5 $mmol \cdot L^{-1}$) in clean THF is added dropwise over a period of 0.1 $\mu mol \cdot min^{-1}$ under stirring. The mixture is then refluxed for about 1 h. The product is then filtered and washed consecutively with 20/80 water/THF (3×5 mL), EtOH (3×5 mL), and $Et_2O$ (3×5 mL), and dried at 80° C. under vacuum.

Note 1: Trialkoxy Azidoalkyl silane, Trialkoxy Aminoalkyl silane or Trialkoxy alkylThiol silane can be added to the TEOS solution to add versatile functionalities the solid for further functionalization.

The same procedure was carried out by replacing semiconductor nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $HfO_2$ and/or $SiO_2$ with $TiO_2$, ZnTe, $Al_2O_3$, $SiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $HfO_2$ and/or $SiO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 36: Semiconductor Nanoplatelets@$Al_2O_3$@$SiO_2$

Semiconductor nanoplatelets@$Al_2O_3$ particles are dispersed in 16.7 wt % $H_2O$ in an anhydrous ethanol to reach 5 wt. % solid loading and then ultrasonicated to break down agglomerates. A 20 wt. % of TEOS+silane in ethanol solution (quantity varied to tune $SiO_2$ thickness) was carefully added to the suspension step by step. The amounts of added TEOS were calculated based on the surface area of semiconductor nanoplatelets@$Al_2O_3$ particle and the desired shell thickness, assuming complete conversion of TEOS to silica. The appropriate pH value of the suspension was adjusted using ammonia to pH=11. Afterward, the suspension was stirred at 50° C. for 6 h to control the thickness of the coating layer through the hydrolysis and condensation of TEOS on the surface of semiconductor nanoplatelets@$Al_2O_3$ particle. Resulting particles were then collected by centrifuged, washed with anhydrous ethanol and dried in an oven at 80° C.

The same procedure was carried out by replacing semiconductor nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $SiO_2$ with ZnTe, $TiO_2$, $Al_2O_3$, $SiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $SiO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 37: CdSe/CdZnS@$HfO_2$@$SiO_2$

1st Step

100 μL of CdSe/CdZnS nanoplatelets suspended in heptane (10 mg/mL) were mixed with Hafnium n-butoxide and 5 mL of pentane, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles CdSe/CdZnS@$HfO_2$ were collected at the surface of a filter.

2nd Step 50 mg of CdSe/CdZnS@$HfO_2$ particles were suspended in 20 mL of water and mixed with TEOS and ammonia, then loaded on a spray-drying set-up. The liquid was sprayed towards a tube furnace heated at a temperature ranging from the boiling point of the solvent to 1000° C. with a nitrogen flow. The luminescent particles CdSe/CdZnS@$HfO_2$@$SiO_2$ were collected at the surface of a filter.

Figure 1:
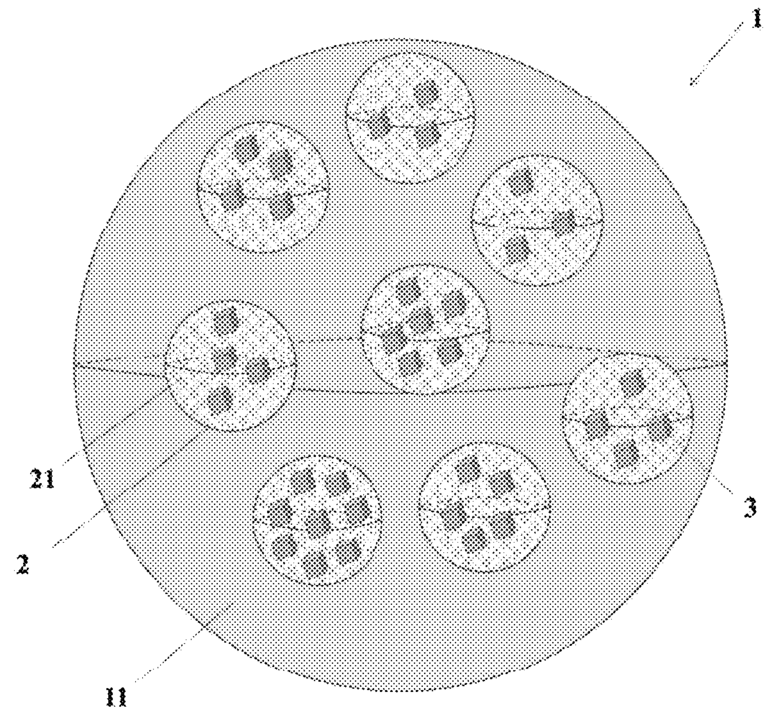
FIG. 1 illustrates a particle 1 comprising a first material 11 and particles 2; wherein each particle 2 comprises a second material 21 and at least one nanoparticle 3 dispersed in said second material 21.
Figure 2:
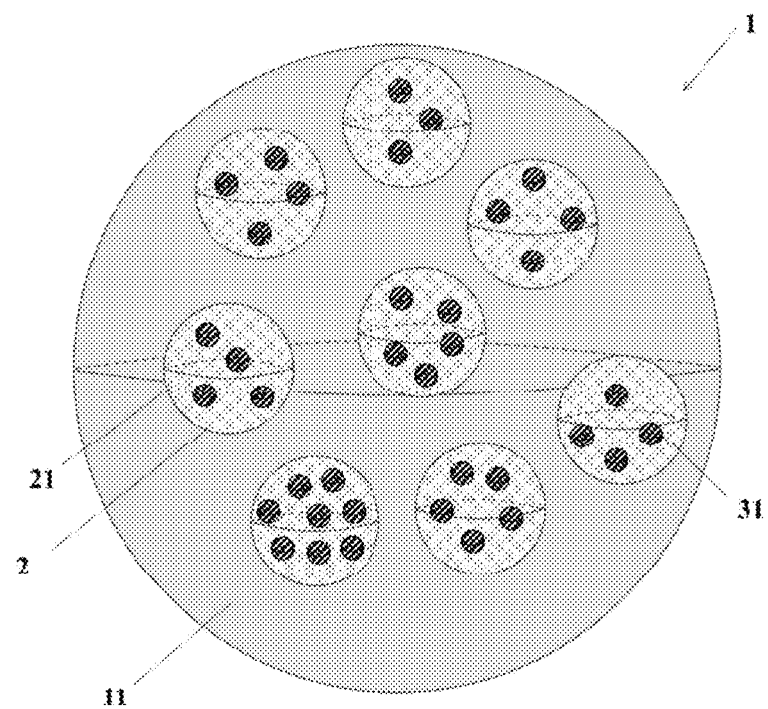
FIG. 2 illustrates a particle 1 comprising a first material 11 and particles 2; wherein each particle 2 comprises a second material 21 and at least one spherical nanoparticle 31 dispersed in said second material 21.
Figure 3:
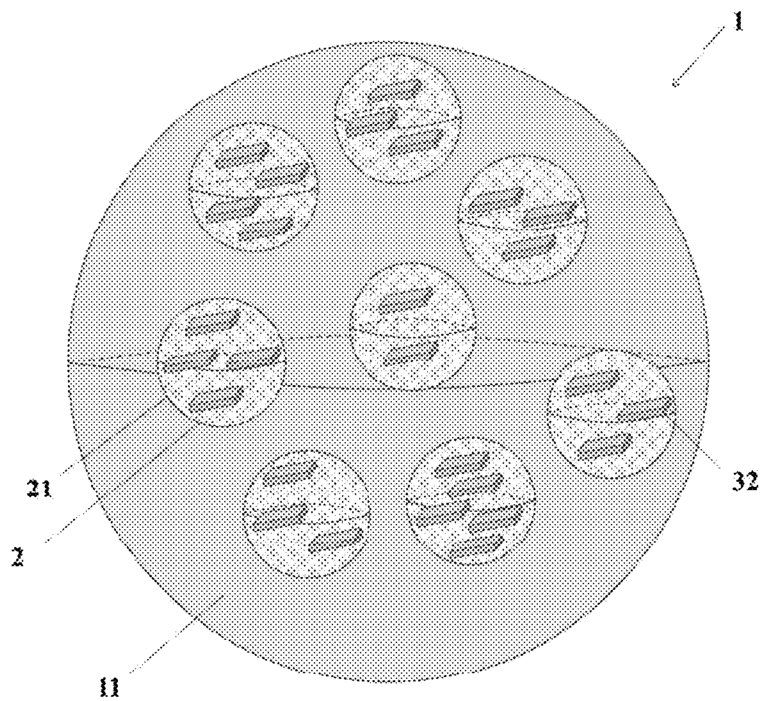
FIG. 3 illustrates a particle 1 comprising a first material 11 and particles 2; wherein each particle 2 comprises a second material 21 and at least one 2D nanoparticle 32 dispersed in said second material 21.
Figure 4:
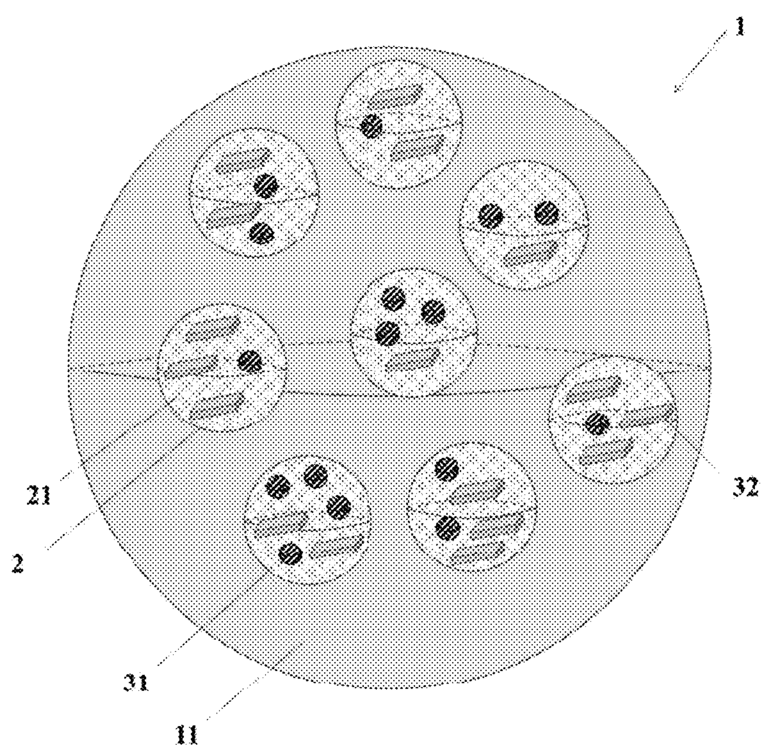
FIG. 4 illustrates a particle 1 comprising a first material 11 and particles 2; wherein each particle 2 comprises a second material 21, at least one spherical nanoparticle 31 and at least one 2D nanoparticle 32 dispersed in said second material 21.
Figure 5:
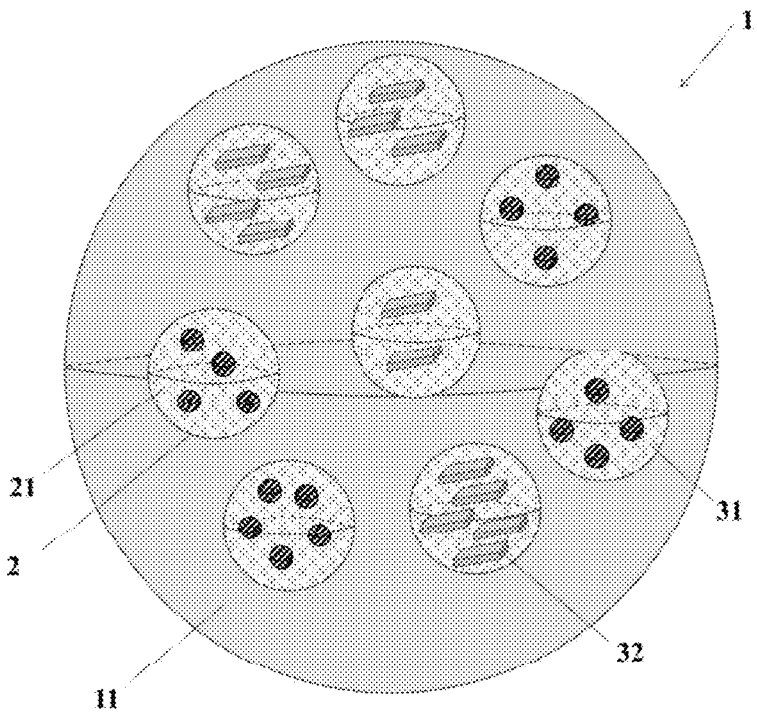
FIG. 5 illustrates a particle 1 comprising different particles 2.
Figure 6A:
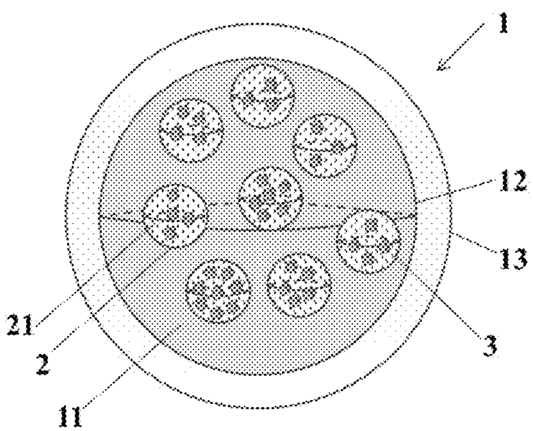
FIG. 6A illustrates a heterostructured particle 1, wherein the core 12 of the particle 1 comprises at least one particle 2 and the shell 13 of the particle 1 does not comprise particles 2.
Figure 6B:
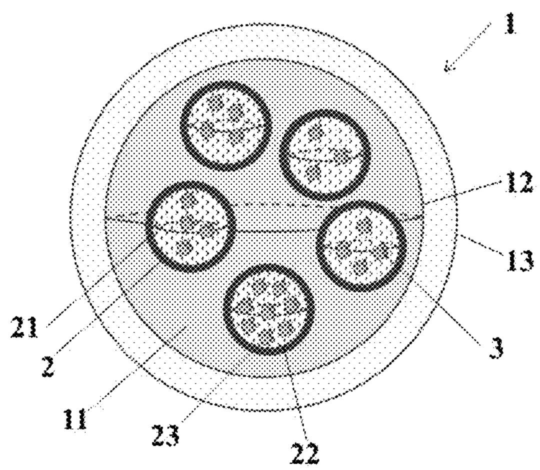
FIG. 6B illustrates a heterostructured particle 1, wherein the at least one particle 2 is a heterostructure.
Figure 6C:
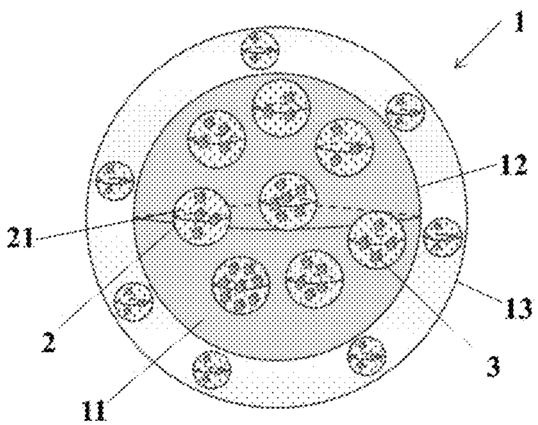
FIG. 6C illustrates a heterostructured particle 1, wherein the core 12 of the particle 1 comprises at least one particle 2 and the shell 13 of the particle 1 comprises at least one particle 2.
Figure 6D:
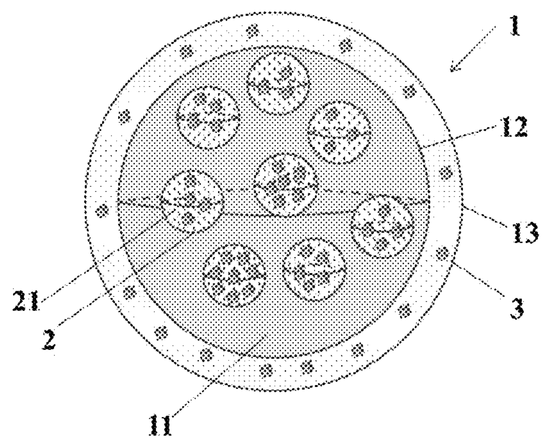
FIG. 6D illustrates a heterostructured particle 1, wherein the core 12 of the particle 1 comprises at least one particle 2 and the shell 13 of the particle 1 comprises at least one nanoparticle 3.
Figure 7A:
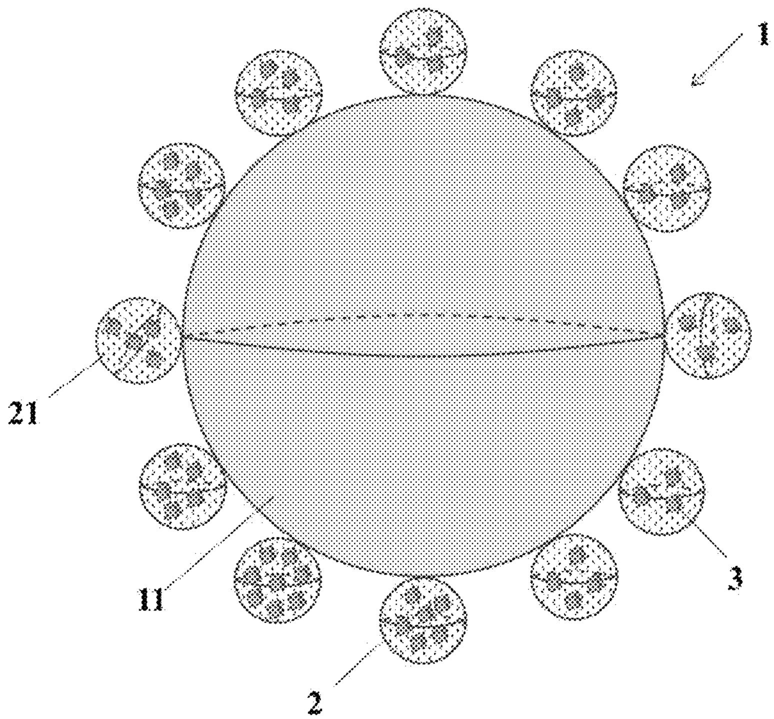
FIG. 7A illustrates a particle 1 with at least one nanoparticle 2 adsorbed with a cement on its surface.
Figure 7B:
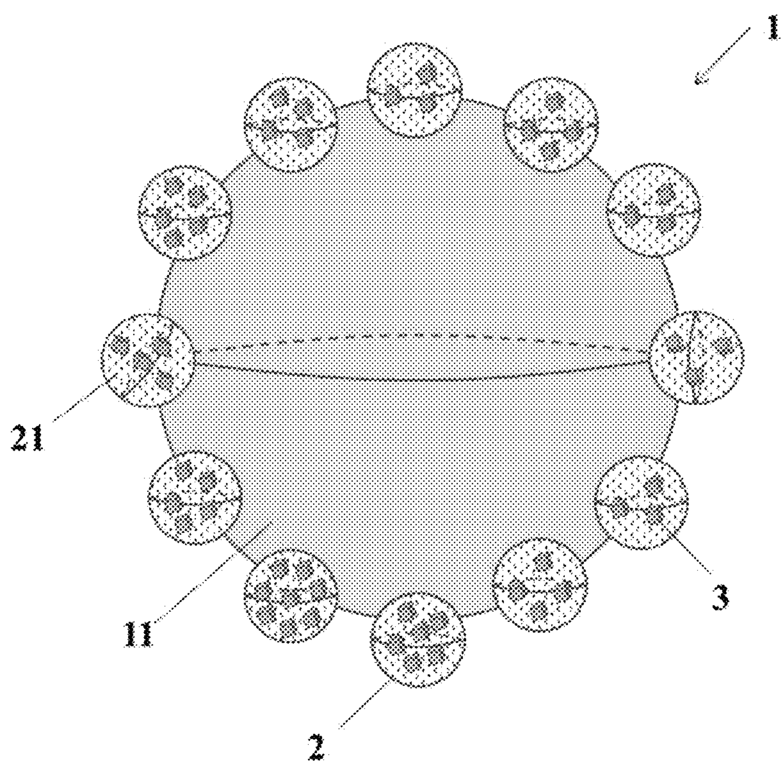
FIG. 7B illustrates a particle 1 with at least one nanoparticle 2 located on its surface, wherein the at least one particle 2 has some of its volume trapped in the first material 11.
Figure 8A:
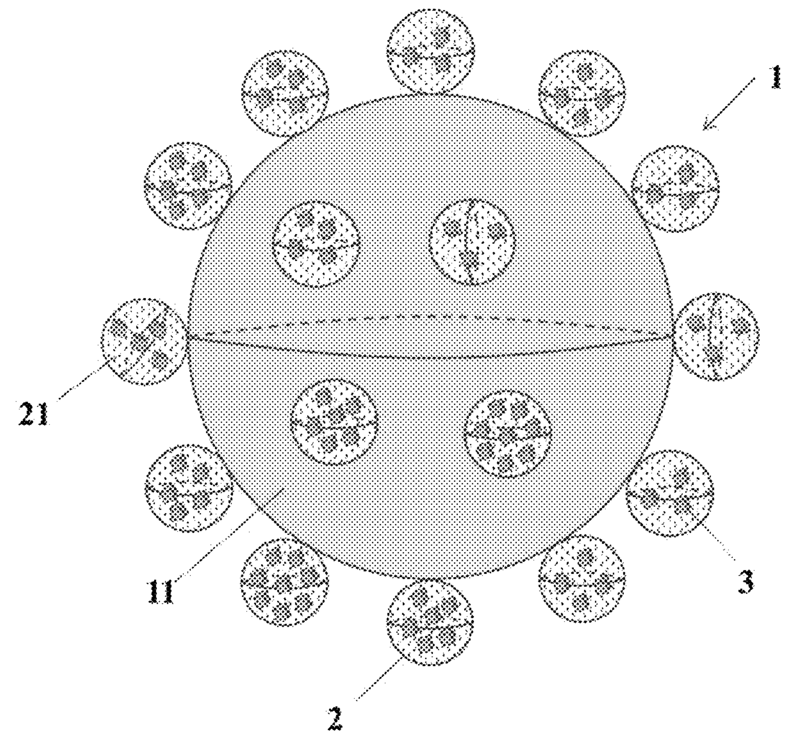
FIG. 8A illustrates a particle 1 comprising at least one particle 2 dispersed in the first material 11; and at least one particle 2 adsorbed with a cement on the surface of said particle 1.
Figure 8B:
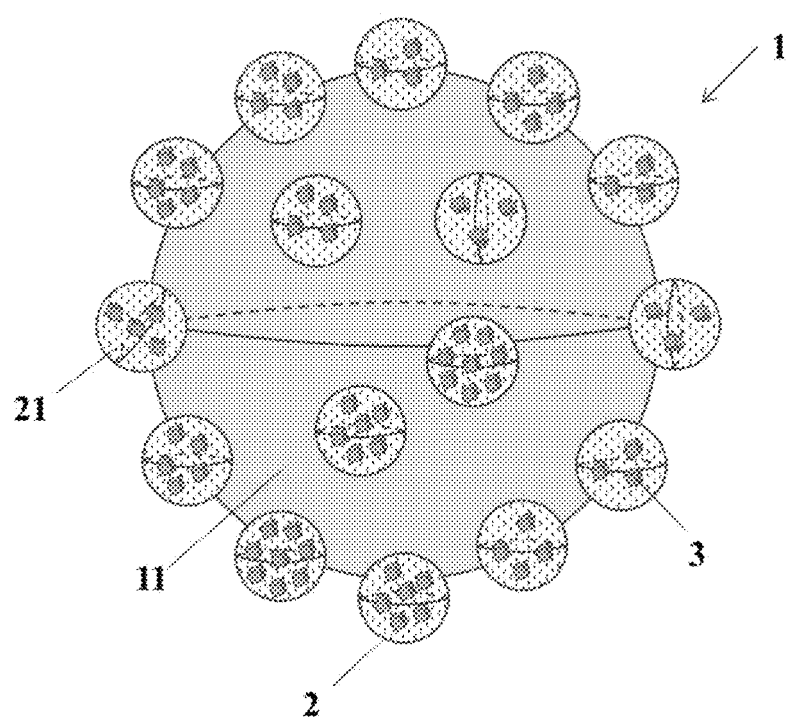
FIG. 8B illustrates a particle 1 comprising at least one particle 2 dispersed in the first material 11; and at least one particle 2 located on the surface with some of its volume trapped in the first material 11.
Figure 9:
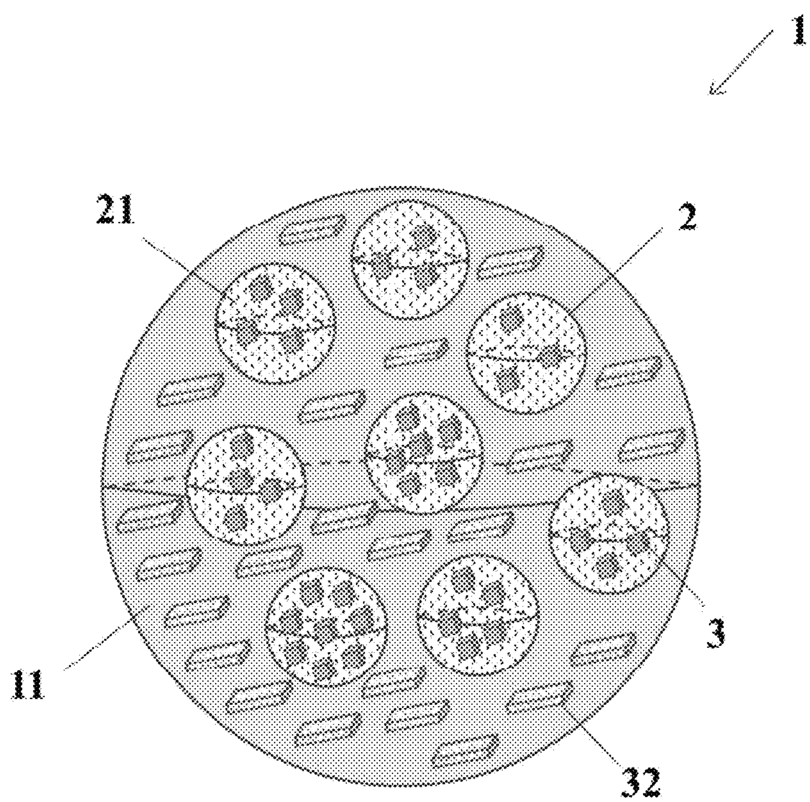
FIG. 9 illustrates a particle 1 further comprising at least one nanoparticle 3 dispersed in the first material 11.
Figure 10A:
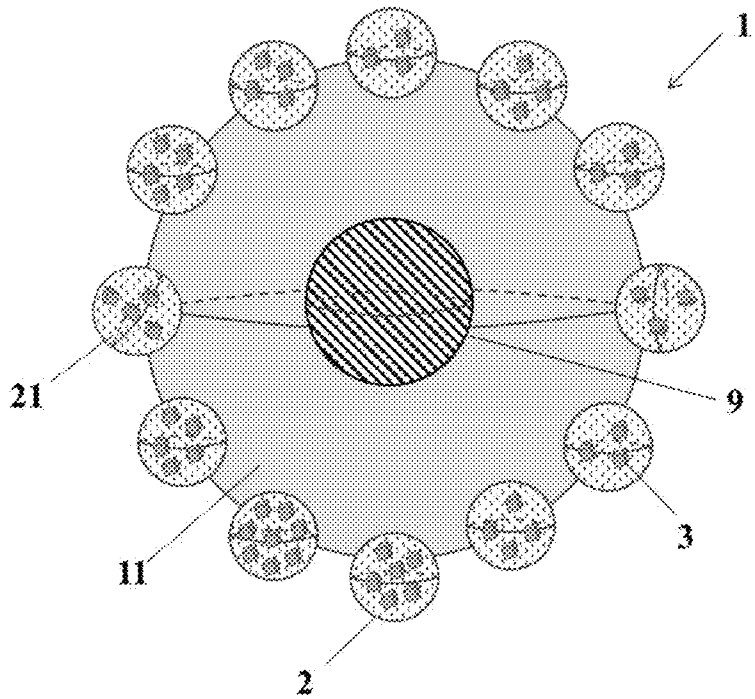
FIG. 10A illustrates a particle 1 comprising at least one nanoparticle 2 located on its surface and a dense particle 9 dispersed in the first material 11.
Figure 10B:
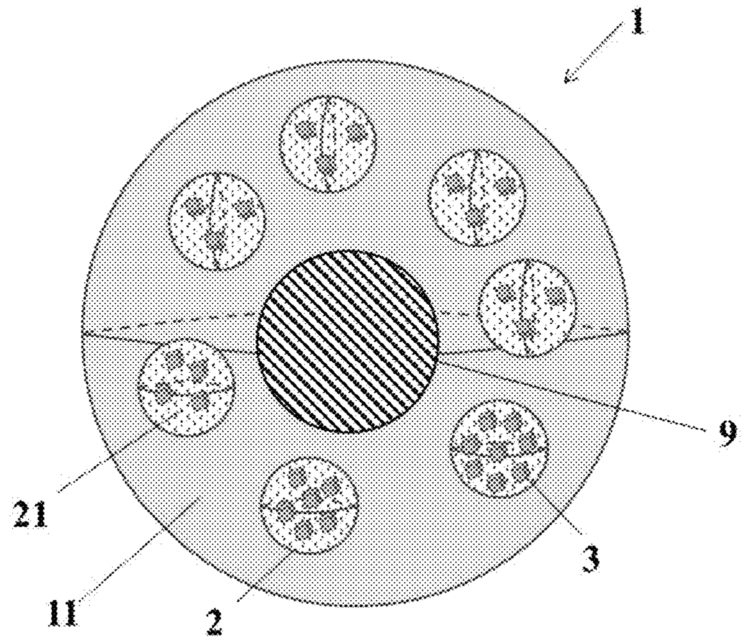
FIG. 10B illustrates a particle 1 comprising at least one nanoparticle 2 and a dense particle 9 dispersed in the first material 11.
Figure 11:
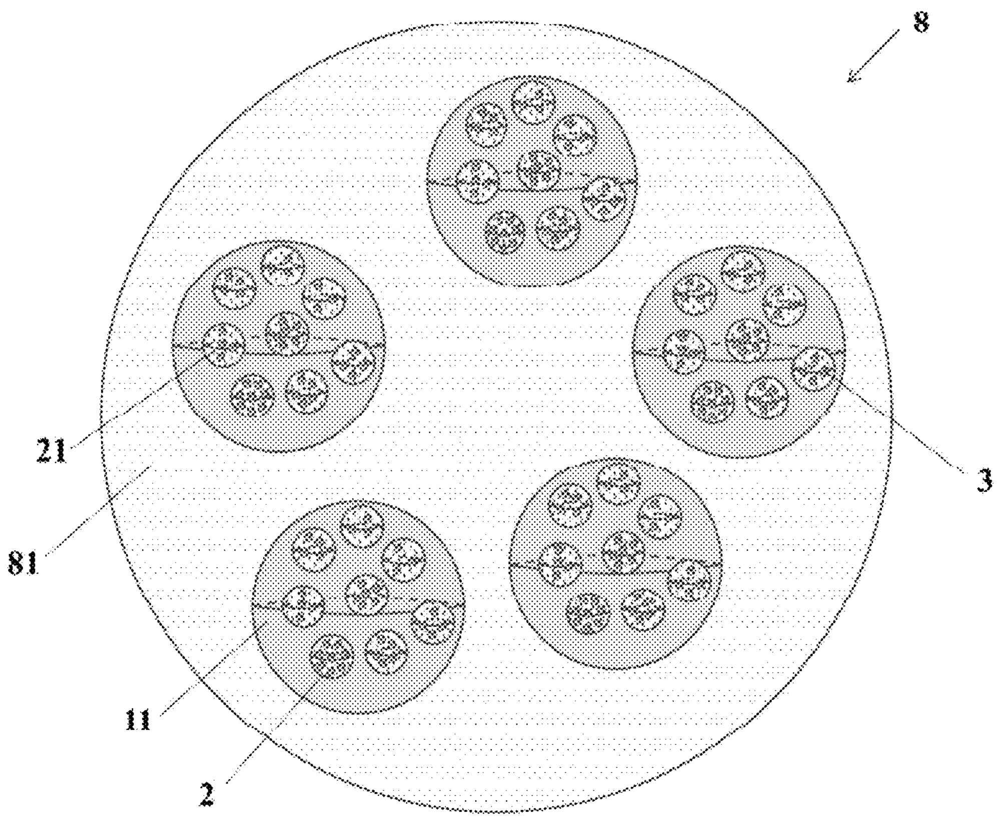
FIG. 11 illustrates a bead 8 comprising a third material 81 and the particle 1 is dispersed in said third material 81.
Figure 12A:
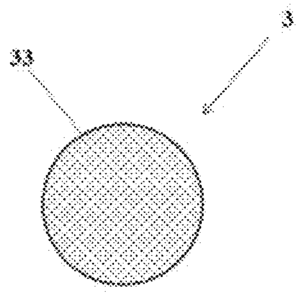
FIG. 12A illustrates a core nanoparticle 33 without a shell.
Figure 12B:
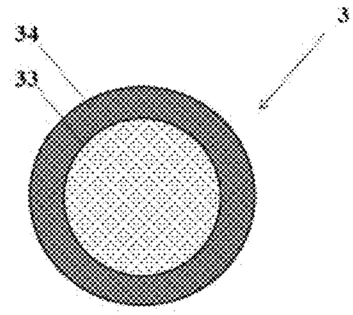
FIG. 12B illustrates a core 33/shell 34 nanoparticle 3 with one shell 34.
Figure 12C:
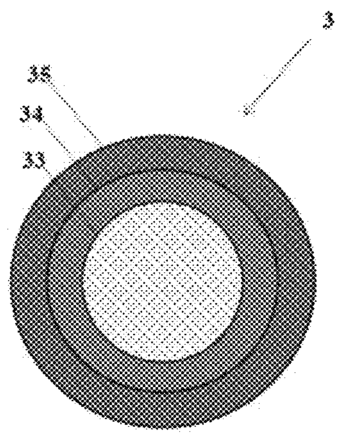
FIG. 12C illustrates a core 33/shell (34, 35) nanoparticle 3 with two different shells (34, 35).
Figure 12D:
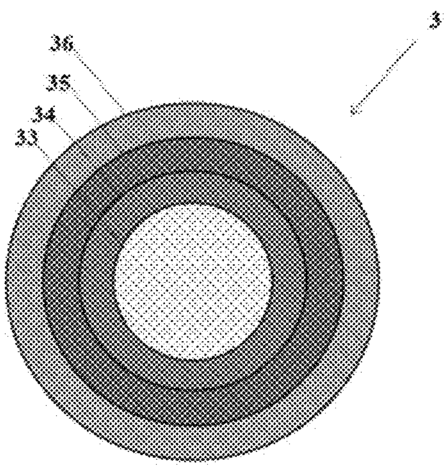
FIG. 12D illustrates a core 33/shell (34, 35, 36) nanoparticle 3 with two different shells (34, 35) surrounded by an oxide insulator shell 36.
Figure 12E:
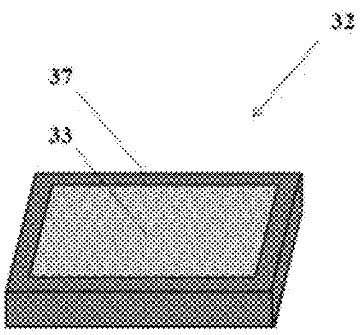
FIG. 12E illustrates a core 33/crown 37 nanoparticle 32.
Figure 12F:
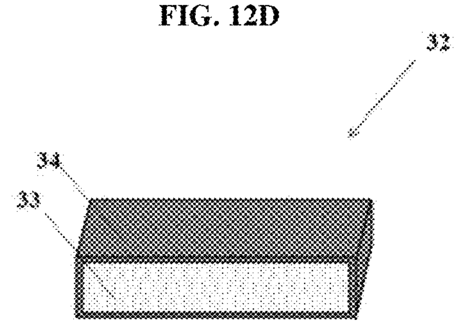
FIG. 12F illustrates a sectional view of a core 33/shell 34 nanoparticle 32 with one shell 34.
Figure 12G:
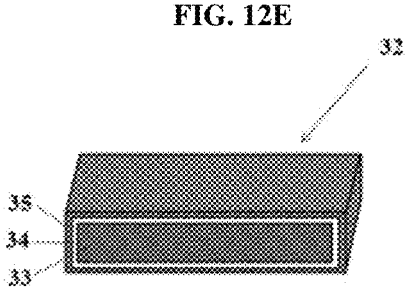
FIG. 12G illustrates a sectional view of a core 33/shell (34, 35) nanoparticle 32 with two different shells (34, 35).
Figure 12H:
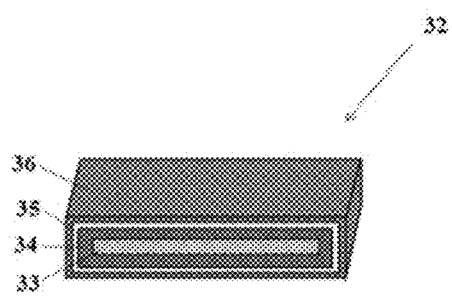
FIG. 12H illustrates a sectional view of a core 33/shell (34, 35, 36) nanoparticle 32 with two different shells (34, 35) surrounded by an oxide insulator shell 36.
Figure 13A:
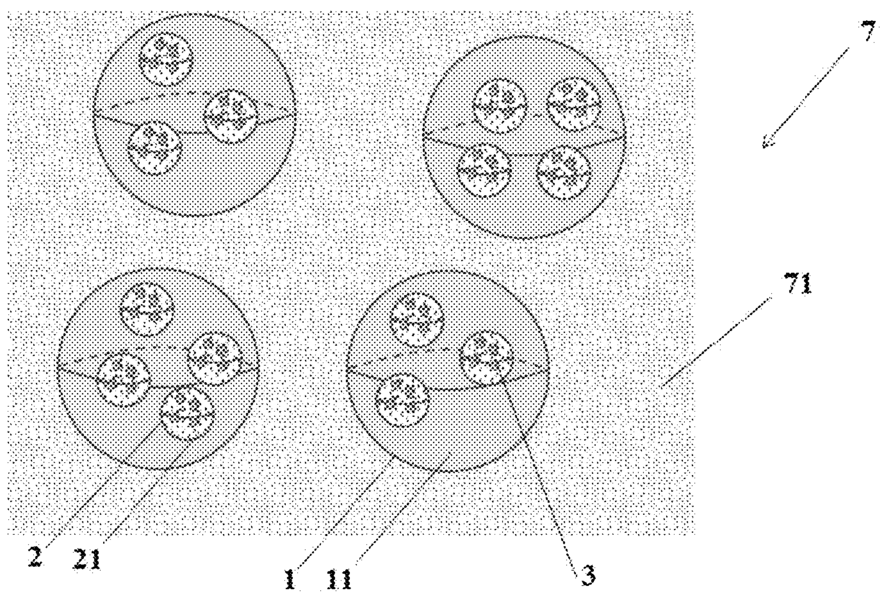
FIG. 13A illustrates a light emitting material 7 comprising a host material 71 and at least one particle 1 of the invention.
Figure 13B:
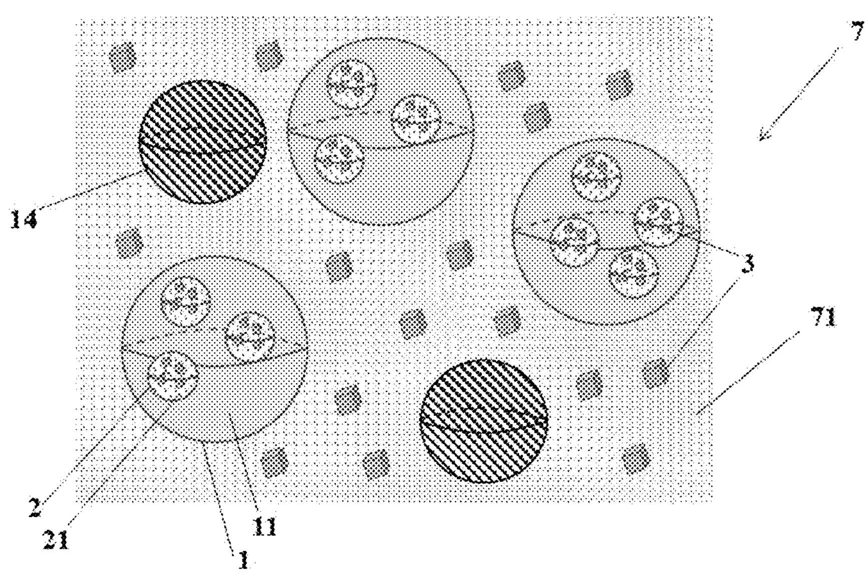
FIG. 13B illustrates a light emitting material 7 comprising a host material 71; at least one particle 1 of the invention; a plurality of particles comprising an inorganic material 14; and a plurality of 2D nanoparticles 3.
Figure 14A:
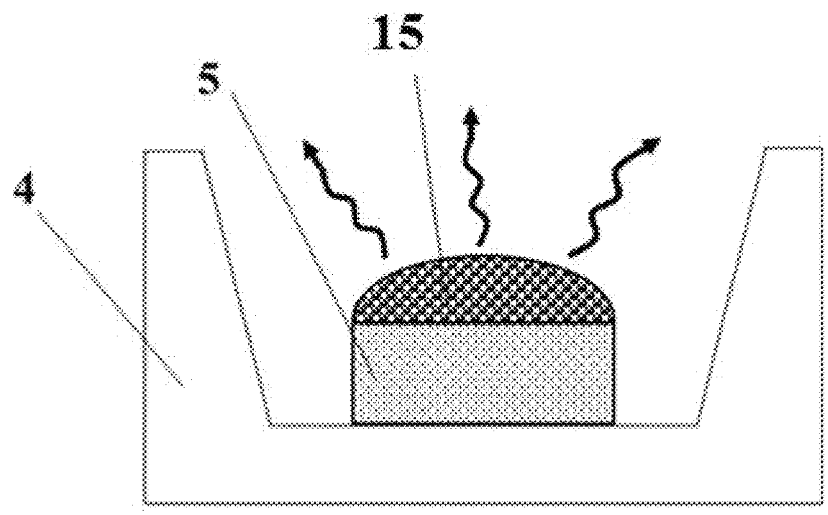
FIG. 14A illustrates an optoelectronic device comprising a LED support 4, a LED chip 5 and ink 15 deposited on said LED chip 5, wherein the ink 15 covers the LED chip 5.
Figure 14B:
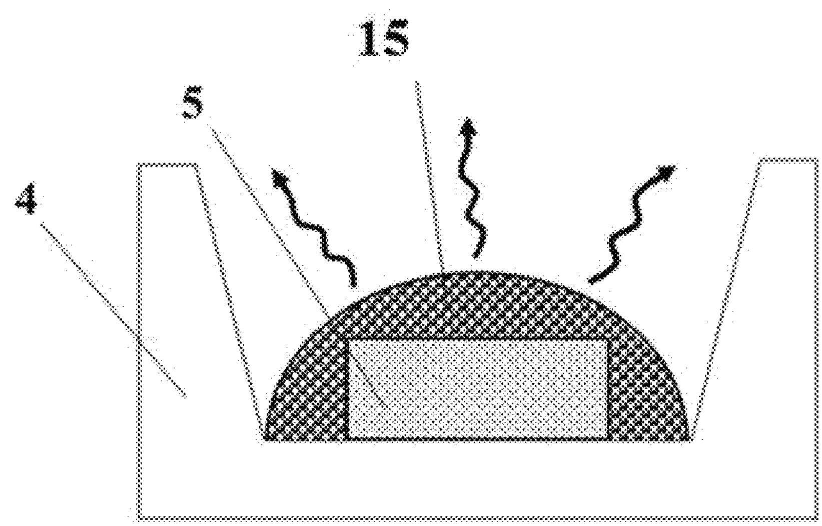
FIG. 14B illustrates an optoelectronic device comprising a LED support 4, a LED chip 5 and ink 15 deposited on said LED chip 5 wherein the ink 15 covers and surrounds the LED chip 5.
Figure 15:
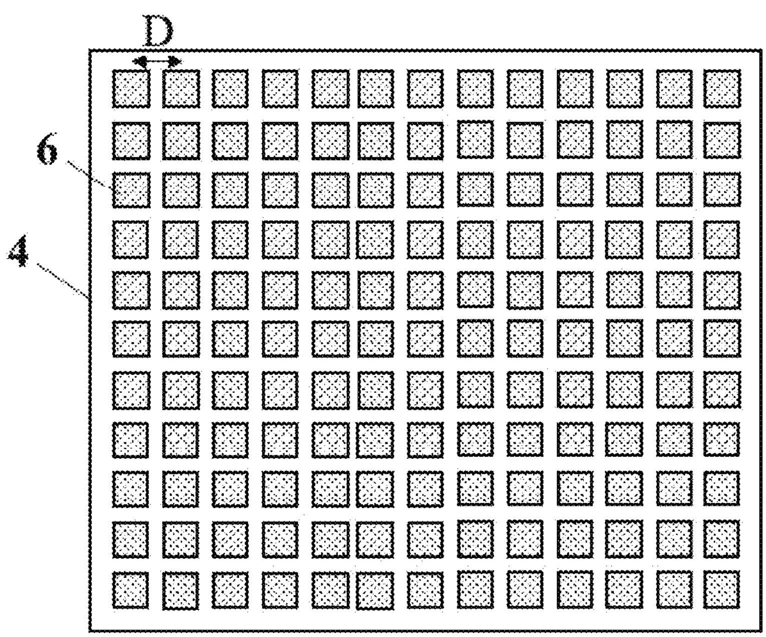
FIG. 15 illustrates a microsized LED 6 array comprising a LED support 4 and a plurality of microsized LED 6, wherein the pixel pitch D is the distance from the center of a pixel to the center of the next pixel.
Figure 16A:
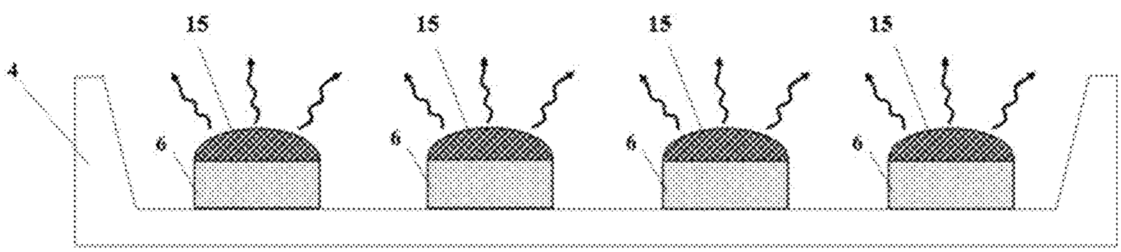
FIG. 16A illustrates an optoelectronic device comprising a LED support 4, a microsized LED 6 and ink 15 deposited on said microsized LED 6, wherein the ink 15 covers the microsized LED 6.
Figure 16B:
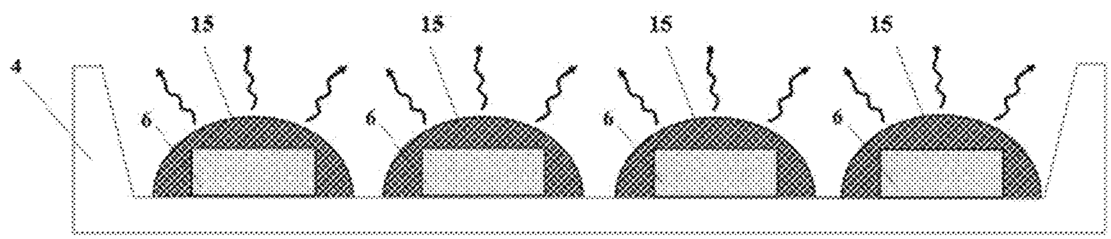
FIG. 16B illustrates an optoelectronic device comprising a LED support 4, a microsized LED 6 and ink 15 deposited on said microsized LED 6 wherein the ink 15 covers and surrounds the microsized LED 6.
Figure 17A:
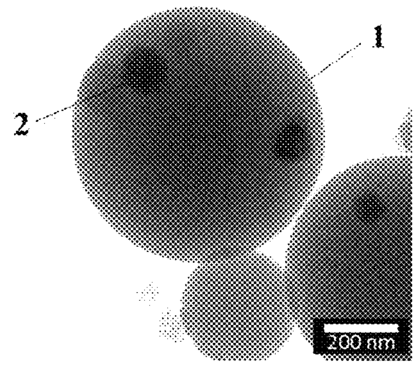
FIG. 17A is a TEM image of CdSe/CdZnS@$HfO_2$@$SiO_2$ particles.
Figure 17B:
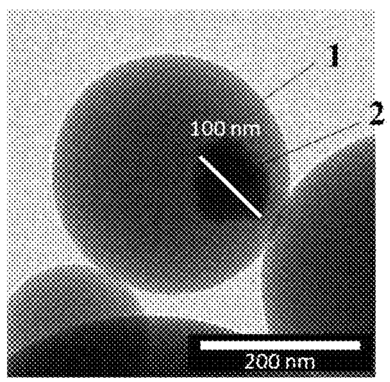
FIG. 17B is a TEM image of CdSe/CdZnS@$HfO_2$@$SiO_2$ particles.

FIGS. 17A and 17B show as-synthetized CdSe/CdZnS@$HfO_2$@$SiO_2$ particles.

Figure 17C:
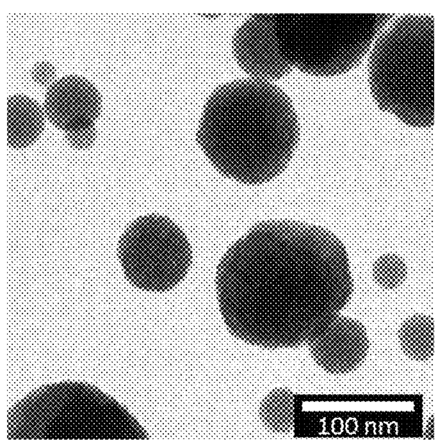
FIG. 17C is a TEM image of $HfO_2$ particles.
Figure 18:
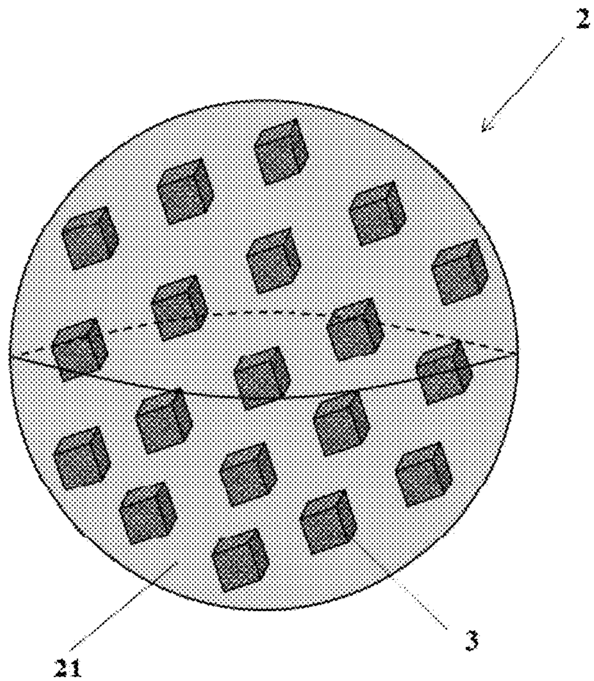
FIG. 18 illustrates a particle 2 comprising a plurality of nanoparticles 3 encapsulated in a material 21.
Figure 19:
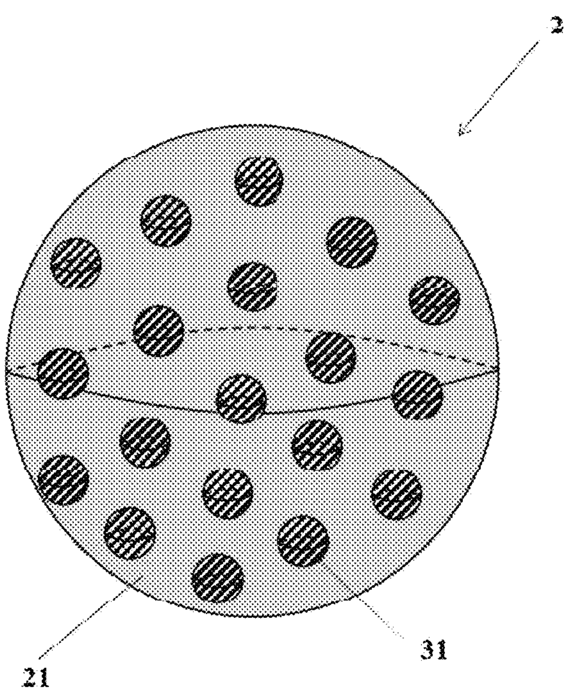
FIG. 19 illustrates a particle 2 comprising a plurality of spherical nanoparticles 31 encapsulated in a material 21.
Figure 20:
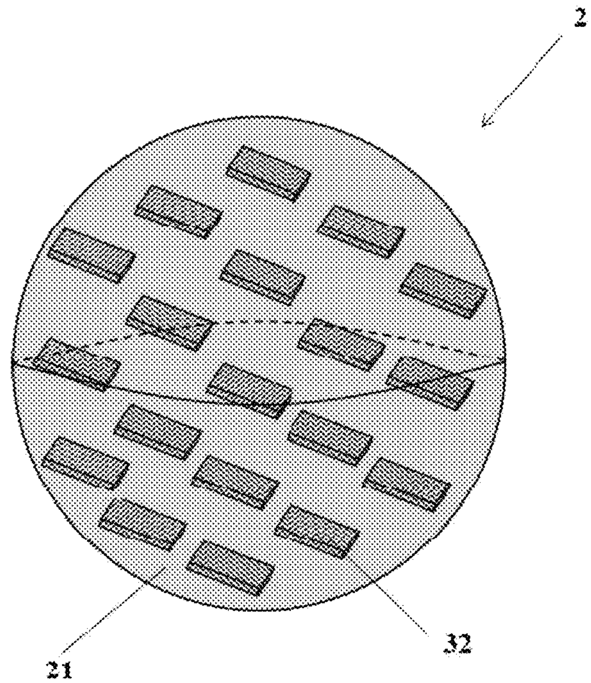
FIG. 20 illustrates a particle 2 comprising a plurality of 2D nanoparticles 32 encapsulated in a material 21.
Figure 21:
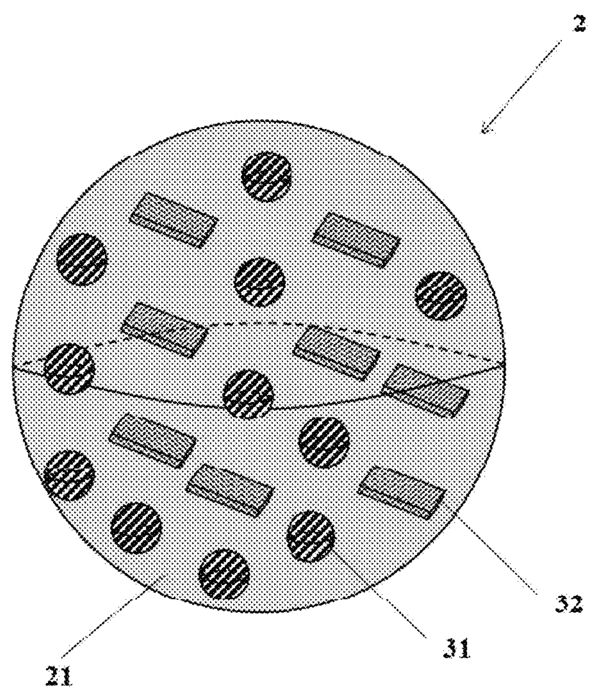
FIG. 21 illustrates a particle 2 comprising a plurality of spherical nanoparticles 31 and a plurality of 2D nanoparticles 32 encapsulated in a material 21.
Figure 22A:
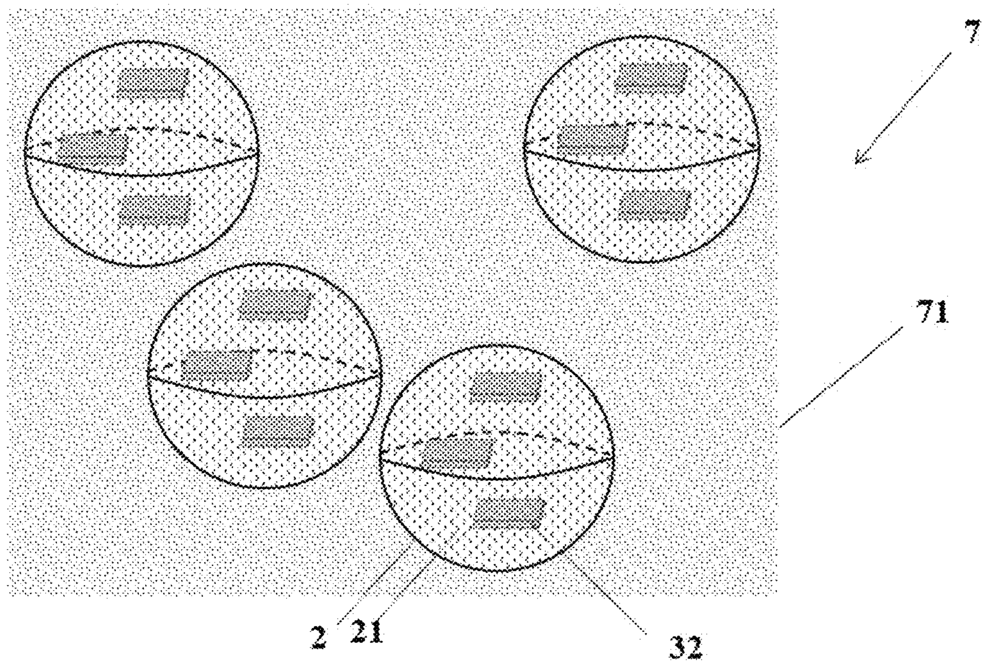
FIG. 22A illustrates a light emitting material 7 comprising a host material 71 and at least one particle 2 of the invention comprising a plurality of 2D nanoparticles 32 encapsulated in a material 21.
Figure 22B:
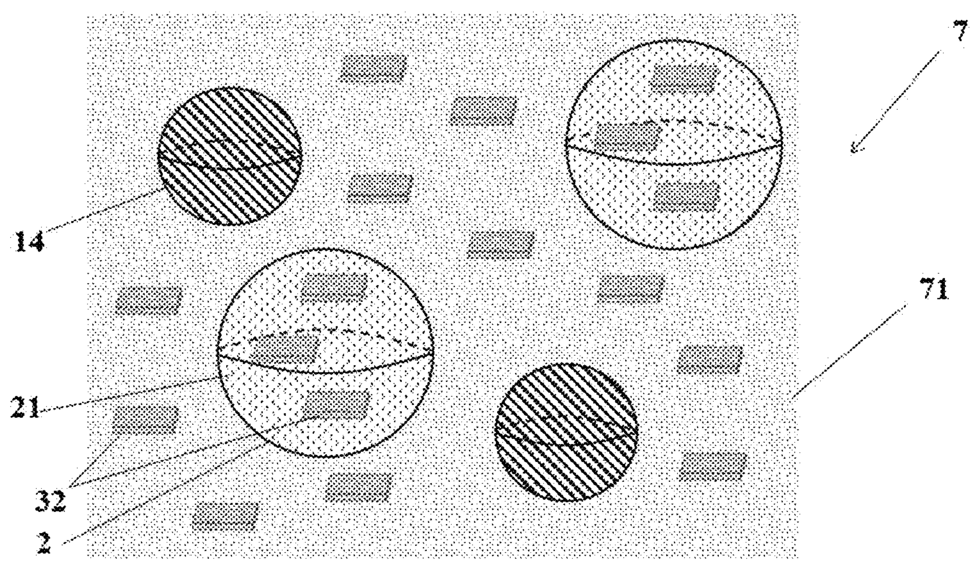
FIG. 22B illustrates a light emitting material 7 comprising a host material 71; at least one particle 2 of the invention comprising a plurality of 2D nanoparticles 32 encapsulated in a material 21; a plurality of particles comprising an inorganic material 14; and a plurality of 2D nanoparticles 32.

FIG. 17C show a TEM image of $HfO_2$ particles, it is clear from that pictures that CdSe/CdZnS@$HfO_2$ seen in FIGS. 17A and 17B have a morphology consistent with $HfO_2$ particles.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $SiO_2$ and/or $HfO_2$ with $TiO_2$, ZnTe, $Al_2O_3$, $SiO_2$, $HfO_2$, ZnSe, ZnO, ZnS, $SiZrO_2$, $SiHfO_2$ or MgO, or a mixture thereof.

Reaction temperature of the above procedure is adapted according to the inorganic material chosen.

The same procedure was carried out by replacing $SiO_2$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 38: Luminescent Particles Preparation from an Organometallic Precursor

100 μL of CdSe/CdZnS@$HfO_2$ particles suspended in heptane were mixed with an organometallic precursor selected in the group below in pentane under controlled atmosphere, then loaded on a spray-drying set-up. On another side, an aqueous solution was prepared and loaded on the same spray-drying set-up, but at a different location than the first heptane solution.

The two liquids were sprayed simultaneously towards a tube furnace heated from room temperature to 300° C. with a nitrogen flow. The particles were collected at the surface of a filter.

The procedure was carried out with an organometallic precursor selected in the group comprising: $Al[N(SiMe_3)_2]_3$, trimethyl aluminium, triisobutylaluminum, trioctylaluminum, triphenylaluminum, dimethyl aluminium, trimethyl zinc, dimethyl zinc, diethylzinc, $Zn[(N(TMS)_2]_2$, $Zn[(CF_3SO_2)_2N]_2$, $Zn(Ph)_2$, $Zn(C_6F_5)_2$, $Zn(TMHD)_2$ (β-diketonate), $Hf[C_5H_4(CH_3)]_2(CH_3)_2$, $HfCH_3(OCH_3)[C_5H_4(CH_3)]_2$, $[[(CH_3)_3Si]_2N]_2HfCl_2$, $(C_5H_5)_2Hf(CH_3)_2$, $[(CH_2CH_3)_2N]_4Hf$, $[(CH_3)_2N]_4Hf$, $[(CH_3)_2N]_4Hf$, $[(CH_3)(C_2H_5)N]_4Hf$, $[(CH_3)(C_2H_5)N]_4Hf$, 2,2',6,6'-tetramethyl-3,5-heptanedione zirconium ($Zr(THD)_4$), $C_{10}H_{12}Zr$, $Zr(CH_3C_5H_4)_2CH_3OCH_3$, $C_{22}H_{36}Zr$, $[(C_2H_5)_2N]_4Zr$, $[(CH_3)_2N]_4Zr$, $[(CH_3)_2N]_4Zr$, $Zr(NCH_3C_2H_5)_4$, $Zr(NCH_3C_2H_5)_4$, $C_{18}H_{32}O_6Zr$, $Zr(C_5H_{15}O_2)_4$, $Zr(OCC(CH_3)_3CHCOC(CH_3)_3)_4$, $Mg(C_5H_5)_2$, or $C_{20}H_{30}Mg$, or a mixture thereof. Reaction temperature of the above procedure is adapted according to the organometallic precursor chosen.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $HfO_2$ with ZnTe, $TiO_2$, $Al_2O_3$, $SiO_2$, $HfO_2$, ZnSe, ZnO, ZnS, $SiZrO_2$, $SiHfO_2$ or MgO, or a mixture thereof.

The same procedure was carried out by replacing $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

The same procedure was carried out by replacing the aqueous solution with another liquid or vapor source of oxidation.

Example 39: Luminescent Particles Preparation from an Organometallic Precursor—CdSe/CdZnS@$HfO_2$@ZnTe 100 μL of CdSe/CdZnS@$HfO_2$ particles suspended in heptane were mixed with two organometallic precursors selected in the group below in pentane under inert atmosphere then loaded on a spray-drying set-up. The suspension was sprayed towards a tube furnace heated from RT to 300° C. with a nitrogen flow. The particles were collected at the surface of a filter.

The procedure was carried out by with a first organometallic precursor selected in the group comprising: dimethyl telluride, diethyl telluride, diisopropyl telluride, di-t-butyl telluride, diallyl telluride, methyl allyl telluride, dimethyl selenide, or dimethyl sulfur, or a mixture thereof. Reaction temperature of the above procedure is adapted according to the organometallic precursor chosen.

The procedure was carried out by with a second organometallic precursor selected in the group comprising: dimethyl zinc, trimethyl zinc, diethylzinc, $Zn[(N(TMS)_2]_2$, $Zn[(CF_3SO_2)_2N]_2$, $Zn(Ph)_2$, $Zn(C_6F_5)_2$, or $Zn(TMHD)_2$ (β-diketonate), or a mixture thereof. Reaction temperature of the above procedure is adapted according to the organometallic precursor chosen.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing ZnTe with ZnS or ZnSe, or a mixture thereof.

The same procedure was carried out by replacing $HfO_2$ with ZnTe, $TiO_2$, $Al_2O_3$, $SiO_2$, $HfO_2$, ZnSe, ZnO, ZnS, $SiZrO_2$, $SiHfO_2$ or MgO. The same procedure was carried out by replacing $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

The same procedure was carried out by replacing the aqueous solution with another liquid or vapor source of oxidation.

Example 40: Luminescent Particles Preparation from an Organometallic Precursor—CdSe/CdZnS@$HfO_2$@ZnS 100 μL of CdSe/CdZnS@$HfO_2$ particles suspended in heptane were mixed with an organometallic precursor selected in the group below in pentane under inert atmosphere, then loaded on a spray-drying set-up. On another side, a vapor source of $H_2S$ was inserted in the same spray-drying set-up. The suspension was sprayed towards a tube furnace heated from RT to 300° C. with a nitrogen flow. The particles were collected at the surface of a filter.

The procedure was carried out with an organometallic precursor selected in the group comprising: dimethyl zinc, trimethyl zinc, diethylzinc, $Zn[(N(TMS)_2]_2$, $Zn[(CF_3SO_2)_2N]_2$, $Zn(Ph)_2$, $Zn(C_6F_5)_2$, $Zn(TMHD)_2$ (β-diketonate), or a mixture thereof. Reaction temperature of the above procedure is adapted according to the organometallic precursor chosen.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing ZnS with ZnSe or ZnTe, or a mixture thereof.

The same procedure was carried out by replacing $HfO_2$ with ZnTe, $TiO_2$, $Al_2O_3$, $SiO_2$, $HfO_2$, ZnSe, ZnO, ZnS, $SiZrO_2$, $SiHfO_2$ or MgO, or a mixture thereof. The same procedure was carried out by replacing $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer The same procedure was carried out by replacing the aqueous solution with another liquid or vapor source of oxidation.

The same procedure was carried out by replacing $H_2S$ with $H_2Se$, $H_2Te$ or other gas.

Example 41: Ink

Particles of the invention were prepared, collected and then dispersed in a solvent composed of 40 μl of toluene and 20 μl of PMMA (10 wt % in toluene). The resulting suspension was homogeneously mixed using ultrasonic bath (37 kHz, 480 W, sweep mode) for 1 minute.

Example 42: Ink 0.1 g of particles of the invention having an emission peak centered at 620 nm were mixed with a mixed solvent of 70 g of chlorobenzene and 24.9 g of cyclohexane, and 5 g of Ttiton X-100 as an additive was added to the mixture to prepare an ink composition for inkjet printing.

Example 43: Ink 10 mg of particles of the invention in toluene is added to 1.0 mL of Ebecyl 150 and degassed under reduced pressure to remove the toluene and oxygen. Once the toluene is removed, three purge and $N_2$ back-fill cycles are completed and then 10 mg of $TiO_2$ (1% by weight) is added to the formulation and the mixture is degassed under reduced pressure while stirring in order to disperse the $TiO_2$. The formulation is then ready for ink preparation.

Example 44: Ink

An ink composition was prepared comprising: 40 wt. % to 60 wt. % polyethylene glycol dimethacrylate monomer, or polyethylene glycol diacrylate monomer (number average molecular weights in the range from about 230 g/mole to about 430 g mole); 25 wt. % to 50 wt. % monoacrylate monomer, or monomethacrylate monomer (viscosity in the range from about 10 cps to about 27 cps at 22° C.); 4 wt. % to 10 wt. % multifunctional acrylate crosslinking agent, or a multifunctional methacrylate crosslinking agent; and 0.1 wt. % to 10 wt. % crosslinking photoinitiator; and 0.01 wt. % to 50 wt. % particles of the invention.

The resulting ink composition has a surface tension of between about 32 dynes/cm and about 45 dynes/cm at 22° C.

Example 45: Ink

An ink composition was prepared comprising: from 30 wt. % to 50 wt. % of a polyethylene glycol dimethacrylate monomer, or a polyethylene glycol diacrylate monomer (number average molecular weights in the range from 230 g/mole to 430 g/mole); from 4 wt. % to 10 wt. % of a multifunctional acrylate crosslinking agent, or a multifunctional methacrylate crosslinking agent; from 40 wt. % to 60 wt. % of a spreading modifier comprising an alkoxylated aliphatic diacrylate monomer, or an alkoxylated aliphatic dimethacrylate monomer (viscosity in the range from 14 cps to 18 cps at 22° C. and surface tension in the range from 35 dynes/cm to 39 dynes/cm at 22° C.); and 0.01 wt. % to 50 wt. % particles of the invention.

Example 46: Ink

An ink composition was prepared comprising: from 30 wt. % to 50 wt. % of a monomer selected from the group consisting of a polyethylene glycol dimethacrylate monomer, a polyethylene glycol diacrylate monomer (number average molecular weights in the range from 230 g/mole to 430 g/mole); from 4 wt. % to 10 wt. % of a crosslinking agent selected from the group consisting of a multifunctional acrylate crosslinking agent, a multifunctional methacrylate crosslinking agent; from 40 wt. % to 60 wt. % of a spreading modifier selected from the group consisting of an alkoxylated aliphatic diacrylate monomer, an alkoxylated aliphatic dimethacrylate monomer; and 0.01 wt. % to 50 wt. % particles of the invention.

The resulting ink composition has a viscosity in the range from 14 cps to 18 cps at 22° C. and a surface tension in the range from 35 dynes/cm to 39 dynes/cm at 22° C.

Example 47: Ink

An ink composition was prepared comprising: 75-95 wt. % of a polyethylene glycol dimethacrylate monomer, or a polyethylene glycol diacrylate monomer (number average molecular weights in the range from about 230 g/mole to about 430 g/mole); 4-10 wt. % of pentaerythritol tetraacrylate, or pentaerythritol tetramethacrylate; 1-15 wt. % of a spreading modifier (viscosity in the range from about 14 to about 18 cps at 22° C. and surface tension in the range from about 35 to about 39 dynes/cm at 22° C.); and 0.01 wt. % to 50 wt. % particles of the invention.

Example 48: Ink

An ink composition was prepared comprising: 70 wt. % to 96 wt. % di(meth)acrylate monomers or a combination of di(meth)acrylate monomers and mono(meth)acrylate monomers; 4 wt. % to 10 wt. % multifunctional (meth)acrylate crosslinking agent; and 0.1 wt. % to 5 wt. % particles of the invention; wherein said particles are particles 1 as prepared in the examples hereabove; or particles 2 as prepared in the examples hereabove;

The resulting ink composition has a viscosity in the range from 2 cps to 30 cps and a surface tension at 22° C. in the range from 25 dyne/cm to 45 dyne/cm at a temperature in the range from 22° C. to 40° C.

REFERENCES

1—Particle
11—First material
12—Core of the particle
13—Shell of the particle
14—Inorganic material
15—Ink
2—Particle
21—Second material
22—Core of the particle 2
23—Shell of the particle 2
3—Nanoparticle
31—Spherical Nanoparticle
32—2D nanoparticle
33—Core of a nanoparticle
34—First shell of a nanoparticle
35—Second shell of a nanoparticle
36—Insulator shell of a nanoparticle
37—Crown of a nanoparticle
4—LED support
5—LED chip
6—Microsized LED
7—Light emitting material
71—Host material
8—Bead
81—Third material
9—Dense particle
D—Pixel pitch

The invention claimed is:

1. An ink comprising:

(i) at least one first particle comprising a first material and at least one liquid vehicle;

wherein the at least one first particle comprises at least one second particle comprising a second material and at least one nanoparticle dispersed in said second material;

wherein the at least one nanoparticle is a luminescent nanoparticle and comprises at least 1% of semiconductor nanoplatelets;

wherein the first material and the second material have an extinction coefficient less than or equal to $15\times10^5$ at 460 nm; or (ii) at least one particle comprising a plurality of nanoparticles encapsulated in a material and at least one liquid vehicle;

wherein said particle has a surface roughness less than or equal to 5% of the largest dimension of said particle;

wherein the at least one nanoparticle is a luminescent nanoparticle and comprises at least 1% of semiconductor nanoplatelets; or (iii) at least one first particle comprising a first material and at least one liquid vehicle;

wherein the at least one first particle comprises at least one second particle comprising a second material and at least one nanoparticle dispersed in said second material;

wherein said at least one first particle has a surface roughness less than or equal to 5% of the largest dimension of said at least one first particle; and wherein the at least one nanoparticle is a luminescent nanoparticle and comprises at least 1% of semiconductor nanoplatelets.

2. The ink according to claim 1, wherein the first material limits or prevents the diffusion of outer molecular species or fluids into said first material.

3. The ink according to claim 1, wherein the first material has a density ranging from 1 to 10.

4. The ink according to claim 1, wherein the first material has a density greater than or equal to that of the second material.

5. The ink according to claim 1, wherein the first material has a thermal conductivity at standard conditions of at least 0.1 W/(m·K).

6. The ink according to claim 1, wherein the at least one nanoparticle is a semiconductor nanocrystal.

7. The ink according to claim 1, wherein the at least one nanoparticle is a semiconductor nanocrystal comprising a core comprising a material of formula MxNyEzAw, wherein:

M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs and mixtures thereof;

N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs and mixtures thereof;

E is selected from the group consisting of O, S, Se, Te, C, N, P, As, Sb, F, Cl, Br, I, and mixtures thereof;

A is selected from the group consisting of O, S, Se, Te, C, N, P, As, Sb, F, Cl, Br, I, and mixtures thereof; and x, y, z and w are each independently a decimal number from 0 to 5; x, y, z and w are not simultaneously equal to 0; x and y are not simultaneously equal to 0; z and w may not be simultaneously equal to 0.

8. The ink according to claim 1, wherein the at least one nanoparticle is a semiconductor nanocrystal comprising at least one shell comprising a material of formula MxNyEzAw, wherein:

M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof;

N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs and mixtures thereof;

E is selected from the group consisting of O, S, Se, Te, C, N, P, As, Sb, F, Cl, Br, I, and mixtures thereof;

A is selected from the group consisting of O, S, Se, Te, C, N, P, As, Sb, F, Cl, Br, I, and mixtures thereof; and x, y, z and w are each independently a decimal number from 0 to 5; x, y, z and w are not simultaneously equal to 0; x and y are not simultaneously equal to 0; z and w may not be simultaneously equal to 0.

9. The ink according to claim 1, wherein the at least one nanoparticle is a semiconductor nanocrystal comprising at least one crown comprising a material of formula MxNyEzAw, wherein:

M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof;

N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs and mixtures thereof;

E is selected from the group consisting of O, S, Se, Te, C, N, P, As, Sb, F, Cl, Br, I, and mixtures thereof;

A is selected from the group consisting of O, S, Se, Te, C, N, P, As, Sb, F, Cl, Br, I, and mixtures thereof; and x, y, z and w are each independently a decimal number from 0 to 5; x, y, z and w are not simultaneously equal to 0; x and y are not simultaneously equal to 0; z and w may not be simultaneously equal to 0.

10. The ink according to claim 1, wherein the at least one nanoparticle is a semiconductor nanoplatelet.

11. The ink according to claim 1, wherein the at least one liquid vehicle comprises 1-methoxy-2-propanol, 2-pyrrolidinone, C4 to C8 1,2-alkanediol, aliphatic or alicycle ketone, methyl ethyl ketone, C1-C4 alkanol, ketones, esters, ether of ethylene glycol or propylene glycol, acetals, acrylic resin, polyvinyl acetate, polyvinyl alcohol, polyamide resin, polyurethane resin, epoxy resin, alkyd ester, nitrated cellulose, ethyl cellulose, sodium carboxymethyl cellulose, alkyds, maleics, cellulose derivatives, formaldehyde, rubber resin, phenolics, propyl acetate, glycol ether, aliphatic hydrocarbon, acetate, ester, acrylic, cellulose ester, nitrocellulose, modified resin, alkoxylated alcohol, 2-pyrrolidone, a homolog of 2-pyrrolidone, glycol, water, or a mixture thereof.

12. A pattern comprising at least one ink according to claim 1 deposited by inkjet printing on a support.

13. A pattern comprising at least one ink according to claim 1 deposited by inkjet printing on a LED chip or microsized LED.

14. A particle deposited on a support by inkjet printing, wherein the deposited particle comprises:

(i) a first material and at least one second particle comprising a second material and at least one nanoparticle dispersed in said second material;

wherein the first material and the second material have an extinction coefficient less than or equal to $15\times10^{-5}$ at 460 nm;

wherein the at least one nanoparticle is a luminescent nanoparticle and comprises at least 1% of semiconductor nanoplatelets; or (ii) a first material and at least one second particle comprising a second material and at least one nanoparticle dispersed in said second material;

wherein said deposited particle has a surface roughness less than or equal to 5% of the largest dimension of said deposited particle; and wherein the at least one nanoparticle is a luminescent nanoparticle and comprises at least 1% of semiconductor nanoplatelets.

15. A particle deposited on a support by inkjet printing;

wherein said particle comprises a plurality of nanoparticles encapsulated in a material;

wherein said particle has a surface roughness less than or equal to 5% of the largest dimension of said particle; and wherein the at least one nanoparticle is a luminescent nanoparticle and comprises at least 1% of semiconductor nanoplatelets.

16. An optoelectronic device comprising at least one ink according to claim 1.

17. A method for depositing an ink according to claim 1 on a support comprising:

printing the ink on a support using inkjet printing; and evaporating the liquid vehicle.

* * * * *